US012680017B2

(12) United States Patent
Furue et al.

(10) Patent No.: US 12,680,017 B2
(45) **Date of Patent: *Jul. 14, 2026**

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventors: Ryuhei Furue, Yokohama (JP); Hirokazu Kuwabara, Yokohama (JP); Yoshiro Sugita, Yokohama (JP); Yuji Suzaki, Yokohama (JP); Yuma Aoki, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 1127 days.

This patent is subject to a terminal disclaimer.

(21) Appl. No.: 17/532,117

(22) Filed: Nov. 22, 2021

(65) Prior Publication Data

US 2022/0246850 A1 Aug. 4, 2022

(30) Foreign Application Priority Data

Jan. 19, 2021 (KR) ........................ 10-2021-0007287
Oct. 20, 2021 (KR) ........................ 10-2021-0140578

(51) Int. Cl.
*C09K 11/06* (2006.01)
*C07F 5/02* (2006.01)
(Continued)

(52) U.S. Cl.
CPC .............. *C09K 11/06* (2013.01); *C07F 5/027* (2013.01); *H10K 85/658* (2023.02);
(Continued)

(58) Field of Classification Search
CPC . C07F 5/027; C09K 11/06; C09K 2211/1018; H10K 50/11; H10K 85/322;
(Continued)

(56) References Cited

U.S. PATENT DOCUMENTS 10,374,166 B2 8/2019 Hatakeyama et al.
11,950,508 B2 * 4/2024 Kim .................. H10K 85/6574
(Continued)

FOREIGN PATENT DOCUMENTS

KR 20160119683 A 10/2016
KR 10-1886773 8/2018
(Continued)

*Primary Examiner* — Elizabeth M. Dahlburg
(74) *Attorney, Agent, or Firm* — Lerner David LLP

(57) ABSTRACT

An organic electroluminescence device of an embodiment includes a first electrode, a hole transport region disposed on the first electrode, an emission layer disposed on the hole transport region, an electron transport region disposed on the emission layer, and a second electrode disposed on the
(Continued)

electron transport region. The emission layer includes a polycyclic compound represented by Formula 1, thereby showing high emission efficiency.

[Formula 1]

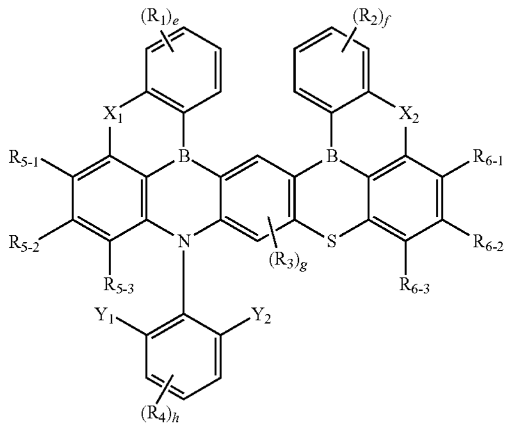

20 Claims, 6 Drawing Sheets

(51) Int. Cl.

| | |
|---|---|
| ***H10K 50/11*** | (2023.01) |
| ***H10K 85/60*** | (2023.01) |
| ***H10K 101/20*** | (2023.01) |
| *H10K 101/10* | (2023.01) |

(52) U.S. Cl.
CPC ...... *C09K 2211/1018* (2013.01); *H10K 50/11* (2023.02); *H10K 2101/10* (2023.02); *H10K 2101/20* (2023.02)

(58) Field of Classification Search
CPC ............... H10K 85/636; H10K 85/657; H10K 85/6572; H10K 85/658; H10K 2101/10; H10K 2101/20
See application file for complete search history.

(56) References Cited

U.S. PATENT DOCUMENTS

| | | | | |
|---|---|---|---|---|
| 12,114,566 | B2 * | 10/2024 | Miyazaki | H10K 85/636 |
| 12,245,496 | B2 * | 3/2025 | Pak | H10K 85/633 |
| 12,284,905 | B2 * | 4/2025 | Park | C09K 11/06 |
| 2015/0236274 | A1 | 8/2015 | Hatakeyama et al. | |
| 2019/0115538 | A1 | 4/2019 | Lim et al. | |
| 2020/0185626 | A1 | 6/2020 | Yuuki | |
| 2020/0190115 | A1 | 6/2020 | Hatakeyama et al. | |
| 2022/0093874 | A1 * | 3/2022 | Miyazaki | H10K 85/658 |
| 2022/0115595 | A1 * | 4/2022 | Park | H10K 85/658 |
| 2022/0123214 | A1 * | 4/2022 | Kuwabara | H10K 85/658 |
| 2022/0149292 | A1 * | 5/2022 | Kim | H10K 85/6574 |
| 2022/0209116 | A1 * | 6/2022 | Pak | H10K 85/633 |

FOREIGN PATENT DOCUMENTS

| | | |
|---|---|---|
| KR | 10-2019-0042791 | 4/2019 |
| KR | 10-2020-0006965 | 1/2020 |
| KR | 10-2020-0071192 | 6/2020 |
| WO | 2018/074167 | 4/2018 |
| WO | 2018/212169 | 11/2018 |
| WO | 2020040298 A1 | 2/2020 |

* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION(S)

This application claims priority to and benefits of Korean Patent Application Nos. 10-2021-0007287 and 10-2021-0140578 under 35 U.S.C. § 119, filed on Jan. 19, 2021 and Oct. 20, 2021, respectively, in the Korean Intellectual Property Office, the entire contents of which are incorporated herein by reference.

BACKGROUND

1. Technical Field

The disclosure relates to an organic electroluminescence device and a polycyclic compound for an organic electroluminescence device.

2. Description of the Related Art

Active development continues for an organic electroluminescence display as an image display. The organic electroluminescence display is different from a liquid crystal display and is a so-called self-luminescent display in which holes and electrons injected respectively from a first electrode and a second electrode recombine in an emission layer so that a light-emitting material including an organic compound in the emission layer emits light to achieve display.

In the application of an organic electroluminescence device to an image display, there is a need for decreasing driving voltage, increasing emission efficiency, and increasing the life of the organic electroluminescence device, and continuous development is required on materials for an organic electroluminescence device which is capable of stably achieving such characteristics.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides an organic electroluminescence device with high efficiency and a polycyclic compound included in an emission layer of an organic electroluminescence device.

An embodiment provides a polycyclic compound represented by Formula 1 below.

[Formula 1]

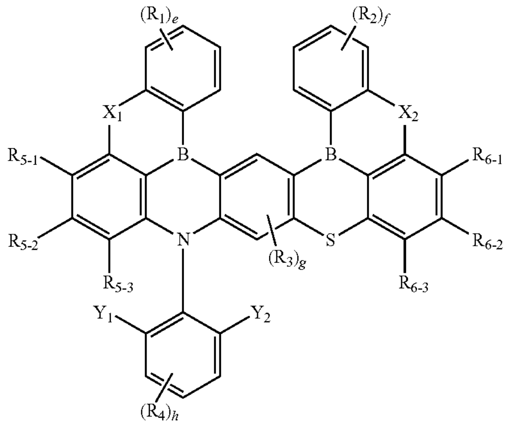

In Formula 1, $X_1$ and $X_2$ may each independently be O, S, or $N(R_7)$, e and f may each independently be an integer from 0 to 4, g may be an integer from 0 to 2, h may be an integer from 0 to 3, $R_1$ to $R_4$, $R_{5-1}$ to $R_{5-3}$, and $R_{6-1}$ to $R_{6-3}$ may each independently be a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, $R_7$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, and $Y_1$ and $Y_2$ may each independently be a hydrogen atom, a deuterium atom, a substituted or unsubstituted alkyl group of 6 to 20 carbon atoms, a substituted or unsubstituted aryl group of 6 to 30 ring-forming carbon atoms, or a substituted or unsubstituted heteroaryl group of 2 to 30 ring-forming carbon atoms, and at least one of $Y_1$ and $Y_2$ may be a substituted or unsubstituted alkyl group of 6 to 20 carbon atoms, a substituted or unsubstituted aryl group of 6 to 30 ring-forming carbon atoms, or a substituted or unsubstituted heteroaryl group of 2 to 30 ring-forming carbon atoms.

In an embodiment, at least one of $X_1$ and $X_2$ may be $N(R_7)$, and $R_7$ may be a substituted or unsubstituted aryl group of 6 to 30 ring-forming carbon atoms, or a substituted or unsubstituted heteroaryl group of 2 to 30 ring-forming carbon atoms.

In an embodiment, the polycyclic compound represented by Formula 1 may be represented by any one of Formula 2-1 to Formula 2-5 below.

[Formula 2-1]

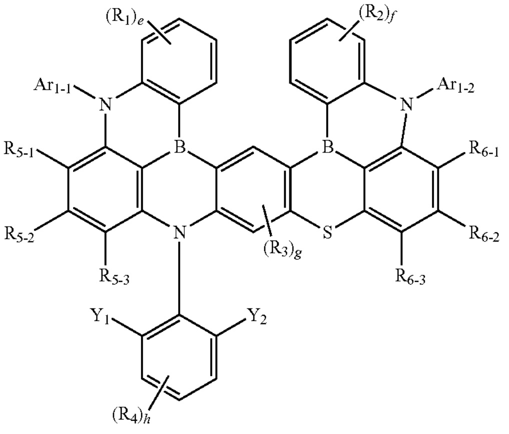

[Formula 2-2]

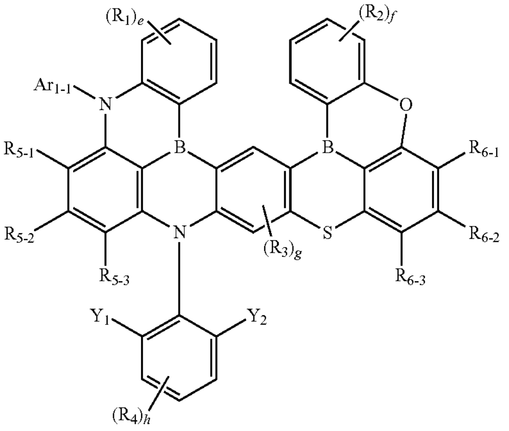

[Formula 2-3]

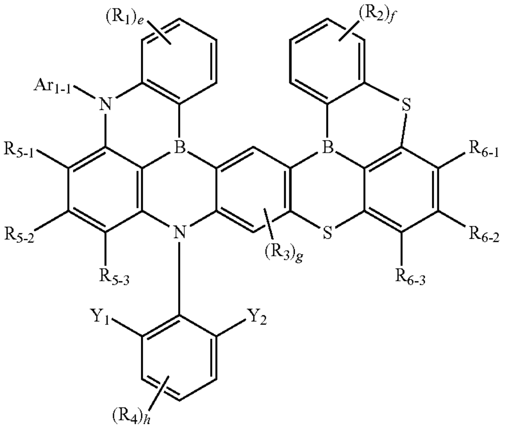

-continued

[Formula 2-4]

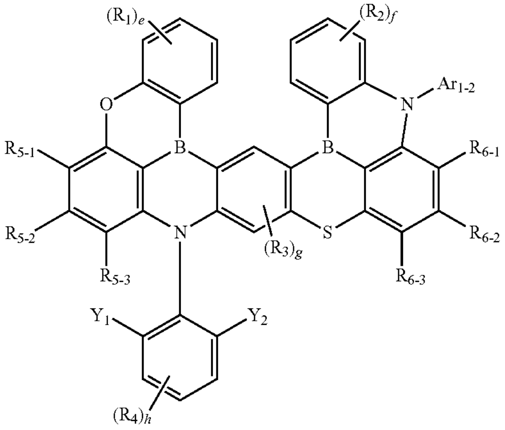

[Formula 2-5]

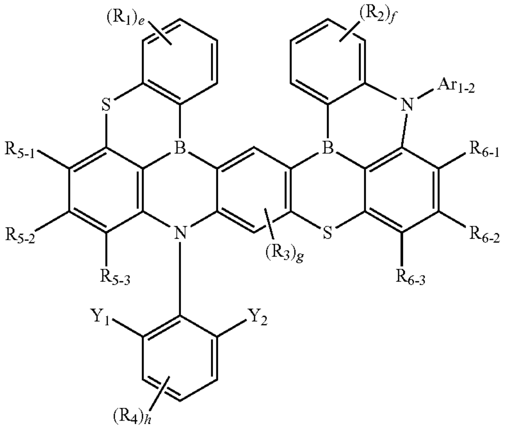

In Formula 2-1 to Formula 2-5, $Ar_{1-1}$ and $Ar_{1-2}$ may each independently be a substituted or unsubstituted aryl group of 6 to 30 ring-forming carbon atoms, or a substituted or unsubstituted heteroaryl group of 2 to 30 ring-forming carbon atoms, and $R_1$ to $R_4$, $R_{5-1}$ to $R_{5-3}$, $R_{6-1}$ to $R_{6-3}$, $Y_1$, $Y_2$, and e to h may be the same as defined in connection with Formula 1.

In an embodiment, $Ar_{1-1}$ and $Ar_{1-2}$ may each independently be a group represented by any one of Formula 5-1 to Formula 5-3 below.

[Formula 5-1]

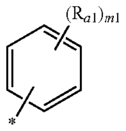

[Formula 5-2]

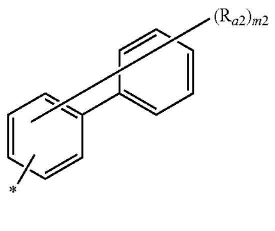

-continued

[Formula 5-3]

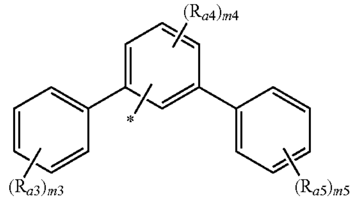

In Formulae 5-1 to Formula 5-3, $R_{a1}$ to $R_{a5}$ may each independently be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, m1, m3, and m5 may each independently be an integer from 0 to 5, m2 may be an integer from 0 to 9, m4 may be an integer from 0 to 3, and —* represents a binding site to a neighboring atom.

In an embodiment, at least one of $R_{5-1}$ to $R_{5-3}$, and $R_{6-1}$ to $R_{6-3}$ may be a substituted amine group.

In an embodiment, the polycyclic compound represented by Formula 1 may be represented by Formula 3-1 or Formula 3-2 below.

[Formula 3-1]

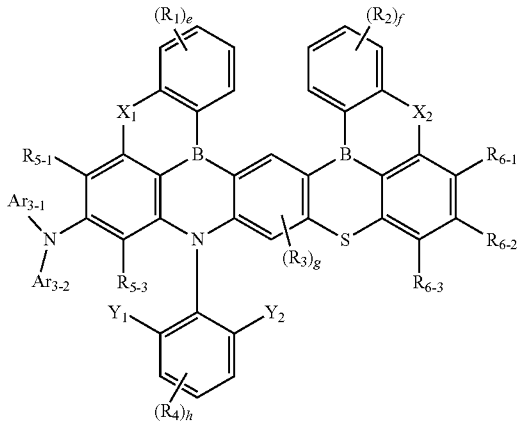

[Formula 3-2]

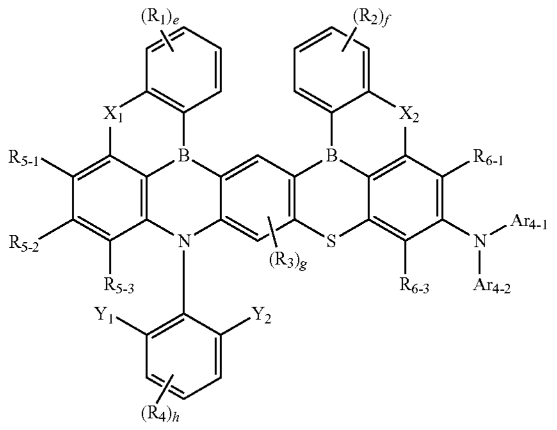

In Formulae 3-1 and Formula 3-2, $Ar_{3-1}$, $Ar_{3-2}$, $Ar_{4-1}$, and $Ar_{4-2}$ may each independently be a substituted or unsubstituted aryl group of 6 to 30 ring-forming carbon atoms, and $X_1$, $X_2$, $R_1$ to $R_4$, $R_{5-1}$ to $R_{5-3}$, $R_{6-1}$ to $R_{6-3}$, $Y_1$, $Y_2$, and e to h may be the same as defined in connection with Formula 1.

In an embodiment, the polycyclic compound represented by Formula 1 may be represented by Formula 4 below.

[Formula 4]

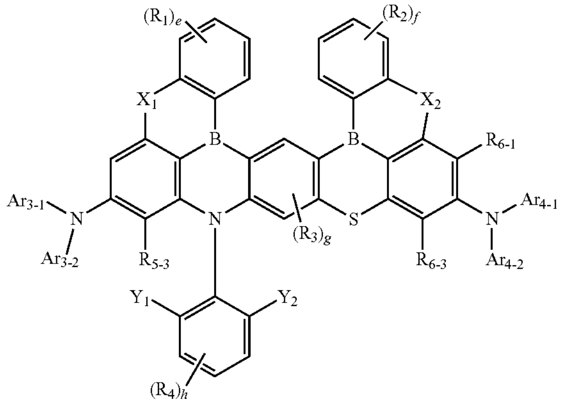

In Formula 4, $Ar_{3-1}$, $Ar_{3-2}$, $Ar_{4-1}$, and $Ar_{4-2}$ may each independently be a substituted or unsubstituted aryl group of 6 to 30 ring-forming carbon atoms, and $X_1$, $X_2$, $R_1$ to $R_4$, $R_{5-1}$, $R_{5-3}$, $R_{6-1}$, $R_{6-3}$, $Y_1$, $Y_2$, and e to h may be the same as defined in connection with Formula 1.

In an embodiment, $Ar_{3-1}$, $Ar_{3-2}$, $Ar_{4-1}$, and $Ar_{4-2}$ may each independently be a substituted or unsubstituted aryl group of 6 to 18 ring-forming carbon atoms.

In an embodiment, the polycyclic compound represented by Formula 1 may be any one selected from Compound Group 1.

In an embodiment, there is provided an organic electroluminescence device which may include a first electrode, a hole transport region disposed on the first electrode, an emission layer disposed on the hole transport region, an electron transport region disposed on the emission layer, and a second electrode disposed on the electron transport region, wherein the emission layer may include the polycyclic compound of an embodiment.

In an embodiment, the emission layer may emit delayed fluorescence.

In an embodiment, the emission layer may be a delayed fluorescence emission layer including a first compound and a second compound, and the first compound may include the polycyclic compound.

In an embodiment, the emission layer may be a thermally activated delayed fluorescence emission layer emitting light having a wavelength in a range of about 430 nm to about 480 nm.

BRIEF DESCRIPTION OF THE DRAWINGS

The accompanying drawings are included to provide a further understanding of the embodiments, and are incorporated in and constitute a part of this specification. The drawings illustrate embodiments of the disclosure and principles thereof. The above and other aspects and features of the disclosure will become more apparent by describing in detail embodiments thereof with reference to the attached drawings, in which.

DETAILED DESCRIPTION OF THE EMBODIMENTS

Figure 1:
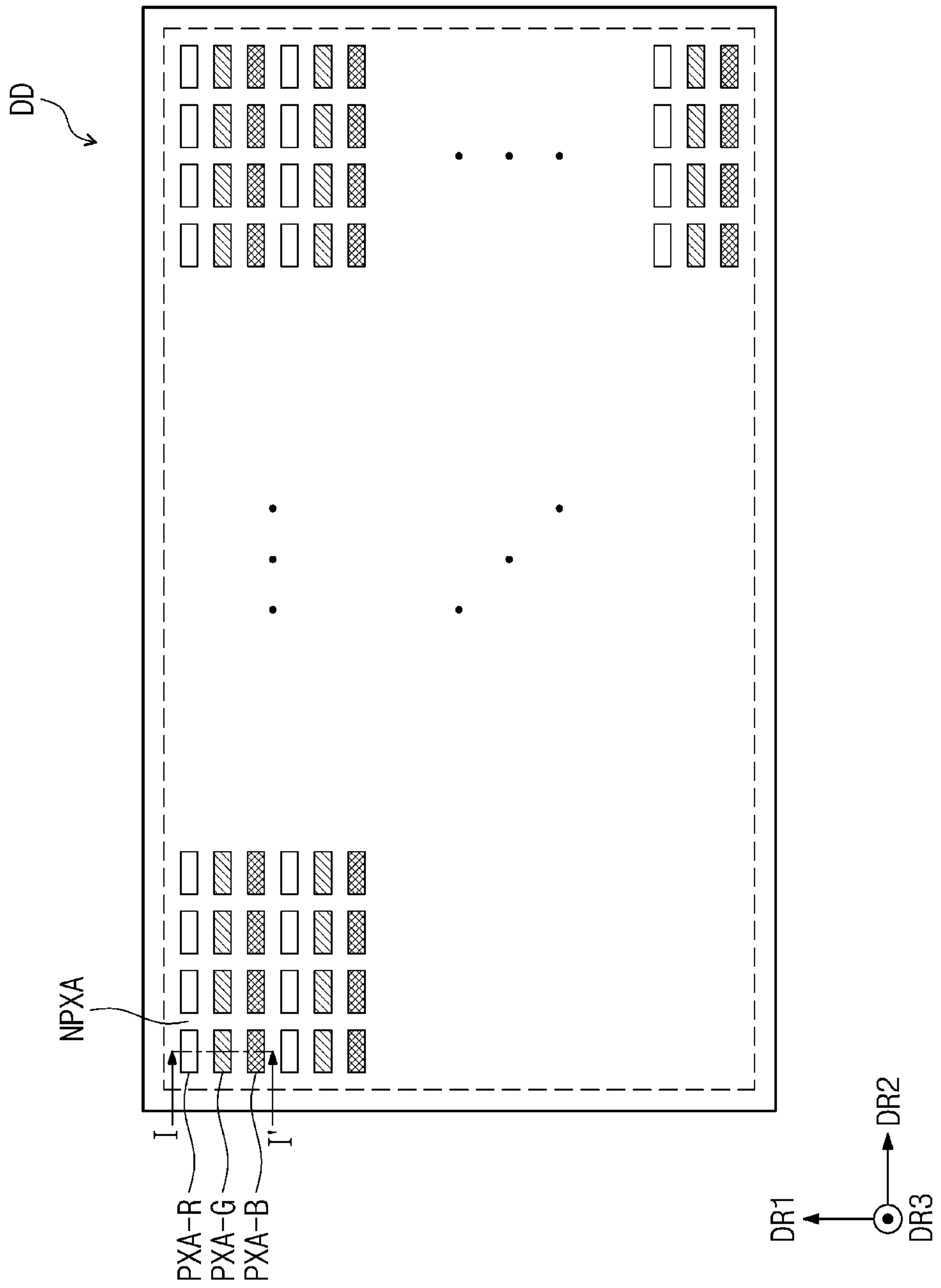
FIG. 1 is a plan view showing a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be explained referring to the drawings.

Figure 2:
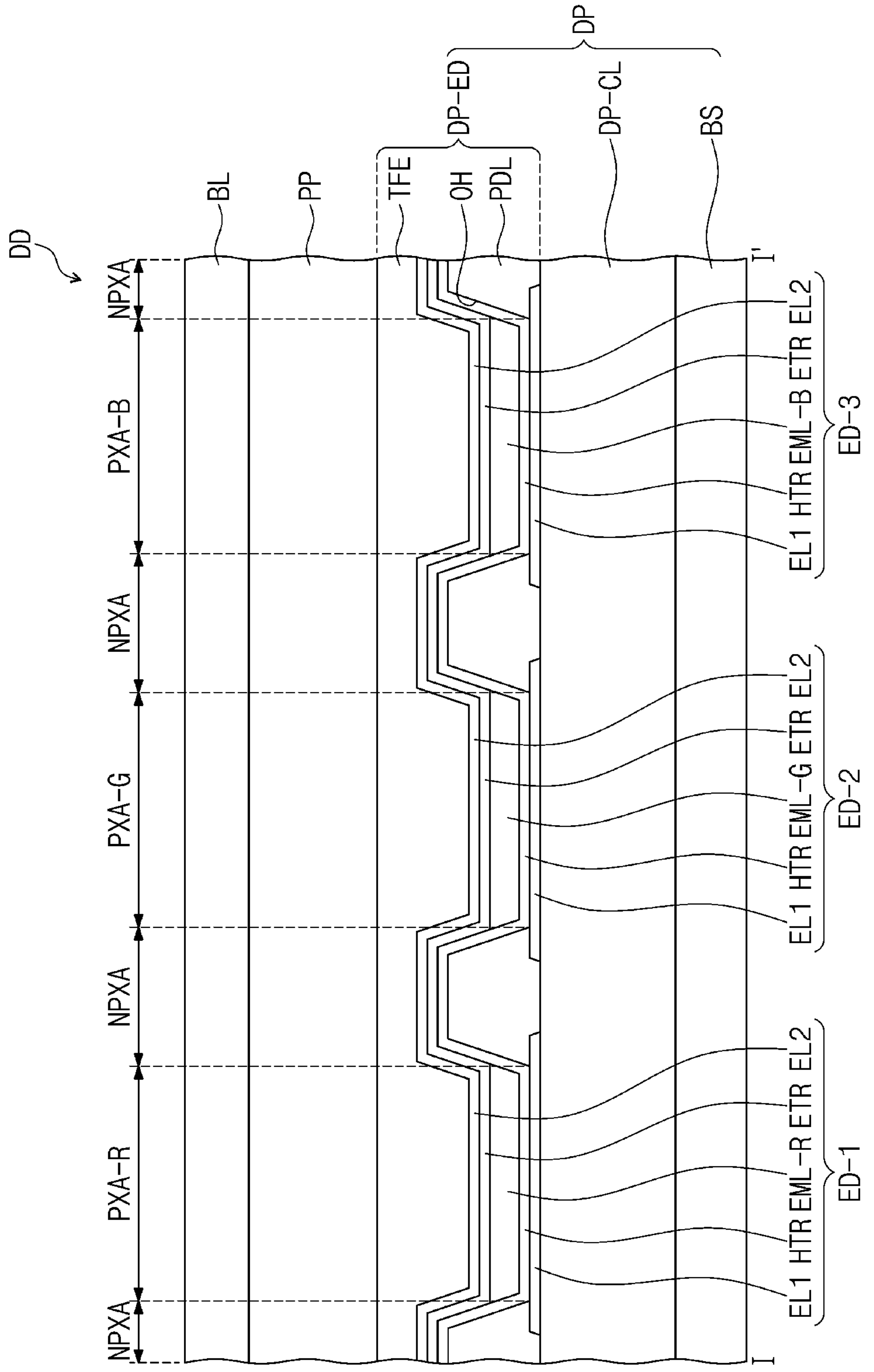
FIG. 2 is a schematic cross-sectional view showing a display apparatus according to an embodiment.

FIG. 1 is a plan view showing an embodiment of a display apparatus DD. FIG. 2 is a schematic cross-sectional view of a display apparatus DD according to an embodiment. FIG. 2 is a schematic cross-sectional view showing a part corresponding to line I-I' in FIG. 1.

The display apparatus DD may include a display panel DP and an optical layer PP disposed on the display panel DP. The display panel DP may include organic electroluminescence devices ED-1, ED-2, and ED-3. The display apparatus DD may include multiples of each of the organic electroluminescence devices ED-1, ED-2, and ED-3. The optical layer PP may be disposed on the display panel DP and may control light reflected at the display panel DP from an external light. The optical layer PP may include, for example, a polarization layer or a color filter layer. Although not shown in the drawings, in an embodiment, the optical layer PP may be omitted from the display apparatus DD.

The display panel DP may include a base layer BS, a circuit layer DP-CL provided on the base layer BS, and a display device layer DP-ED. The display device layer DP-ED may include a pixel definition layer PDL, organic electroluminescence devices ED-1, ED-2 and ED-3 disposed in the pixel definition layer PDL, and an encapsulating layer TFE disposed on the organic electroluminescence devices ED-1, ED-2, and ED-3.

The base layer BS may provide a base surface where the display device layer DP-ED is disposed. The base layer BS may be a glass substrate, a metal substrate, a plastic substrate, etc. However, embodiments are not limited thereto, and the base layer BS may include an inorganic layer, an organic layer, or a composite material layer.

In an embodiment, the circuit layer DP-CL may be disposed on the base layer BS, and the circuit layer DP-CL may include multiple transistors (not shown). Each of the transistors (not shown) may include a control electrode, an input electrode, and an output electrode. For example, the circuit layer DP-CL may include switching transistors and driving transistors for driving the organic electroluminescence devices ED-1, ED-2, and ED-3 of the display device layer DP-ED.

Each of the organic electroluminescence devices ED-1, ED-2, and ED-3 may have the structures of organic electroluminescence devices ED of embodiments according to FIG. 3 to FIG. 6, which will be explained later. Each of the organic electroluminescence devices ED-1, ED-2, and ED-3 may include a first electrode EL1, a hole transport region HTR, emission layers EML-R, EML-G, and EML-B, an electron transport region ETR, and a second electrode EL2.

In FIG. 2, shown is an embodiment where the emission layers EML-R, EML-G, and EML-B of organic electroluminescence devices ED-1, ED-2, and ED-3, are disposed in opening portions OH defined in a pixel definition layer PDL, and a hole transport region HTR, an electron transport region ETR, and a second electrode EL2 are each provided as common layers in all organic electroluminescence devices ED-1, ED-2, and ED-3. However, embodiments are not limited thereto. Although not shown in FIG. 2, in an embodiment, the hole transport region HTR and the electron transport region ETR may each be patterned and provided in the opening portions OH defined in the pixel definition layer PDL. For example, in an embodiment, the hole transport region HTR, the emission layers EML-R, EML-G and EML-B, and the electron transport region ETR of the organic electroluminescence devices ED-1, ED-2 and ED-3 may each be patterned by an ink jet printing method and provided.

An encapsulating layer TFE may cover the organic electroluminescence devices ED-1, ED-2, and ED-3. The encapsulating layer TFE may encapsulate the display device layer DP-ED. The encapsulating layer TFE may be a thin film encapsulating layer. The encapsulating layer TFE may be one layer or a stack of multiple layers. The encapsulating layer TFE may include at least one insulating layer. The encapsulating layer TFE according to an embodiment may include at least one inorganic layer (hereinafter, encapsulating inorganic layer). The encapsulating layer TFE according to an embodiment may include at least one organic layer (hereinafter, encapsulating organic layer) and at least one encapsulating inorganic layer.

The encapsulating inorganic layer may protect the display device layer DP-ED from moisture and/or oxygen, and the encapsulating organic layer may protect the display device layer DP-ED from foreign materials such as dust particles. The encapsulating inorganic layer may include silicon nitride, silicon oxy nitride, silicon oxide, titanium oxide, or aluminum oxide, without specific limitation. The encapsulating organic layer may include an acrylic compound, an epoxy-based compound, etc. The encapsulating organic layer may include a photopolymerizable organic material, without specific limitation.

The encapsulating layer TFE may be disposed on the second electrode EL2 and may be disposed to fill the opening portion OH.

Referring to FIG. 1 and FIG. 2, the display apparatus DD may include a non-luminous area NPXA and luminous areas PXA-R, PXA-G and PXA-B. The luminous areas PXA-R, PXA-G, and PXA-B may be areas emitting light produced from the organic electroluminescence devices ED-1, ED-2, and ED-3, respectively. The luminous areas PXA-R, PXA-G, and PXA-B may be separated from each other on a plane.

The luminous areas PXA-R, PXA-G, and PXA-B may be areas separated by the pixel definition layer PDL. The non-luminous areas NPXA may be areas between neighboring luminous areas PXA-R, PXA-G, and PXA-B and may be areas corresponding to the pixel definition layer PDL. Each of the luminous areas PXA-R, PXA-G, and PXA-B may correspond to a pixel. The pixel definition layer PDL may separate the organic electroluminescence devices ED-1, ED-2, and ED-3. The emission layers EML-R, EML-G, and EML-B of the organic electroluminescence devices ED-1, ED-2, and ED-3 may be disposed in the opening portions OH defined in the pixel definition layer PDL and separated from one another.

The luminous areas PXA-R, PXA-G, and PXA-B may be divided into multiple groups according to the color of light produced from each of the organic electroluminescence devices ED-1, ED-2, and ED-3. In the display apparatus DD of an embodiment, shown in FIG. 1 and FIG. 2, three luminous areas PXA-R, PXA-G, and PXA-B respectively emitting red light, green light, and blue light are illustrated as an embodiment. For example, the display apparatus DD of an embodiment may include a red luminous area PXA-R, a green luminous area PXA-G, and a blue luminous area PXA-B, which are separated from each other.

In the display apparatus DD according to an embodiment, organic electroluminescence devices ED-1, ED-2, and ED-3 may each emit light having different wavelength regions. For example, in an embodiment, the display apparatus DD may include a first organic electroluminescence device ED-1 emitting red light, a second organic electroluminescence device ED-2 emitting green light, and a third organic electroluminescence device ED-3 emitting blue light. For example, each of the red luminous area PXA-R, the green luminous area PXA-G, and the blue luminous area PXA-B of the display apparatus DD may correspond to the first organic electroluminescence device ED-1, the second organic electroluminescence device ED-2, and the third organic electroluminescence device ED-3, respectively.

However, embodiments are not limited thereto, and the first to third organic electroluminescence devices ED-1, ED-2, and ED-3 may emit light in a same wavelength region, or at least one thereof may emit light in a different wavelength region. For example, the first to third organic electroluminescence devices ED-1, ED-2, and ED-3 may all emit blue light.

The luminous areas PXA-R, PXA-G, and PXA-B in the display apparatus DD according to an embodiment may be arranged in a stripe shape. Referring to FIG. 1, multiple red luminous areas PXA-R, multiple green luminous areas PXA-G, and multiple blue luminous areas PXA-B may be arranged along a second direction DR2. The red luminous area PXA-R, the green luminous area PXA-G, and the blue luminous area PXA-B may be arranged by turns along a first direction DR1.

In FIG. 1 and FIG. 2, the areas of the luminous areas PXA-R, PXA-G and PXA-B are shown to be similar, but embodiments are not limited thereto. The areas of the luminous areas PXA-R, PXA-G and PXA-B may be different from each other according to a wavelength region of light emitted. The areas of the luminous areas PXA-R, PXA-G and PXA-B may be areas in a plan view that are defined by the first direction DR1 and the second direction DR2.

The arrangement type of the luminous areas PXA-R, PXA-G, and PXA-B is not limited to the configuration shown in FIG. 1, and the arrangement order of the red luminous areas PXA-R, the green luminous areas PXA-G, and the blue luminous areas PXA-B may be provided in various combinations according to the properties of display quality required for the display apparatus DD. For example, the arrangement type of the luminous areas PXA-R, PXA-G, and PXA-B may be a PenTile® arrangement type, or a diamond arrangement type.

In an embodiment, the areas of the luminous areas PXA-R, PXA-G, and PXA-B may be different from each other. For example, in an embodiment, an area of the green luminous area PXA-G may be smaller than an area of the blue luminous area PXA-B, but embodiments are not limited thereto.

Figure 3:
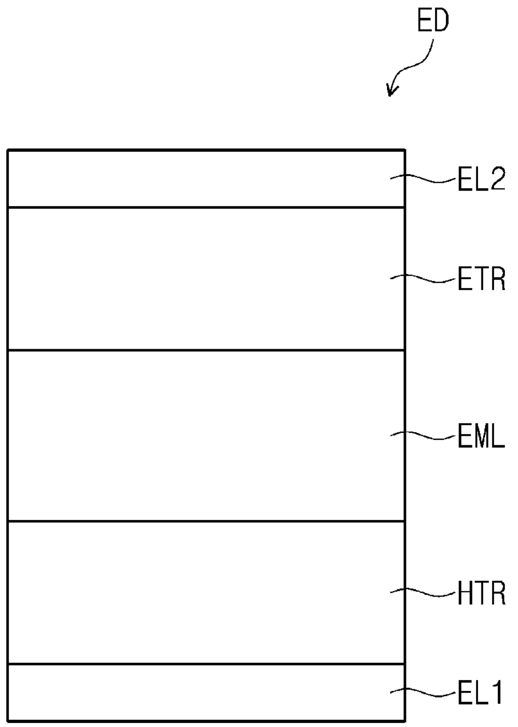
FIG. 3 is a schematic cross-sectional view showing an organic electroluminescence device according to an embodiment.

Hereinafter, FIG. 3 to FIG. 6 are each a schematic cross-sectional view showing an organic electroluminescence device according to embodiments. As shown in FIG. 3, the organic electroluminescence device ED according to an embodiment may include a first electrode EL1, a hole transport region HTR, an emission layer EML, an electron transport region ETR, and a second electrode EL2, which are stacked in order.

The organic electroluminescence device ED of an embodiment may include a polycyclic compound of an embodiment, which will be explained later, in the emission layer EML disposed between the first electrode EL1 and the second electrode EL2. However, embodiments are not limited thereto, and the organic electroluminescence device ED of an embodiment may include the polycyclic compound of an embodiment, which will be explained later, in a hole transport region HTR or in an electron transport region ETR, which are among the functional layers disposed between the first electrode EL1 and the second electrode EL2, in addition to the emission layer EML, or may include the polycyclic compound according to an embodiment, which will be explained later, in a capping layer CPL disposed on the second electrode EL2.

Figure 4:
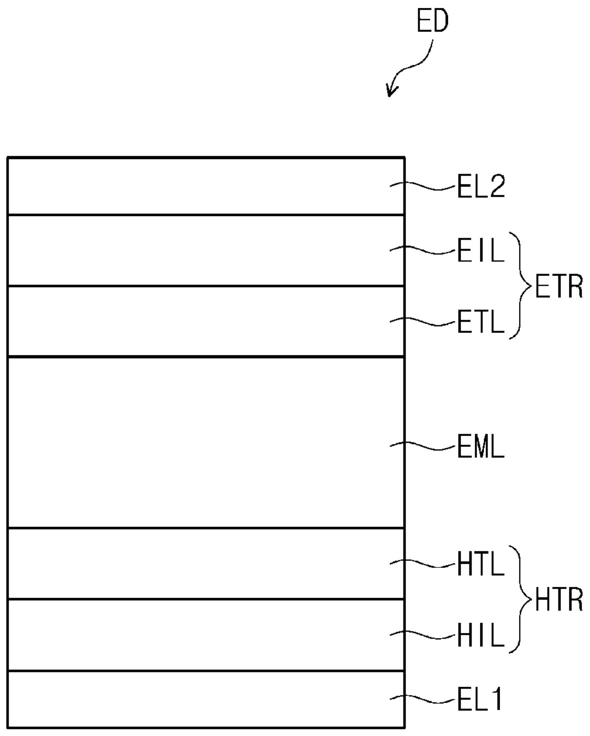
FIG. 4 is a schematic cross-sectional view schematically showing an organic electroluminescence device according to an embodiment.
Figure 5:
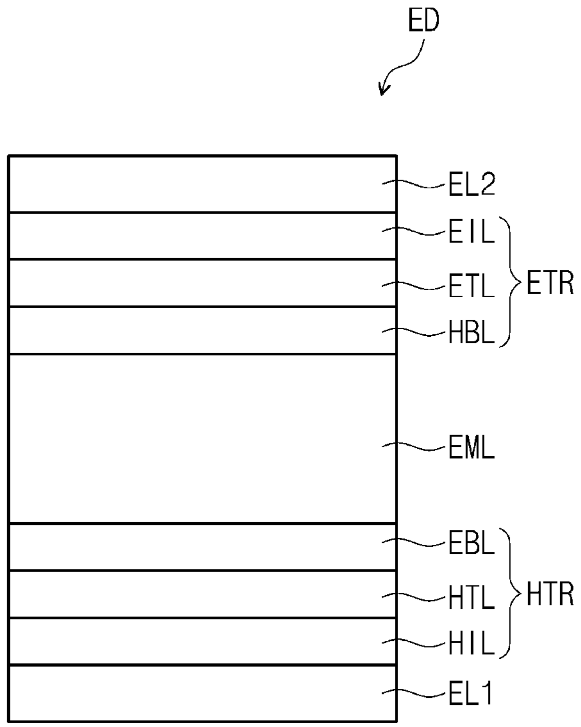
FIG. 5 is a schematic cross-sectional view schematically showing an organic electroluminescence device according to an embodiment.
Figure 6:
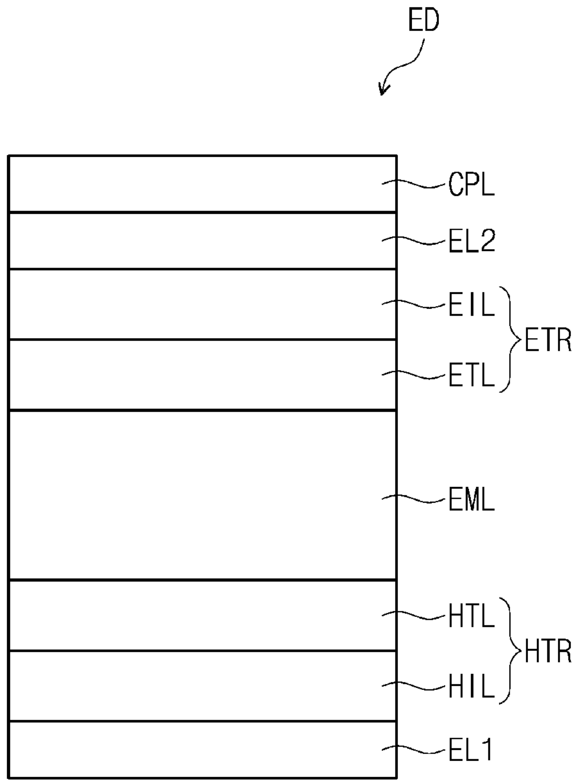
FIG. 6 is a schematic cross-sectional view schematically showing an organic electroluminescence device according to an embodiment.

In comparison to FIG. 3, FIG. 4 shows a schematic cross-sectional view of an organic electroluminescence device ED of an embodiment, wherein a hole transport region HTR includes a hole injection layer HIL and a hole transport layer HTL, and an electron transport region ETR includes an electron injection layer EIL and an electron transport layer ETL. In comparison to FIG. 3, FIG. 5 shows a schematic cross-sectional view of an organic electroluminescence device ED of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In comparison to FIG. 4, FIG. 6 shows a schematic cross-sectional view of an organic electroluminescence device ED of an embodiment, including a capping layer CPL disposed on the second electrode EL2.

The first electrode EL1 has conductivity. The first electrode EL1 may be formed using a metal alloy or a conductive compound. The first electrode EL1 may be an anode or a cathode. However, embodiments are not limited thereto. In an embodiment, the first electrode EL1 may be a pixel electrode. The first electrode EL1 may be a transmissive electrode, a transflective electrode, or a reflective electrode. If the first electrode EL1 is a transmissive electrode, the first electrode EL1 may include a transparent metal oxide such as indium tin oxide (ITO), indium zinc oxide (IZO), zinc oxide (ZnO), and indium tin zinc oxide (ITZO). If the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, compounds thereof, or mixtures thereof (for example, a mixture of Ag and Mg). In an embodiment, the first electrode EL1 may have a structure of multiple layers including a reflective layer or a transflective layer formed using the above materials, and a transmissive conductive layer formed using ITO, IZO, ZnO, or ITZO. For example, the first electrode EL1 may have a three-layer structure of ITO/Ag/ITO. However, embodiments are not limited thereto. A thickness of the first electrode EL1 may be in a range of about 700 Å to about 10,000 Å. For example, the thickness of the first electrode EL1 may be in a range of about 1,000 Å to about 3,000 Å.

The hole transport region HTR is provided on the first electrode EL1. The hole transport region HTR may include at least one of a hole injection layer HIL, a hole transport layer HTL, a hole buffer layer (not shown), and an electron blocking layer EBL. A thickness of the hole transport region HTR may be, for example, in a range of about 50 Å to about 15,000 Å.

The hole transport region HTR may have a layer formed using a single material, a layer formed using different materials, or a multilayer structure including layers formed using different materials.

For example, the hole transport region HTR may have a structure of a single layer of a hole injection layer HIL or a hole transport layer HTL, or may have a structure of a single layer formed using a hole injection material and a hole transport material. In embodiments, the hole transport region HTR may have a structure of a single layer formed using multiple different materials, or a structure stacked from the first electrode EL1 of a hole injection layer HIL/a hole transport layer HTL, a hole injection layer HIL/a hole transport layer HTL/a hole buffer layer (not shown), a hole injection layer HIL/a hole buffer layer (not shown), a hole transport layer HTL/a hole buffer layer (not shown), or a hole injection layer HIL/a hole transport layer HTL/an electron blocking layer EBL, without limitation.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include a compound represented by Formula H-1 below.

[Formula H-1]

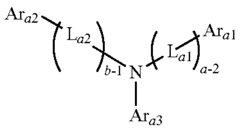

In Formula H-1 above, $L_{a1}$ and $L_{a2}$ may each independently be a direct linkage, a substituted or unsubstituted arylene group of 6 to 30 ring-forming carbon atoms, or a substituted or unsubstituted heteroarylene group of 2 to 30 ring-forming carbon atoms. In Formula H-1, a-1 and b-1 may each independently be an integer from 0 to 10. In Formula H-1, if a-1 or b-1 is 2 or more, multiple $L_{a1}$ groups and multiple $L_{a2}$ groups may each independently be a substituted or unsubstituted arylene group of 6 to 30 ring-forming carbon atoms, or a substituted or unsubstituted heteroarylene group of 2 to 30 ring-forming carbon atoms.

In Formula H-1, $Ar_{a1}$ to $Ar_{a3}$ may each independently be a substituted or unsubstituted aryl group of 6 to 30 ring-forming carbon atoms, or a substituted or unsubstituted heteroaryl group of 2 to 30 ring-forming carbon atoms.

The compound represented by Formula H-1 may be a monoamine compound. In another embodiment, the compound represented by Formula H-1 may be a diamine compound in which at least one of $Ar_{a1}$ to $Ar_{a3}$ includes an amine group as a substituent. The compound represented by Formula H-1 may be a carbazole-based compound in which at least one of $Ar_{a1}$ to $Ar_{a3}$ includes a substituted or unsubstituted carbazole group, or a fluorene-based compound in which at least one of $Ar_{a1}$ to $Ar_{a3}$ includes a substituted or unsubstituted fluorene group.

The compound represented by Formula H-1 may be any one selected from Compound Group H below. However, the compounds shown in Compound Group H are only examples, and the compound represented by Formula H-1 is not limited to those listed in Compound Group H below.

[Compound Group H]

H-1-1

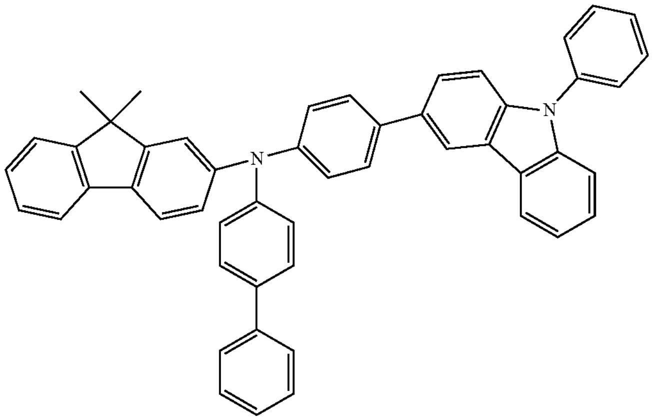

H-1-2

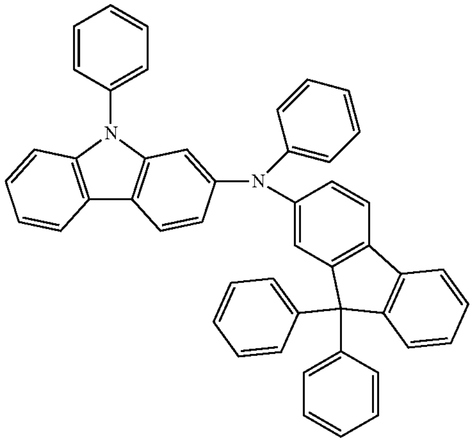

-continued
H-1-3
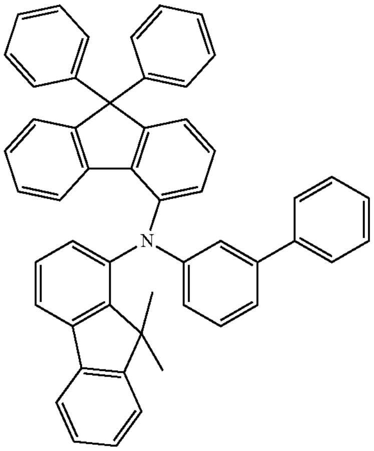
H-1-4
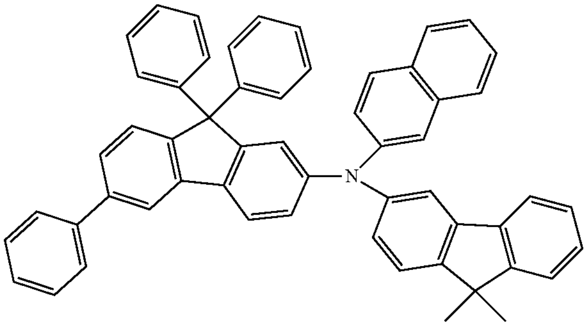
H-1-5
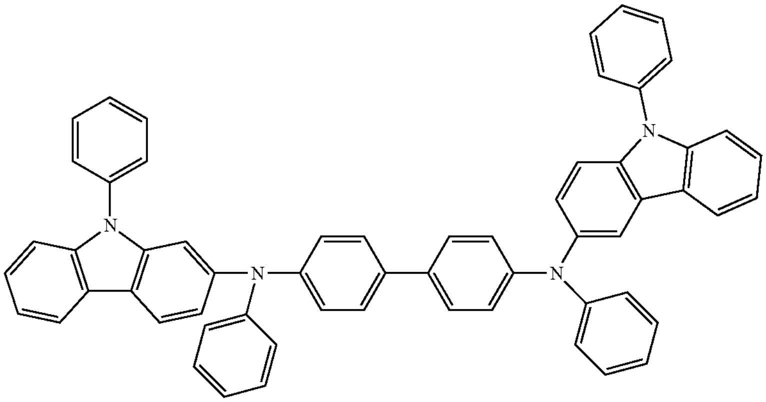

-continued
H-1-6
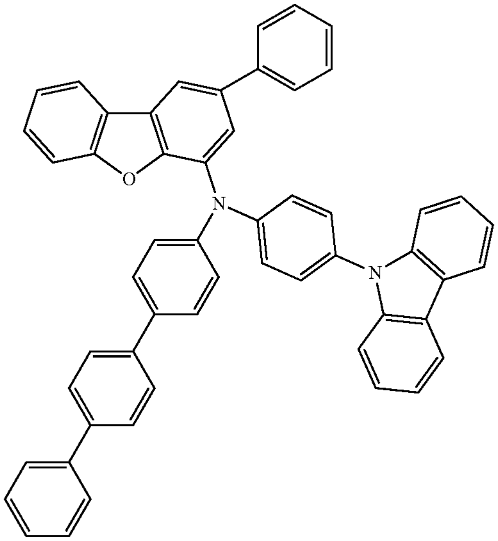
H-1-7
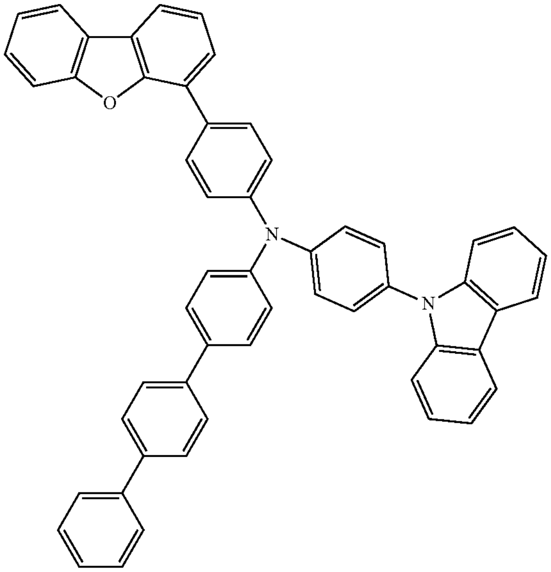
H-1-8
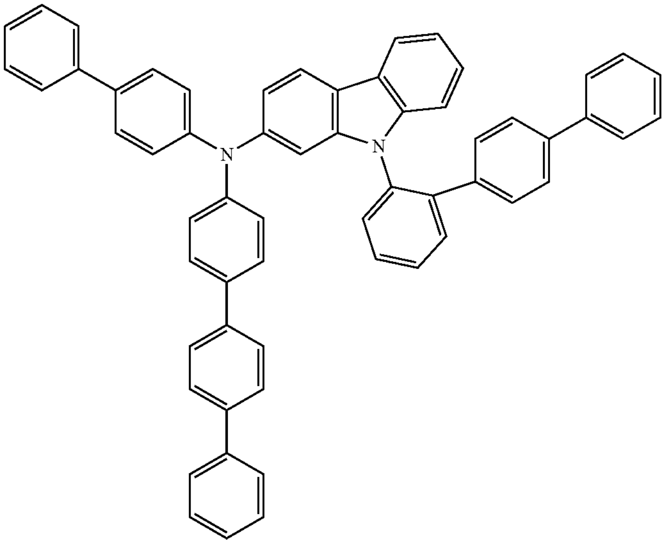

-continued
H-1-9
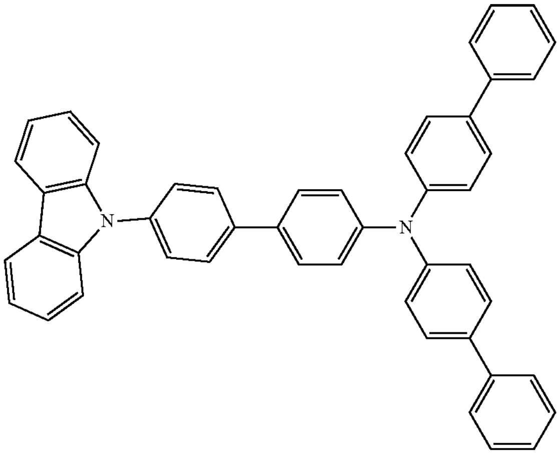
H-1-10
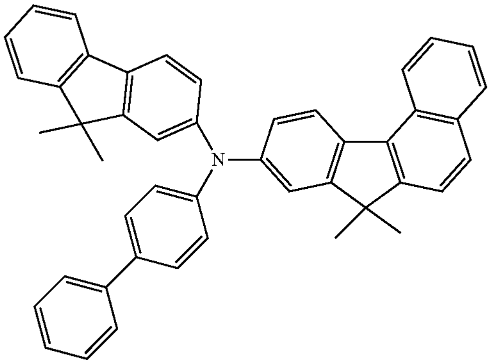
H-1-11
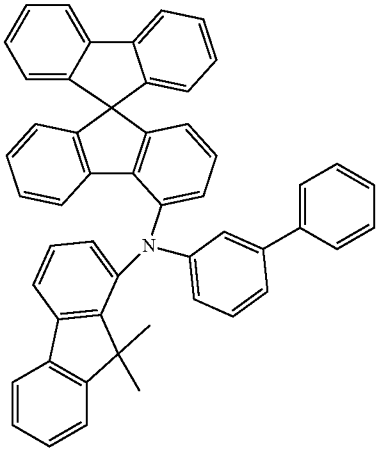

-continued
H-1-12
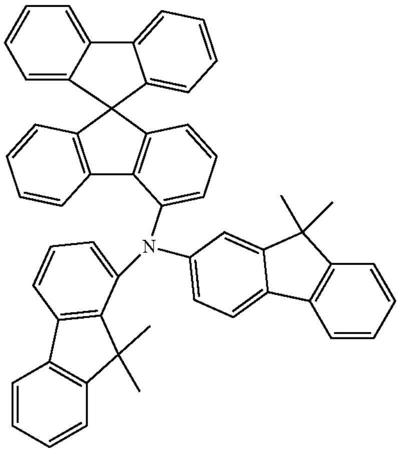
H-1-13
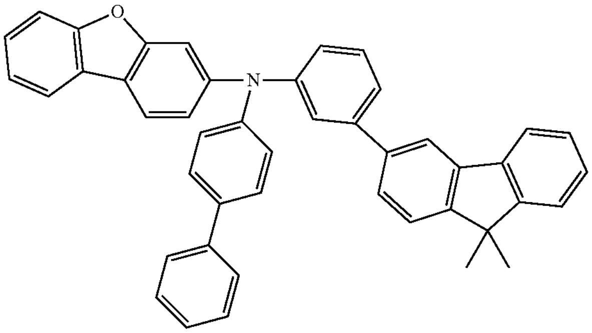
H-1-14
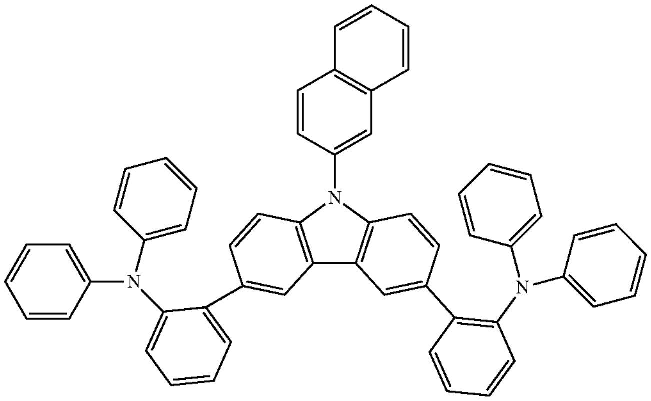

-continued
H-1-15
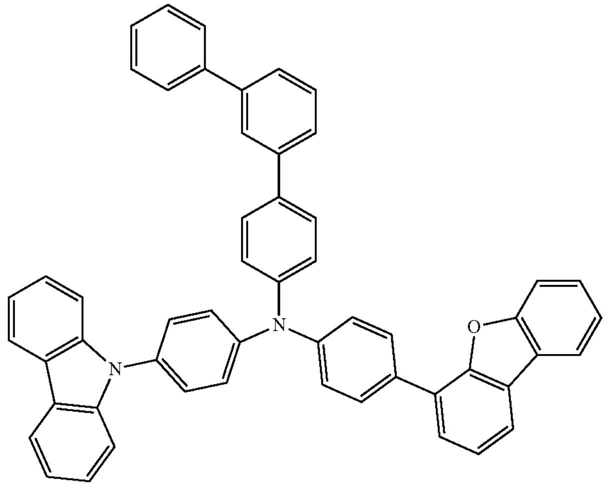
H-1-16
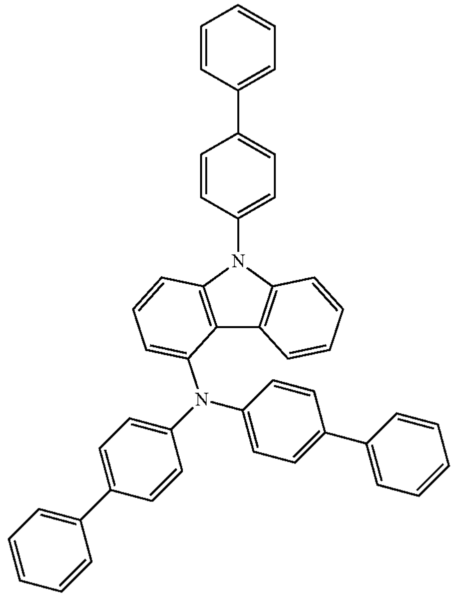
H-1-17
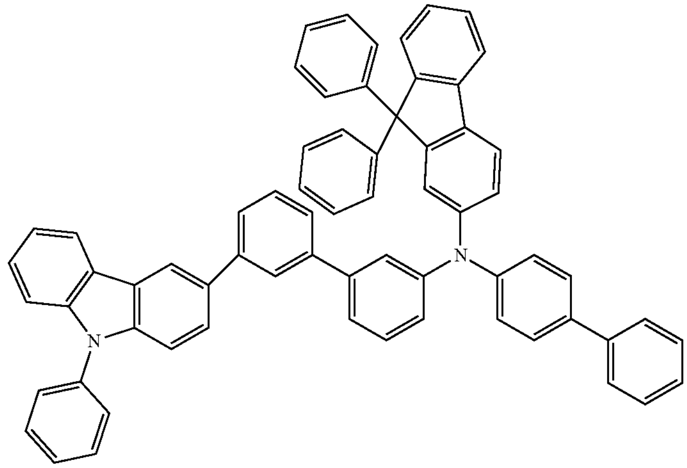

-continued

H-1-18

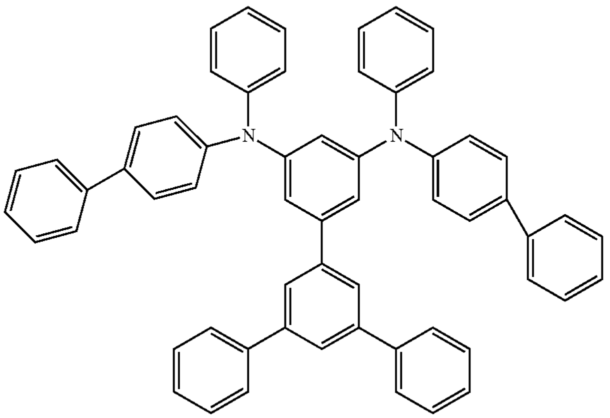

H-1-19

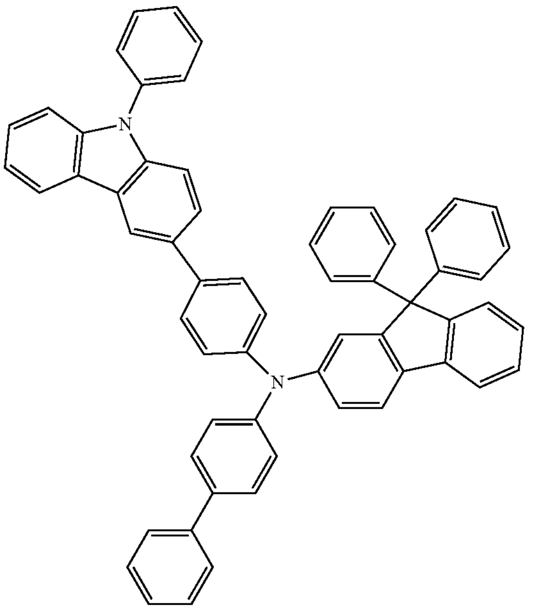

The hole transport region HTR may include a phthalocyanine compound such as copper phthalocyanine, N[1],N[1]'-([1,1'-biphenyl]-4,4'-diyl)bis(N[1]-phenyl-N[4],N[4]-di-m-tolyl-benzene-1,4-diamine) (DNTPD), 4,4',4"-[tris(3-methylphenyl)phenylamino] triphenylamine (m-MTDATA), 4,4',4"-tris(N,N-diphenylamino)triphenylamine (TDATA), 4,4',4"-tris[N (1-naphthyl)-N-phenylamino]-triphenylamine (1-TNATA), 4,4',4"-tris[N (2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl) borate], and dipyrazino[2,3-f:2',3'-h]quinoxaline-2,3,6,7,10,11-hexacarbonitrile (HAT-CN).

The hole transport region HTR may include, for example, carbazole derivatives such as N-phenyl carbazole and polyvinyl carbazole, fluorene-based derivatives, N,N'-bis(3-methylphenyl)-N,N'-diphenyl-[1,1'-biphenyl]-4,4'-diamine (TPD), triphenylamine-based derivatives such as 4,4',4"-tris (N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), 1,3-bis(N-carbazolyl)benzene (mCP), etc.

The hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region in at least one of a hole injection layer HIL, a hole transport layer HTL, and an electron blocking layer EBL.

A thickness of the hole transport region HTR may be in a range of about 100 Å to about 10,000 Å. For example, the thickness of the hole transport region HTR may be in a range of about 100 Å to about 5,000 Å. A thickness of the hole injection region HIL may be, for example, in a range of about 30 Å to about 1,000 Å. A thickness of the hole transport layer HTL may be in a range of about 30 Å to about 1,000 Å. For example, a thickness of the electron blocking layer EBL may be in a range of about 10 Å to about 1,000 Å. If the thicknesses of the hole transport region HTR, the hole injection layer HIL, the hole transport layer HTL, and the electron blocking layer EBL satisfy the above-described ranges, satisfactory hole transport properties may be achieved without substantial increase of a driving voltage.

The hole transport region HTR may further include a charge generating material to increase conductivity in addition to the above-described materials. The charge generating material may be dispersed uniformly or non-uniformly in the hole transport region HTR. The charge generating material may be, for example, a p-dopant. The p-dopant may include at least one of quinone derivatives, metal oxides, and cyano group-containing compounds, without limitation. For example, non-limiting examples of the p-dopant may include quinone derivatives such as tetracyanoquinodimethane (TCNQ) and 2,3,5,6-tetrafluoro-7,7',8,8-tetracyanoquinodimethane (F4-TCNQ), metal oxides such as tungsten oxide and molybdenum oxide, etc. However, embodiments are not limited thereto.

As described above, the hole transport region HTR may further include at least one of a hole buffer layer (not shown) and an electron blocking layer EBL in addition to the hole injection layer HIL and the hole transport layer HTL. The hole buffer layer (not shown) may compensate for a resonance distance according to a wavelength of light emitted from an emission layer EML and may increase light emitting efficiency. As materials included in the hole buffer layer (not shown), materials which may be included in the hole transport region HTR may be used. The electron blocking layer EBL may block the injection of electrons from an electron transport region ETR to a hole transport region HTR.

The emission layer EML is provided on the hole transport region HTR. The emission layer EML may have a thickness, for example, in a range of about 100 Å to about 1,000 Å. For example, the emission layer EML may have a thickness in a range of about 100 Å to about 300 Å. The emission layer EML may have a layer formed using a single material, a layer formed using different materials, or a multilayer structure having layers formed using different materials.

In the specification, the term "substituted or unsubstituted" as used herein may mean a group that is substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. Each of the substituents listed above may themselves be substituted or unsubstituted. For example, a biphenyl group may be interpreted as an aryl group or as a phenyl group substituted with a phenyl group.

In the specification, the term "combined with an adjacent group to form a ring" may mean a group that is combined with an adjacent group to form a substituted or unsubstituted hydrocarbon ring, or a substituted or unsubstituted heterocycle. The hydrocarbon ring may include an aliphatic hydrocarbon ring and an aromatic hydrocarbon ring. The heterocycle may include an aliphatic heterocycle and an aromatic heterocycle. The hydrocarbon ring and the heterocycle may each be monocyclic or polycyclic. A ring formed by groups being combined with each other may be combined with another ring to form a spiro structure.

In the specification, the term "adjacent group" may mean a substituent substituted for an atom which is directly bonded to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as "adjacent groups" to each other, and two ethyl groups in 1,1-diethylcyclopentane may be interpreted as "adjacent groups" to each other. For example, two methyl groups in 4,5-dimethylphenanthrene may be interpreted as "adjacent groups" to each other.

In the specification, examples of a halogen atom may include a fluorine atom, a chlorine atom, a bromine atom, and an iodine atom.

In the specification, an alkyl group may be a linear, a branched, or a cyclic type. The number of carbon atoms in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, a s-butyl group, a t-butyl group, an i-butyl group, a 2-ethylbutyl group, a 3,3-a dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but embodiments are not limited thereto.

In the specification, a hydrocarbon ring group may be any functional group or substituent derived from an aliphatic hydrocarbon ring, or an any functional group or substituent derived from an aromatic hydrocarbon ring. The number of ring-forming carbon atoms in the hydrocarbon ring group may be 5 to 60, 5 to 30, or 5 to 20.

In the specification, an aryl group may be any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinophenol group, a sexiphenyl group, a triphenylenyl group, a pyrenyl group, a benzofluoranthenyl group, a chrysenyl group, etc., but embodiments are not limited thereto.

In the specification, a fluorenyl group may be substituted, and two substituents may be combined with each other to form a spiro structure. Examples of substituted fluorenyl groups are as follows. However, embodiments are not limited thereto.

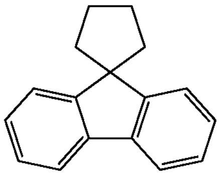
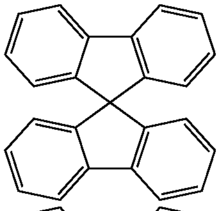
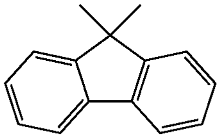
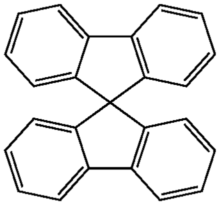

In the specification, a heterocyclic group may be any functional group or substituent derived from a ring containing at least one of B, O, N, P, Si, and S as a heteroatom. The heterocyclic group may be an aliphatic heterocyclic group or an aromatic heterocyclic group. The aromatic heterocyclic group may be a heteroaryl group. The aliphatic heterocyclic group and the aromatic heterocyclic group may each be monocyclic or polycyclic.

In the specification, a heterocyclic group may include at least one of B, O, N, P, Si, and S as a heteroatom. If the heterocyclic group includes two or more heteroatoms, the two or more heteroatoms may be the same as or different from each other. The heterocyclic group may be a monocyclic heterocyclic group or a polycyclic heterocyclic group, and the heterocyclic group may be a heteroaryl group. The number of ring-forming carbon atoms in the heterocyclic group may be 2 to 30, 2 to 20, or 2 to 10.

In the specification, an aliphatic heterocyclic group may include at least one of B, O, N, P, Si, and S as a heteroatom. The number of ring-forming carbon atoms in the aliphatic heterocyclic group may be 2 to 30, 2 to 20, or 2 to 10. Examples of the aliphatic heterocyclic group may include an oxirane group, a tyran group, a pyrrolidine group, a piperidine group, a tetrahydrofuran group, a tetrahydrothiophene group, a thian group, a tetrahydropyran group, a 1,4-dioxane group, etc., but embodiments are not limited thereto.

In the specification, a heteroaryl group may include at least one of B, O, N, P, Si, and S as a heteroatom. When the heteroaryl group contains two or more heteroatoms, the two or more heteroatoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but embodiments are not limited thereto.

In the specification, the above description with respect to the aryl group may be applied to an arylene group, except that the arylene group is a divalent group.

In the specification, the above description with respect to the heteroaryl group may be applied to a heteroarylene group, except that the heteroarylene group is a divalent group.

In the specification, a silyl group may be an alkylsilyl group or an arylsilyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc. However, embodiments are not limited thereto.

In the specification, the number of carbon atoms in the amino group is not specifically limited, but may be 1 to 30. The amino group may may be an alkyl amino group, an aryl amino group, or a heteroaryl amino group. Examples of the amino group may include a methylamino group, a dimethylamino group, a phenylamino group, a diphenylamino group, a naphthylamino group, a 9-methyl-anthracenylamino group, a triphenylamino group, etc., but embodiments are not limited thereto.

In the specification, a thio group may be an alkylthio group or an arylthio group. The thio group may be a sulfur atom that is bonded to an alkyl group or an aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, but embodiments are not limited thereto.

In the specification, an oxy group may include an alkoxy group or an aryl oxy group. For example, in the oxy group, the above-defined alkyl group or aryl group may be combined with an oxygen atom. The oxy group may be an oxygen atom that is bonded to an alkyl group or an aryl group as defined above. Examples of the oxy group may include methoxy, ethoxy, n-propoxy, isopropoxy, butoxy, pentyloxy, hexyloxy, octyloxy, nonyloxy, decyloxy, benzyloxy, etc. However, embodiments are not limited thereto.

In the specification, a boron group may include an alkyl boron group or an aryl boron group. The boron group may be a boron atom that is bonded to an alkyl group or an aryl group as defined above. Examples of the boron group may include a trimethylboron group, a triethylboron group, a t-butyldimethylboron group, a triphenylboron group, a diphenylboron group, a phenylboron group, etc., but embodiments are not limited thereto.

In the specification, an alkenyl group may be a hydrocarbon group that includes at least one carbon-carbon double bond in the middle or end of an alkyl group having 2 or more carbon atoms. The alkenyl group may be a linear chain or a branched chain. The number of carbon atoms is not specifically limited, but may be 2 to 30, 2 to 20 or 2 to 10. Examples of the alkenyl group may include a vinyl group, a 1-butenyl group, a 1-pentenyl group, a 1,3-butadienyl aryl group, a styrenyl group, a styrylvinyl group, etc., but embodiments are not limited thereto.

In the specification, an alkynyl group may be a hydrocarbon group including at least one carbon-carbon triple bond in the middle or end of an alkyl group having 2 or more carbon atoms. The alkynyl group may be a linear chain or a branched chain. The number of carbon atoms is not specifically limited, but may be 2 to 30, 2 to 20 or 2 to 10. Examples of the alkynyl group may include an ethynyl group, a propynyl group, etc., but embodiments are not limited thereto.

In the specification, a direct linkage may be a single bond.

In the specification, —* as used herein represents a binding site to a neighboring atom.

The organic electroluminescence device ED of an embodiment may include the polycyclic compound according to an embodiment. The polycyclic compound of an embodiment may be represented by Formula 1 below.

[Formula 1]

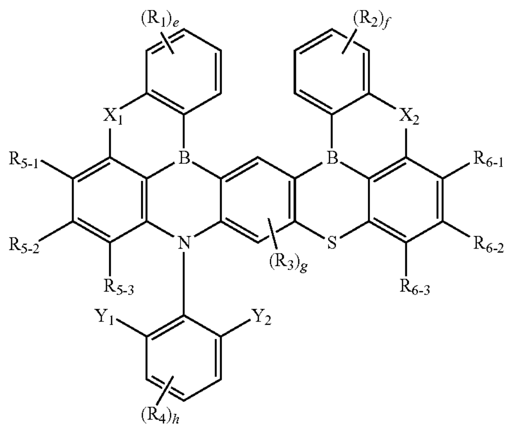

In Formula 1, $X_1$ and $X_2$ may each independently be O, S, or $N(R_7)$, and $R_7$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula 1, $R_1$ to $R_4$, $R_{5-1}$ to $R_{5-3}$, and $R_{6-1}$ to $R_{6-3}$ may each independently be a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula 1, e and f may each independently be an integer from 0 to 4. If e is 2 or more, multiple $R_1$ groups may be the same or different, and if f is 2 or more, multiple $R_2$ groups may be the same or different.

In Formula 1, g may be an integer from 0 to 2. If g is 2, multiple $R_3$ groups may be the same or different.

In Formula 1, h may be an integer from 0 to 3. If h is 2 or more, multiple $R_4$ groups may be the same or different.

In Formula 1, $Y_1$ and $Y_2$ may each independently be a hydrogen atom, a deuterium atom, a substituted or unsubstituted alkyl group of 6 to 20 carbon atoms, a substituted or unsubstituted aryl group of 6 to 30 ring-forming carbon atoms, or a substituted or unsubstituted heteroaryl group of 2 to 30 ring-forming carbon atoms, and at least one of $Y_1$ and $Y_2$ may be a substituted or unsubstituted alkyl group of 6 to 20 carbon atoms, a substituted or unsubstituted aryl group of 6 to 30 ring-forming carbon atoms, or a substituted or unsubstituted heteroaryl group of 2 to 30 ring-forming carbon atoms.

In an embodiment, at least one of $X_1$ and $X_2$ in Formula 1 may be $N(R_7)$, and $R_7$ may be a substituted or unsubstituted aryl group of 6 to 30 ring-forming carbon atoms, or a substituted or unsubstituted heteroaryl group of 2 to 30 ring-forming carbon atoms. For example, the polycyclic compound represented by Formula 1 may be represented by any one of Formula 2-1 to Formula 2-5 below.

[Formula 2-1]

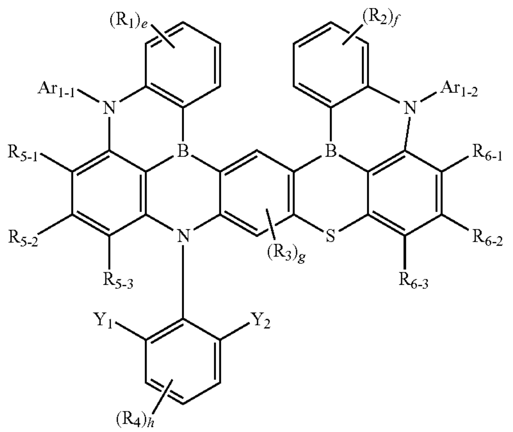

[Formula 2-2]

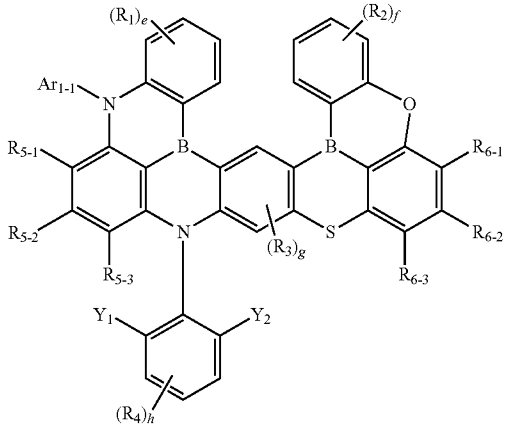

-continued

[Formula 2-3]

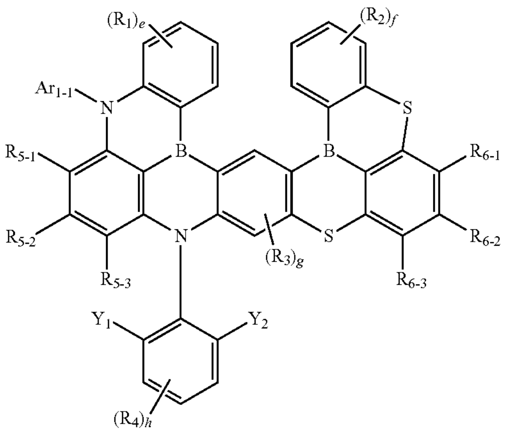

[Formula 2-4]

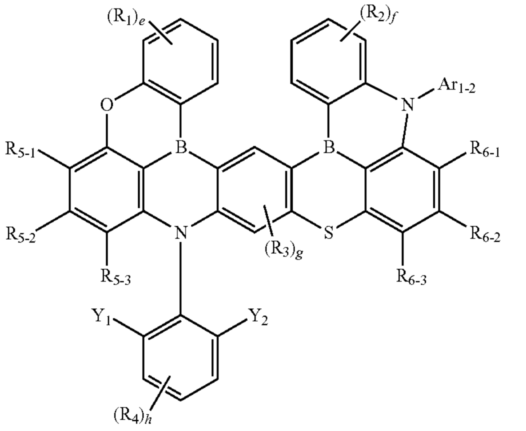

[Formula 2-5]

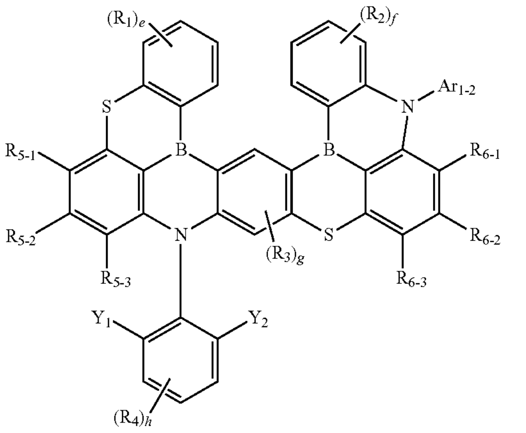

In Formula 2-1 to Formula 2-5, $Ar_{1-1}$ and $Ar_{1-2}$ may each independently be a substituted or unsubstituted aryl group of 6 to 30 ring-forming carbon atoms, or a substituted or unsubstituted heteroaryl group of 2 to 30 ring-forming carbon atoms.

In Formula 2-1 to Formula 2-5, $R_1$ to $R_4$, $R_{5-1}$ to $R_{5-3}$, $R_{6-1}$ to $R_{6-3}$, $Y_1$, $Y_2$, and e to h may be the same as defined in connection with Formula 1.

In an embodiment, $Ar_{1-1}$ and $Ar_{1-2}$ may each independently be a group represented by any one of Formula 5-1 to Formula 5-3 below.

[Formula 5-1]

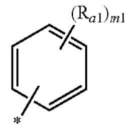

[Formula 5-2]

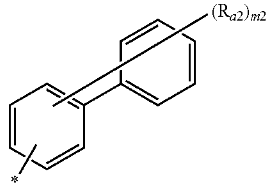

[Formula 5-3]

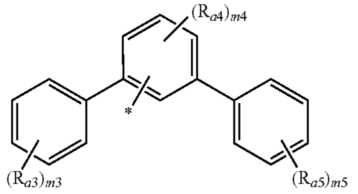

In Formulae 5-1 to Formula 5-3, Ral to Ras may each independently be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula 5-1, m1 may be an integer from 0 to 5. If m1 is 2 or more, multiple Ral groups may be the same or different.

In Formula 5-2, m2 may be an integer from 0 to 9. If m2 is 2 or more, multiple $R_{a2}$ groups may be the same or different.

In Formula 5-3, m3 may be an integer from 0 to 5. If m3 is 2 or more, multiple $R_{a3}$ groups may be the same or different.

In Formula 5-3, m4 may be an integer from 0 to 3. If m4 is 2 or more, multiple $R_{a4}$ groups may be the same or different.

In Formula 5-3, m5 may be an integer from 0 to 5. If m5 is 2 or more, multiple $R_{a5}$ groups may be the same or different.

In an embodiment, at least one of $R_{5-1}$ to $R_{5-3}$, and $R_{6-1}$ to $R_{6-3}$ of Formula 1 may be a substituted amine group.

In an embodiment, $R_{5-2}$ of Formula 1 may be a substituted amine group. For example, the polycyclic compound represented by Formula 1 may be represented by Formula 3-1 below.

[Formula 3-1]

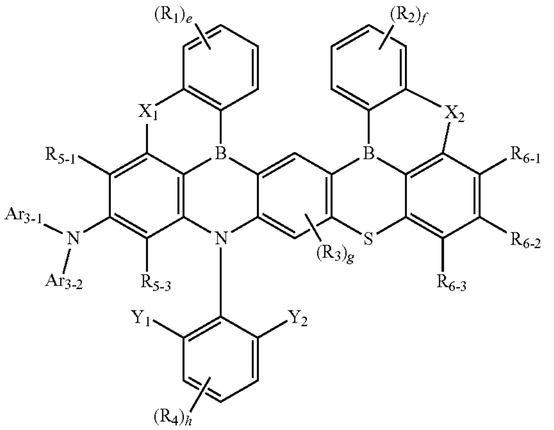

In Formulae 3-1, $Ar_{3-1}$ and $Ar_{3-2}$ may each independently be a substituted or unsubstituted aryl group of 6 to 30 ring-forming carbon atoms, and $X_1$, $X_2$, $R_1$ to $R_4$, $R_{5-1}$, $R_{5-3}$, $R_{6-1}$ to $R_{6-3}$, $Y_1$, $Y_2$, and e to h may be the same defined in connection with Formula 1.

In an embodiment, $R_{6-2}$ of Formula 1 may be a substituted amine group. For example, the polycyclic compound represented by Formula 1 may be represented by Formula 3-2 below.

[Formula 3-2]

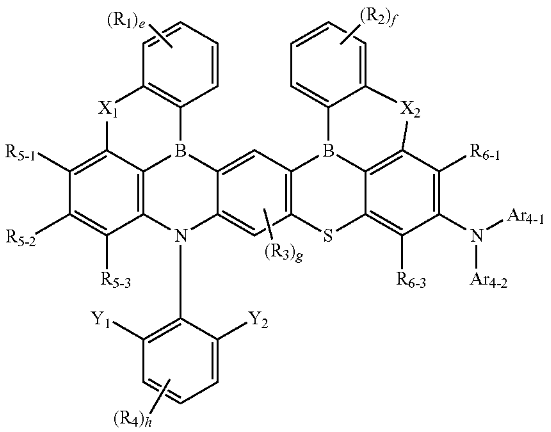

In Formulae 3-2, $Ar_{4-1}$ and $Ar_{4-2}$ may each independently be a substituted or unsubstituted aryl group of 6 to 30 ring-forming carbon atoms, and $X_1$, $X_2$, $R_1$ to $R_4$, $R_{5-1}$ to $R_{5-3}$, $R_{6-1}$, $R_{6-3}$, $Y_1$, $Y_2$, and e to h may be the same as defined in connection with Formula 1.

In an embodiment, $R_{5-2}$ and $R_{6-2}$ of Formula 1 may each be substituted amine groups. For example, the polycyclic compound represented by Formula 1 may be represented by Formula 4 below.

[Formula 4]

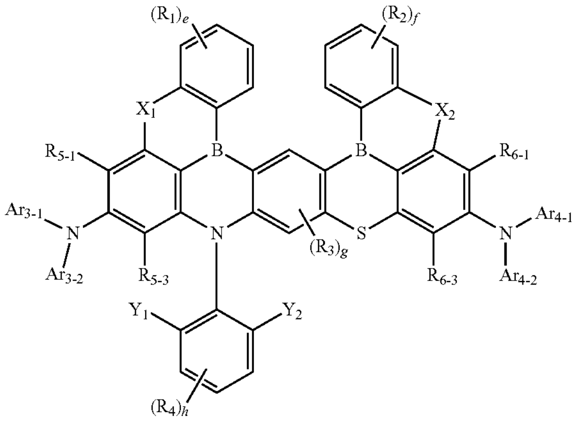

In Formula 4, $Ar_{3-1}$, $Ar_{3-2}$, $Ar_{4-1}$, and $Ar_{4-2}$ may each independently be a substituted or unsubstituted aryl group of 6 to 30 ring-forming carbon atoms, and $X_1$, $X_2$, $R_1$ to $R_4$, $R_{5-1}$, $R_{5-3}$, $R_{6-1}$, $R_{6-3}$, $Y_1$, $Y_2$, and e to h may be the same as defined in connection with Formula 1.

In an embodiment, in Formula 3-1 or Formula 4, $Ar_{3-1}$ and $Ar_{3-2}$ may each independently be a substituted or unsubstituted aryl group of 6 to 18 ring-forming carbon atoms.

In an embodiment, in Formula 3-2 or Formula 4, $Ar_{4-1}$ and $Ar_{4-2}$ may each independently be a substituted or unsubstituted aryl group of 6 to 18 ring-forming carbon atoms.

The polycyclic compound represented by Formula 1 according to an embodiment may be any one selected from Compound Group 1 below. However, embodiments are not limited thereto.

[Compound Group 1]
1
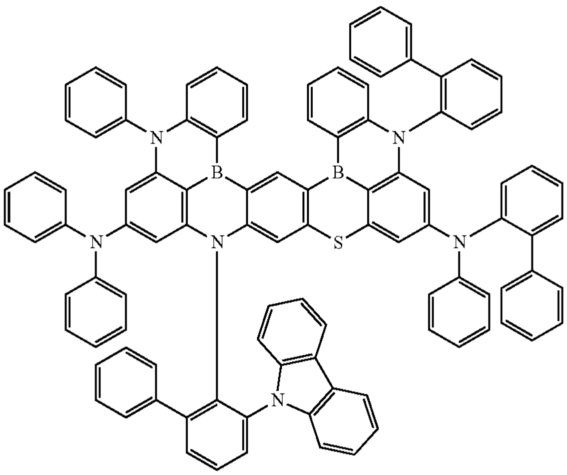
2
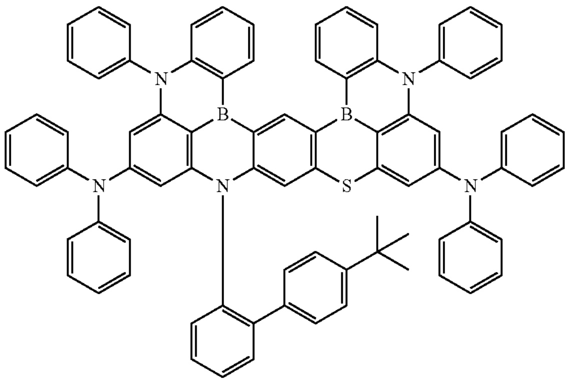
3
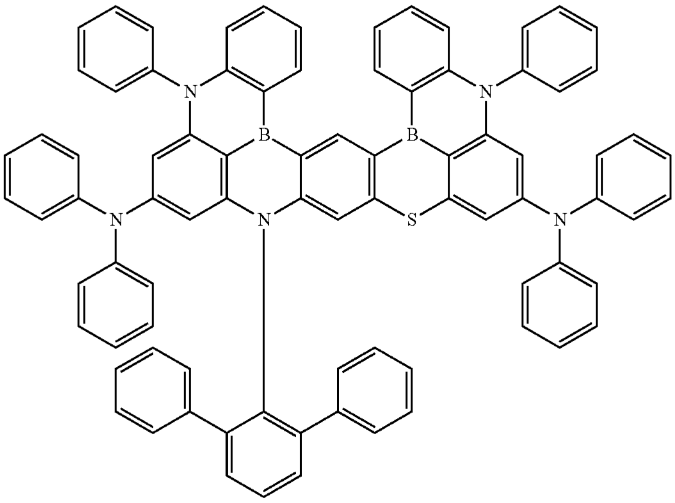
4
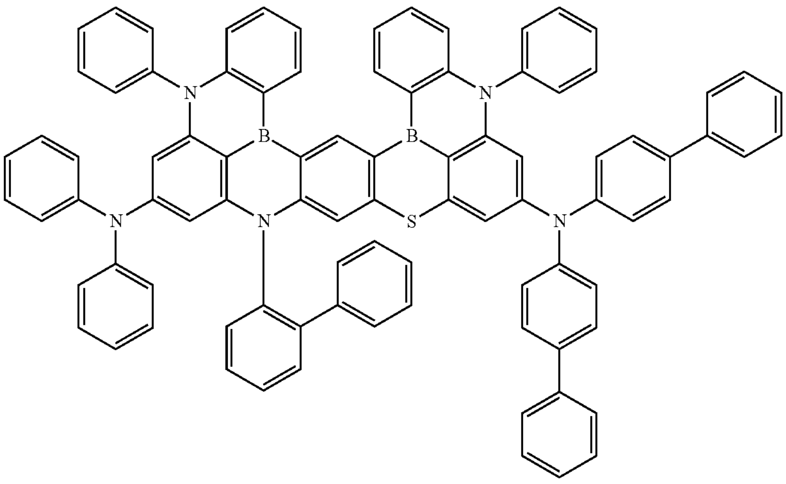

-continued
5
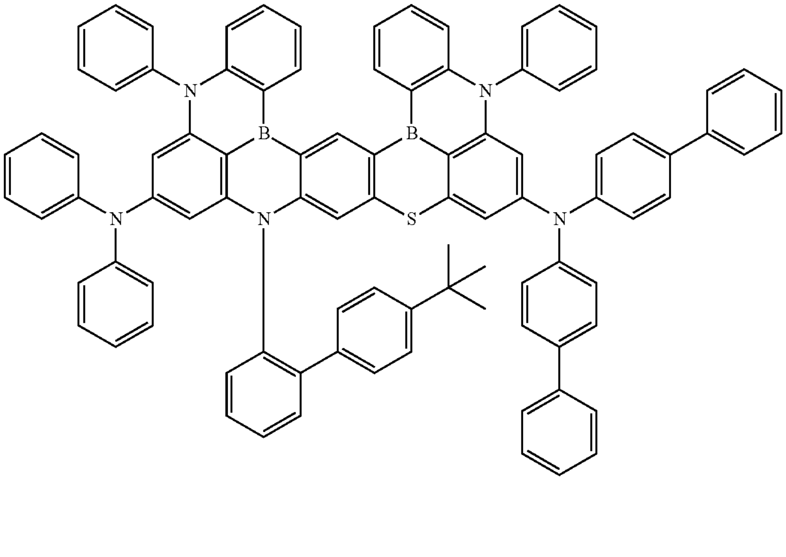
6
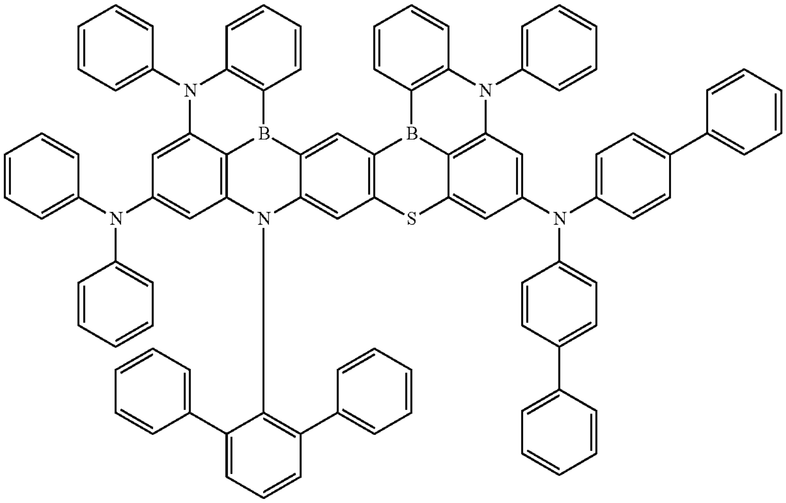
7
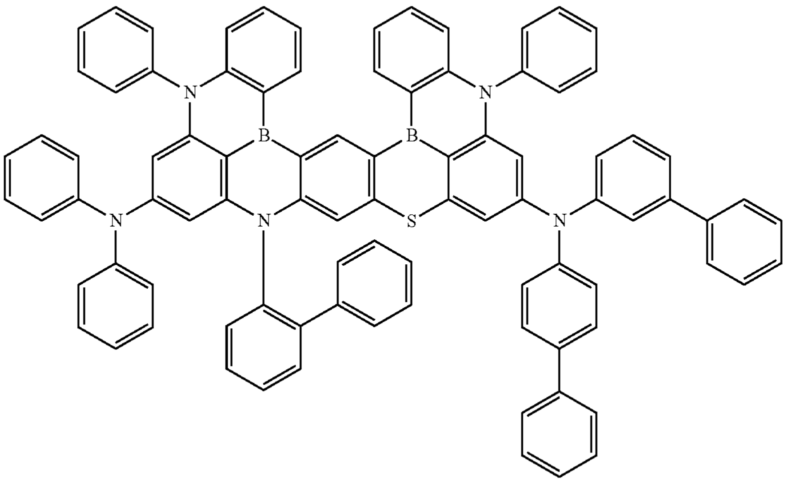

-continued
8
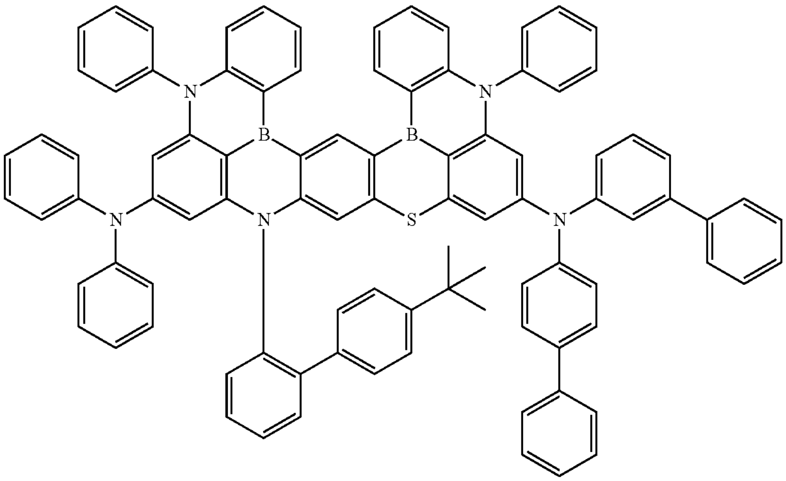
9
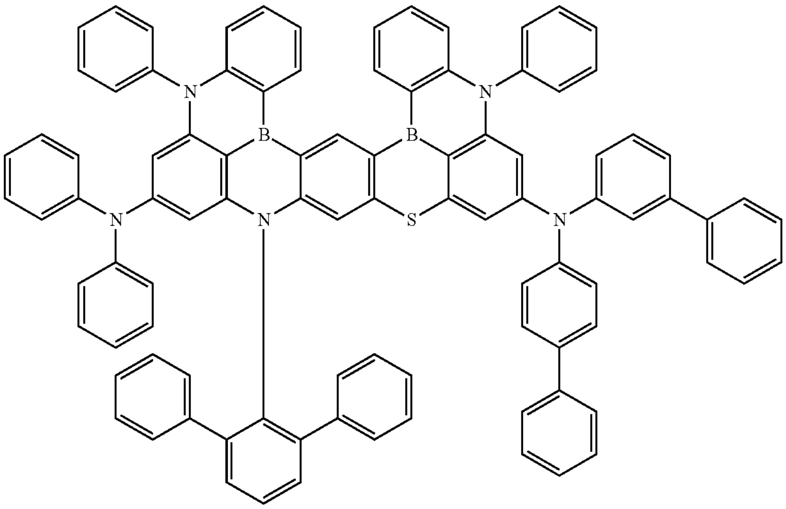
10
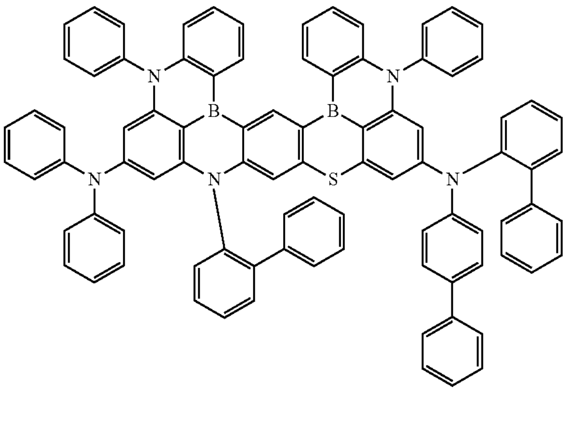
11
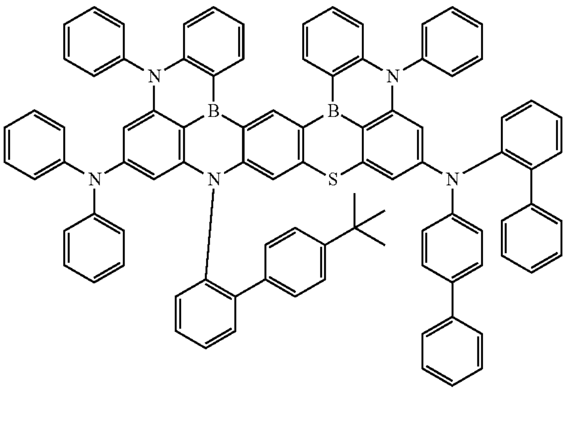

-continued
12
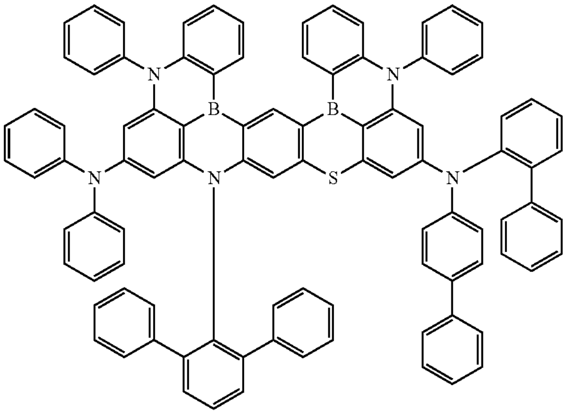
13
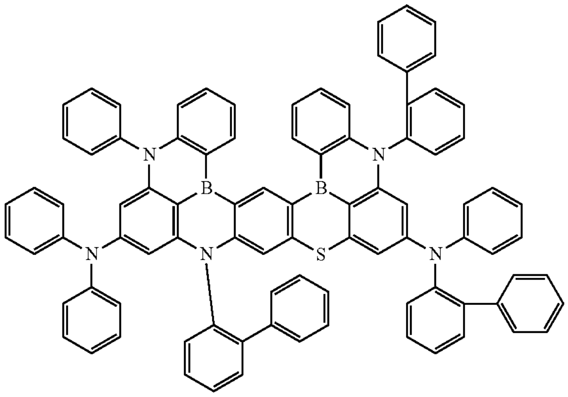
14
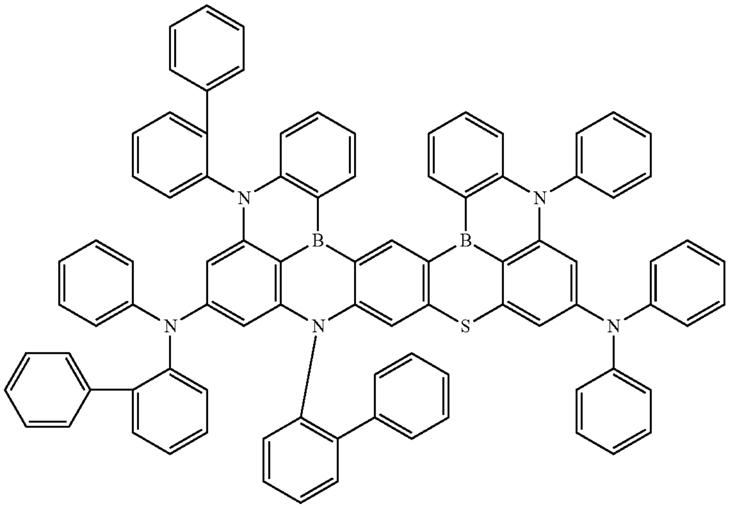
15
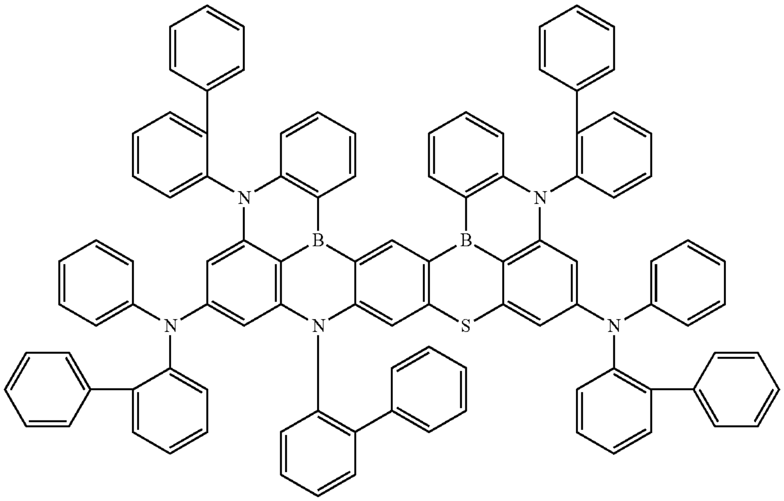

-continued
16
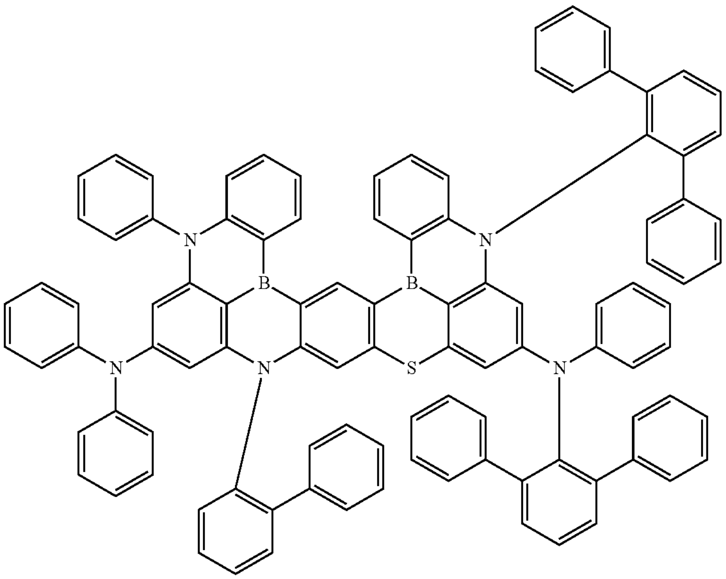
17
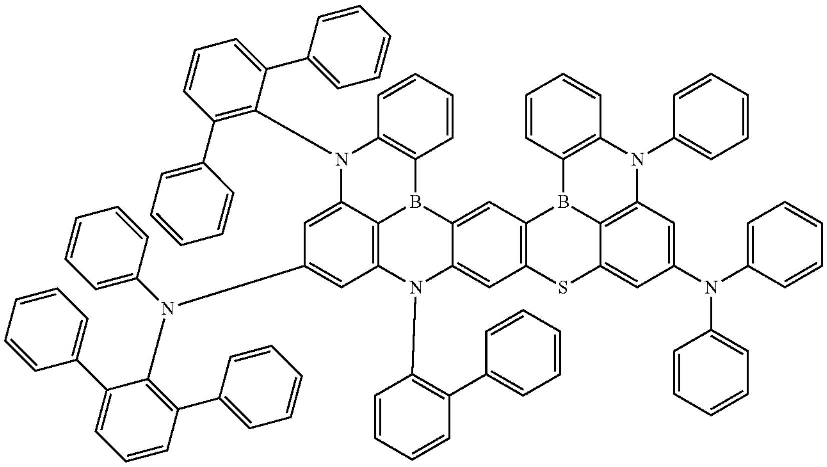
18
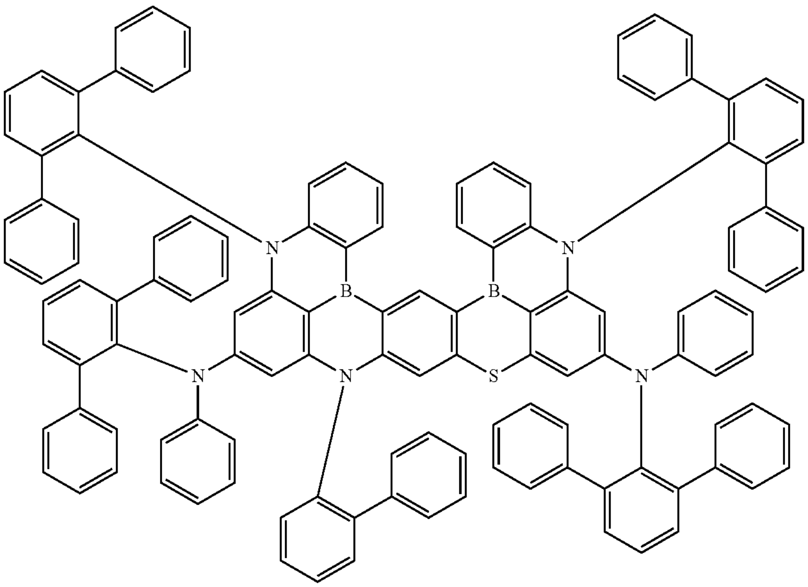

-continued
19
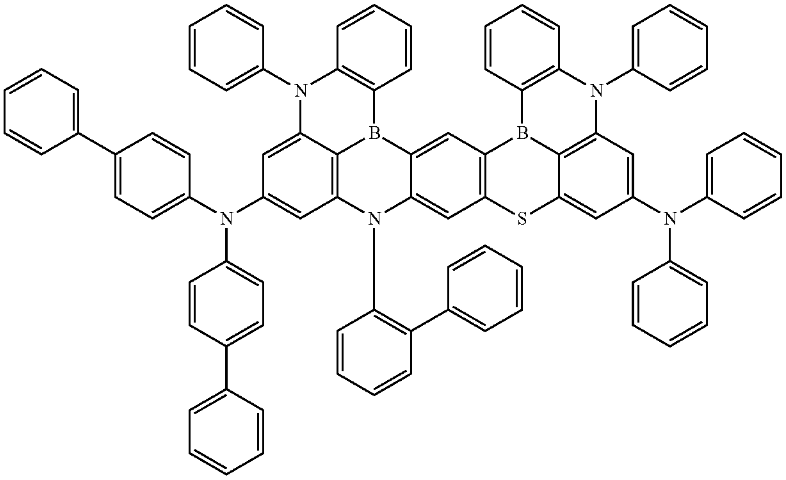
20
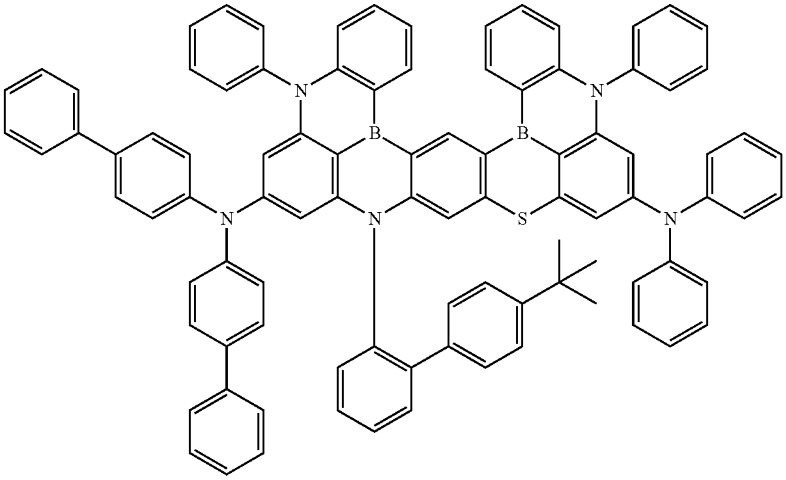
21
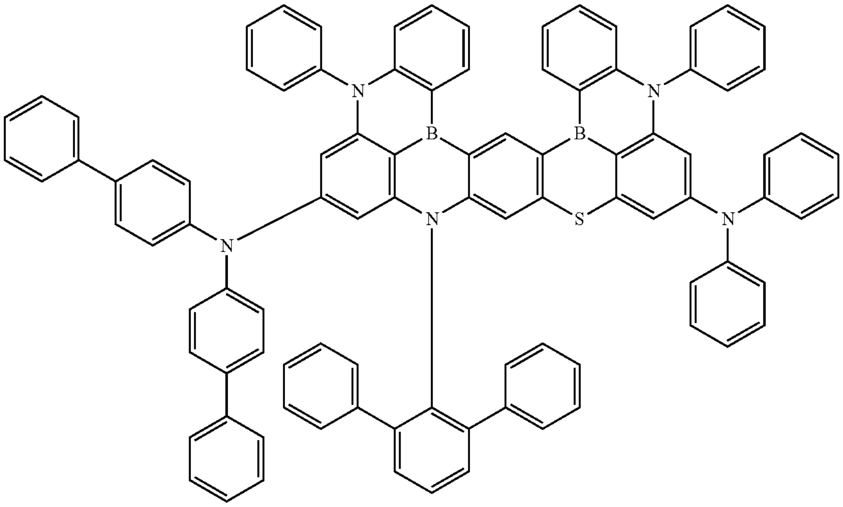

-continued
22
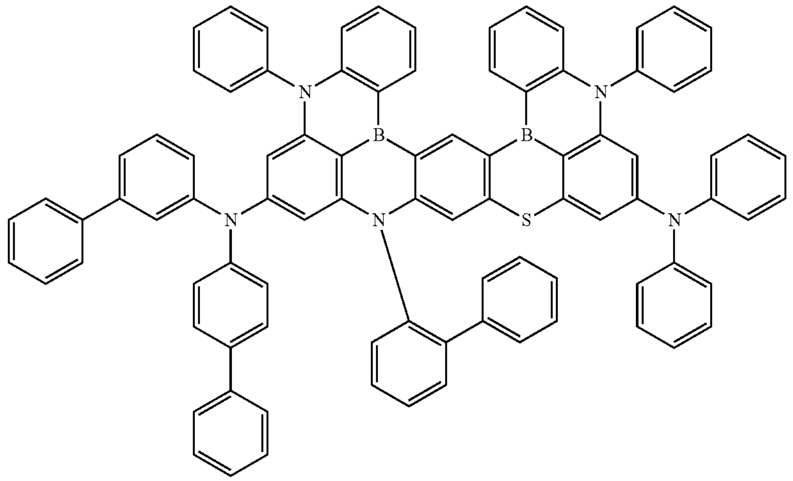
23
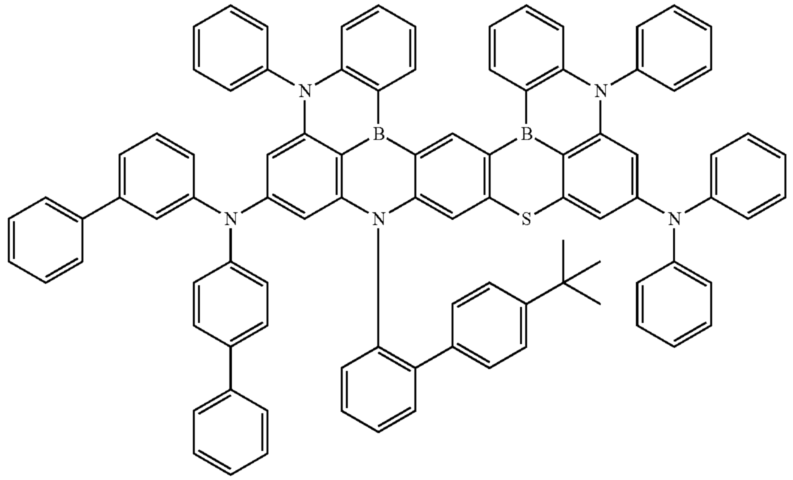
24
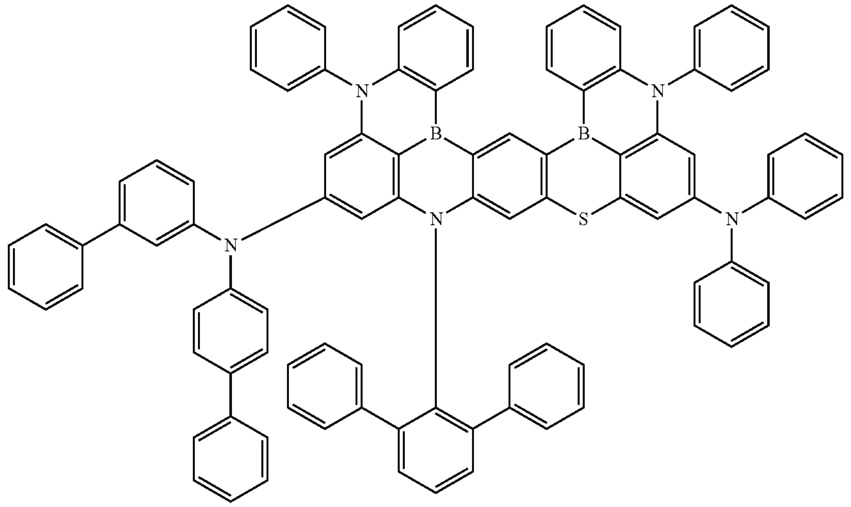

-continued
25
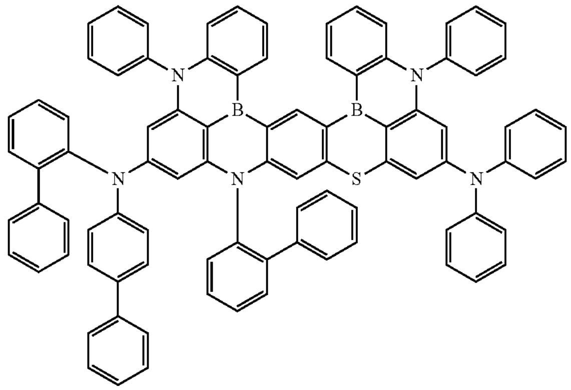
26
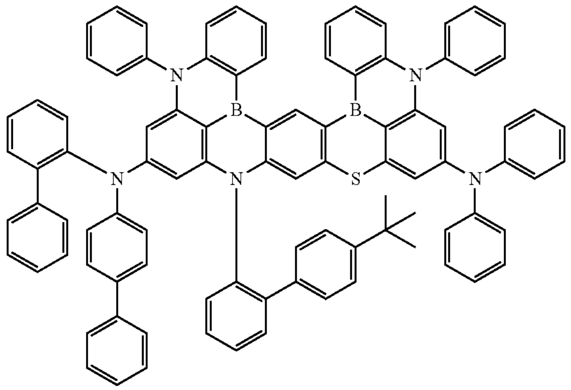
27
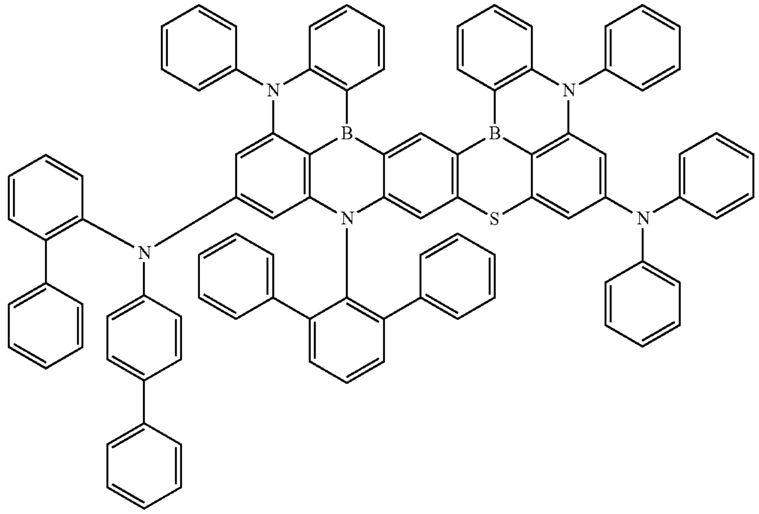
28
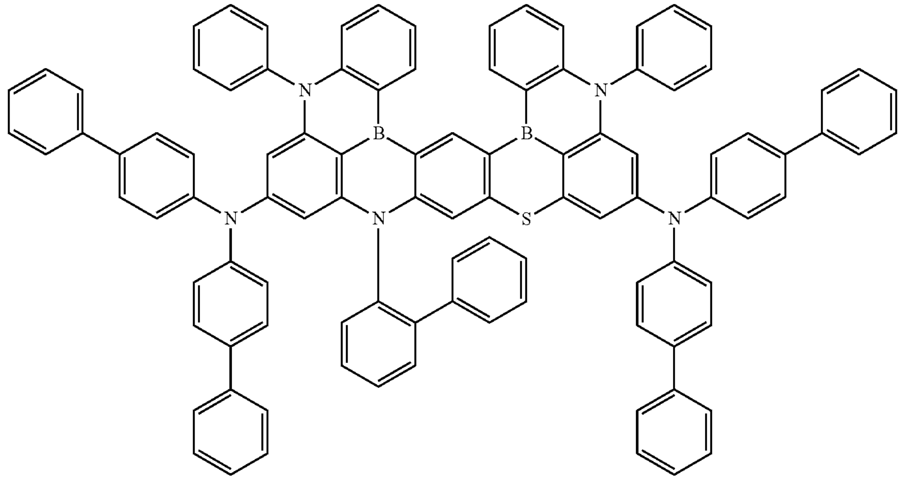

-continued
29
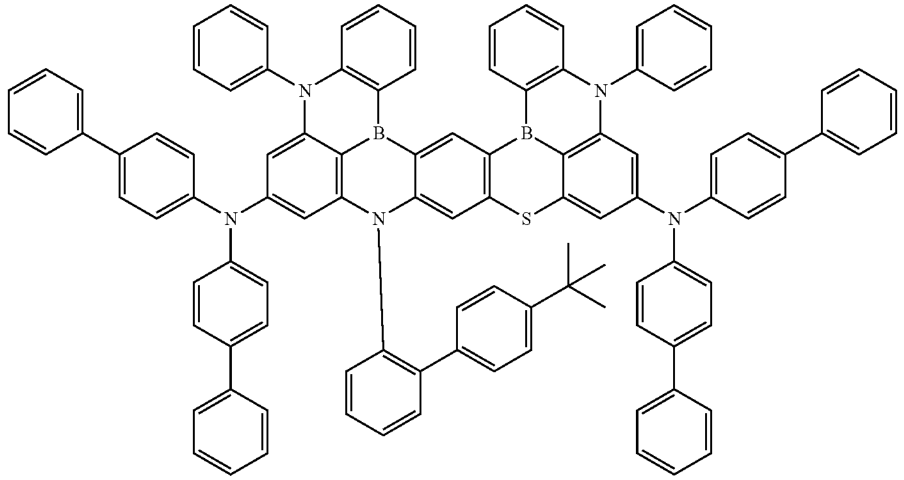
30
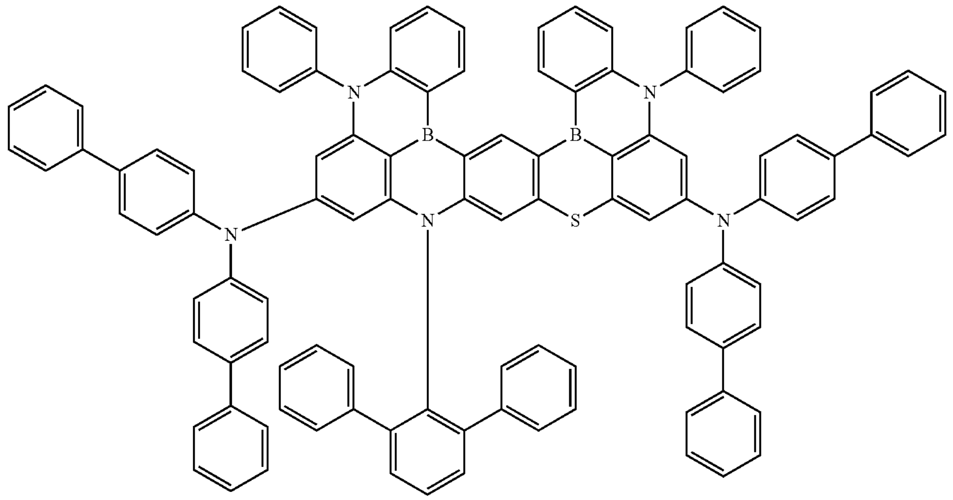
31
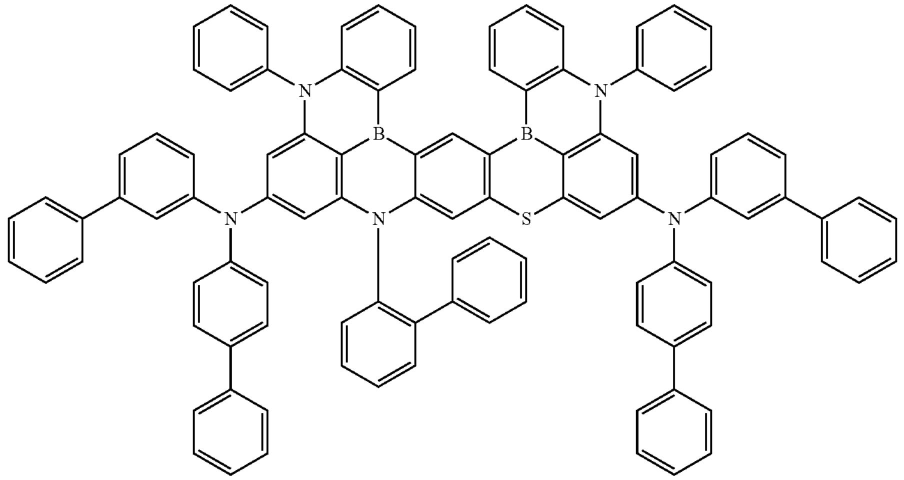

-continued
32
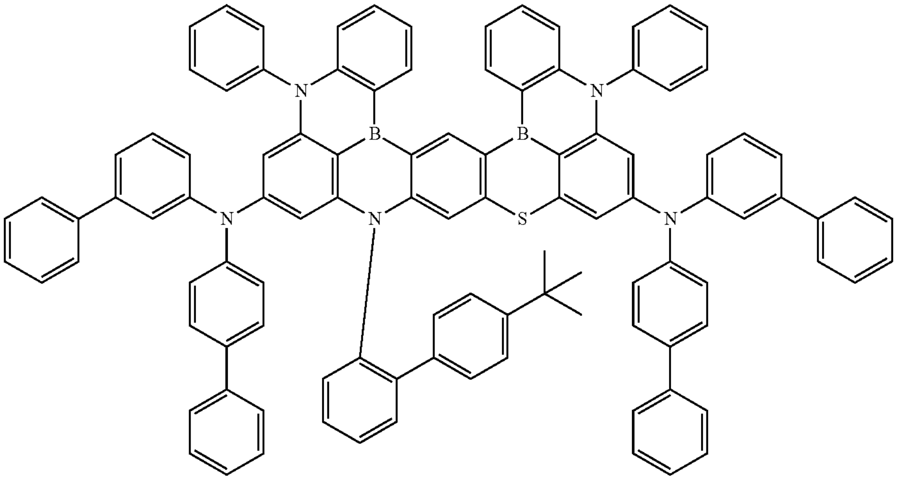
33
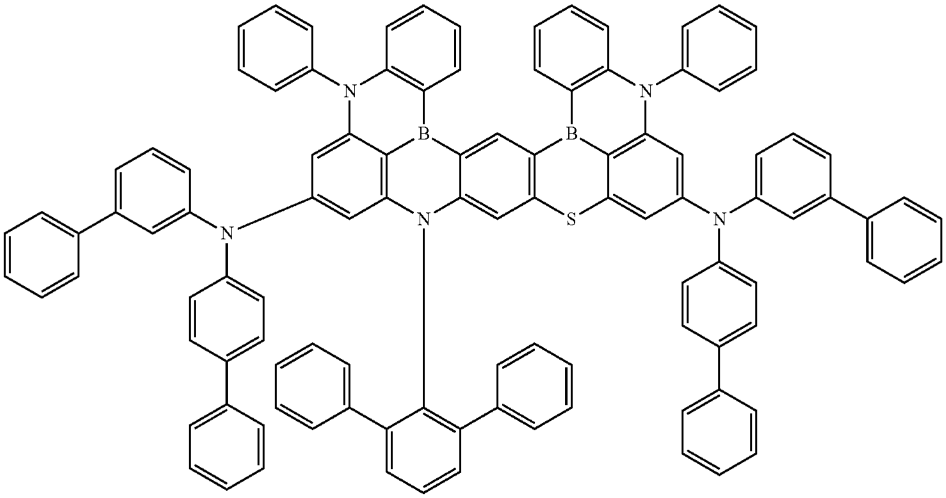
34
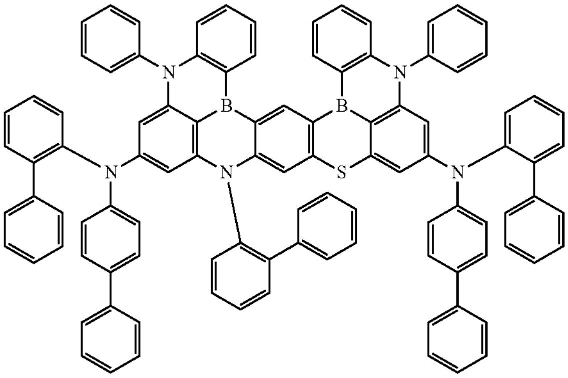
35
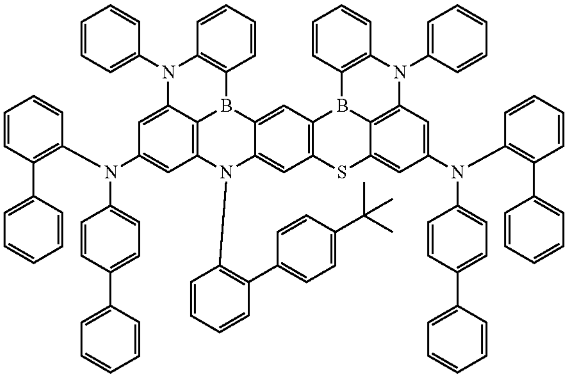

-continued
36
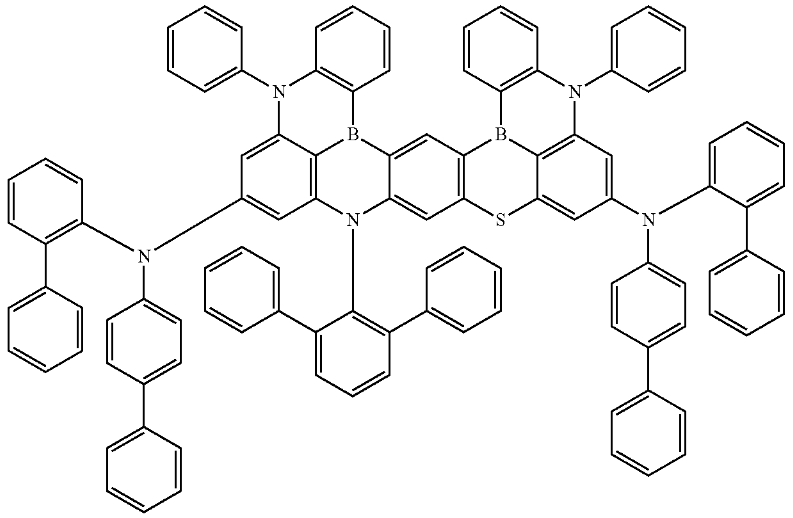
37
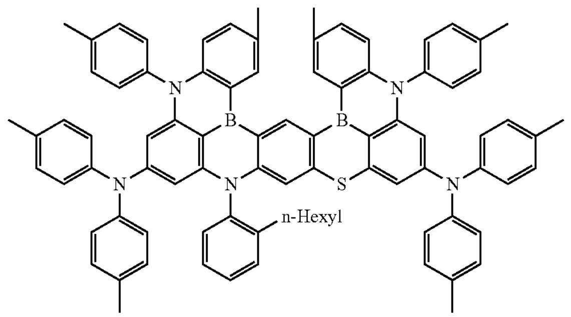
38
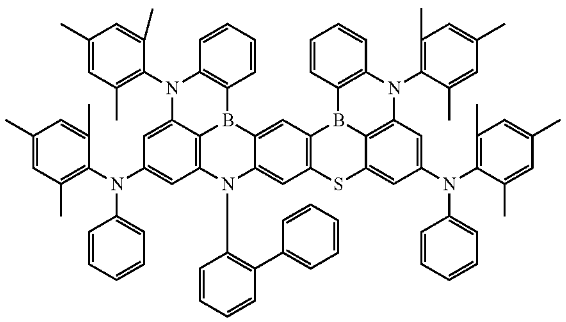
39
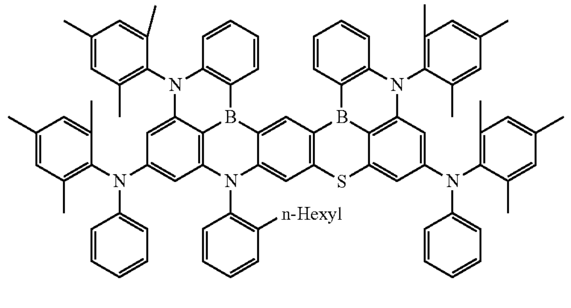
40
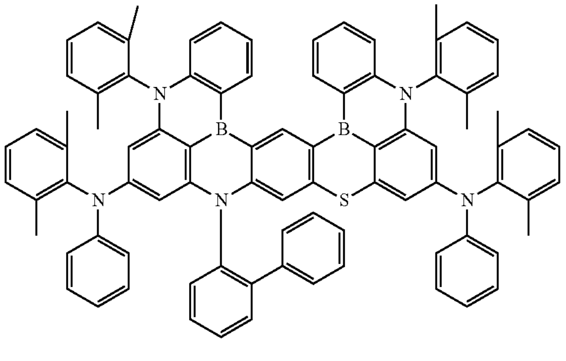

-continued
41
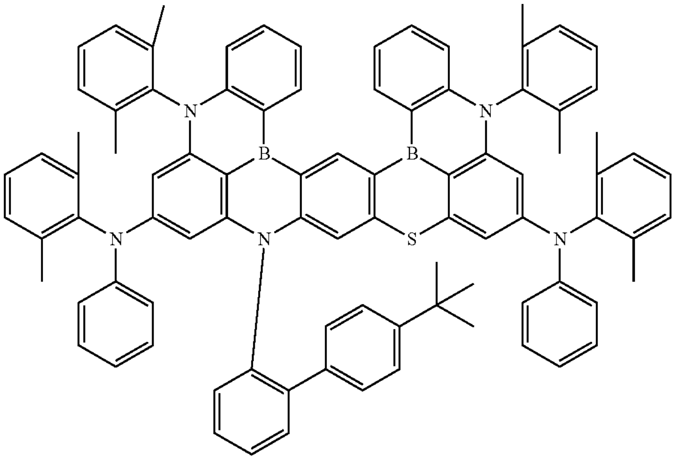
42
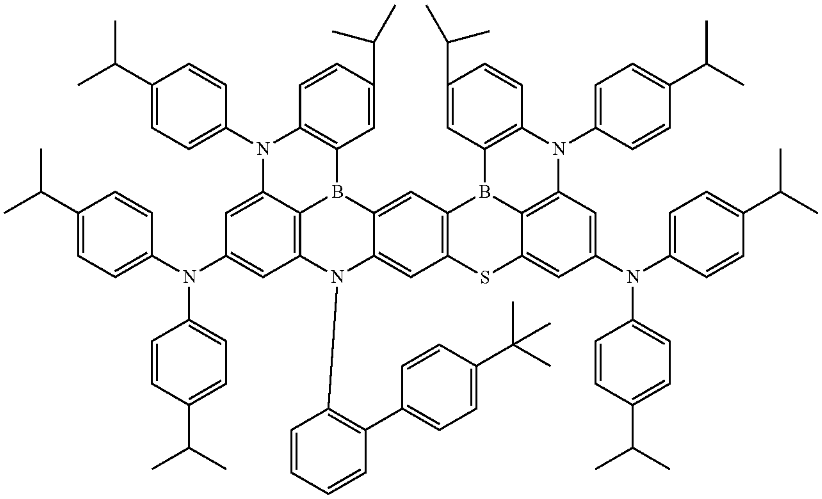
43
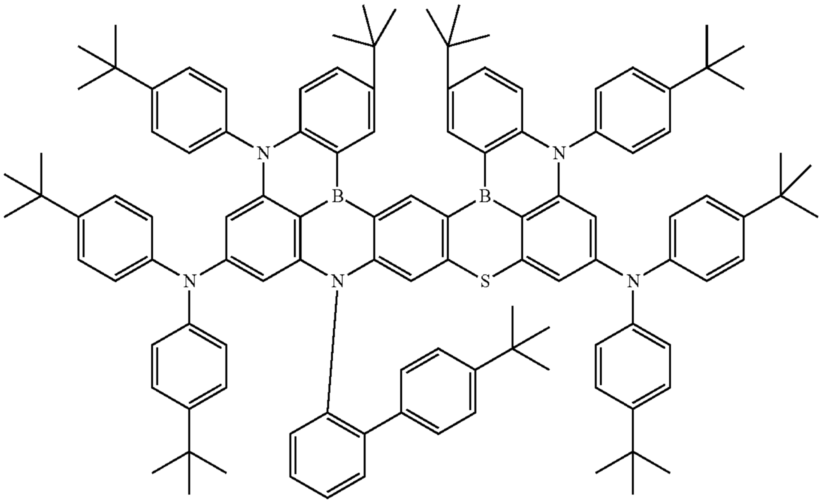

-continued
44
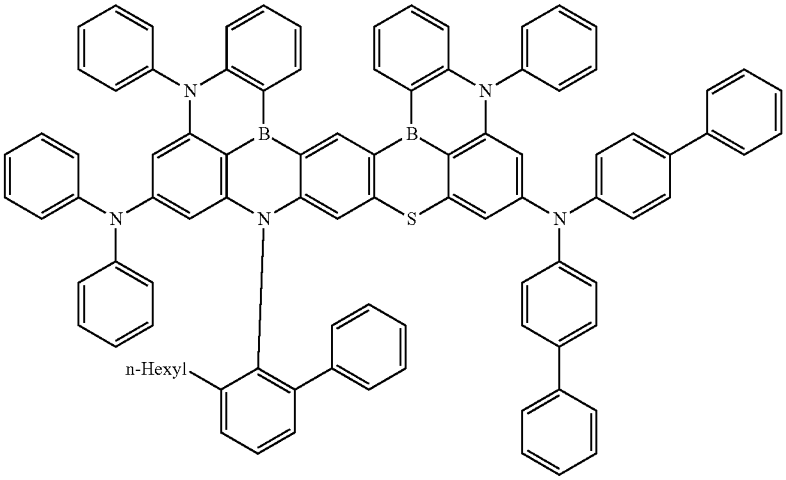
45
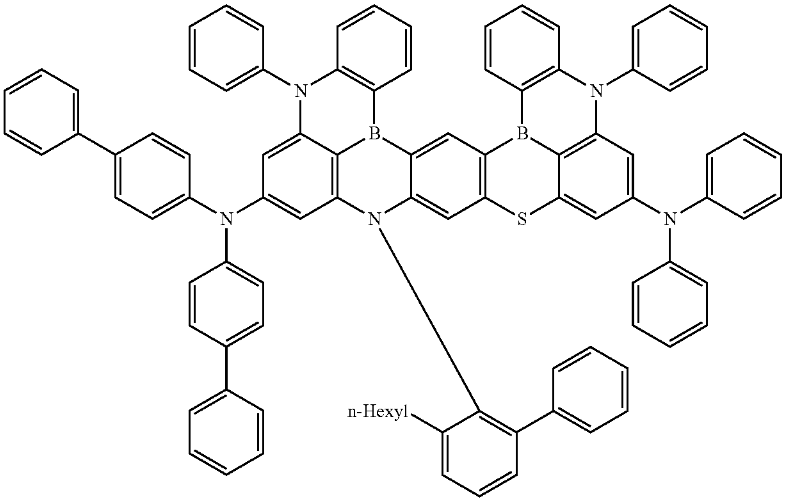
46
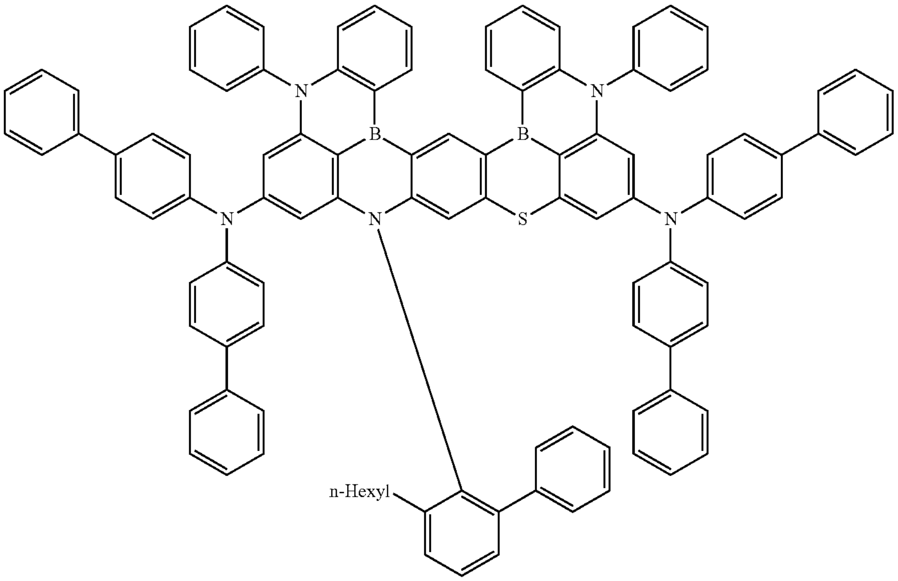

-continued
47
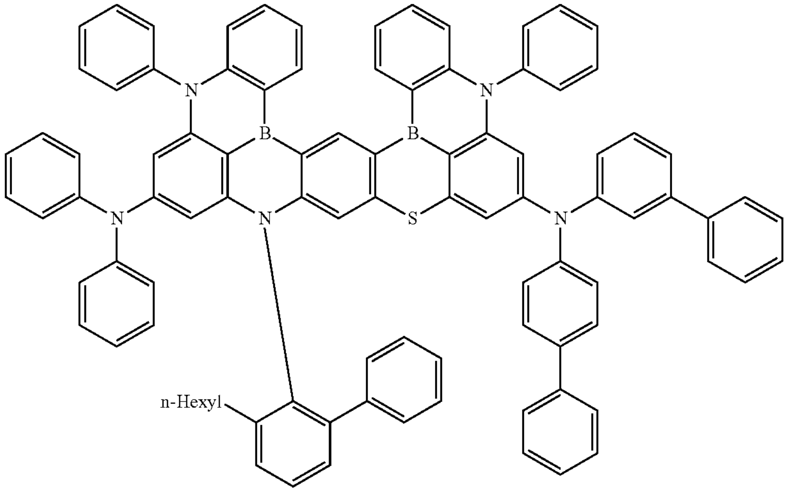
48
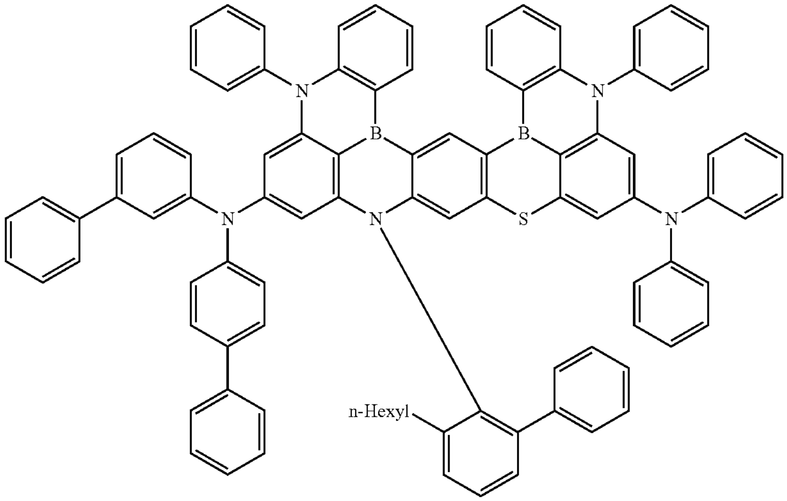
49
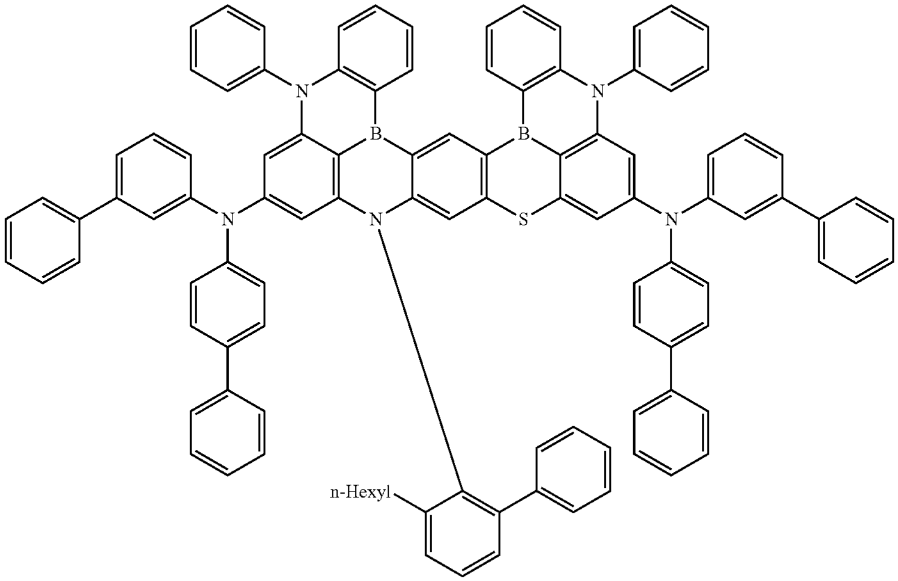

-continued
50
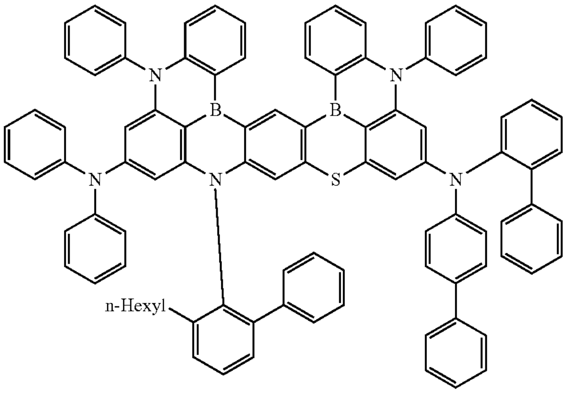
51
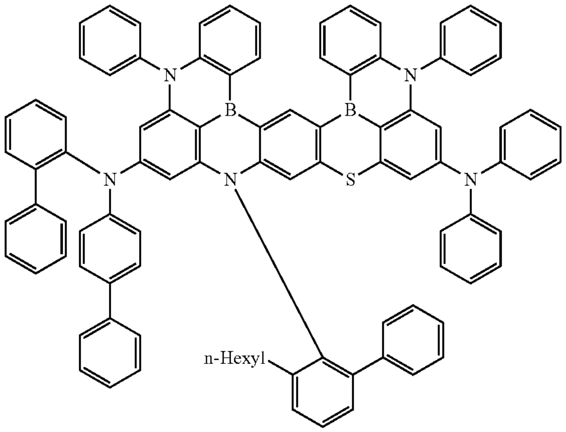
52
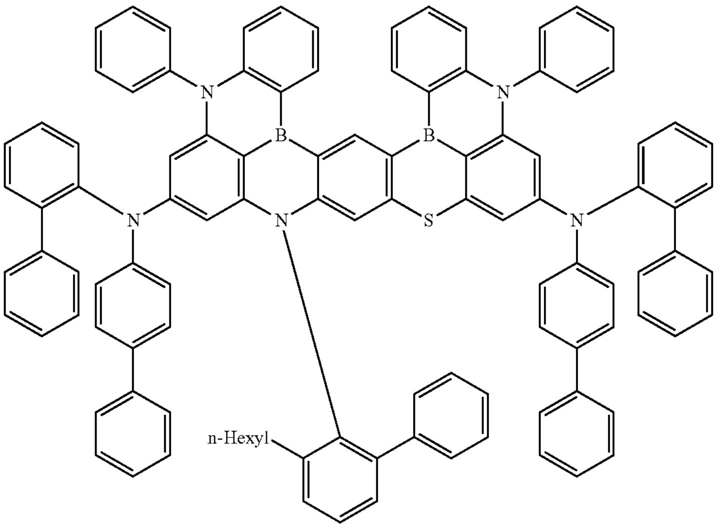
53
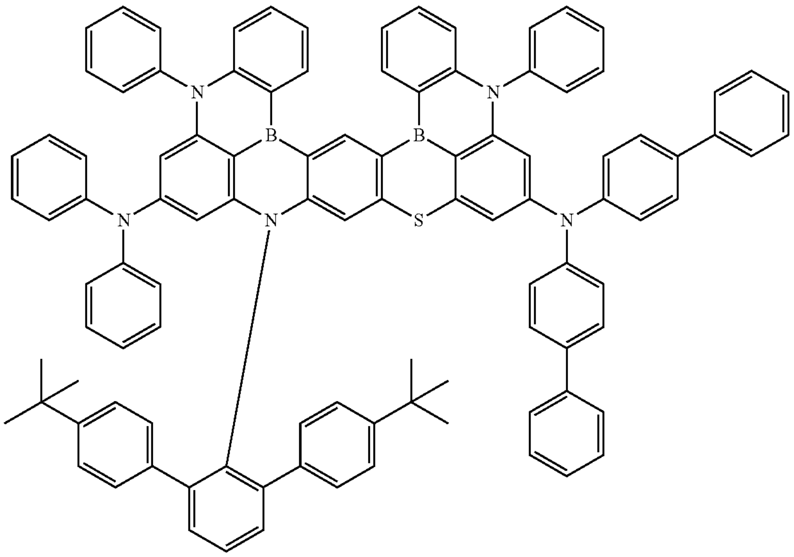

-continued
54
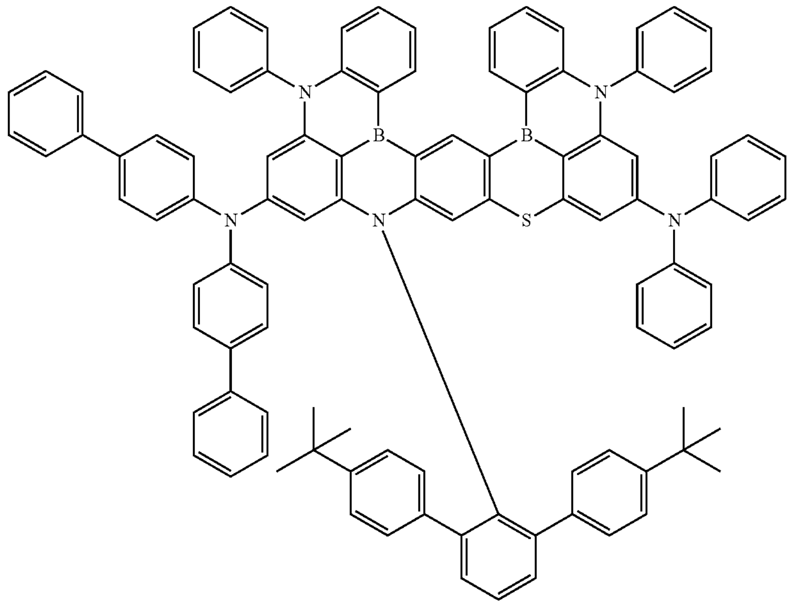
55
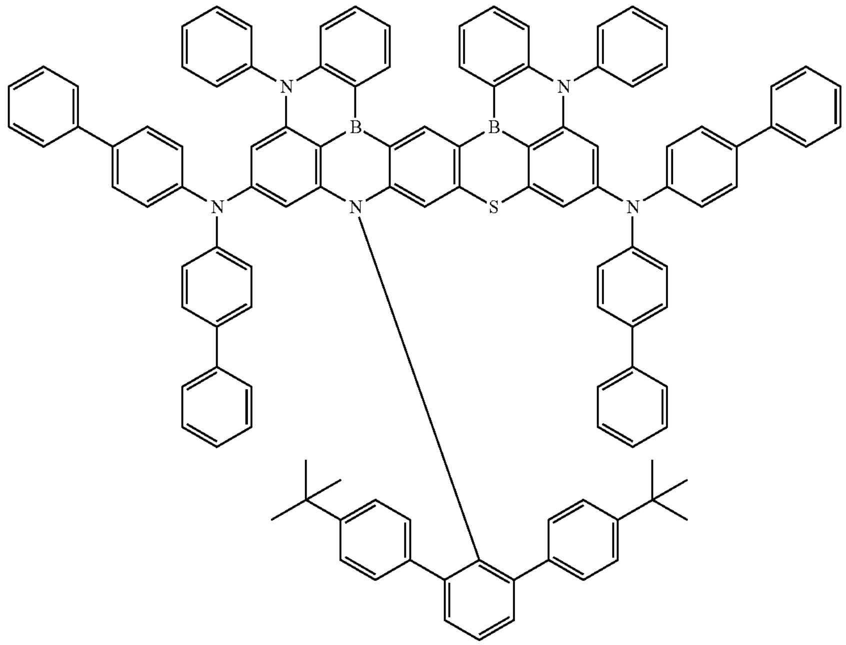

-continued
56
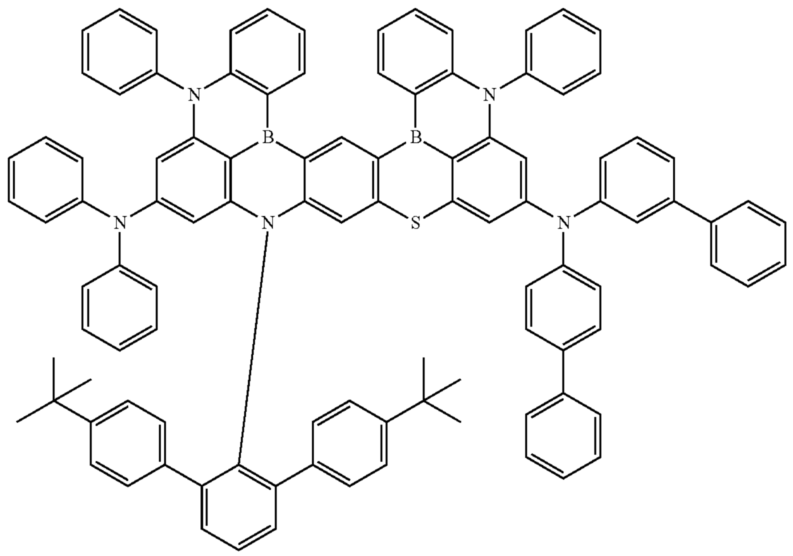
57
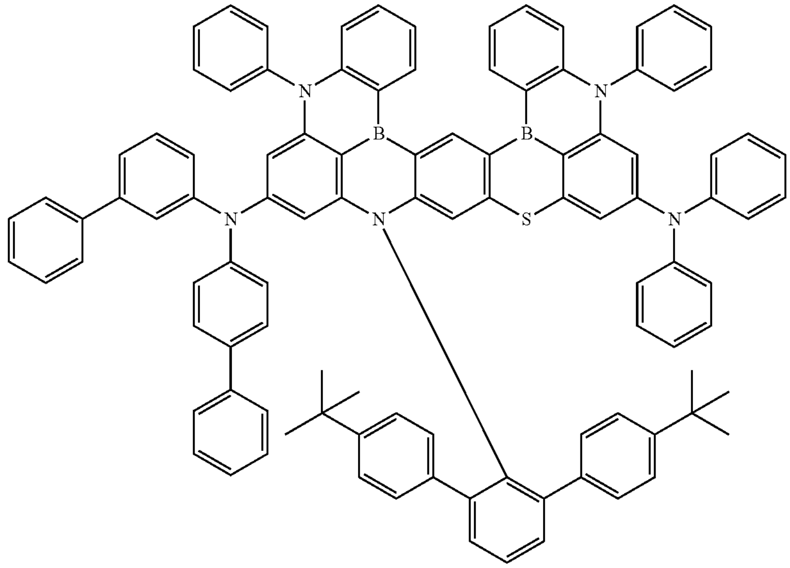
58
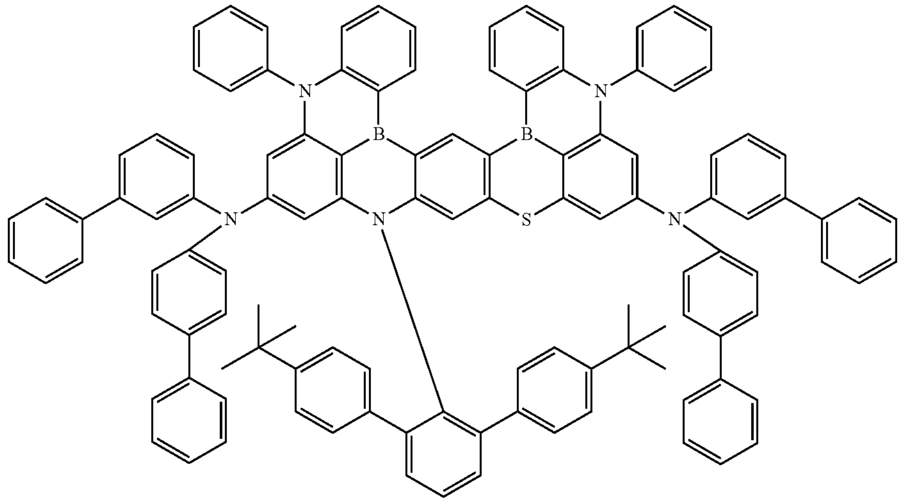

-continued
59
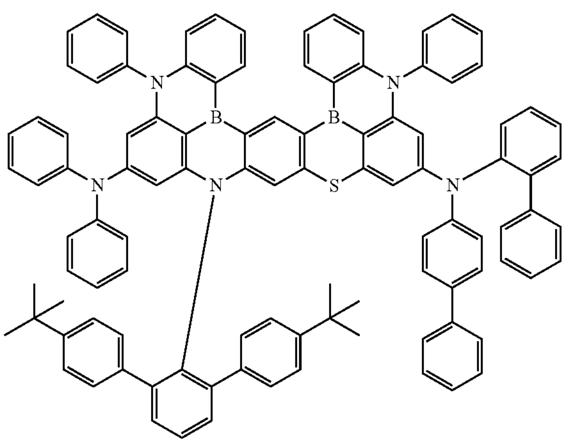
60
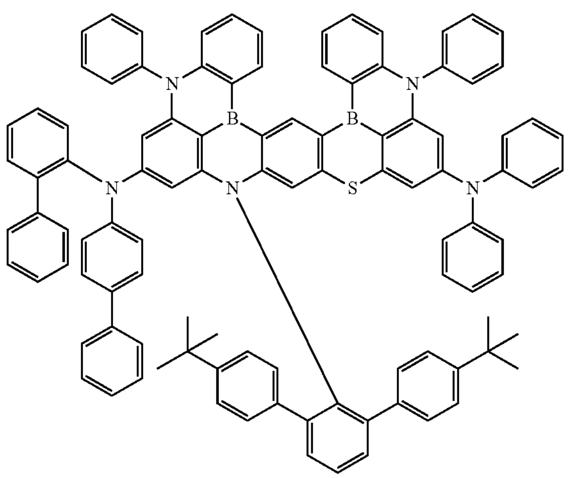
61
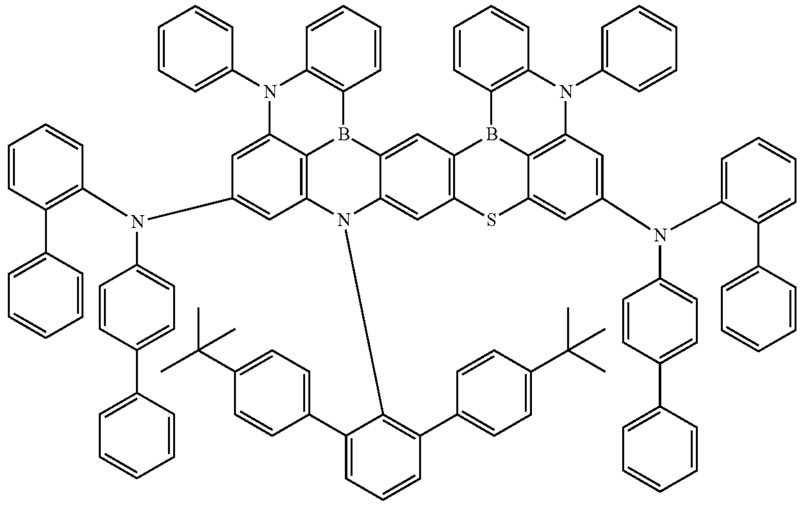
62
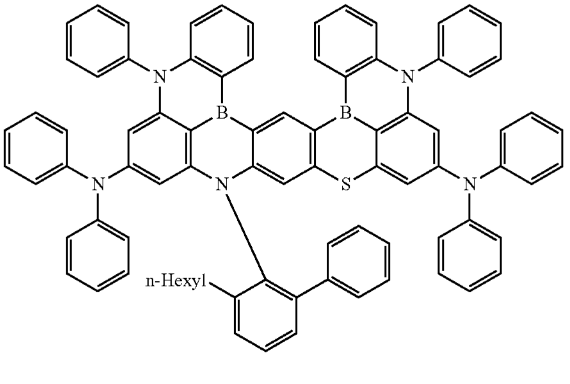
63
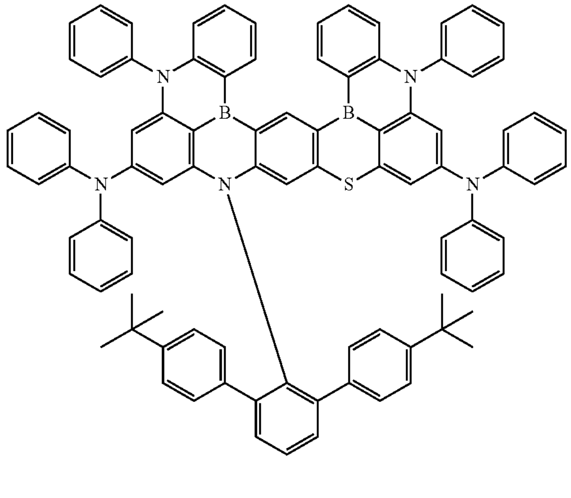

-continued
64
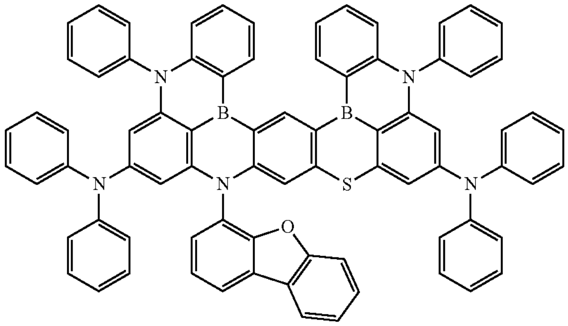
65
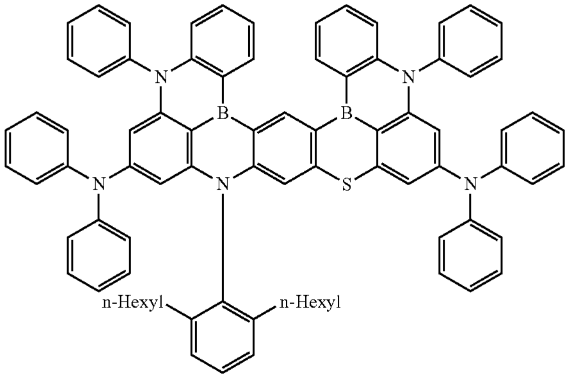
66
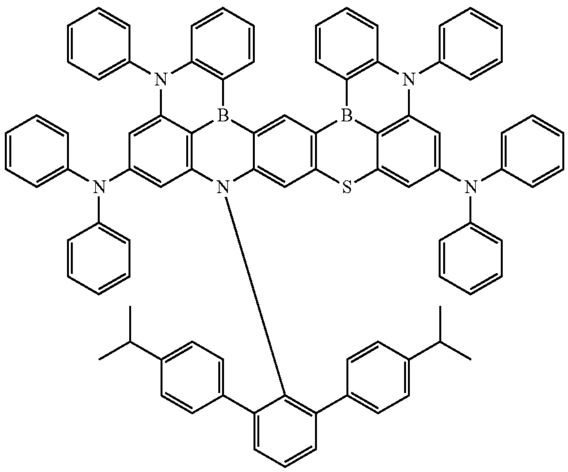
67
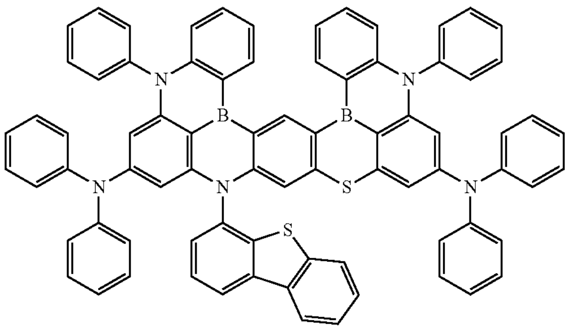
68
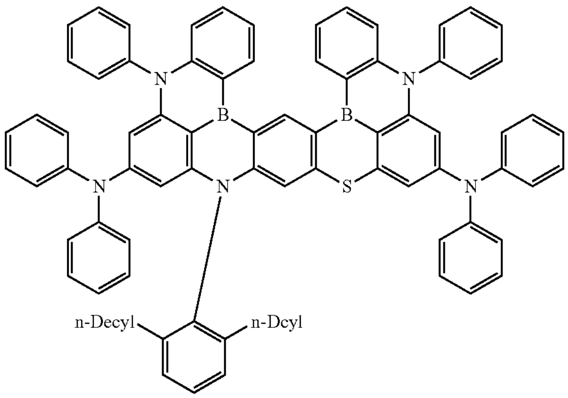
69
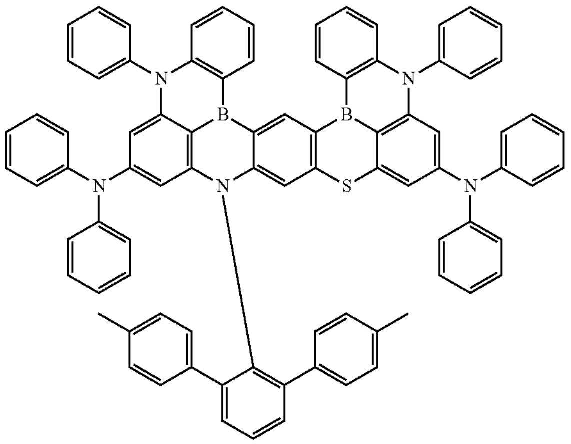

-continued
70
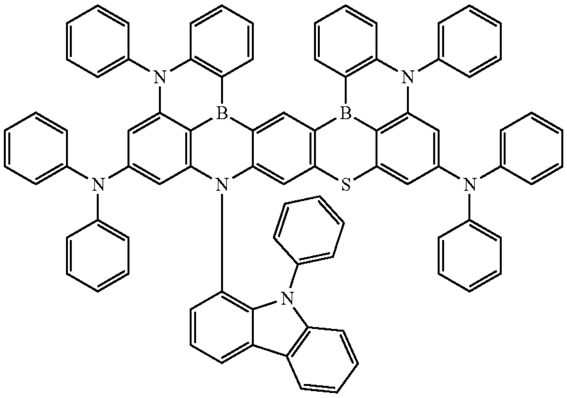
71
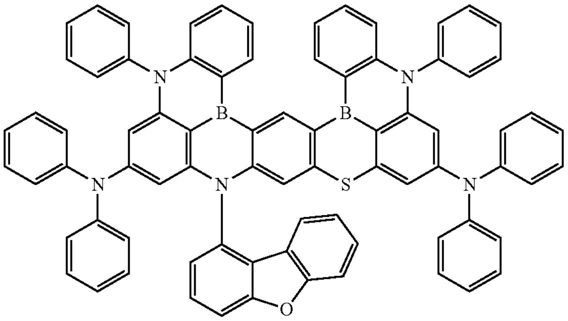
72
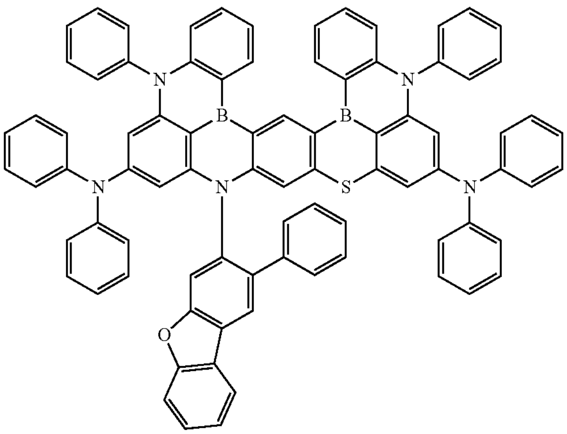
73
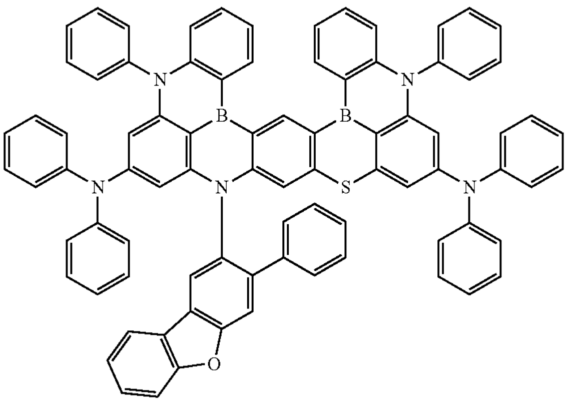
74
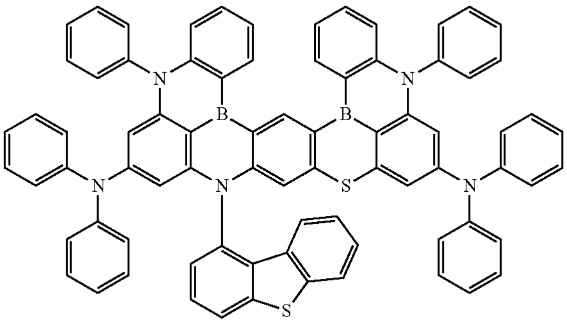
75
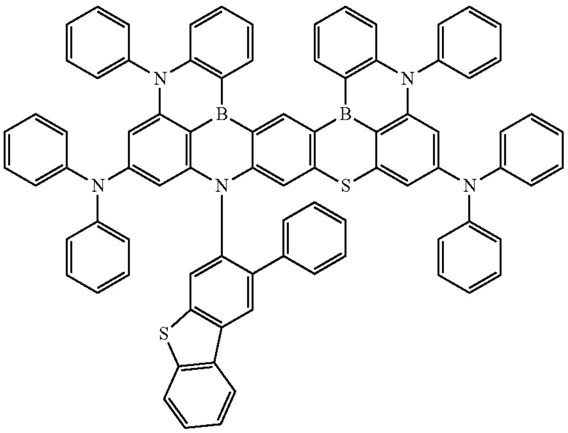

-continued
76
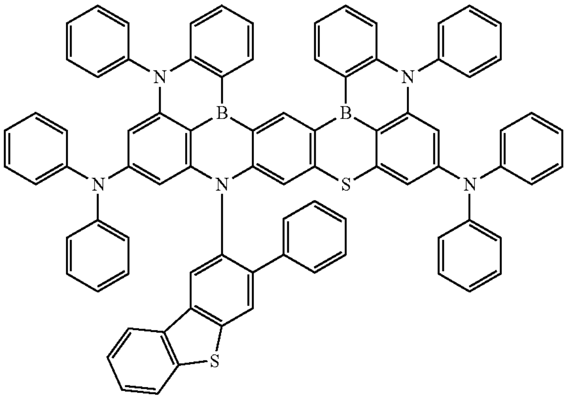
77
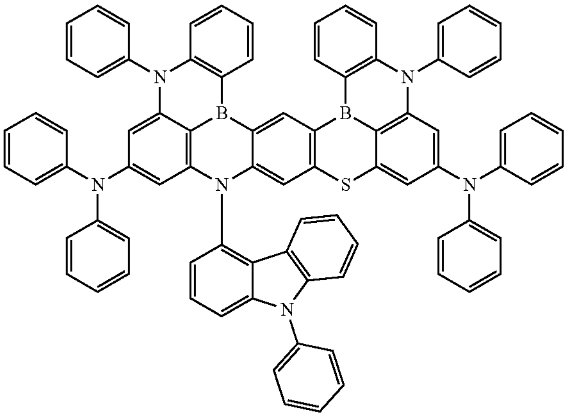
78
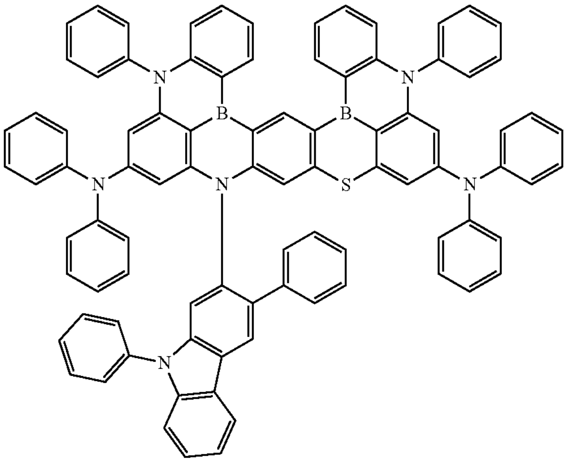
79
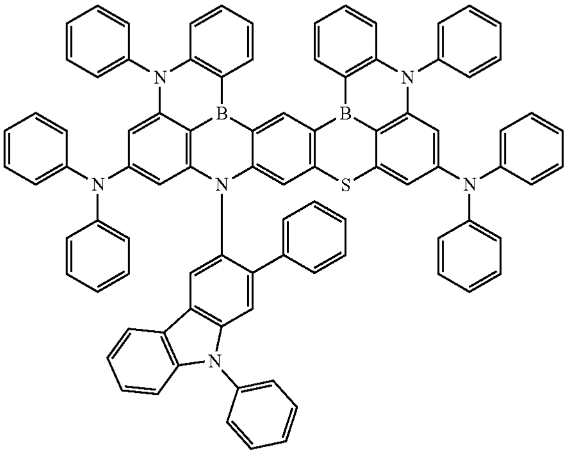
80
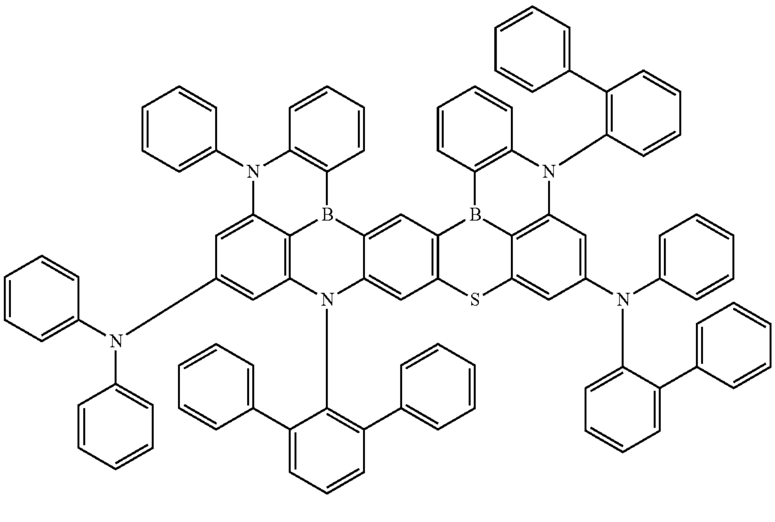

-continued
81
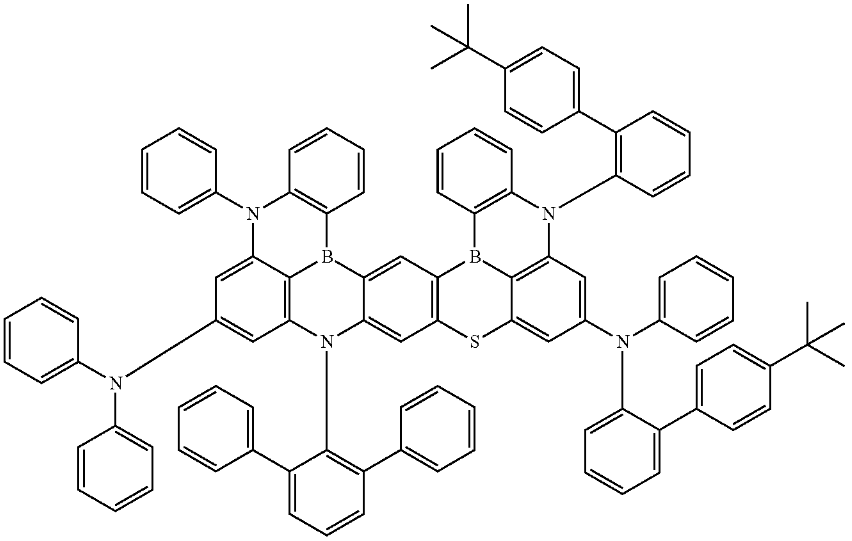
82
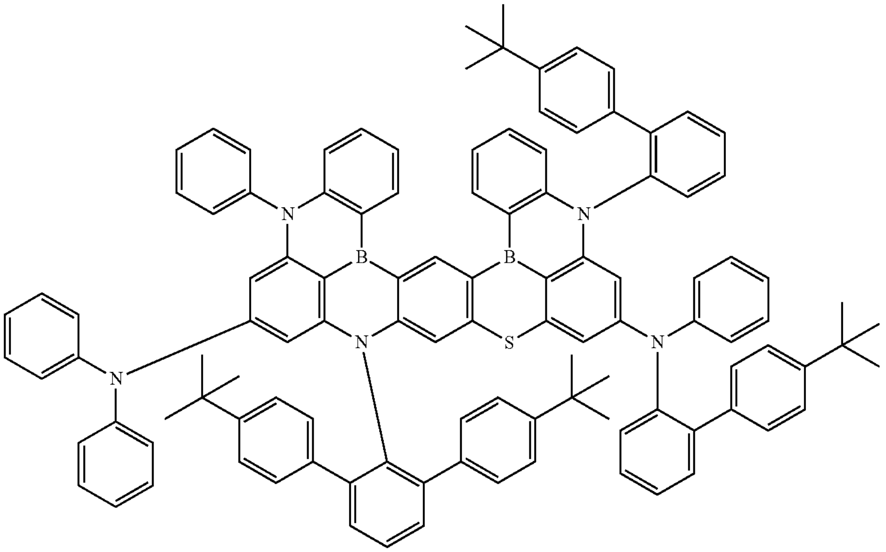
83
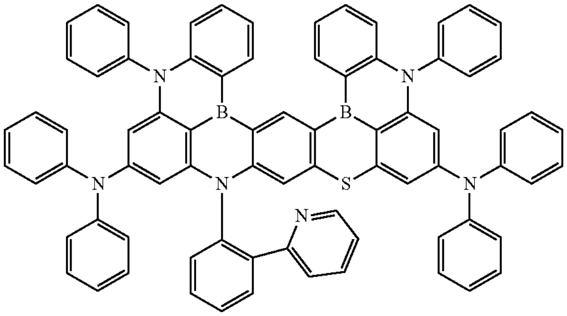
84
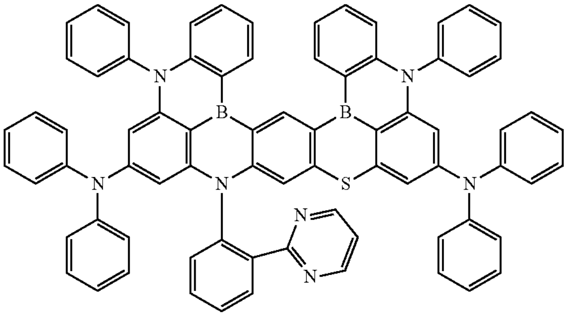

-continued
85
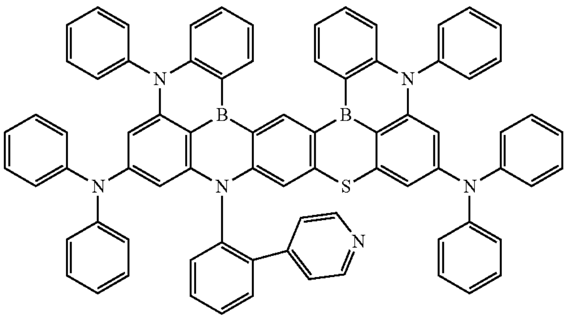
86
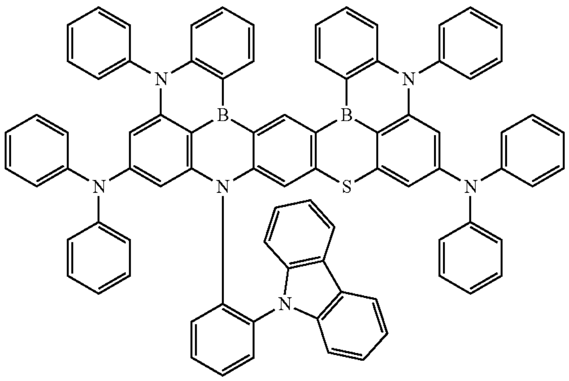
87
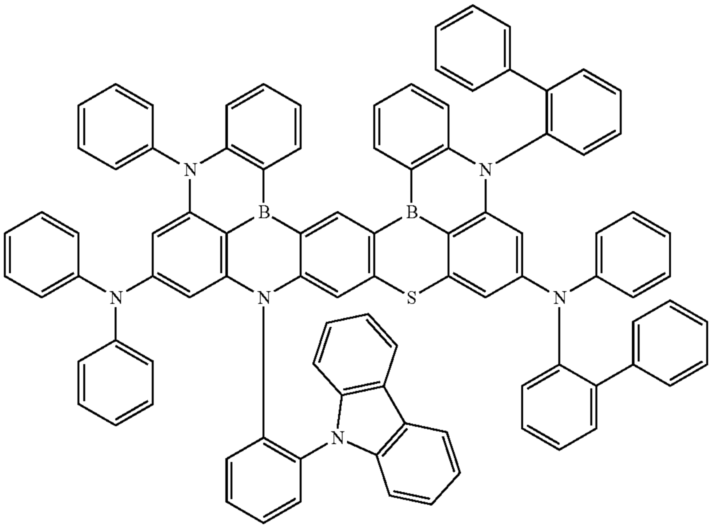
88
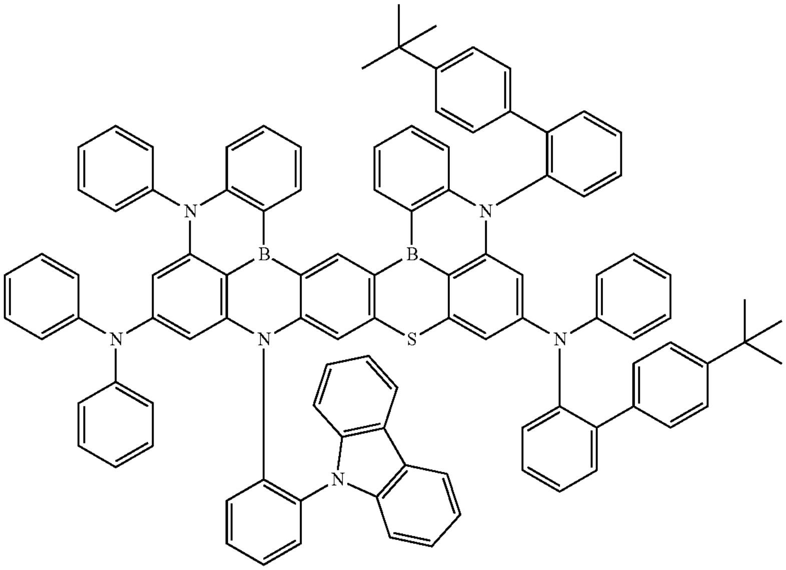

-continued
89
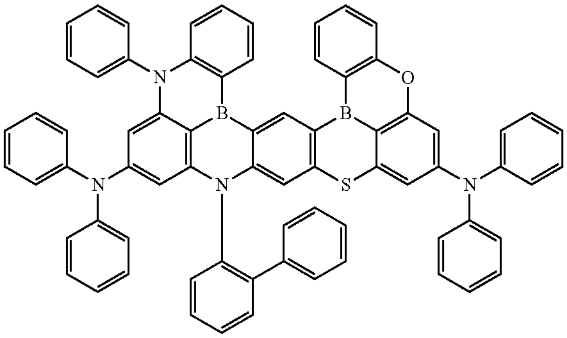
90
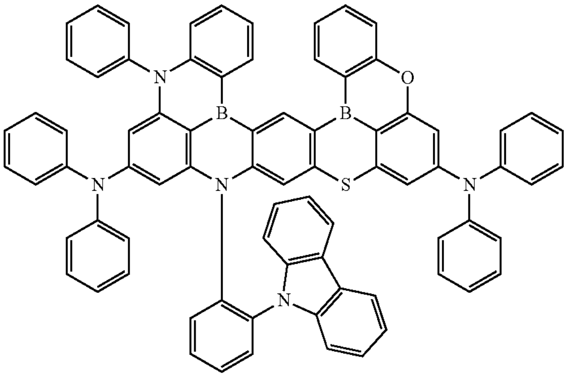
91
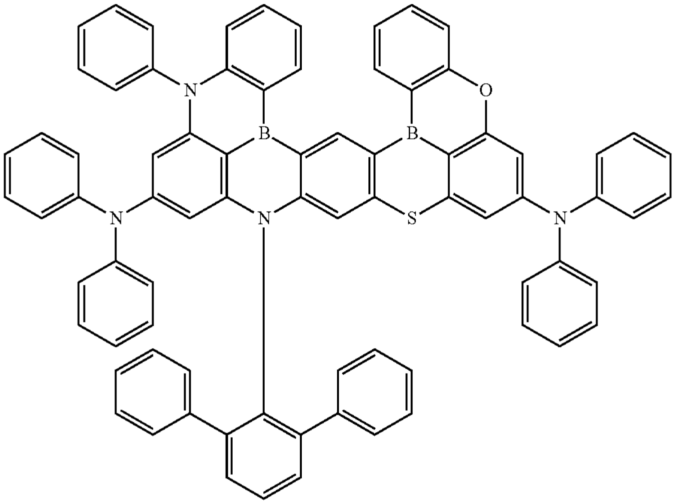
92
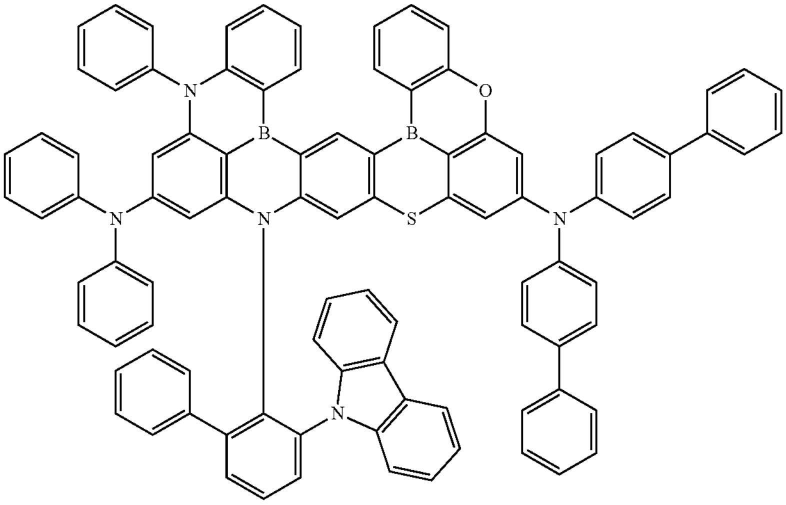

-continued
93
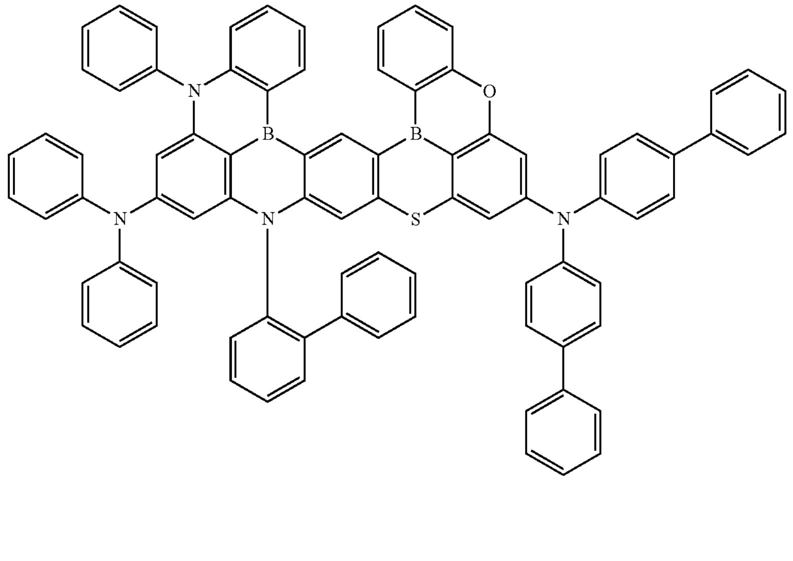
94
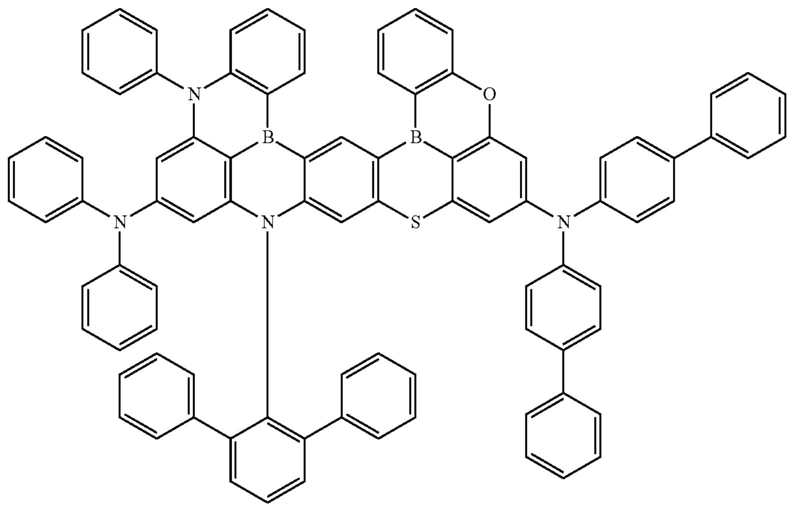
95
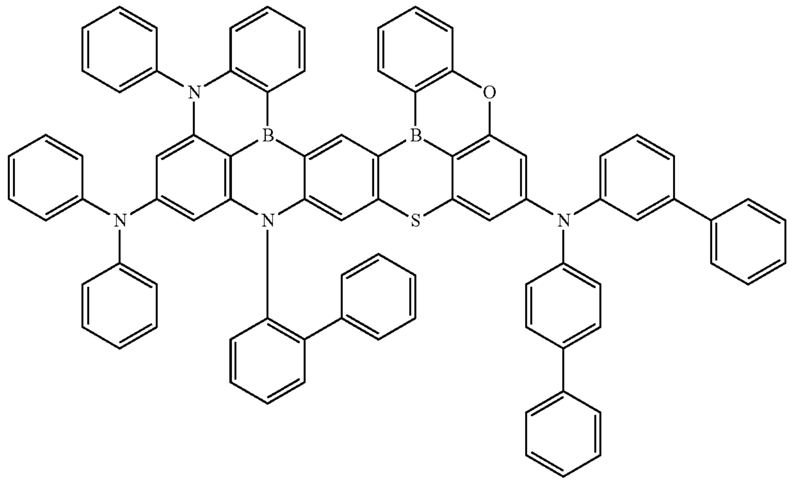

-continued
96
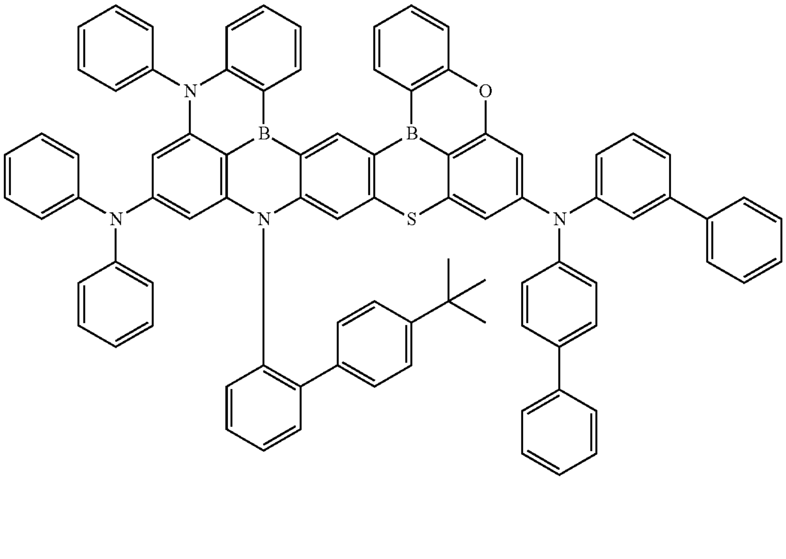
97
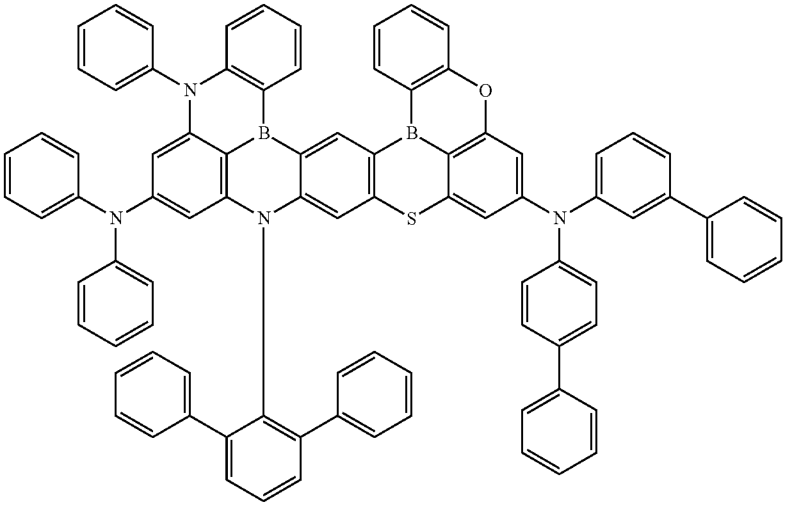
98
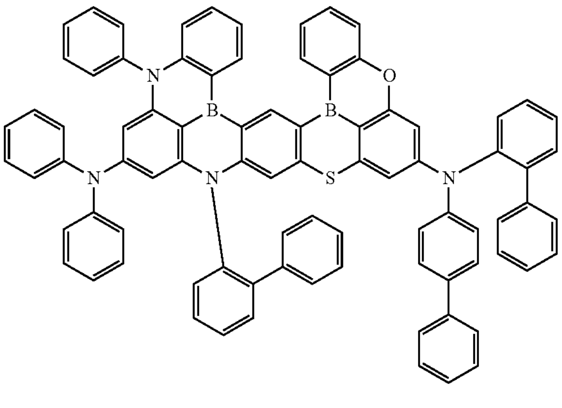
99
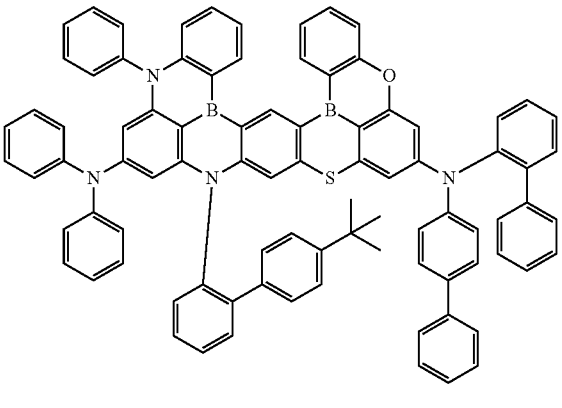

-continued
100
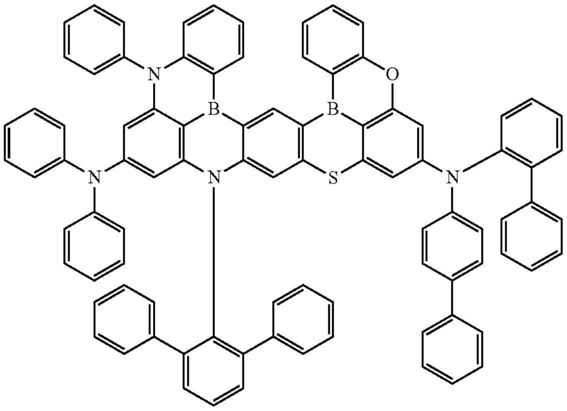
101
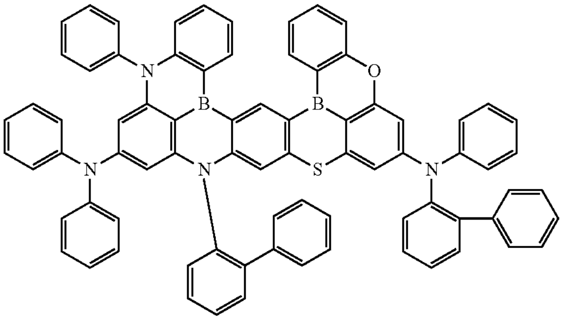
102
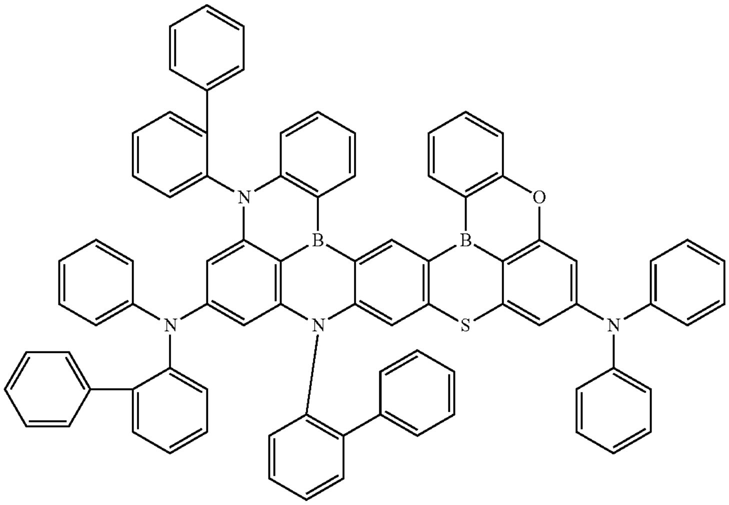
103
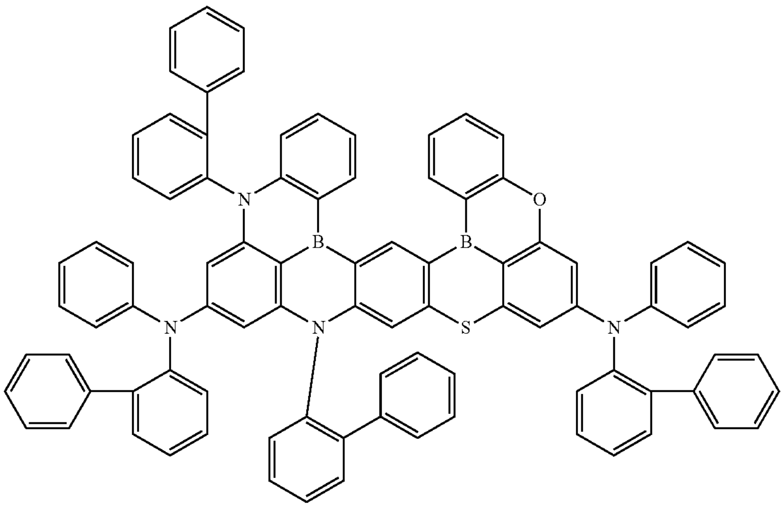

-continued
104
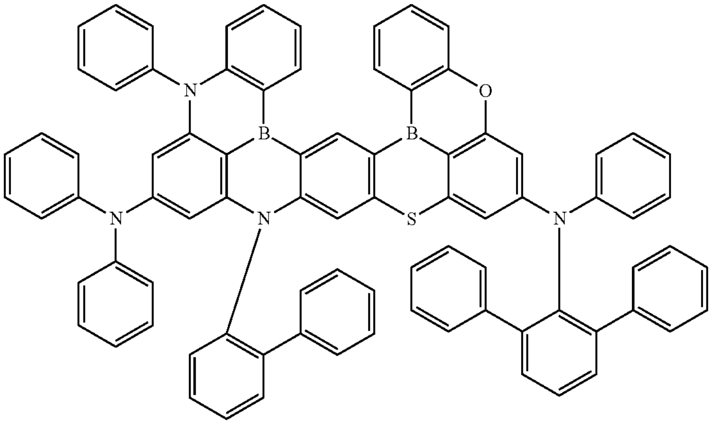
105
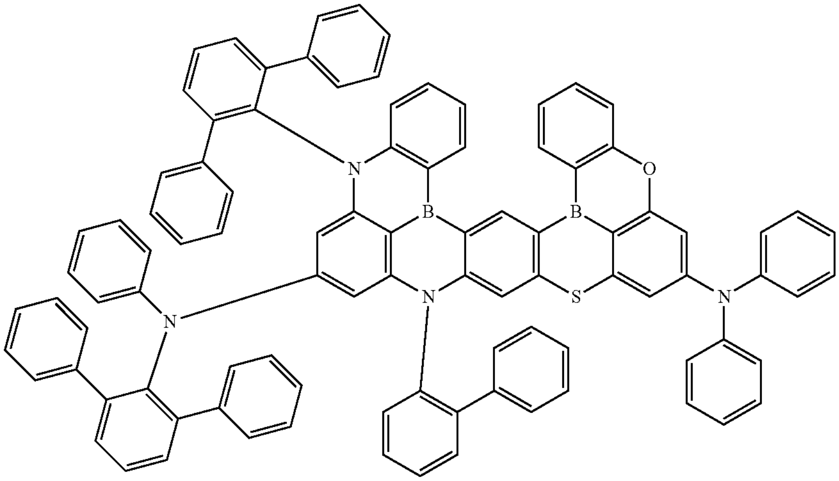
106
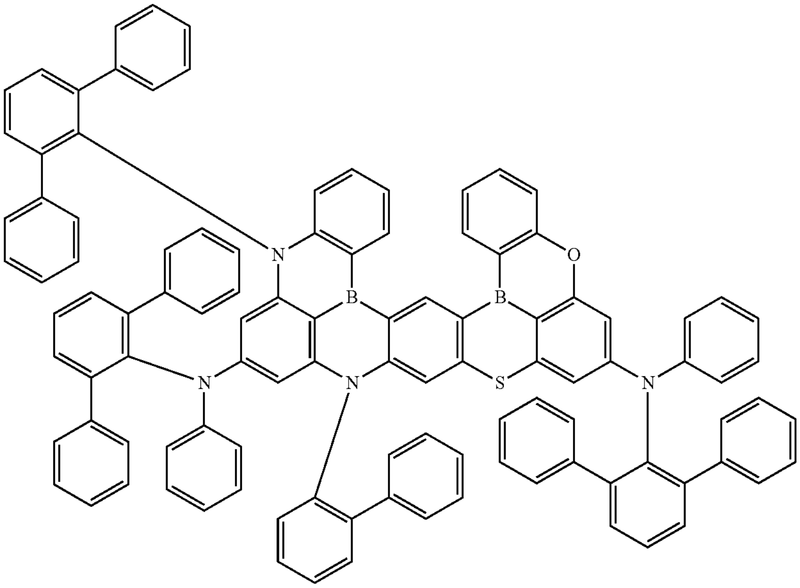

-continued
107
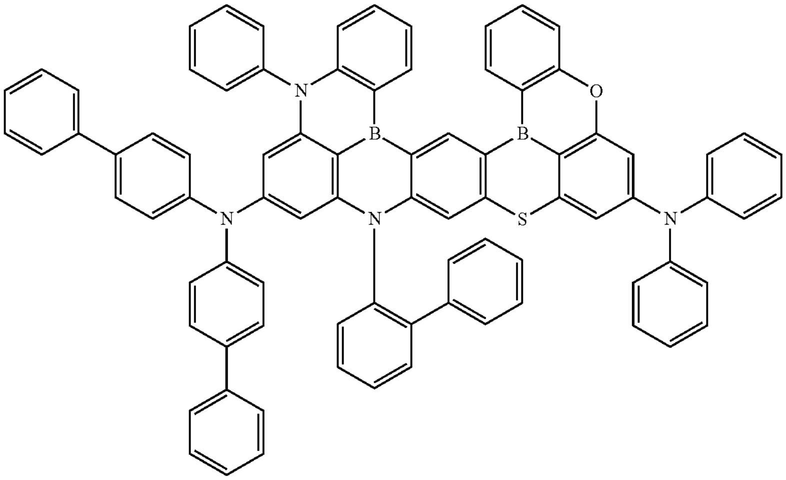
108
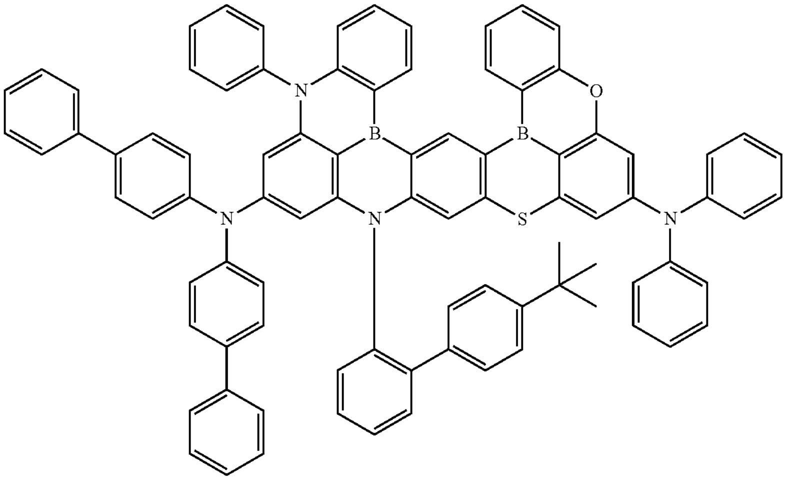
109
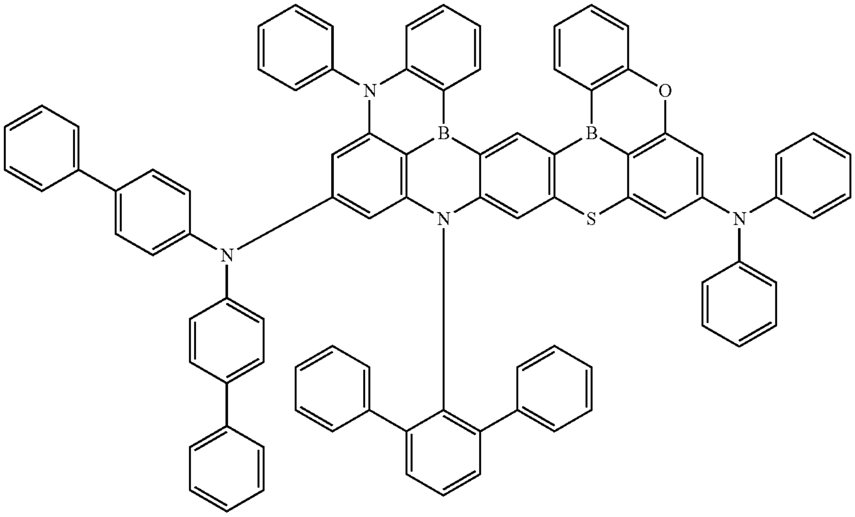

-continued
110
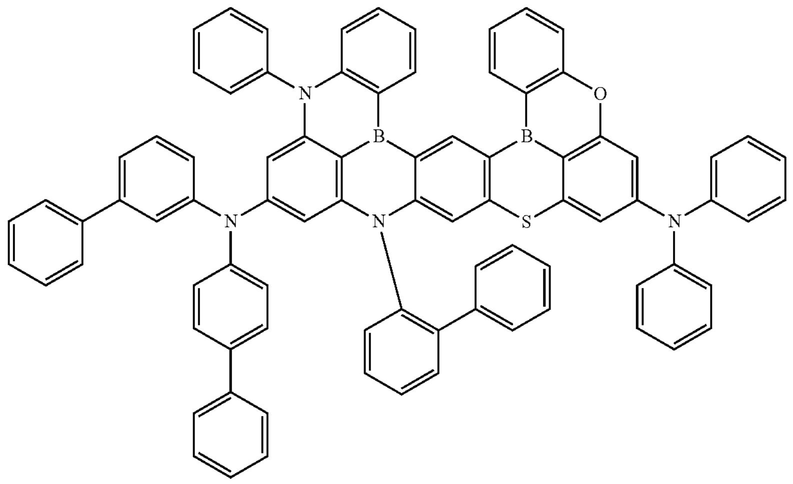
111
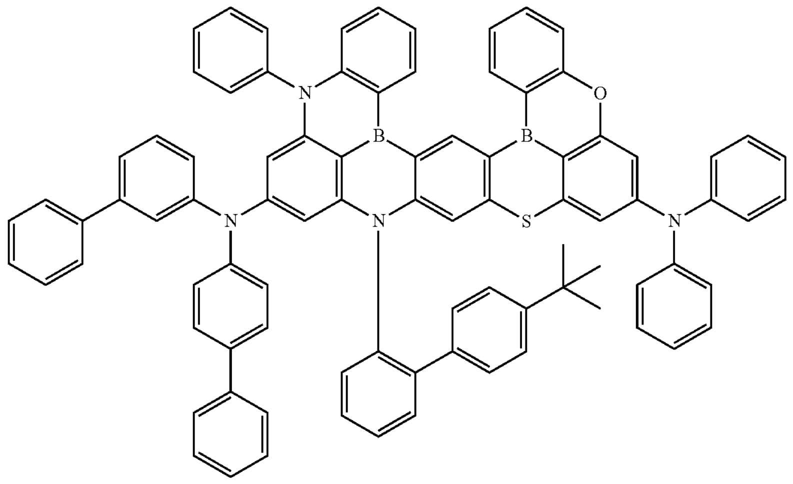
112
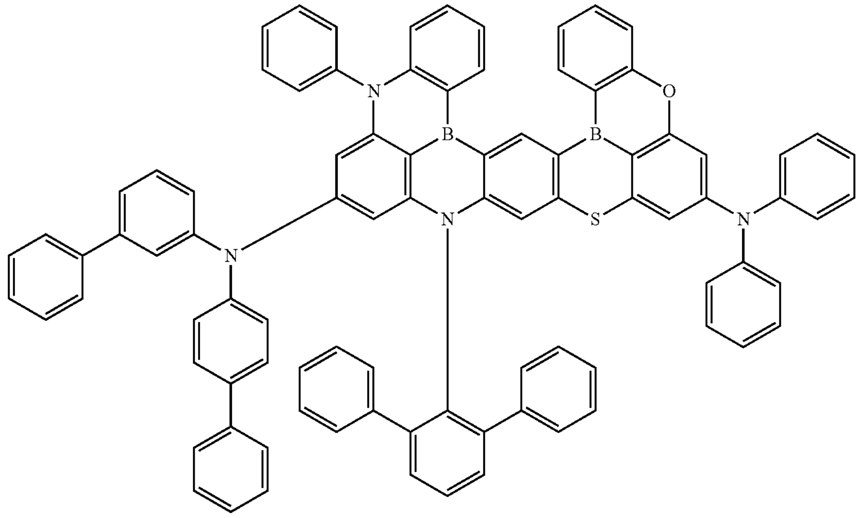

-continued
113
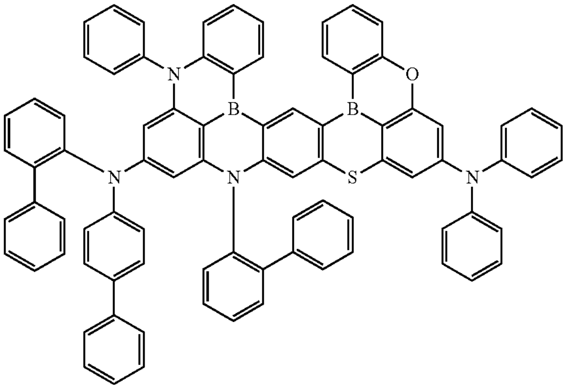
114
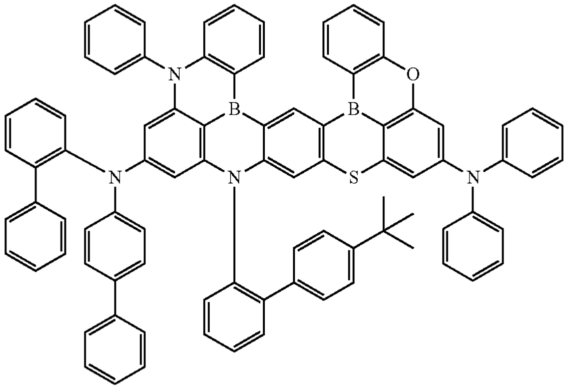
115
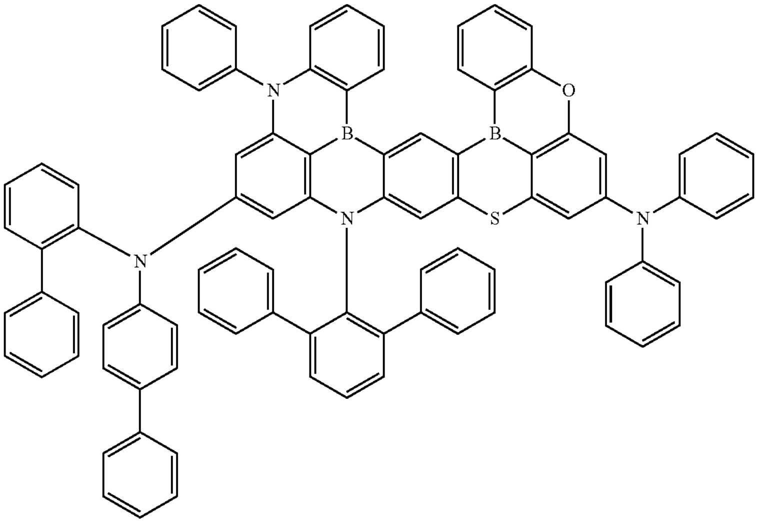
116
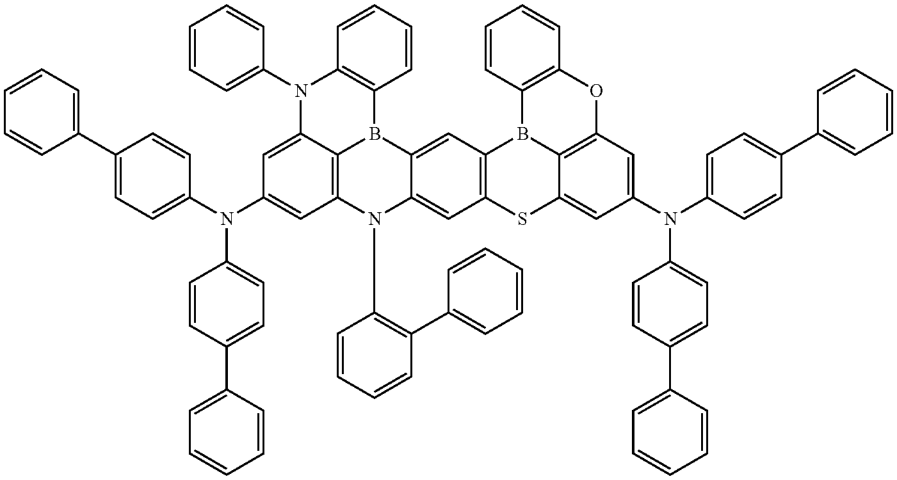

-continued
117
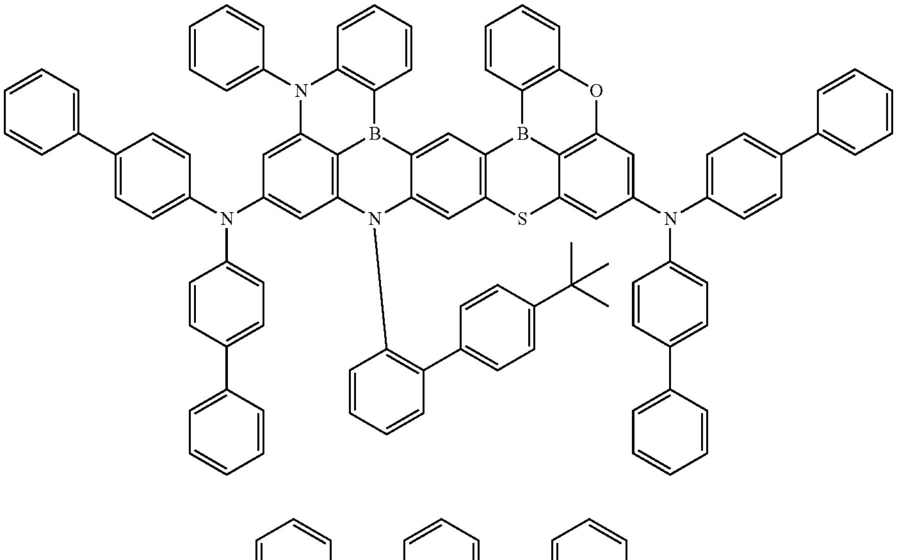
118
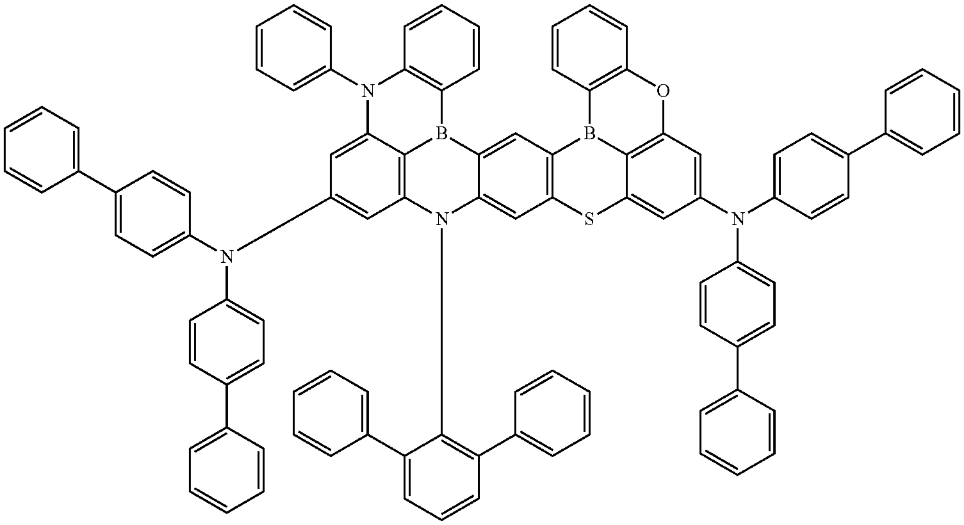
119
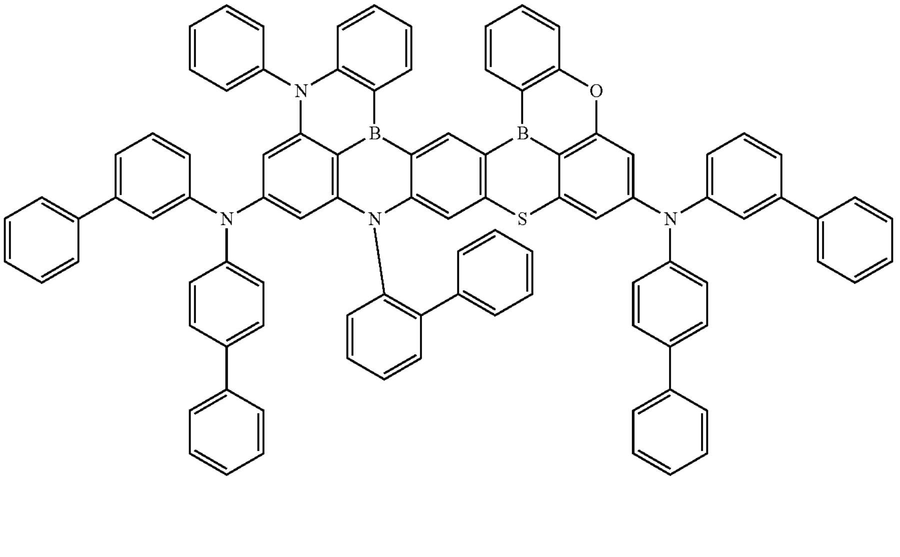

-continued
120
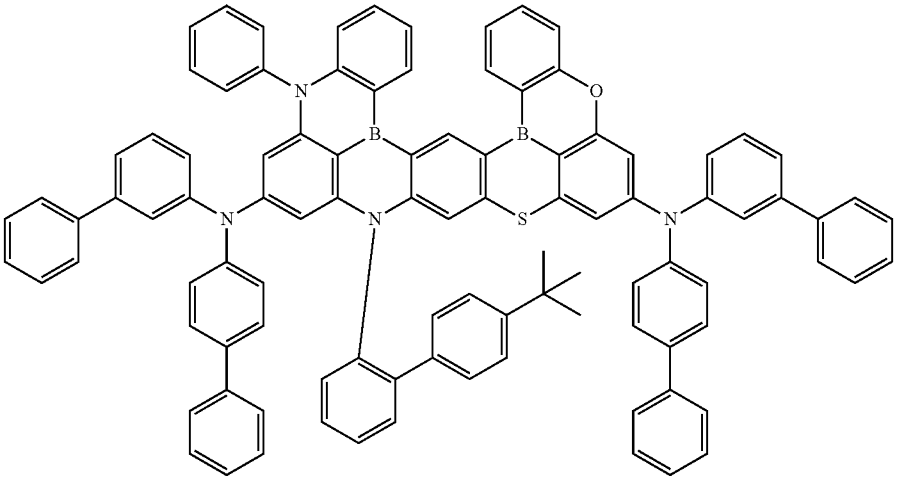
121
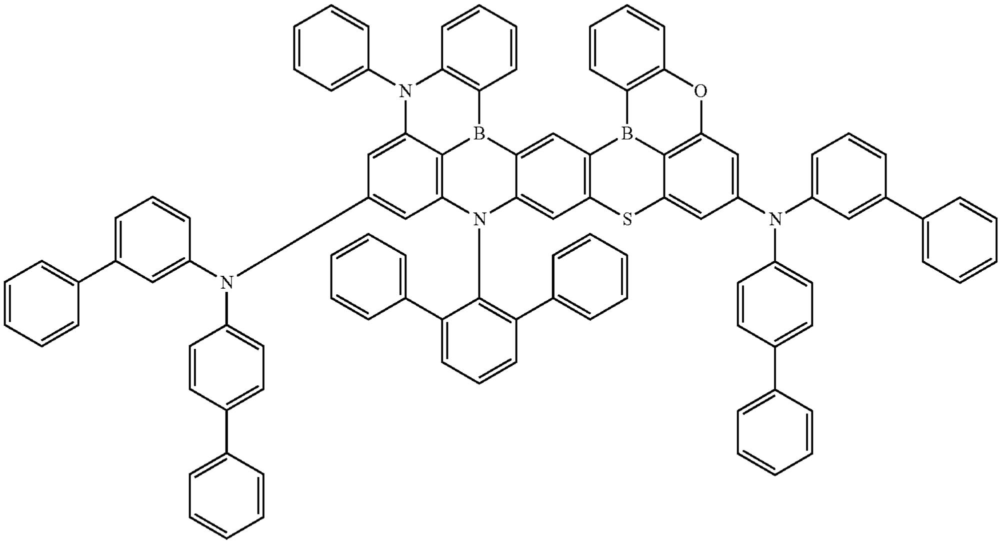
122
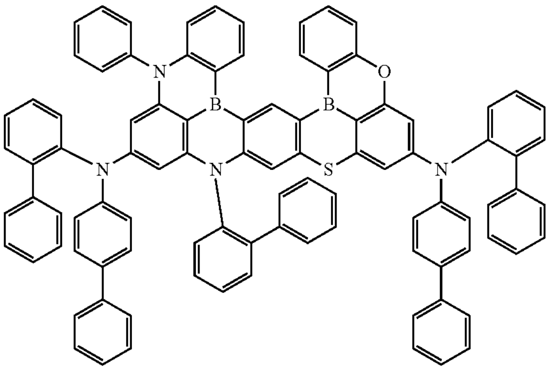
123
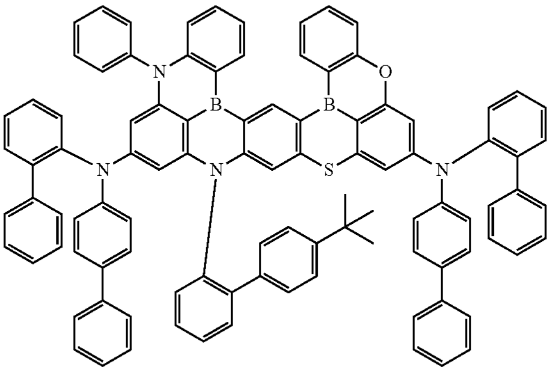

-continued
124
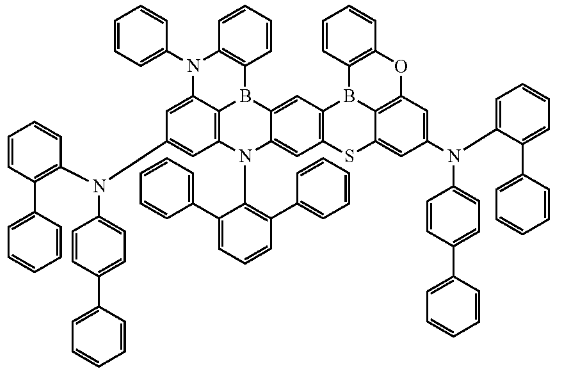
125
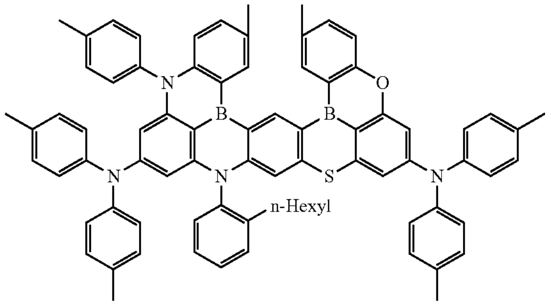
126
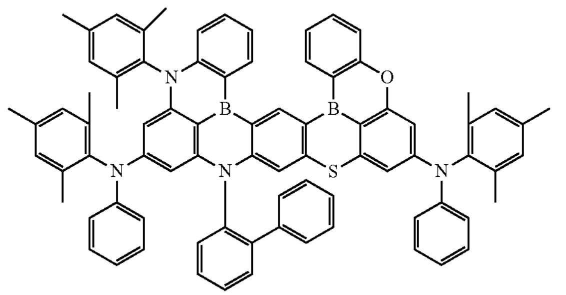
127
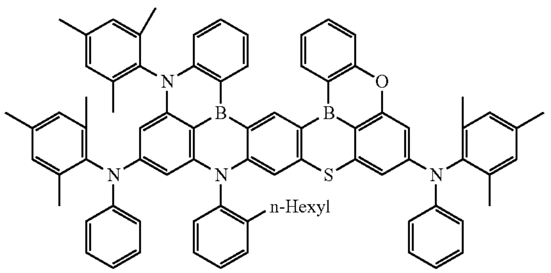
128
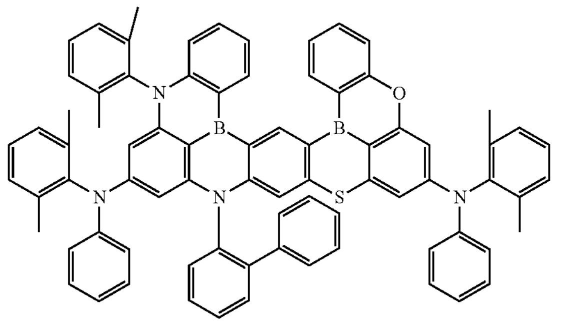
129
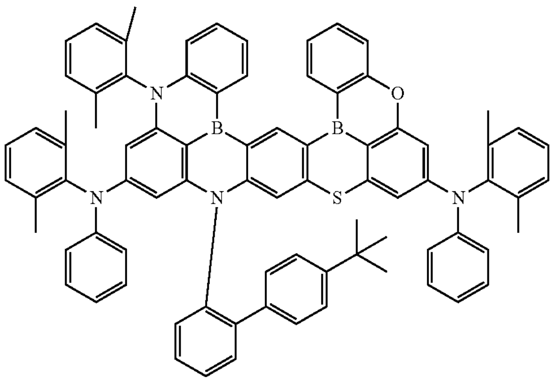
130
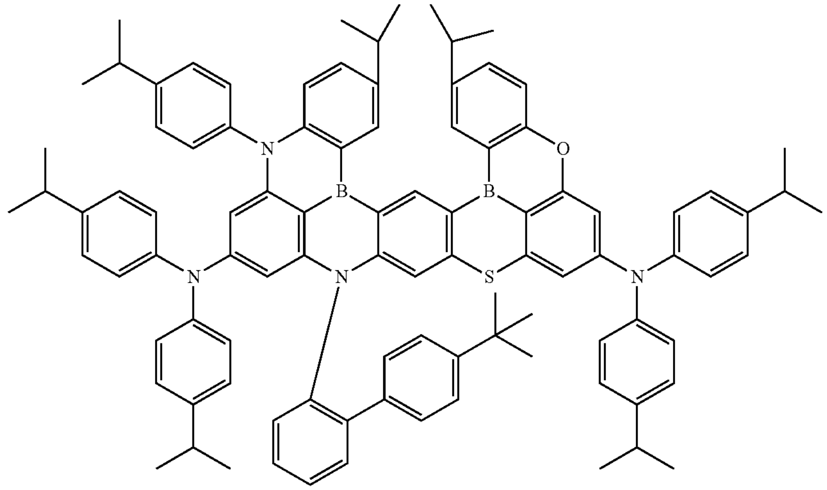

-continued
131
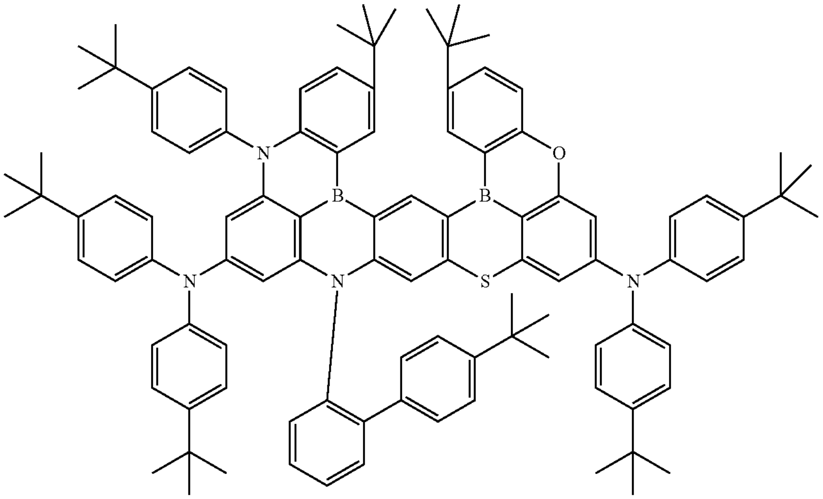
132
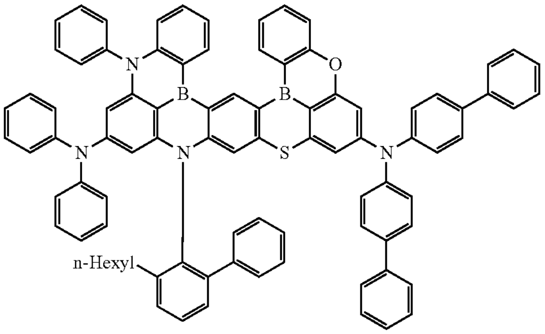
133
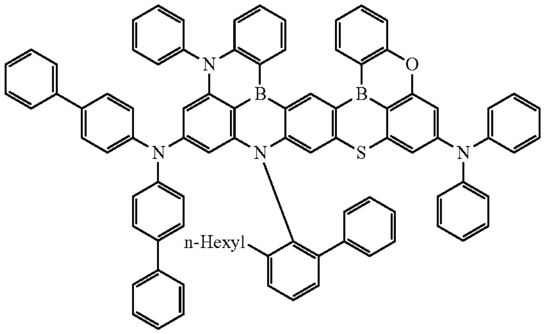
134
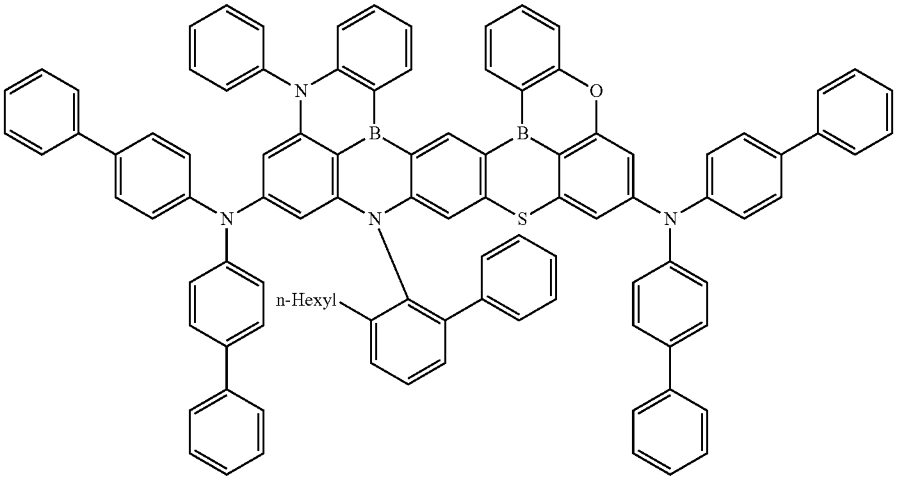
135
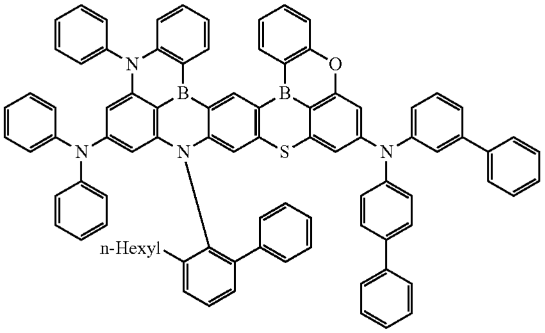
136
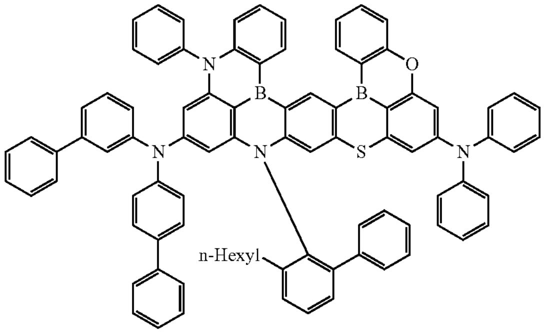

-continued
137
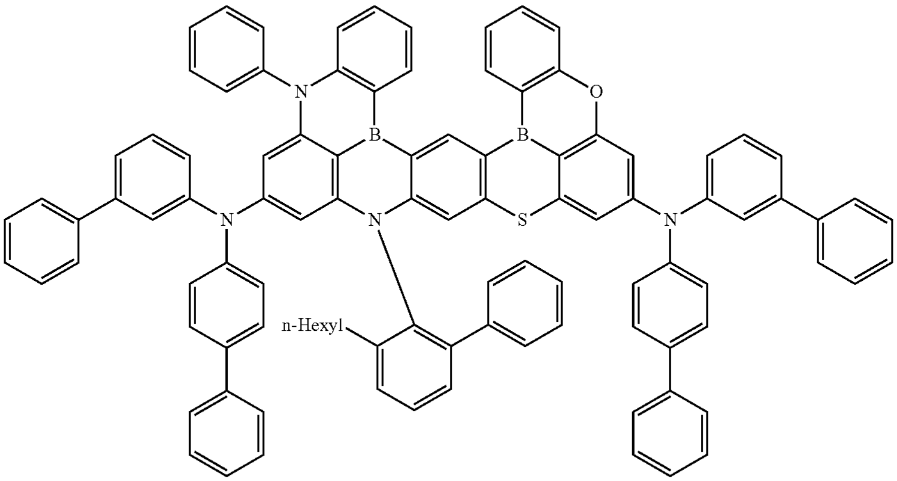
138
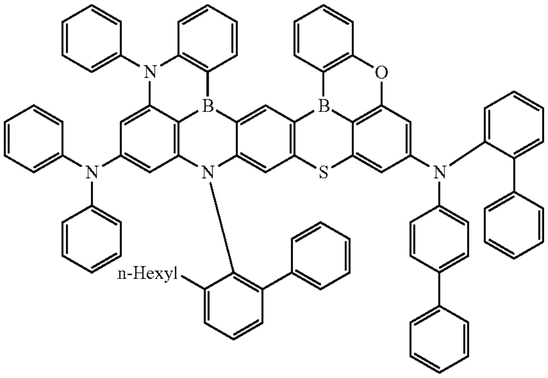
139
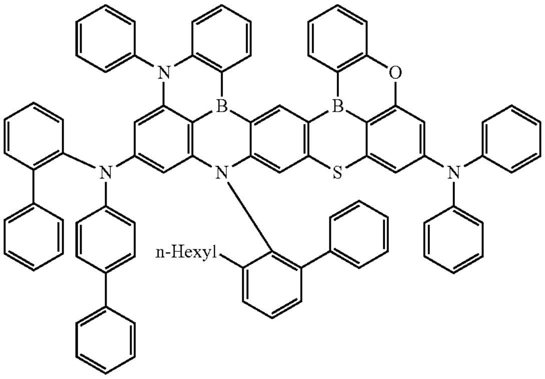
140
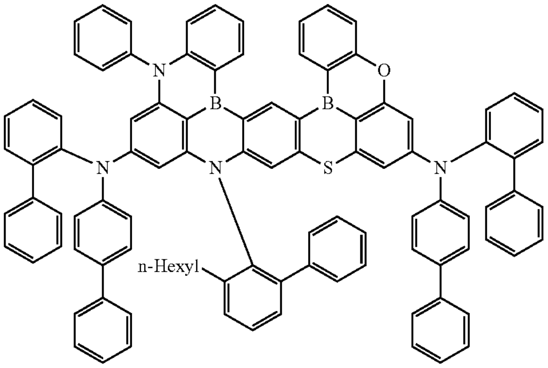
141
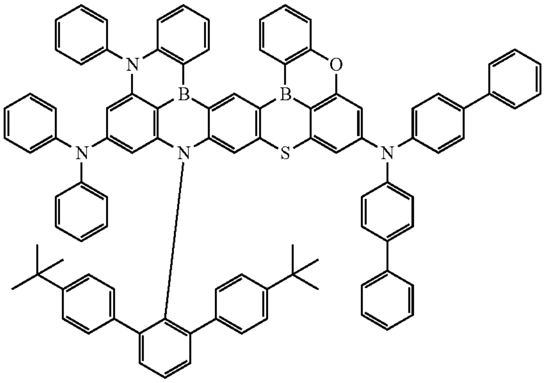

-continued
142
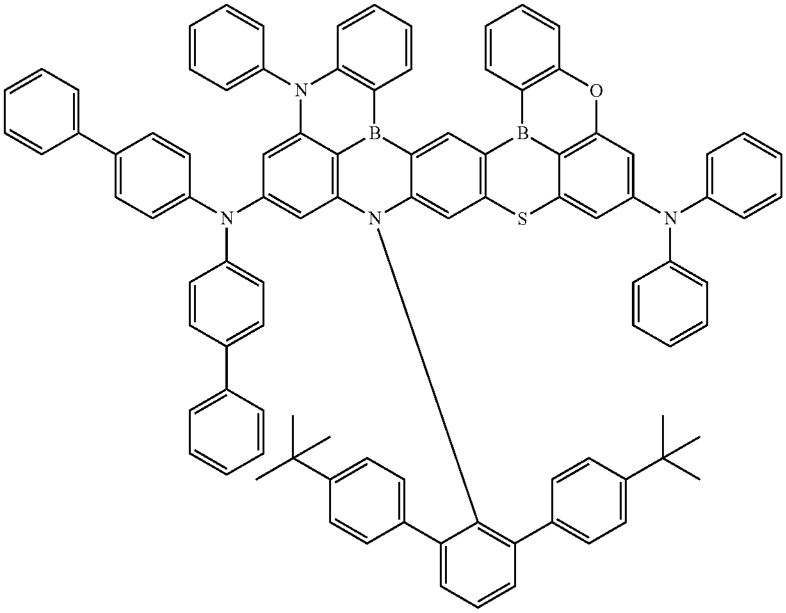
143
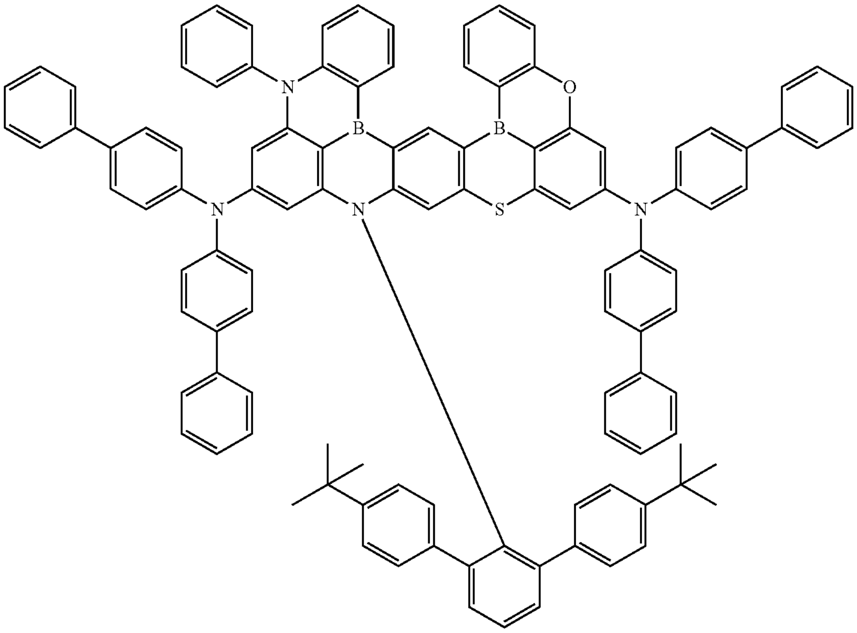
144
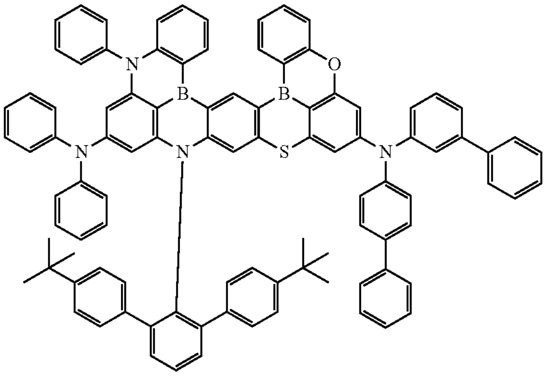
145
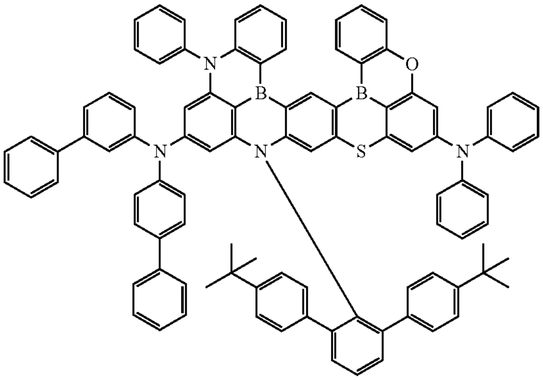

-continued
146
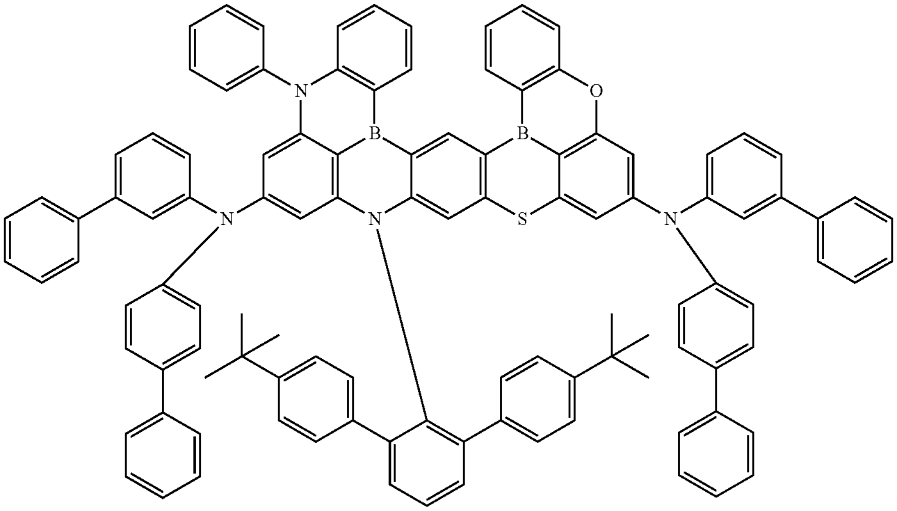
147
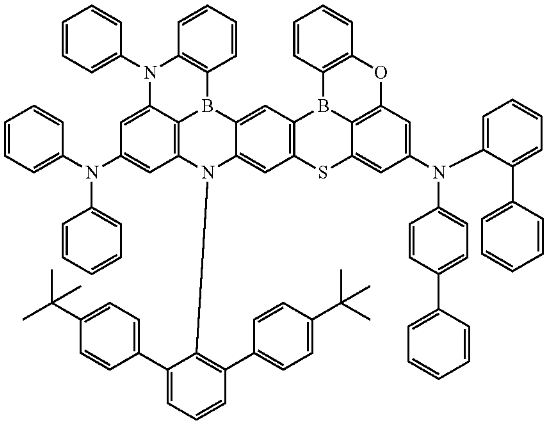
148
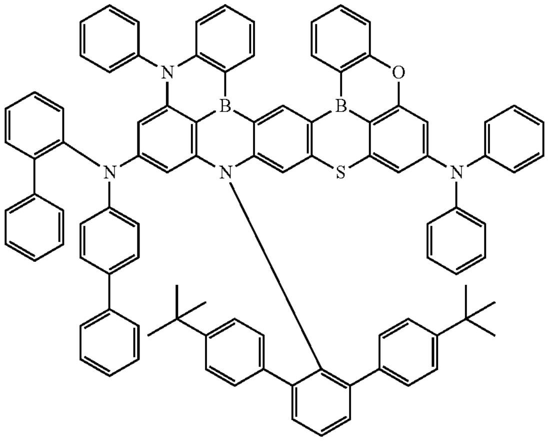
149
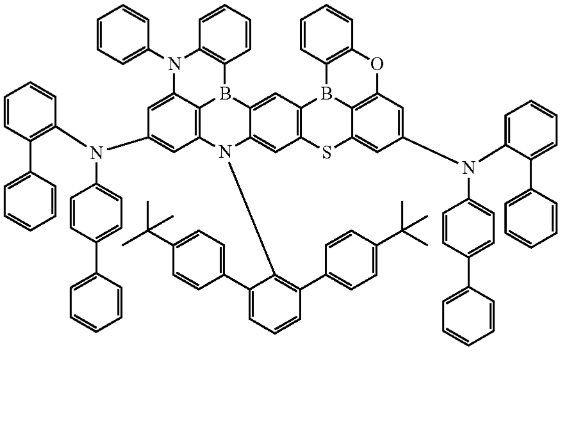
150
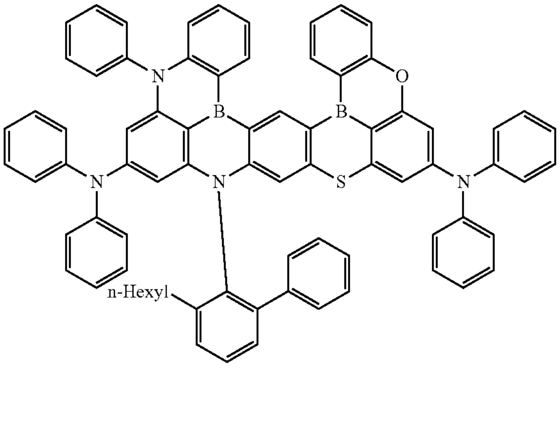

-continued
151
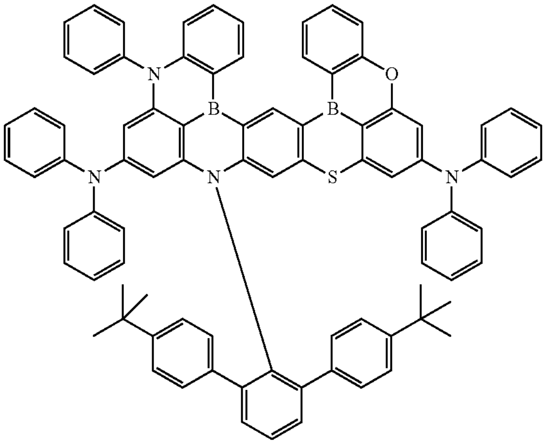
152
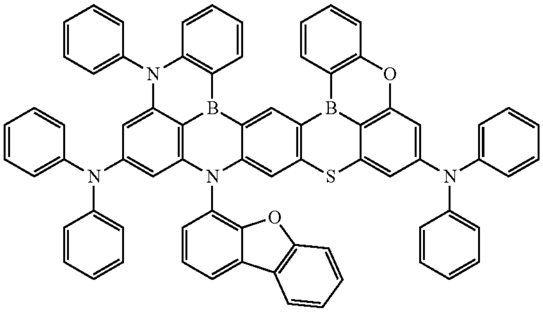
153
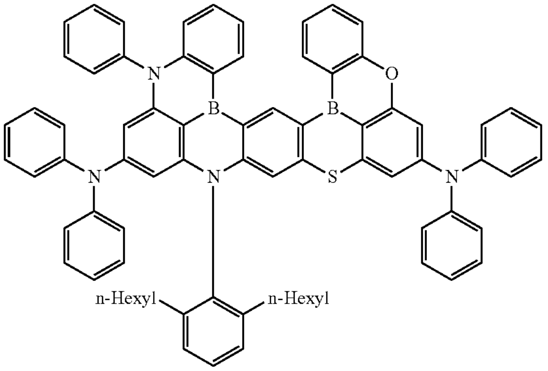
154
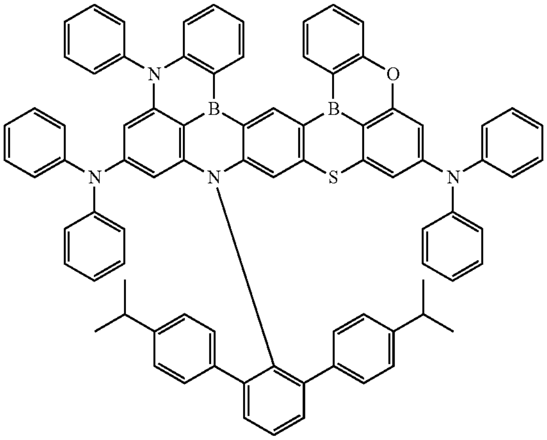
155
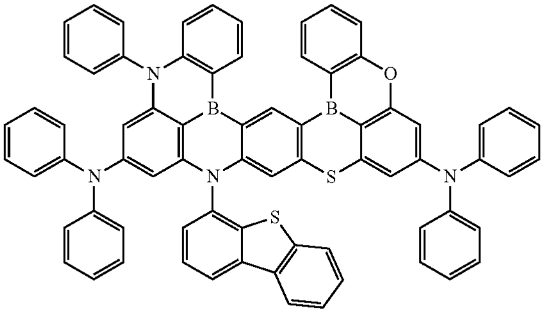
156
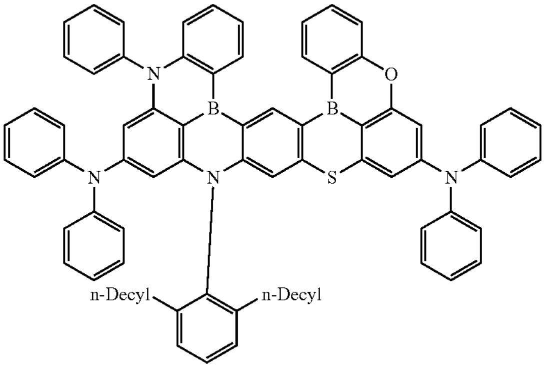

-continued
157
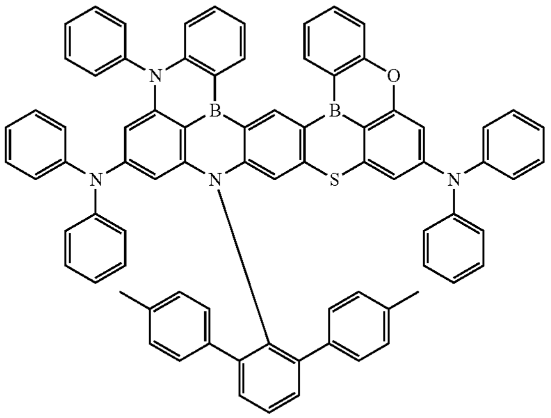
158
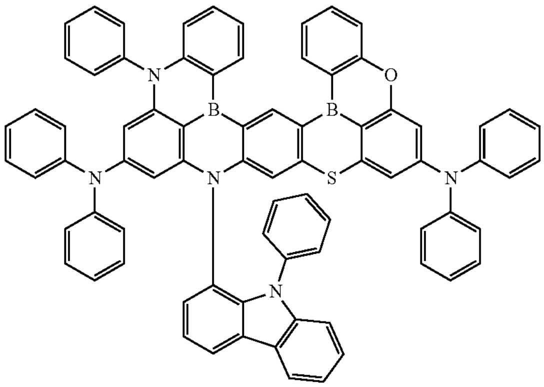
159
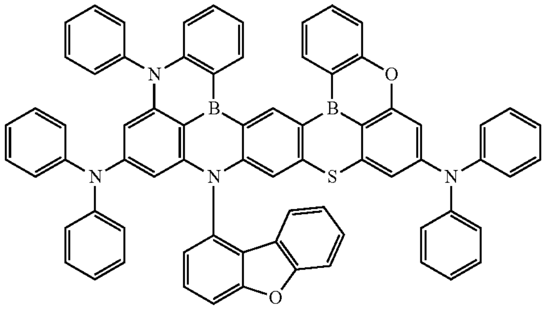
160
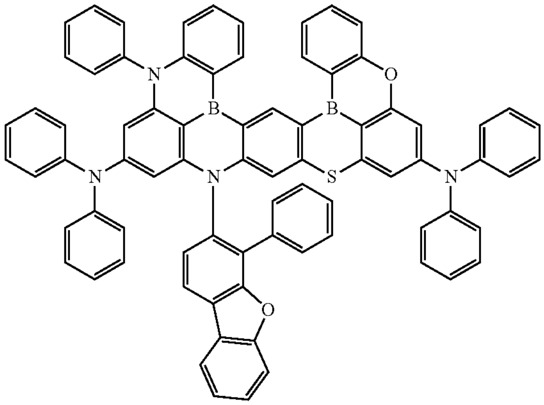
161
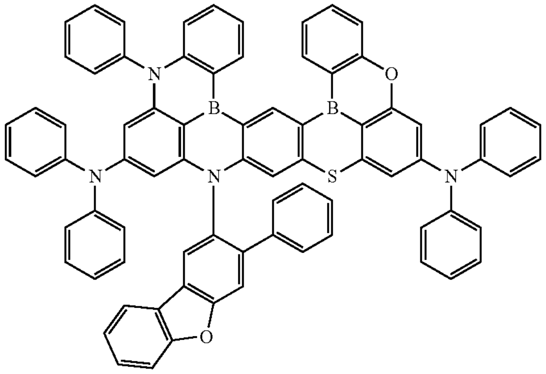
162
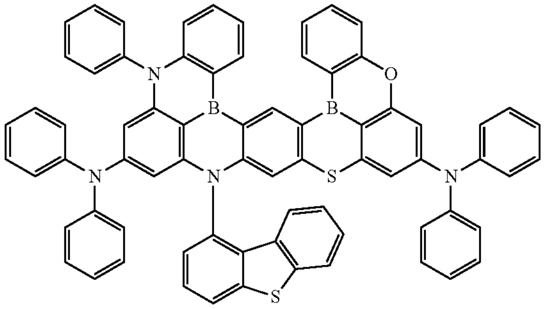
163
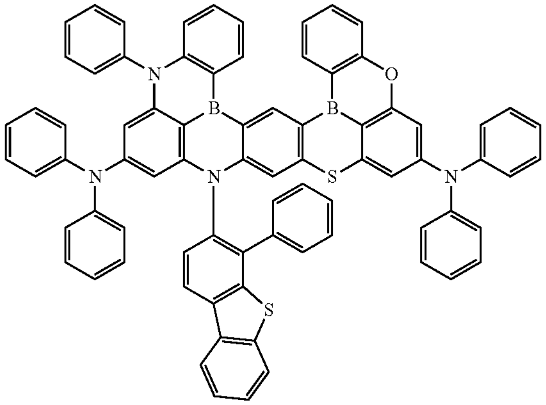
164
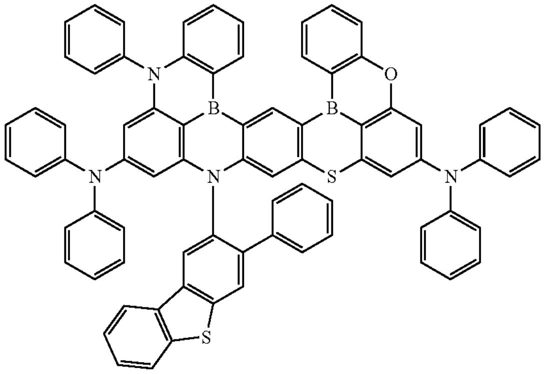

-continued
165
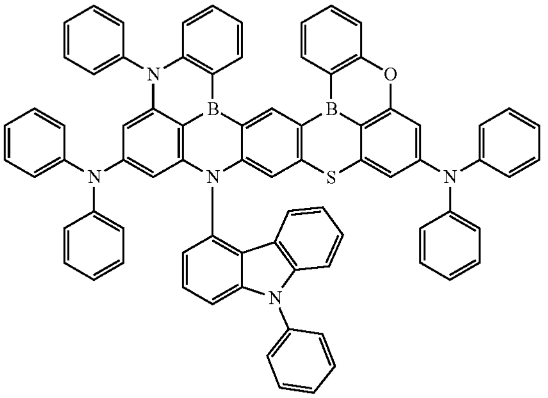
166
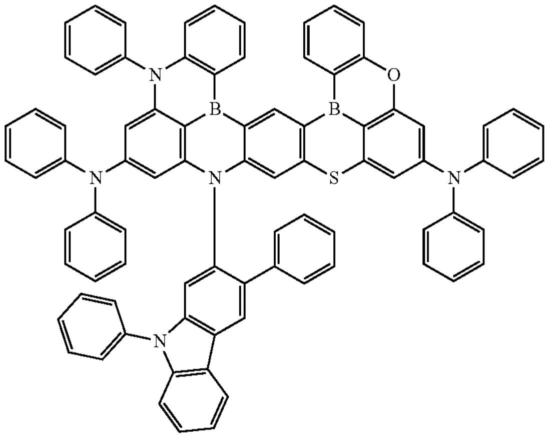
167
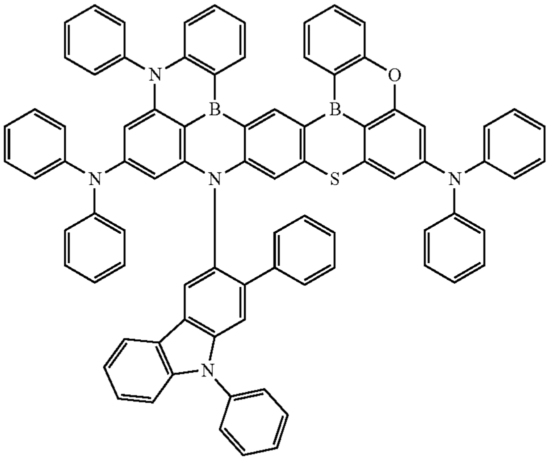
168
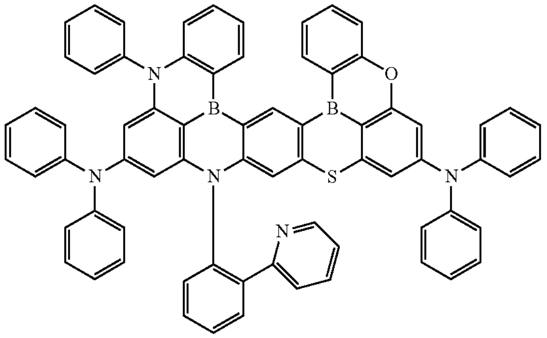
169
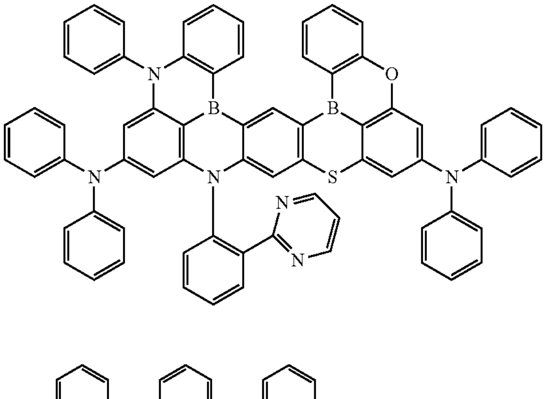
170
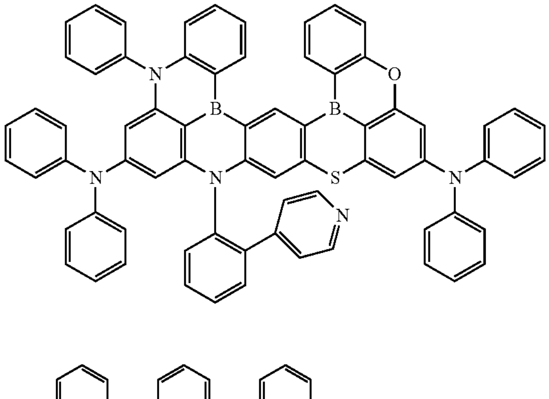
171
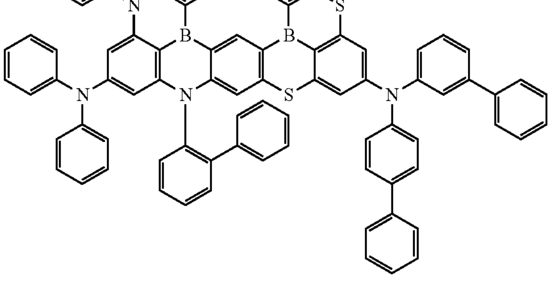
172
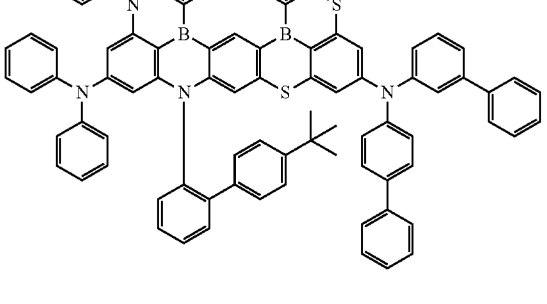

-continued
173
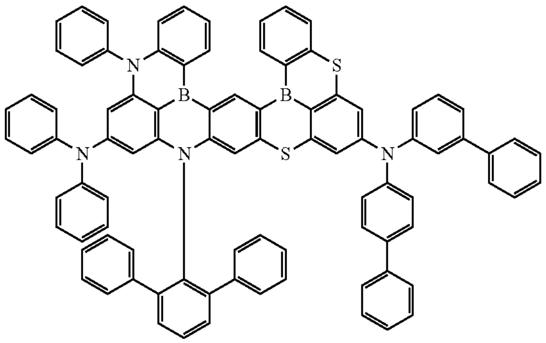
174
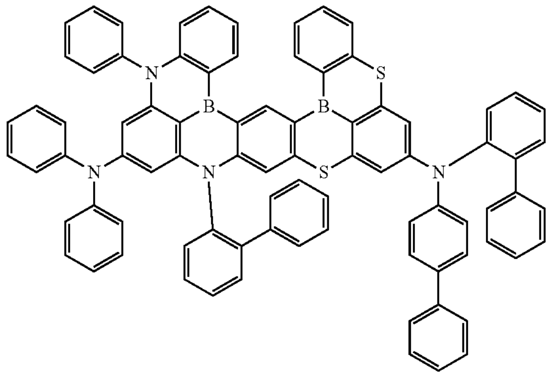
175
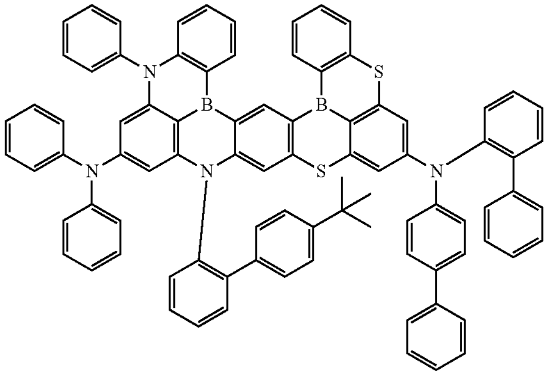
176
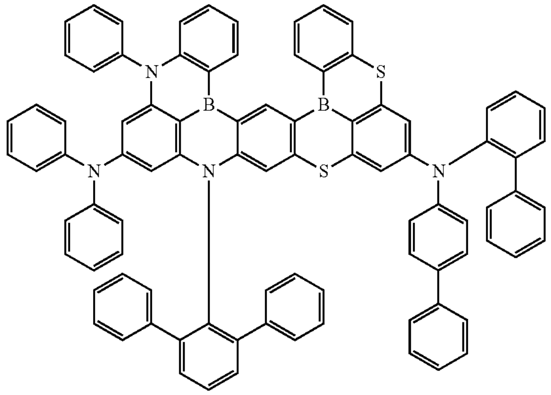
177
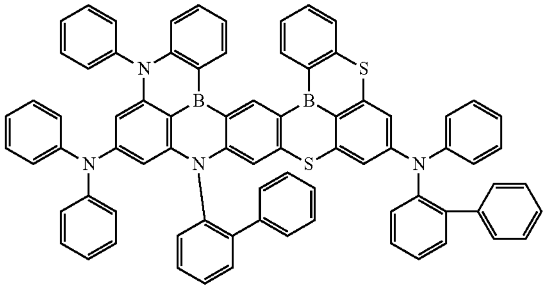
178
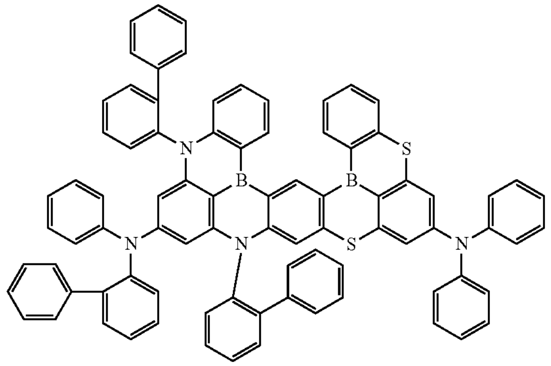
179
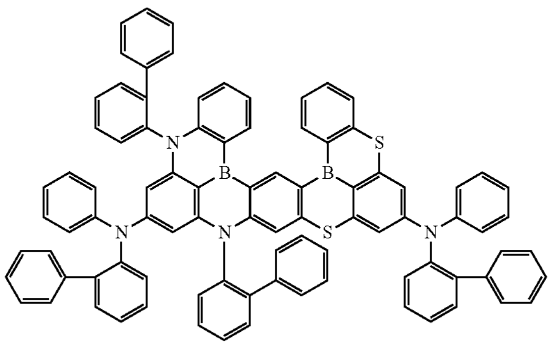
180
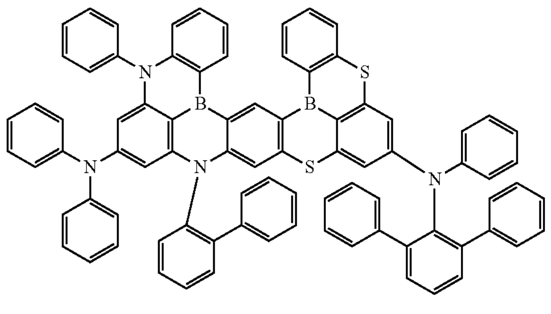

-continued
181
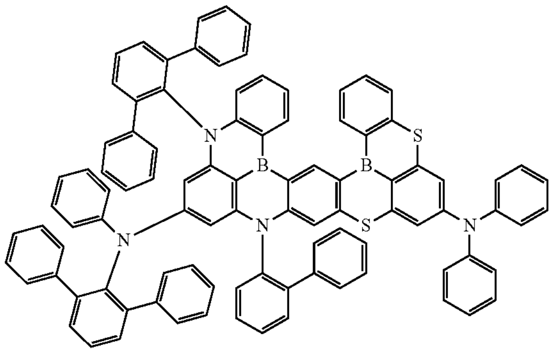
182
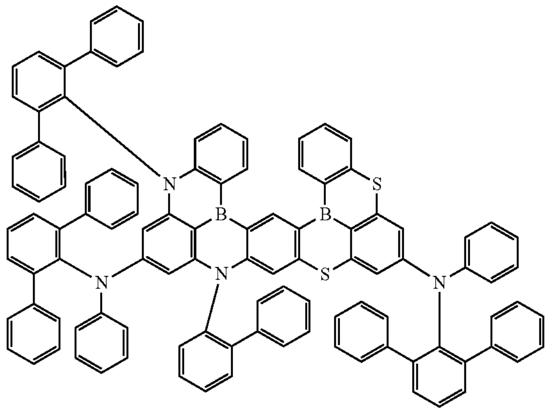
183
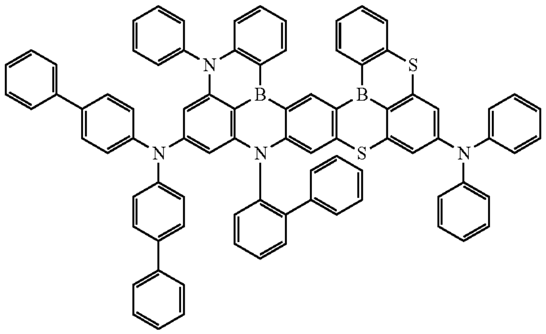
184
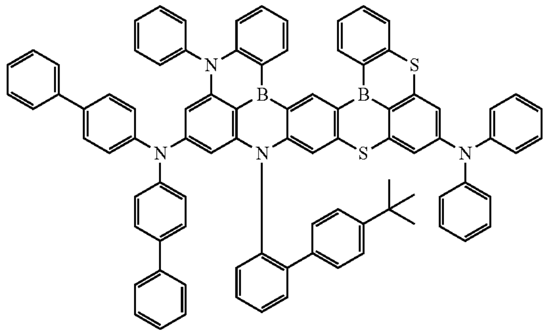
185
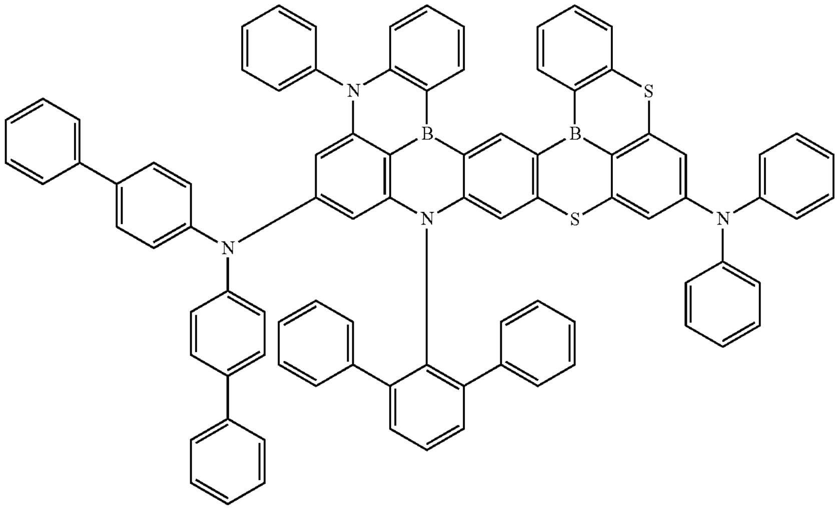
186
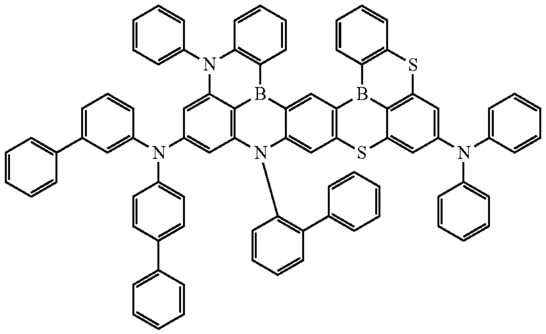
187
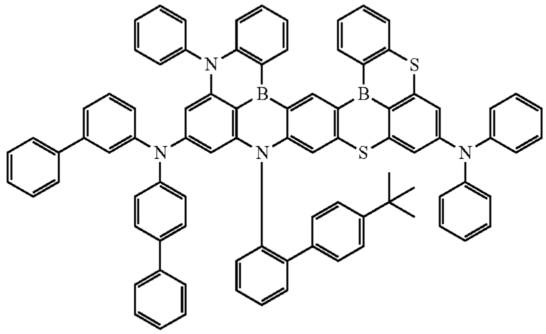

-continued
188
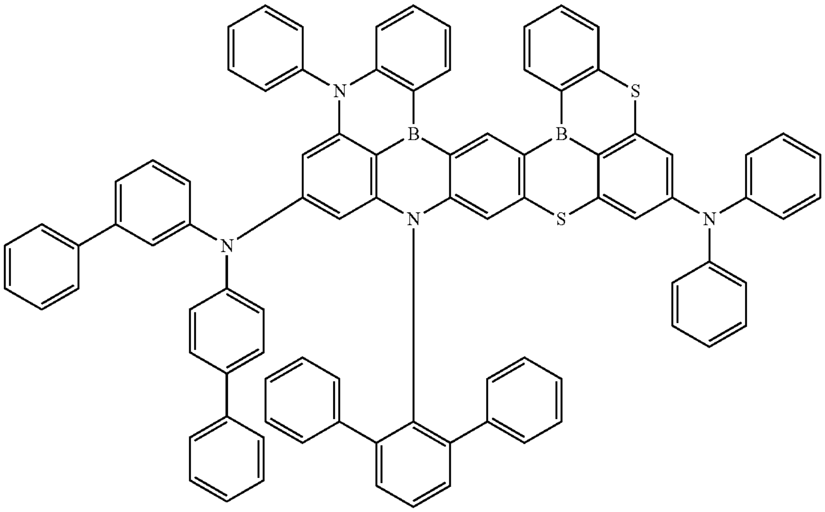
189
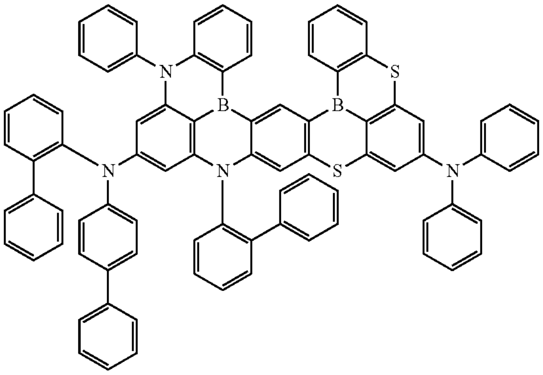
190
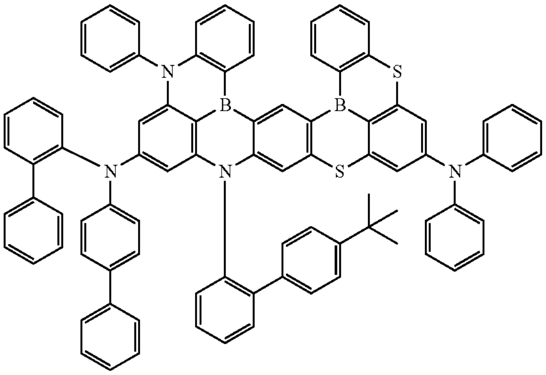
191
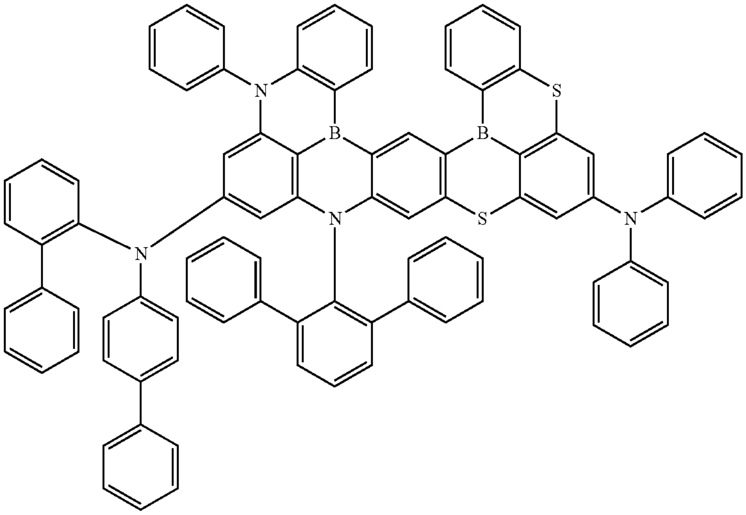

-continued
192
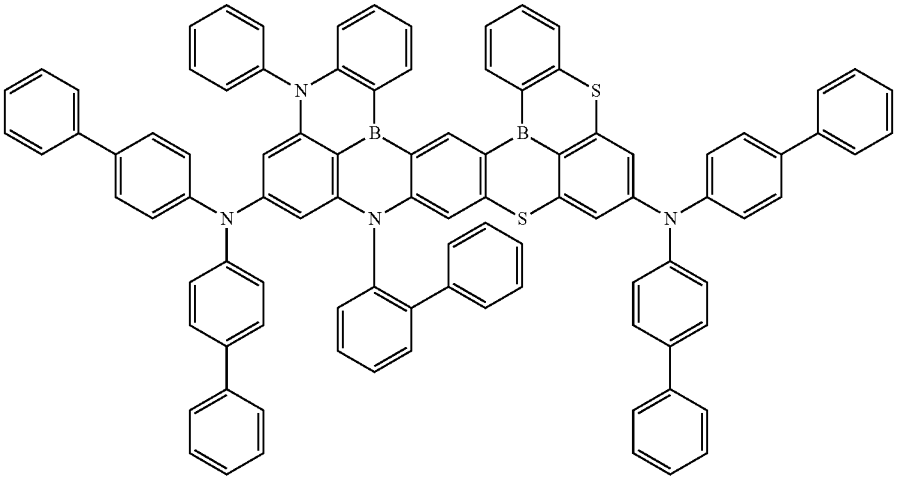
193
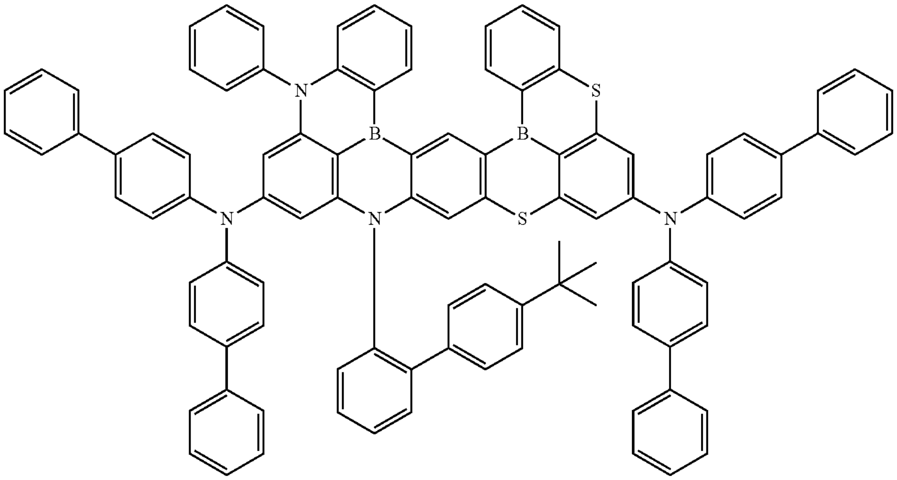
194
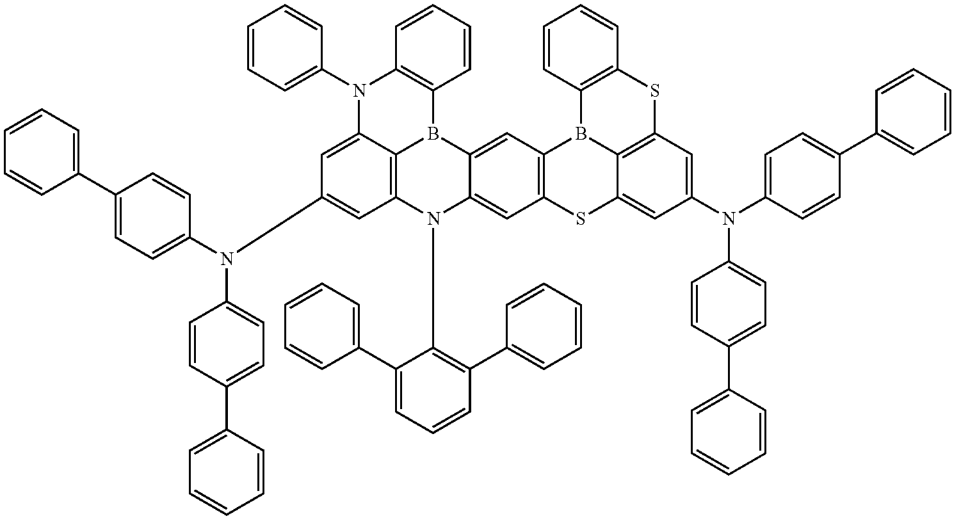

-continued
195
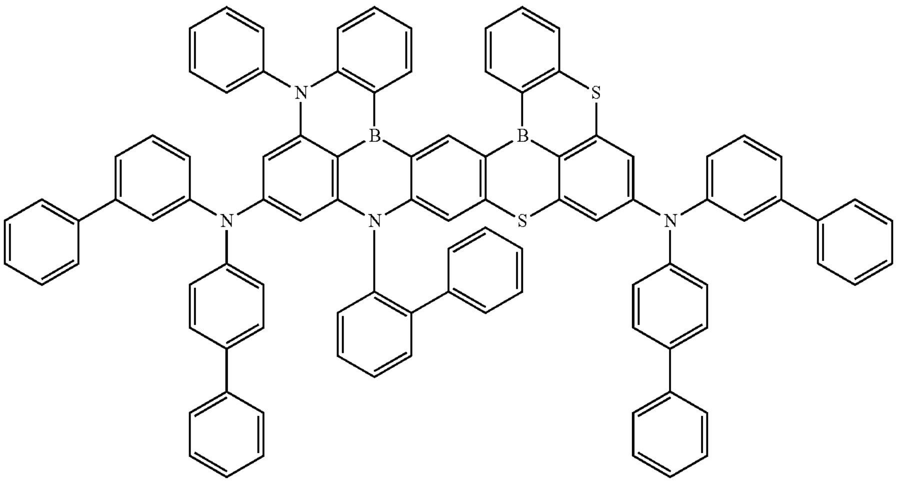
196
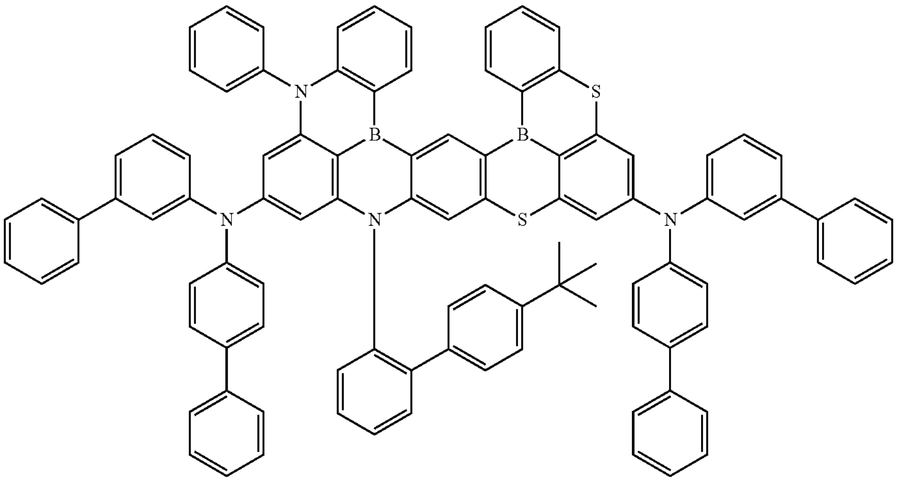
197
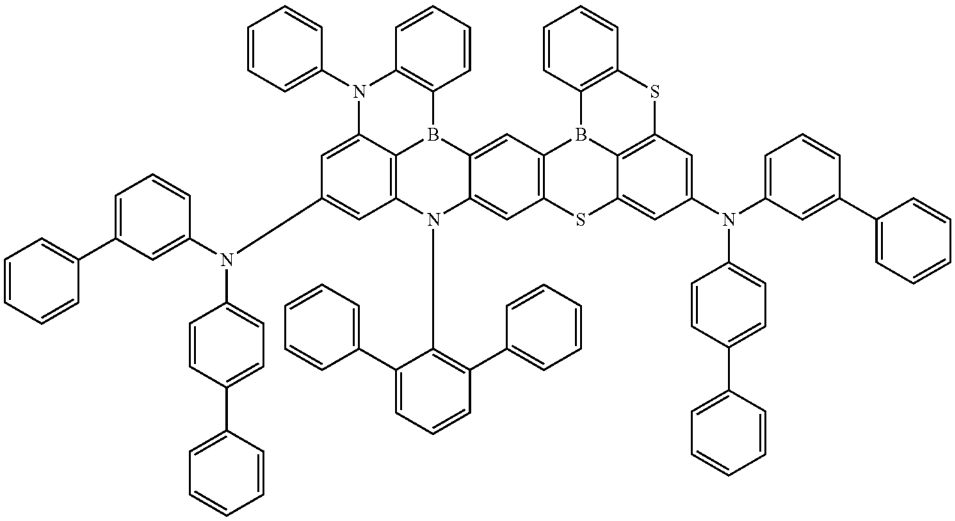

-continued
198
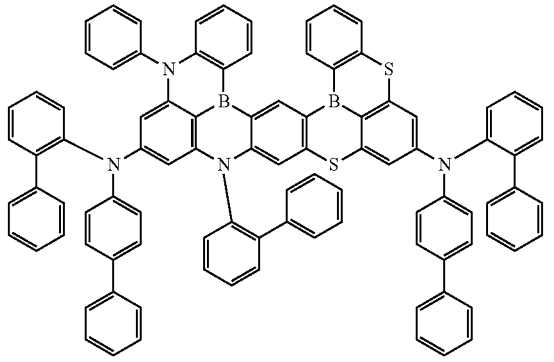
199
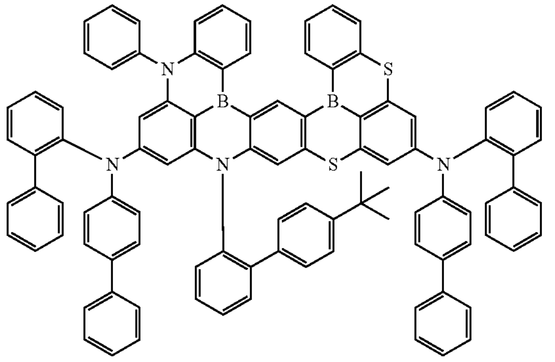
200
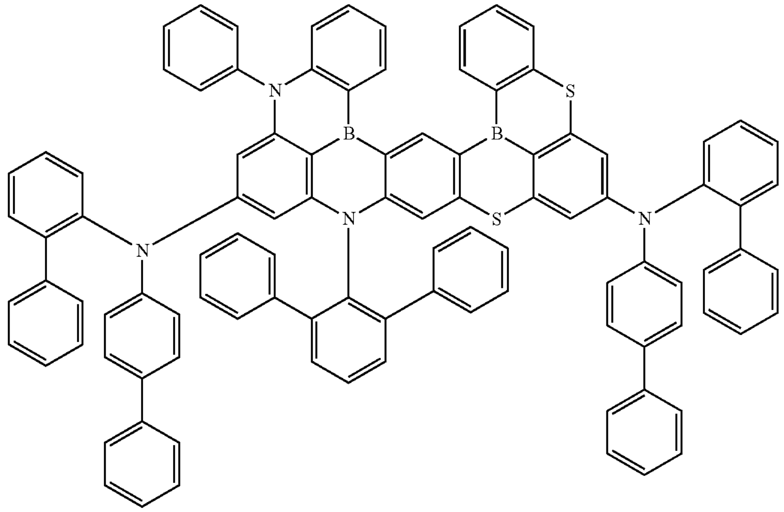
201
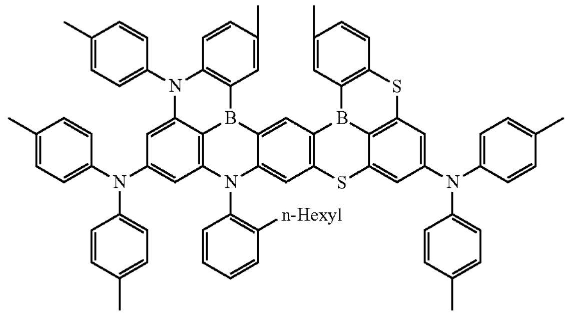
202
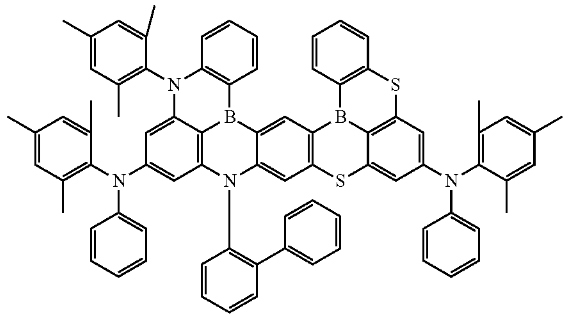
203
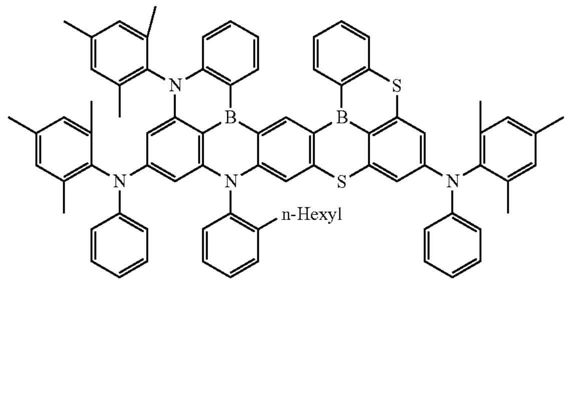
204
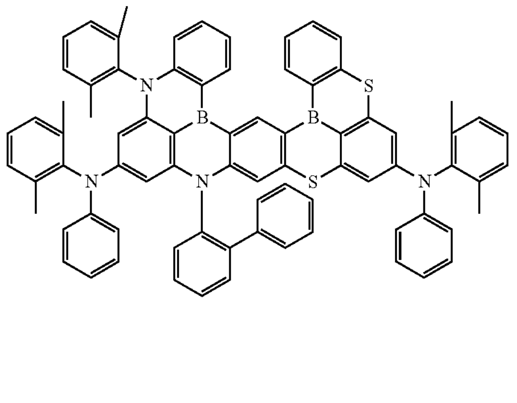

-continued
205
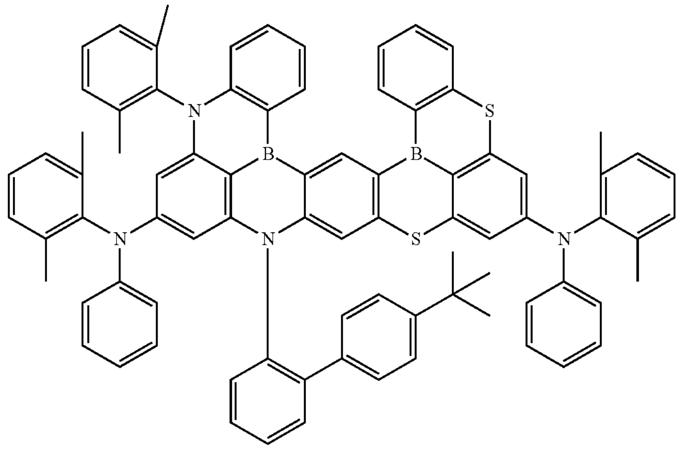
206
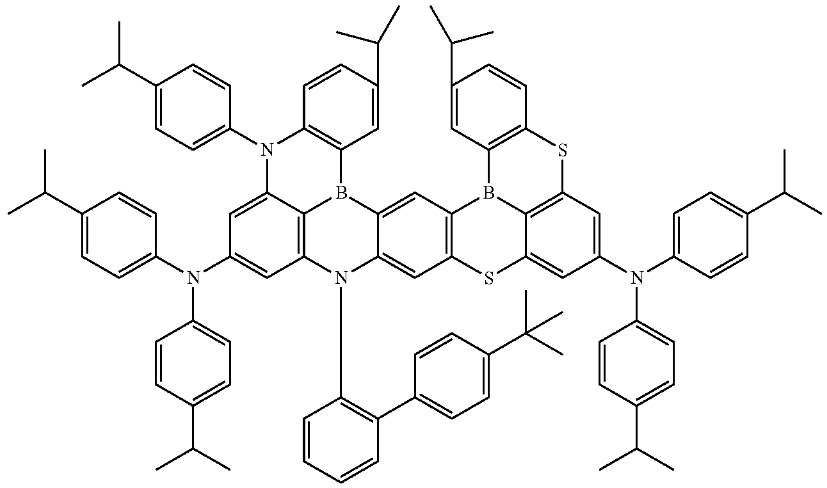
207
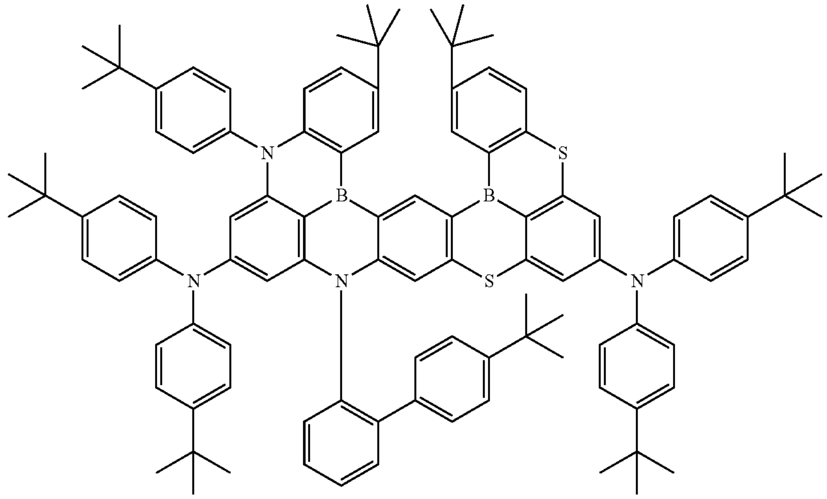

-continued
208
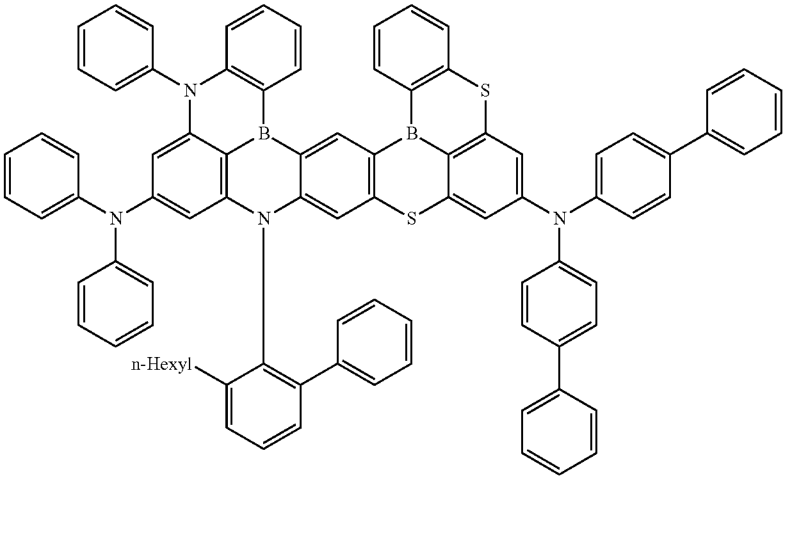
209
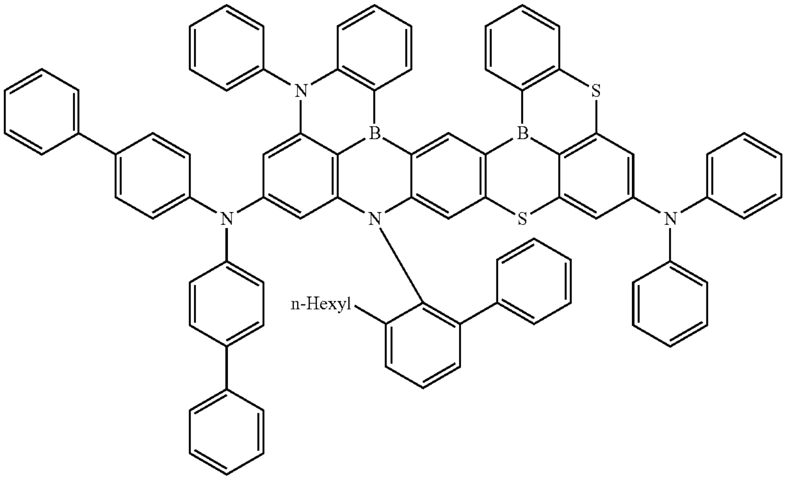
210
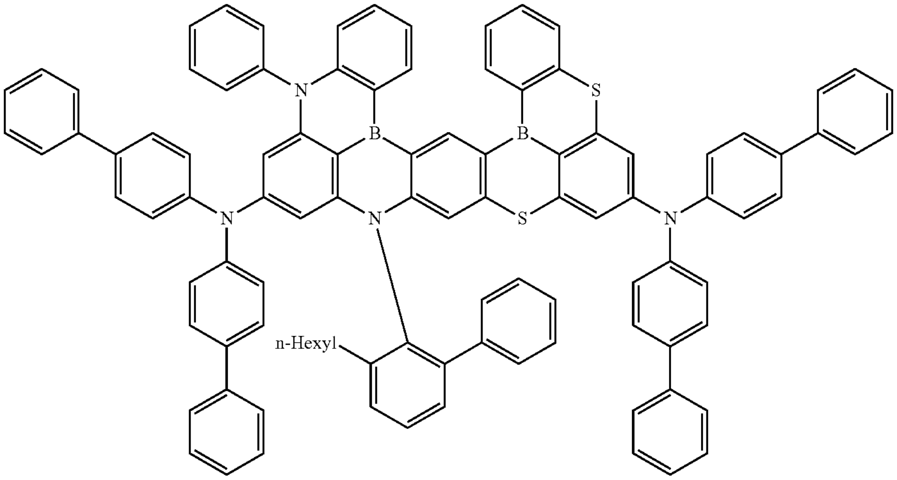

-continued
211
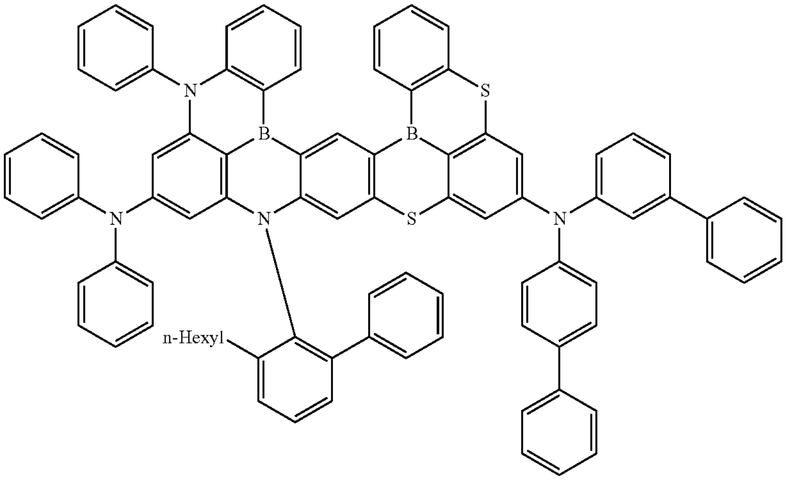
212
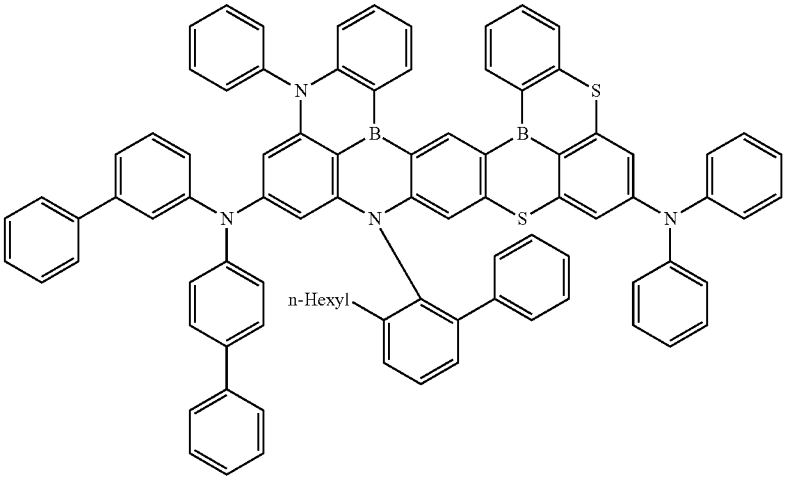
213
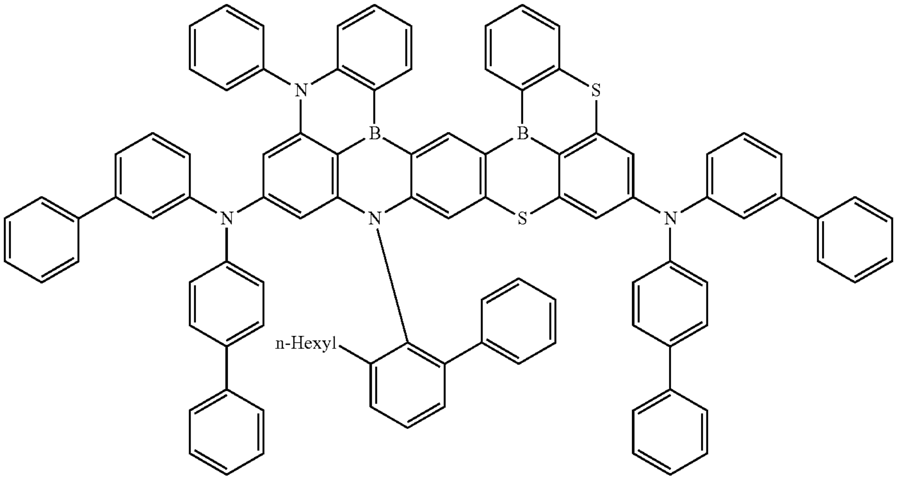

-continued
214
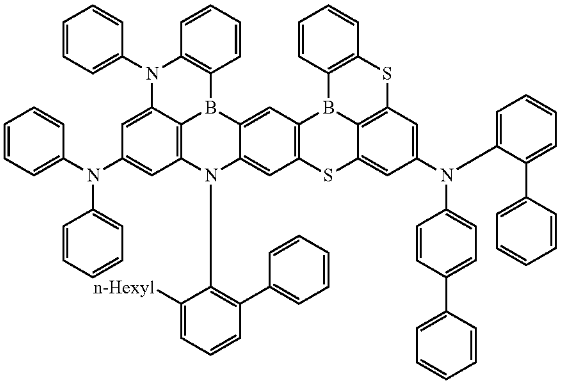
215
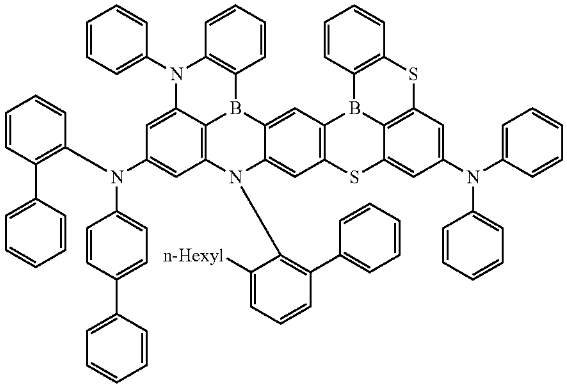
216
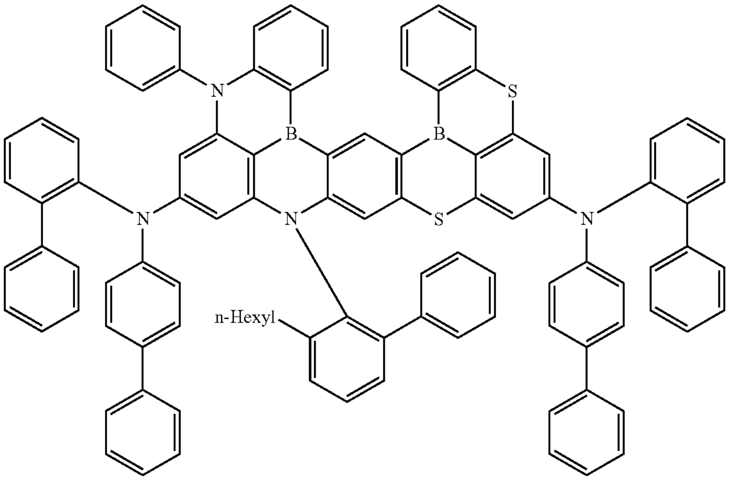
217
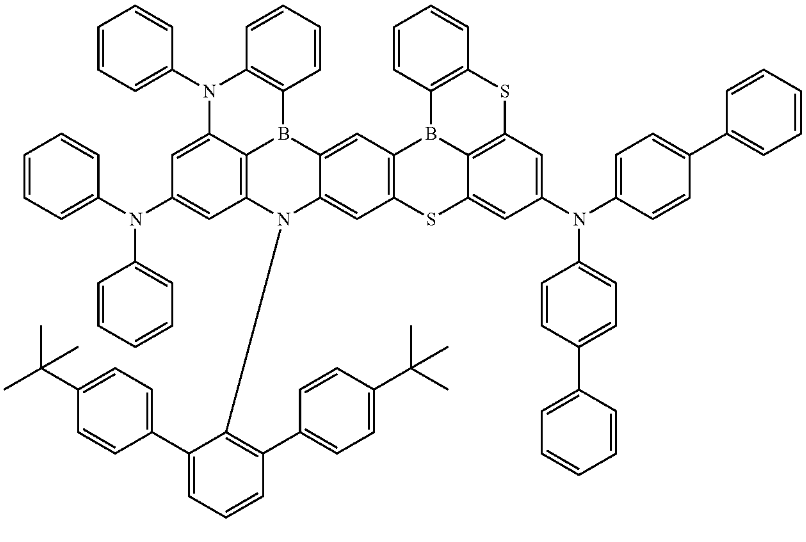

-continued
218
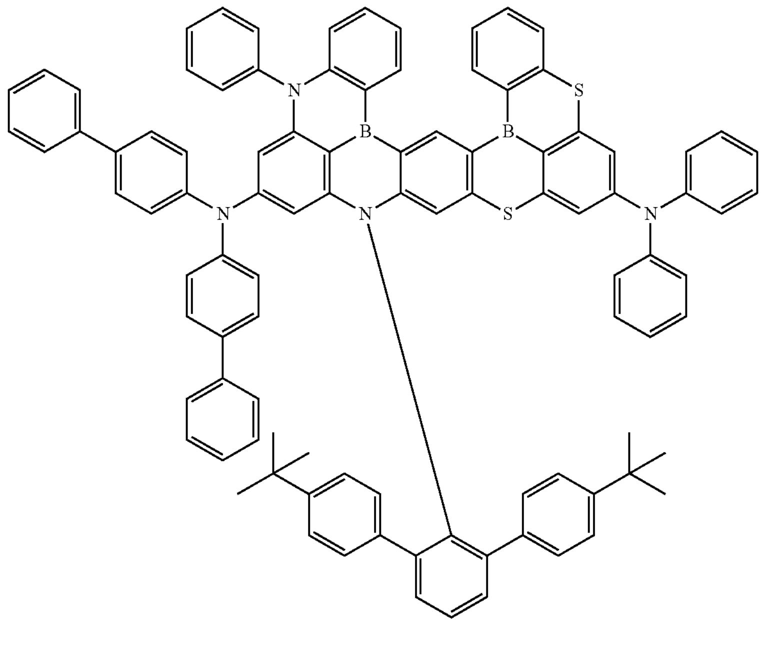
219
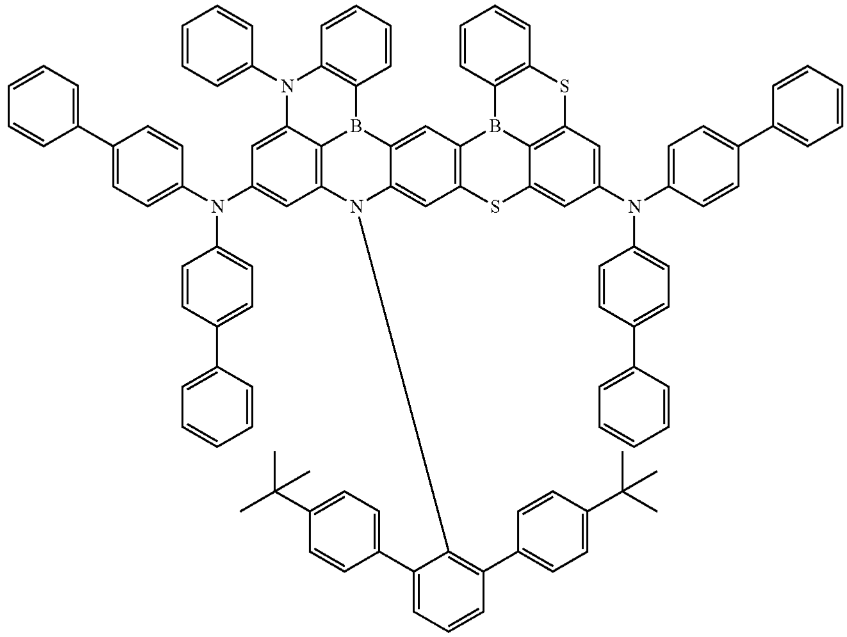

-continued
220
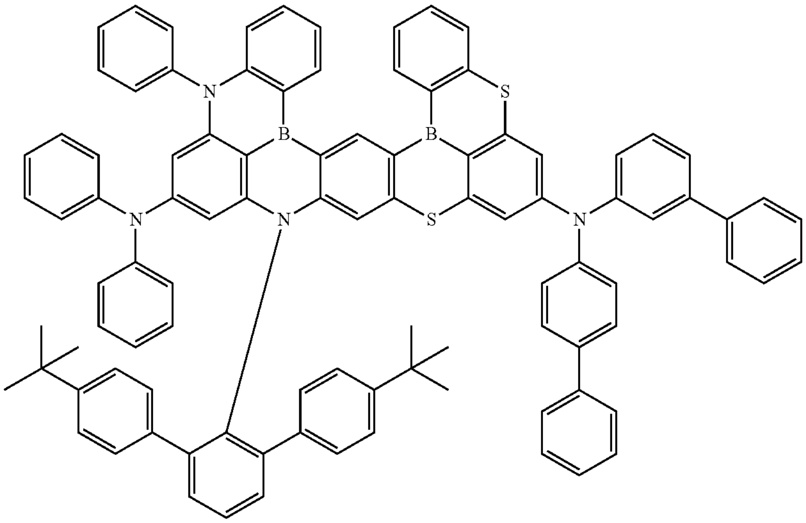
221
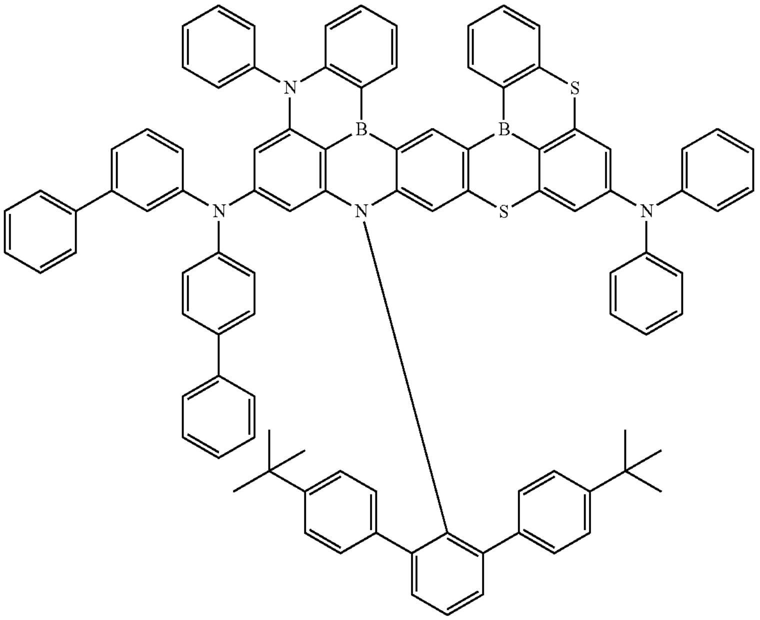
222
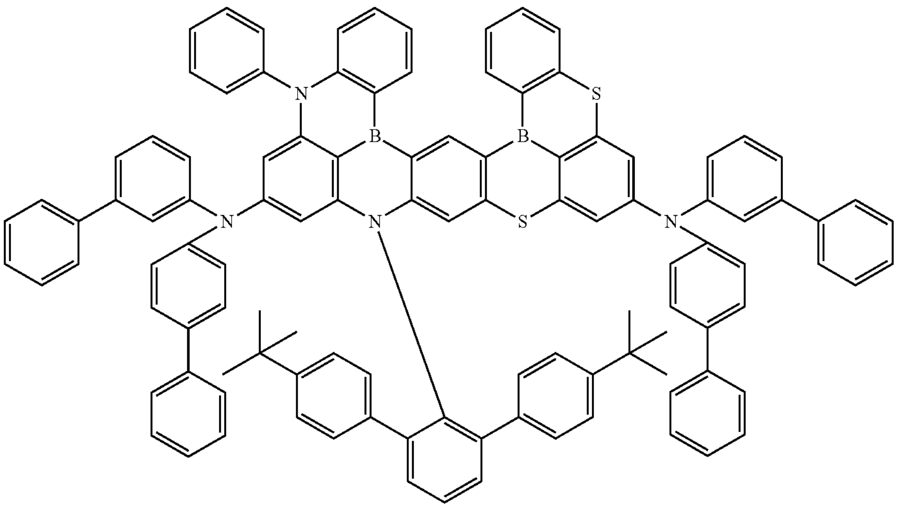

-continued
223
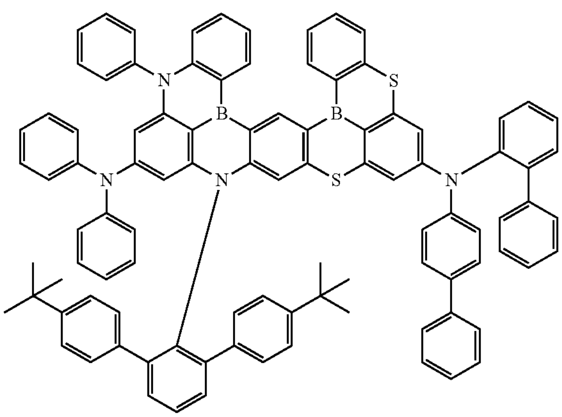
224
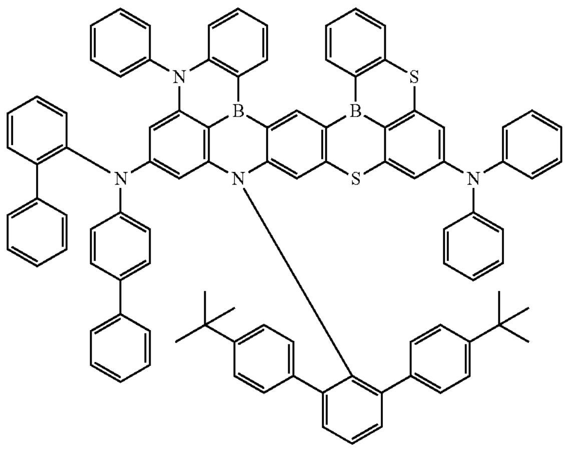
225
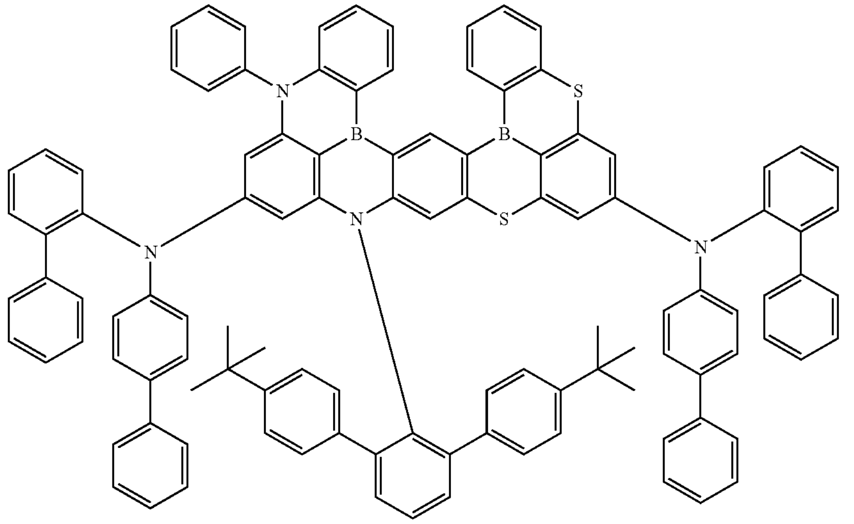
226
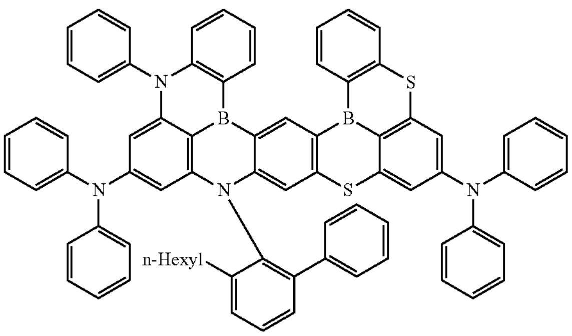
227
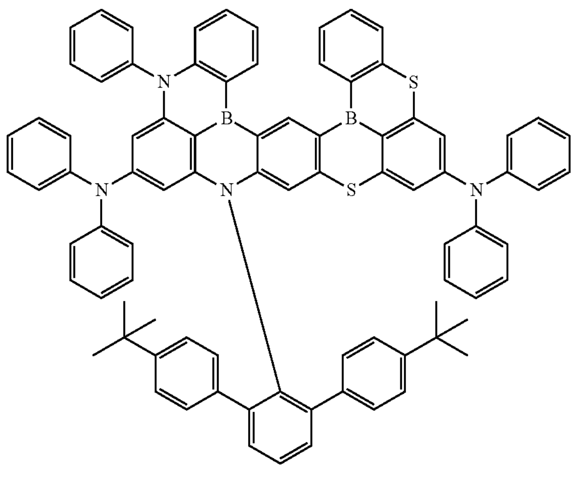

-continued
228
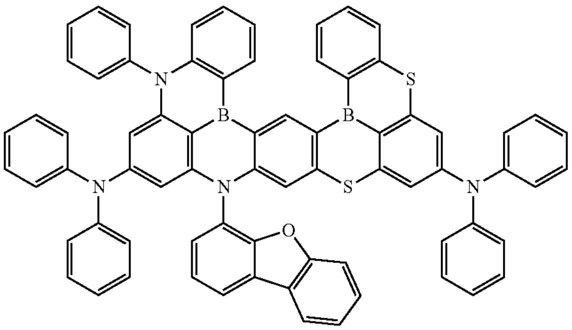
229
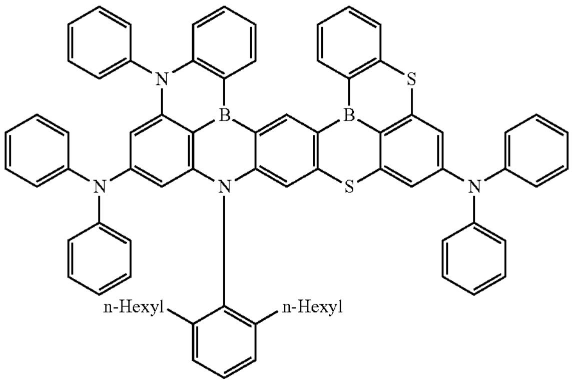
230
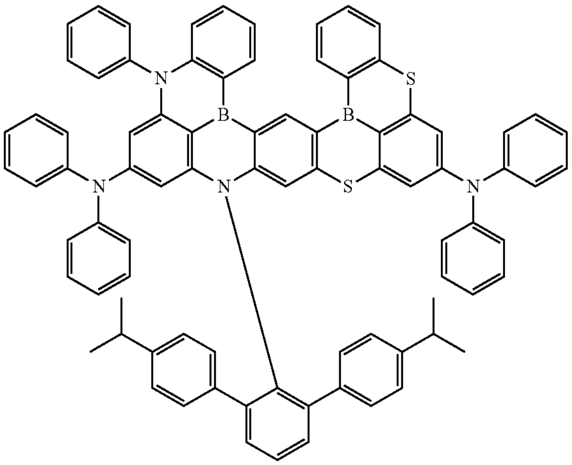
231
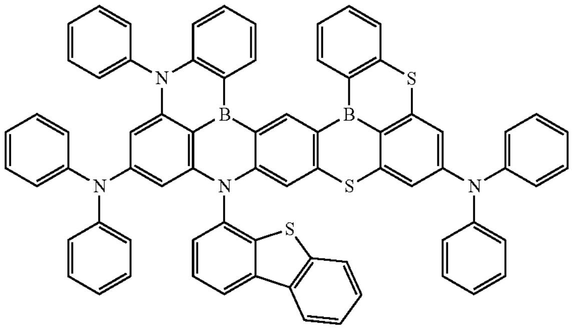
232
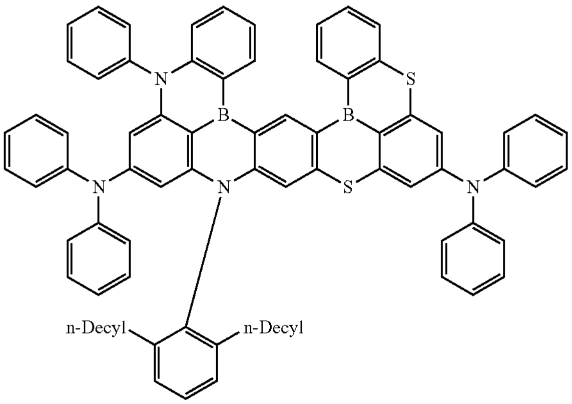
233
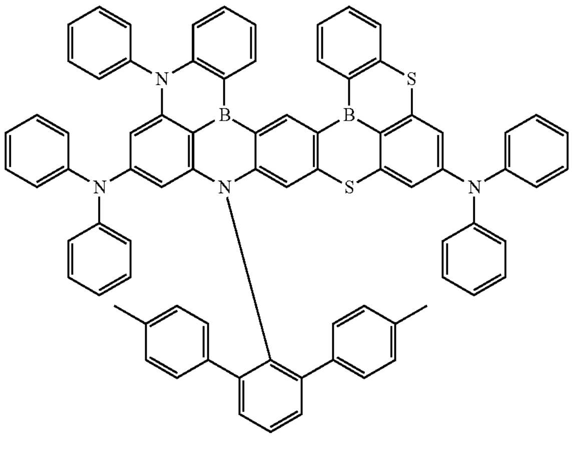

-continued
234
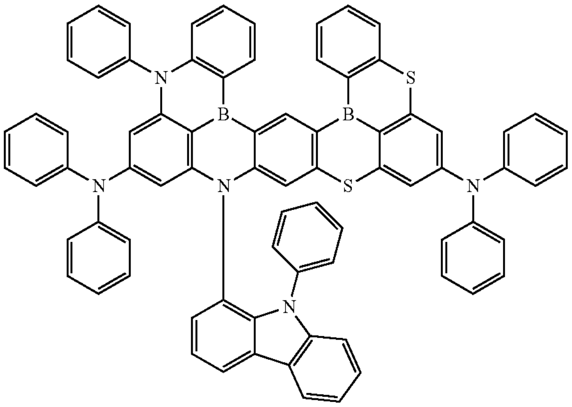
235
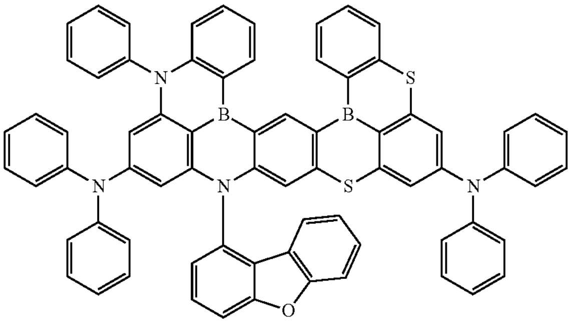
236
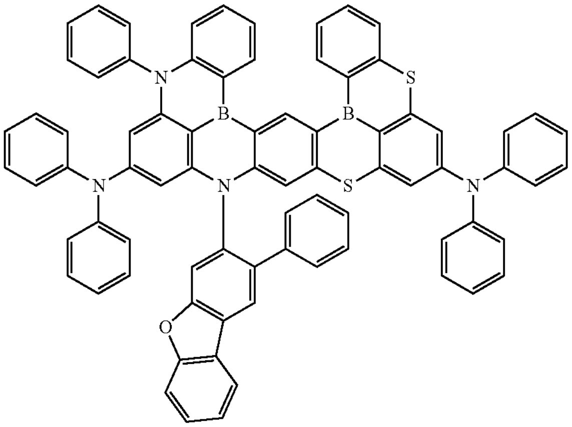
237
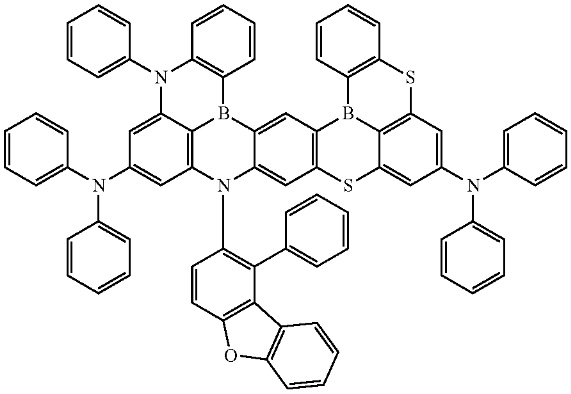
238
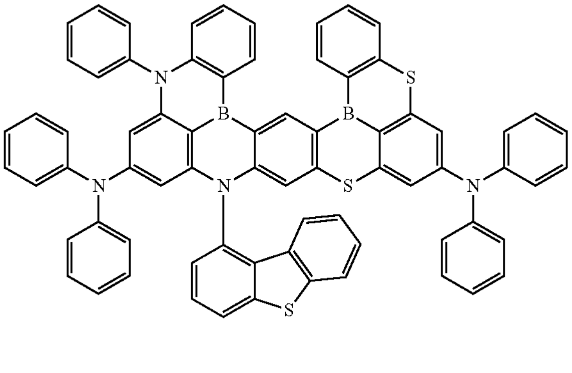
239
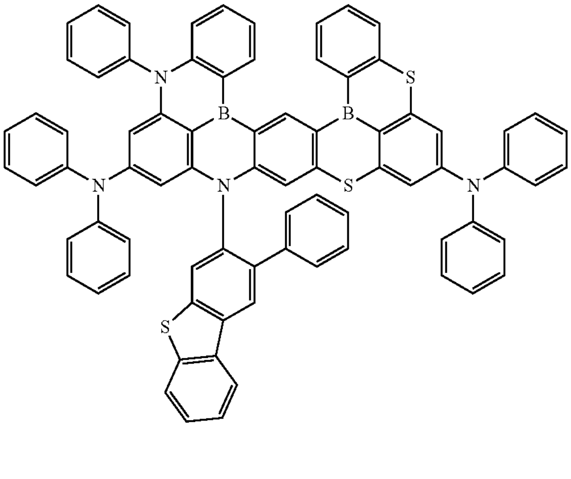

-continued
240
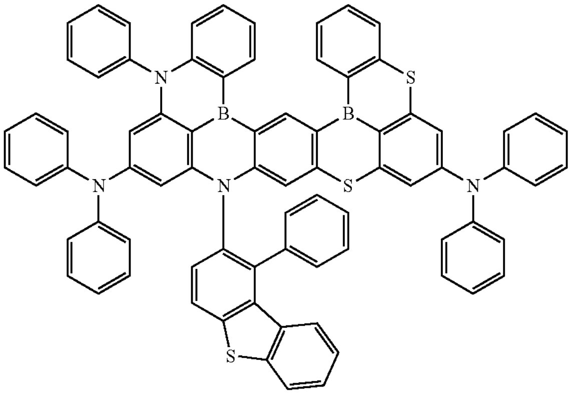
241
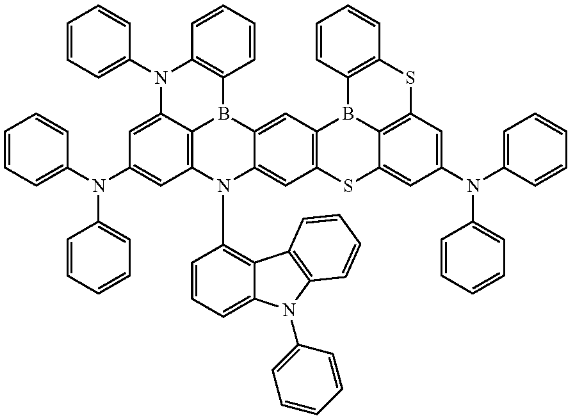
242
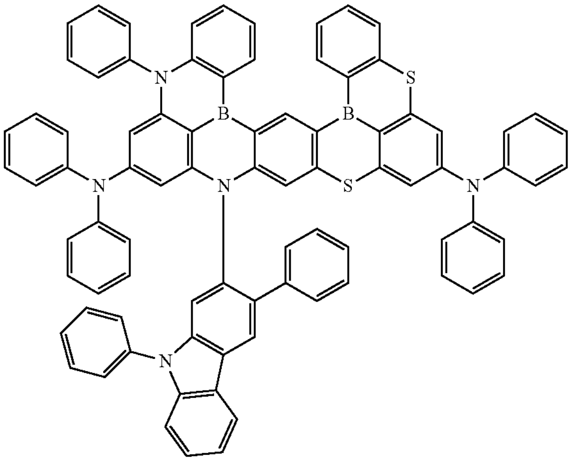
243
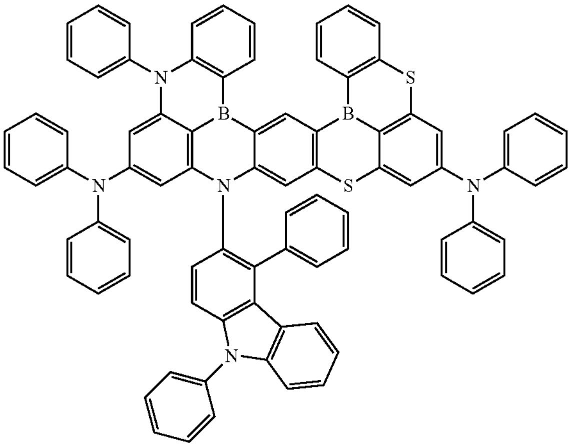
244
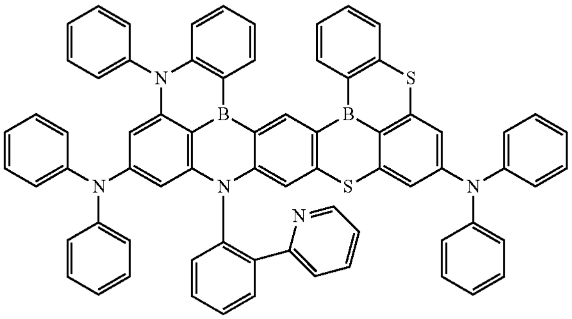
245
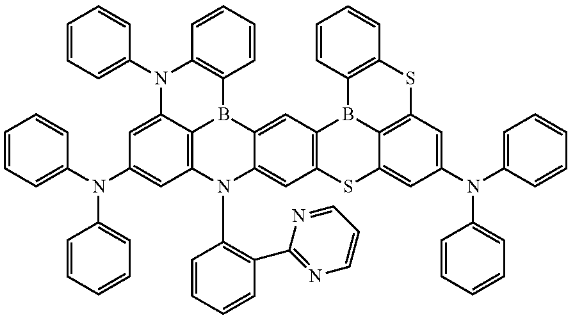
246
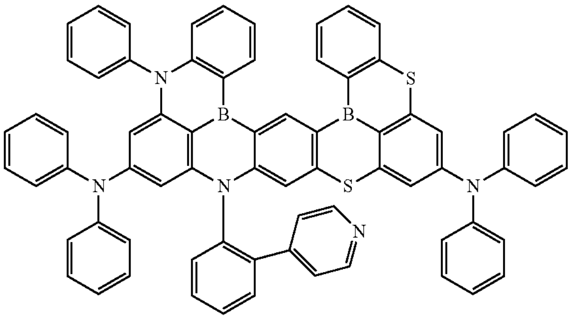
247
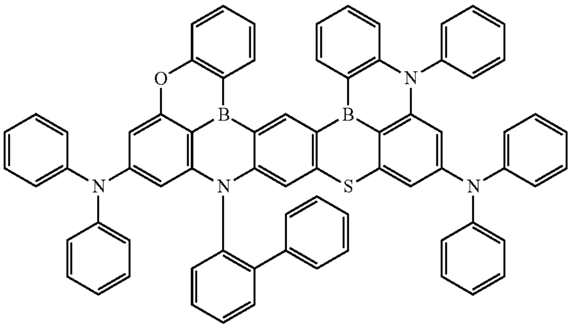

-continued
248
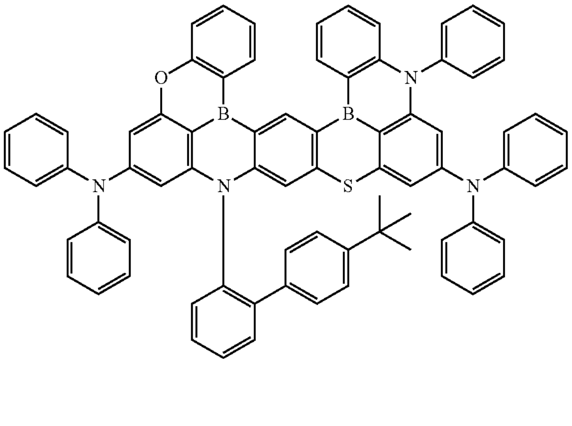
249
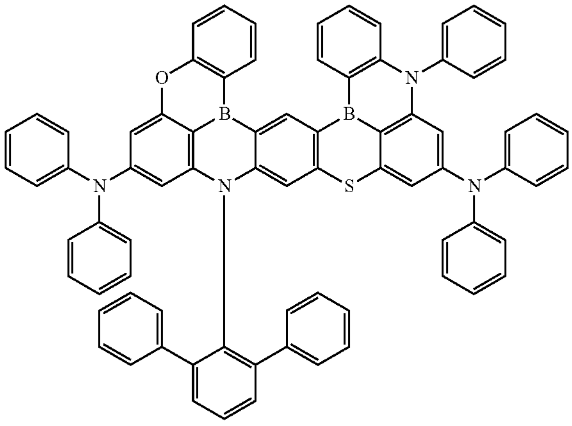
250
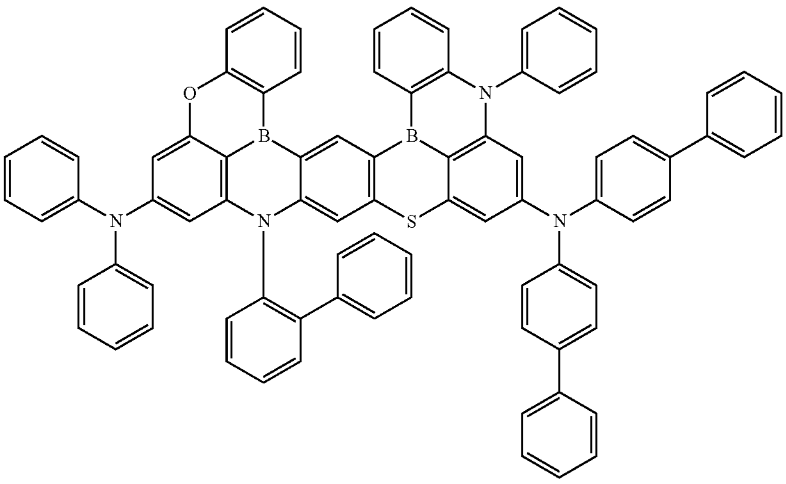
251
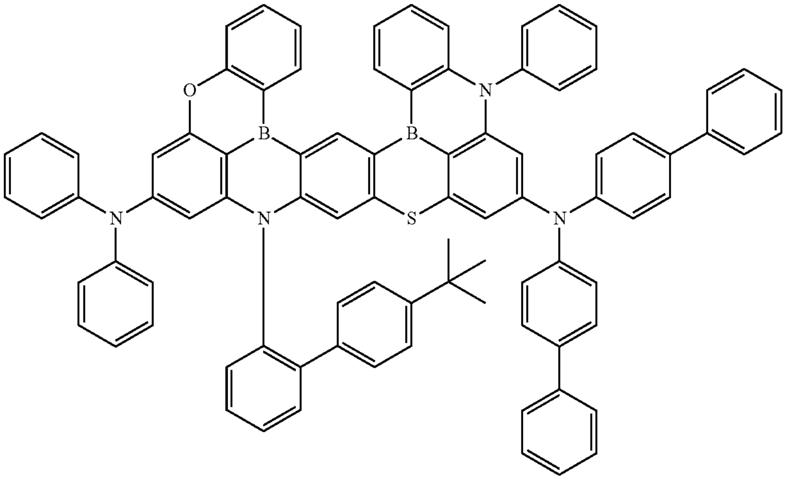

-continued
252
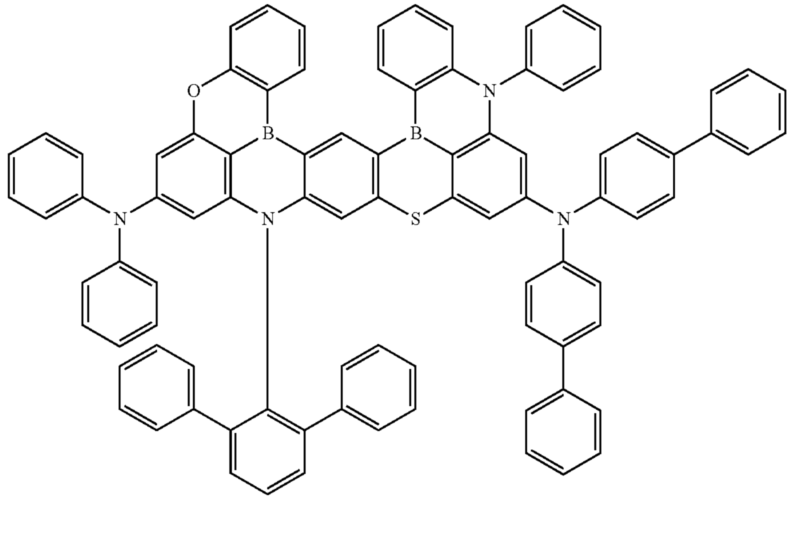
253
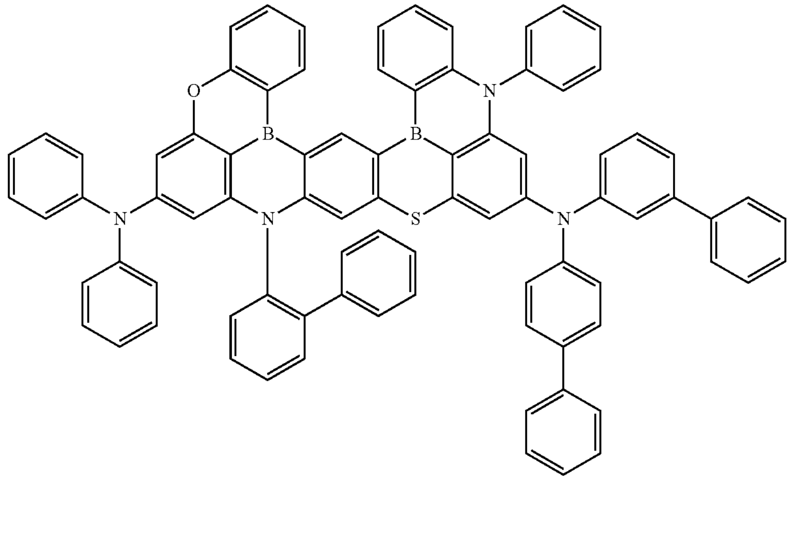
254
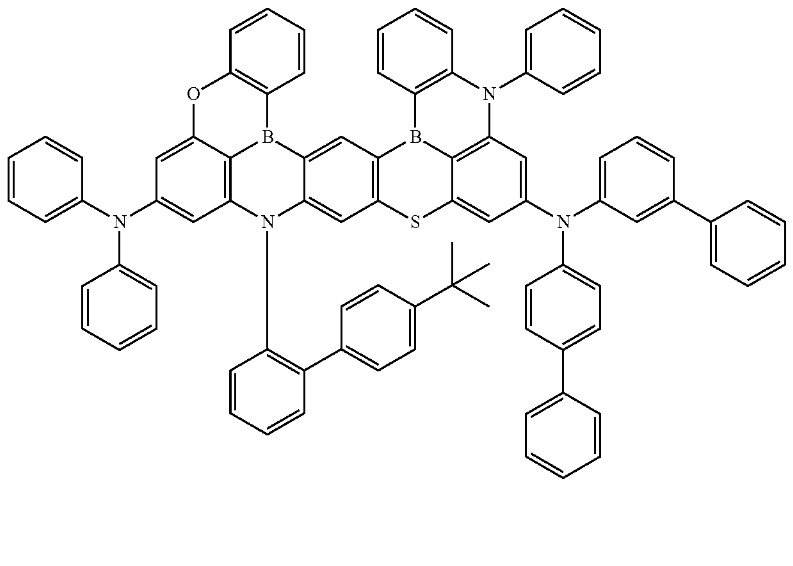

-continued
255
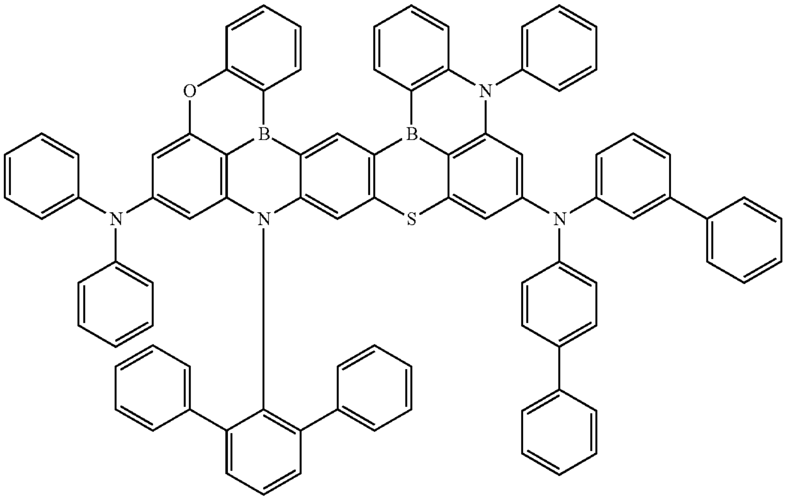
256
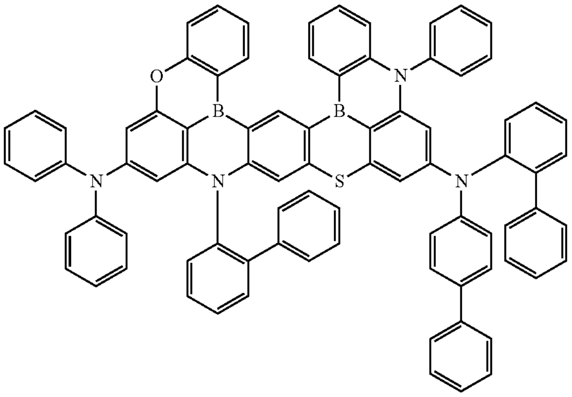
257
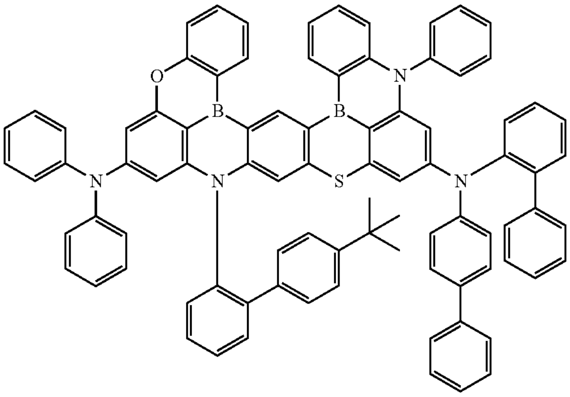
258
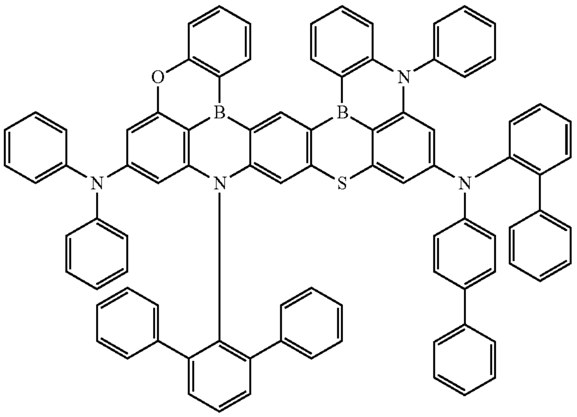
259
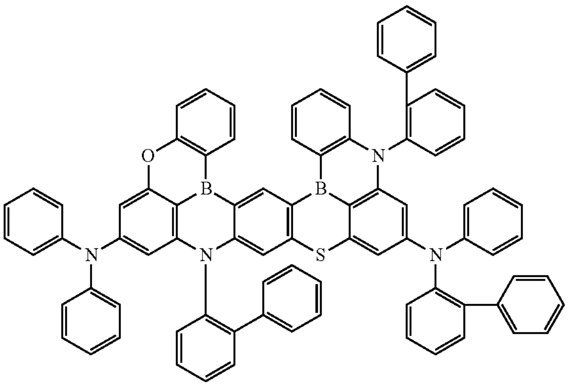

-continued
260
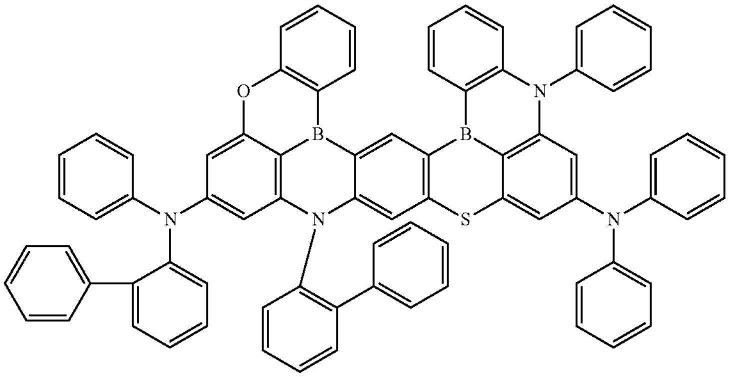
261
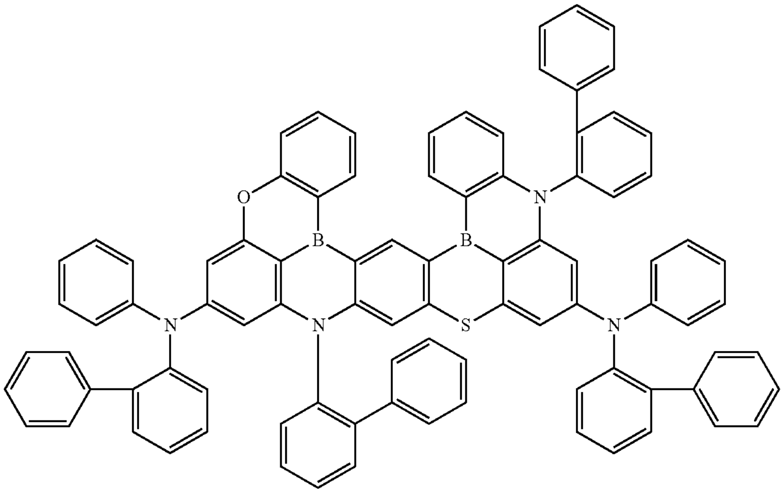
262
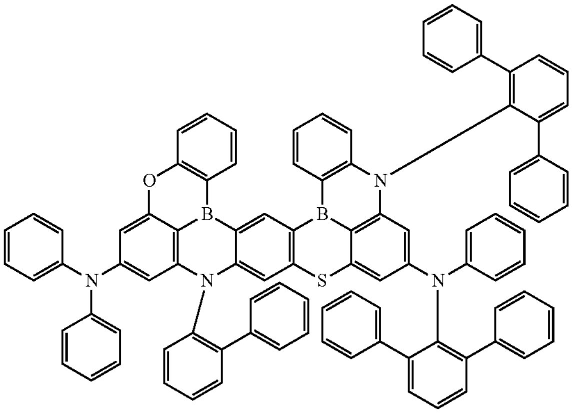
263
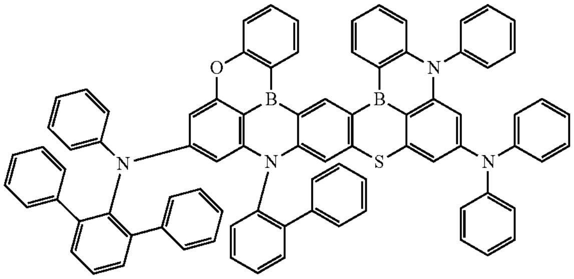

-continued
264
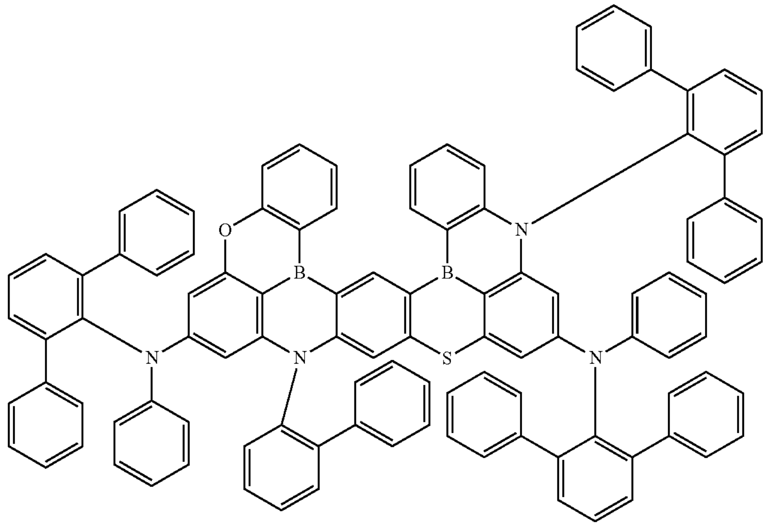
265
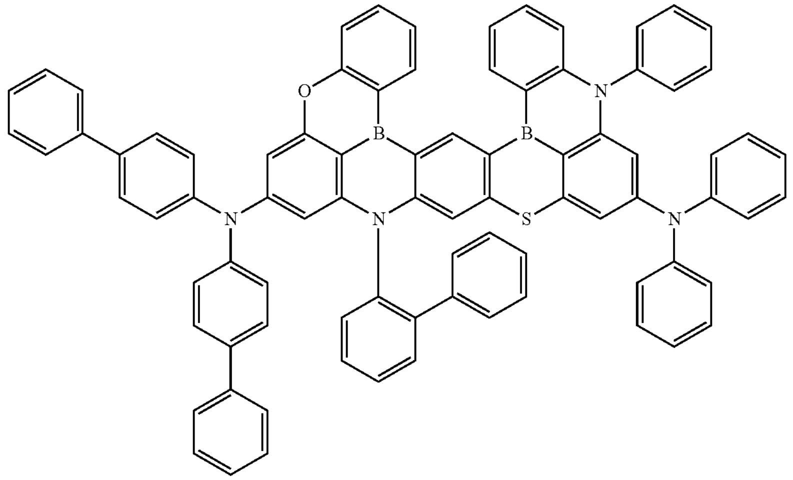
266
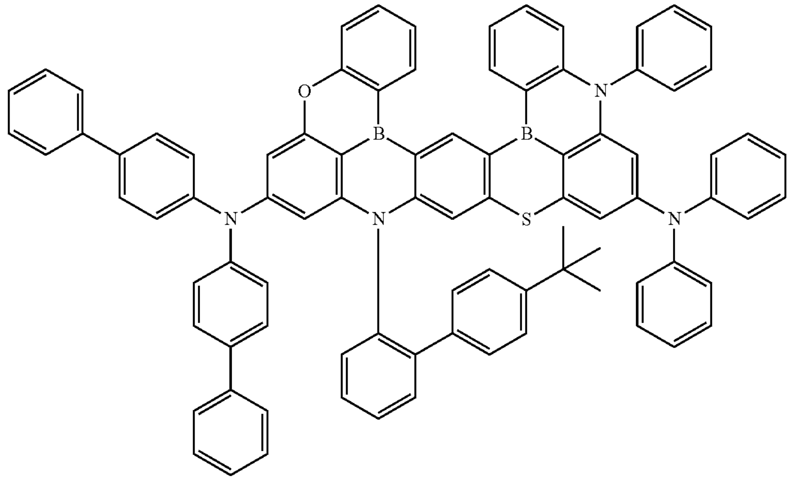

-continued
267
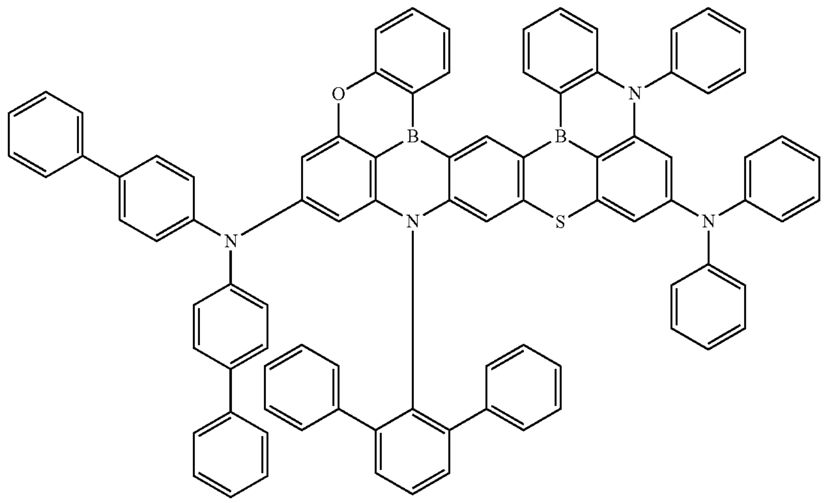
268
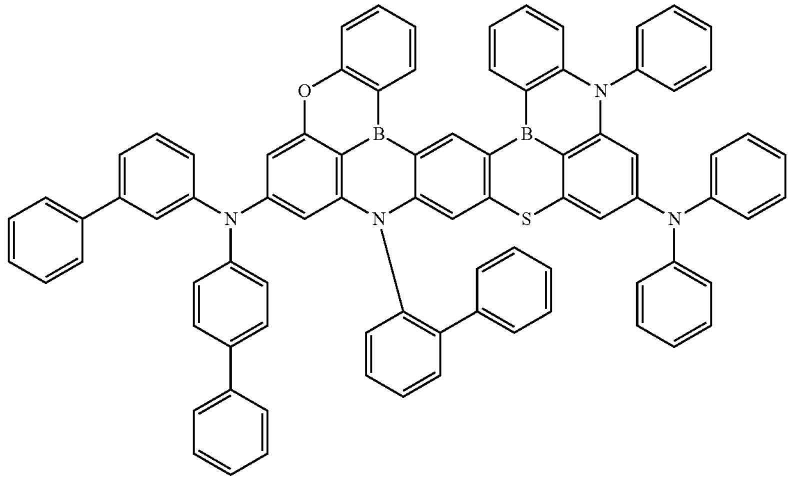
269
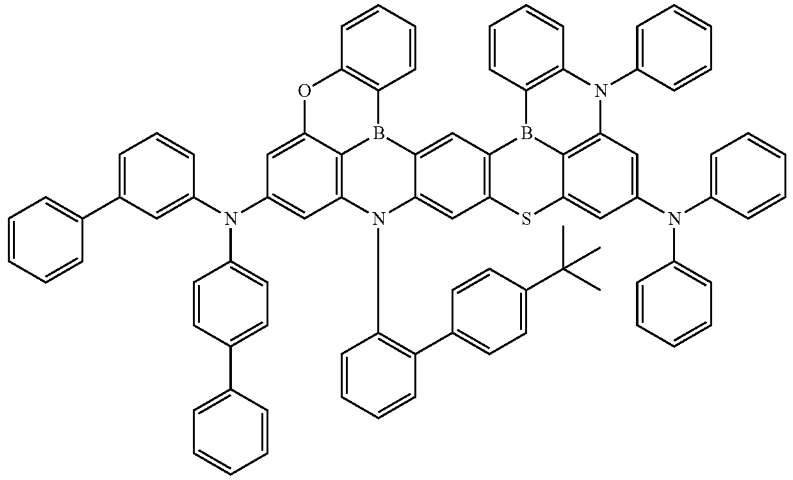

-continued
270
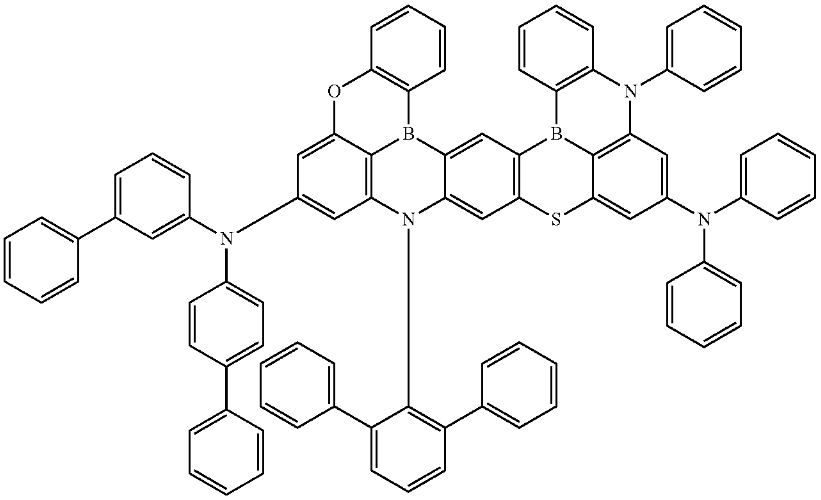
271
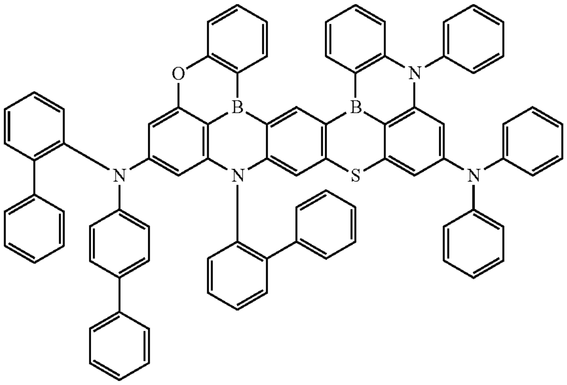
272
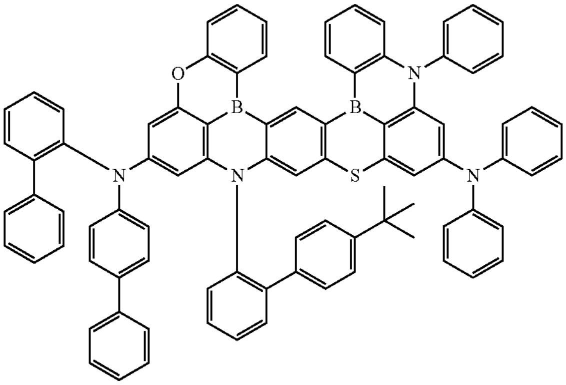
273
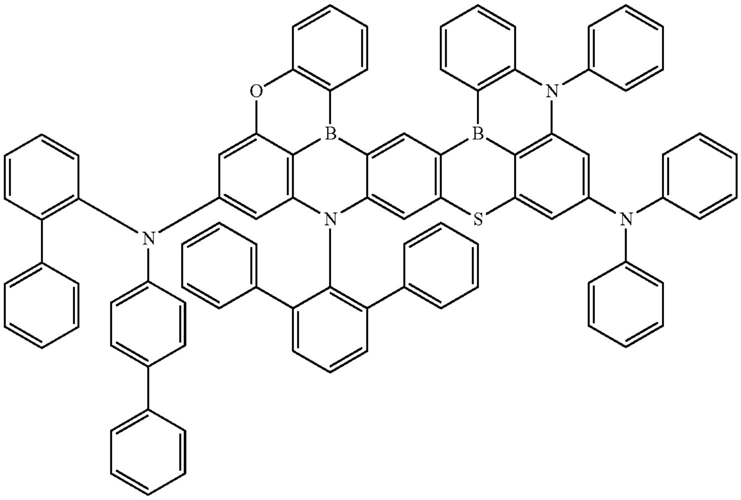

-continued
274
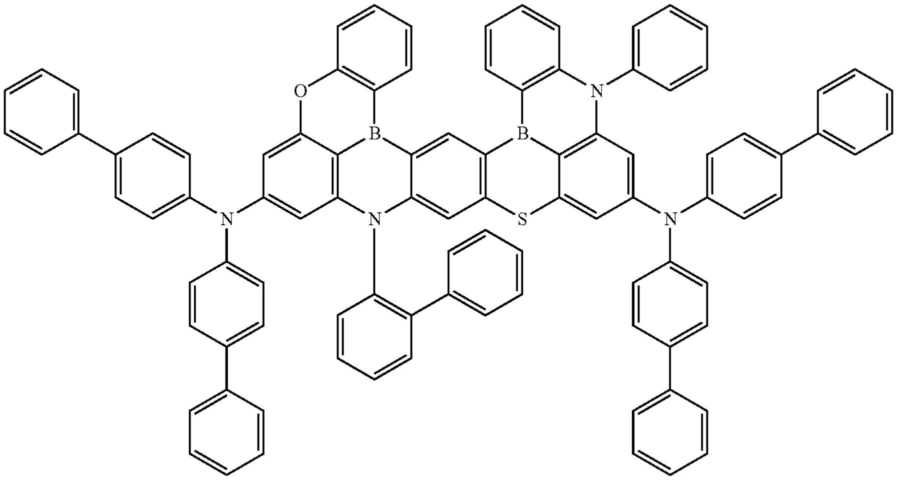
275
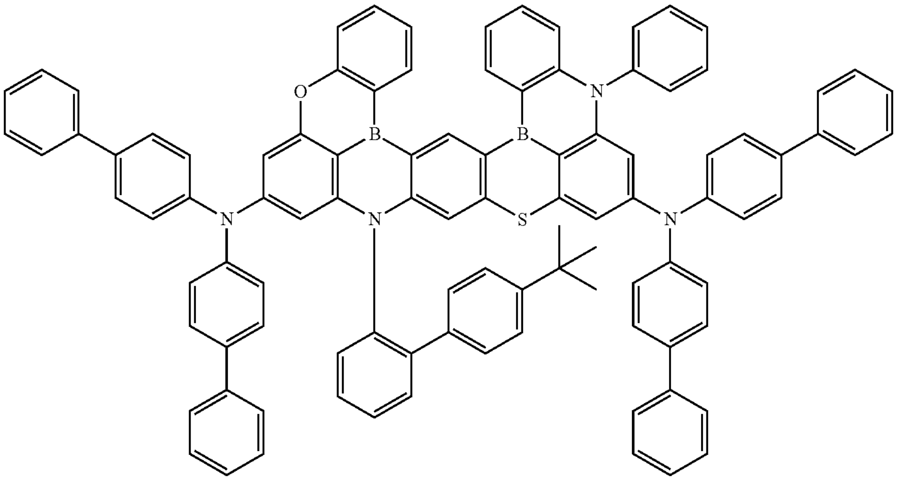
276
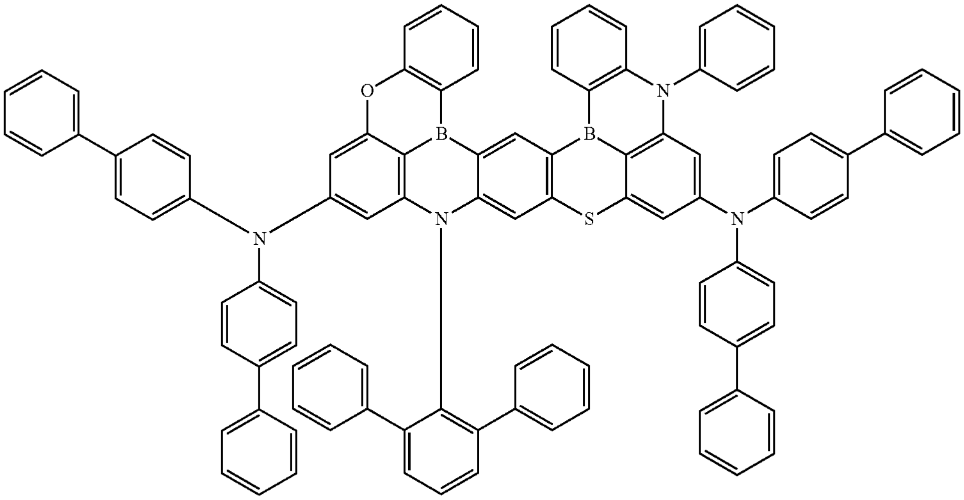

-continued
277
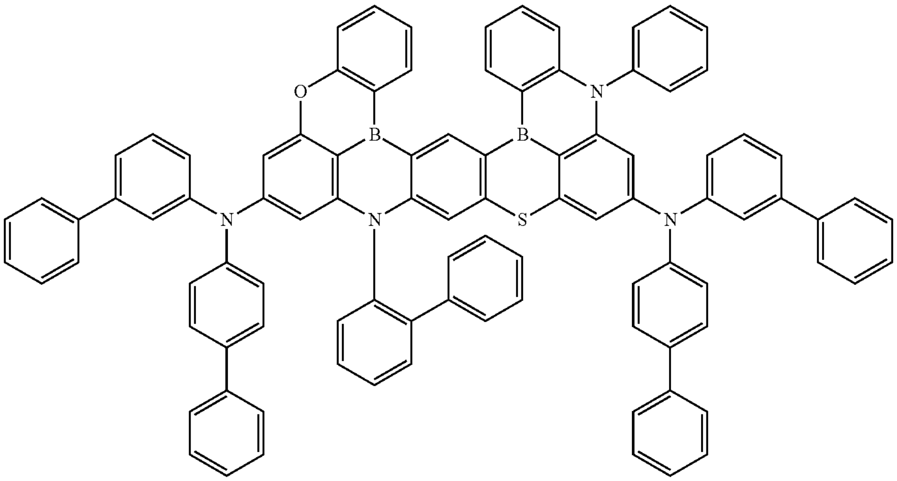
278
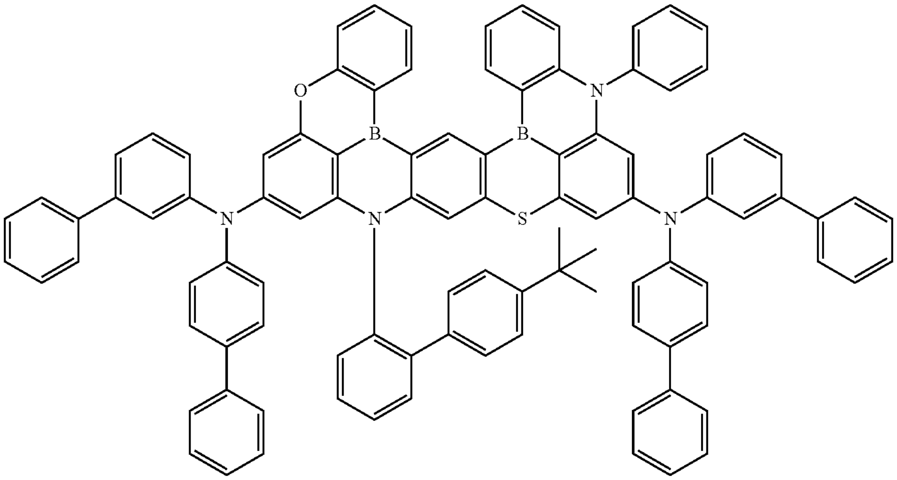
279
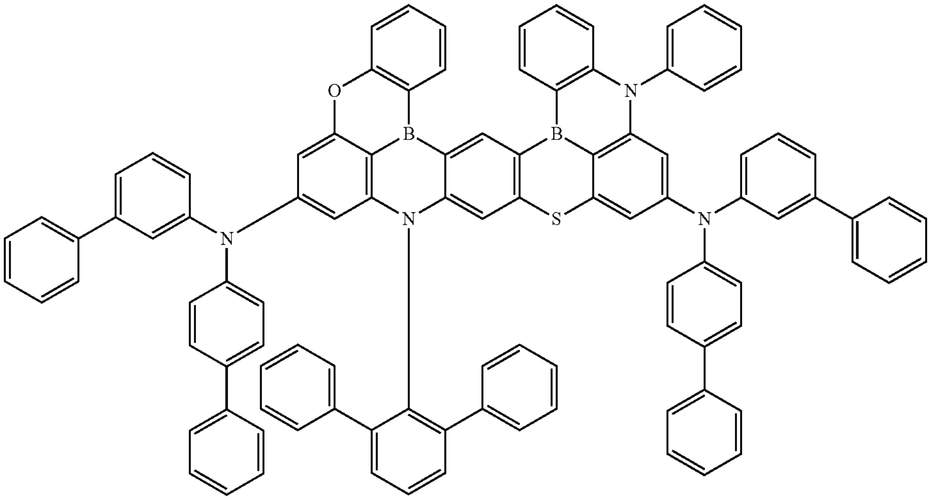

-continued
280
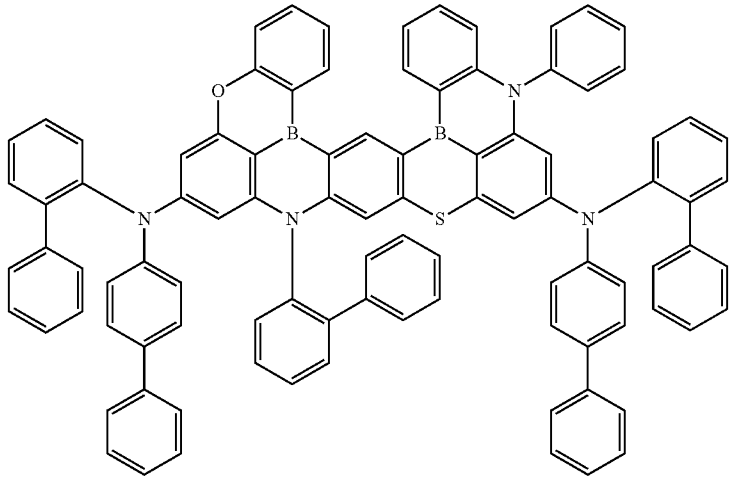
281
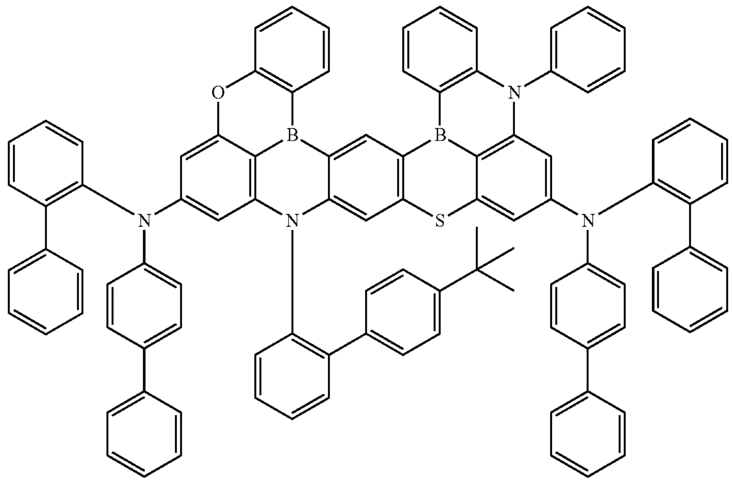
282
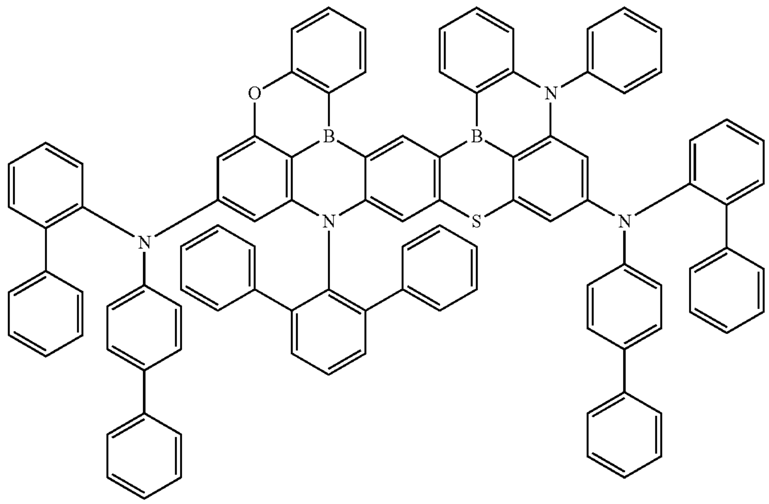

-continued
283
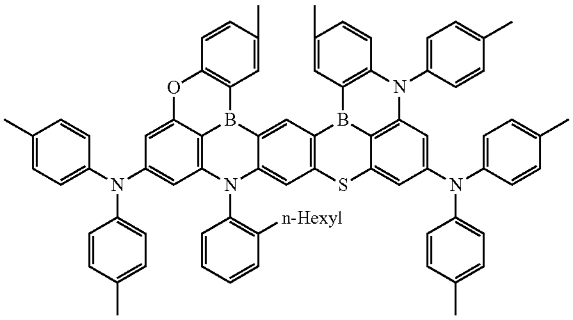
284
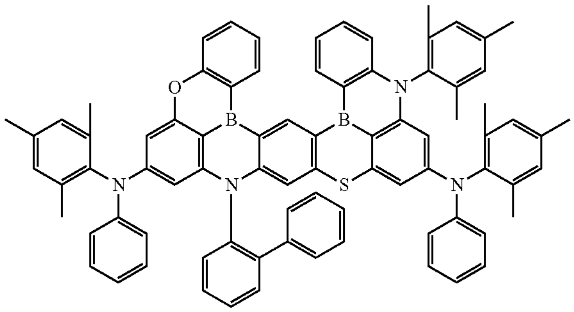
285
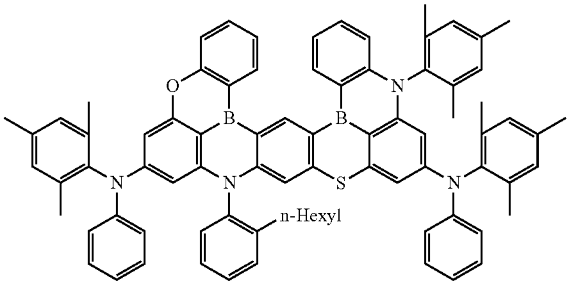
286
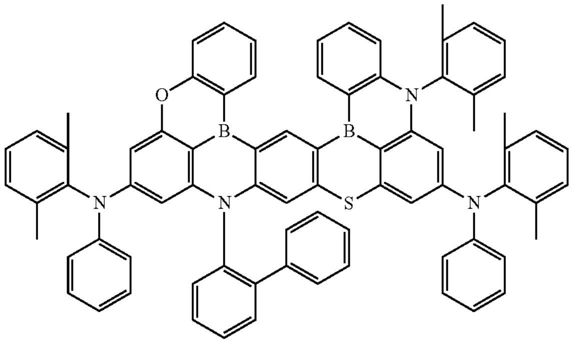
287
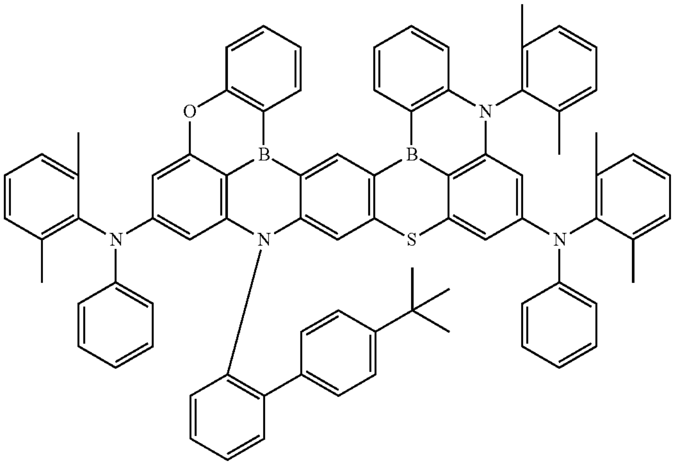

288
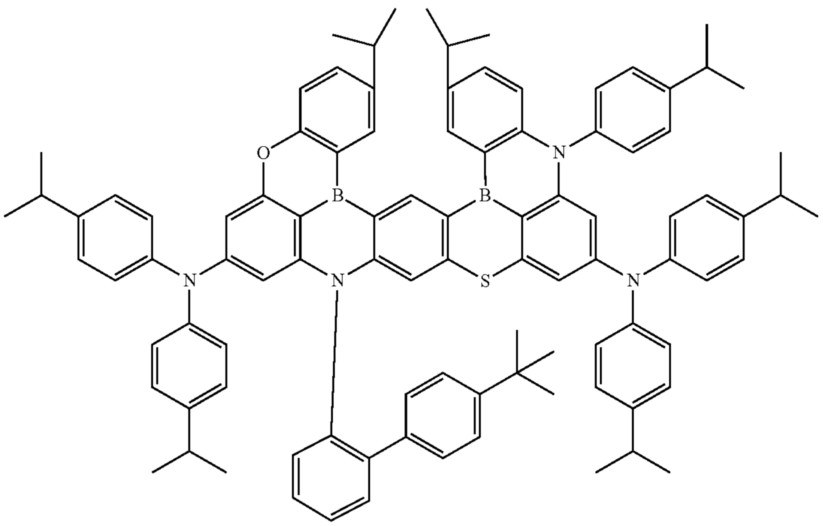
289
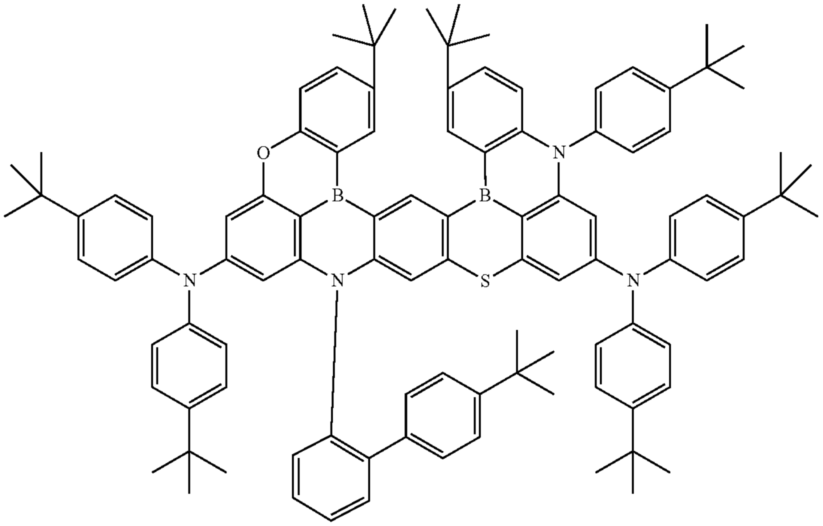
290
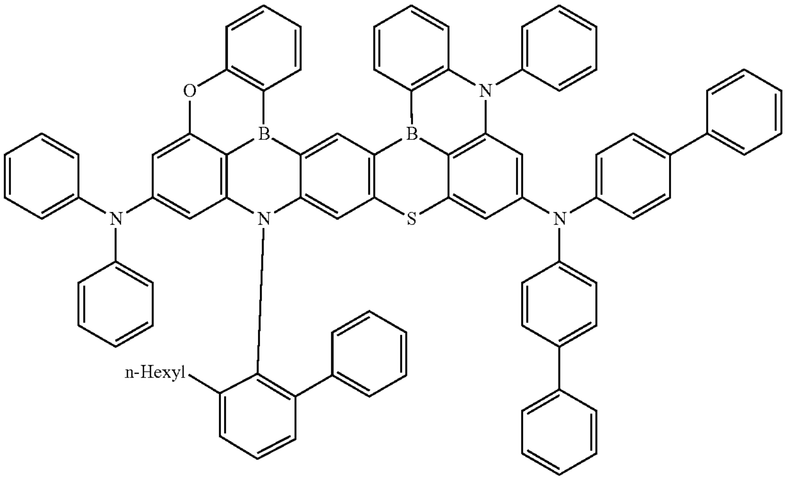

-continued
291
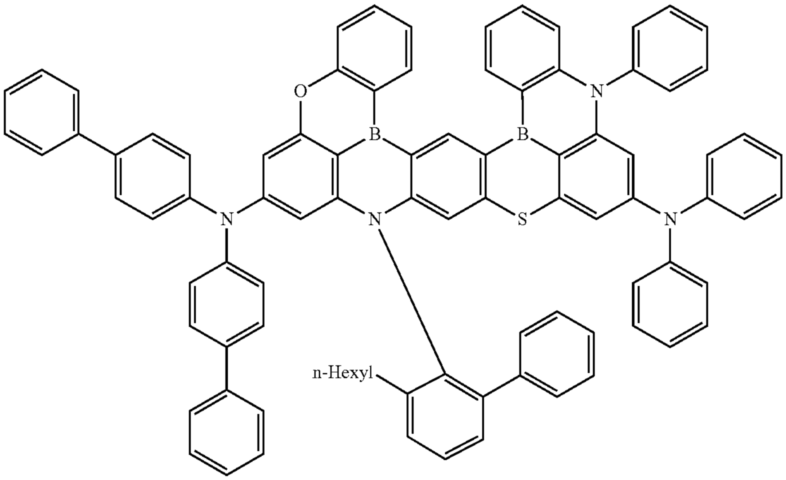
292
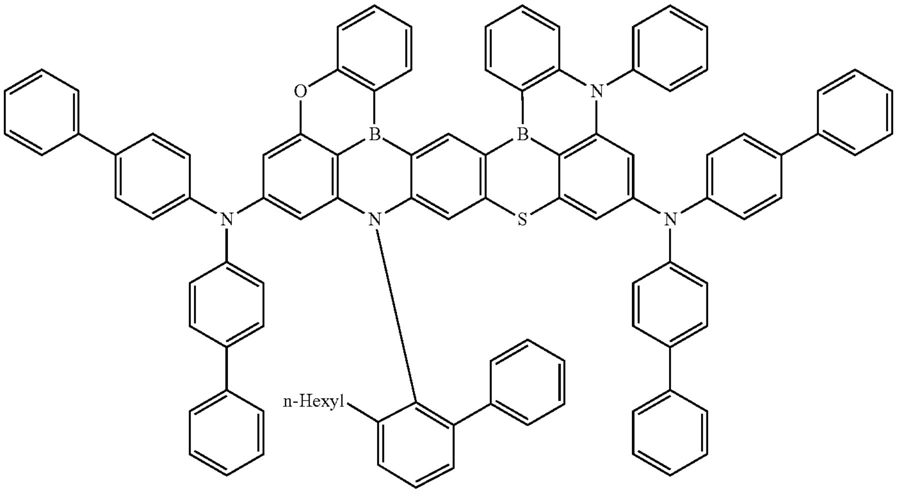
293
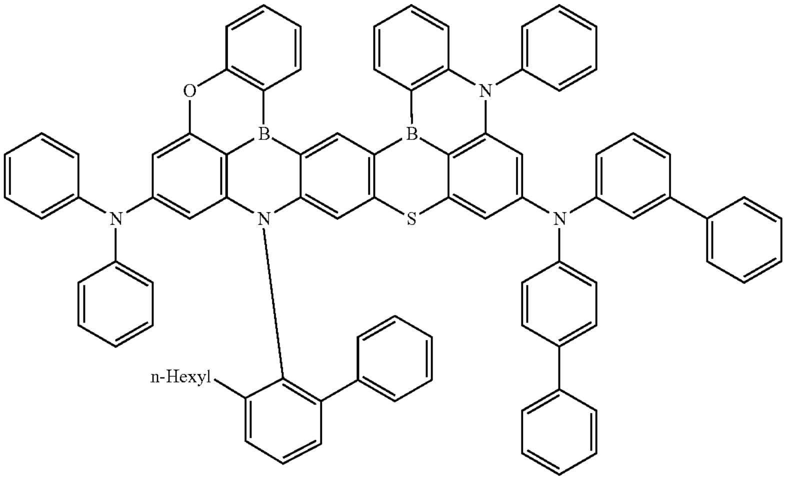

-continued
294
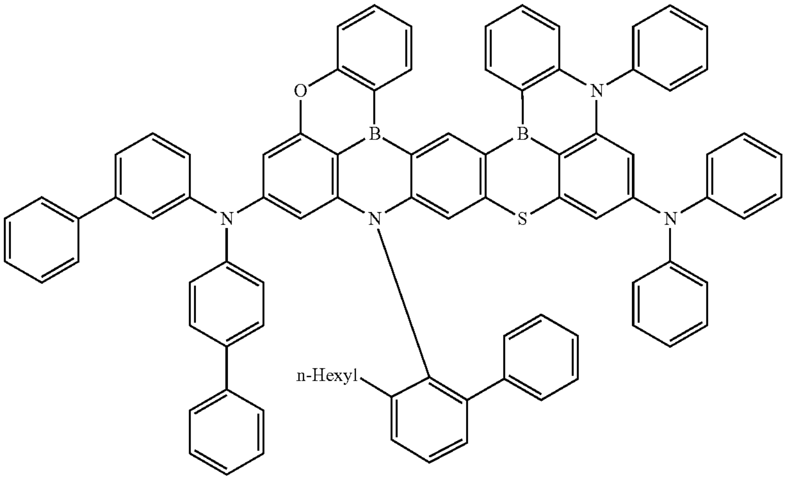
295
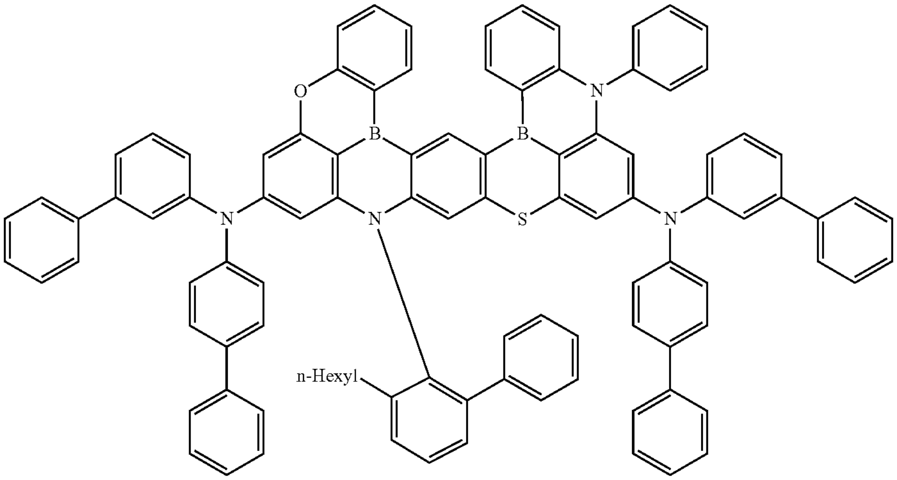
296
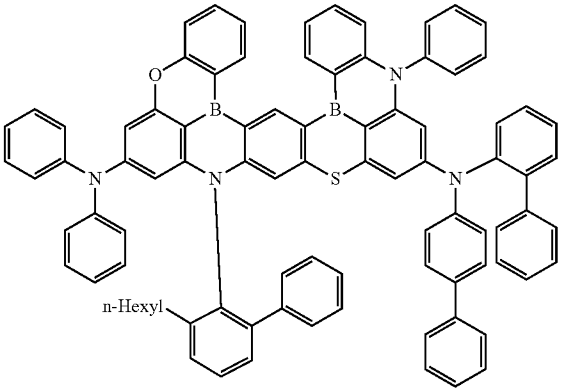
297
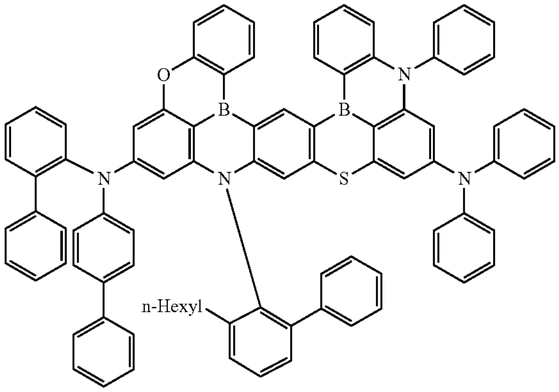

-continued
298
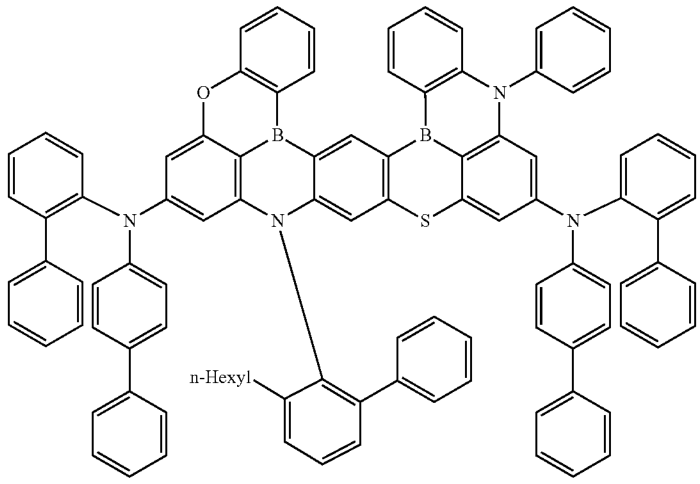
299
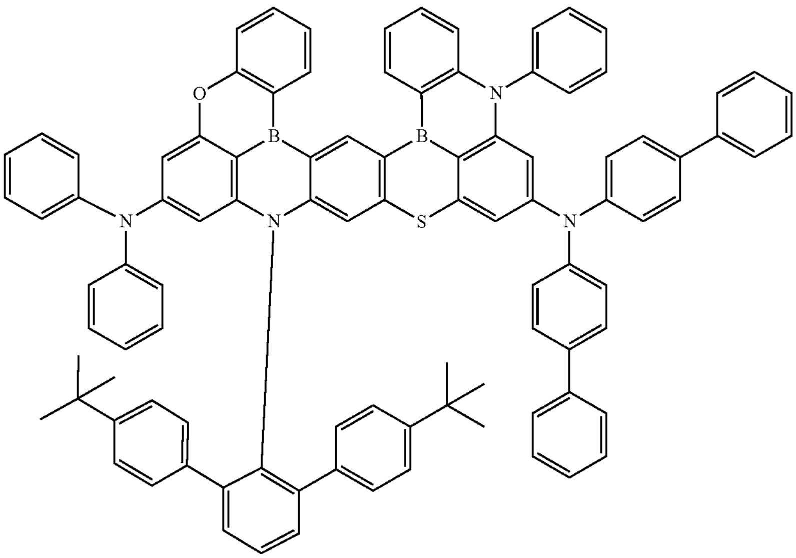
300
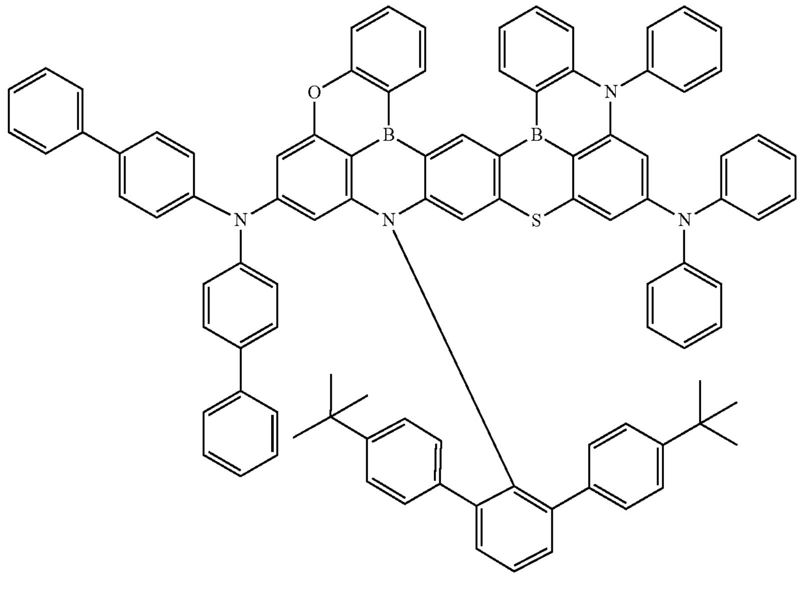

-continued
301
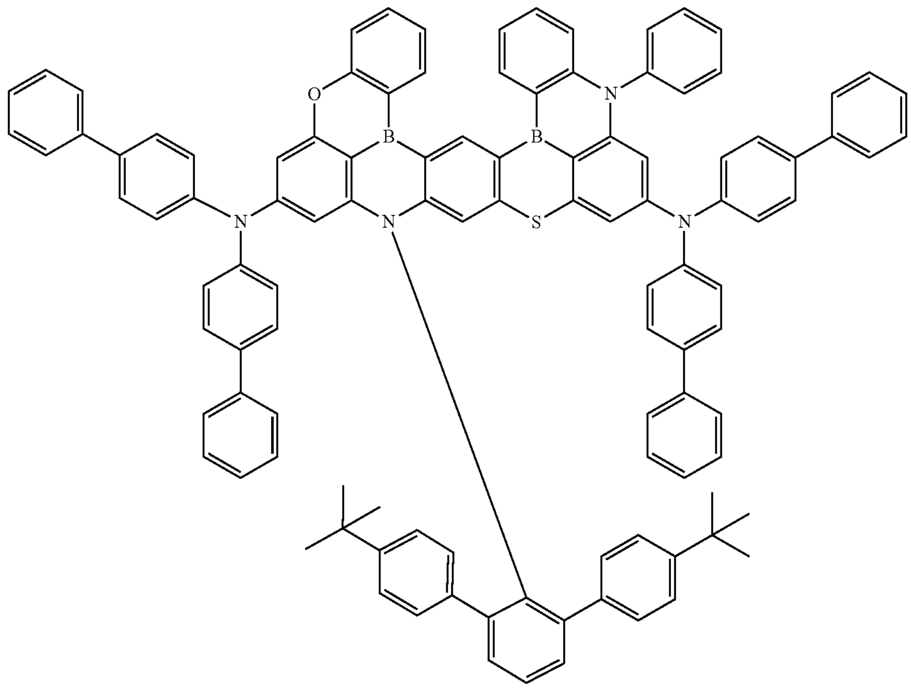
302
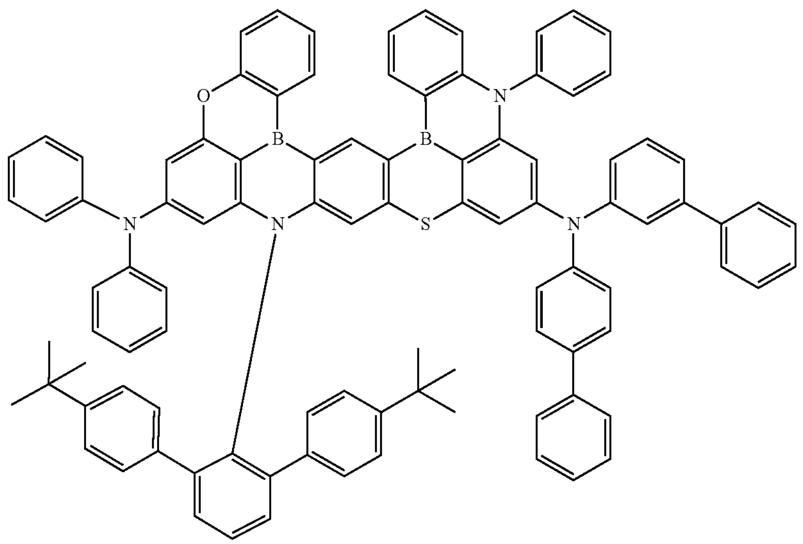

-continued
303
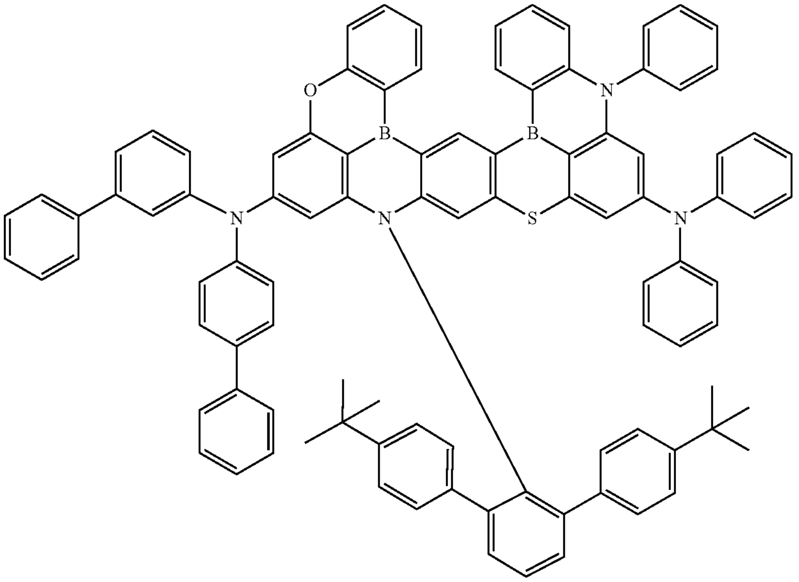
304
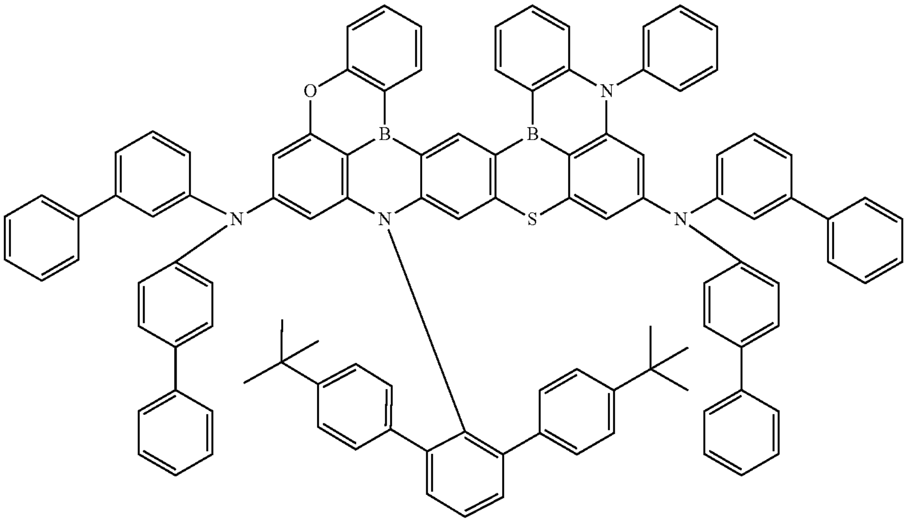
305
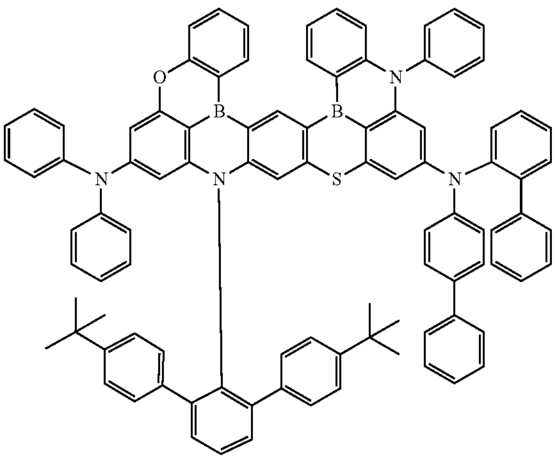
306
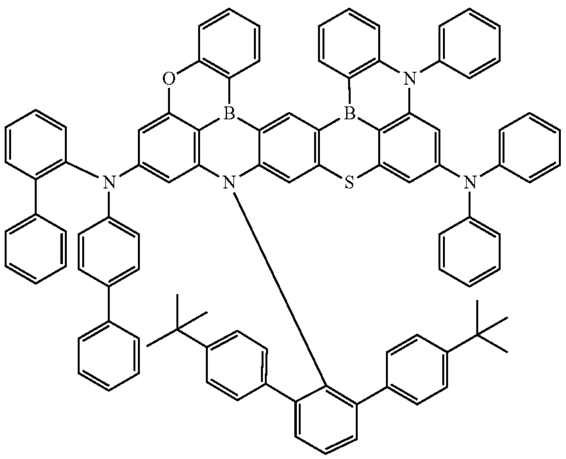

-continued
307
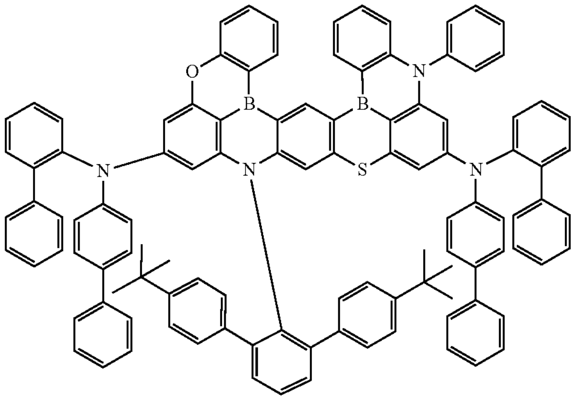
308
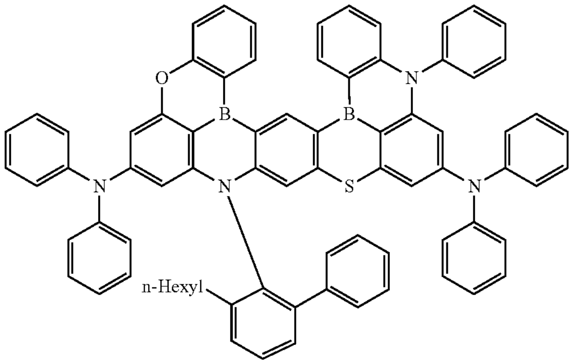
309
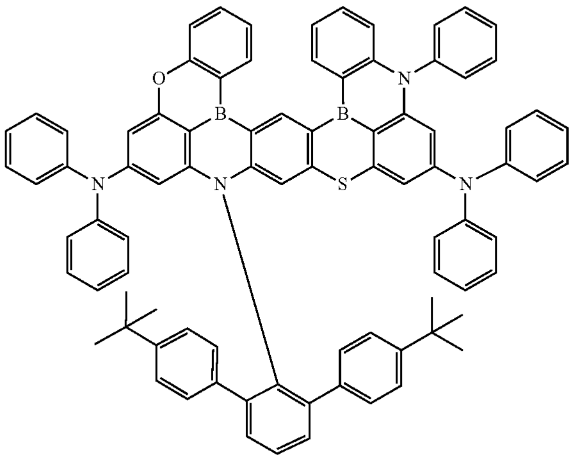
310
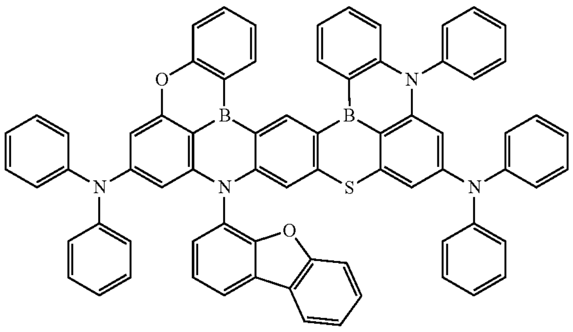
311
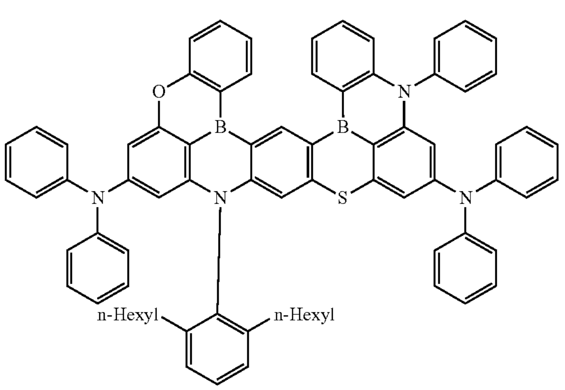
312
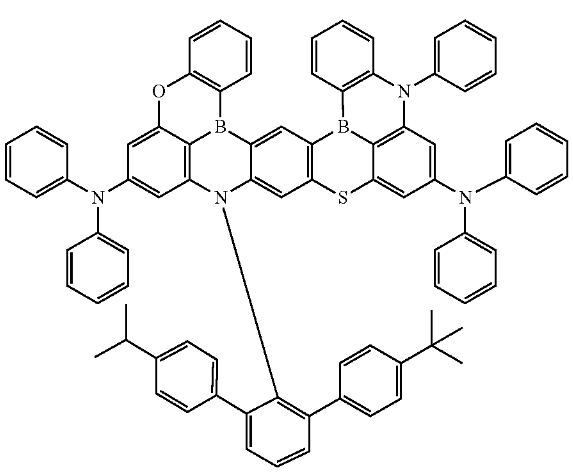

-continued
313
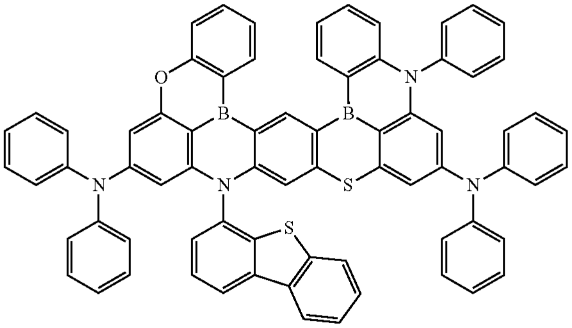
314
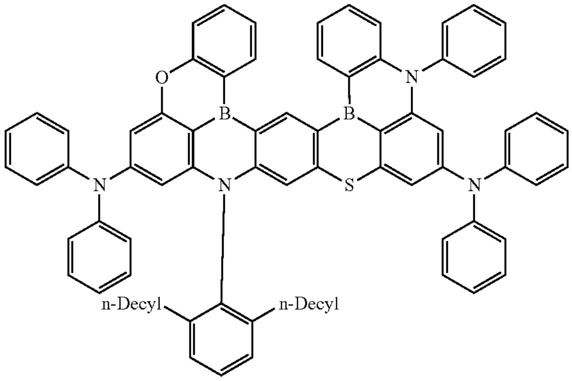
315
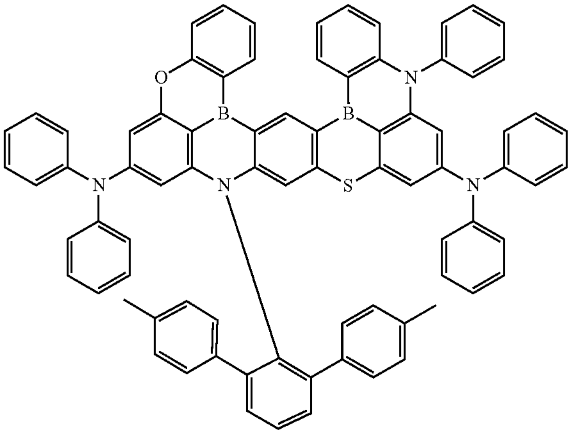
316
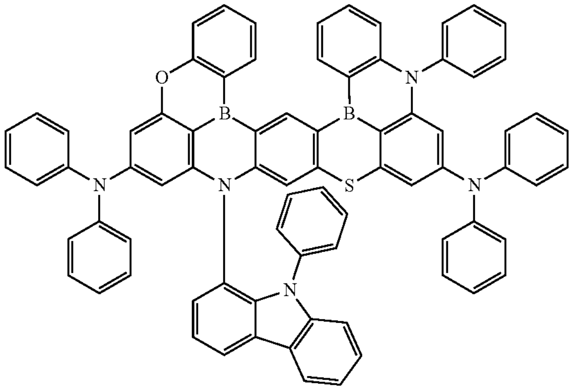
317
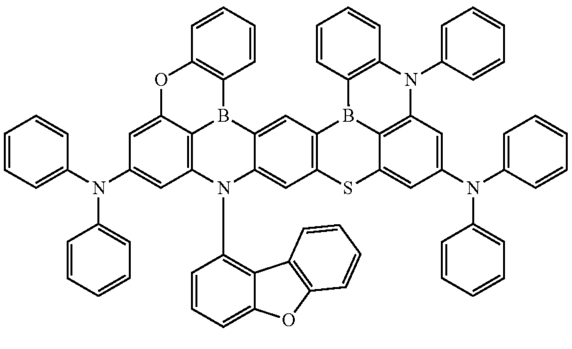
318
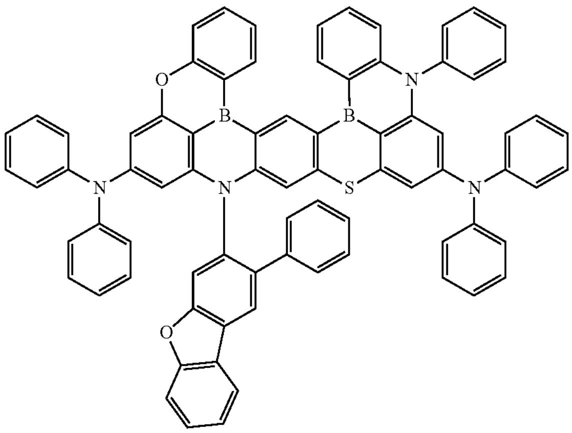

-continued
319
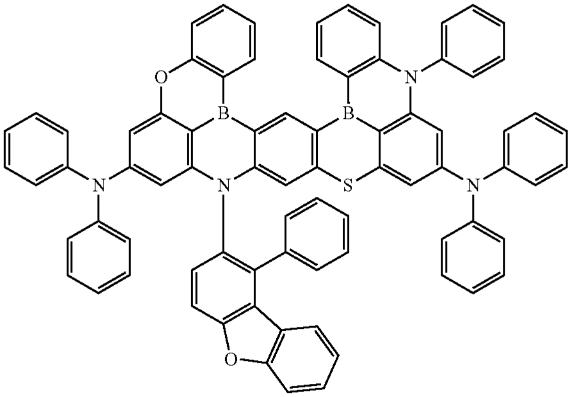
320
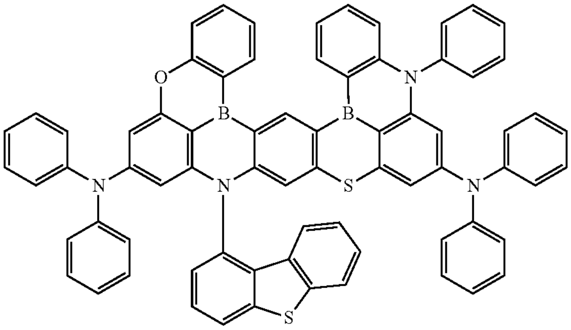
321
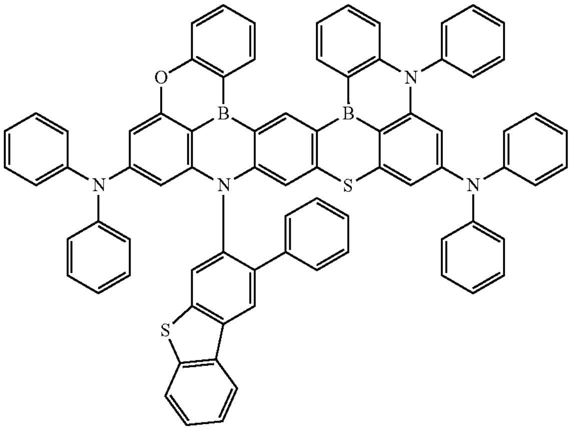
322
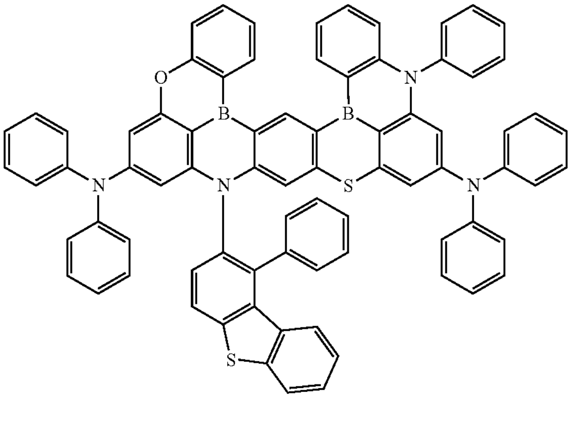
323
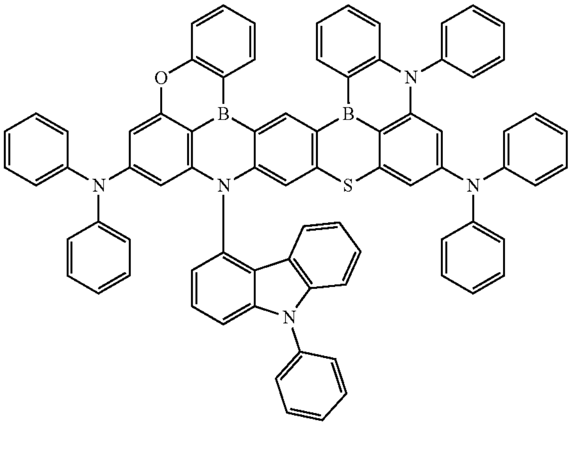
324
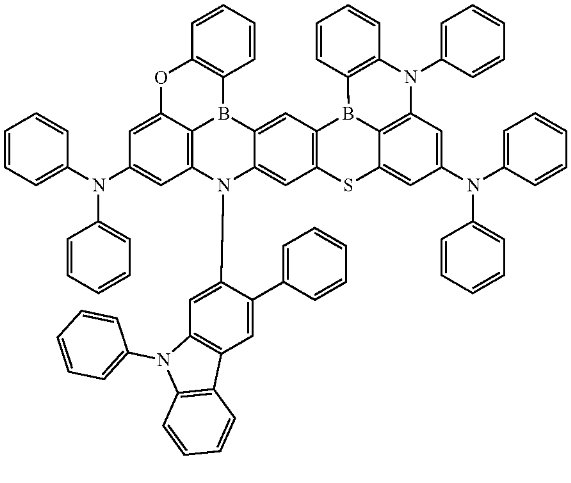

-continued
325
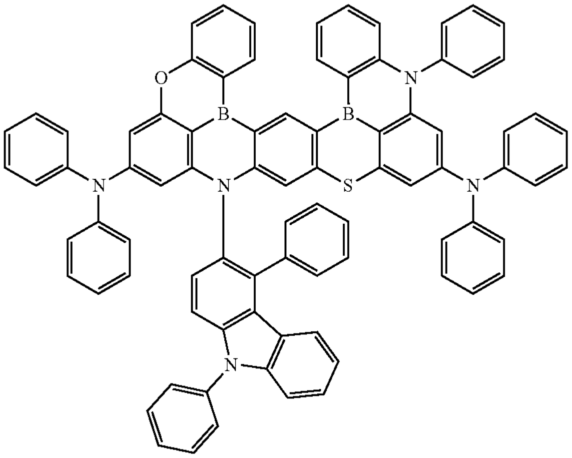
326
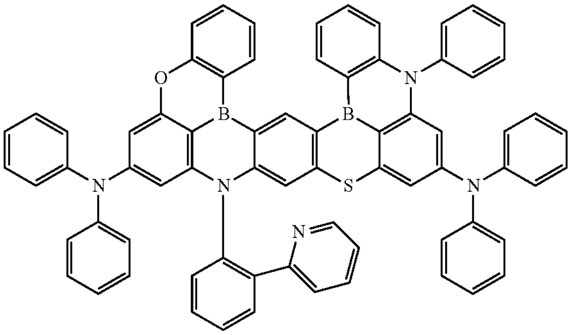
327
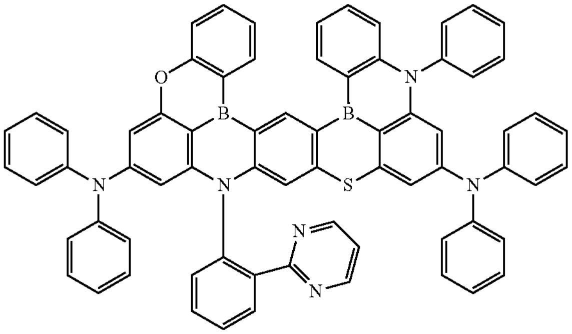
328
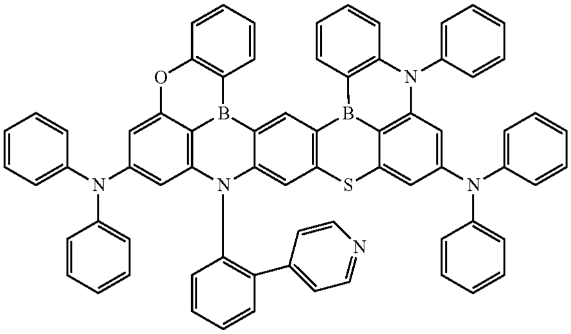
329
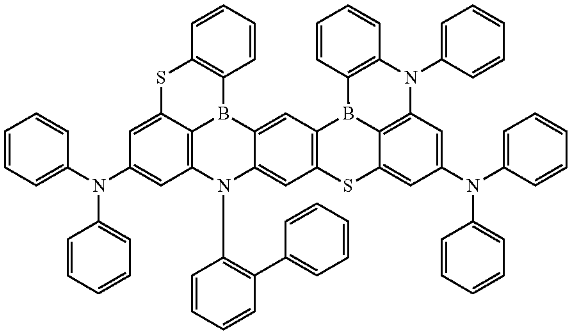
330
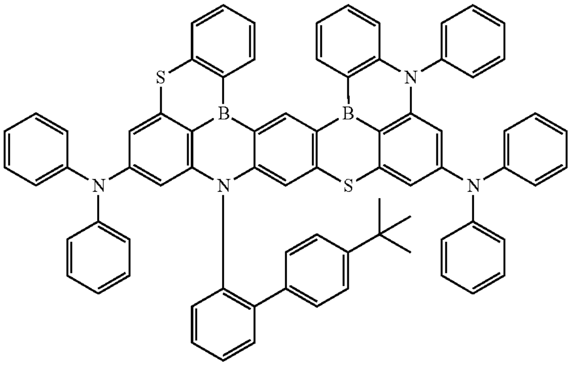

-continued
331
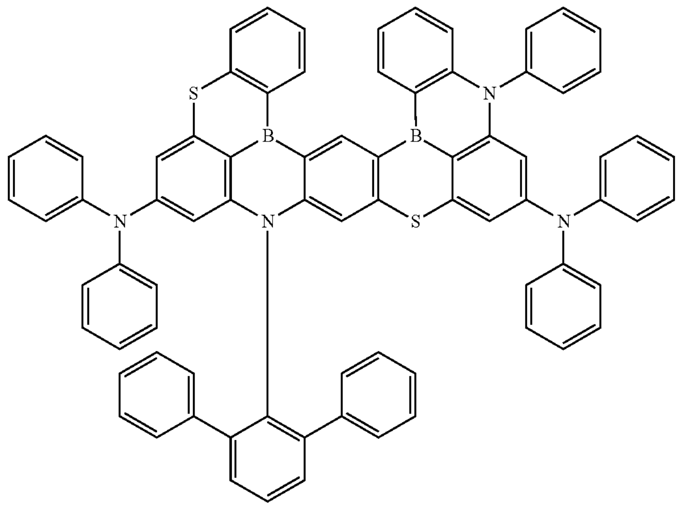
332
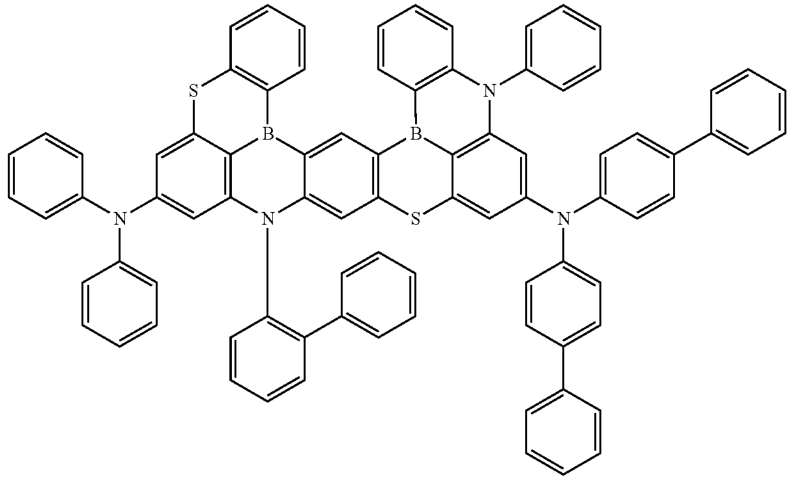
333
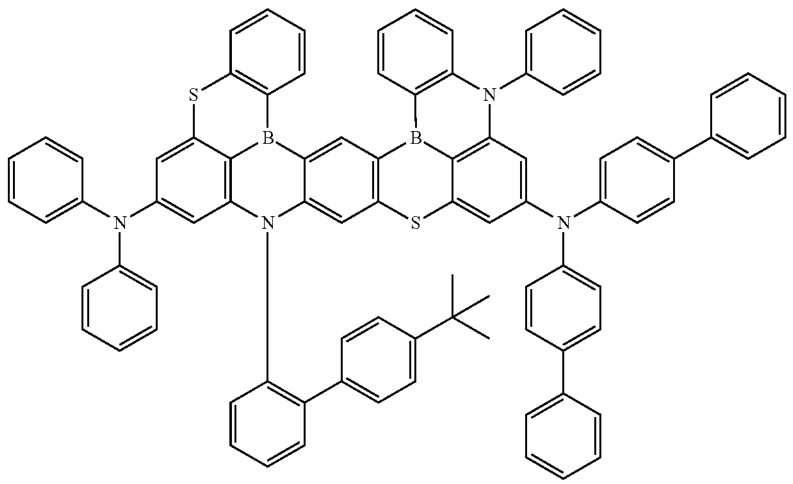

-continued
334
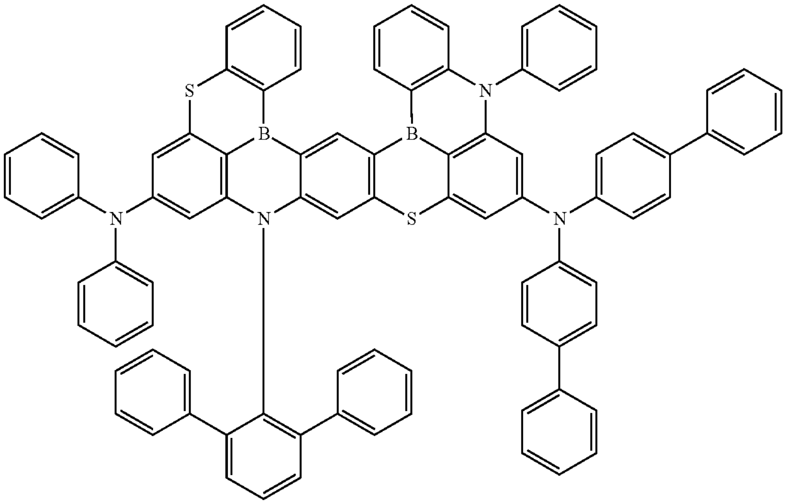
335
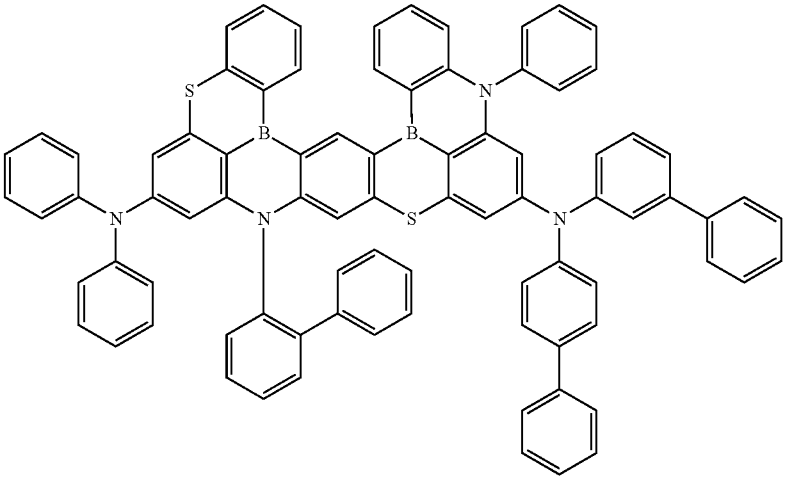
336
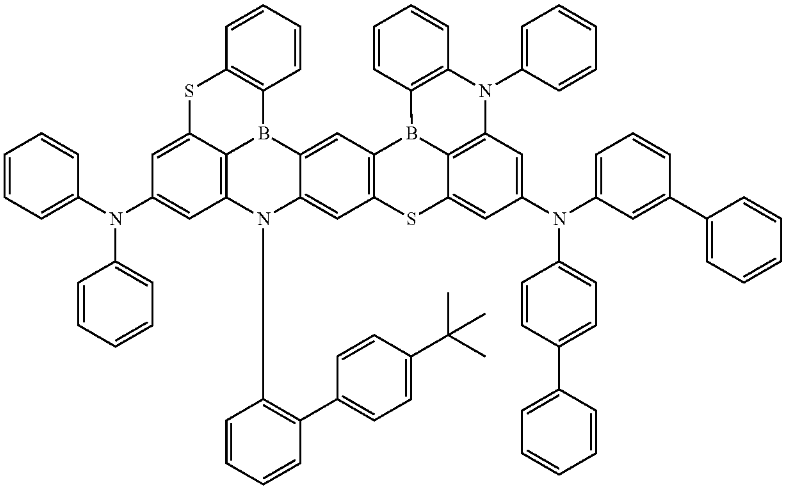

-continued
337
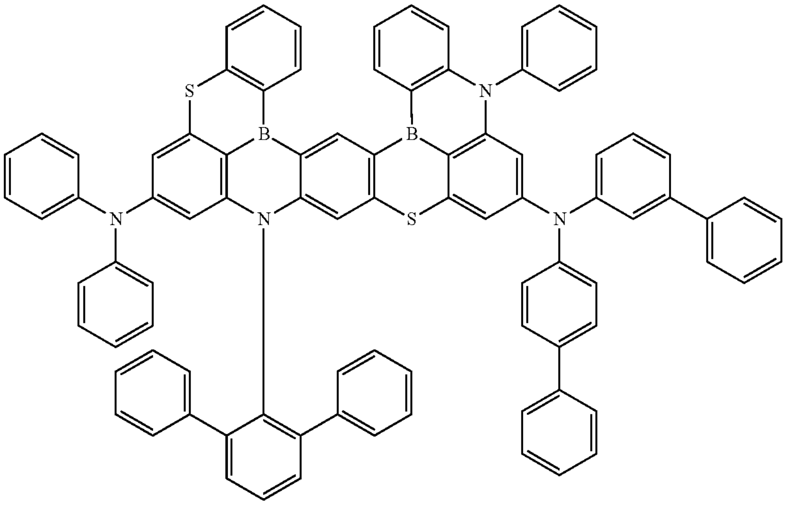
338
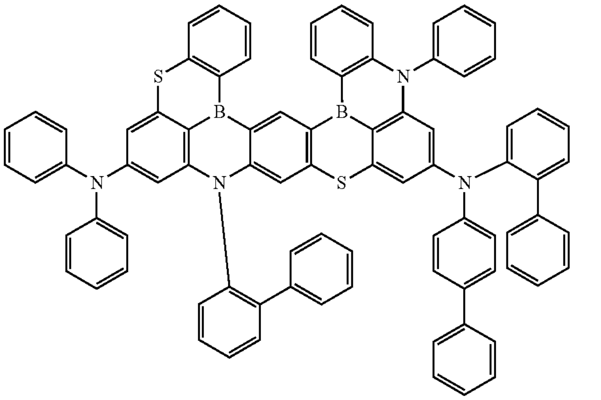
339
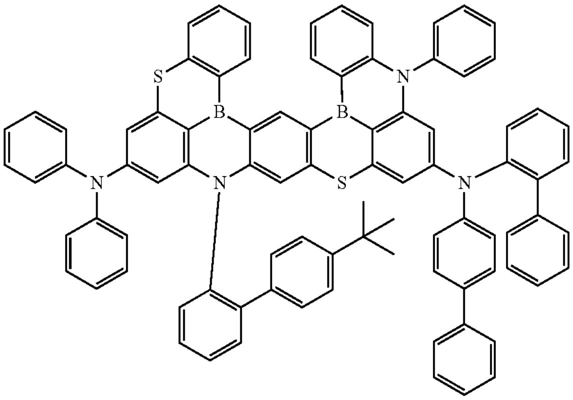
340
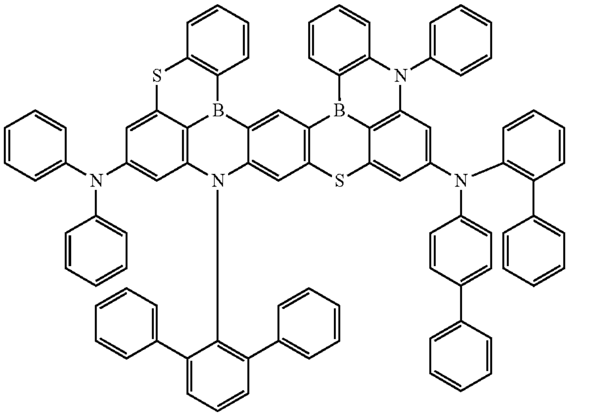
341
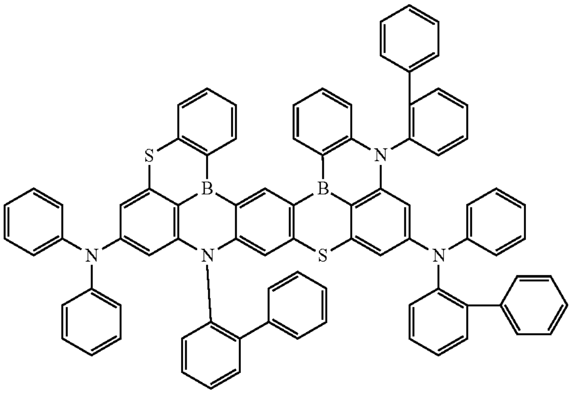

-continued
342
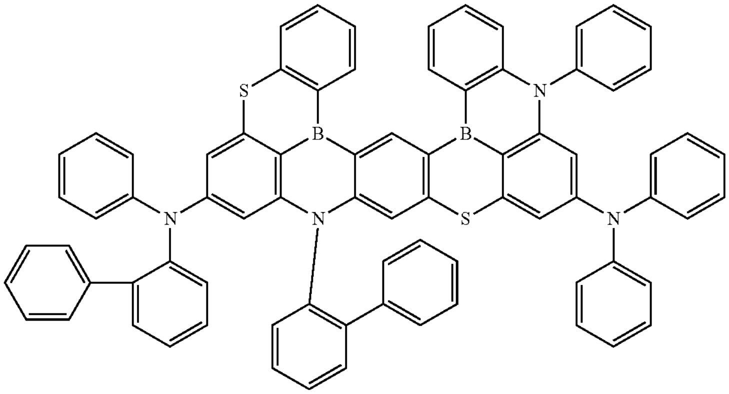
343
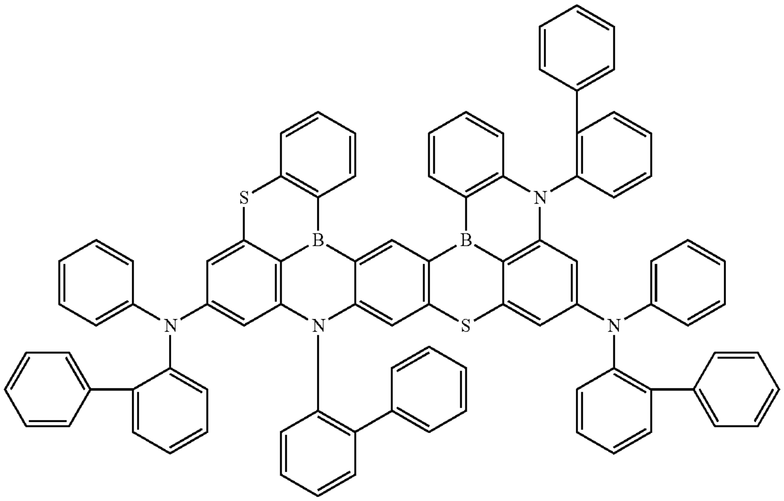
344
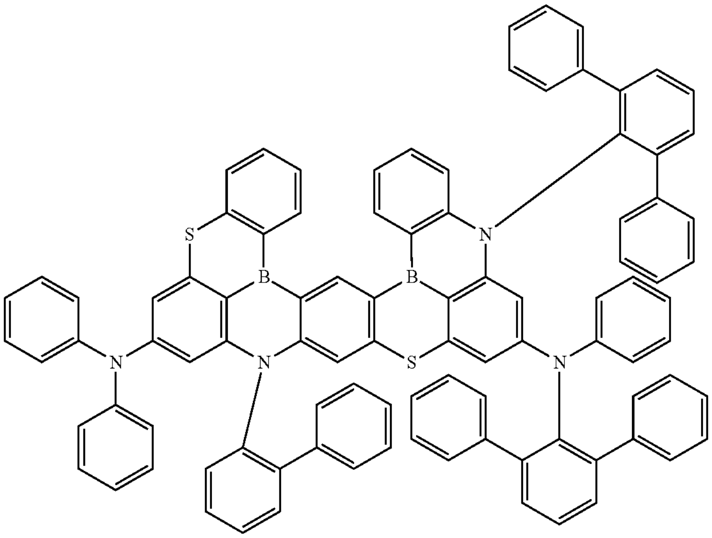

-continued
345
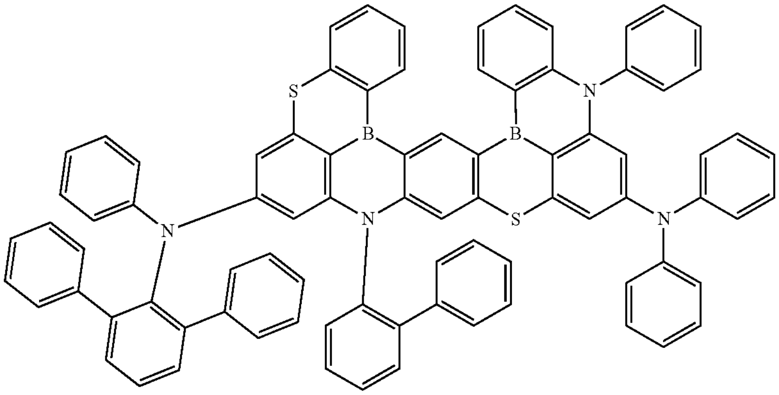
346
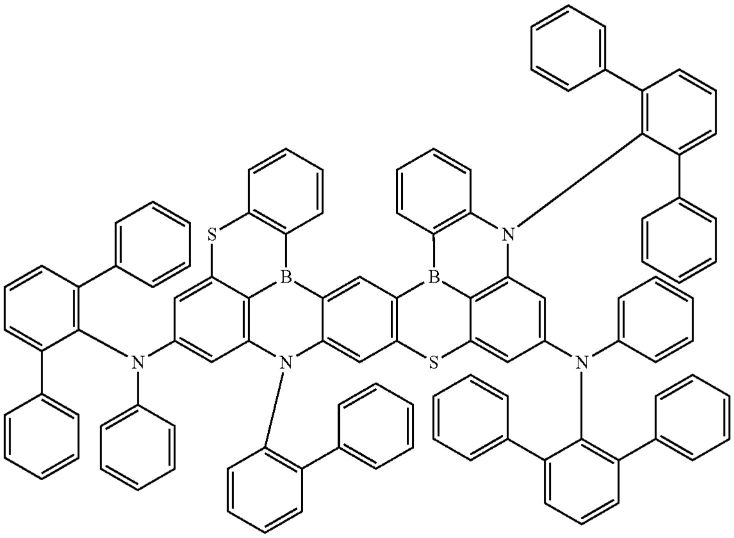
347
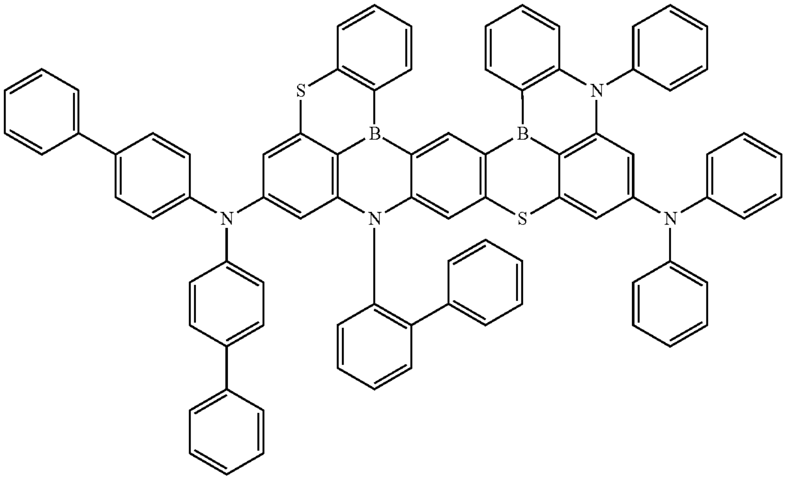

-continued
348
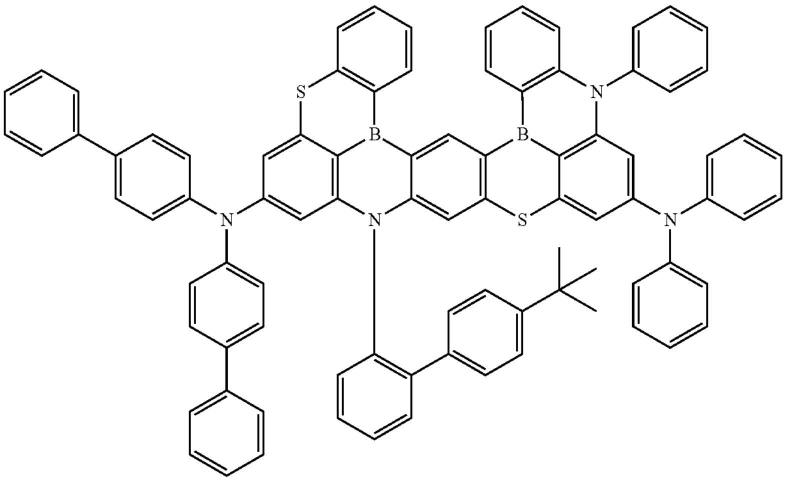
349
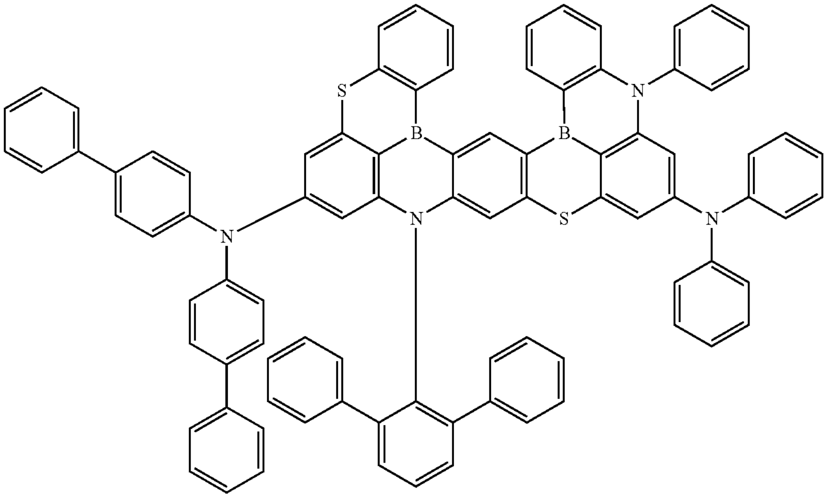
350
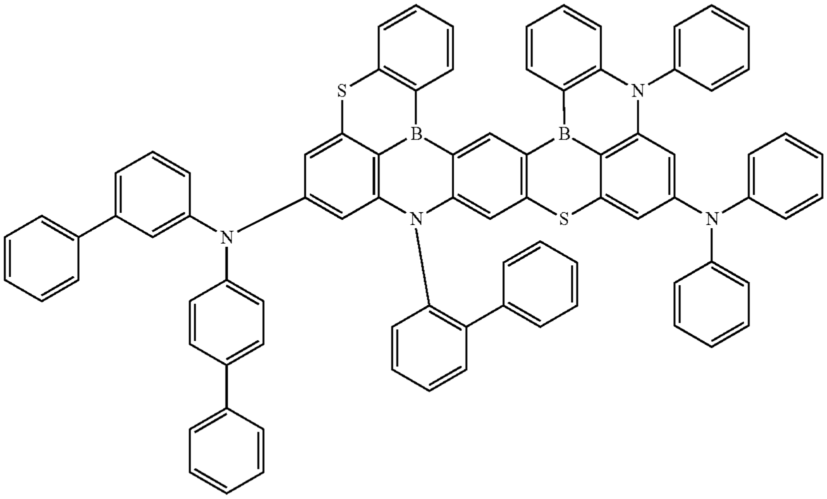

-continued
351
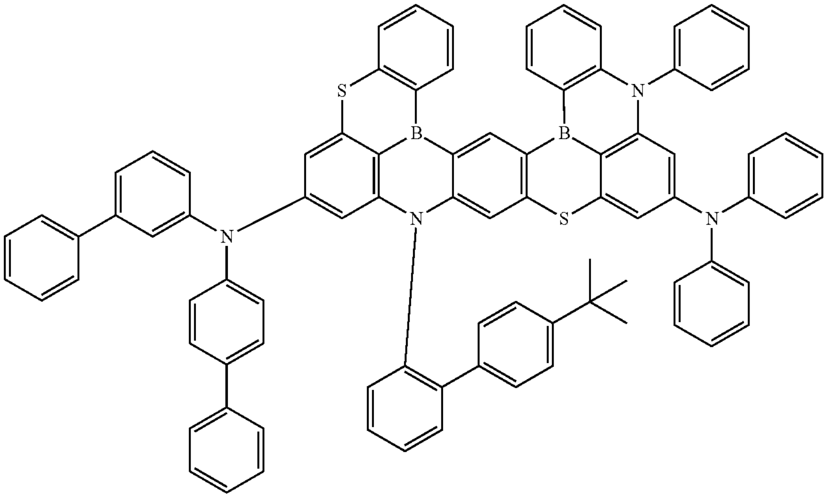
352
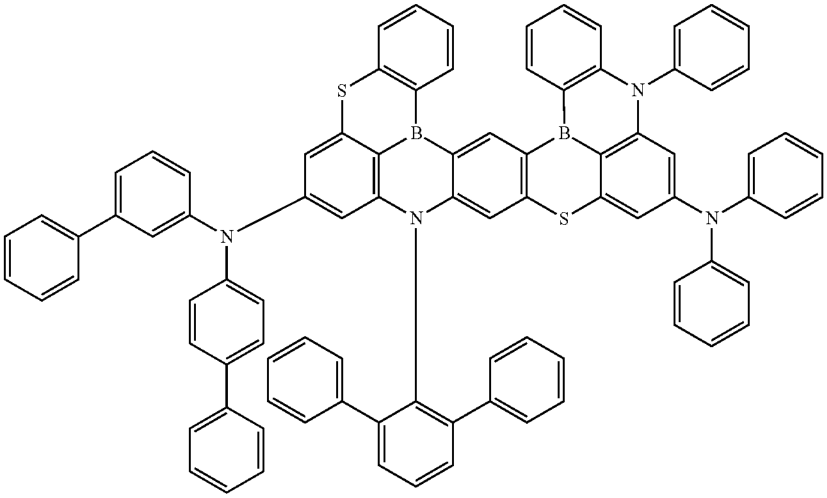
353
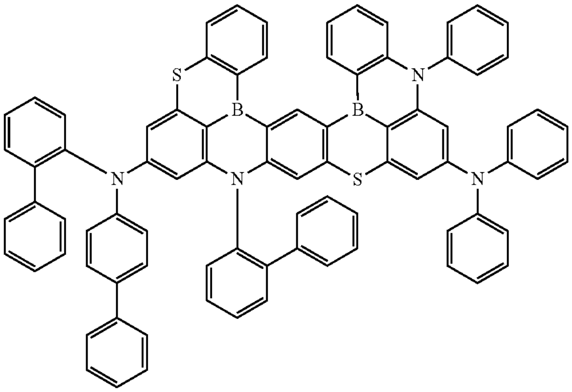
354
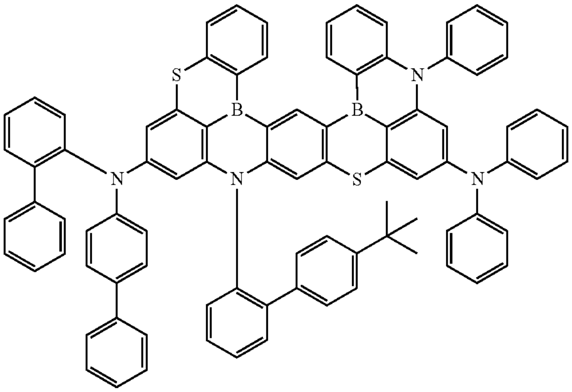

-continued
355
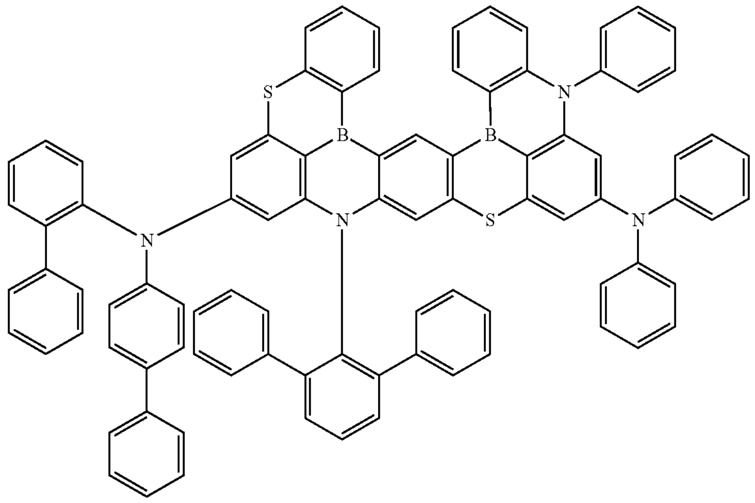
356
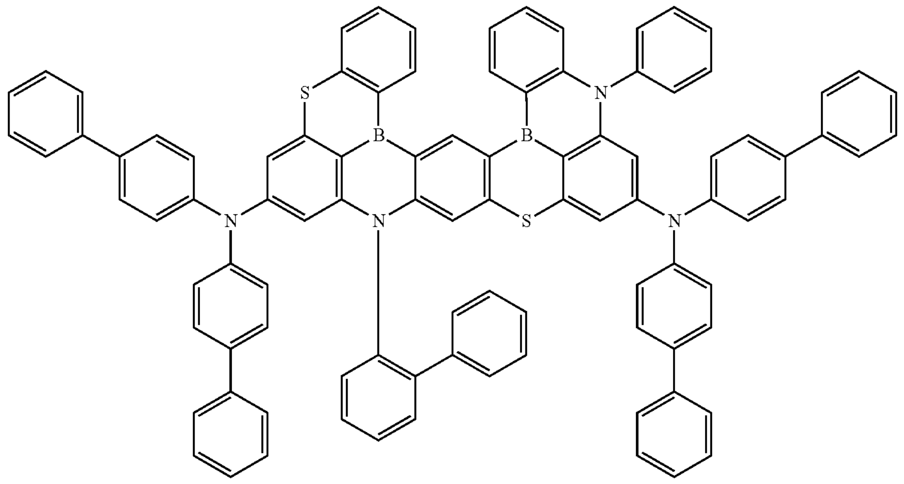
357
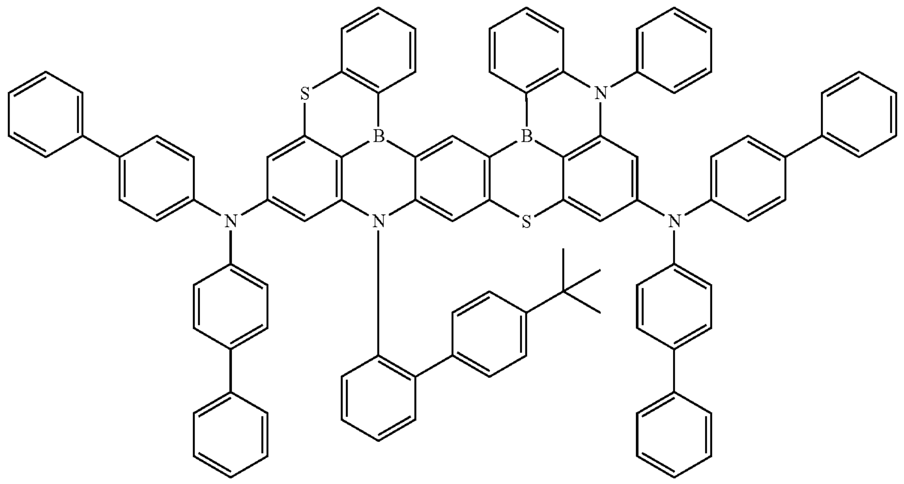

-continued
358
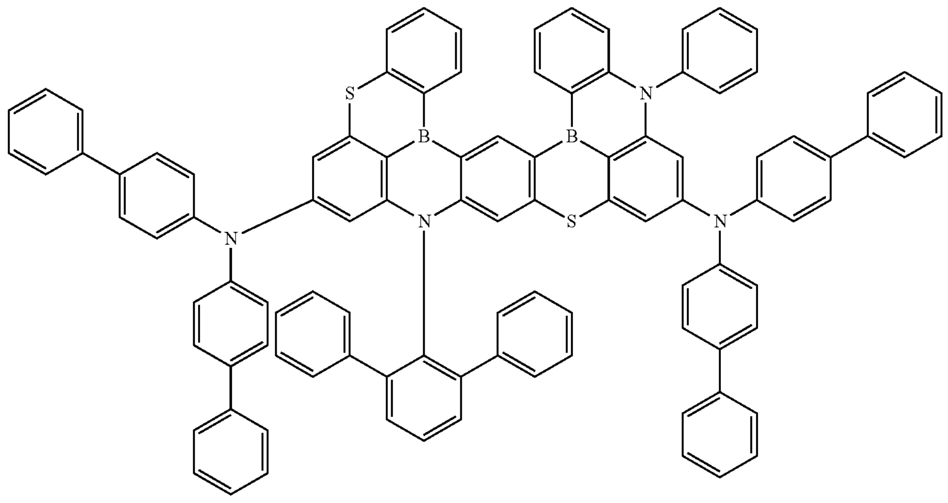
359
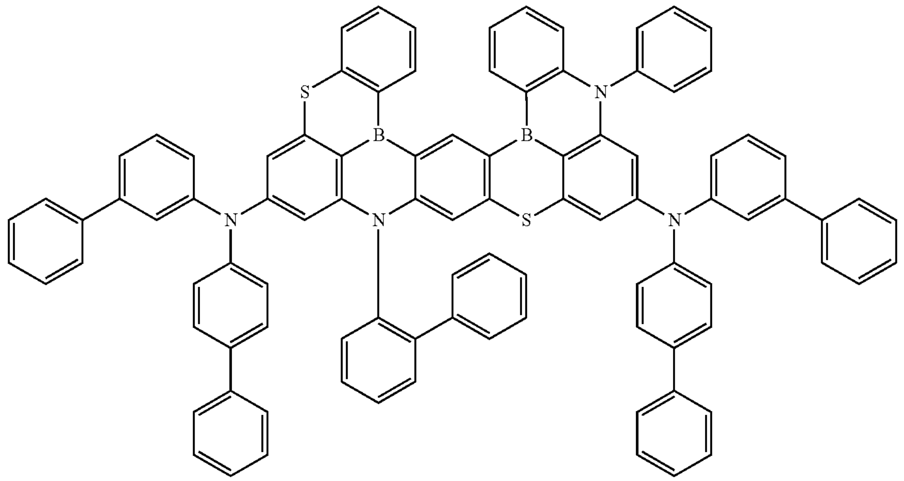
360
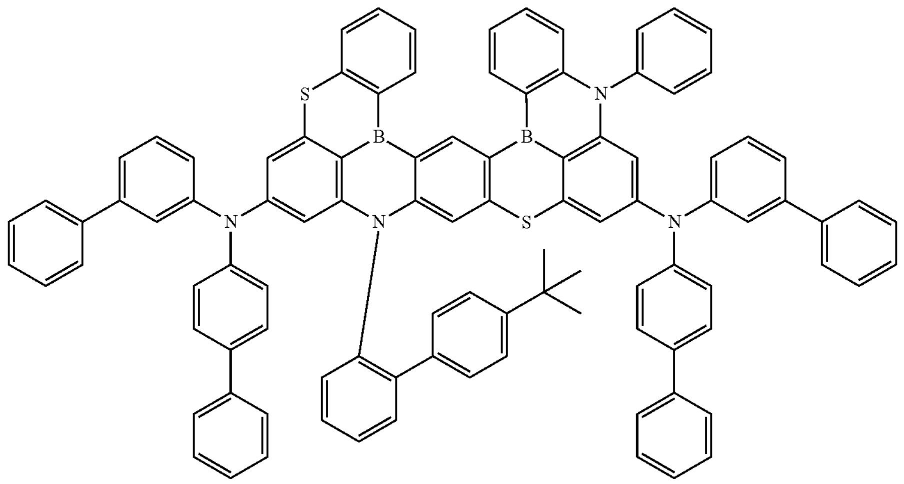

-continued
361
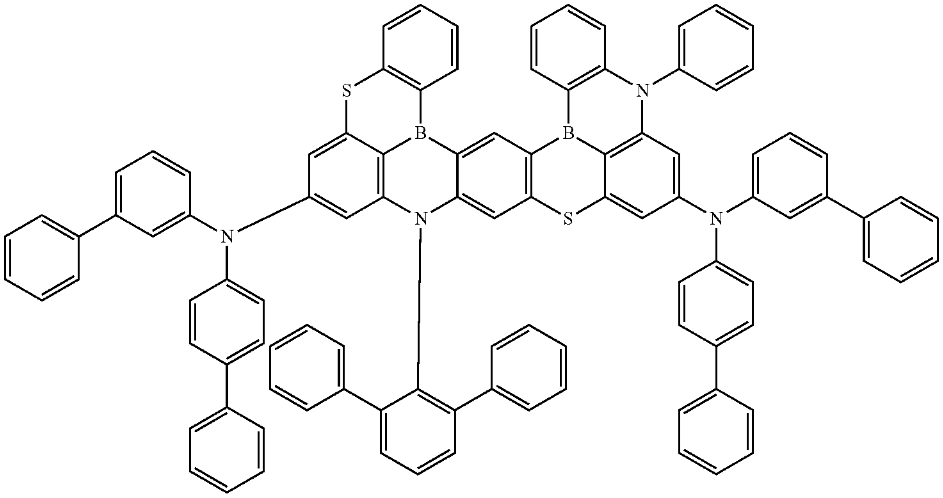
362
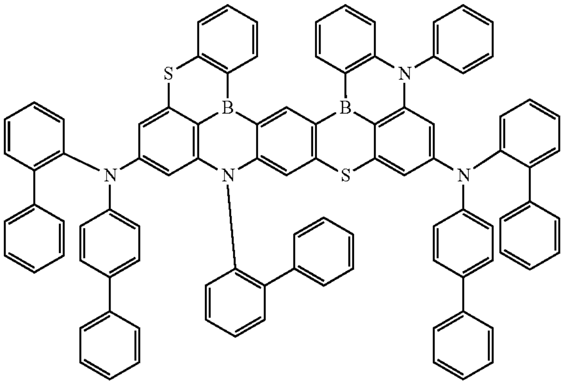
363
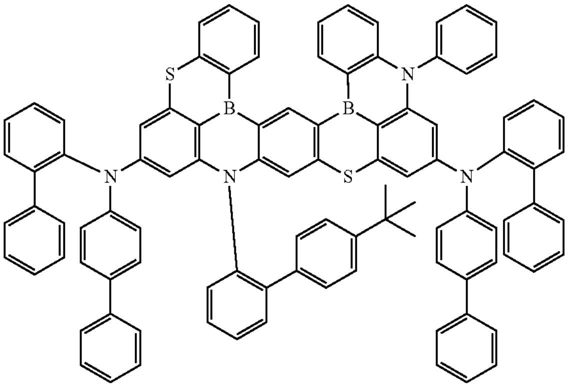
364
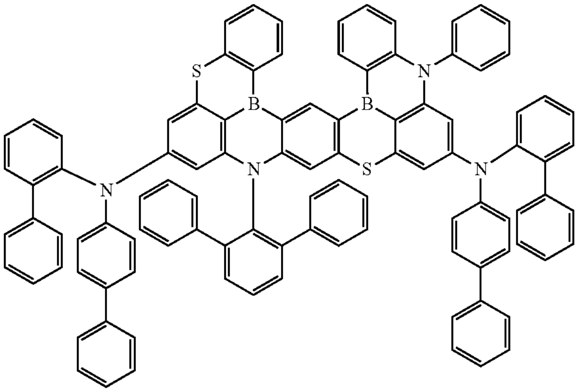
365
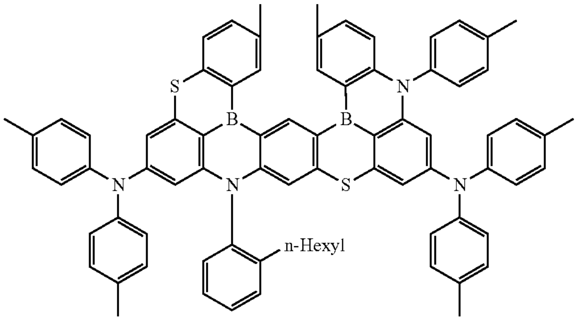

-continued
366
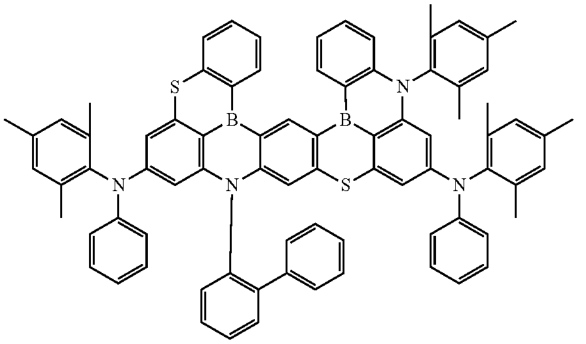
367
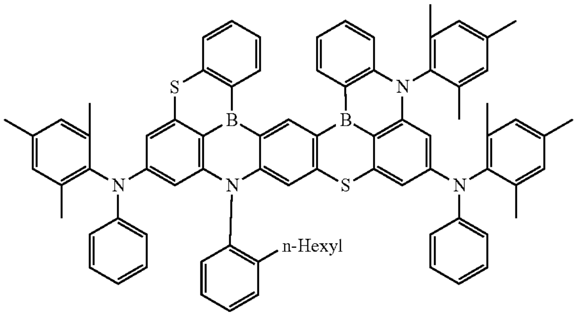
368
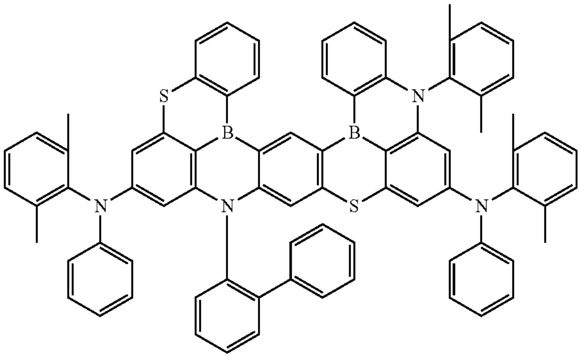
369
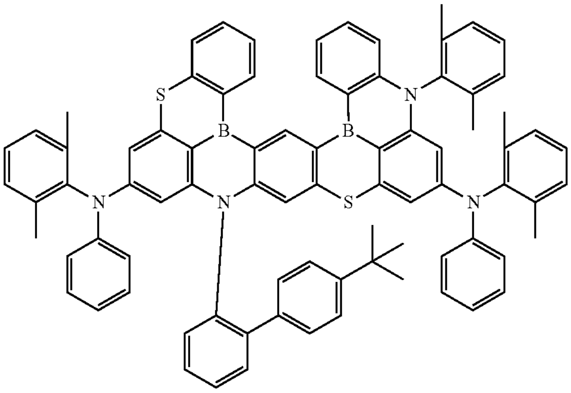
370
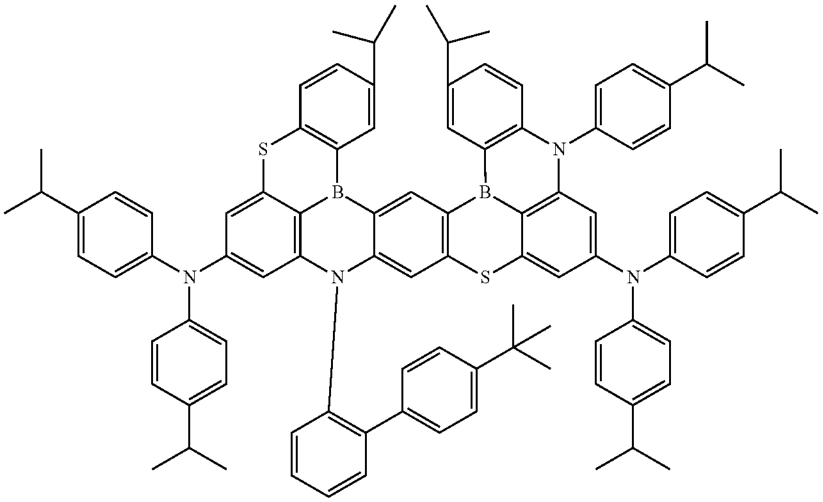

-continued
371
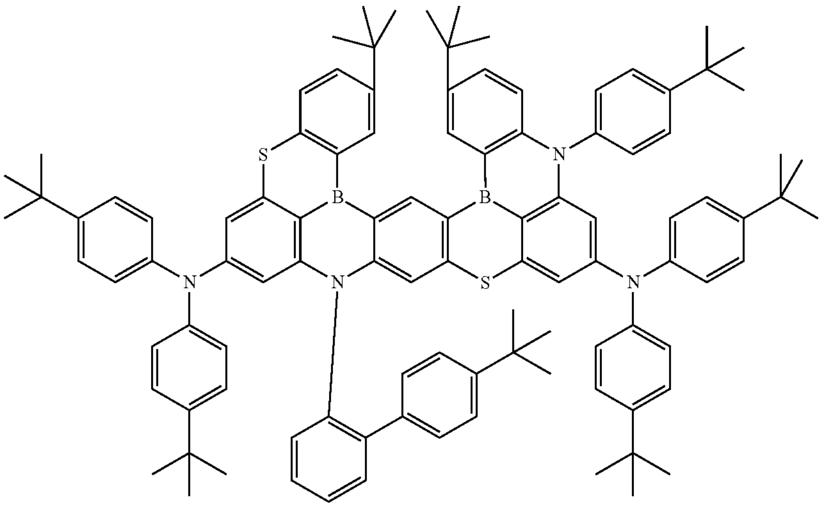
372
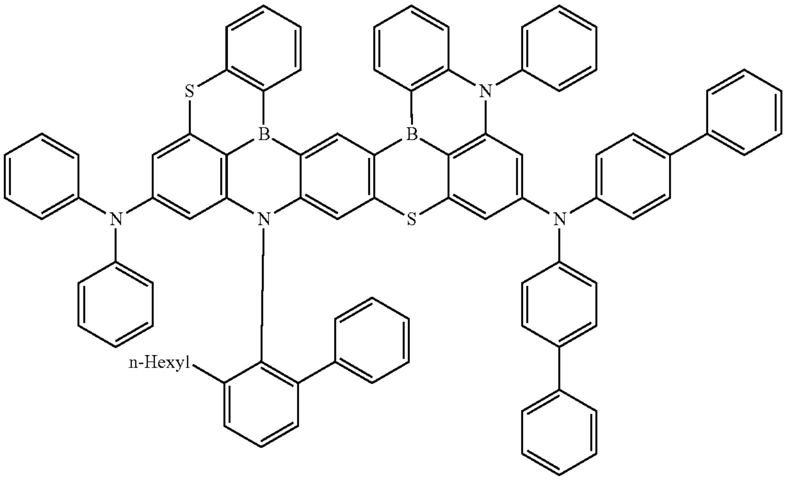
373
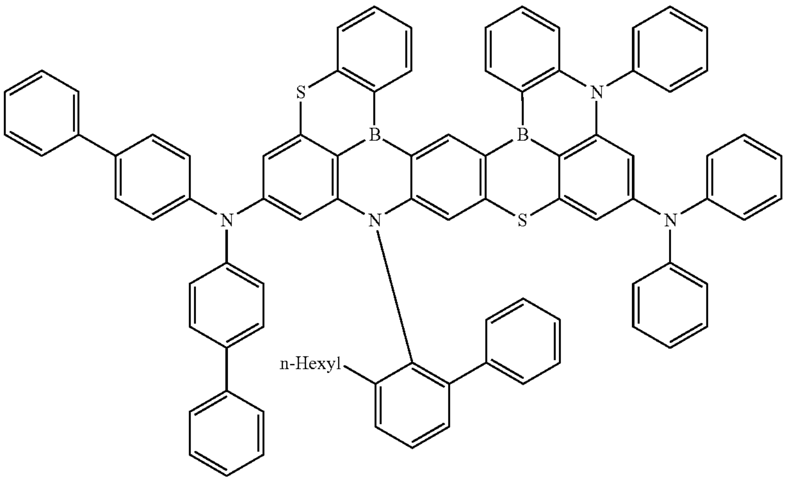

-continued
374
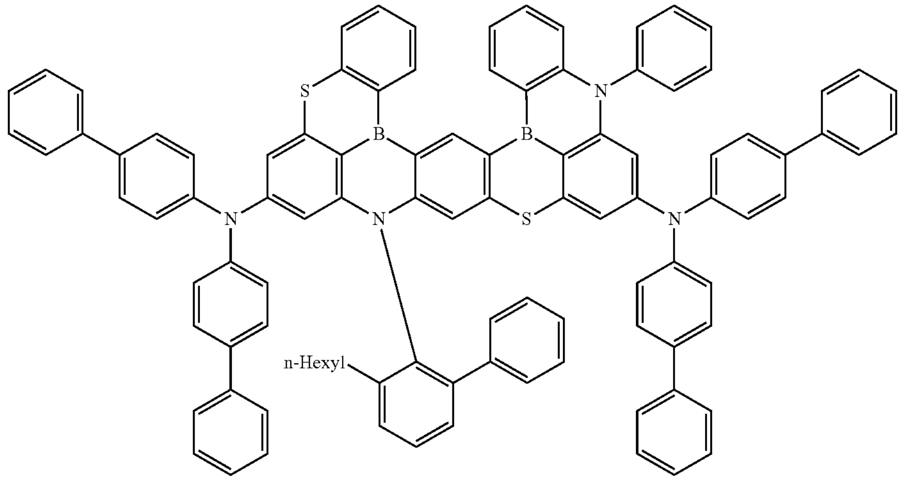
375
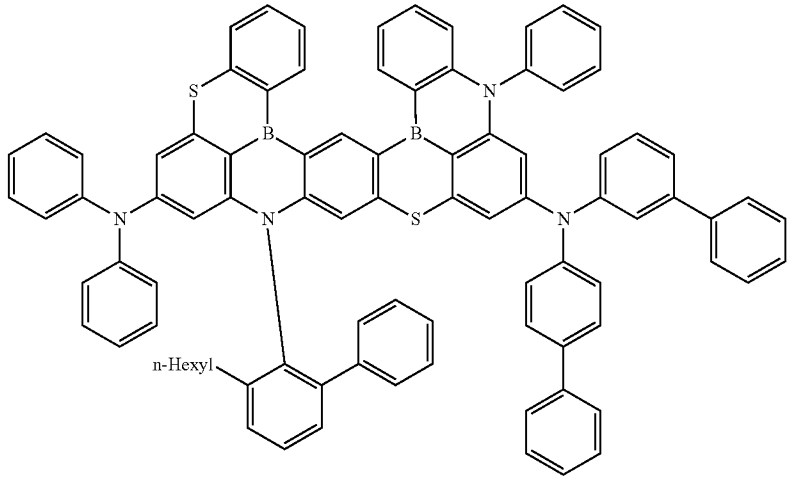
376
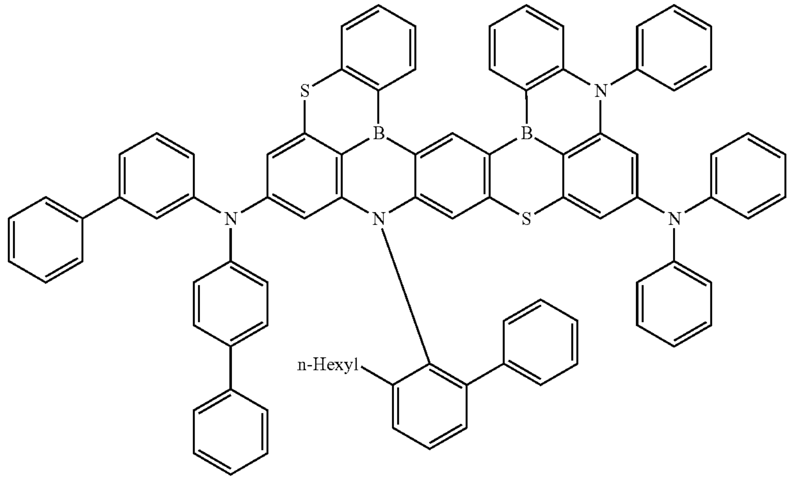

-continued
377
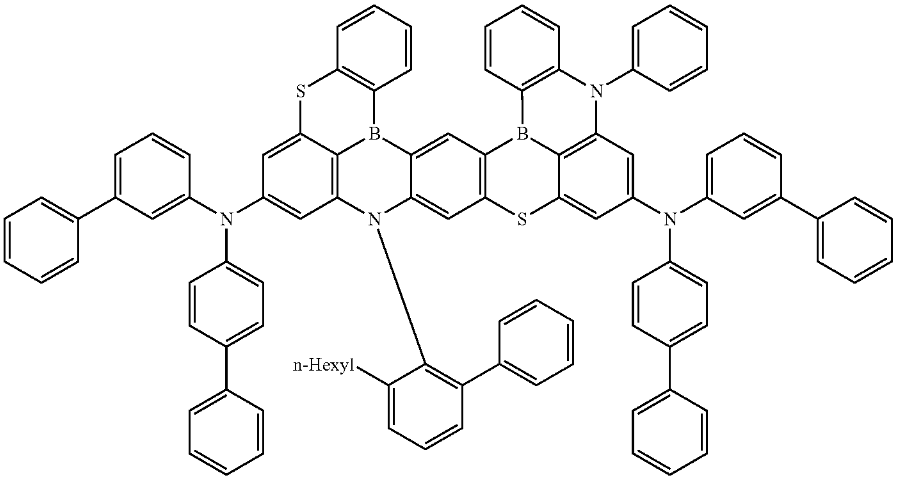
378
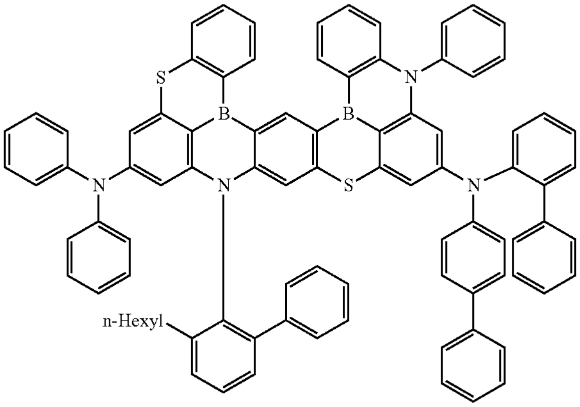
379
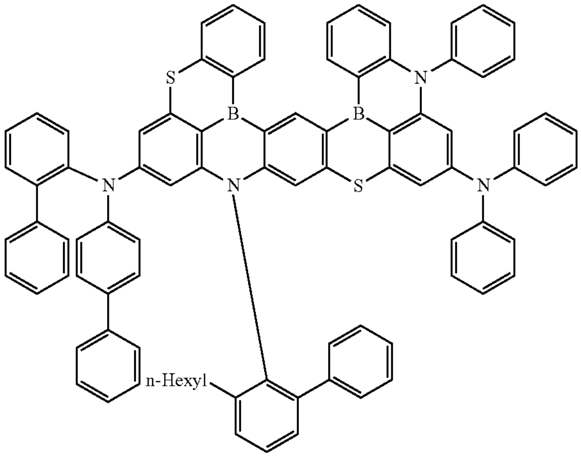
380
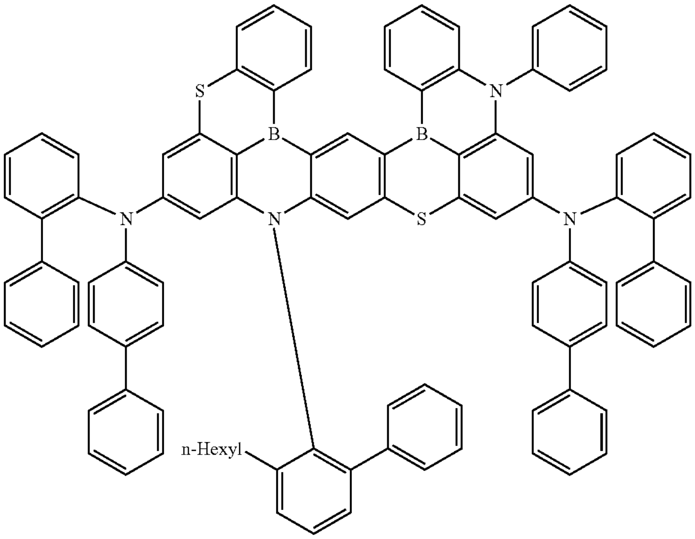

-continued
381
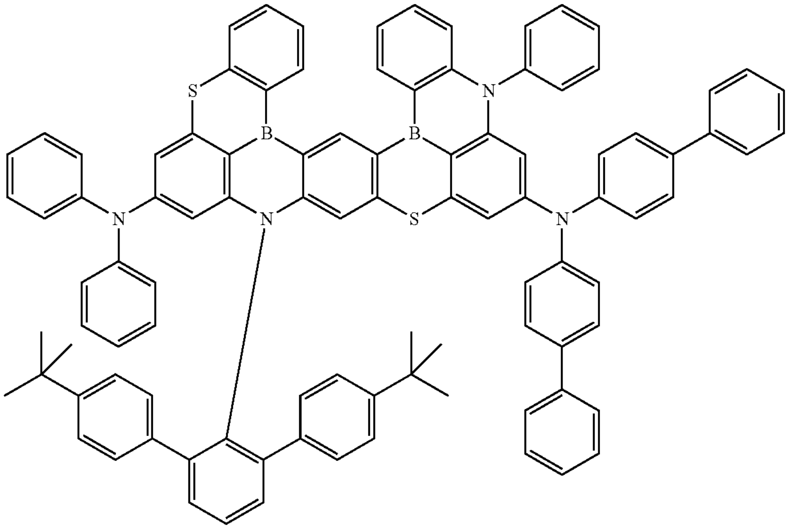
382
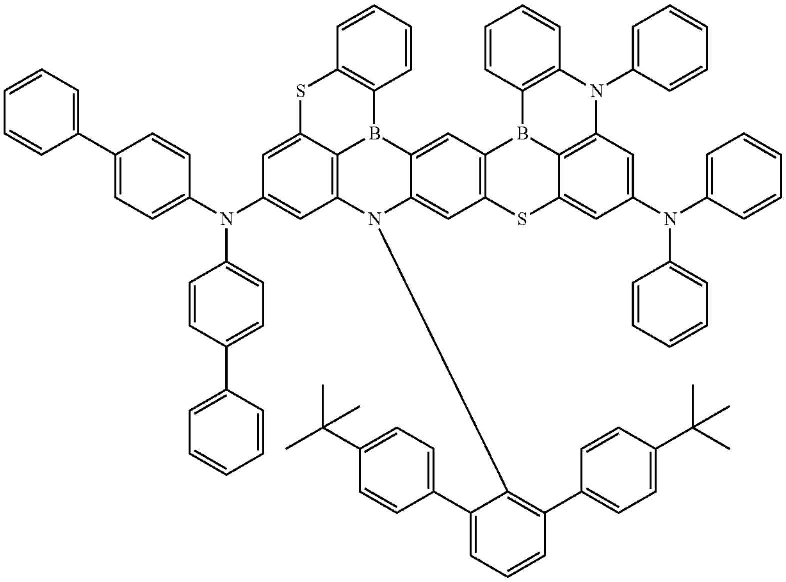

-continued
383
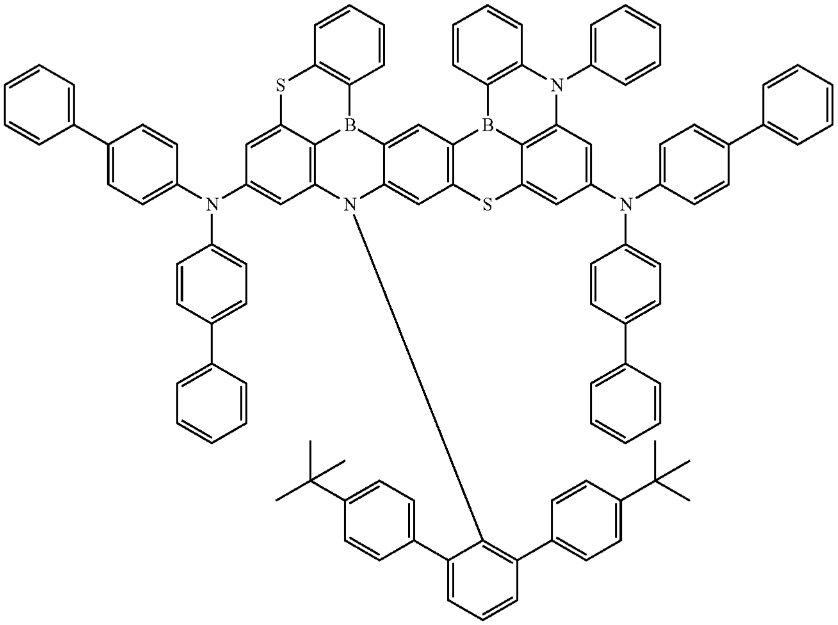
384
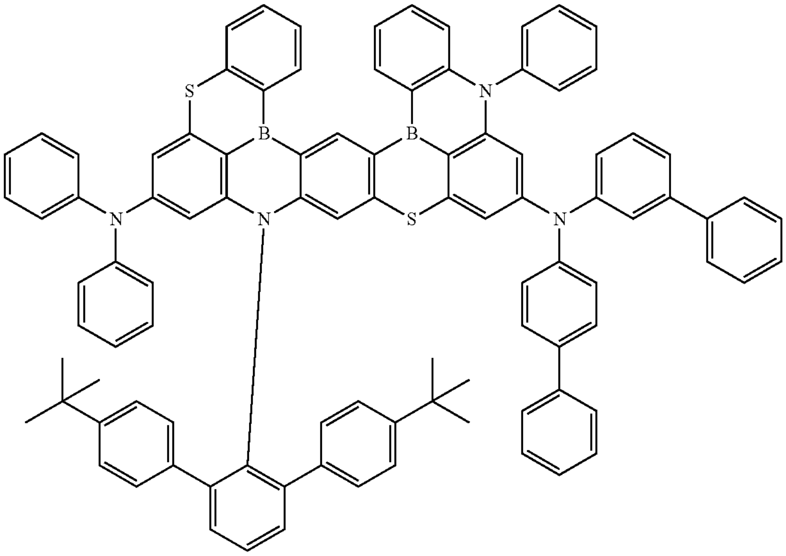

-continued
385
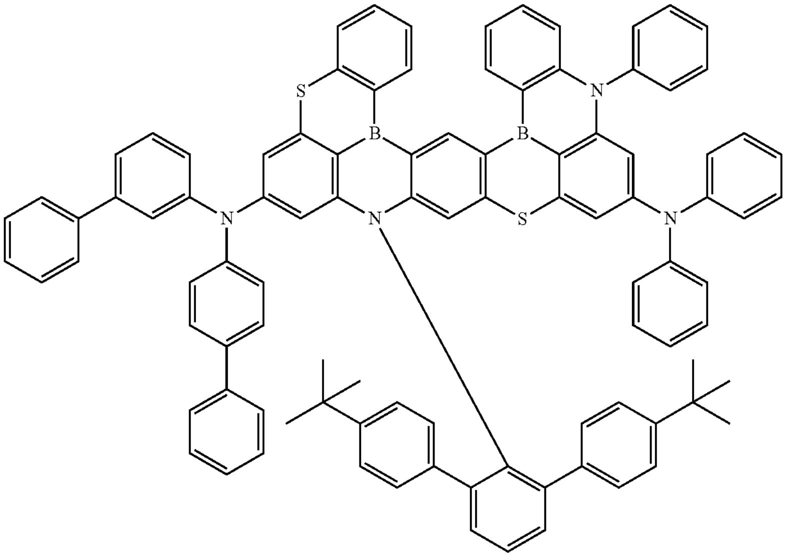
386
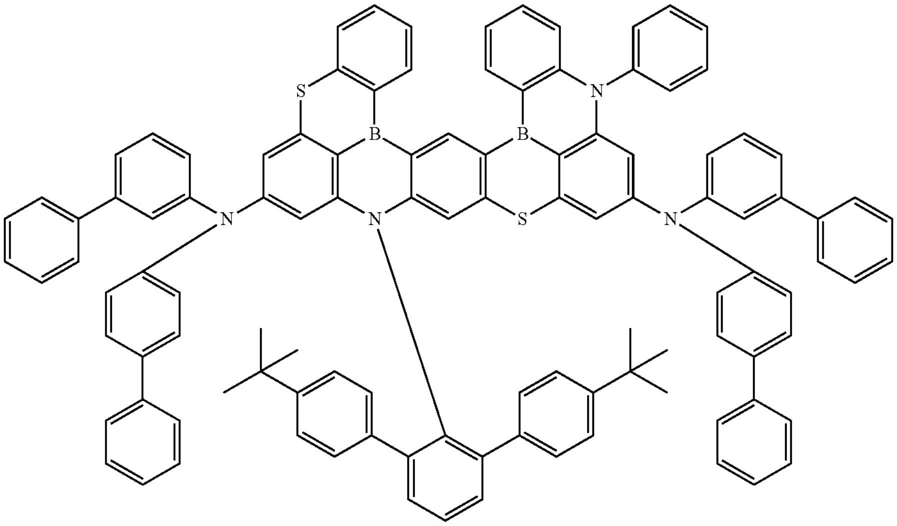
387
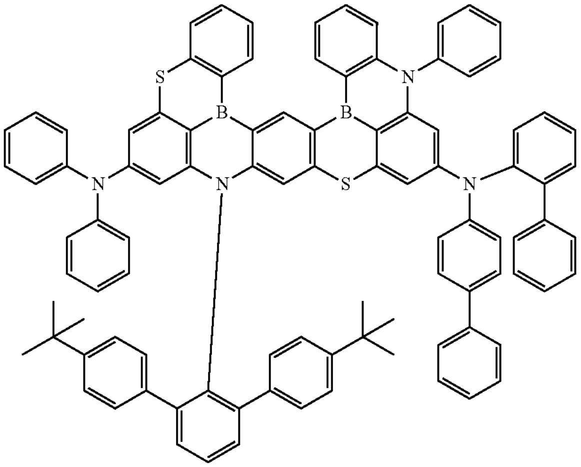
388
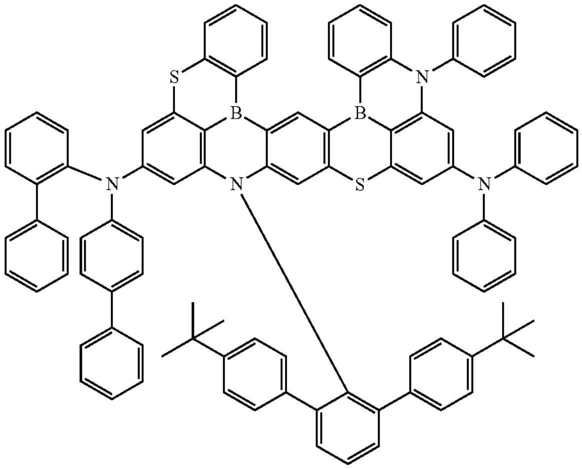

-continued
389
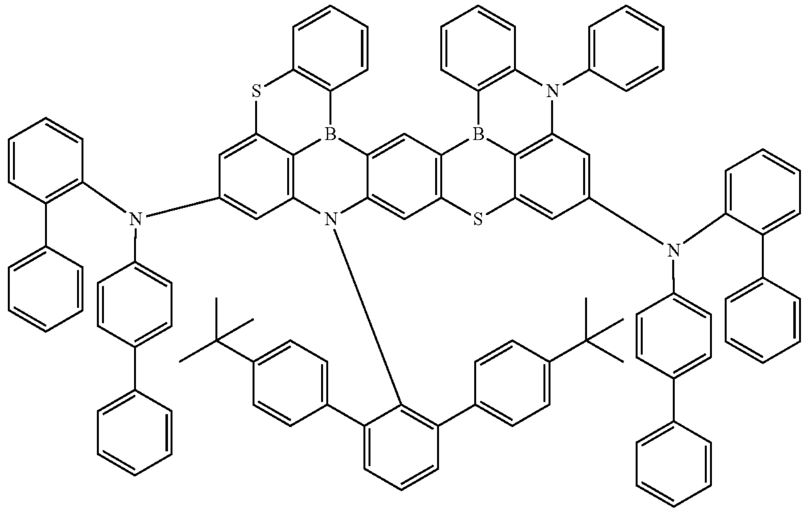
390
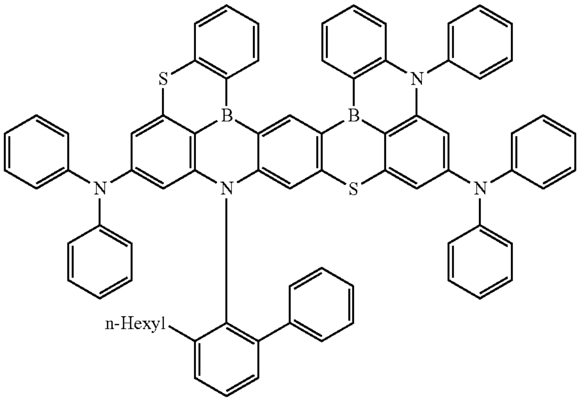
391
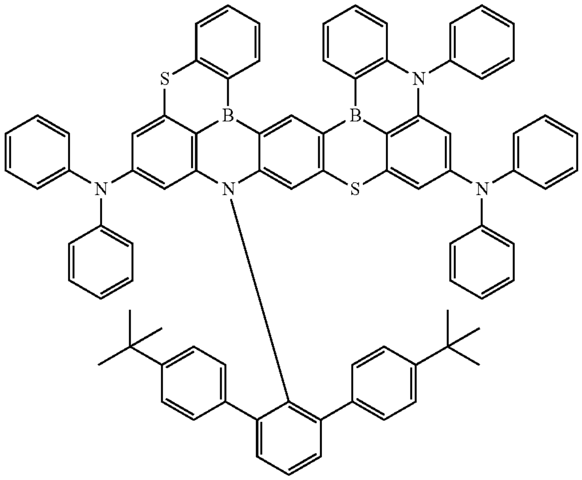
392
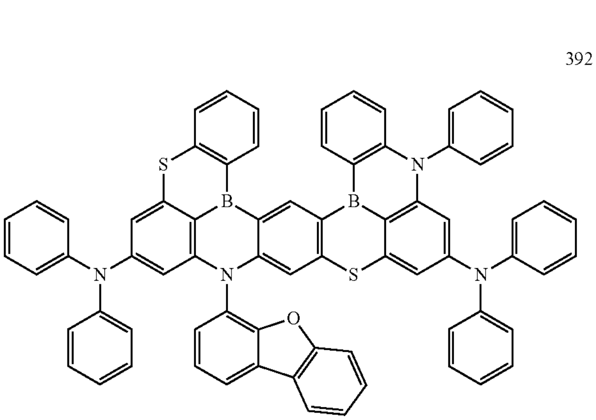
393
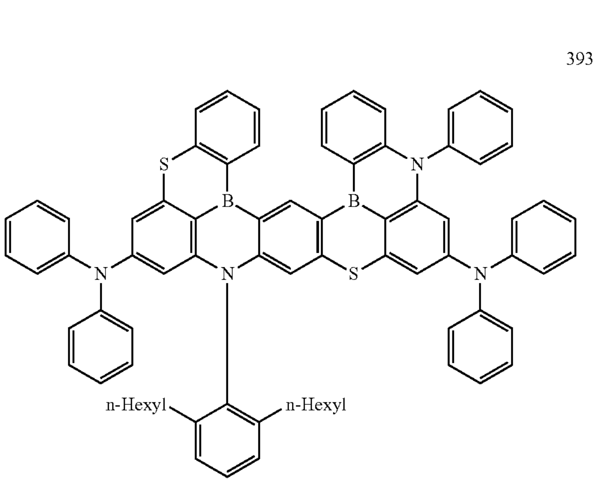

-continued
394
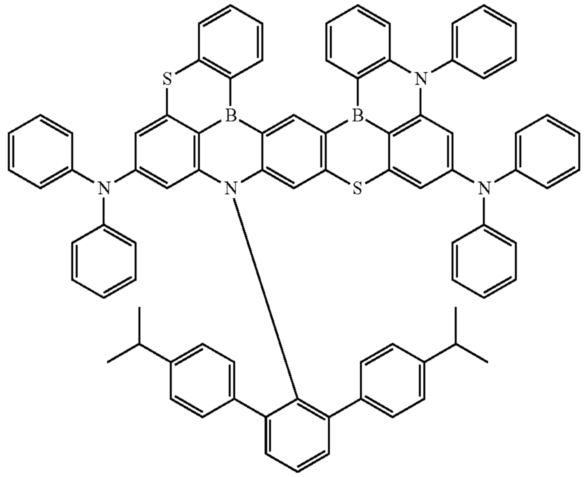
395
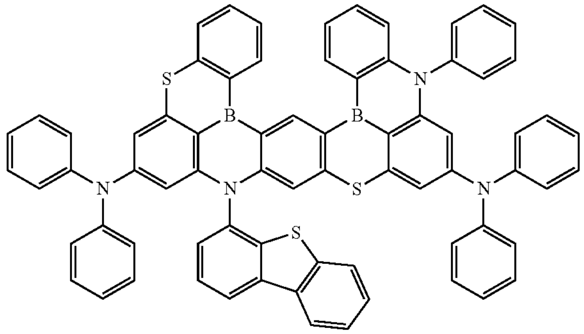
396
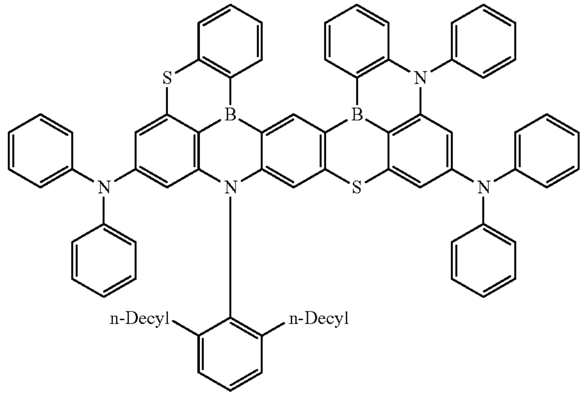
397
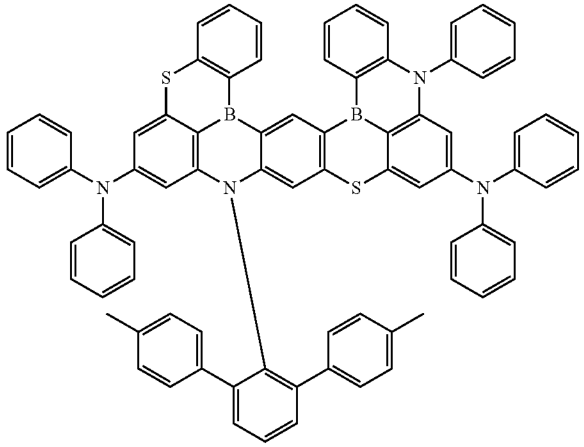
398
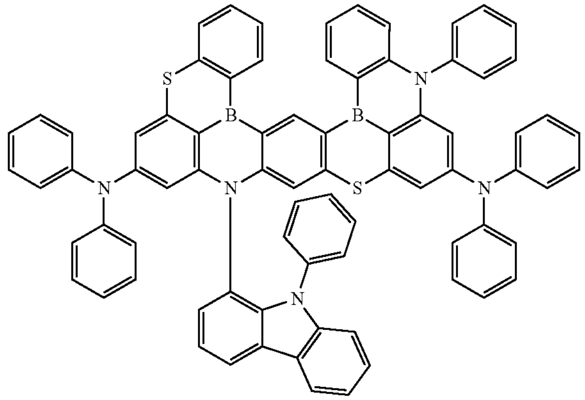
399
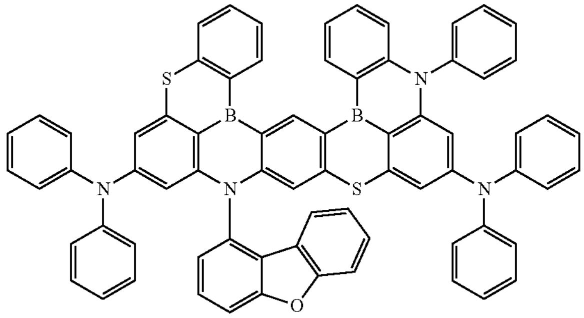

-continued
400
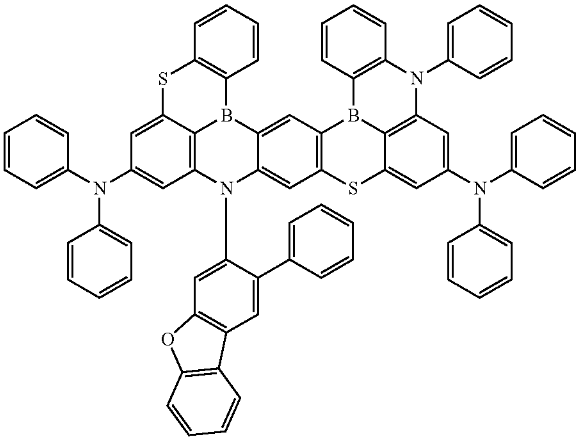
401
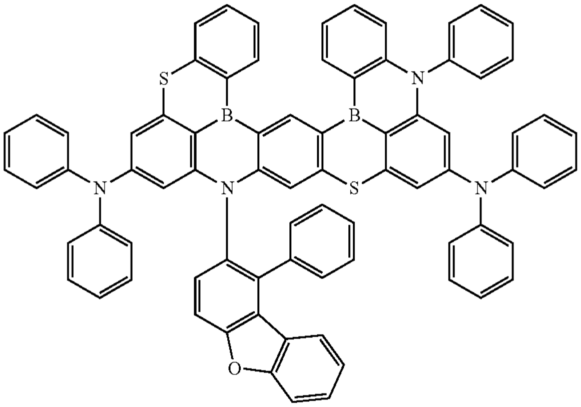
402
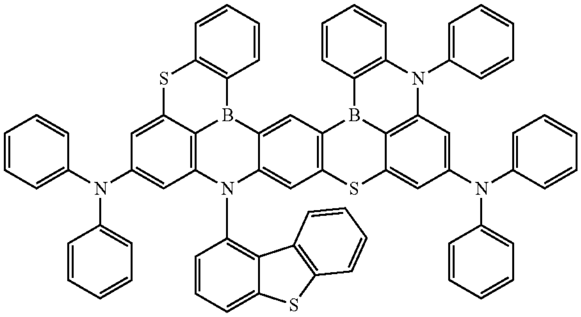
403
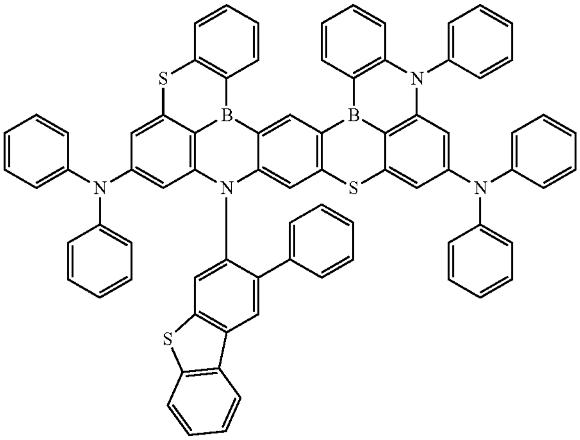
404
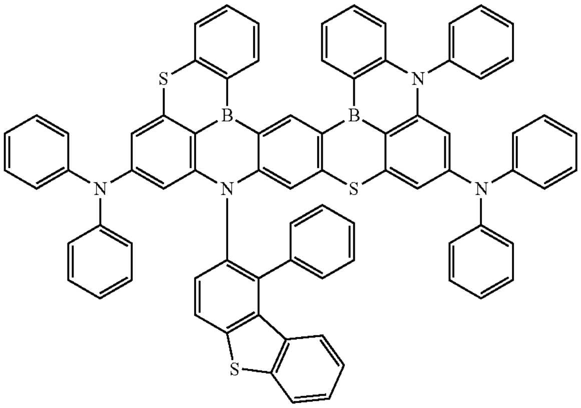
405
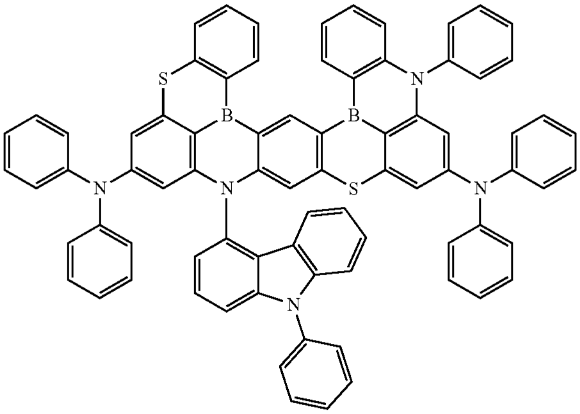

-continued
406
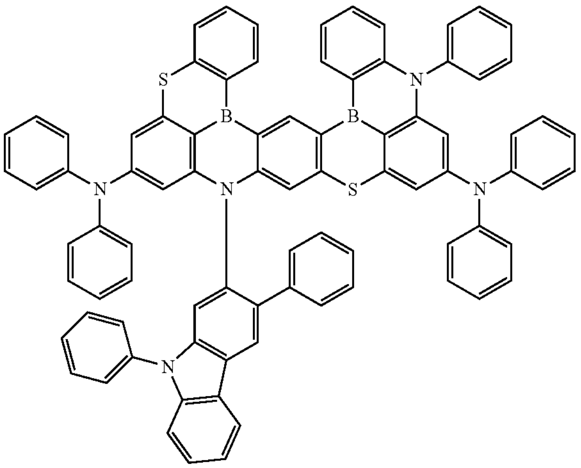
407
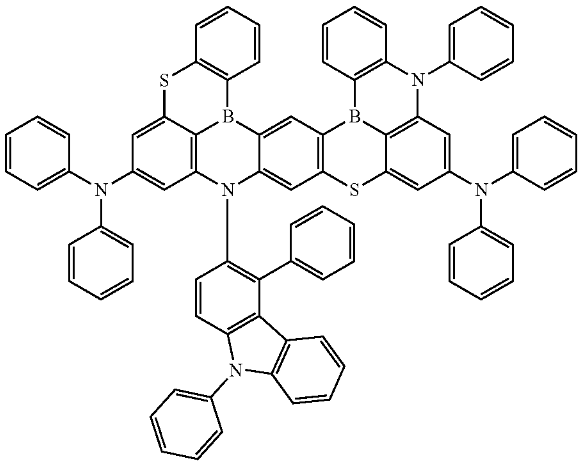
408
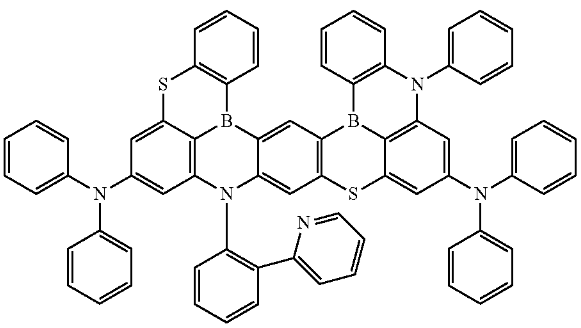
409
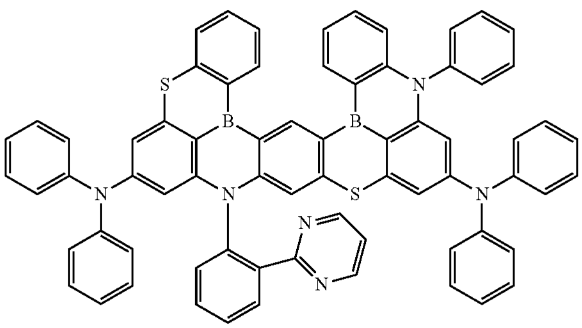
410
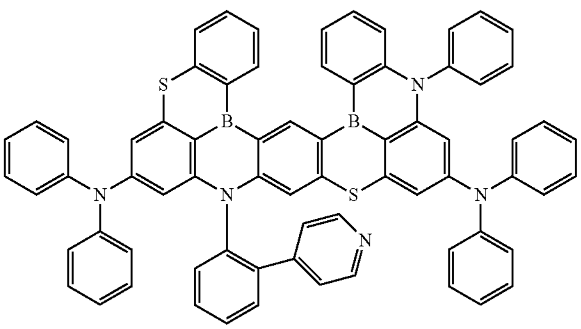
411
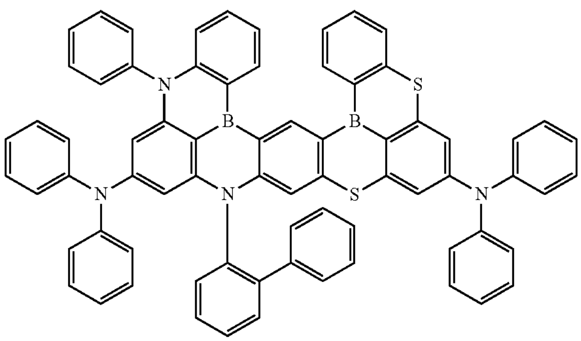
412
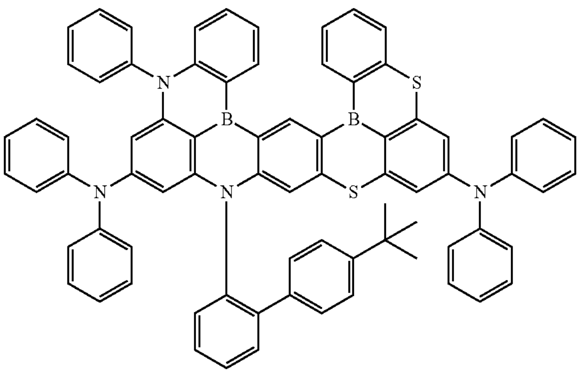
413
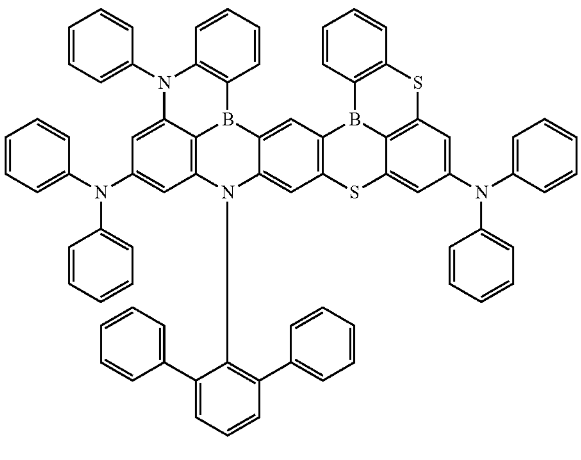

-continued
414
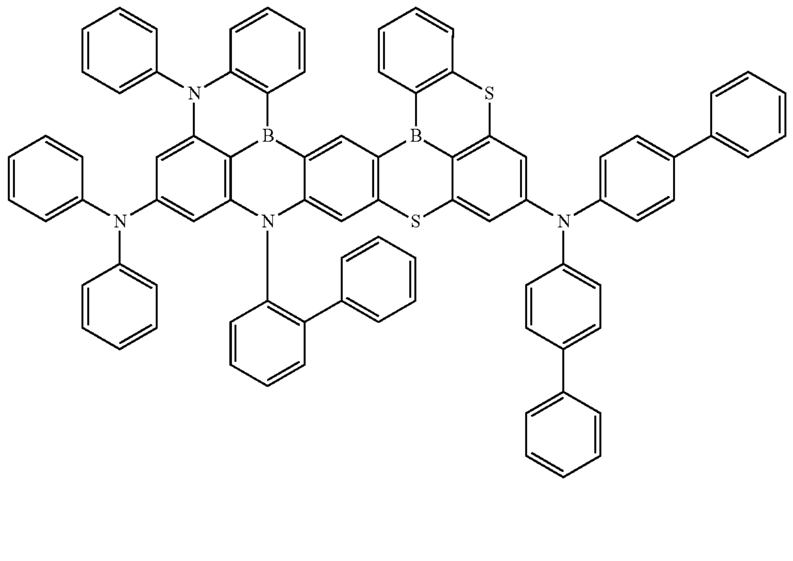
415
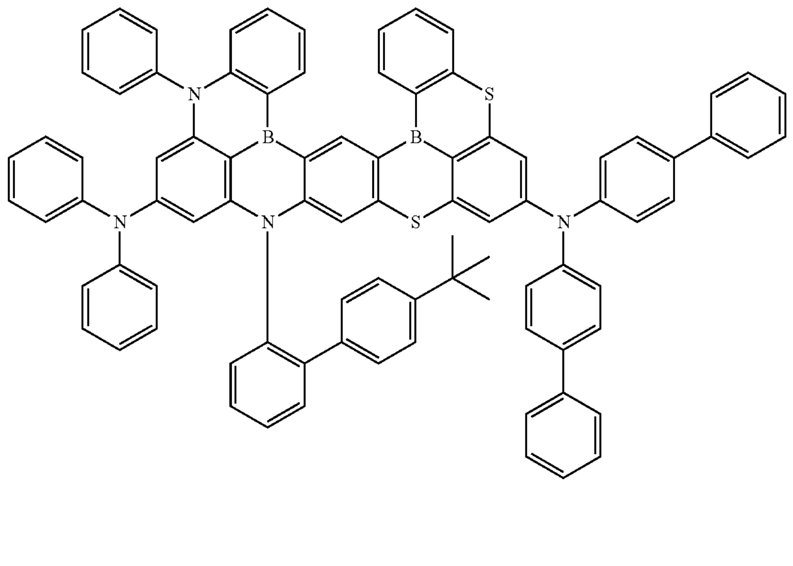
416
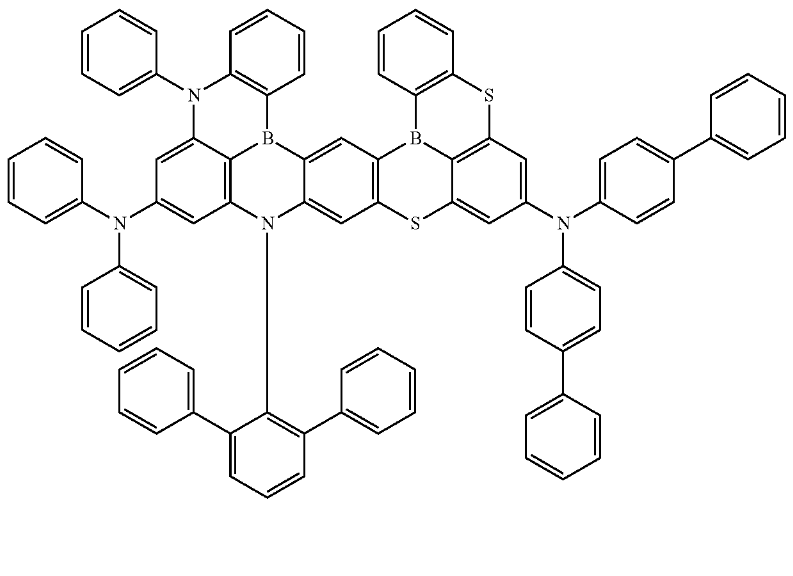

-continued
417
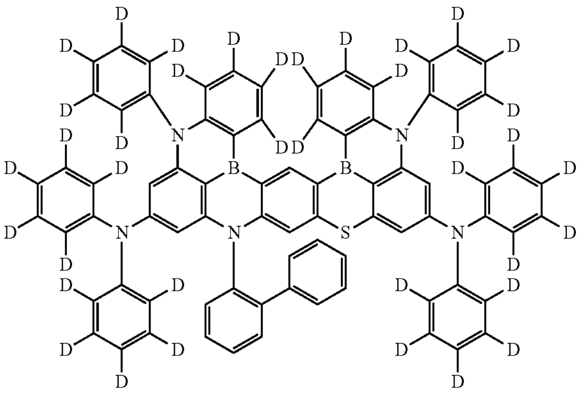
418
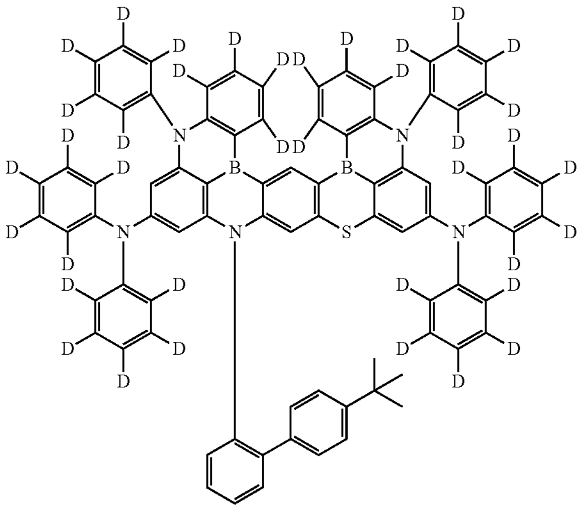
419
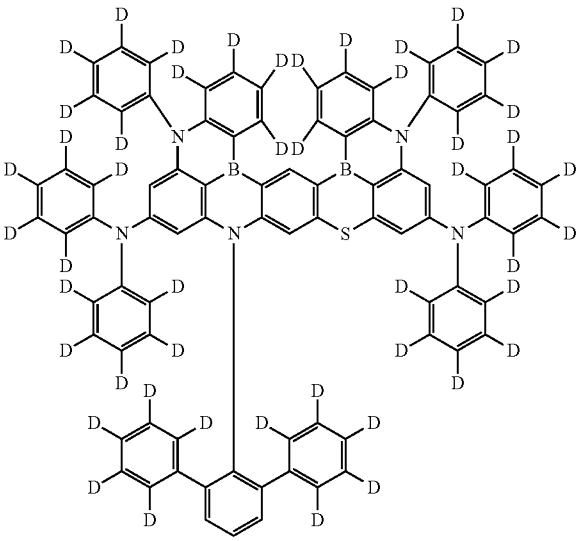
420
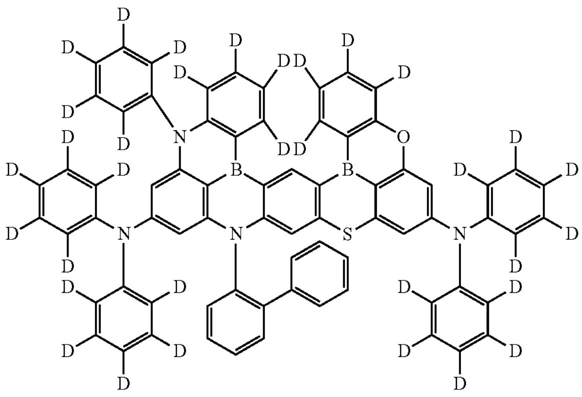
421
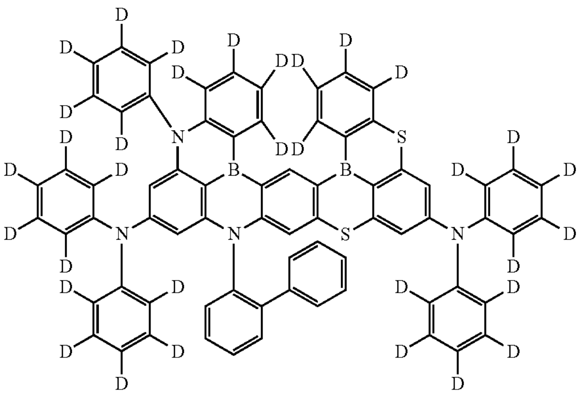
422
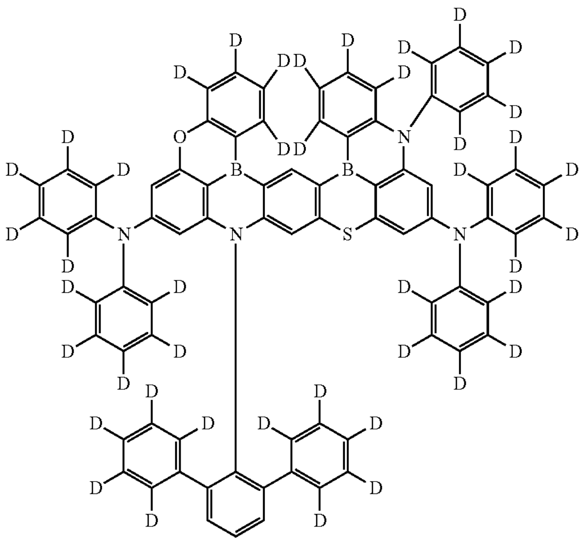

-continued

423

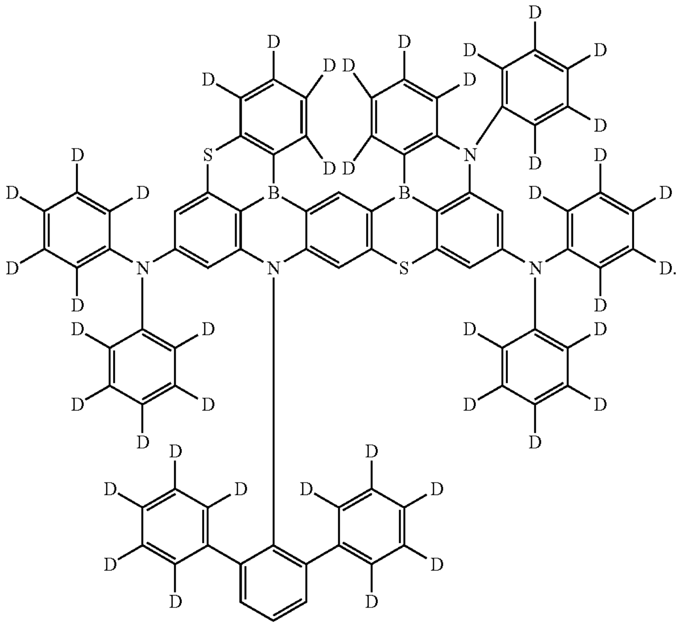

The polycyclic compound of an embodiment represented by Formula 1 may be used as a fluorescence emitting material or as a thermally activated delayed fluorescence (TADF) material. For example, the polycyclic compound of an embodiment may be used as a fluorescence dopant material of a TADF dopant material, emitting blue light. The polycyclic compound of an embodiment may be a light emitting material having a central wavelength ($\lambda_{max}$) in a wavelength region equal to or less than about 490 nm. For example, the polycyclic compound of an embodiment represented by Formula 1 may be a light emitting material having a central wavelength in a wavelength region in a range of about 430 nm to about 480 nm. For example, the polycyclic compound of an embodiment may be a blue thermally activated delayed fluorescence dopant. For example, in an embodiment, the emission layer EML may be a thermally activated delayed fluorescence layer emitting light having a wavelength in a range of about 430 nm to about 480 nm. However, embodiments are not limited thereto.

In the organic electroluminescence devices ED of embodiments, shown in FIG. 3 to FIG. 6, an emission layer EML may include a first compound and a second compound. For example, the first compound may include a dopant, and the second compound may include a host. In an embodiment, the emission layer EML may be a delayed fluorescence emission layer including a first compound and a second compound, and the first compound may be the polycyclic compound represented by Formula 1.

The polycyclic compound according to an embodiment may increase $k_{RISC}$ according to the increase of spin orbital interaction by heavy-atom effects due to the introduction of a sulfur atom, and may restrain triplet-triplet annihilation (TTA) and singlet-triplet annihilation (STA). As the polycyclic compound of an embodiment represented by Formula 1 includes substituents $Y_1$ and/or $Y_2$ at specific positions, a molecular volume may increase, and thus, distance between adjacent molecules in excited states may increase, thereby restraining TTA and STA. Accordingly, the organic electroluminescence device ED of an embodiment, including the polycyclic compound of an embodiment in an emission layer EML may restrain roll off and show improved life characteristics.

The organic electroluminescence device ED of an embodiment that includes the polycyclic compound of an embodiment represented by Formula 1 in an emission layer EML may emit delayed fluorescence. The organic electroluminescence device ED of an embodiment may emit it thermally activated delayed fluorescence (TADF), and the organic electroluminescence device ED may show high efficiency properties.

The organic electroluminescence device ED of an embodiment may further include a material for an emission layer below, in addition to the polycyclic compound of an embodiment. In the organic electroluminescence device ED of an embodiment, the emission layer EML may include anthracene derivatives, pyrene derivatives, fluoranthene derivatives, chrysene derivatives, dihydrobenzanthracene derivatives, or triphenylene derivatives. For example, the emission layer EML may include anthracene derivatives or pyrene derivatives.

In the organic electroluminescence devices ED, shown in FIG. 3 to FIG. 6, the emission layer EML may include a host and a dopant, and the emission layer EML may include a compound represented by Formula E-1 below. The compound represented by Formula E-1 below may be used as a fluorescence host material.

[Formula E-1]

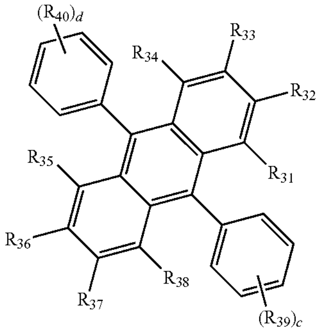

In Formula E-1, $R_{31}$ to $R_{40}$ may each independently be a hydrogen atom, a deuterium atom, a halogen atom, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula E-1, $R_{31}$ to $R_{40}$ may be combined with an adjacent group to form a saturated hydrocarbon ring or an unsaturated hydrocarbon ring.

In Formula E-1, c and d may each independently be an integer from 0 to 5.

The compound represented by Formula E-1 may be any one selected from Compound E1 to Compound E19 below.

E1

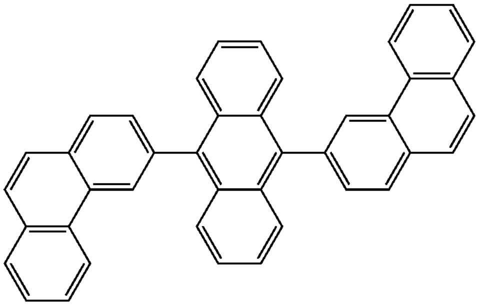

E2

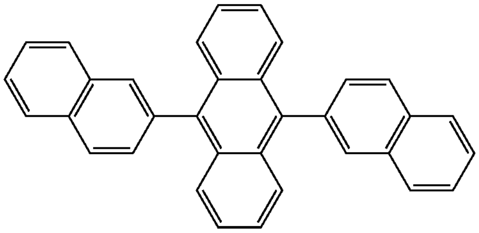

E3

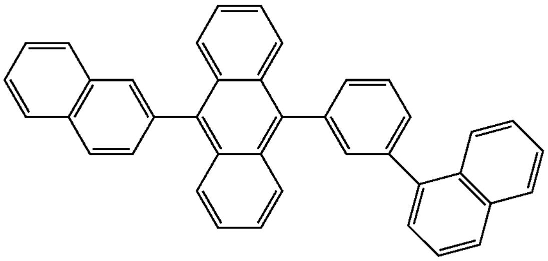

-continued

E4

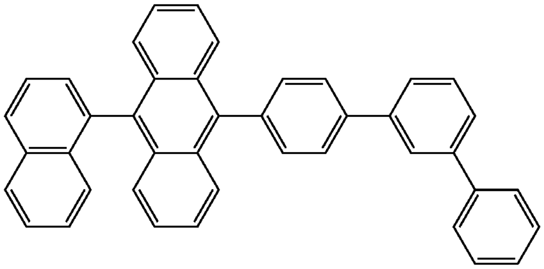

E5

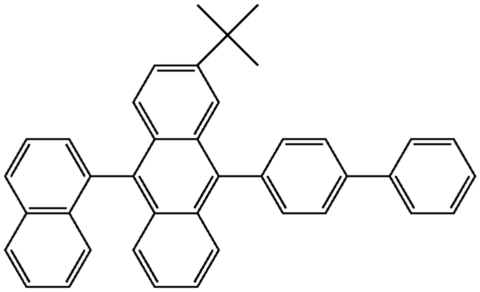

E6

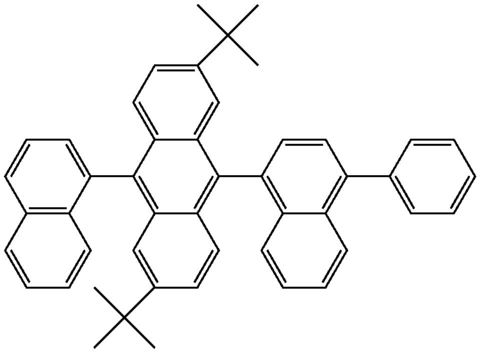

E7

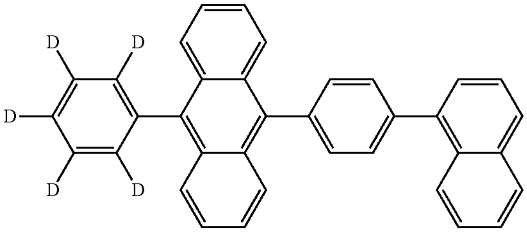

E8

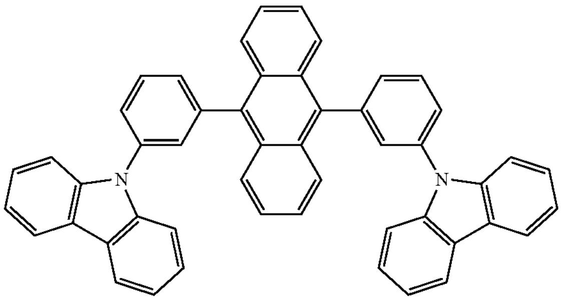

-continued
E9
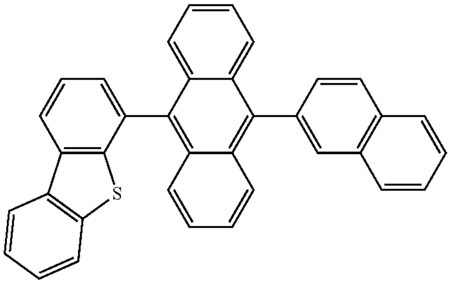
E10
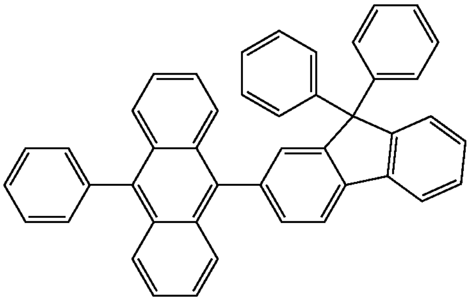
E11
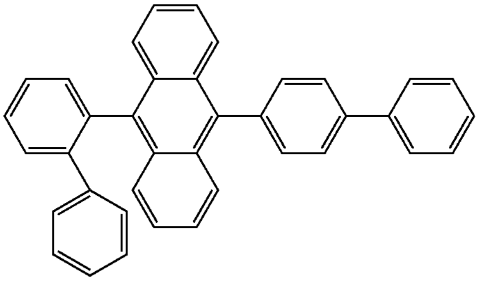
E12
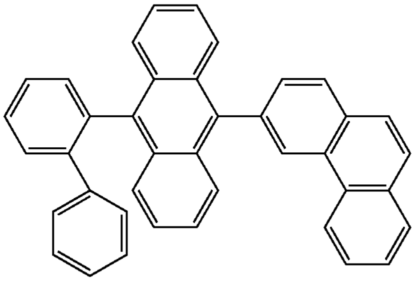
E13
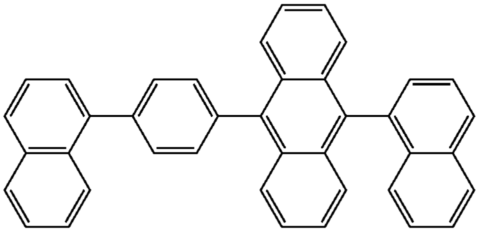
-continued
E14
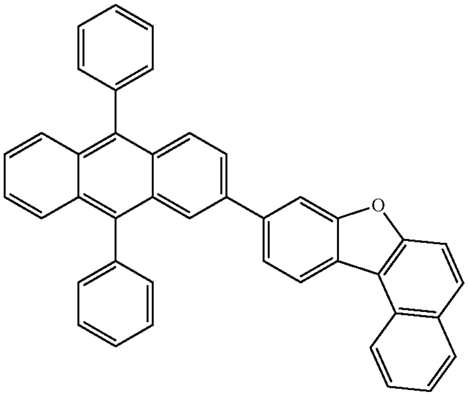
E15
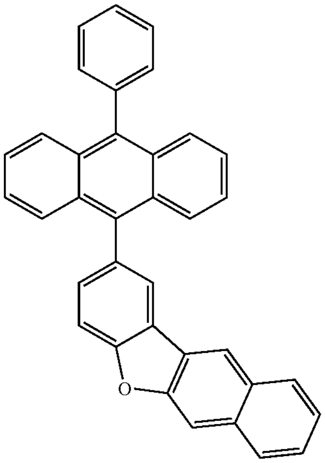
E16
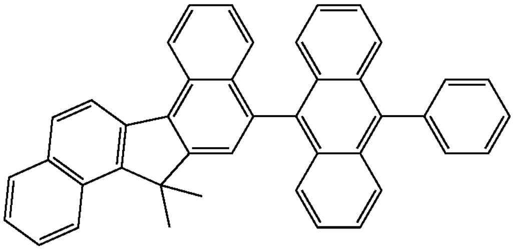
E17
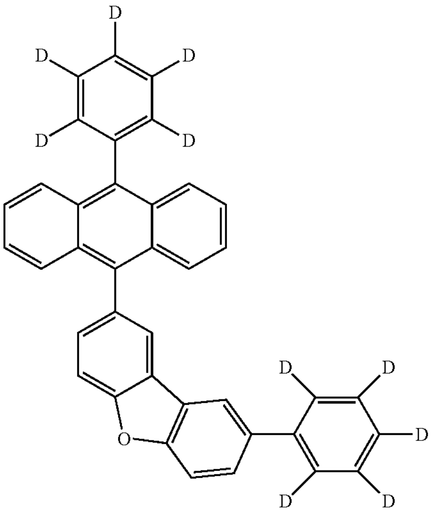

-continued

E18

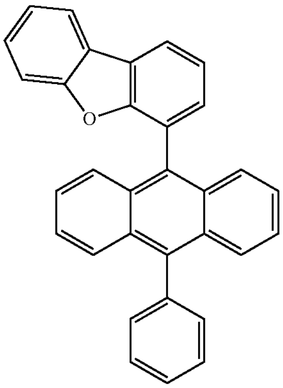

E19

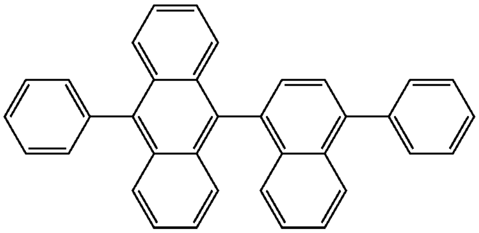

In an embodiment, the emission layer EML may include a compound represented by Formula E-2a or Formula E-2b below. The compound represented by Formula E-2a or Formula E-2b below may be used as a phosphorescence host material.

[Formula E-2a]

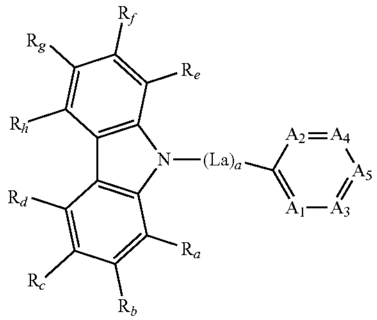

In Formula E-2b, a may be an integer from 0 to 10, and $L_a$ may be a direct linkage, a substituted or unsubstituted arylene group of 6 to 30 ring-forming carbon atoms, or a substituted or unsubstituted heteroarylene group of 2 to 30 ring-forming carbon atoms. If a is 2 or more, multiple $L_a$ groups may each independently be a substituted or unsubstituted arylene group of 6 to 30 ring-forming carbon atoms, or a substituted or unsubstituted heteroarylene group of 2 to 30 ring-forming carbon atoms.

In Formula E-2a, $A_1$ to $A_5$ may each independently be N or C(Ri). $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. $R_a$ to $R_i$ may be combined with an adjacent group to form a hydrocarbon ring or a heterocycle including N, O, S, etc. as a ring-forming atom.

In Formula E-2a, two or three of $A_1$ to $A_5$ may be N, and the remainder of $A_1$ to $A_5$ may be $C(R_i)$.

[Formula E-2b]

$$(Cbz1 - (L_b)_b - Cbz2)$$

In Formula E-2b, Cbz1 and Cbz2 may each independently be an unsubstituted carbazole group, or a carbazole group substituted with an aryl group of 6 to 30 ring-forming carbon atoms. $L_b$ may be a direct linkage, a substituted or unsubstituted arylene group of 6 to 30 ring-forming carbon atoms, or a substituted or unsubstituted heteroarylene group of 2 to 30 ring-forming carbon atoms. In Formula E-2b, b may be an integer from 0 to 10, and if b is 2 or more, multiple $L_b$ groups may each independently be a substituted or unsubstituted arylene group of 6 to 30 ring-forming carbon atoms, or a substituted or unsubstituted heteroarylene group of 2 to 30 ring-forming carbon atoms.

The compound represented by Formula E-2a or Formula E-2b may be any one selected from Compound Group E-2 below. However, the compounds shown in Compound Group E-2 below are only examples, and the compound represented by Formula E-2a or Formula E-2b is not limited to the compounds listed in Compound Group E-2 below.

[Compound Group E-2]

E-2-1

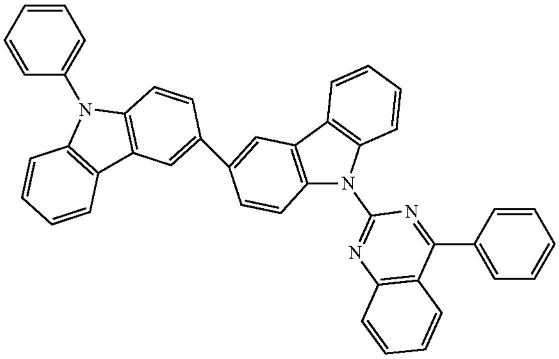

E-2-2

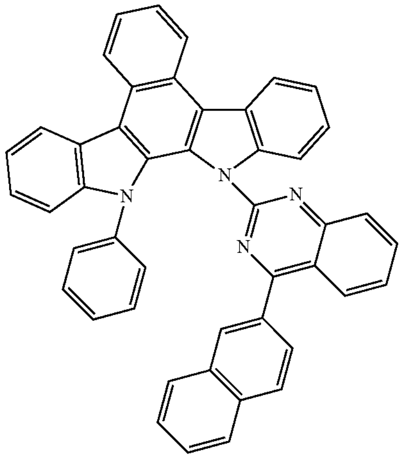

-continued
E-2-3
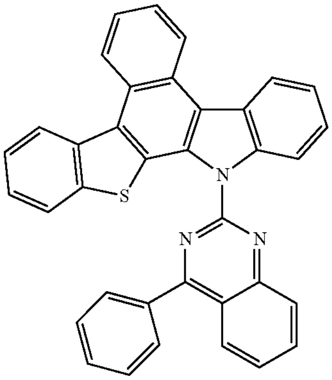
E-2-4
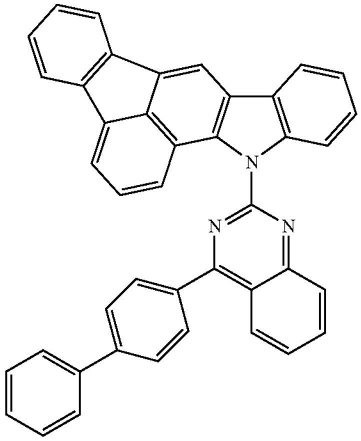
E-2-5
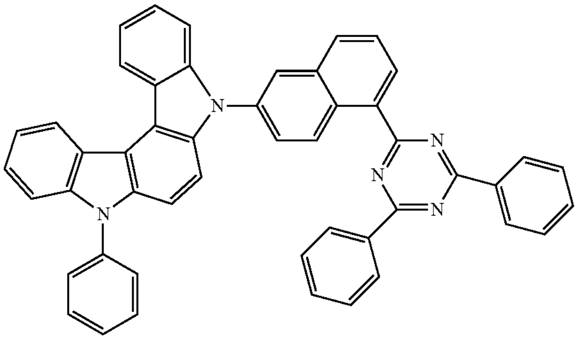
E-2-6
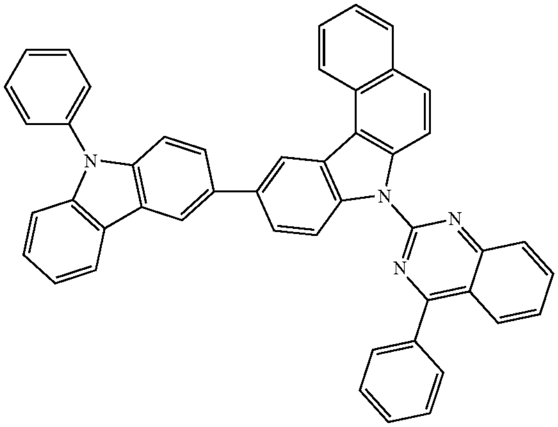
-continued
E-2-7
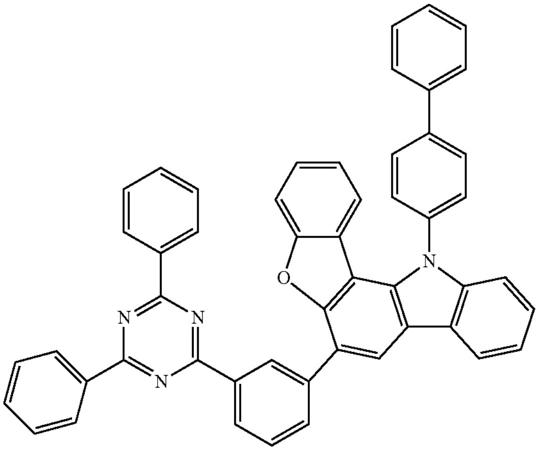
E-2-8
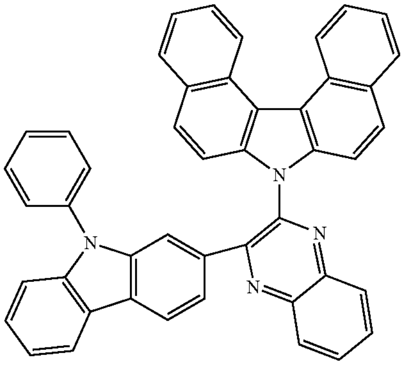
E-2-9
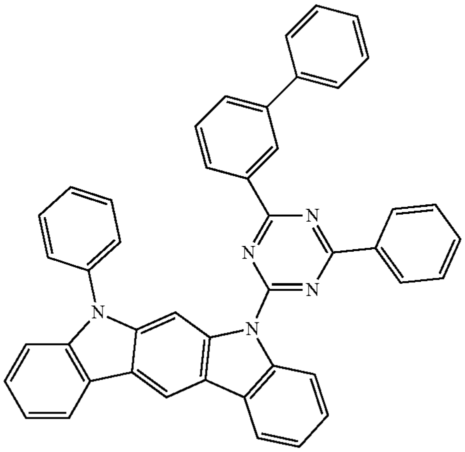

-continued
E-2-10
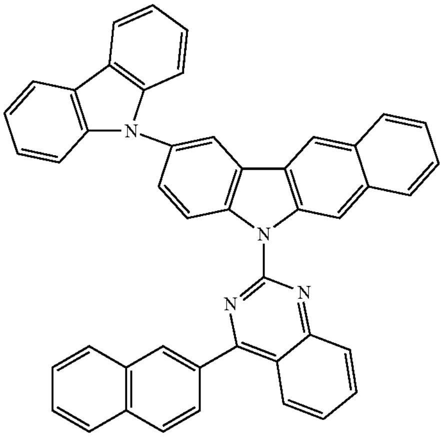
E-2-11
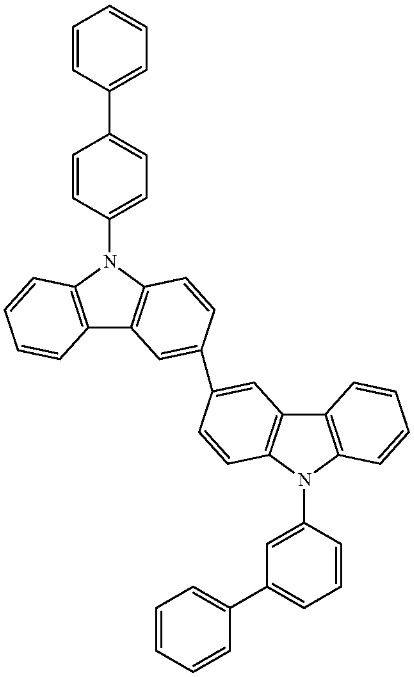
E-2-12
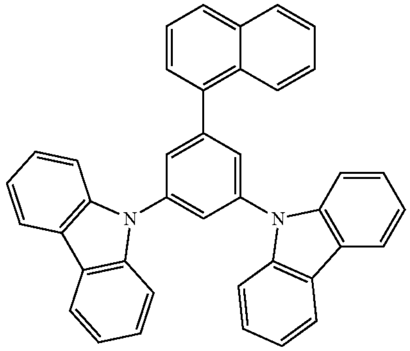
-continued
E-2-13
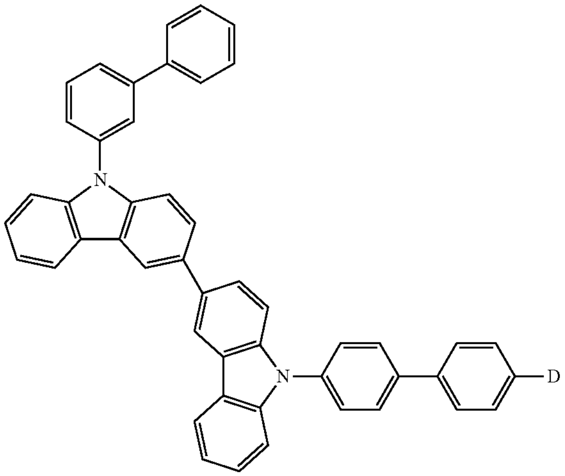
E-2-14
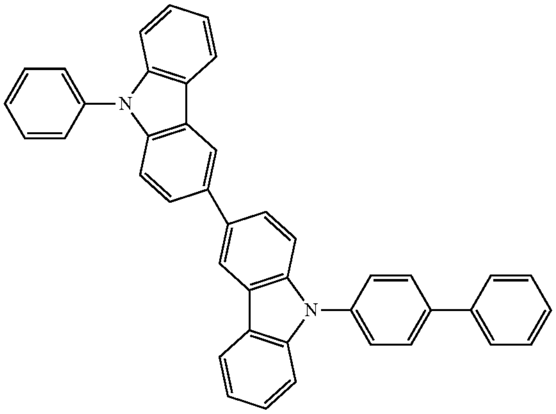
E-2-15
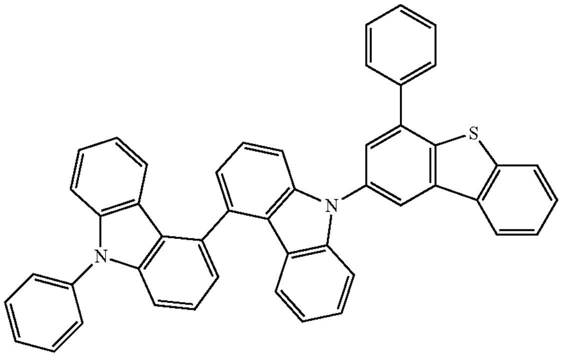

-continued
E-2-16
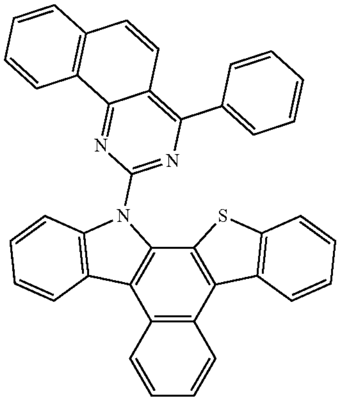
E-2-17
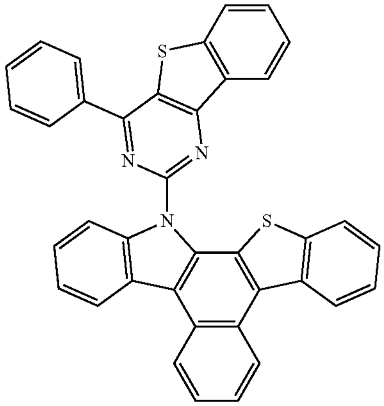
E-2-18
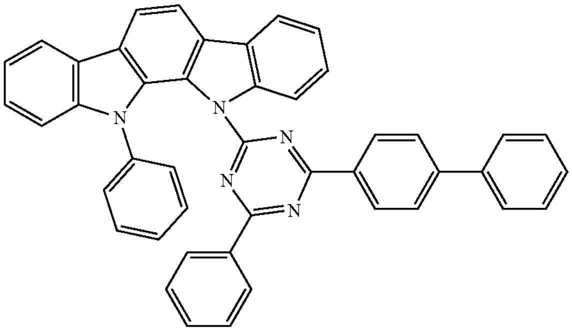
E-2-19
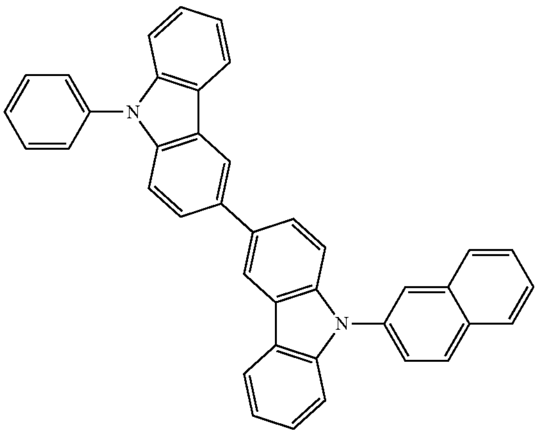
-continued
E-2-20
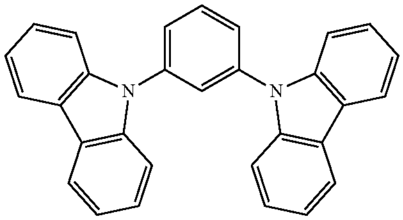
E-2-21
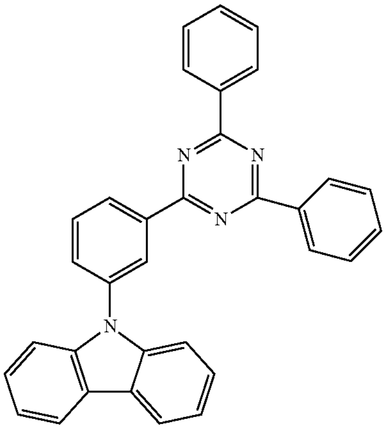
E-2-22
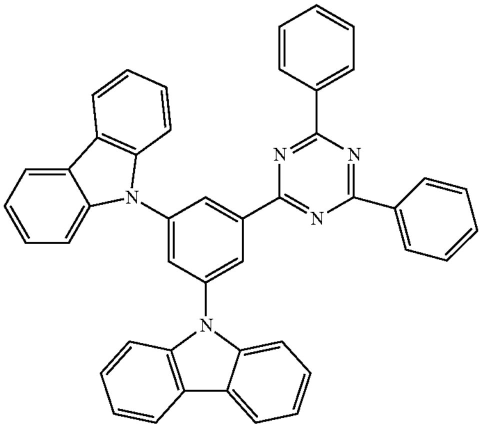
E-2-23
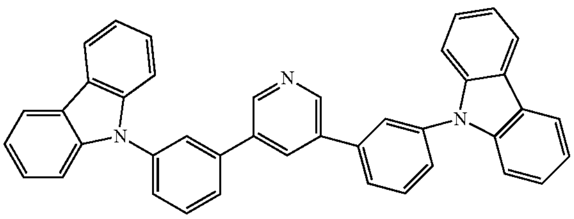

-continued

E-2-24

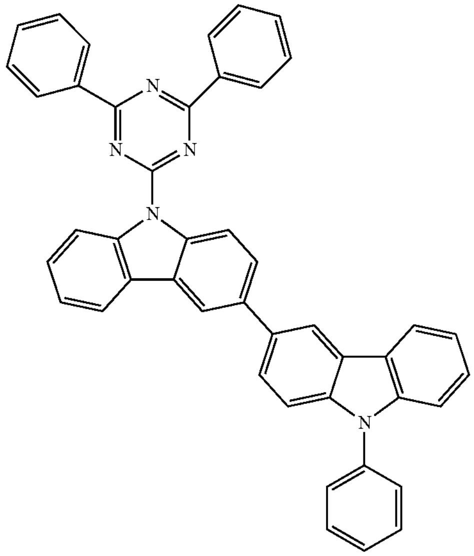

The emission layer EML may further include a common material in the art as a host material. For example, the emission layer EML may include as a host material, at least one of bis[2-(diphenylphosphino)phenyl] ether oxide (DPEPO), 4,4'-bis(carbazol-9-yl)-1,1'-biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), and 1,3,5-tris(1-phenyl-1H-benzo[d]imidazole-2-yl)benzene (TPBi). However, embodiments are not limited thereto. For example, tris(8-hydroxyquinolino)aluminum ($Alq_3$), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be used as the host material.

The emission layer EML may include a compound represented by Formula M-a or Formula M-b below. The compound represented by Formula M-a or Formula M-b may be used as a phosphorescence dopant material.

[Formula M-a]

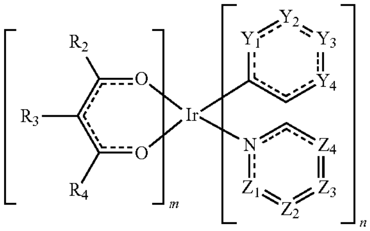

In Formula M-a, $Y_1$ to $Y_4$ and $Z_1$ to $Z_4$ may each independently be $C(R_1)$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula M-a, m may be 0 or 1, and n may be 2 or 3. In Formula M-a, if m is 0, n may be 3, and if m is 1, n may be 2.

The compound represented by Formula M-a may be used as a red phosphorescence dopant or a green phosphorescence dopant.

The compound represented by Formula M-a may be any one selected from Compounds M-a1 to M-a25 below. However, Compounds M-a1 to M-a25 below are examples, and the compound represented by Formula M-a is not limited to Compounds M-a1 to M-a25 below.

M-a1

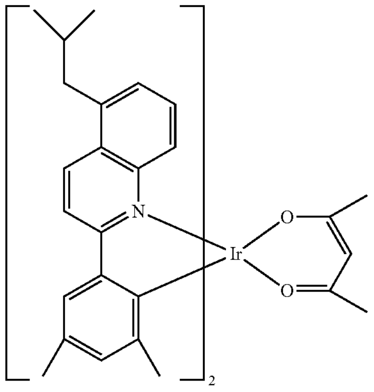

M-a2

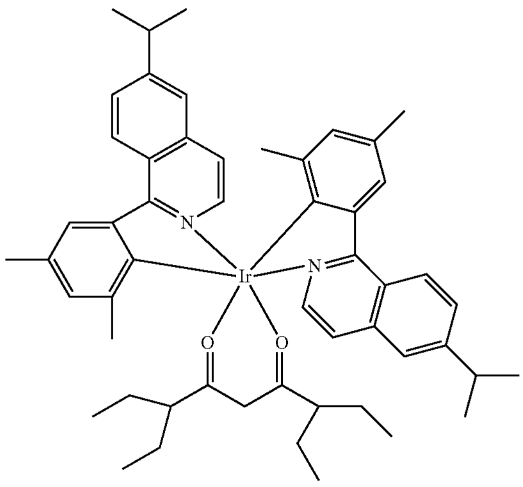

M-a3

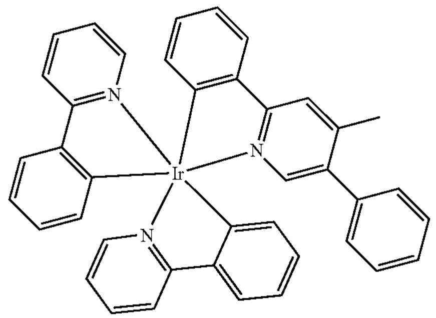

-continued
M-a4
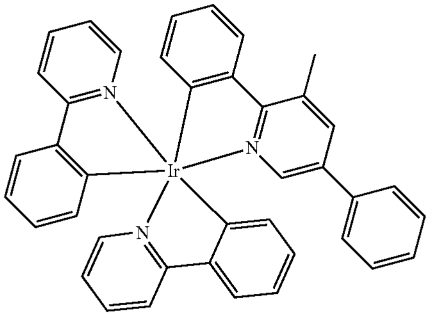
M-a5
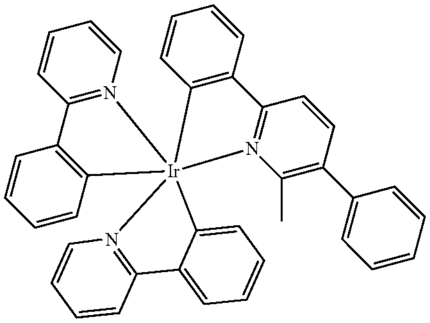
M-a6
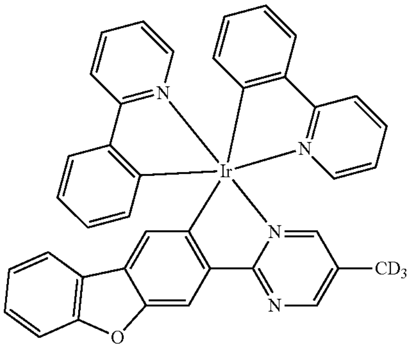
M-a7
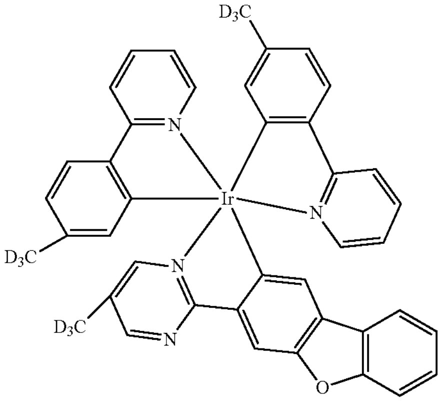
M-a8
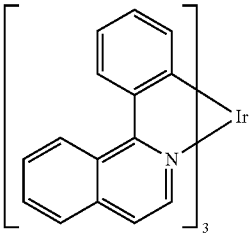
-continued
M-a9
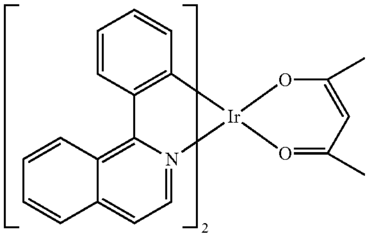
M-a10
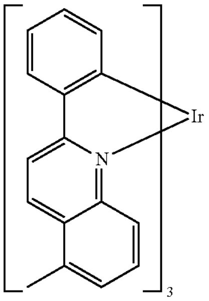
M-a11
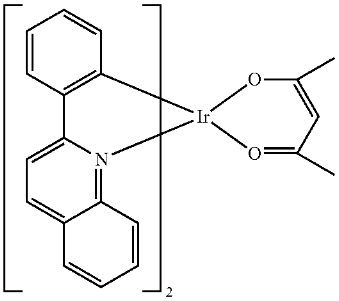
M-a12
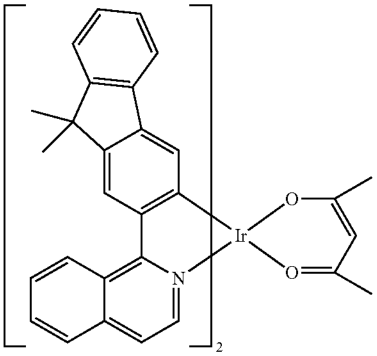
M-a13
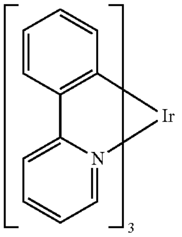

-continued
M-a14
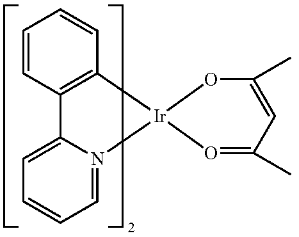
M-a15
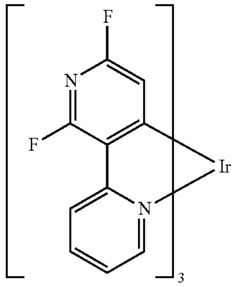
M-a16
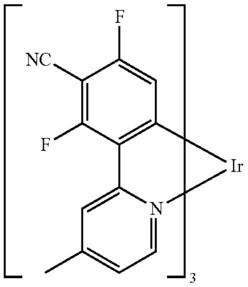
M-a17
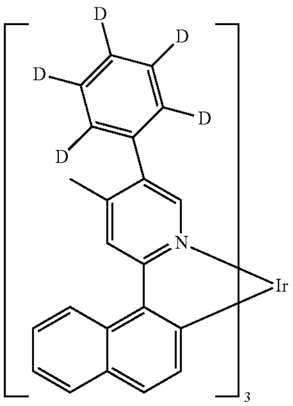
M-a18
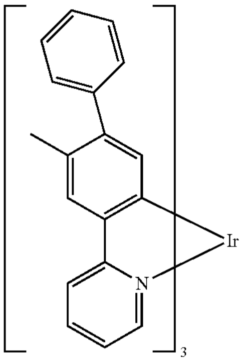
-continued
M-a19
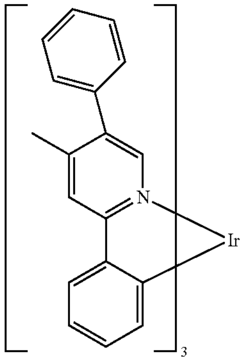
M-a20
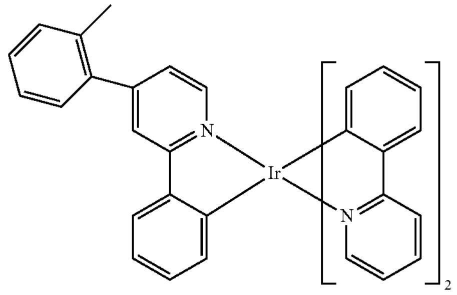
M-a21
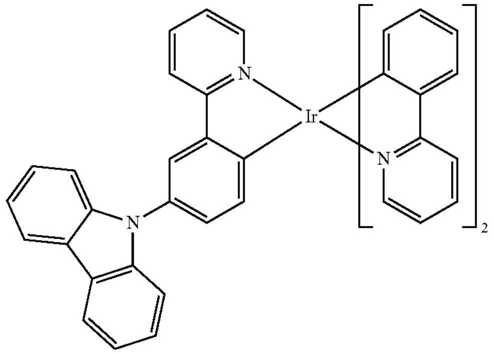
M-a22
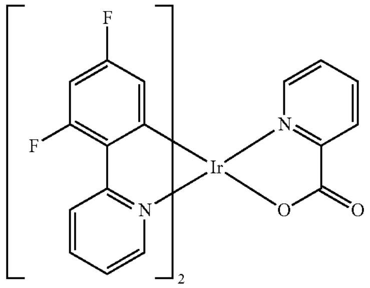
M-a23
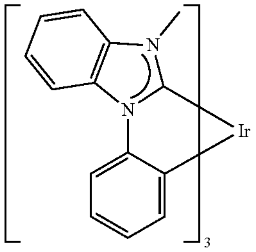

-continued

M-a24

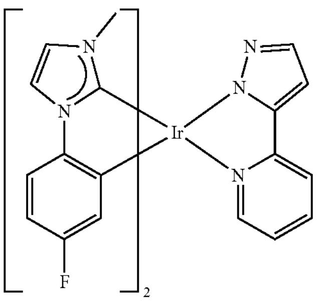

M-a25

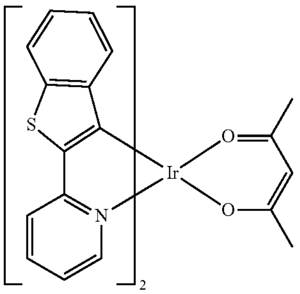

Compound M-a1 and Compound M-a2 may be used as red dopant materials, and Compound M-a3 and Compound M-a4 may be used as green dopant materials.

[Formula M-b]

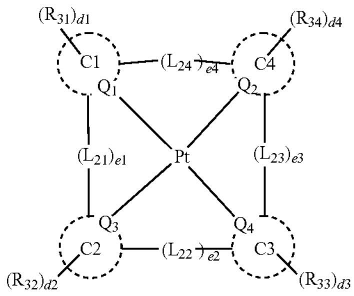

In Formula M-b, $Q_1$ to $Q_4$ may each independently be C or N, and C1 to C4 may each independently be a substituted or unsubstituted hydrocarbon ring of 5 to 30 ring-forming carbon atoms, or a substituted or unsubstituted heterocycle of 2 to 30 ring-forming carbon atoms. $L_{21}$ to $L_{24}$ may each independently be a direct linkage,

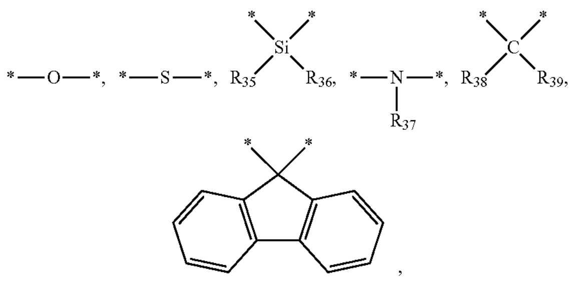

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms, and e1 to e4 may each independently be 0 or 1. In Formula M-b, $R_{31}$ to $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, and d1 to d4 may each independently be an integer from 0 to 4.

The compound represented by Formula M-b may be used as a blue phosphorescence dopant or a green phosphorescence dopant.

The compound represented by Formula M-b may be any one selected from the compounds below. However, the compounds below are examples, and the compound represented by Formula M-b is not limited to the compounds below.

M-b-1

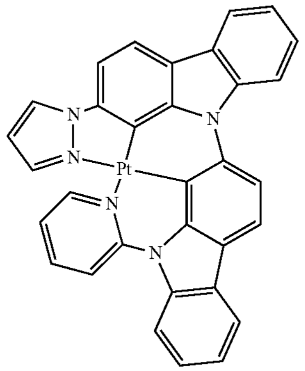

M-b-2

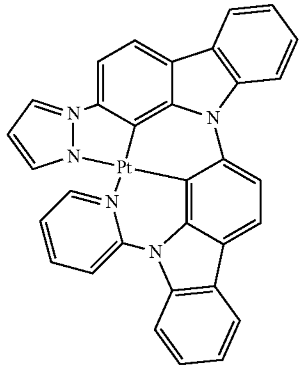

M-b-3

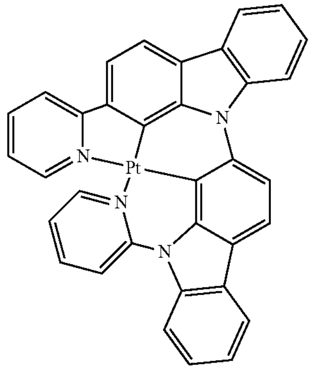

-continued
M-b-4
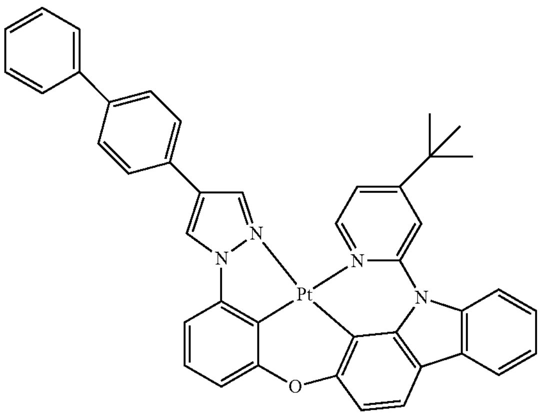
M-b-5
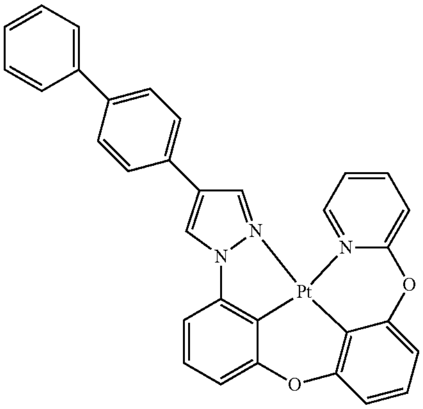
M-b-6
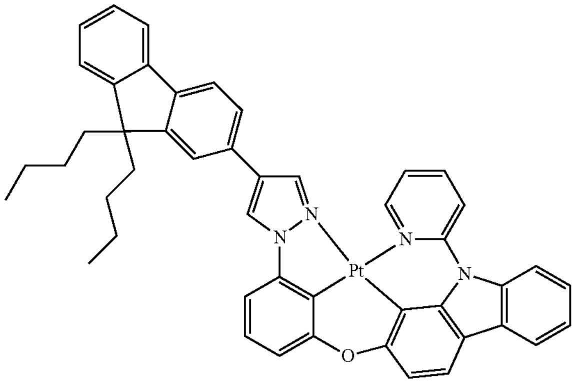
-continued
M-b-7
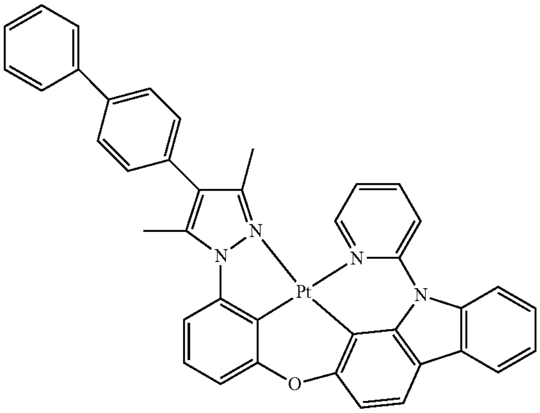
M-b-8
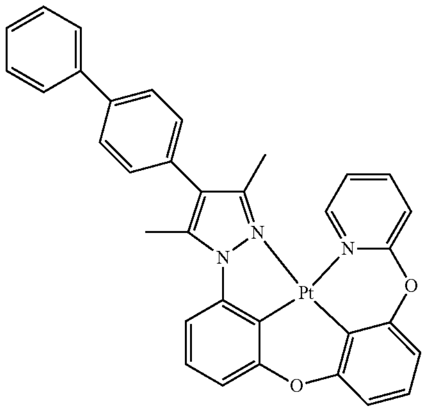
M-b-9
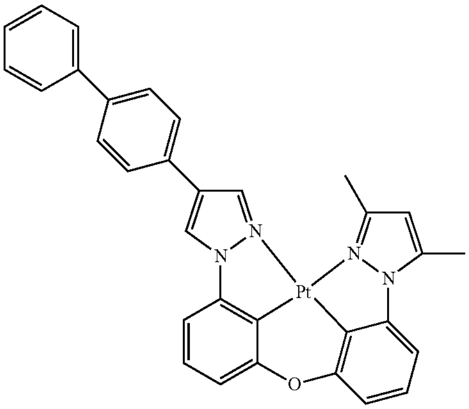
M-b-10
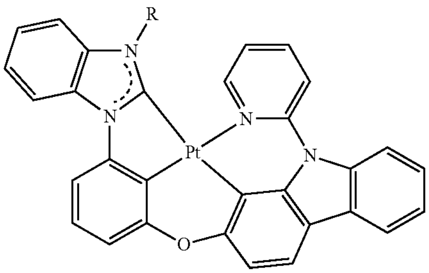

-continued

M-b-11

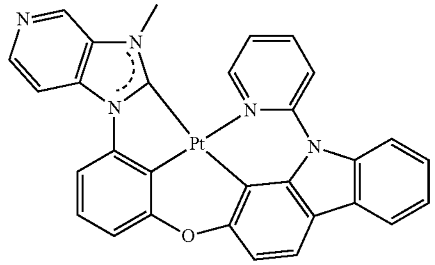

M-b-12

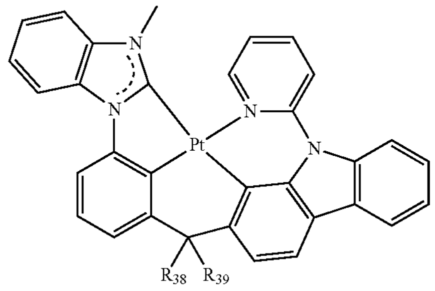

In the compounds above, R, $R_{38}$, and $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

The emission layer EML may include a compound represented by any one of Formula F-a to Formula F-c below. The compounds represented by Formula F-a to Formula F-c below may be used as fluorescence dopant materials.

[Formula F-a]

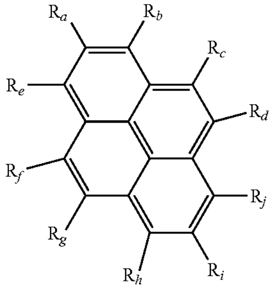

In Formula F-a, two selected from $R_a$ to $R_j$ may each independently be substituted with *—$NAr_1Ar_2$. The remainder of $R_a$ to $R_j$ which are not substituted with *—$NAr_1Ar_2$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In the group *—$NAr_1Ar_2$, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. For example, at least one of $Ar_1$ and $Ar_2$ may be a heteroaryl group including O or S as a ring-forming atom.

[Formula F-b]

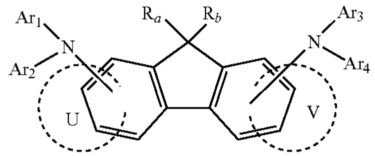

In Formula F-b, $R_a$ and $R_b$ may each independently be a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula F-b, U and V may each independently be 0 or 1. In Formula F-b, U may indicate the number of rings fused at position U, and V may indicate the number of rings fused at position V. For example, if the number of U or V is 1, the ring indicated by U or V may form a fused ring, and if U or V is 0, the ring indicated by U or V may not be present. If U is 0 and V is 1, or if U is 1 and V is 0, a fused ring having the fluorene core of Formula F-b may be a compound with four rings. If both U and V are 0, the fused ring of Formula F-b may be a compound with three rings. If both U and V are 1, a fused ring having the fluorene core of Formula F-b may be a compound with five rings.

In Formula F-b, if U or V is 1, U and V may each independently be a substituted or unsubstituted hydrocarbon ring of 5 to 30 ring-forming carbon atoms, or a substituted or unsubstituted heterocycle of 2 to 30 ring-forming carbon atoms.

[Formula F-c]

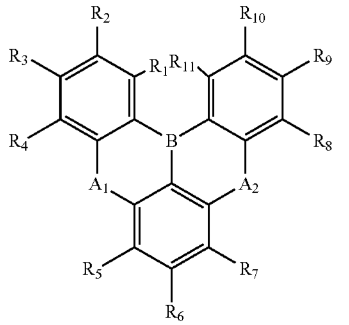

In Formula F-c, $A_1$ and $A_2$ may each independently be O, S, Se, or $N(R_m)$, and $R_m$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In Formula F-c, $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula F-c, $A_1$ and $A_2$ may each independently be combined with the substituents of an adjacent ring to form a fused ring. For example, if $A_1$ and $A_2$ may each independently be $N(R_m)$, $A_1$ may be combined with $R_4$ or $R_5$ to form a ring. For example, $A_2$ may be combined with $R_7$ or $R_8$ to form a ring.

In an embodiment, the emission layer EML may include, as a dopant material, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, and 1,4-bis(N,N-diphenylamino)pyrene), etc.

The emission layer EML may include a phosphorescence dopant material. For example, the phosphorescence dopant may use a metal complex including iridium (Ir), platinum (Pt), osmium (Os), gold (Au), titanium (Ti), zirconium (Zr), hafnium (Hf), europium (Eu), terbium (Tb) or thulium (Tm). For example, iridium (III) bis(4,6-difluorophenylpyridinato-N,C2')picolinate (FIrpic), bis(2,4-difluorophenylpyridinato)-tetrakis(1-pyrazolyl)borate iridium(III) (Fir6), or platinum octaethyl porphyrin (PtOEP) may be used as the phosphorescence dopant. However, embodiments are not limited thereto.

In the organic electroluminescence device ED of an embodiment, as shown in FIG. 3 to FIG. 6, the electron transport region ETR is provided on the emission layer EML. The electron transport region ETR may include at least one of an electron blocking layer HBL, an electron transport layer ETL, and an electron injection layer EIL. However, embodiments are not limited thereto.

The electron transport region ETR may have a layer formed using a single material, a layer formed using different materials, or a multilayer structure having layers formed using different materials.

For example, the electron transport region ETR may have a single layer structure of an electron injection layer EIL or an electron transport layer ETL, or a single layer structure formed using an electron injection material and an electron transport material. In embodiments, the electron transport region ETR may have a single layer structure formed using different materials, or a structure stacked from the emission layer EML of an electron transport layer ETL/an electron injection layer EIL, or a hole blocking layer HBL/an electron transport layer ETL/an electron injection layer EIL, without limitation. A thickness of the electron transport region ETR may be, for example, in a range of about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

The electron transport region ETR may include a compound represented by Formula ET-1 below.

[Formula ET-1]

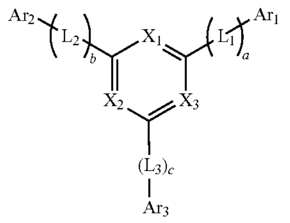

In Formula ET-1, at least one of $X_1$ to $X_3$ may be N, and the remainder of $X_1$ to $X_3$ may be $C(R_a)$. $R_a$ may be a hydrogen atom, a deuterium atom, a substituted or unsubstituted alkyl of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In Formula ET-1, $Ar_1$ to $Ar_3$ may each independently be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group of 6 to 30 ring-forming carbon atoms, or a substituted or unsubstituted heteroarylene group of 2 to 30 ring-forming carbon atoms. In Formula ET-1, if a to c are 2 or more, $L_1$ to $L_3$ may each independently be a substituted or unsubstituted arylene group of 6 to 30 ring-forming carbon atoms, or a substituted or unsubstituted heteroarylene group of 2 to 30 ring-forming carbon atoms.

If the electron transport region ETR includes an electron transport layer ETL, the electron transport region ETR may include an anthracene-based compound. However, embodiments are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($Bebq_2$), 9,10-di(naphthalene-2-yl)anthracene (ADN), 1,3-bis[3,5-di(pyridin-3-yl)phenyl]benzene (BmPyPhB), and mixtures thereof, without limitation.

The electron transport region ETR may include at least one selected from Compounds ET1 to ET36 below.

-continued
ET1
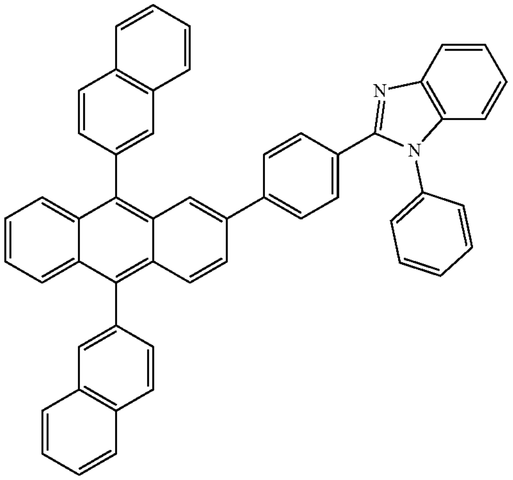
ET2
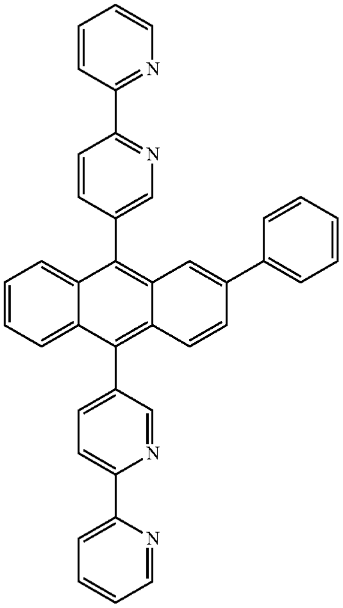
ET3
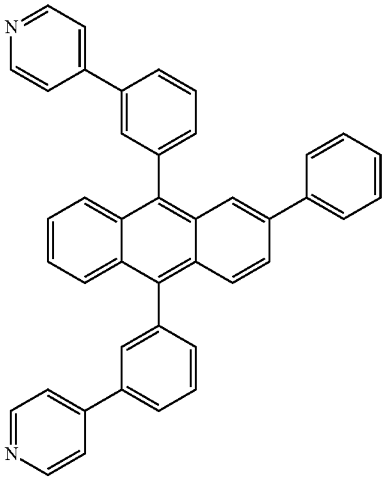
ET4
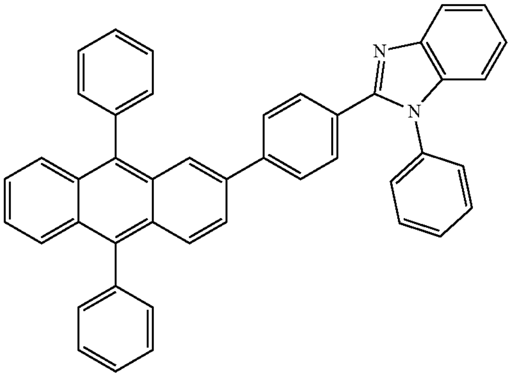
ET5
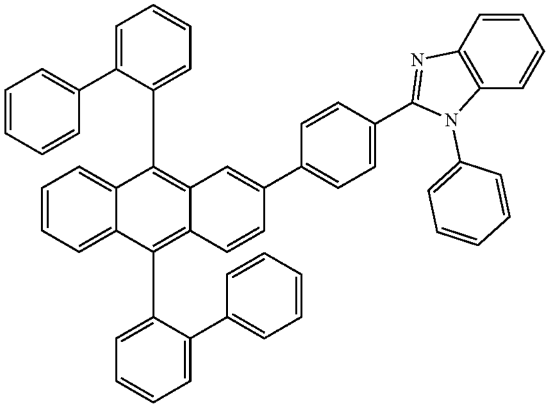
ET6
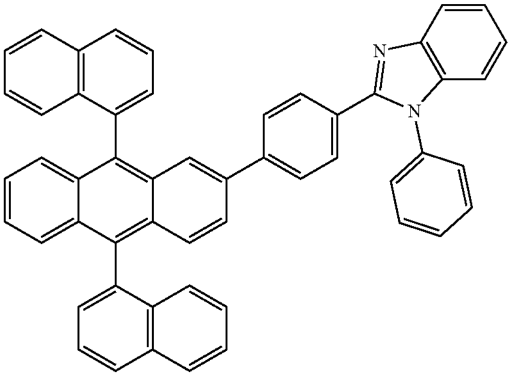

-continued
ET7
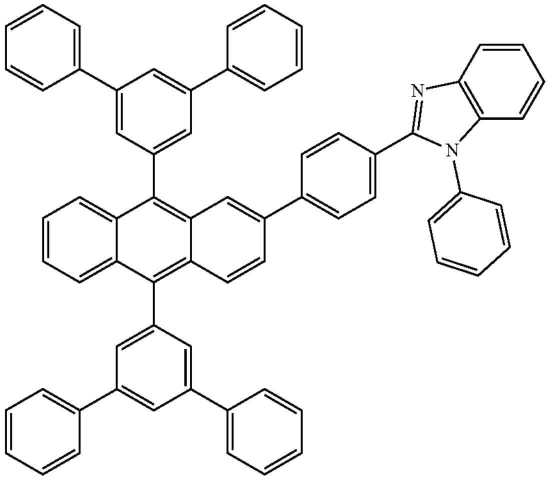
ET8
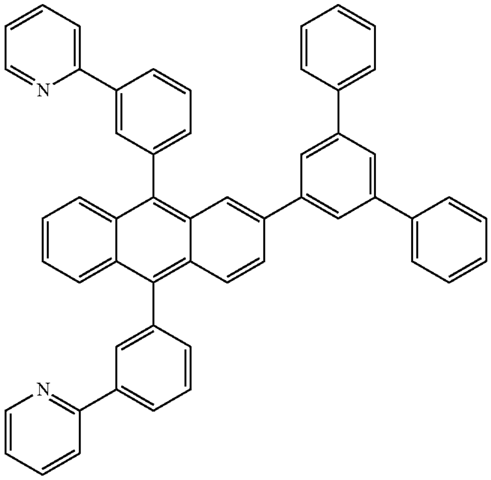
ET9
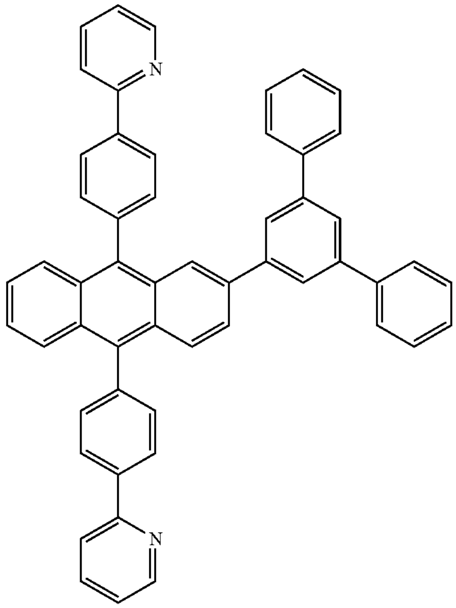
-continued
ET10
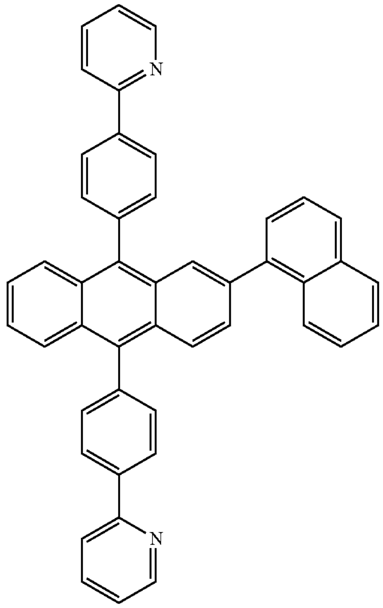
ET11
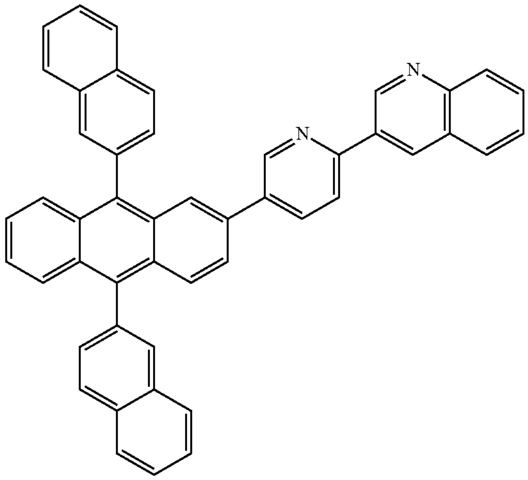
ET12
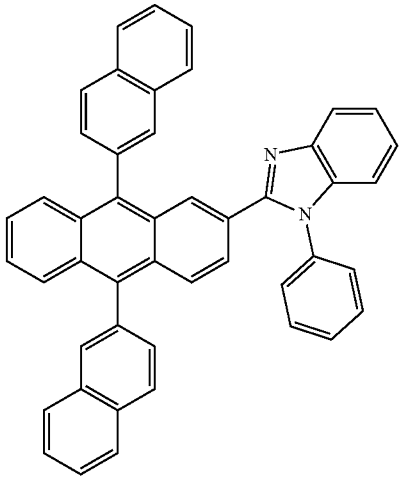

-continued
ET13
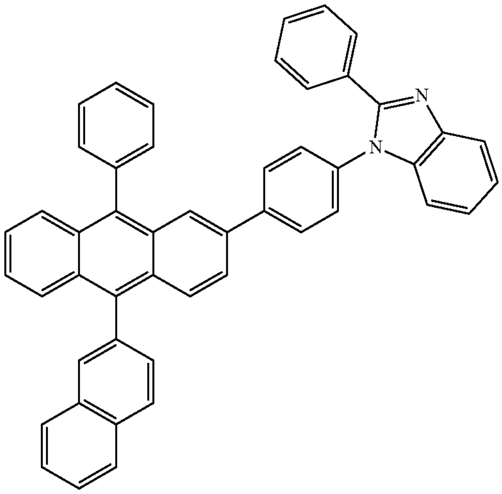
ET14
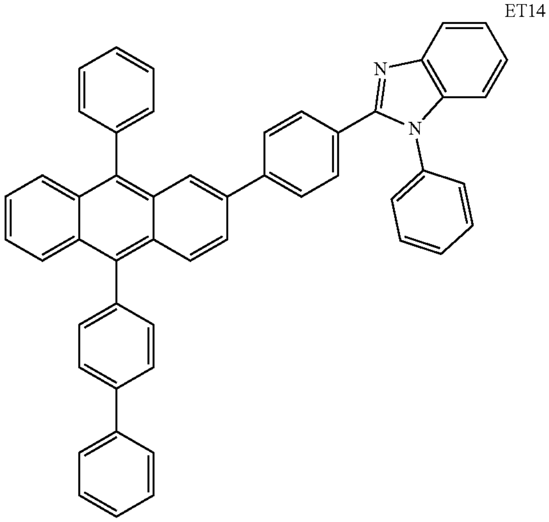
ET15
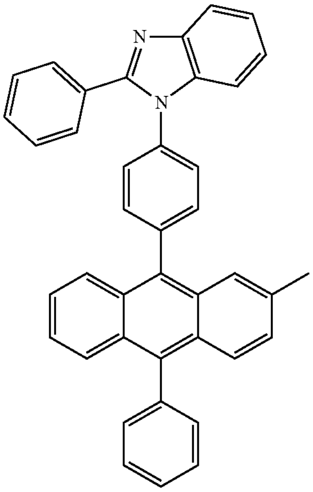
-continued
ET16
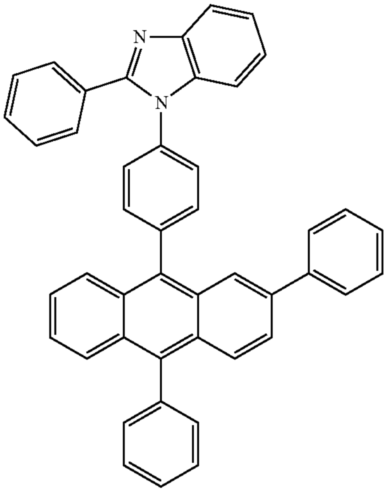
ET17
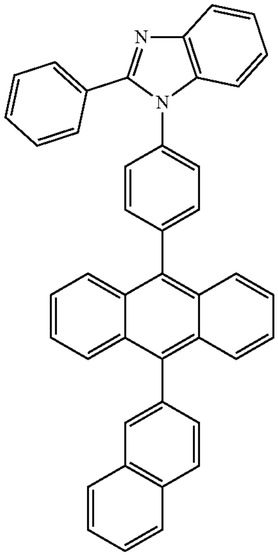
ET18
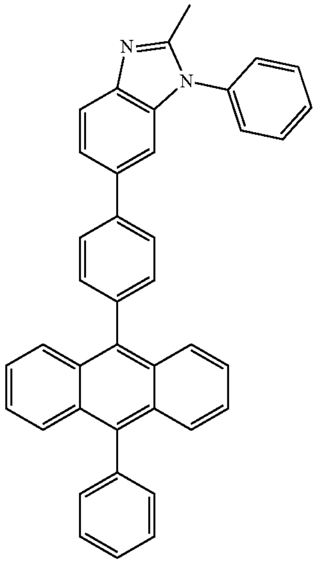

-continued
ET19
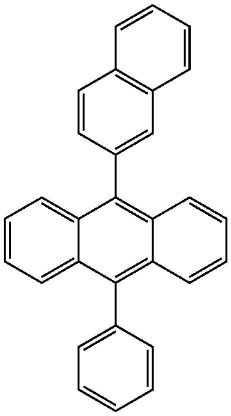
ET20
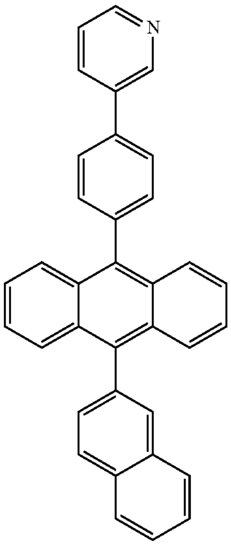
ET21
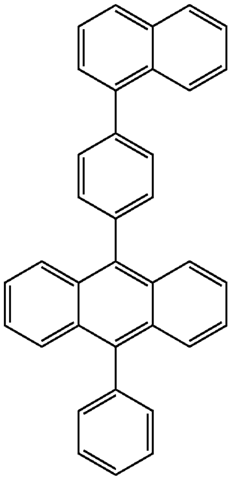
-continued
ET22
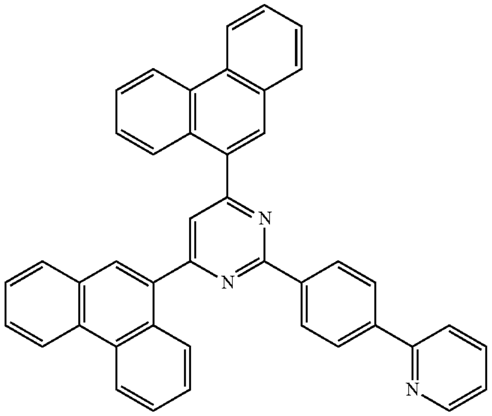
ET23
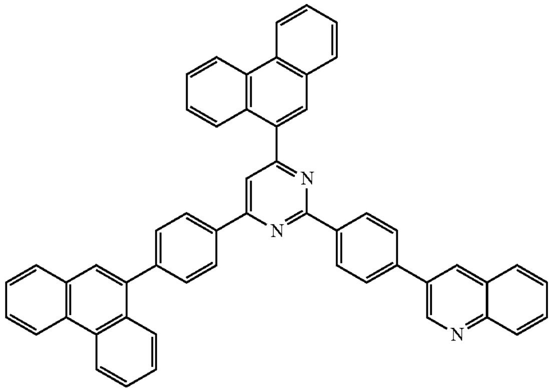
ET24
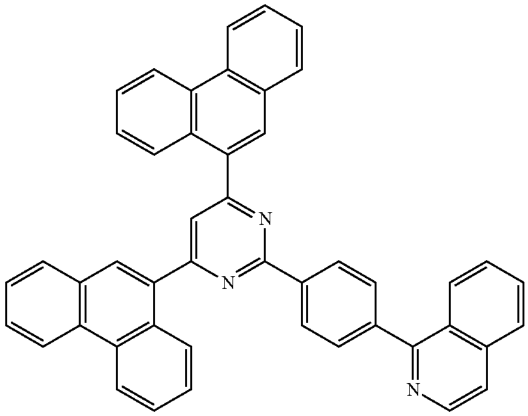

-continued
ET25
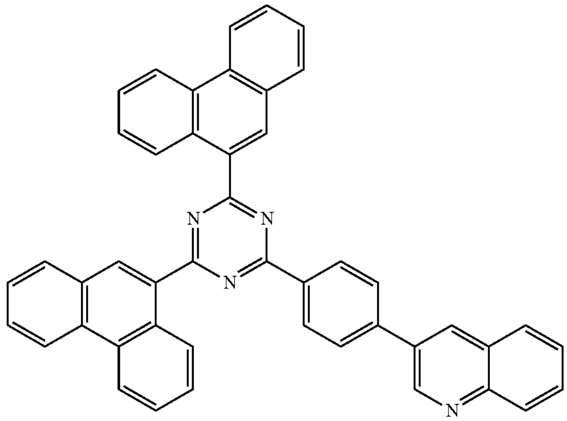
ET26
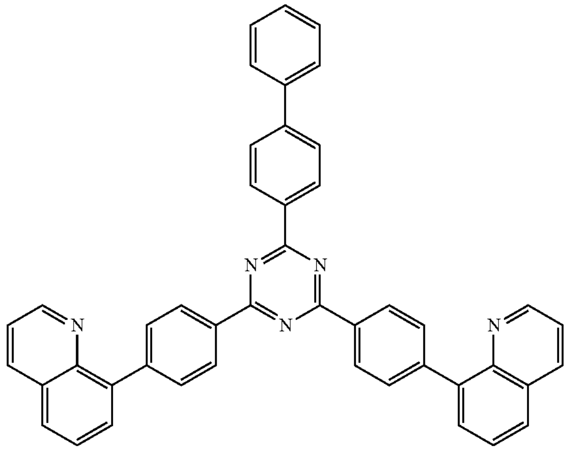
ET27
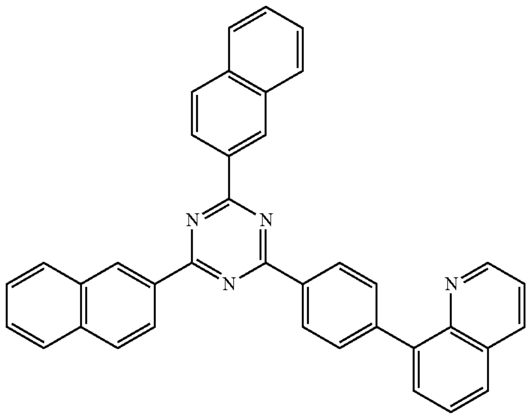
-continued
ET28
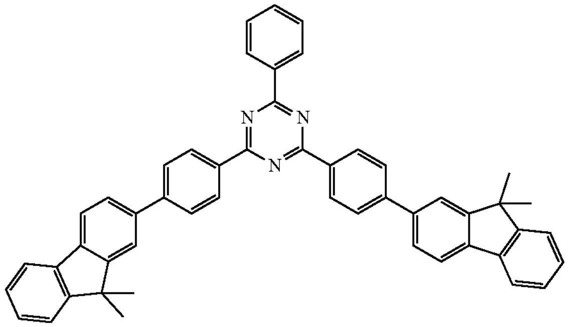
ET29
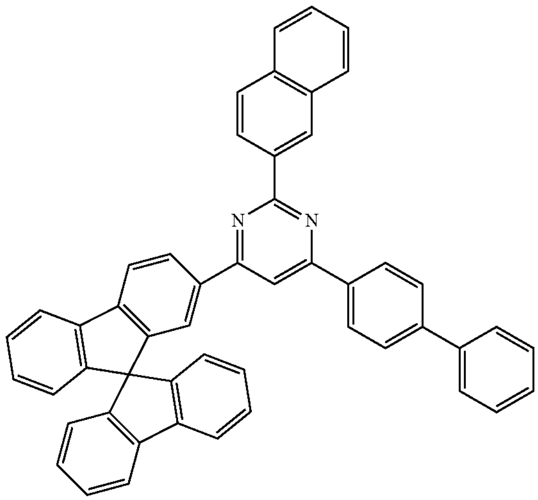
ET30
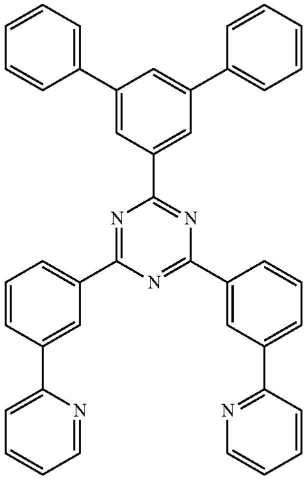

-continued

ET31

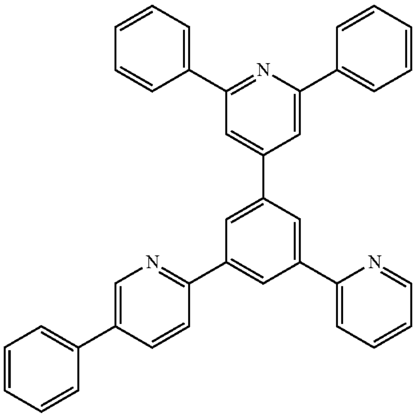

ET32

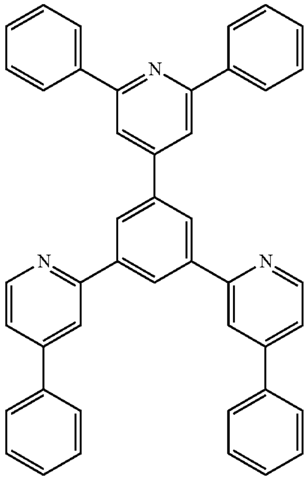

ET33

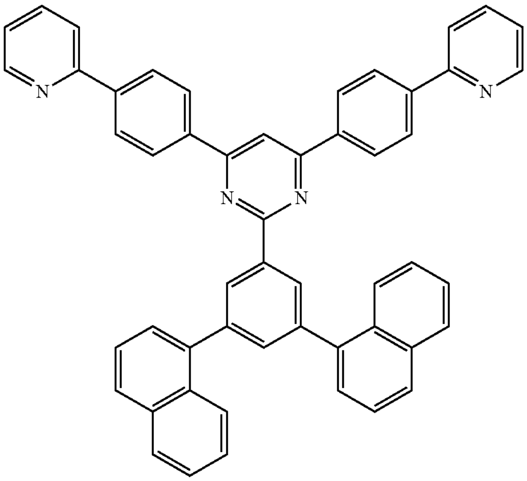

-continued

ET34

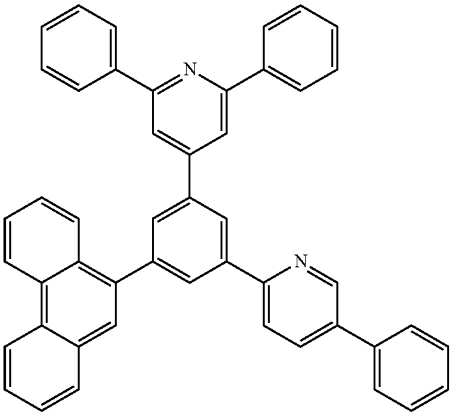

ET35

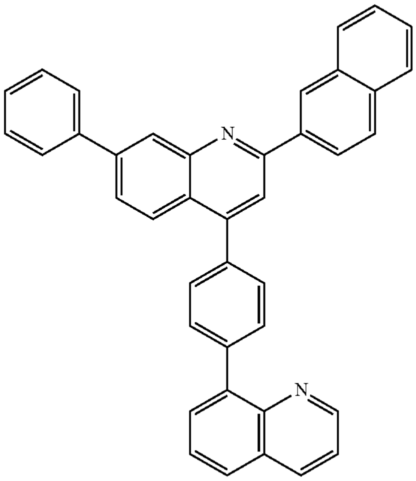

ET36

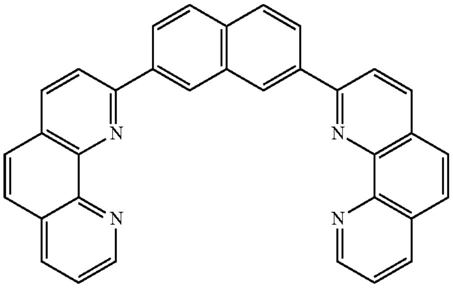

The electron transport region ETR may include a metal halide such as LiF, NaCl, CsF, RbCl, RbI, CuI and KI, a lanthanide metal such as Yb, or a co-depositing material of the metal halide and the lanthanide metal. For example, the electron transport region ETR may include KI:Yb, RbI:Yb, etc., as the co-depositing material. The electron transport region ETR may include a metal oxide such as $Li_2O$ and BaO, or 8-hydroxy-lithium quinolate (Liq). However, embodiments are not limited thereto. The electron transport region ETR also may be formed using a mixture material of an electron transport material and an insulating organo metal salt. The organo metal salt may be a material having an energy band gap equal to or greater than about 4 eV. For example, the organo metal salt may include metal acetates, metal benzoates, metal acetoacetates, metal acetylacetonates, or metal stearates. However, embodiments are not limited thereto.

The electron transport region ETR may include the compounds of the electron transport region in at least one of an electron injection layer EIL, an electron transport layer ETL, and a hole blocking layer HBL.

If the electron transport region ETR includes an electron transport layer ETL, a thickness of the electron transport layer ETL may be in a range of about 100 Å to about 1,000 Å. For example, the thickness of the electron transport layer ETL may be in a range of about 150 Å to about 500 Å. If the thickness of the electron transport layer ETL satisfies the above-described range, satisfactory electron transport properties may be obtained without substantial increase of a driving voltage. If the electron transport region ETR includes an electron injection layer EIL, a thickness of the electron injection layer EIL may be in a range of about 1 Å to about 100 Å. For example, the thickness of the electron injection layer EIL may be in a range of about 3 Å to about 90 Å. If the thickness of the electron injection layer EIL satisfies the above described range, satisfactory electron injection properties may be obtained without inducing substantial increase of a driving voltage.

The second electrode EL2 is provided on the electron transport region ETR. The second electrode EL2 may be a common electrode. The second electrode EL2 may be a cathode or an anode, but embodiments are not limited thereto. For example, if the first electrode EL1 is an anode, the second cathode EL2 may be a cathode, and if the first electrode EL1 is a cathode, the second electrode EL2 may be an anode.

The second electrode EL2 may be a transmissive electrode, a transflective electrode or a reflective electrode. If the second electrode EL2 is a transmissive electrode, the second electrode EL2 may include a transparent metal oxide, for example, ITO, IZO, ZnO, ITZO, etc.

If the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, compounds thereof, or mixtures thereof (for example, AgMg, AgYb, or MgAg). In an embodiment, the second electrode EL2 may have a multi-layered structure including a reflective layer or a transflective layer formed using the above-described materials, and a transparent conductive layer formed using ITO, IZO, ZnO, ITZO, etc. For example, the second electrode EL2 may include the aforementioned metal materials, combinations of two or more metal materials selected from the aforementioned metal materials, or oxides of the aforementioned metal materials.

Although not shown in the drawings, the second electrode EL2 may be electrically connected to an auxiliary electrode. If the second electrode EL2 is electrically connected to the auxiliary electrode, the resistance of the second electrode EL2 may decrease.

In an embodiment, the organic electroluminescence device ED may further include a capping layer CPL disposed on the second electrode EL2. The capping layer CPL may include a multilayer or a single layer.

In an embodiment, the capping layer CPL may include an organic layer or an inorganic layer. For example, if the capping layer CPL includes an inorganic material, the inorganic material may include an alkali metal compound such as LiF, an alkaline earth metal compound such as $MgF_2$, SiON, SiNx, SiOy, etc.

For example, if the capping layer CPL includes an organic material, the organic material may include α-NPD, NPB, TPD, m-MTDATA, $Alq_3$, CuPc, N4,N4,N4',N4'-tetra(biphenyl-4-yl)biphenyl-4,4'-diamine (TPD15), 4,4',4"-tris(carbazol sol-9-yl) triphenylamine (TCTA), etc., or may include an epoxy resin, or acrylate such as methacrylate. A capping layer CPL may include at least one of Compounds P1 to P5 below, but embodiments are not limited thereto.

P1

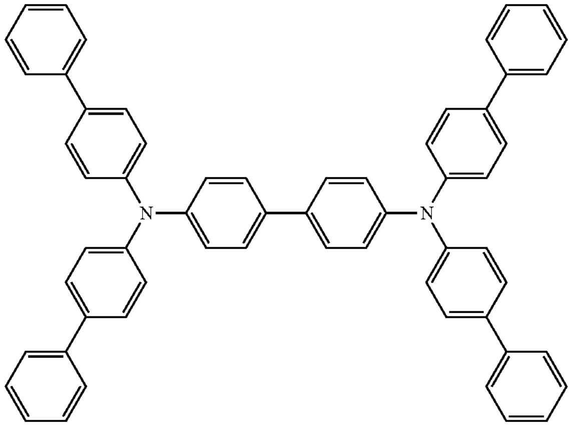

P2

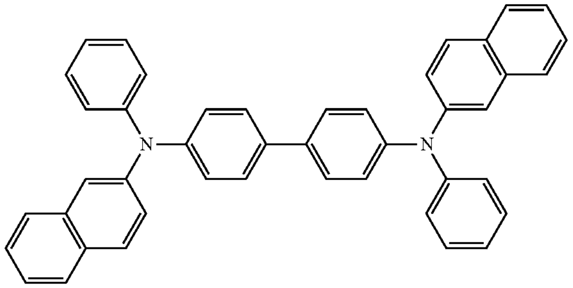

P3

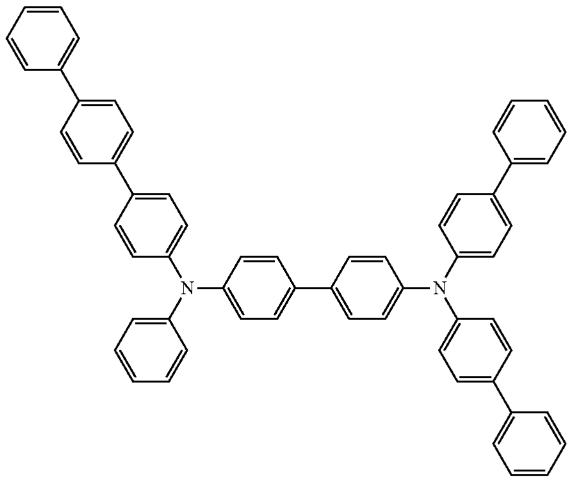

-continued

P4

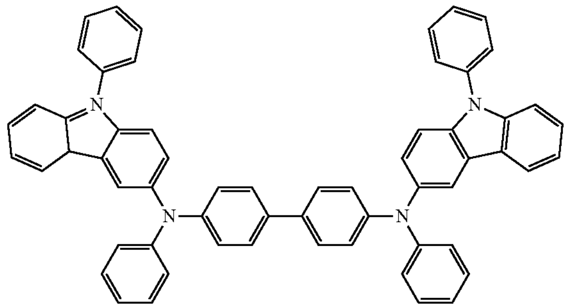

P5

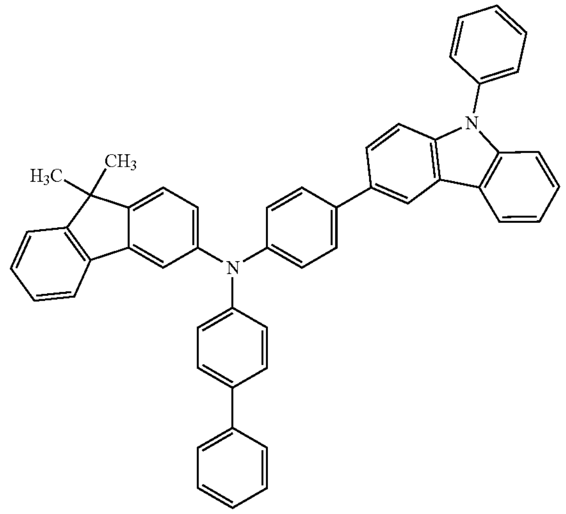

A refractive index of the capping layer CPL may be equal to or greater than about 1.6. For example, the refractive index of the capping layer CPL with respect to light in a wavelength range of about 550 nm to about 660 nm may be equal to or greater than about 1.6.

Figure 7:
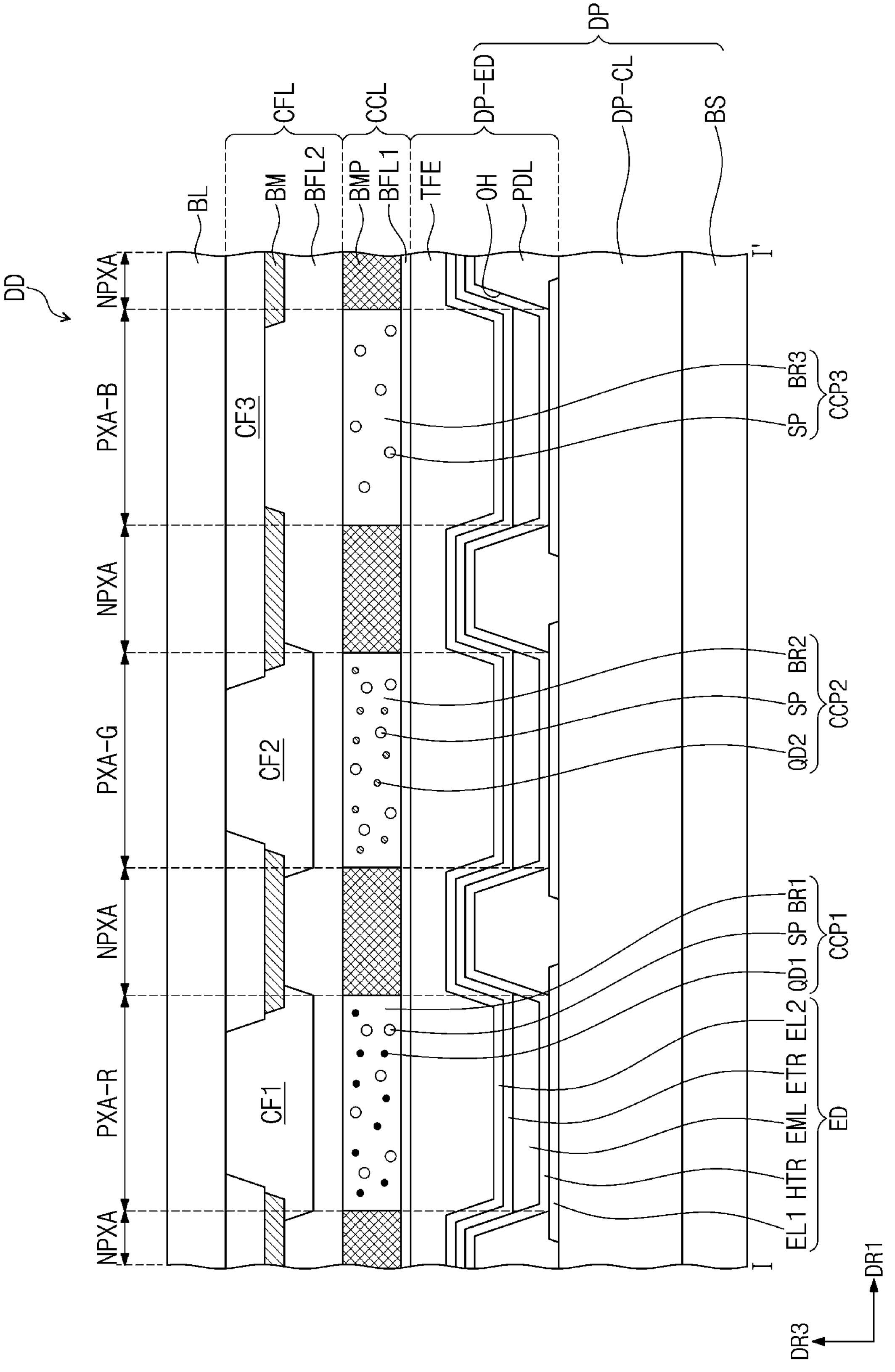
FIG. 7 is a schematic cross-sectional view showing a display apparatus according to an embodiment.
Figure 8:
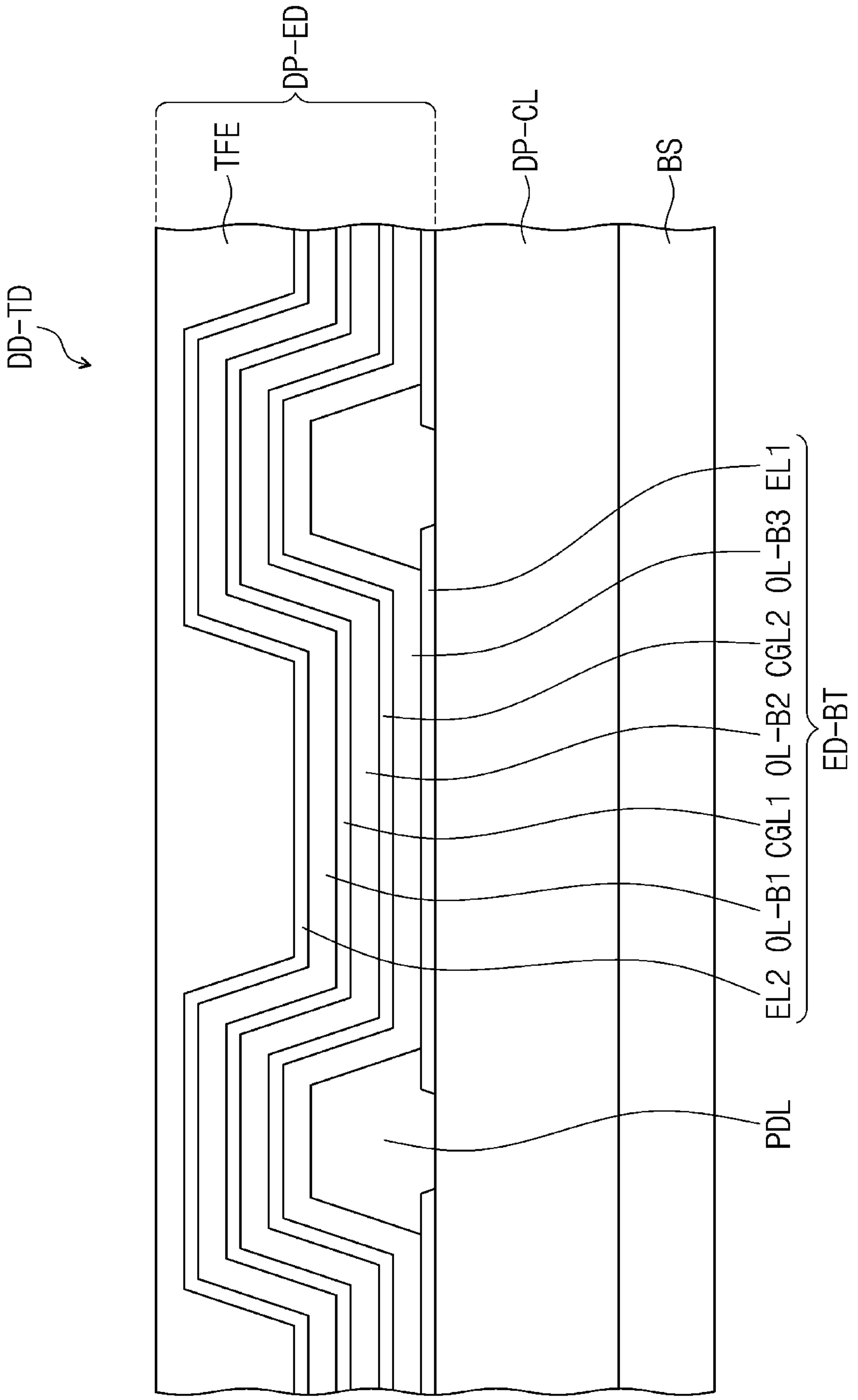
FIG. 8 is a schematic cross-sectional view showing a display apparatus according to an embodiment.

FIG. 7 and FIG. 8 are each a schematic cross-sectional view of display apparatuses according to embodiments, respectively. In the explanation on the display apparatuses of embodiments, referring to FIG. 7 and FIG. 8, the overlapping parts with respect to the explanation on FIG. 1 to FIG. 6 will not be explained again, and the different features will be explained.

Referring to FIG. 7, the display apparatus DD according to an embodiment may include a display panel DP including a display device layer DP-ED, a light controlling layer CCL disposed on the display panel DP, and a color filter layer CFL.

In an embodiment shown in FIG. 7, the display panel DP includes a base layer BS, a circuit layer DP-CL provided on the base layer BS, and a display device layer DP-ED, and the display device layer DP-ED may include an organic electroluminescence device ED.

The organic electroluminescence device ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. The same structures of the organic electroluminescence devices of FIG. 3 to FIG. 6 may be applied to the structure of the organic electroluminescence device ED shown in FIG. 7.

Referring to FIG. 7, the emission layer EML may be disposed in an opening portion OH defined in a pixel definition layer PDL. For example, the emission layer EML divided by the pixel definition layer PDL and correspondingly provided to each of luminous areas PXA-R, PXA-G, and PXA-B may emit light in a same wavelength region. In the display apparatus DD of an embodiment, the emission layer EML may emit blue light. Although not shown in the drawings, in an embodiment, the emission layer EML may be provided as a common layer for all luminous areas PXA-R, PXA-G, and PXA-B.

The light controlling layer CCL may be disposed on the display panel DP. The light controlling layer CCL may include a light converter. The light converter may include a quantum dot or a phosphor. The light converter may transform the wavelength of provided light and emit the converted light. For example, the light controlling layer CCL may be a layer including a quantum dot or a layer including a phosphor.

The quantum dot may be selected from a II-VI group compound, a III-VI group compound, a I-III-VI group compound, a III-V group compound, a III-II-V group compound, a IV-VI group compound, a IV group element, a IV group compound, and combinations thereof.

The II-VI group compound may be selected from the group consisting of a binary compound selected from the group consisting of CdSe, CdTe, CdS, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The III-VI group compound may include a binary compound such as $In_2S_3$ and $In_2Se_3$, a ternary compound such as $InGaS_3$ and $InGaSe_3$, or optional combinations thereof.

The I-III-VI group compound may be selected from a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$, and mixtures thereof; or a quaternary compound such as $AgInGaS_2$ and $CuInGaS_2$.

The III-V group compound may be selected from the group consisting of a binary compound selected from the group consisting of GaN, GaP, GaAs, GaSb, AlN, AlP, AlAs, AlSb, InN, InP, InAs, InSb, and mixtures thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. The III-V group compound may further include a II group metal. For example, InZnP, etc. may be selected as a III-II-V group compound.

The IV-VI group compound may be selected from the group consisting of a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe, and mixtures thereof; and a quaternary compound selected from the group consisting of SnPbSSe, SnPbSeTe, SnPbSTe, and mixtures thereof. The IV group element may be selected from the group consisting of Si, Ge, and a mixture thereof. The IV group compound may be a binary compound selected from the group consisting of SiC, SiGe, and a mixture thereof.

A binary compound, a ternary compound, or a quaternary compound may be present at a uniform concentration in a particle or may be present at a partially different concentration distribution state in the same particle. In an embodiment, the quantum dot may have a core/shell structure in which one quantum dot surrounds another quantum dot. An interface of the core and the shell may have a concentration gradient in which the concentration of an element present in the shell decreases toward the core.

In embodiments, the quantum dot may have the above-described core-shell structure including a core including a nanocrystal and a shell surrounding the core. The shell of the quantum dot may be a protection layer that prevents chemical deformation of the core to maintain semiconductor properties and/or may be a charging layer for imparting the quantum dot with electrophoretic properties. The shell may be a single layer or a multilayer. The interface of the core and shell may have a decreasing concentration gradient of elements present in the shell toward the core. Examples of the shell of the quantum dot may include a metal or non-metal oxide, a semiconductor compound, or combinations thereof.

For example, the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$, but embodiments are not limited thereto.

In an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

The quantum dot may have a full width of half maximum (FWHM) of an emission wavelength spectrum equal to or less than about 45 nm. For example, the quantum dot may have a FWHM of an emission wavelength spectrum equal to or less than about 40 nm. For example, the quantum dot may have a FWHM of an emission wavelength spectrum equal to or less than about 30 nm. Within this range, color purity or color reproducibility may be improved. Light emitted through the quantum dot may be emitted in all directions, and light viewing angle properties may be improved.

The form of the quantum dot may be one that is generally used in the art, without specific limitation. For example, the quantum dot may have a spherical, a pyramidal, a multi-arm, or a cubic shape, or the quantum dot may be in the form of a nanoparticle, a nanotube, a nanowire, a nanofiber, a nanoplate particle, etc.

The quantum dot may control the color of light emitted according to a particle size thereof, and accordingly, the quantum dot may have various emission colors such as blue, red, and green.

The light controlling layer CCL may include light controlling parts CCP1, CCP2, and CCP3. The light controlling parts CCP1, CCP2, and CCP3 may be separated from one another.

Referring to FIG. 7, a partition pattern BMP may be disposed between the separated light controlling parts CCP1, CCP2, and CCP3, but embodiments are not limited thereto. In FIG. 7, the partition pattern BMP does not overlap the light controlling parts CCP1, CCP2 and CCP3, but in an embodiment, at least a portion of the edge of the light controlling parts CCP1, CCP2, and CCP3 may be overlap the partition pattern BMP.

The light controlling layer CCL may include a first light controlling part CCP1 including a first quantum dot QD1 converting first color light provided from the organic electroluminescence device ED into second color light, a second light controlling part CCP2 including a second quantum dot QD2 converting first color light into third color light, and a third light controlling part CCP3 transmitting first color light.

In an embodiment, the first light controlling part CCP1 may provide red light which is the second color light, and the second light controlling part CCP2 may provide green light which is the third color light. The third color controlling part CCP3 may transmit and provide blue light which is the first color light provided from the organic electroluminescence device ED. For example, the first quantum dot QD1 may be a red quantum dot, and the second quantum dot QD2 may be a green quantum dot. The same description above with respect to quantum dots may be applied to quantum dots QD1 and QD2.

The light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include a quantum dot but include the scatterer SP.

The scatterer SP may be an inorganic particle. For example, the scatterer SP may include at least one of $TiO_2$, ZnO, $Al_2O_3$, $SiO_2$, and hollow silica. The scatterer SP may include at least one of $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

The light controlling layer CCL may include a barrier layer BFL1. The barrier layer BFL1 may block penetration of moisture and/or oxygen (hereinafter, will be referred to as "humidity/oxygen"). The barrier layer BFL1 may be disposed on the light controlling parts CCP1, CCP2, and CCP3 to block the exposure of the light controlling parts CCP1, CCP2, and CCP3 to humidity/oxygen. The barrier layer BFL1 may cover the light controlling parts CCP1, CCP2, and CCP3. The barrier layer BFL2 may be provided between the light controlling parts CCP1, CCP2, and CCP3 and a color filter layer CFL.

The barrier layers BFL1 and BFL2 may include at least one inorganic layer. For example, the barrier layers BFL1 and BFL2 may be formed by including an inorganic material. For example, the barrier layers BFL1 and BFL2 may be formed by including silicon nitride, aluminum nitride, zirconium nitride, titanium nitride, hafnium nitride, tantalum nitride, silicon oxide, aluminum oxide, titanium oxide, tin oxide, cerium oxide and silicon oxynitride or a metal thin film securing light transmittance. The barrier layers BFL1 and BFL2 may further include an organic layer. The barrier layers BFL1 and BFL2 may be composed of a single layer or of multiple layers.

In the display apparatus DD of an embodiment, the color filter layer CFL may be disposed on the light controlling layer CCL. For example, the color filter layer CFL may be disposed directly on the light controlling layer CCL. In an embodiment, the barrier layer BFL2 may be omitted.

The color filter layer CFL may include a light blocking part BM and filters CF1, CF2, and CF3. The color filter layer CFL may include a first filter CF1 transmitting second color light, a second filter CF2 transmitting third color light, and a third filter CF3 transmitting first color light. For example, the first filter CF1 may be a red filter, the second filter CF2 may be a green filter, and the third filter CF3 may be a blue filter. Each of the filters CF1, CF2, and CF3 may include a polymer photosensitive resin and a pigment or dye. The first filter CF1 may include a red pigment or dye, the second filter CF2 may include a green pigment or dye, and the third filter CF3 may include a blue pigment or dye. However, embodiments are not limited thereto, and the third filter CF3 may not include a pigment or dye. The third filter CF3 may include a polymer photosensitive resin and not include a pigment or dye. The third filter CF3 may be transparent. The third filter CF3 may be formed using a transparent photosensitive resin.

In an embodiment, the first filter CF1 and the second filter CF2 may be yellow filters. The first filter CF1 and the second filter CF2 may be provided in one body without distinction.

The light blocking part BM may be a black matrix. The light blocking part BM may be formed by including an organic light blocking material or an inorganic light blocking material including a black pigment or black dye. The light blocking part BM may prevent light leakage phenomenon and may divide the boundaries among adjacent filters CF1, CF2, and CF3. In an embodiment, the light blocking part BM may be formed as a blue filter.

Each of the first to third filters CF1, CF2, and CF3 may be disposed corresponding to each of a red luminous area PXA-R, green luminous area PXA-G, and blue luminous area PXA-B, respectively.

A base substrate BL may be disposed on the color filter layer CFL. The base substrate BL may provide a base surface on which the color filter layer CFL, the light controlling layer CCL, etc. are disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawing, in an embodiment, the base substrate BL may be omitted.

FIG. 8 is a schematic cross-sectional view showing a portion of the display apparatus according to an embodiment. In FIG. 8, the schematic cross-sectional view of a portion corresponding to the display panel DP in FIG. 7 is shown. In a display apparatus DD-TD of an embodiment, the organic electroluminescence device ED-BT may include multiple light emitting structures OL-B1, OL-B2, and OL-B3. The organic electroluminescence device ED-BT may include a first electrode EL1 and an oppositely disposed second electrode EL2, and the multiple light emitting structures OL-B1, OL-B2, and OL-B3 stacked in order in a thickness direction and provided between the first electrode EL1 and the second electrode EL2. Each of the light emitting structures OL-B1, OL-B2, and OL-B3 may include an emission layer EML (FIG. 7), and a hole transport region HTR and an electron transport region ETR disposed with the emission layer EML (FIG. 7) therebetween.

For example, the organic electroluminescence device ED-BT included in the display apparatus DD-TD of an embodiment may be an organic electroluminescence device of a tandem structure including multiple emission layers.

In an embodiment shown in FIG. 8, light emitted from the light emitting structures OL-B1, OL-B2, and OL-B3 may be all blue light. However, embodiments are not limited thereto, and the wavelength regions of light emitted from the light emitting structures OL-B1, OL-B2, and OL-B3 may be different from each other. For example, the organic electroluminescence device ED-BT including the multiple light emitting structures OL-B1, OL-B2, and OL-B3 emitting light in different wavelength regions may emit white light.

Charge generating layers CGL1 and CGL2 may be disposed between neighboring light emitting structures OL-B1, OL-B2, and OL-B3. The charge generating layers CGL1 and CGL2 may each independently include a p-type charge generating layer and/or an n-type charge generating layer.

Hereinafter, the embodiments will be explained referring to the Example Compounds and the Comparative Compounds. These embodiments are only illustrations to assist the understanding of the disclosure and the scope thereof is not limited thereto.

EXAMPLES

1. Synthesis of Polycyclic Compound

The polycyclic compound according to an embodiment will be explained with reference to the synthesis methods of Compound 6, Compound 26, Compound 44, Compound 72, and Compound 116 in Compound Group 1. The synthesis methods of the polycyclic compounds explained below are embodiments, and the synthesis method of the polycyclic compound of an embodiment is not limited thereto.

<Synthesis of Compound 1>

Polycyclic Compound 1 according to an embodiment may be synthesized, for example, by the steps in Reaction 1 below.

[Reaction 1]

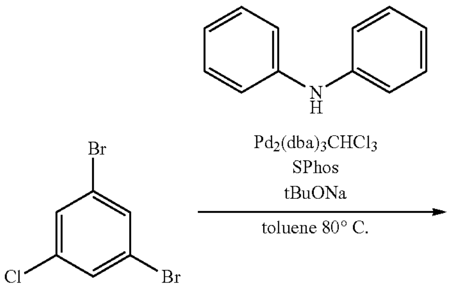

-continued
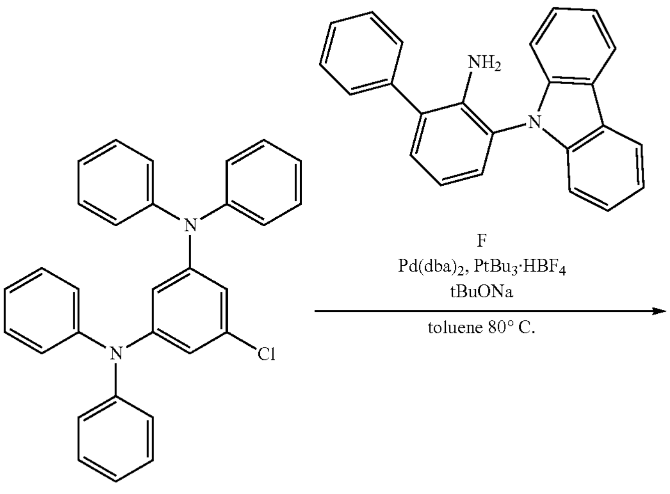
A
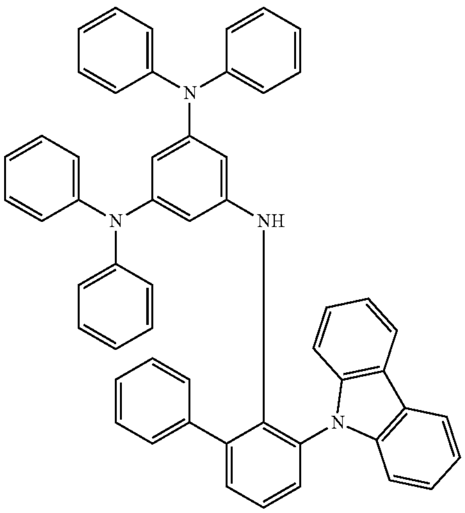
B
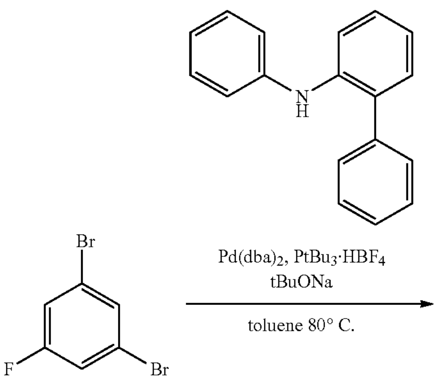

-continued
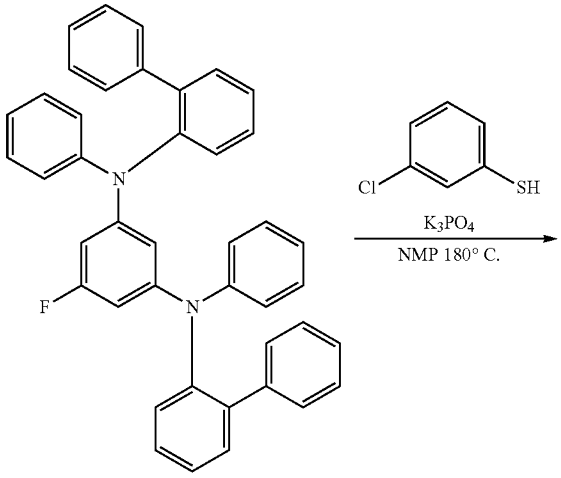
C
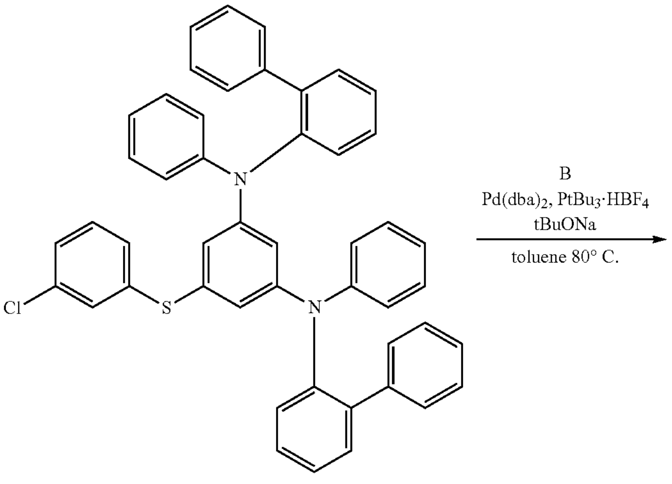
D
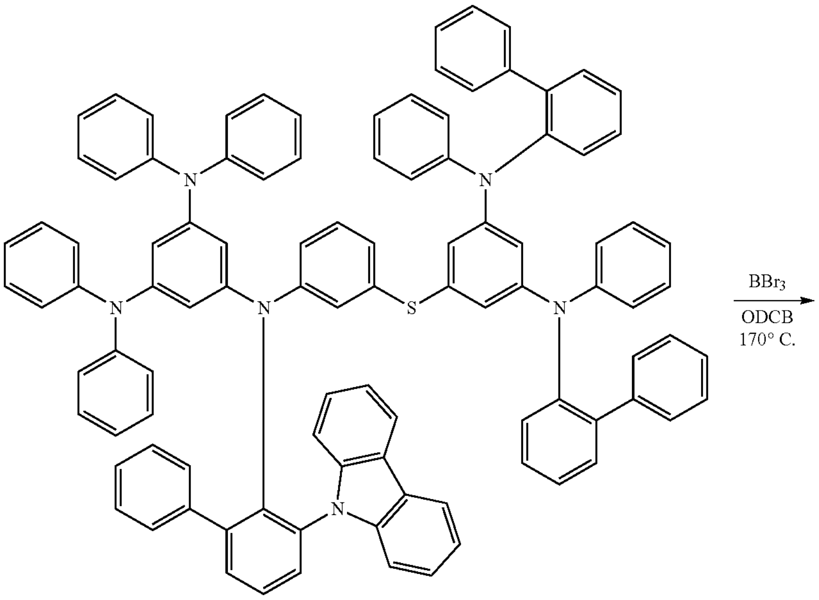
E

-continued

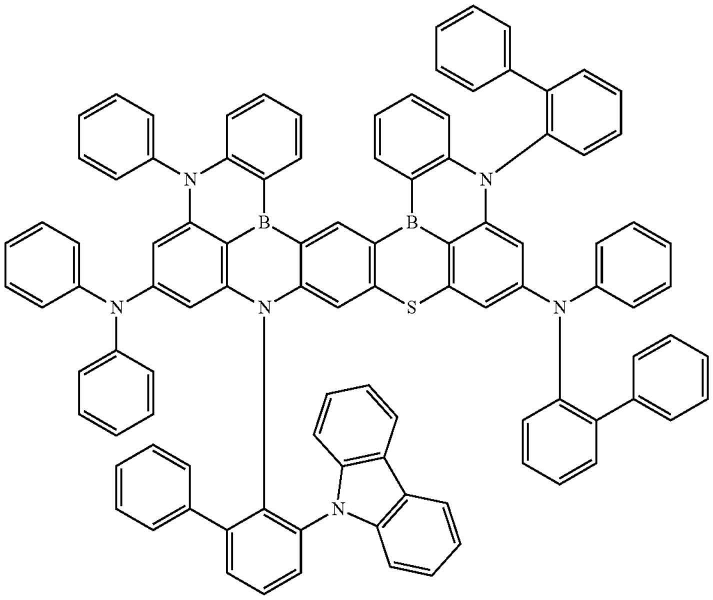

1

(1) Synthesis of Compound A

Under an Ar atmosphere, 1,3-dibromo-5-chlorobenzene (25.0 g, 92.5 mmol), diphenylamine (31.3 g, 185 mmol), tris(dibenzylideneacetone) dipalladium (0)-chloroform adduct ($Pd_2(dba)_3CHCl_3$, 1.78 g, 1.94 mmol), 2-dicyclohexylphosphino-2',6'-dimethoxybiphenyl (SPhos, 1.59 g, 3.88 mmol), and tBuONa (27.1 g, 282 mmol) were added to 400 ml of toluene and reacted at about 80° C. for about 6 hours. After cooling, water was added, celite filtering was performed, liquid layers were separated, and an organic layer was concentrated. The crude product was separated by silica gel column chromatography to obtain Compound A (33.1 g, yield 80%). Through FAB MS measurement, the molecular weight of Compound A was 447.

(2) Synthesis of Compound B

Under an Ar atmosphere, A (33.0 g, 73.8 mmol), F (12.5 g, 73.8 mmol), $Pd(dba)_2$ (1.54 g, 2.68 mmol), $P(t\text{-}Bu)_3HBF_4$ (1.56 g, 5.40 mmol) and tBuONa (9.68 g, 100 mmol) were added to 300 ml of toluene and heated and stirred at about 80° C. for about 2 hours. Water was added, celite filtering was performed, liquid layers were separated, and an organic layer was concentrated. The crude product was separated by silica gel column chromatography to obtain Compound B (28.0 g, yield 65%). Through FAB MS measurement, the molecular weight of Compound B was 745.

(3) Synthesis of Compound C

Under an Ar atmosphere, 1,3-dibromo-5-fluorobenzene (50.0 g, 197 mmol), N-phenyl-biphenyl-2-amine (70.0 g, 414 mmol), $Pd(dba)_2$ (5.66 g, 9.85 mmol), $P(t\text{-}Bu)_3HBF_4$ (2.86 g, 9.85 mmol), and tBuONa (66.2 g, 689 mmol) were added to 700 ml of toluene and heated and stirred at about 80° C. for about 2 hours. Water was added, celite filtering was performed, liquid layers were separated, and an organic layer was concentrated. The crude product was separated by silica gel column chromatography to obtain Compound C (74.6 g, yield 88%). Through FAB MS measurement, the molecular weight of Compound C was 583.

(4) Synthesis of Compound D

Under an Ar atmosphere, Compound C (25.0 g, 58.0 mmol), 3-chlorobenzenethiol (10.9 g, 75.5 mmol), and $K_3PO_4$ (49.3 g, 232 mmol) were added to 1-methyl-2-pyrrolidone (NMP, 250 ml), and heated and stirred at about 170° C. for about 10 hours. After cooling, water and toluene were added, liquid layers were separated, and an organic layer was concentrated. The crude product was separated by silica gel column chromatography to obtain Compound D (19.3 g, yield 60%). Through FAB MS measurement, the molecular weight of Compound D was 707.

(5) Synthesis of Compound E

Compound E (29.7 g, yield 79%) was obtained from Compound D (19.0 g, 34.2 mmol) and Compound B (15.3 g, 34.2 mmol) by performing the same method as the synthesis of Compound B. Through FAB MS measurement, the molecular weight of Compound E was 1416.

(6) Synthesis of Compound 1

Under an Ar atmosphere, Compound E (29.0 g, 26.4 mmol) was dissolved in 1,2-dichlorobenzene (ODCB, 380 ml), and $BBr_3$ (39.7 g, 158 mmol) was added thereto, followed by heating and stirring at about 180° C. for about 10 hours. After cooling to room temperature, N,N-diisopropylethylamine (110 g, 851 mmol) was added, water was added, filtering with celite was performed, liquid layers were separated, and an organic layer was concentrated. The crude product was separated by silica gel column chromatography to obtain Compound 1 (8.82 g, yield 30%). Through FAB MS measurement, the molecular weight of Compound 1 was 1431. After purifying through sublimation purification (395° C., $7.5\times10^{-3}$ Pa), the evaluation on a device was conducted.

<Synthesis of Compound 2>

Polycyclic Compound 2 according to an embodiment may be synthesized, for example, by the steps in Reaction 2 below.

[Reaction 2]

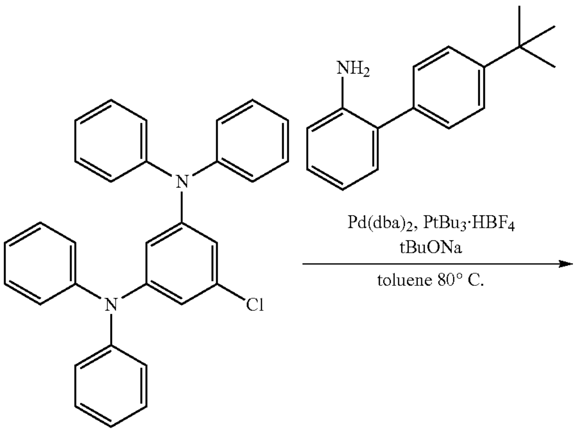

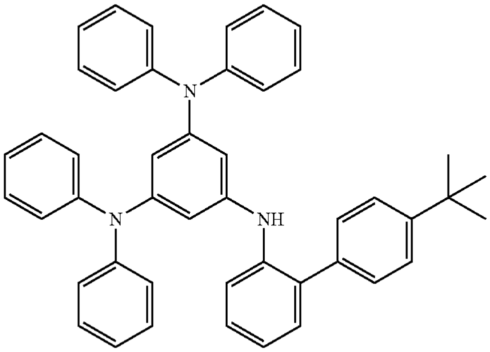

F

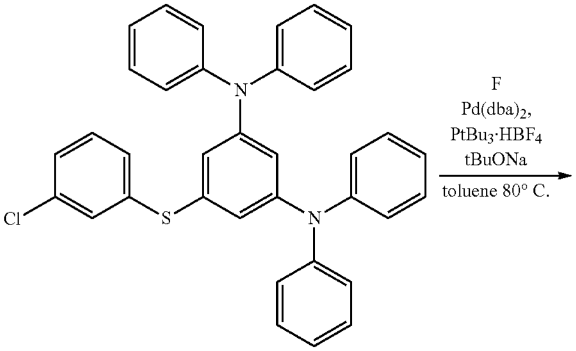

G

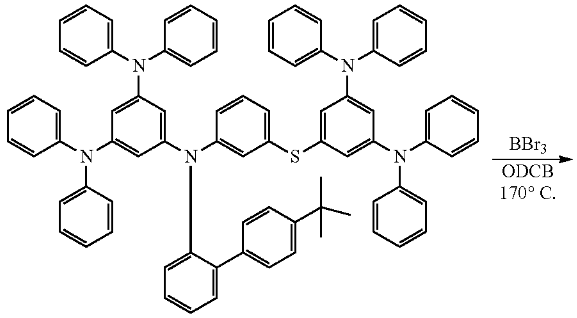

H

-continued

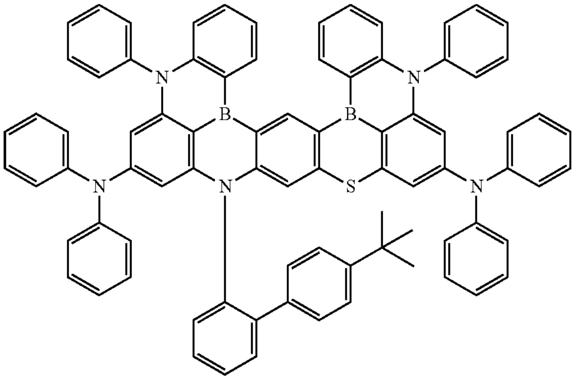

2

(1) Synthesis of Compound F

Compound F (20.0 g, yield 85%) was obtained by performing the same method as the synthesis of Compound B. Through FAB MS measurement, the molecular weight of Compound F was 636.

Compound H (21.0 g, yield 76%) was obtained from Compound G (13.4 g, 24.1 mmol) and Compound F (15.3 g, 24.1 mmol) by performing the same method as the synthesis of Compound B. Through FAB MS measurement, the molecular weight of Compound H was 1154.

(2) Synthesis of Compound 2

Compound 2 (4.1 g, yield 20%) was obtained from Compound H (20.0 g, 17.3 mmol) by performing the same method as the synthesis of Compound 1. Through FAB MS measurement, the molecular weight of Compound 2 was 1170. After purifying through sublimation purification (390° C., $6.5\times10^{-3}$ Pa), the evaluation on a device was conducted.

<Synthesis of Compound 3>

Polycyclic Compound 3 according to an embodiment may be synthesized, for example, by the steps in Reaction 3 below.

[Reaction 3]

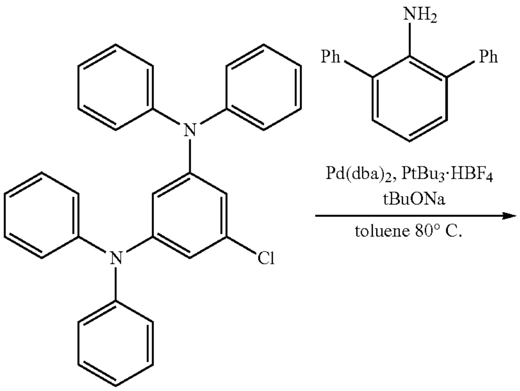

-continued

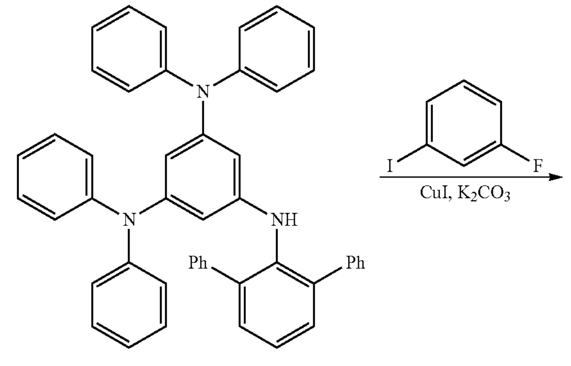

I

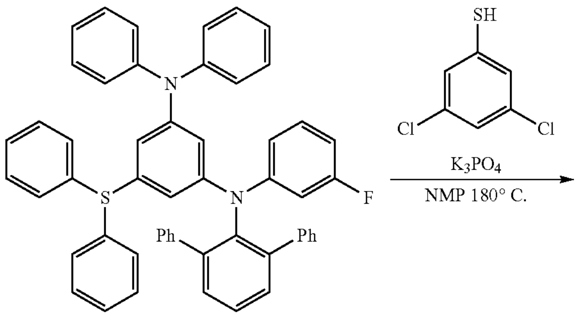

J

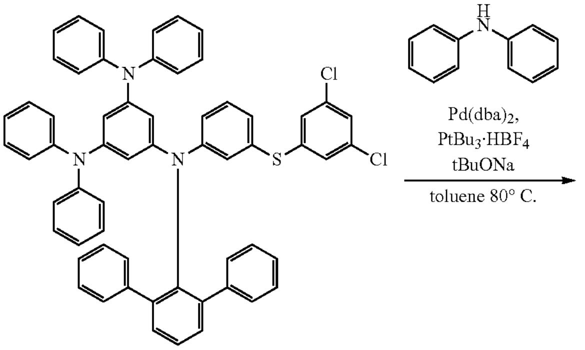

K

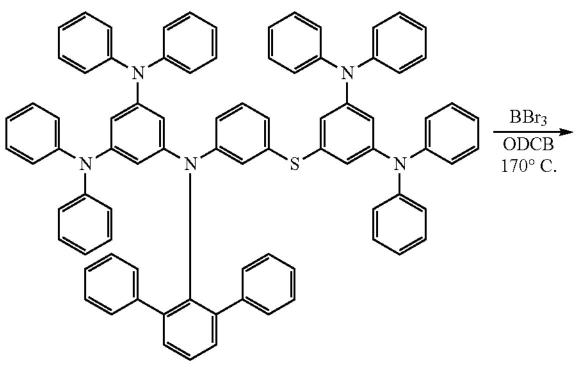

L

-continued

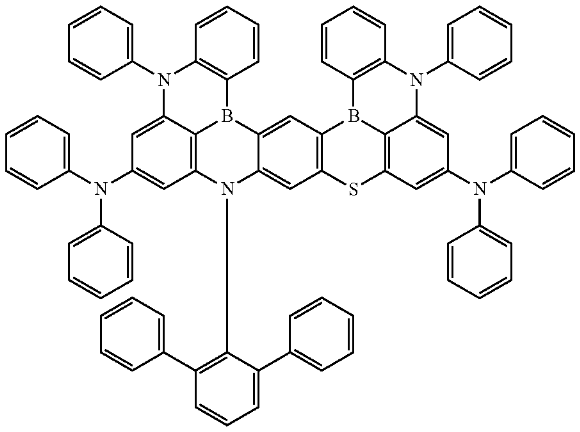

3

(1) Synthesis of Compound I

Compound I (30.0 g, yield 82%) was obtained by performing the same method as the synthesis of Compound B. Through FAB MS measurement, the molecular weight of Compound I was 655.

(2) Synthesis of Compound J

Under an Ar atmosphere, Compound I (28.0 g, 42.7 mmol), 1-fluoro-3-iodobenzene (75.8 g, 341.5 mmol), CuI (8.1 g, 42.7 mmol), and $K_2CO_3$ (29.5 g, 213 mmol) were heated and stirred at about 190° C. for about 72 hours. After cooling, toluene and water were added, filtering with celite was performed, and an organic layer was concentrated. The crude product was separated by silica gel column chromatography to obtain Compound J (16.6 g, yield 52%). Through FAB MS measurement, the molecular weight of Compound J was 749.

(3) Synthesis of Compound K

Compound K (19.1 g, yield 62%) was obtained from Compound J (25.0 g, 33.3 mmol) and 3,5-dichlorobenzenethiol (7.76 g, 43.3 mmol) by performing the same method as the synthesis of Compound D. Through FAB MS measurement, the molecular weight of Compound K was 908.

(4) Synthesis of Compound L

Compound K (22.1 g, yield 90%) was obtained from Compound K (19.0 g, 20.9 mmol) and diphenylamine (7.42 g, 43.9 mmol) by performing the same method as the synthesis of Compound C. Through FAB MS measurement, the molecular weight of Compound L was 1174.

(5) Synthesis of Compound 3

Compound 3 (3.34 g, yield 15%) was obtained from Compound L (22.0 g, 18.7 mmol) by performing the same method as the synthesis of Compound 1. Through FAB MS measurement, the molecular weight of Compound 3 was 1190. After purifying through sublimation purification (395° C., $8.8\times10^{-3}$ Pa), the evaluation on a device was conducted.

<Synthesis of Compound 89>

Polycyclic Compound 89 according to an embodiment may be synthesized, for example, by the steps in Reaction 4 below.

[Reaction 4]

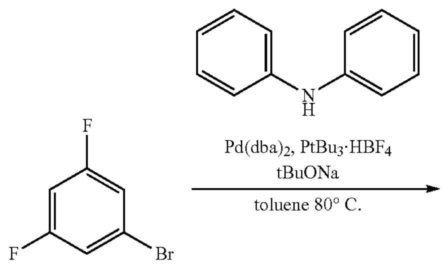

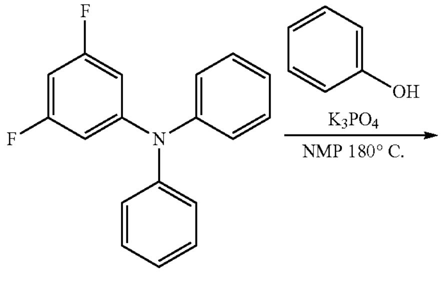

M

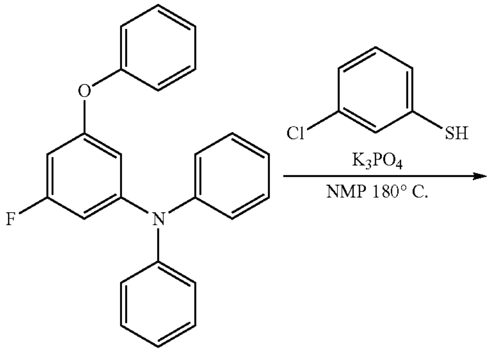

N

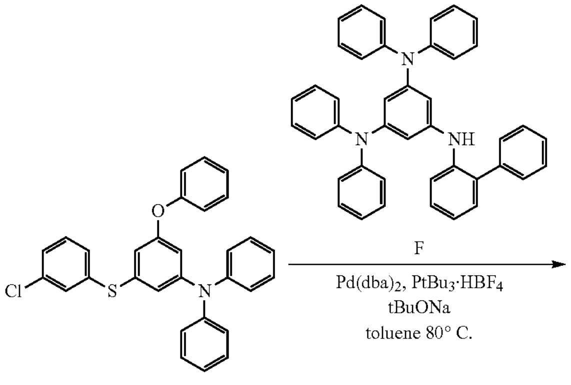

O

-continued

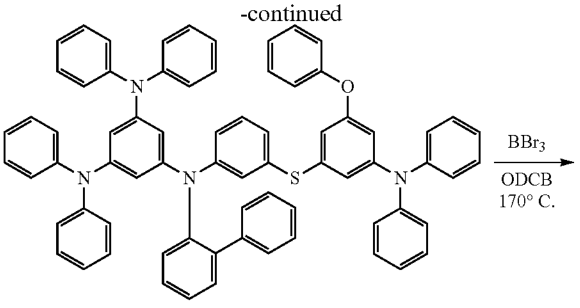

P

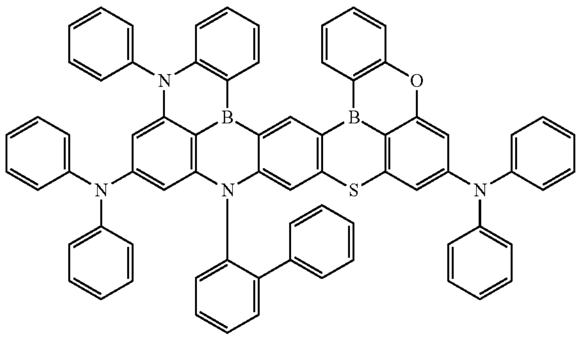

89

(1) Synthesis of Compound M

Compound M (33.2 g, yield 91%) was obtained from 1-bromo-3,5-difluorobenzene (25.0 g, 129 mmol) and diphenylamine (24.1 g, 142 mmol) by performing the same method as the synthesis of Compound C. Through FAB MS measurement, the molecular weight of Compound M was 281.

(2) Synthesis of Compound N

Compound N (20.7 g, yield 64%) was obtained from Compound M (25.0 g, 88.8 mmol) and phenol (10.9 g, 115 mmol) by performing the same method as the synthesis of Compound D. Through FAB MS measurement, the molecular weight of Compound N was 355.

(3) Synthesis of Compound O

Compound O (21.6 g, yield 80%) was obtained from Compound N (20.0 g, 56.3 mmol) by performing the same method as the synthesis of Compound D. Through FAB MS measurement, the molecular weight of Compound O was 480.

(4) Synthesis of Compound P

Compound P (33.6 g, yield 75%) was obtained from Compound O (21.0 g, 43.8 mmol) by performing the same method as the synthesis of Compound H. Through FAB MS measurement, the molecular weight of Compound P was 1023.

(5) Synthesis of Compound 89

Compound 89 (11.7 g, yield 35%) was obtained from Compound P (33.0 g, 32.3 mmol) by performing the same method as the synthesis of Compound 1. Through FAB MS measurement, the molecular weight of Compound 89 was 1038. After purifying through sublimation purification (395° C., $9.7\times10^{-3}$ Pa), the evaluation on a device was conducted.

<Synthesis of Compound 411>
Polycyclic Compound 411 according to an embodiment may be synthesized, for example, by the steps in Reaction 5 below.
[Reaction 5]
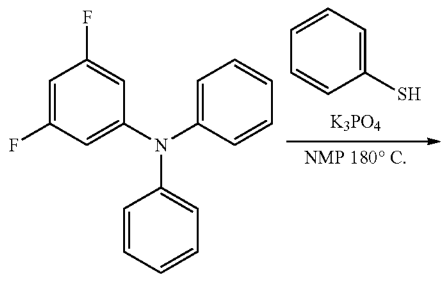
M
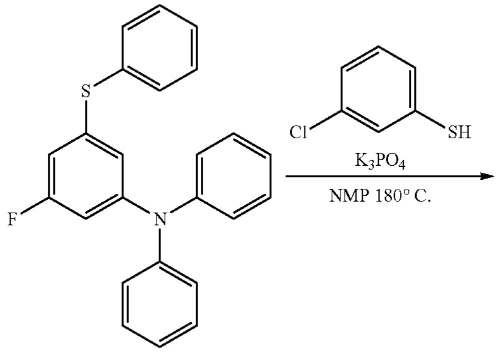
Q
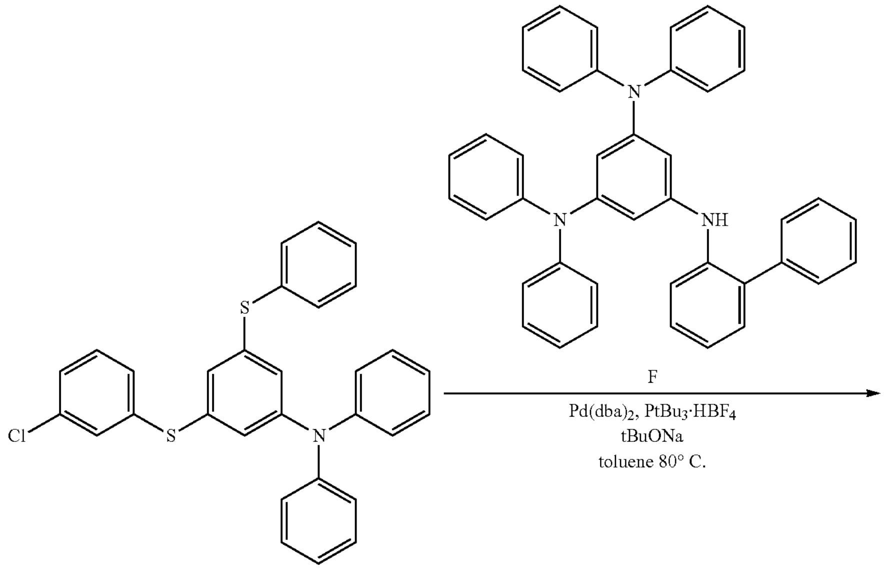
R -continued

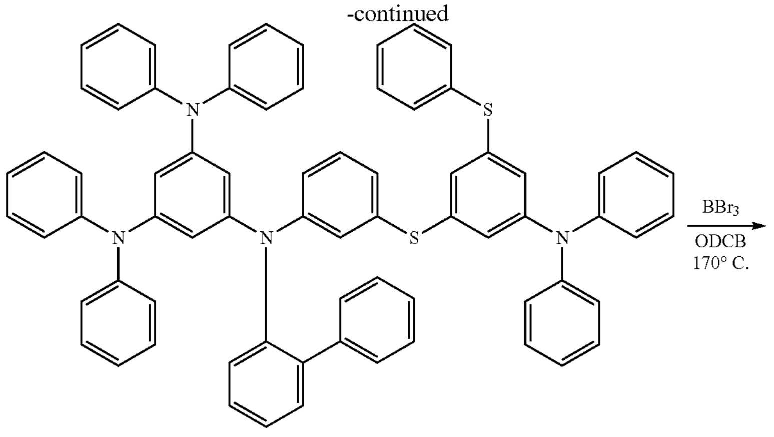

S

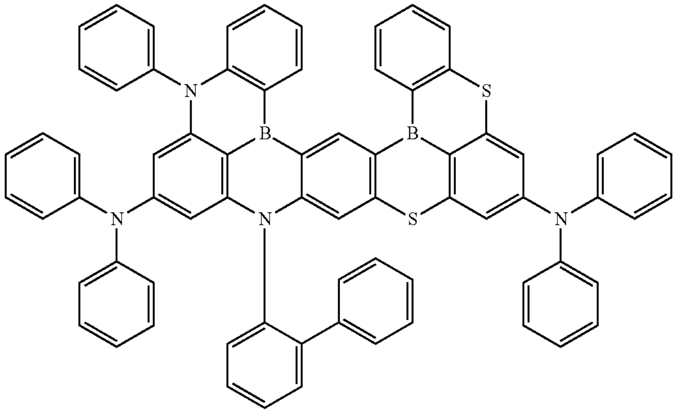

411

(1) Synthesis of Compound Q

Compound Q (17.8 g, yield 54%) was obtained from Compound M (25.0 g, 88.8 mmol) and thiophenol (12.7 g, 116 mmol) by performing the same method as the synthesis of Compound D. Through FAB MS measurement, the molecular weight of Compound Q was 371.

(2) Synthesis of Compound R

Compound R (16.3 g, yield 72%) was obtained from Compound Q (17.0 g, 45.8 mmol) by performing the same method as the synthesis of Compound D. Through FAB MS measurement, the molecular weight of Compound R was 496.

(3) Synthesis of Compound S

Compound S (25.8 g, yield 77%) was obtained from Compound R (16.0 g, 32.2 mmol) by performing the same method as the synthesis of Compound H. Through FAB MS measurement, the molecular weight of Compound S was 1039.

(4) Synthesis of Compound 411

Compound 411 (11.4 g, yield 45%) was obtained from Compound S (25.0 g, 24.4 mmol) by performing the same method as the synthesis of Compound 1. Through FAB MS measurement, the molecular weight of Compound 411 was 1054. After purifying through sublimation purification (395° C., $7.7\times10^{-3}$ Pa), the evaluation on a device was conducted.

<Synthesis of Compound 249>

Polycyclic Compound 249 according to an embodiment may be synthesized, for example, by the steps in Reaction 6 below.

[Reaction 6]

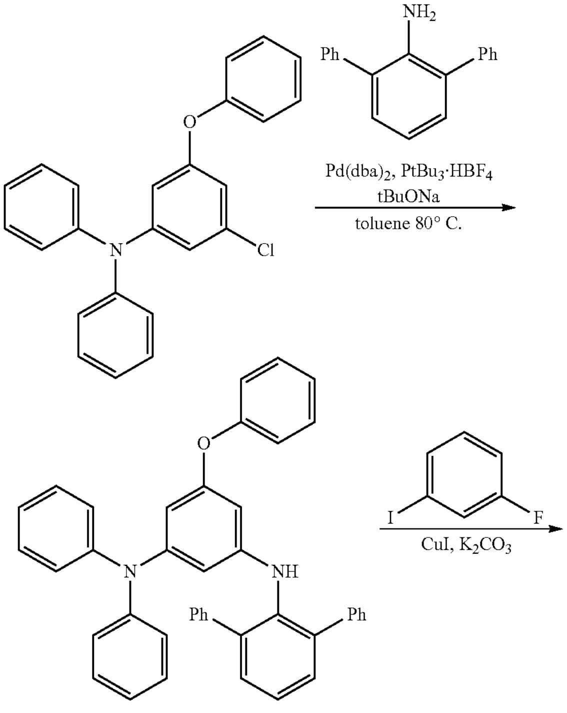

T

-continued

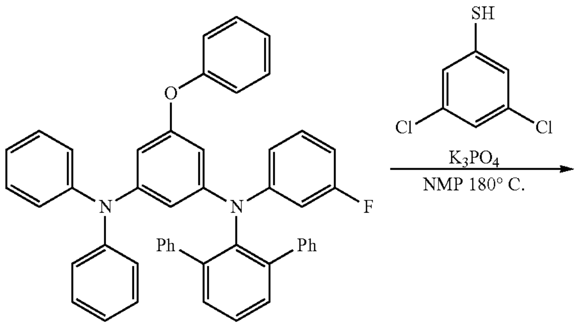

U

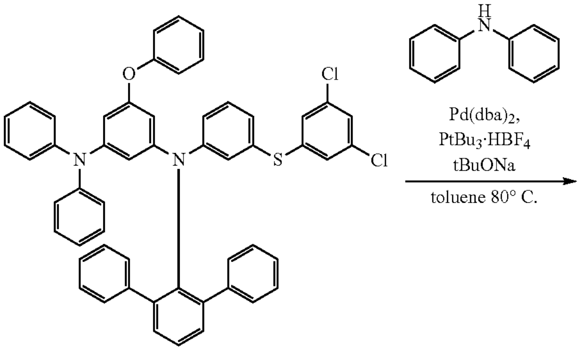

V

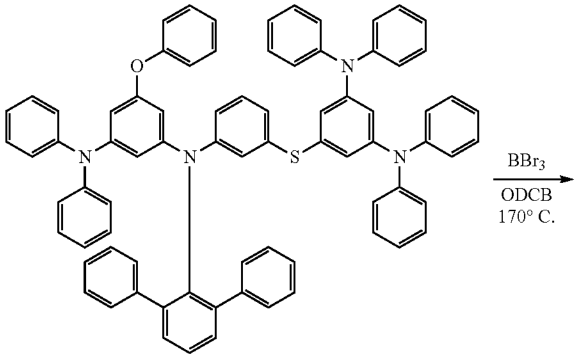

W

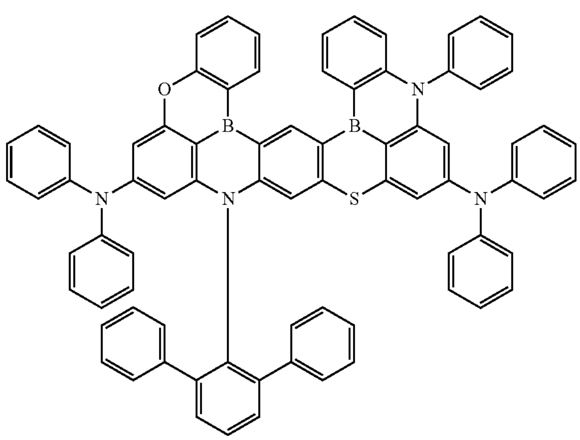

249

(1) Synthesis of Compound T

Compound T (20.0 g, yield 80%) was obtained by performing the same method as the synthesis of Compound B. Through FAB MS measurement, the molecular weight of Compound B was 581.

(2) Synthesis of Compound U

Compound U (13.6 g, yield 65%) was obtained from Compound T (18.0 g, 31.0 mmol) and 1-fluoro-3-iodobenzene (55.0 g, 248 mmol) by performing the same method as the synthesis of Compound J. Through FAB MS measurement, the molecular weight of Compound U was 675.

(3) Synthesis of Compound V

Compound V (12.0 g, yield 75%) was obtained from Compound U (13.0 g, 19.3 mmol) and 3,5-dichlorobenzene (4.48 g, 25.0 mmol) by performing the same method as the synthesis of Compound D. Through FAB MS measurement, the molecular weight of Compound V was 834.

(4) Synthesis of Compound W

Compound W (13.3 g, yield 92%) was obtained from Compound V (11.0 g, 13.2 mmol) and diphenylamine (4.67 g, 27.7 mmol) by performing the same method as the synthesis of Compound C. Through FAB MS measurement, the molecular weight of Compound W was 1099.

(5) Synthesis of Compound 249

Compound 249 (2.38 g, yield 18%) was obtained from Compound W (13.0 g, 11.8 mmol) by performing the same method as the synthesis of Compound 1. Through FAB MS measurement, the molecular weight of Compound 249 was 1115. After purifying through sublimation purification (380° C., $7.8 \times 10^{-3}$ Pa), the evaluation on a device was conducted.

<Synthesis of Compound 331>

Polycyclic Compound 331 according to an embodiment may be synthesized, for example, by the steps in Reaction 7 below.

[Reaction 7]

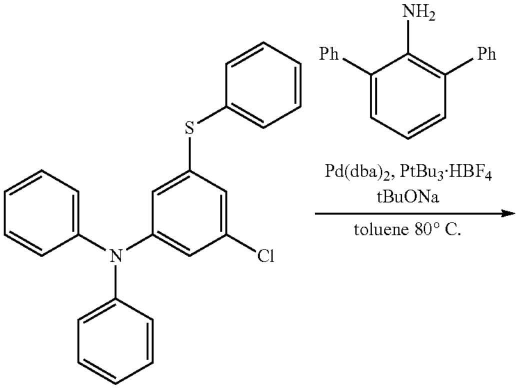

-continued

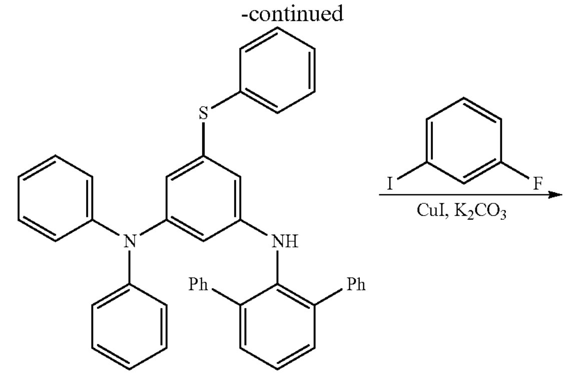

X

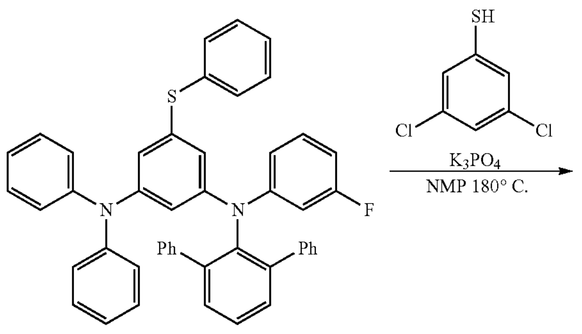

Y

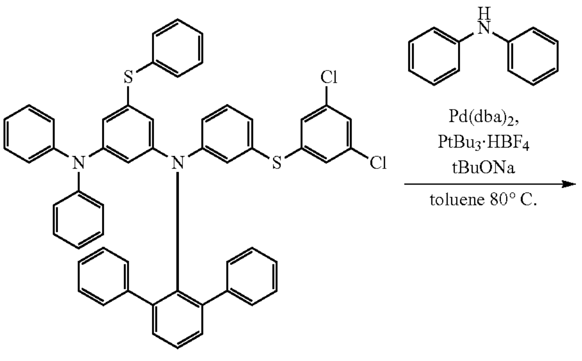

Z

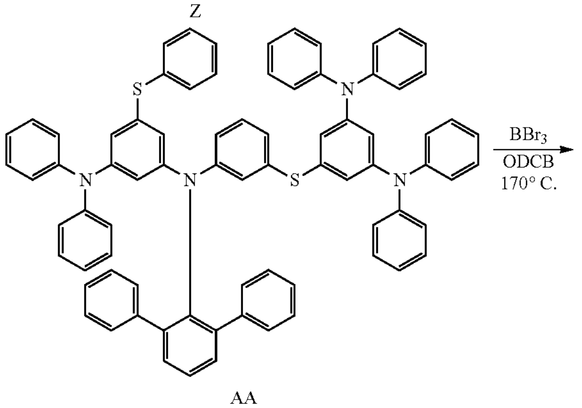

AA

-continued

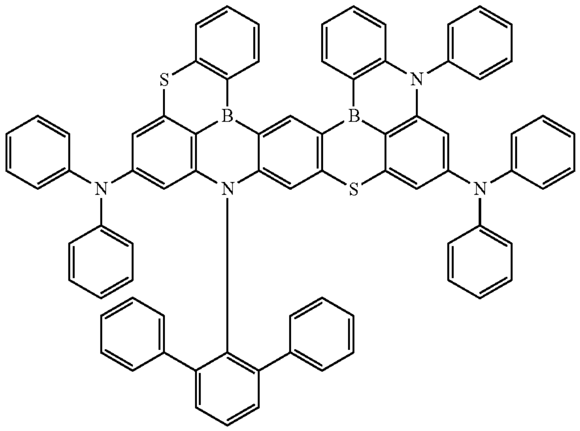

331

(1) Synthesis of Compound X

Compound X (18.0 g, yield 72%) was obtained by performing the same method as the synthesis of Compound B. Through FAB MS measurement, the molecular weight of Compound X was 597.

(2) Synthesis of Compound Y

Compound Y (14.7 g, yield 75%) was obtained from Compound X (17.0 g, 28.5 mmol) and 1-fluoro-3-iodobenzene (50.6 g, 228 mmol) by performing the same method as the synthesis of Compound J. Through FAB MS measurement, the molecular weight of Compound Y was 691.

(3) Synthesis of Compound Z

Compound Z (15.2 g, yield 88%) was obtained from Compound Y (14.0 g, 20.3 mmol) and 3,5-dichlorobenzenethiol (4.72 g, 26.3 mmol) by performing the same method as the synthesis of Compound D. Through FAB MS measurement, the molecular weight of Compound Z was 850.

(4) Synthesis of Compound AA

Compound AA (17.1 g, yield 87%) was obtained from Compound Z (15.0 g, 17.7 mmol) and diphenylamine (6.27 g, 37.1 mmol) by performing the same method as the synthesis of Compound C. Through FAB MS measurement, the molecular weight of Compound AA was 1115.

(5) Synthesis of Compound 331

Compound 331 (1.84 g, yield 11%) was obtained from Compound AA (16.5 g, 14.8 mmol) by performing the same method as the synthesis of Compound 1. Through FAB MS measurement, the molecular weight of Compound 331 was 1131. After purifying through sublimation purification (380° C., $6.8{\times}10^{-3}$ Pa), the evaluation on a device was conducted.

1. Manufacture and Evaluation of Organic Electroluminescence Device (Manufacture of Organic Electroluminescence Device)

Organic electroluminescence devices were manufactured using Example Compounds and Comparative Compounds below as materials of an emission layer.

[Example Compound]
1
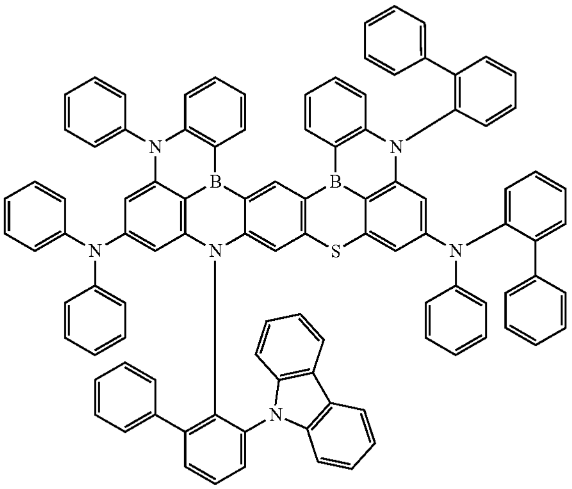
2
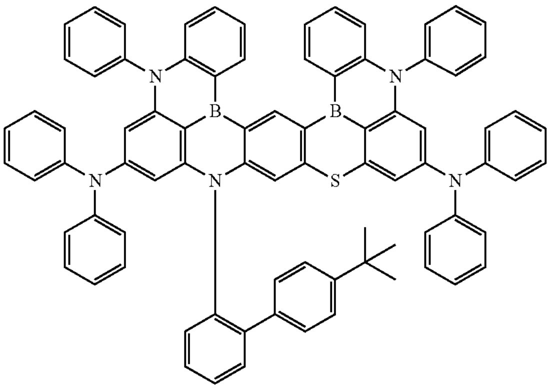
3
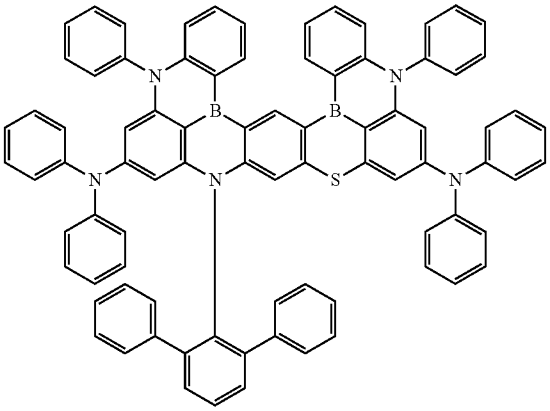
89
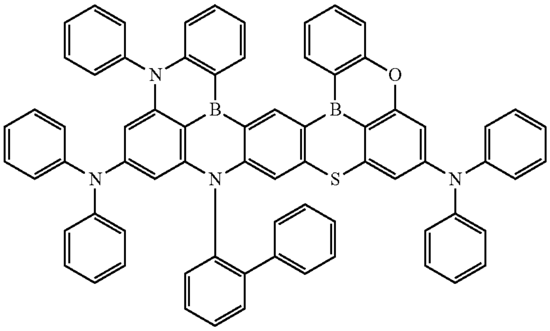
411
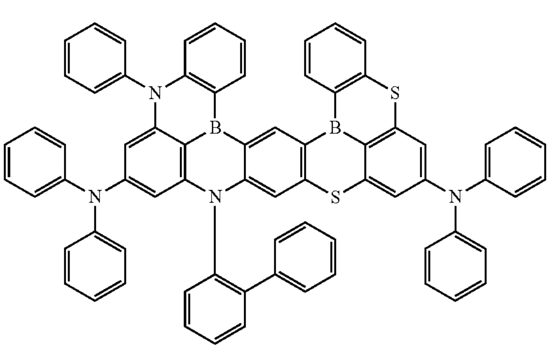
249
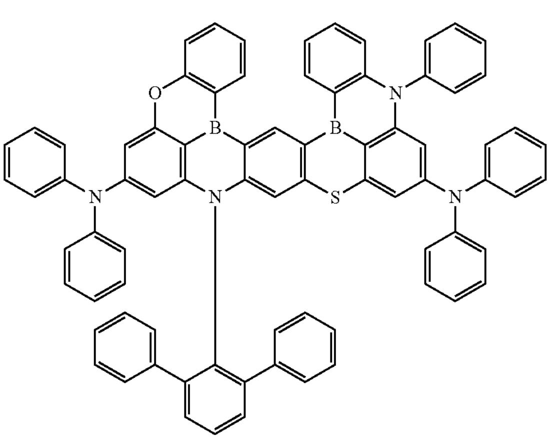

-continued
331
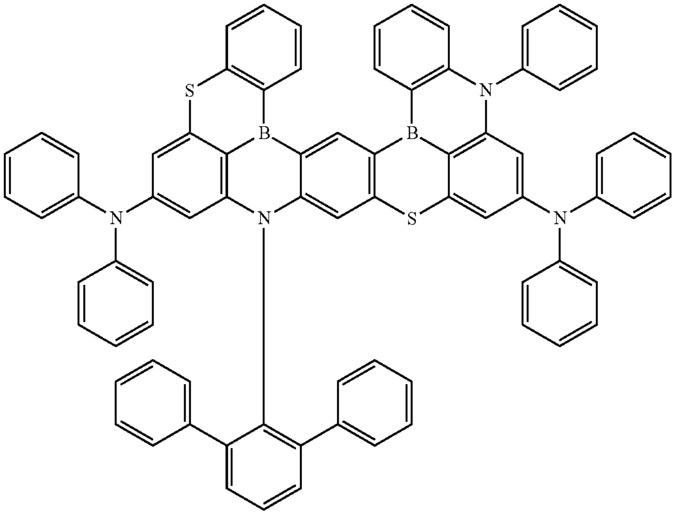
[Comparative Compound]
X1
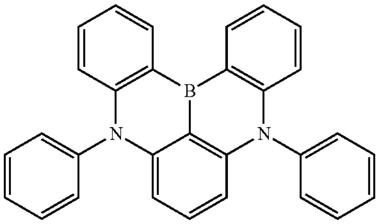
X2
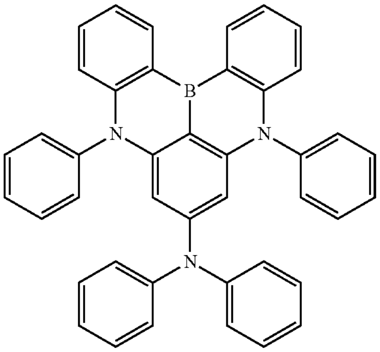
X3
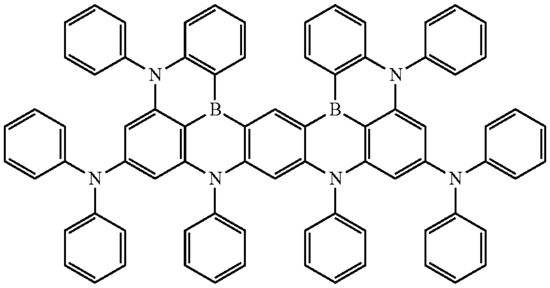
X4
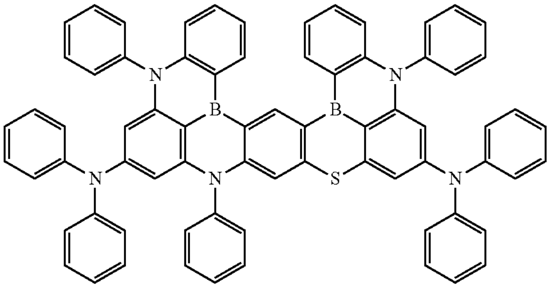
X5
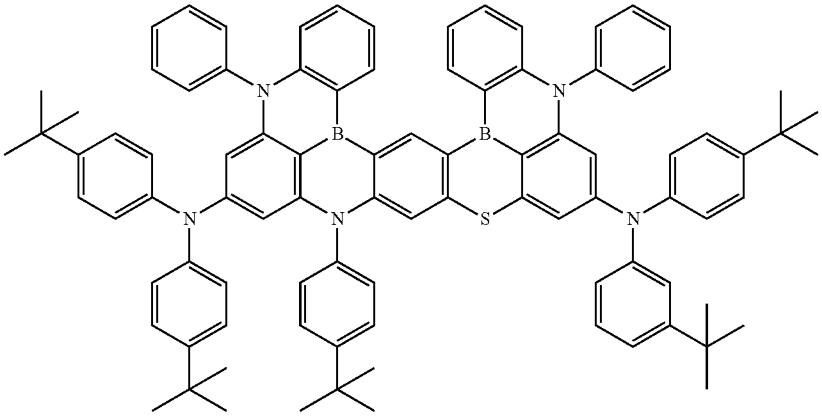

-continued

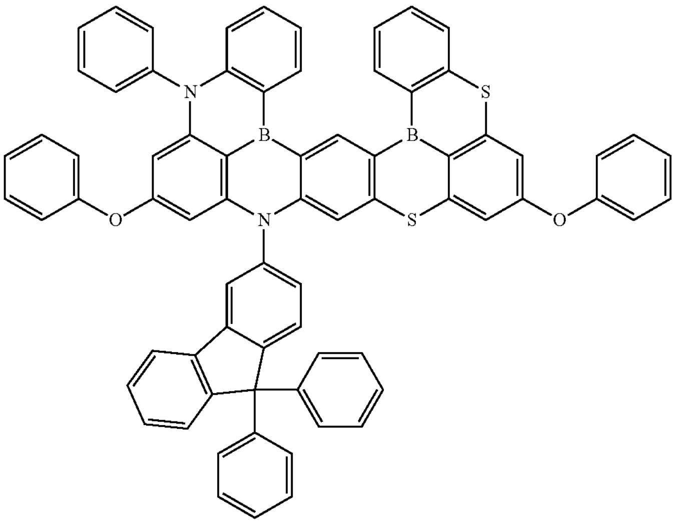

X6

On a glass substrate, ITO with a thickness of about 1,500 Å was patterned, washed with ultrapure water, and treated with UV ozone for about 10 minutes. HAT-CN was deposited to a thickness of about 100 Å, a-NPD was deposited to a thickness of about 800 Å, and mCP was deposited to a thickness of about 50 Å to form a hole transport region.

The polycyclic compound of an embodiment or the Comparative Compound were co-deposited with mCP in a ratio of 1:99 to form a layer having a thickness of about 200 Å to form an emission layer.

On the emission layer, a layer was formed using TPBi to a thickness of about 300 Å, and a layer was formed using LiF to a thickness of about 5 Å to form an electron transport region. A second electrode was formed using aluminum (Al) to a thickness of about 1,000 Å.

(Evaluation of Properties of Organic Electroluminescence Device)

Measurement values according to Examples 1 to 7 and Comparative Examples 1 to 6 are shown in Table 1 below. Roll-off is represented by (external quantum efficiency of 1 $cd/m^3$)−(1000 $cd/m^3$)/(external quantum efficiency of 1 $cd/m^3$)×100. The maximum emission efficiency ($EQE_{max1000nit}$) is a value measured at about 10 $mA/cm^2$, and relative life means a relative life value when the half-life of Comparative Example 3 is set to 1. Luminescence attenuation of delayed fluorescence represents a measured value of thin film photoluminescence (PL) of 1% of Example Compound or Comparative Compound: mCBP (20 nm). From the luminescence attenuation and luminescence quantum efficiency, a reverse intersystem crossing rate constant ($k_{RISC}$) was computed.

TABLE 1

| Device manufacturing example | Dopant | $k_{RISC}$ ($10^4$ $S^{-1-}$) | λmax (nm) | Roll-off (%) | $EQE_{max1000nit}$ (%) | LT50 Relative life |
|---|---|---|---|---|---|---|
| Example 1 | 1 | 20 | 461 | 9.1 | 21.2 | 3.8 |
| Example 2 | 2 | 19 | 464 | 9.8 | 20.5 | 3.8 |
| Example 3 | 3 | 35 | 464 | 8.6 | 22.2 | 4.3 |
| Example 4 | 89 | 18 | 458 | 12.5 | 17.6 | 3.1 |
| Example 5 | 411 | 18 | 456 | 12.0 | 17.8 | 3.2 |
| Example 6 | 249 | 17 | 456 | 12.9 | 17.6 | 2.4 |
| Example 7 | 331 | 19 | 459 | 9.9 | 20.6 | 2.7 |
| Comparative Example 1 | X1 | 0.23 | 457 | 33.2 | 5.4 | 0.3 |
| Comparative Example 2 | X2 | 0.55 | 446 | 30.5 | 7.2 | 0.2 |
| Comparative Example 3 | X3 | 5.0 | 467 | 13.5 | 17.4 | 1 |
| Comparative Example 4 | X4 | 18 | 465 | 13.4 | 17.1 | 1.1 |
| Comparative Example 5 | X5 | 17 | 470 | 16.2 | 12.1 | 0.5 |
| Comparative Example 6 | X6 | 1.2 | 461 | 26.3 | 13.4 | 0.4 |

Referring to Table 1, it could be confirmed that Examples 1 to 7 achieved long life and high efficiency at the same time when compared with Comparative Examples 1 to 6.

The polycyclic compound according to an embodiment introduces a sulfur atom in a core structure and may increase the reverse intersystem crossing rate constant ($k_{RISC}$). By including one or more substituents at ortho positions of a phenyl group which is bonded to nitrogen to increase the volume of a molecule, triplet-triplet annihilation (TTA) or singlet-triplet annihilation (STA), which is one of a factor expressing the roll-off may be restrained, and a low roll-off value is shown. Accordingly, the polycyclic compound according to an embodiment may efficiently restrain the roll-off, and it could be confirmed that the high efficiency and long life of an organic electroluminescence device is achieved.

The organic electroluminescence device according to an embodiment has excellent efficiency.

The polycyclic compound according to an embodiment may be used as a material of an emission layer of an organic electroluminescence device, and by using thereof, the efficiency of the organic electroluminescence device may be improved.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. An organic electroluminescence device, comprising:

a first electrode;

a hole transport region disposed on the first electrode;

an emission layer disposed on the hole transport region;

an electron transport region disposed on the emission layer; and a second electrode disposed on the electron transport region, wherein the emission layer comprises a polycyclic compound represented by Formula 1:

[Formula 1]

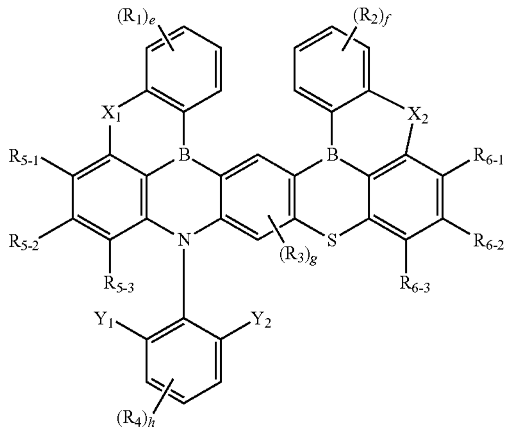

wherein in Formula 1, $X_1$ and $X_2$ are each independently O, S, or $N(R_7)$, e and f are each independently an integer from 0 to 4, g is an integer from 0 to 2, h is an integer from 0 to 3, $R_1$ to $R_4$, $R_{5-1}$ to $R_{5-3}$, and $R_{6-1}$ to $R_{6-3}$ are each independently a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, $R_7$ is a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or is combined with an adjacent group to form a ring, and $Y_1$ and $Y_2$ are each independently a hydrogen atom, a deuterium atom, a substituted or unsubstituted alkyl group of 6 to 20 carbon atoms, a substituted or unsubstituted aryl group of 6 to 30 ring-forming carbon atoms, or a substituted or unsubstituted heteroaryl group of 2 to 30 ring-forming carbon atoms, and at least one of $Y_1$ and $Y_2$ is a substituted or unsubstituted alkyl group of 6 to 20 carbon atoms, a substituted or unsubstituted aryl group of 6 to 30 ring-forming carbon atoms, or a substituted or unsubstituted heteroaryl group of 2 to 30 ring-forming carbon atoms.

2. The organic electroluminescence device of claim 1, wherein the emission layer emits delayed fluorescence.

3. The organic electroluminescence device of claim 1, wherein the emission layer is a delayed fluorescence emission layer comprising a first compound and a second compound, and the first compound comprises the polycyclic compound.

4. The organic electroluminescence device of claim 1, wherein the emission layer is a thermally activated delayed fluorescence emission layer emitting light having a wavelength in a range of about 430 nm to about 480 nm.

5. The organic electroluminescence device of claim 1, wherein at least one of $X_1$ and $X_2$ is $N(R_7)$, and $R_7$ is a substituted or unsubstituted aryl group of 6 to 30 ring-forming carbon atoms, or a substituted or unsubstituted heteroaryl group of 2 to 30 ring-forming carbon atoms.

6. The organic electroluminescence device of claim 1, wherein the polycyclic compound represented by Formula 1 is represented by one of Formula 2-1 to Formula 2-5:

-continued

[Formula 2-1]

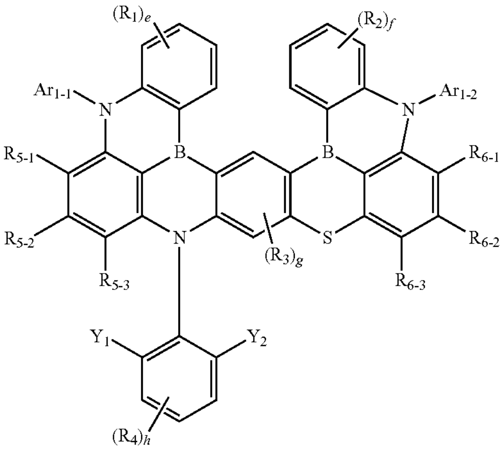

[Formula 2-2]

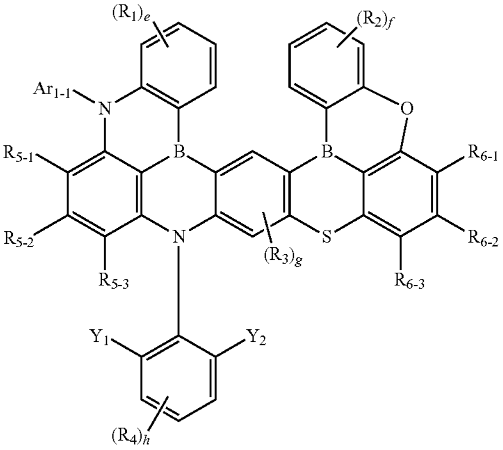

[Formula 2-3]

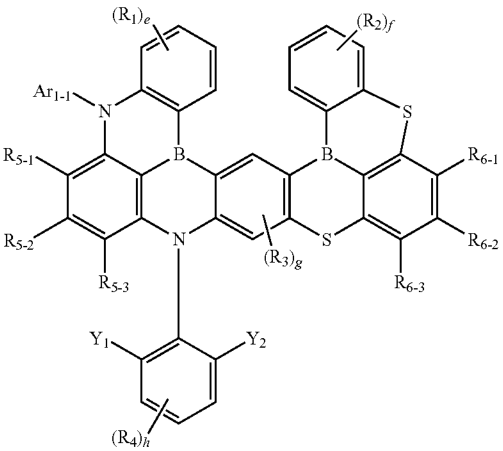

[Formula 2-4]

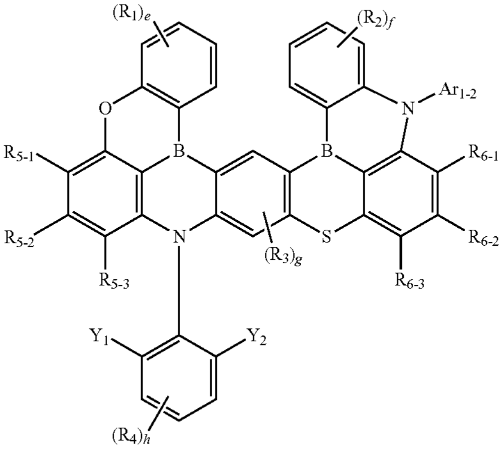

[Formula 2-5]

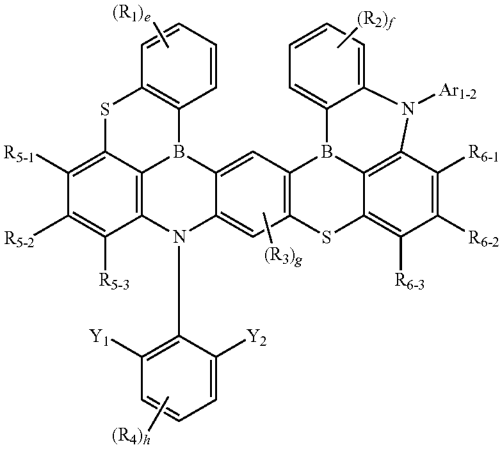

wherein in Formula 2-1 to Formula 2-5, $Ar_{1-1}$ and $Ar_{1-2}$ are each independently a substituted or unsubstituted aryl group of 6 to 30 ring-forming carbon atoms, or a substituted or unsubstituted heteroaryl group of 2 to 30 ring-forming carbon atoms, and $R_1$ to $R_4$, $R_{5-1}$ to $R_{5-3}$, $R_{6-1}$ to $R_{6-3}$, $Y_1$, $Y_2$, and e to h are the same as defined in connection with Formula 1.

7. The organic electroluminescence device of claim 6, wherein $Ar_{1-1}$ and $Ar_{1-2}$ are each independently a group represented by one of Formula 5-1 to Formula 5-3:

[Formula 5-1]

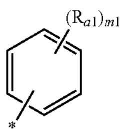

[Formula 5-2]

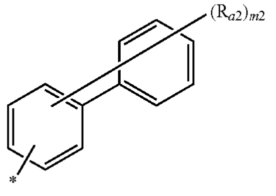

-continued

[Formula 5-3]

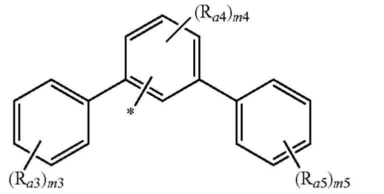

wherein in Formulae 5-1 to Formula 5-3, $R_{a1}$ to $R_{a5}$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, m1, m3, and m5 are each independently an integer from 0 to 5, m2 is an integer from 0 to 9, m4 is an integer from 0 to 3, and —* represents a binding site to a neighboring atom.

8. The organic electroluminescence device of claim 1, wherein at least one of $R_{5-1}$ to $R_{5-3}$, and $R_{6-1}$ to $R_{6-3}$ is a substituted amine group.

9. The organic electroluminescence device of claim 1, wherein the polycyclic compound represented by Formula 1 is represented by Formula 3-1 or Formula 3-2:

[Formula 3-1]

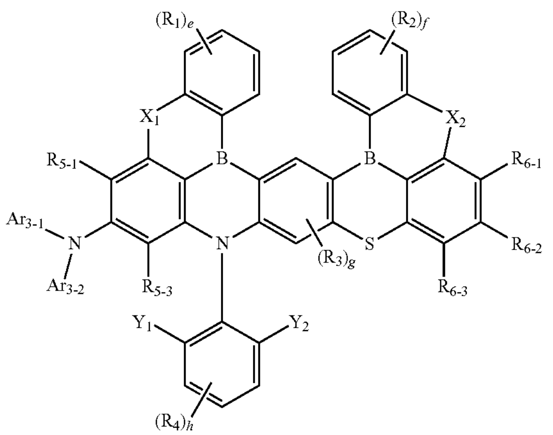

-continued

[Formula 3-2]

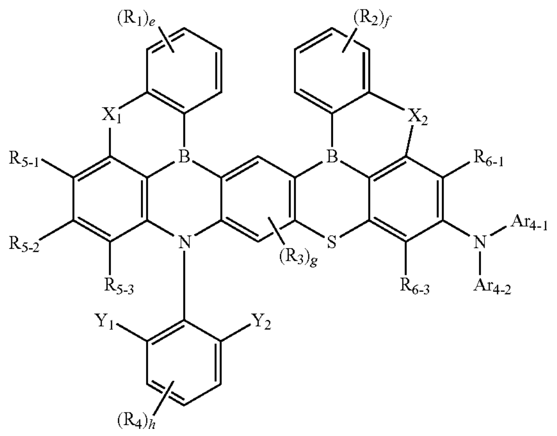

wherein in Formulae 3-1 and Formula 3-2, $Ar_{3-1}$, $Ar_{3-2}$, $Ar_{4-1}$, and $Ar_{4-2}$ are each independently a substituted or unsubstituted aryl group of 6 to 30 ring-forming carbon atoms, and $X_1$, $X_2$, $R_1$ to $R_4$, $R_{5-1}$ to $R_{5-3}$, $R_{6-1}$ to $R_{6-3}$, $Y_1$, $Y_2$, and e to h are the same as defined in connection with Formula 1.

10. The organic electroluminescence device of claim 1, wherein the polycyclic compound represented by Formula 1 is represented by Formula 4:

[Formula 4]

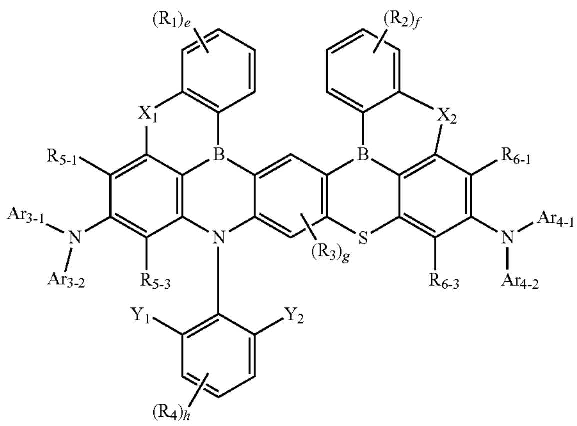

wherein in Formula 4, $Ar_{3-1}$, $Ar_{3-2}$, $Ar_{4-1}$, and $Ar_{4-2}$ are each independently a substituted or unsubstituted aryl group of 6 to 30 ring-forming carbon atoms, and $X_1$, $X_2$, $R_1$ to $R_4$, $R_{5-1}$, $R_{5-3}$, $R_{6-1}$, $R_{6-3}$, $Y_1$, $Y_2$, and e to h are the same as defined in connection with Formula 1.

11. The organic electroluminescence device of claim 10, wherein $Ar_{3-1}$, $Ar_{3-2}$, $Ar_{4-1}$, and $Ar_{4-2}$ are each independently a substituted or unsubstituted aryl group of 6 to 18 ring-forming carbon atoms.

12. The organic electroluminescence device of claim 1, wherein the polycyclic compound represented by Formula 1 is one selected from Compound Group 1:

[Compound Group 1]
1
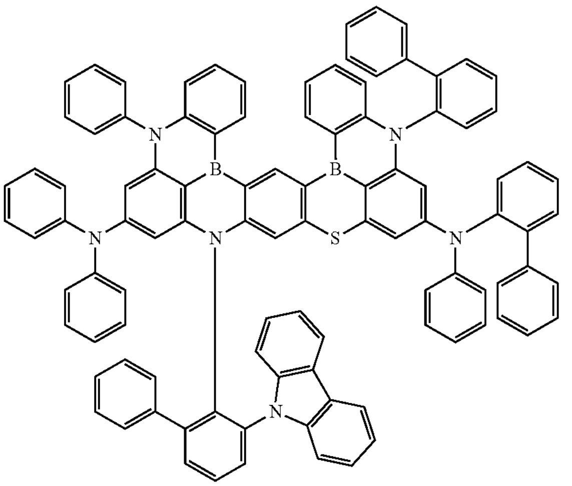
2
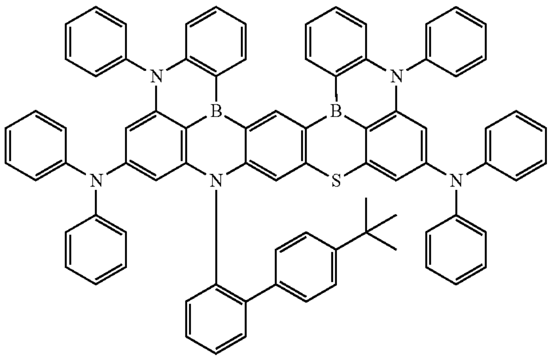
3
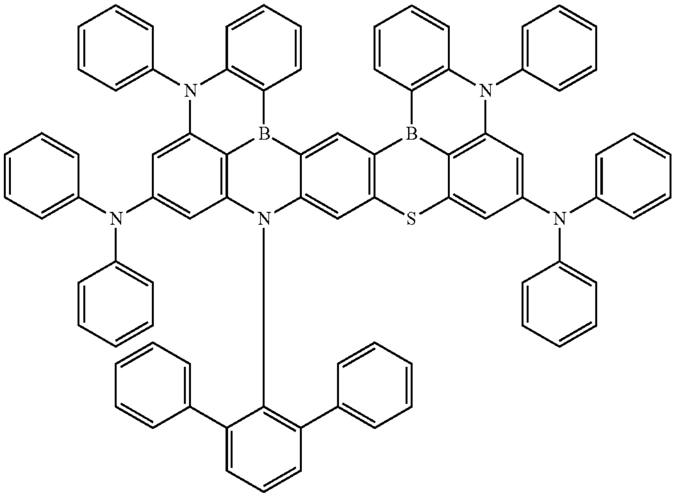
4
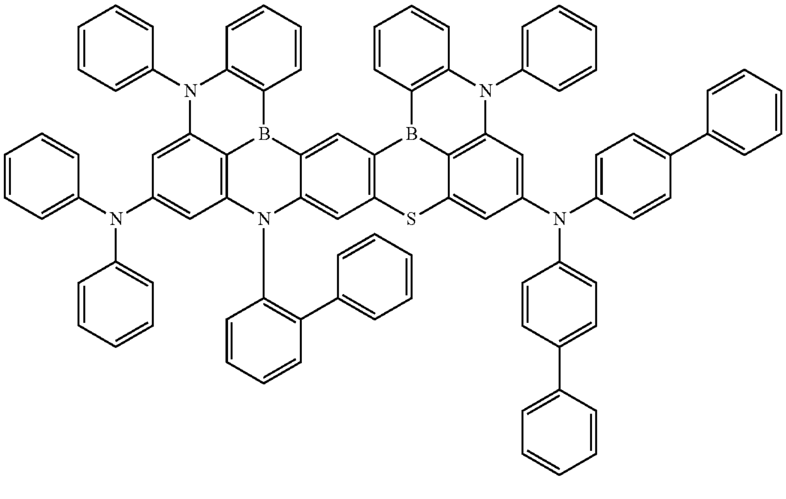

-continued
5
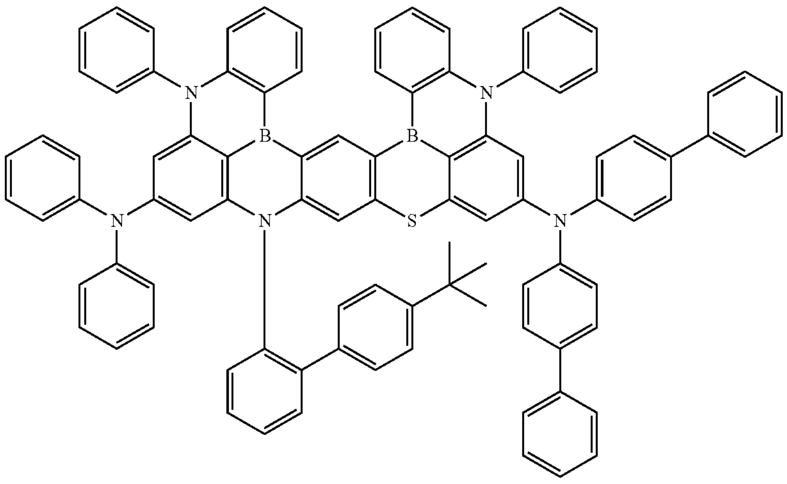
6
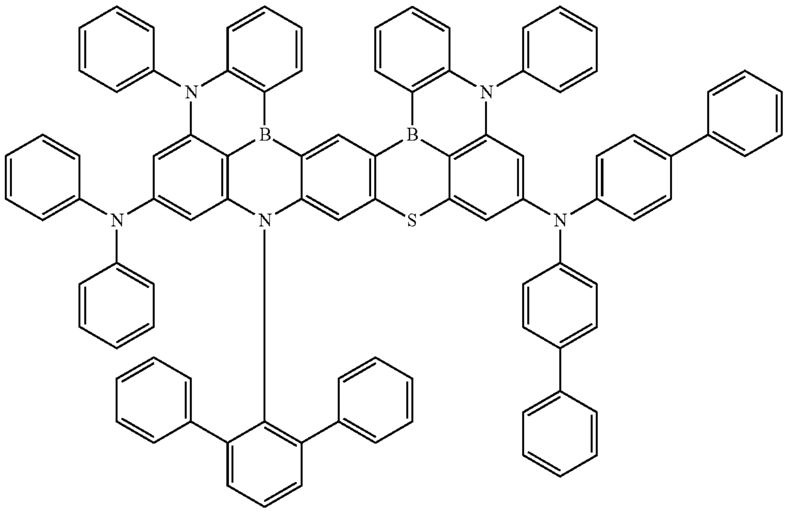
7
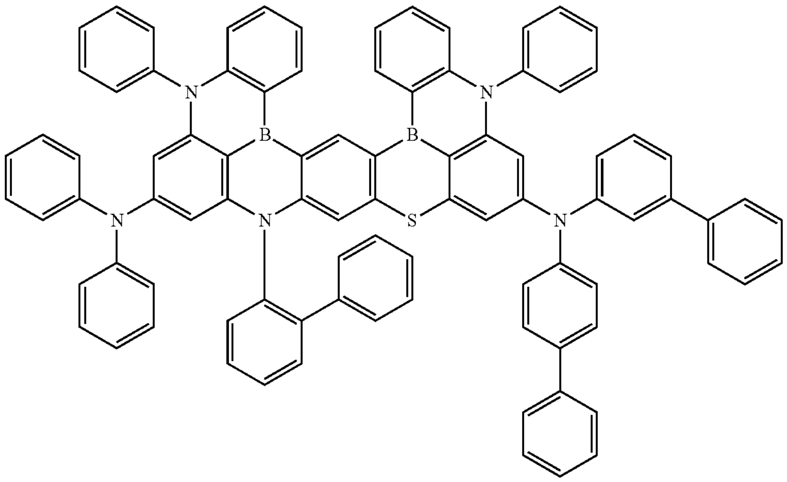

-continued
8
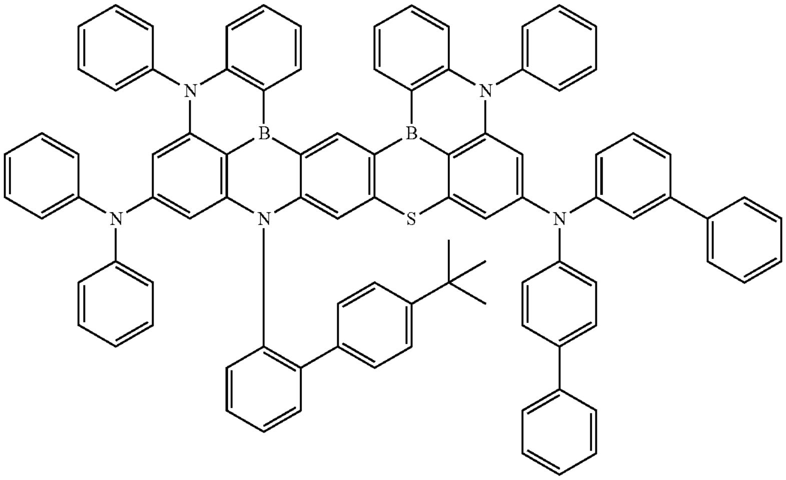
9
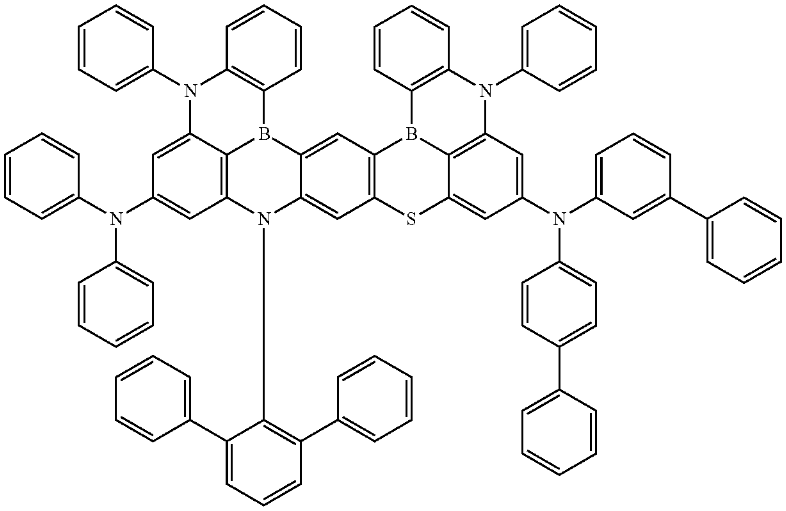
10
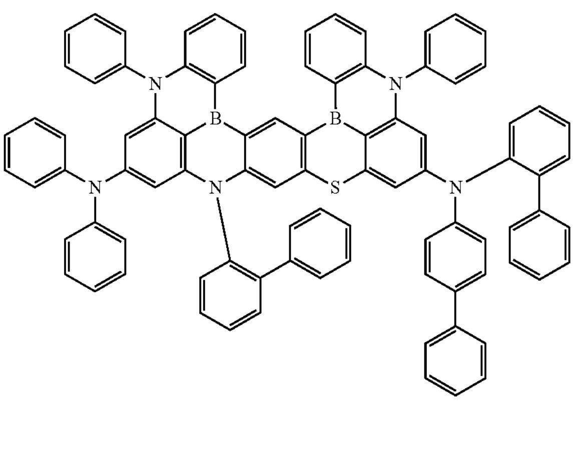
11
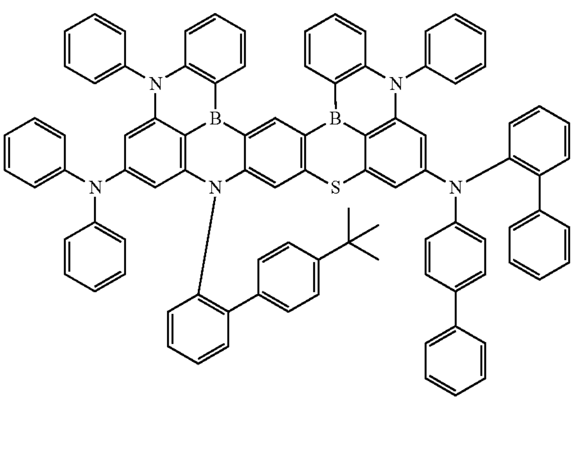

-continued
12
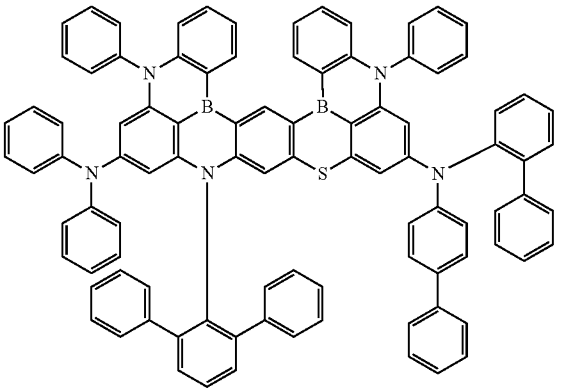
13
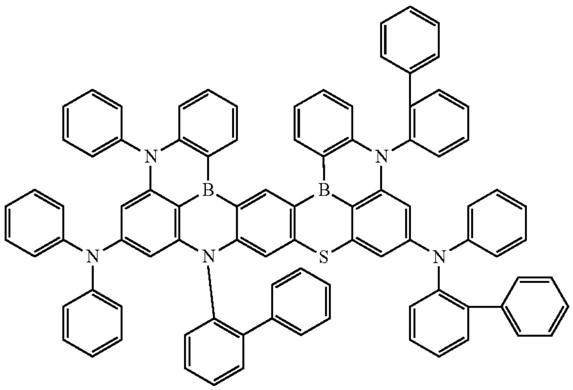
14
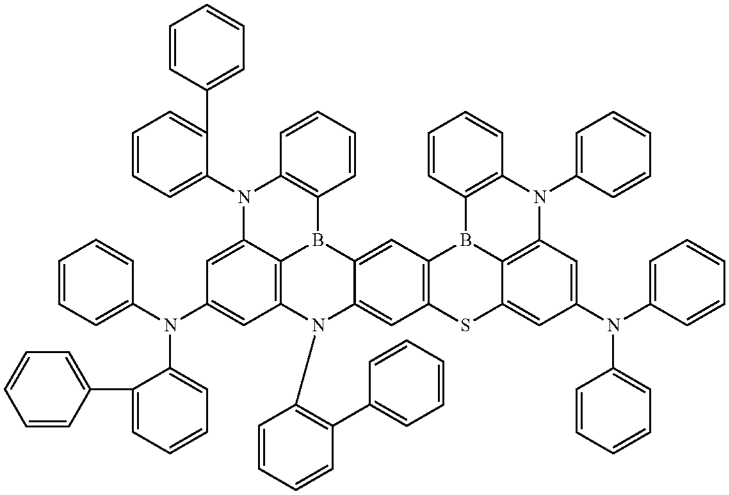
15
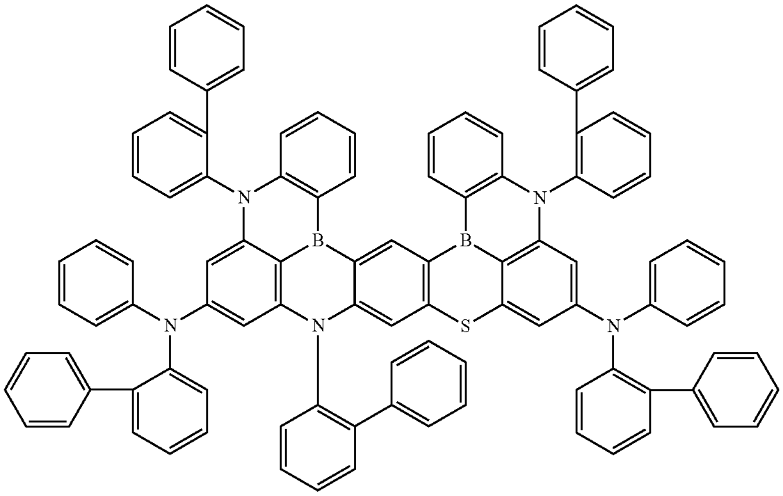

-continued
16
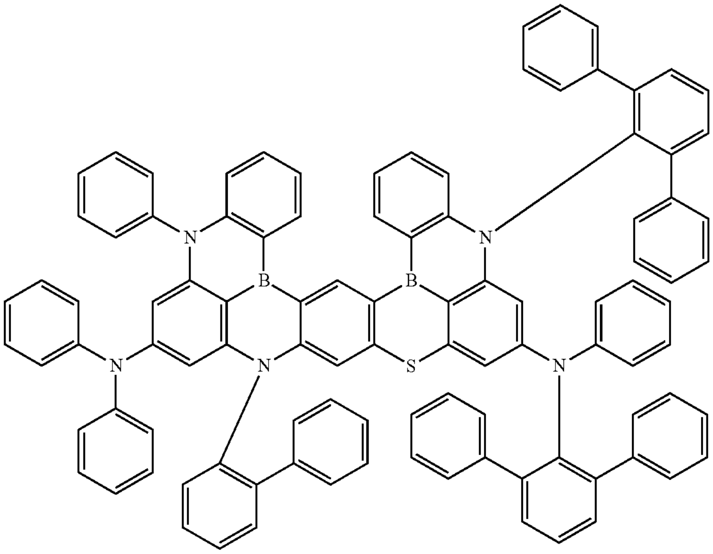
17
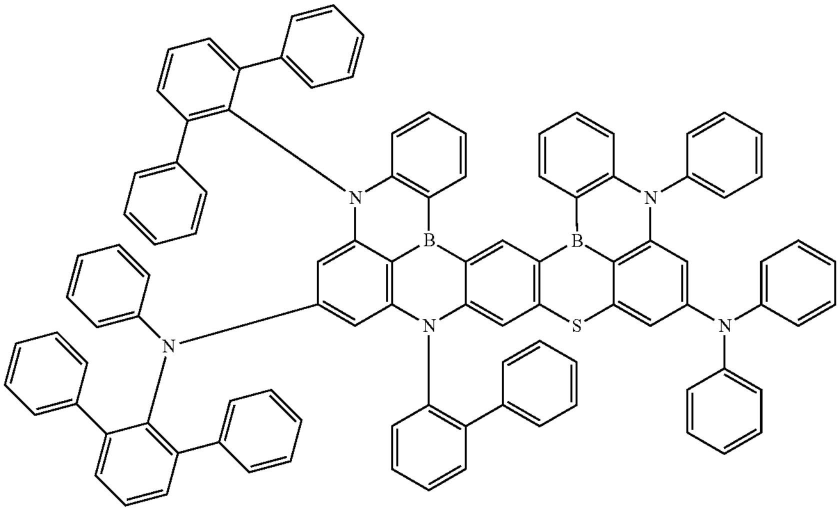
18
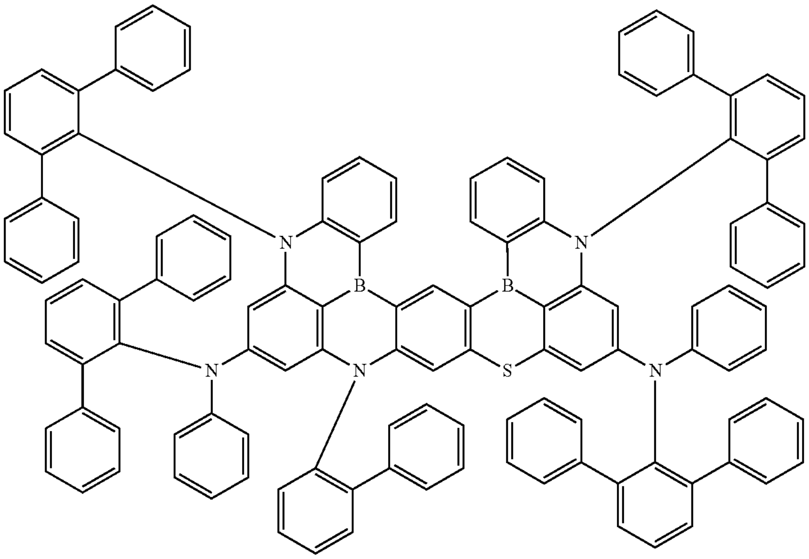

-continued
19
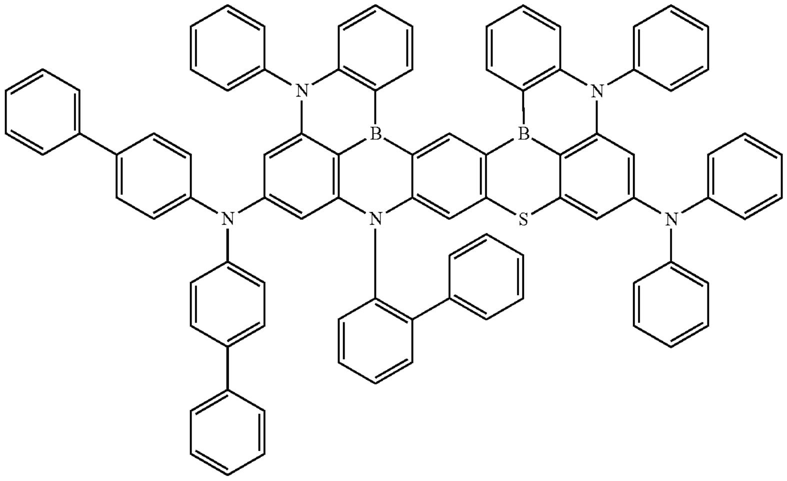
20
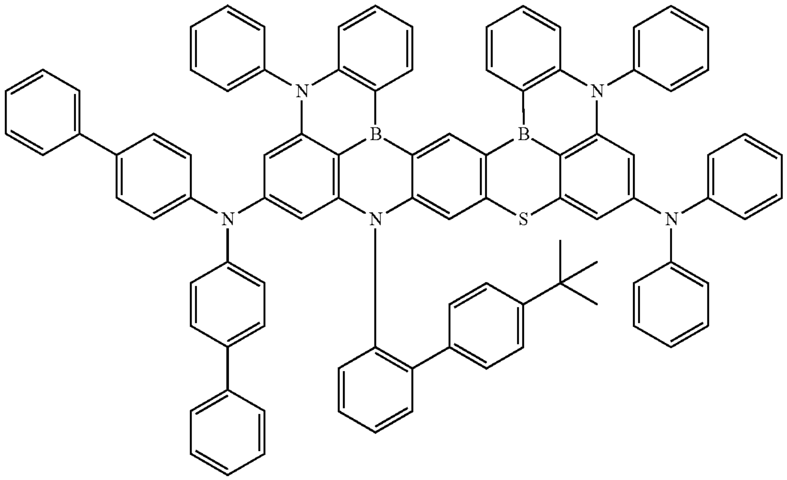
21
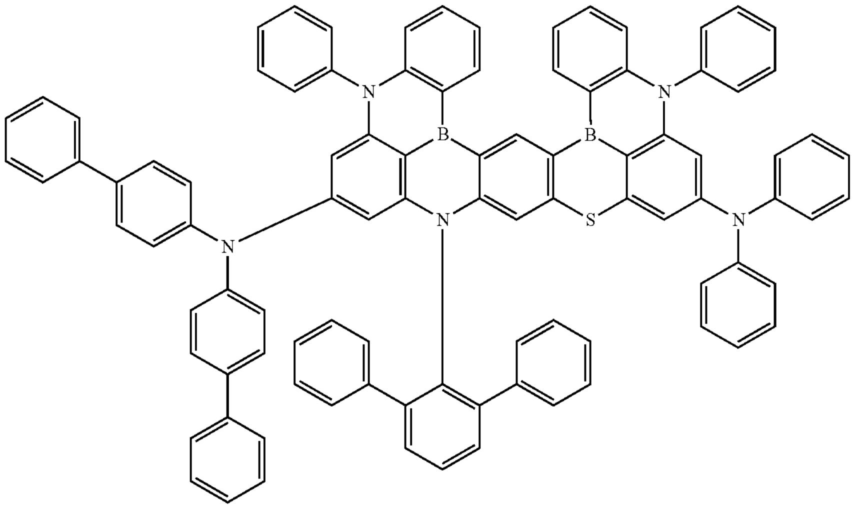

-continued
22
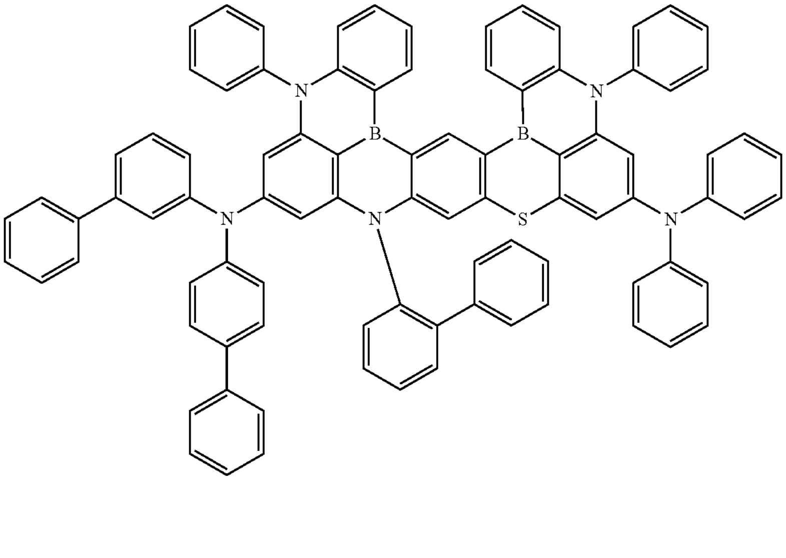
23
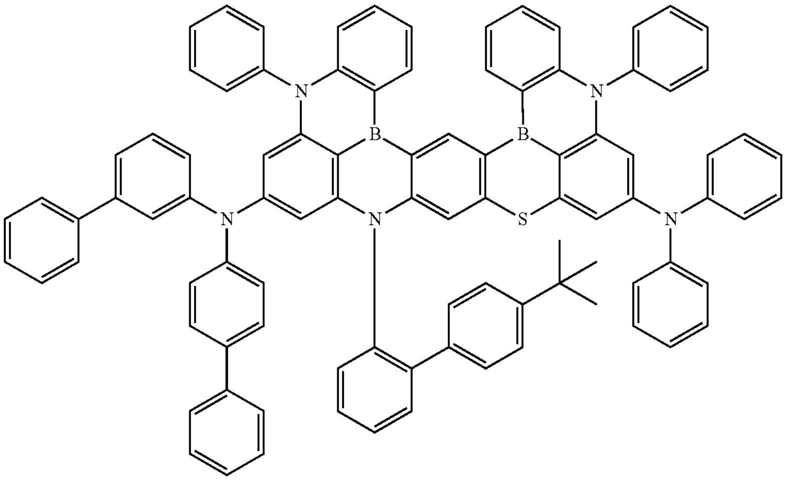
24
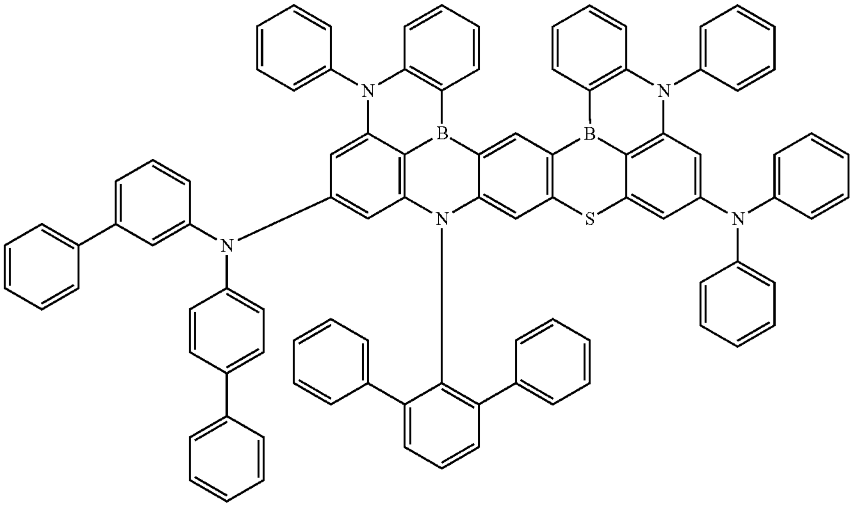

-continued
25
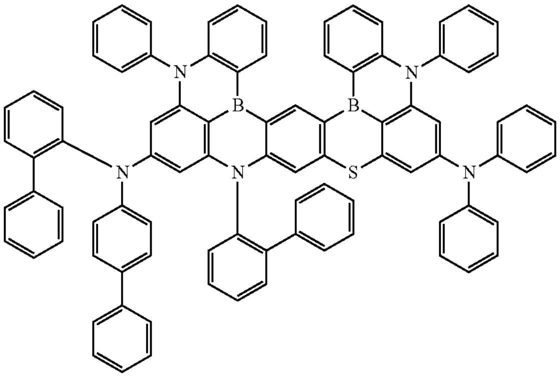
26
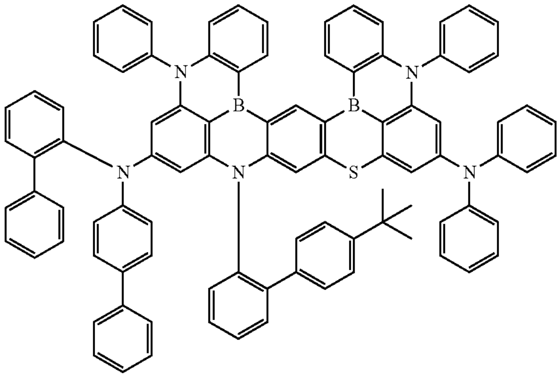
27
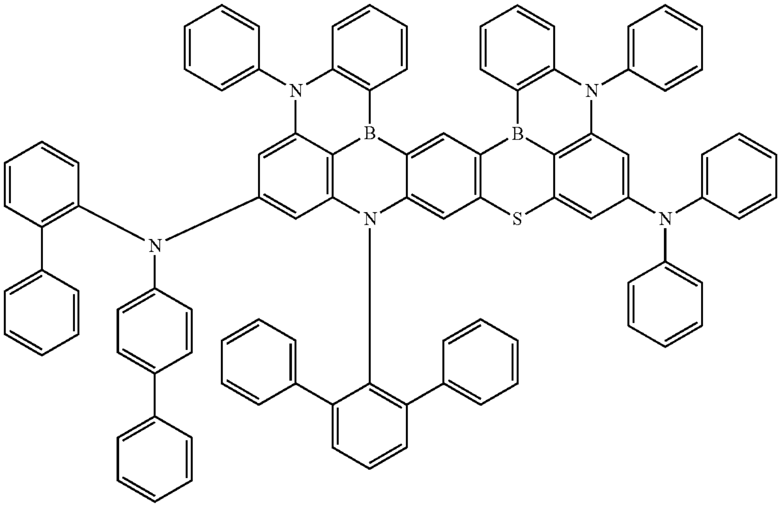
28
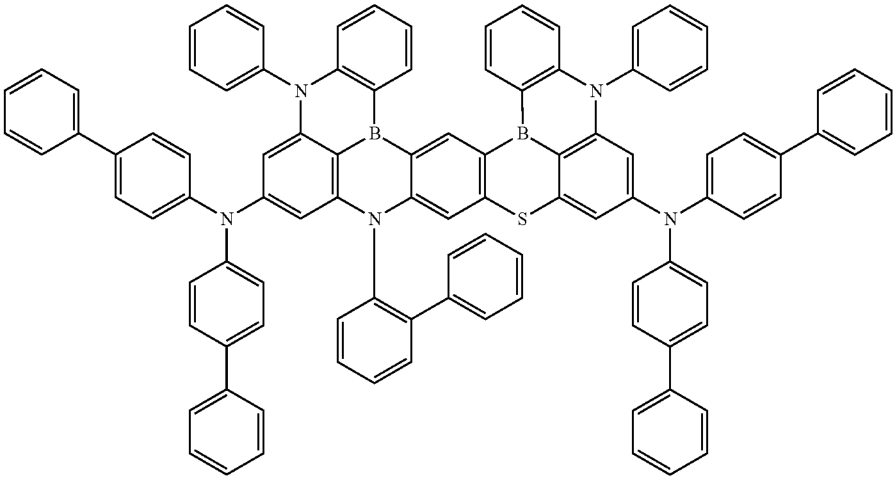

-continued
29
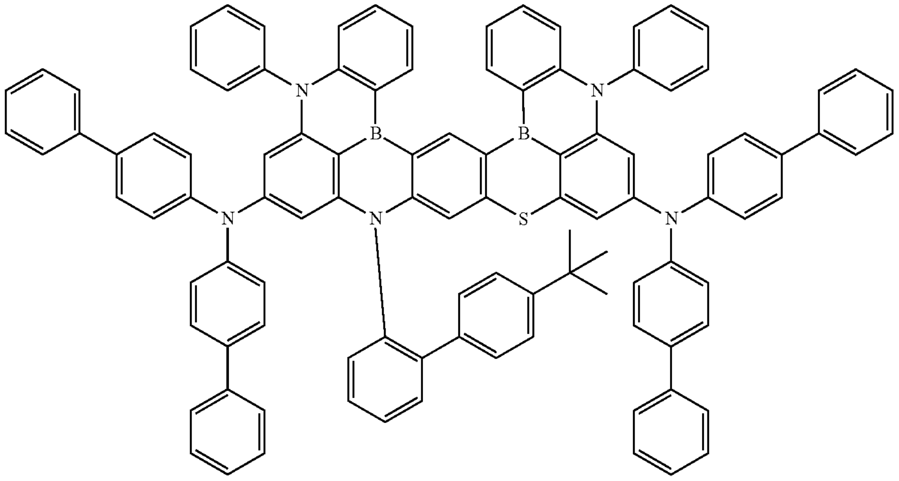
30
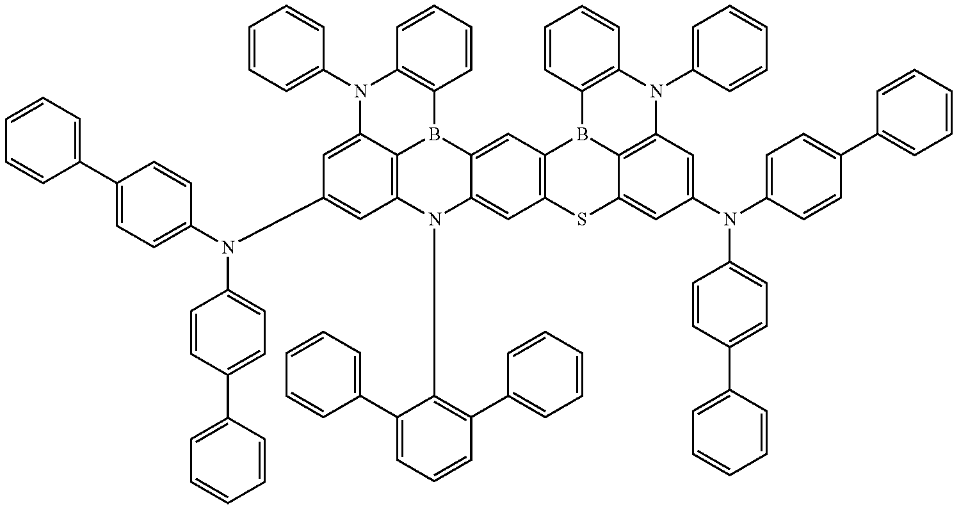
31
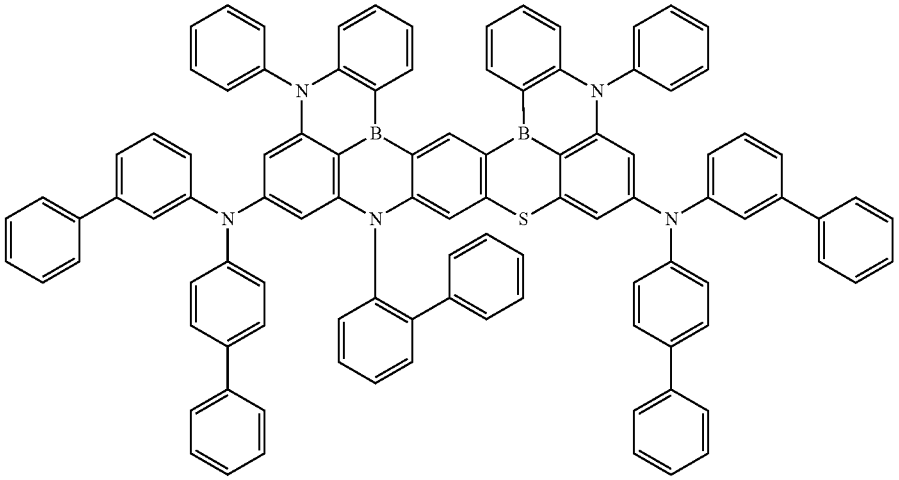

-continued
32
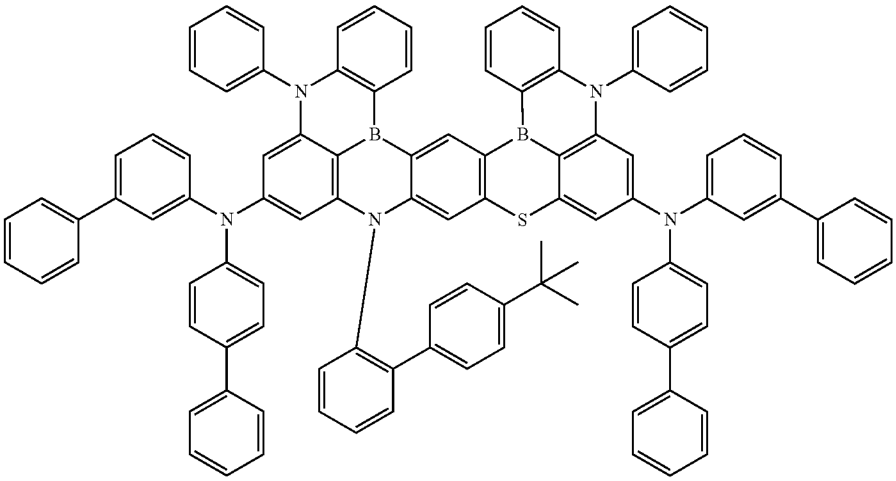
33
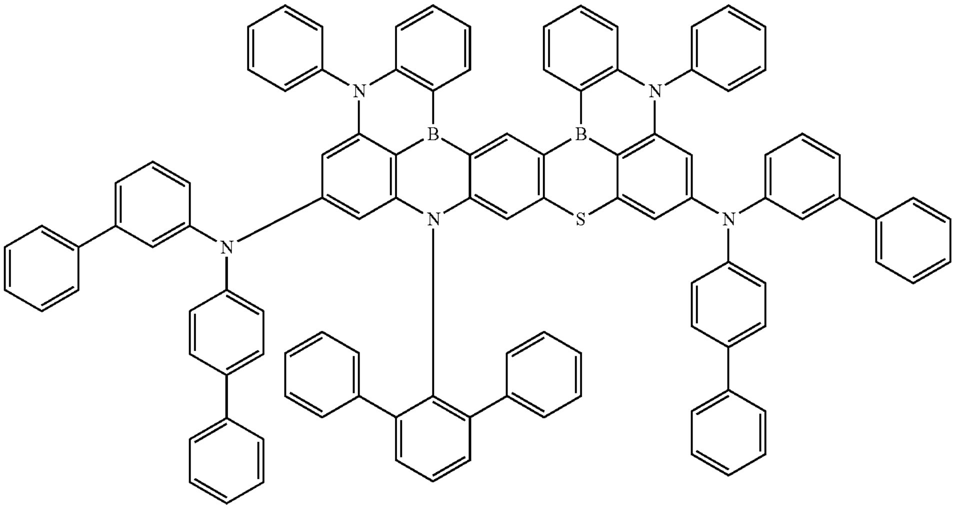
34
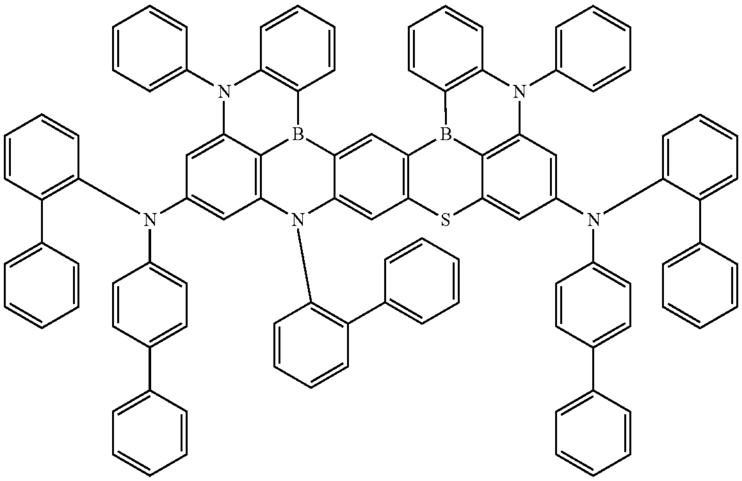

-continued
35
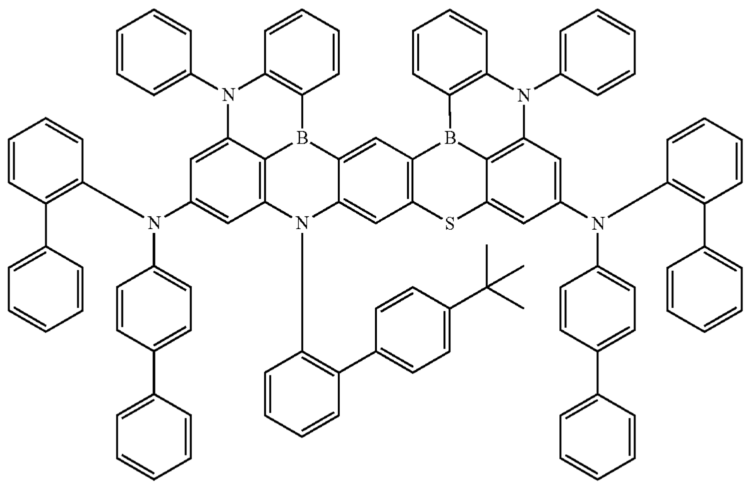
36
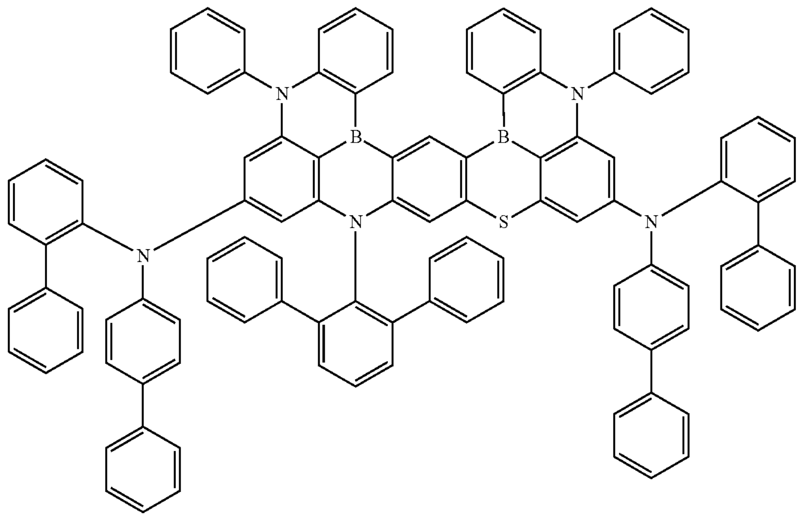
37
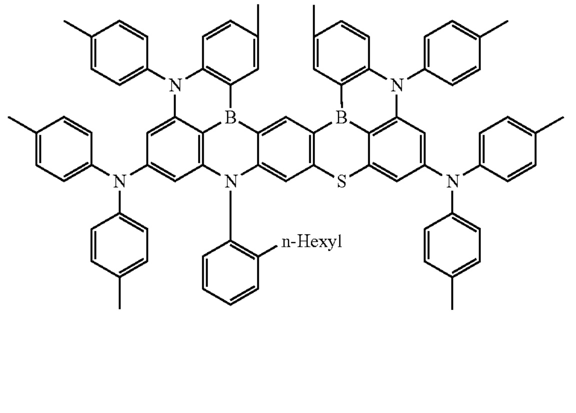
38
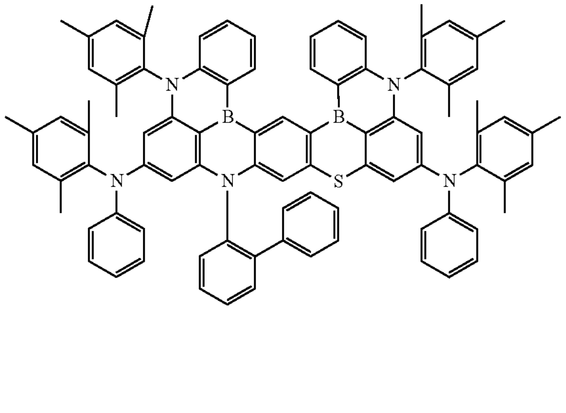

-continued
39
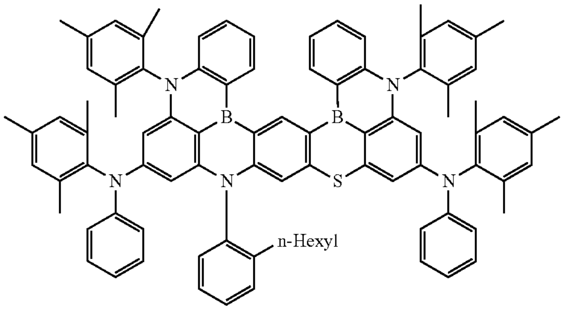
40
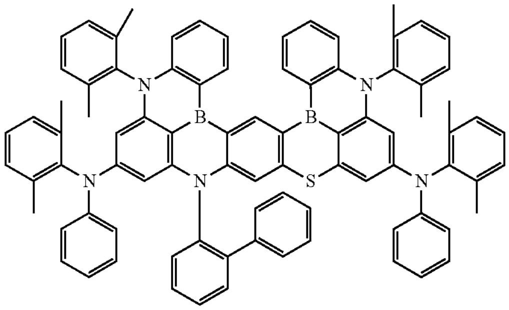
41
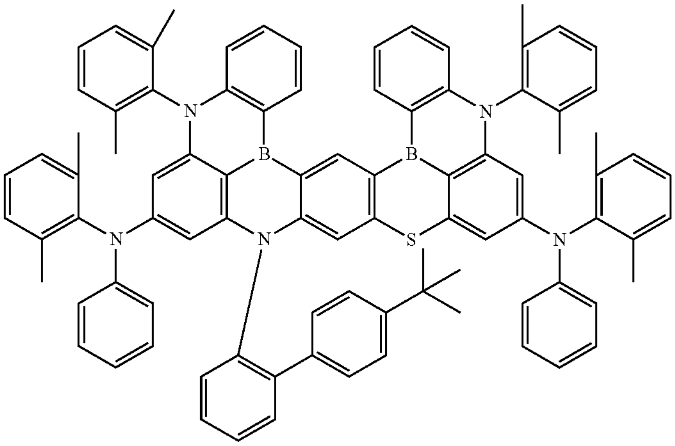
42
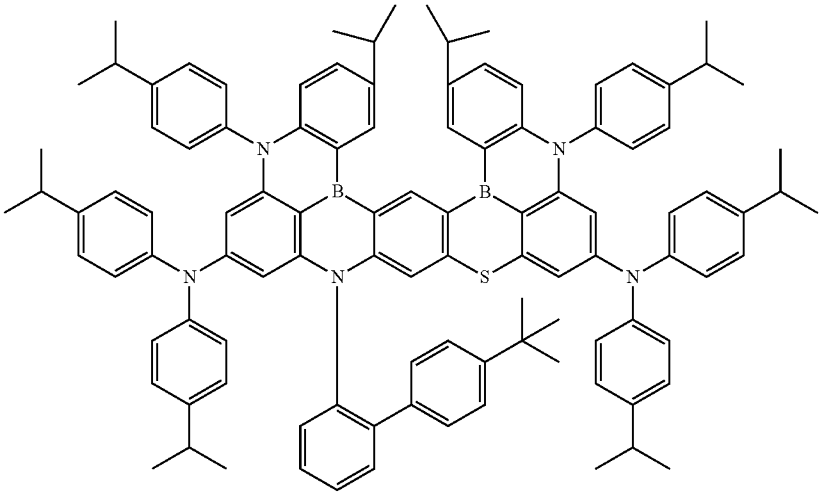

-continued
43
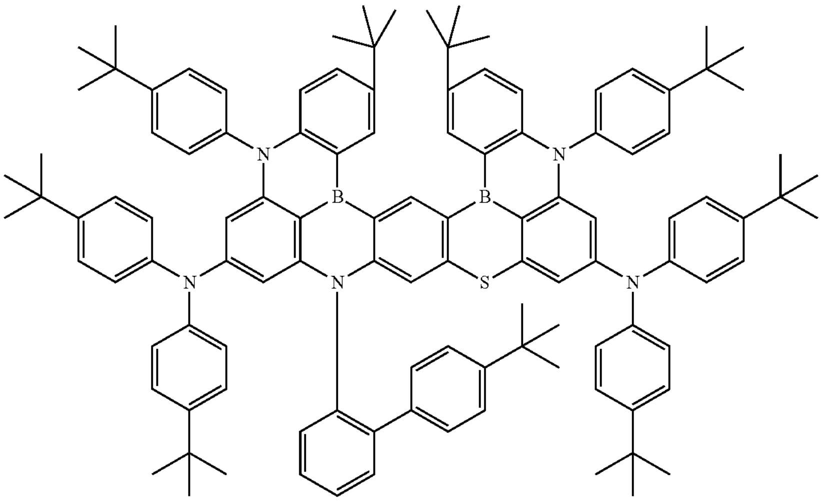
44
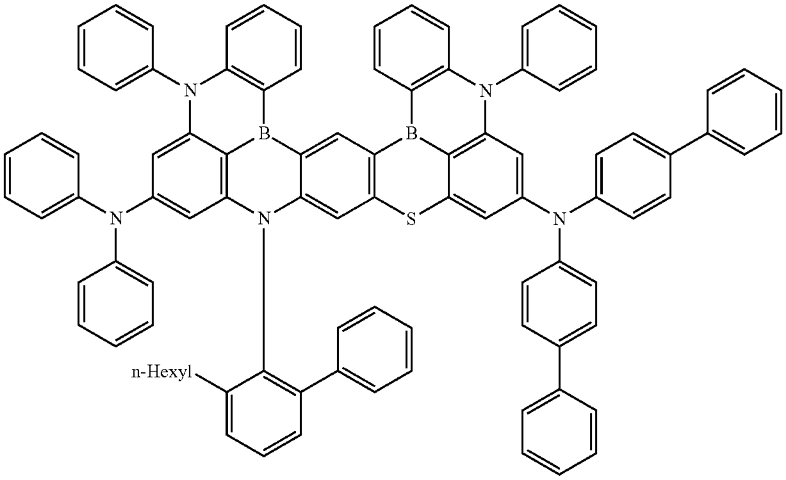
45
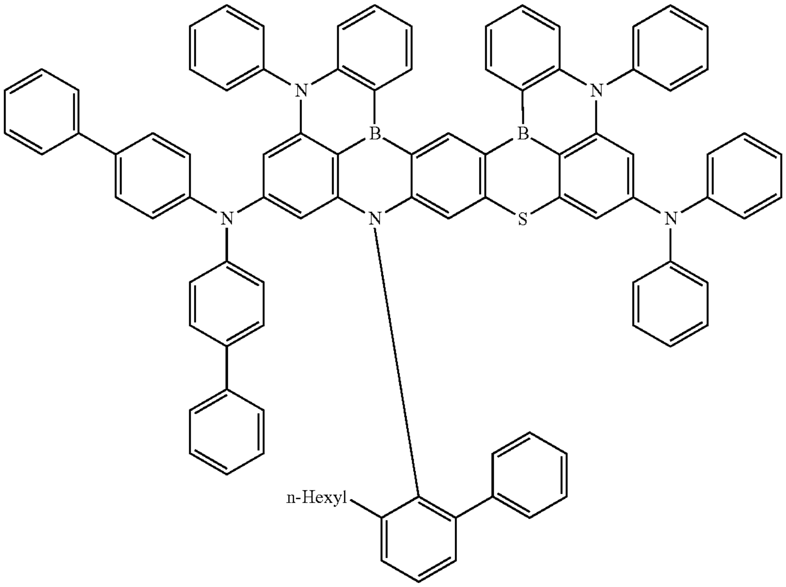

-continued
46
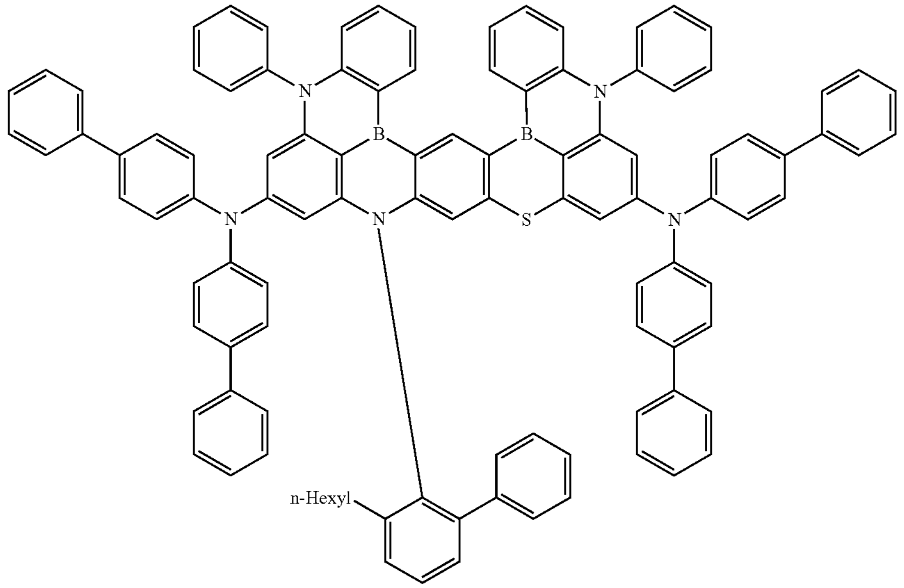
47
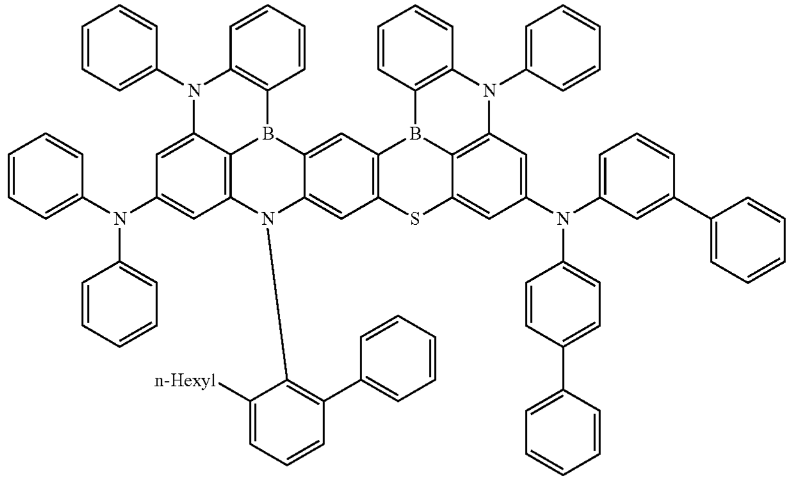
48
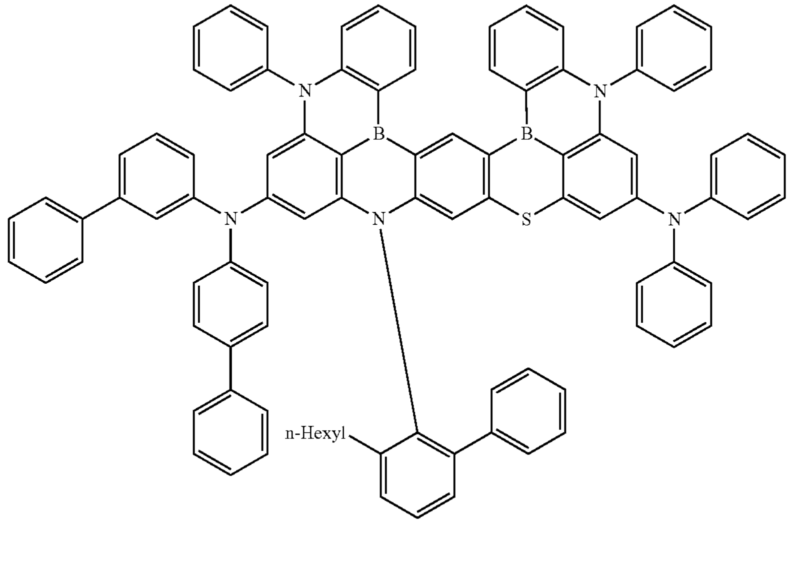

-continued
49
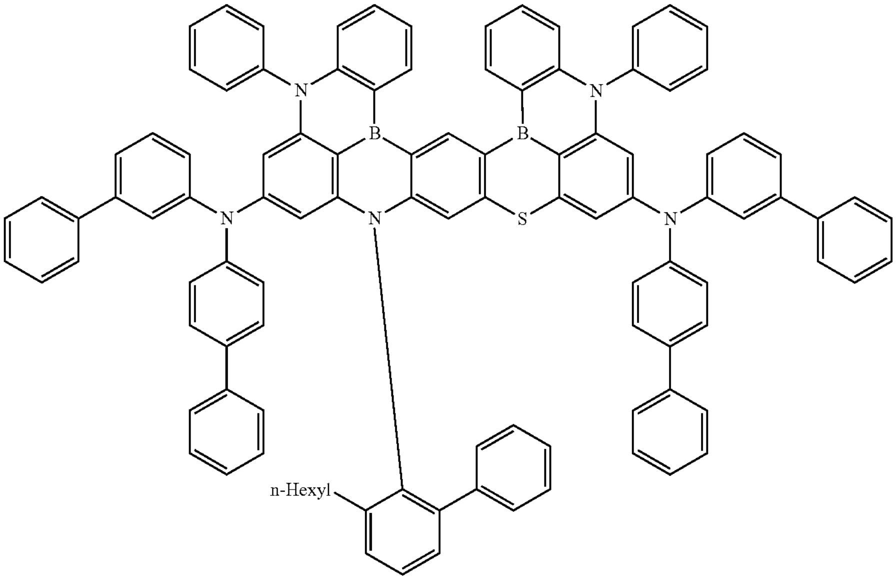
50
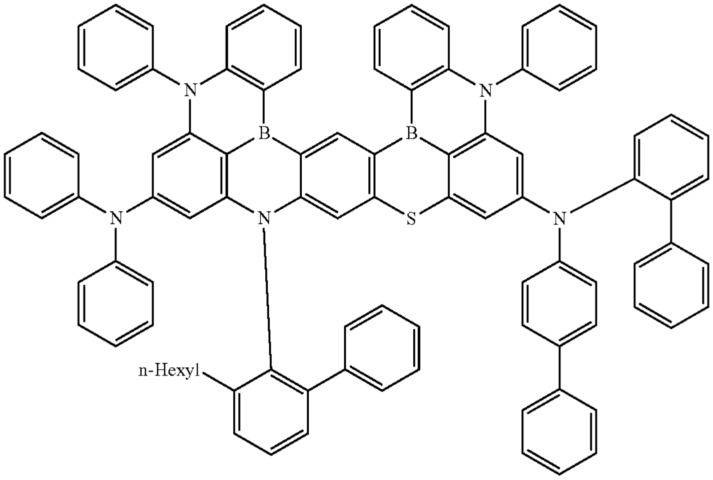
51
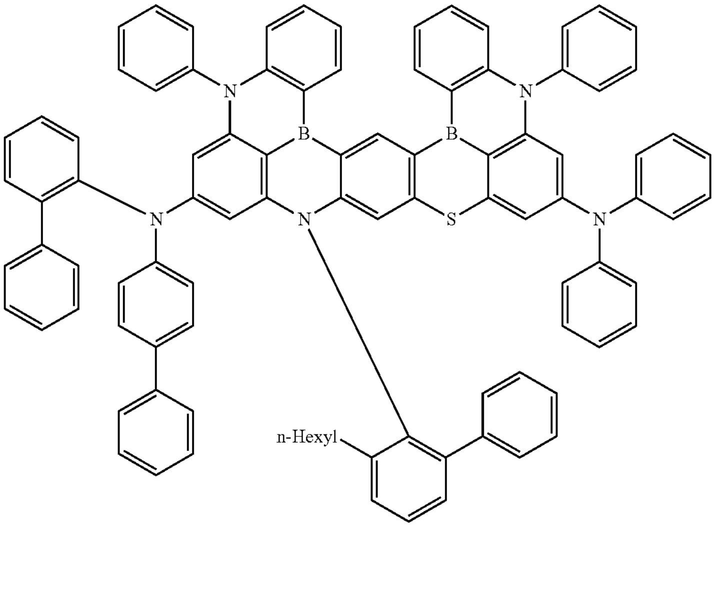

-continued
52
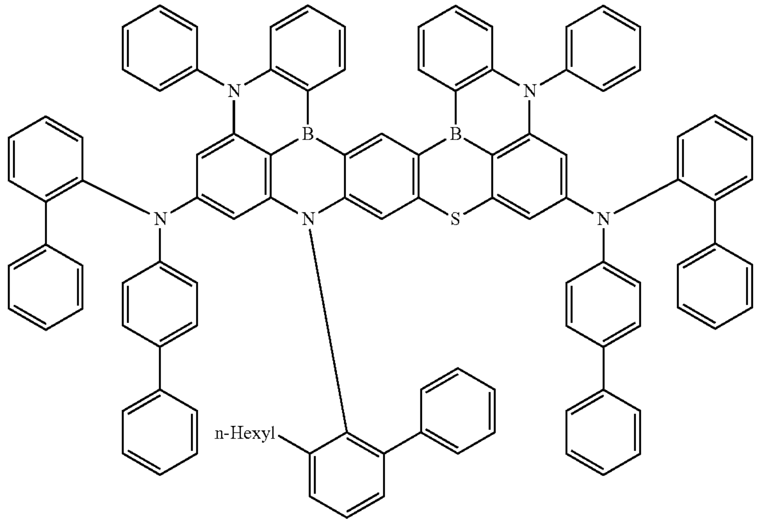
53
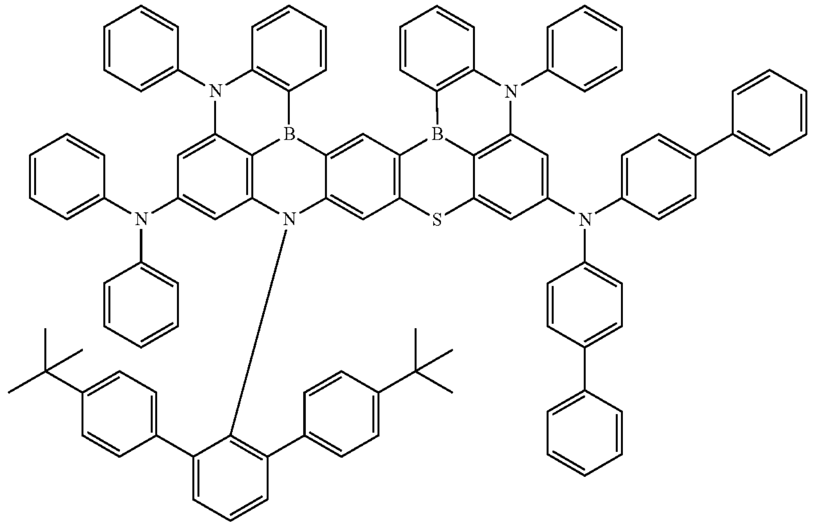
54
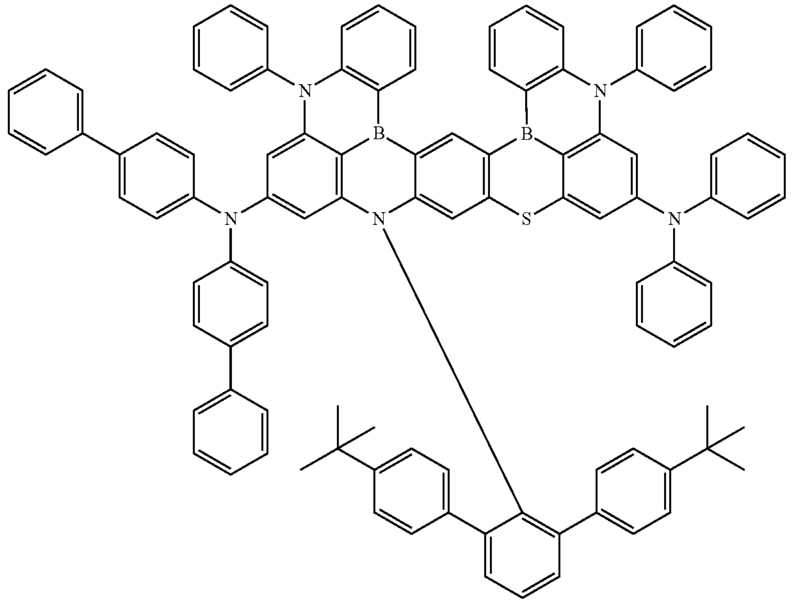

-continued
55
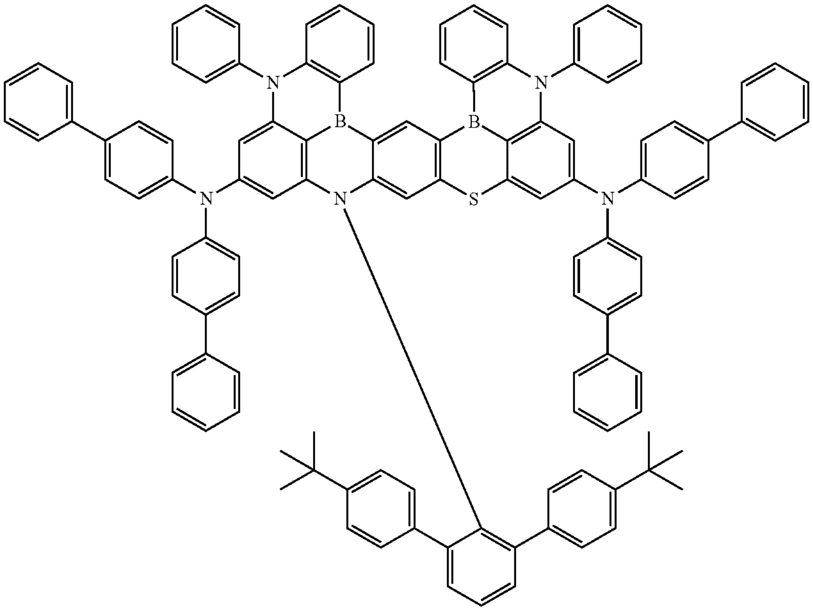
56
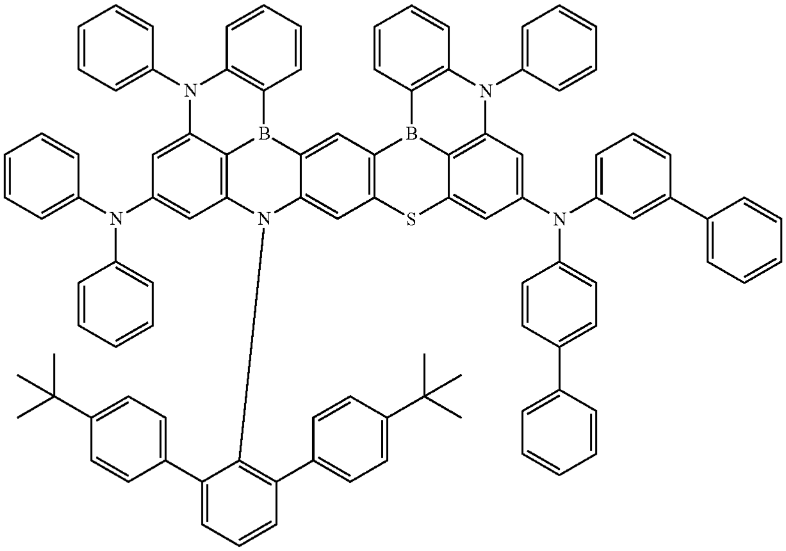

-continued
57
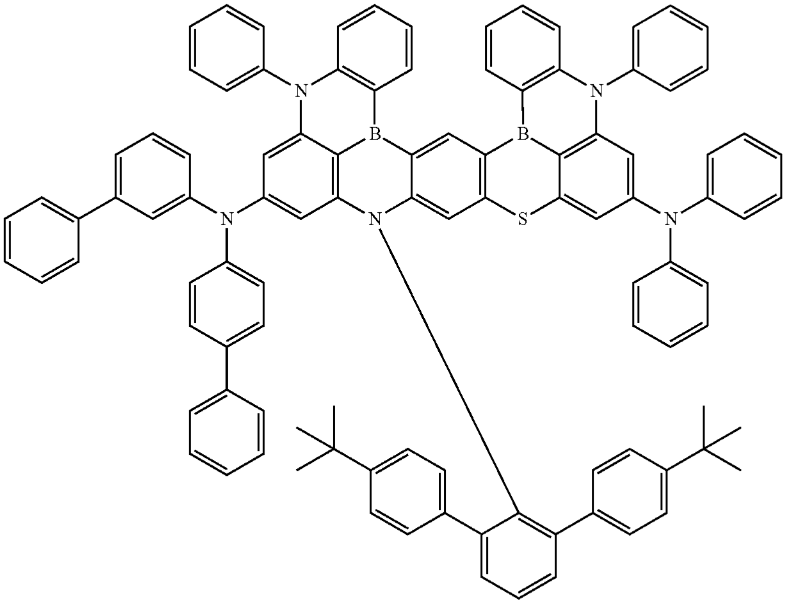
58
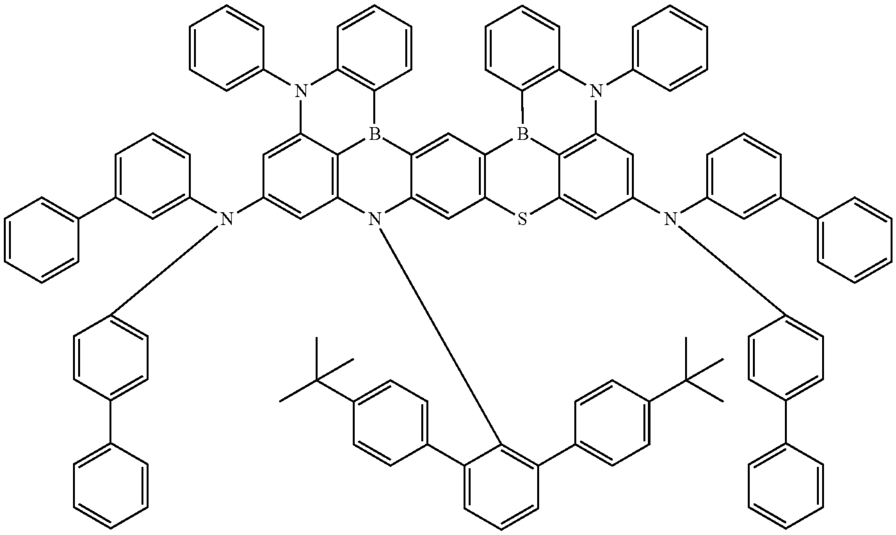
59
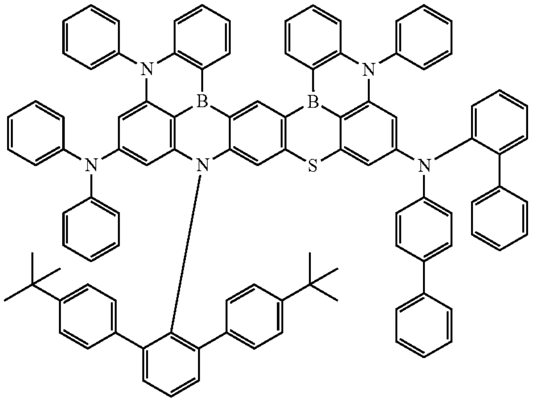
60
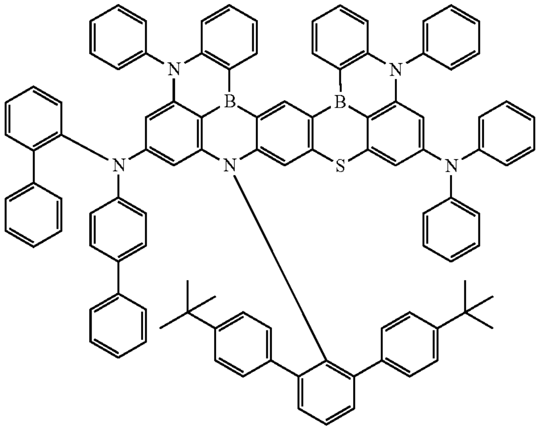

-continued
61
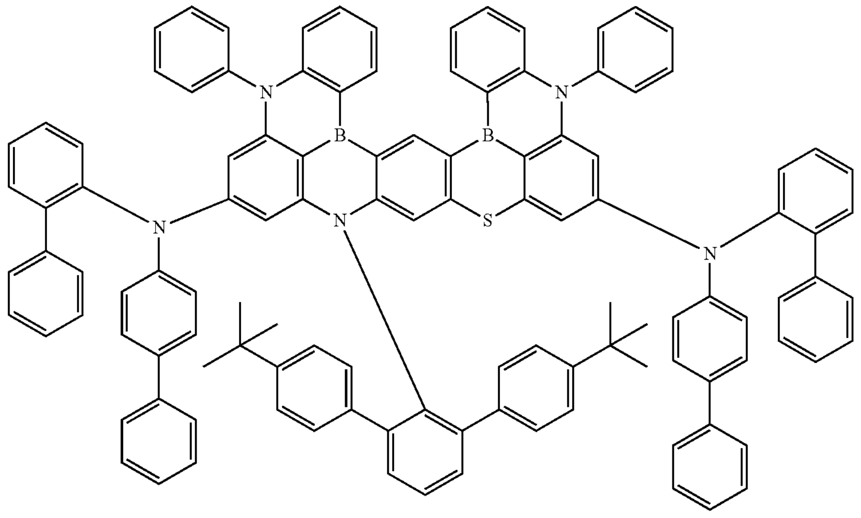
62
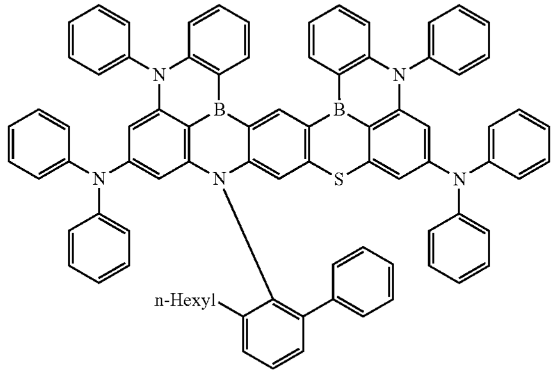
63
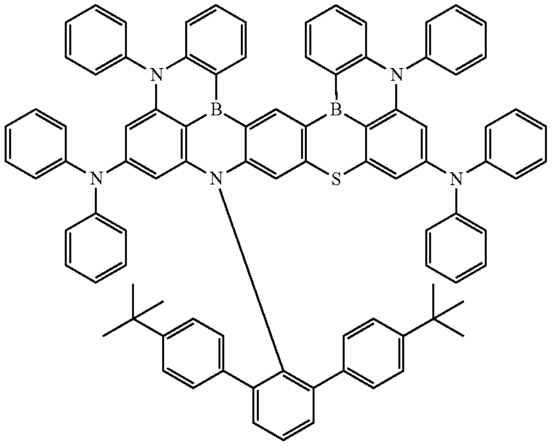
64
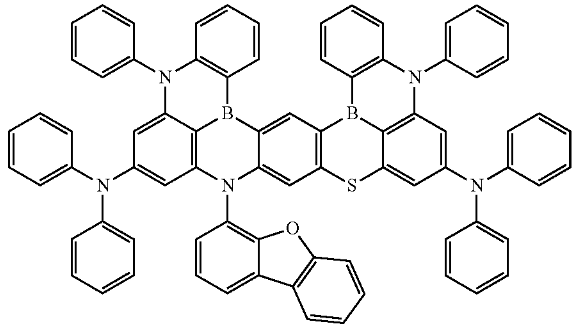
65
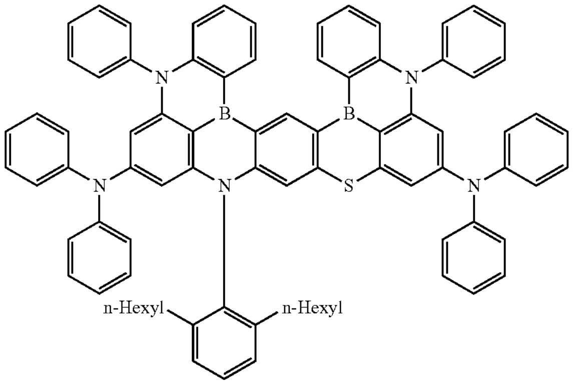

-continued
66
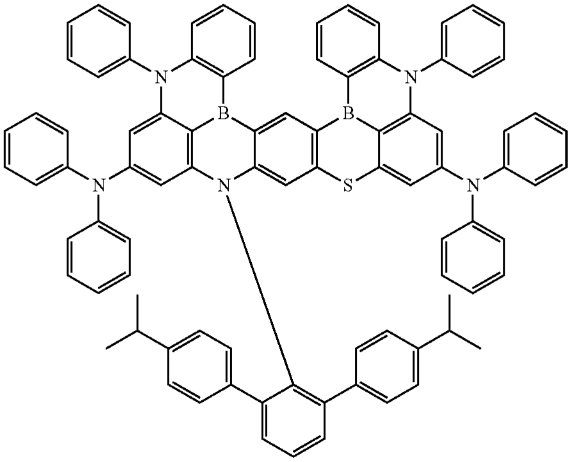
67
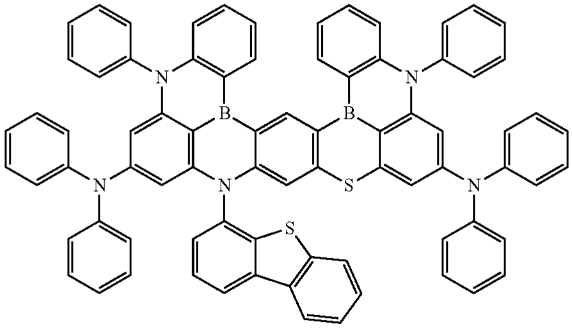
68
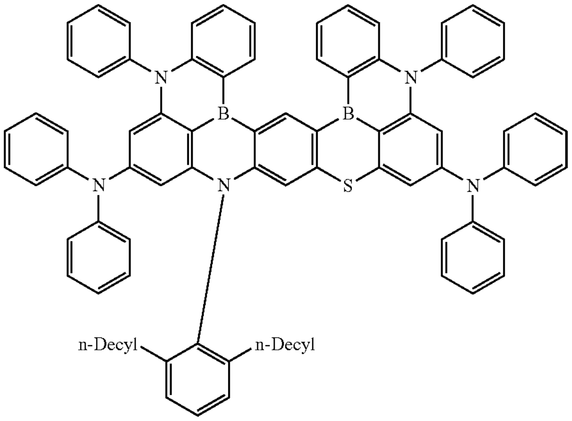
69
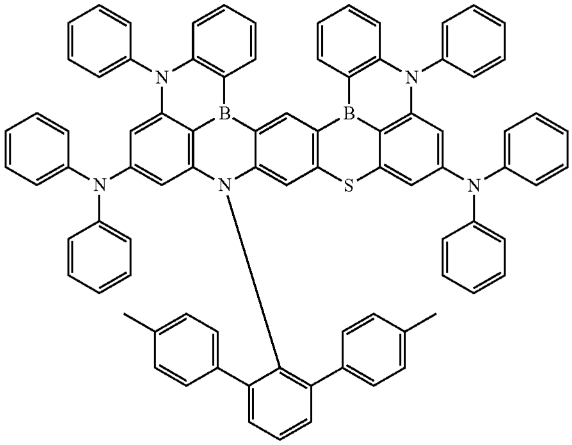
70
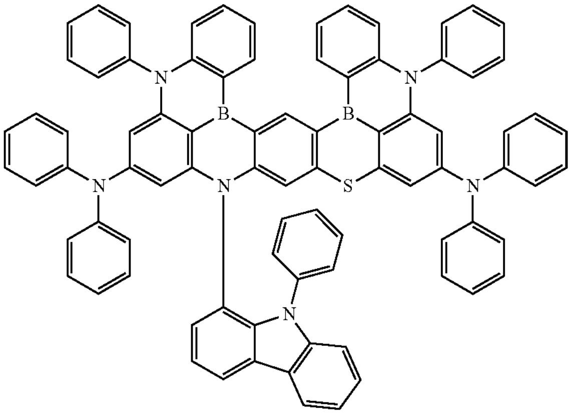
71
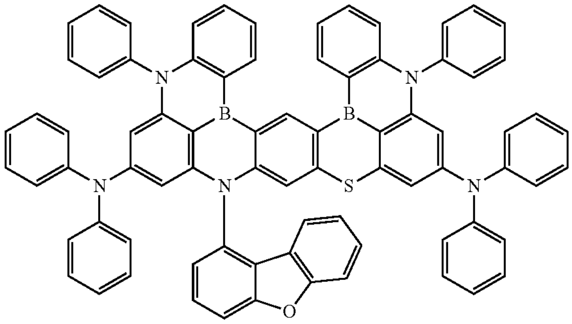

-continued
72
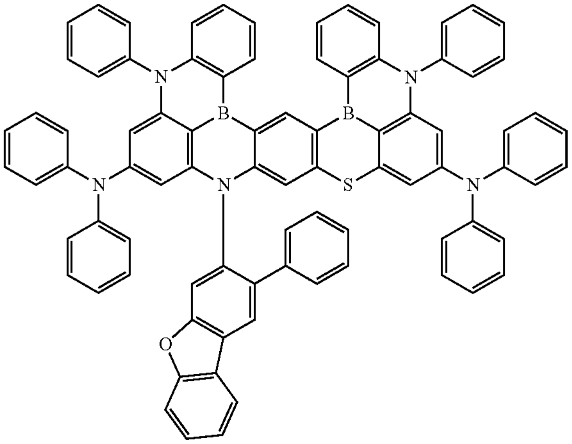
73
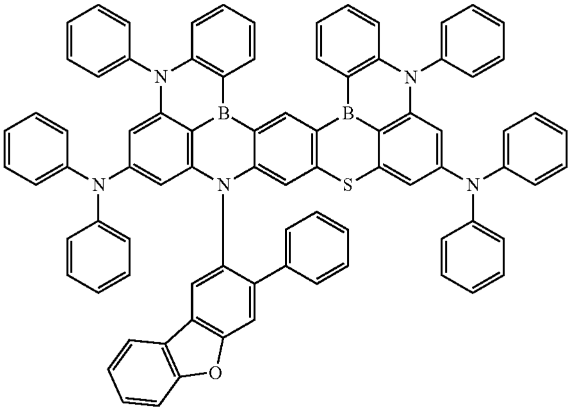
74
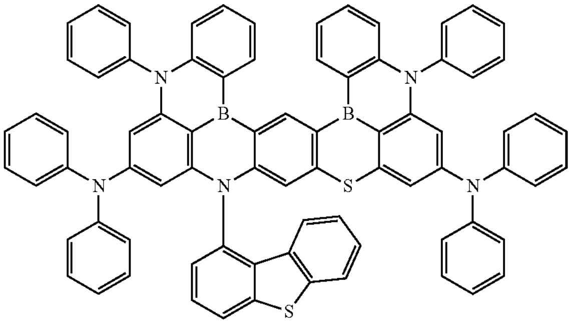
75
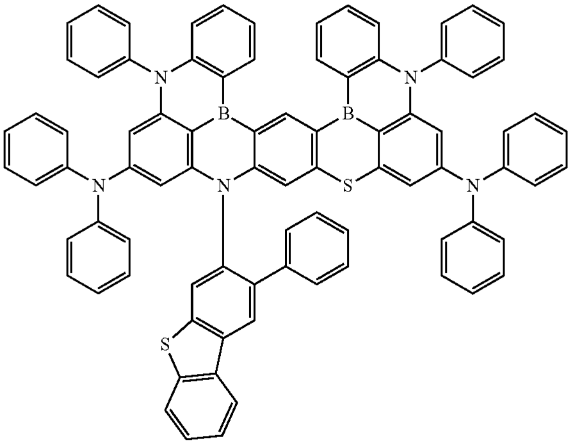
76
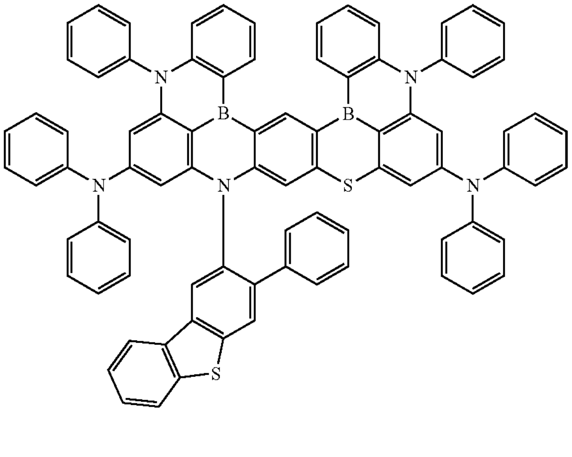
77
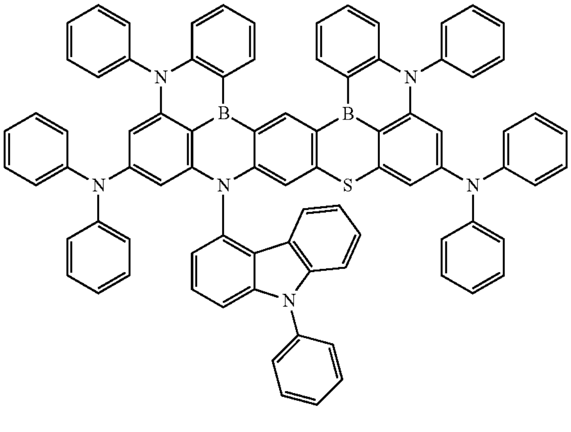

-continued
78
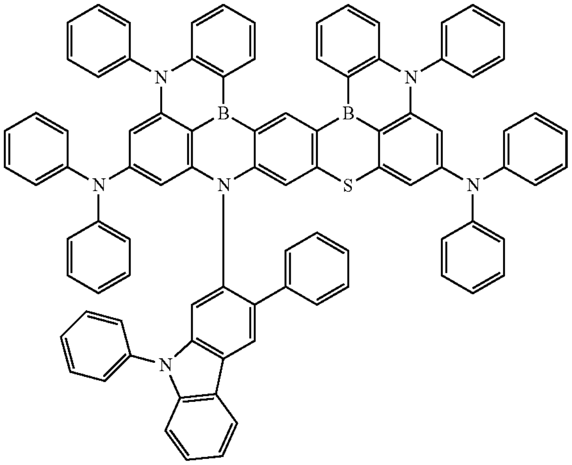
79
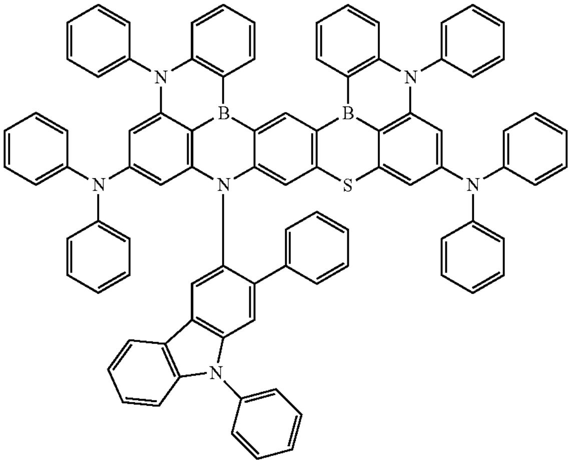
80
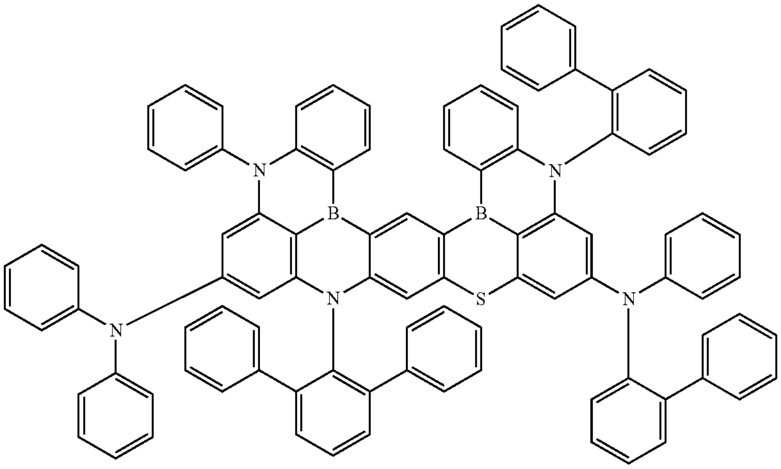
81
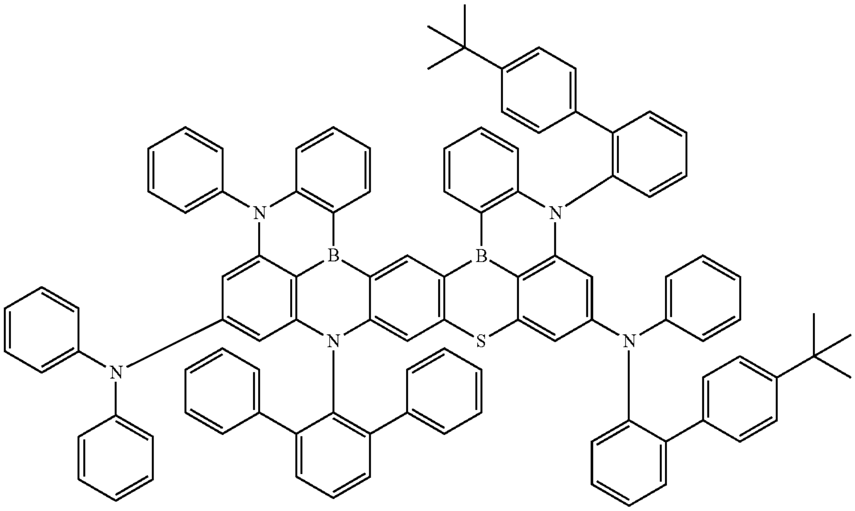

-continued
82
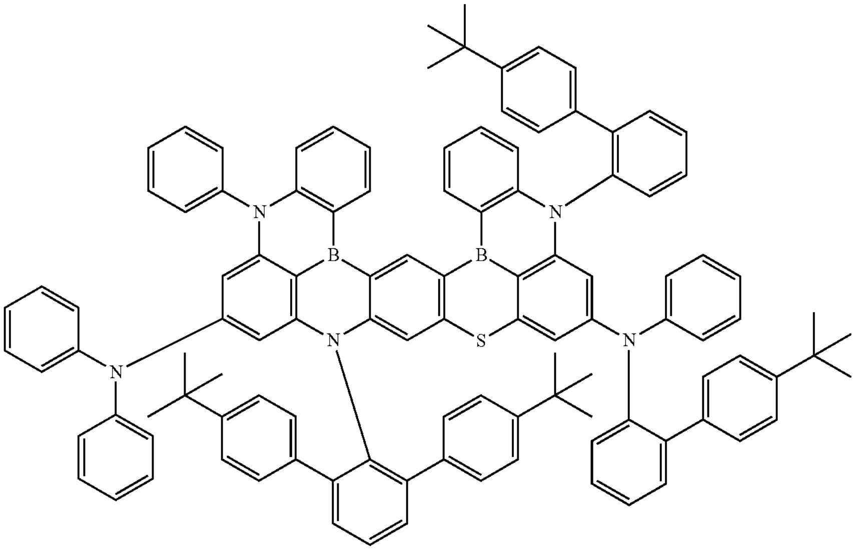
83
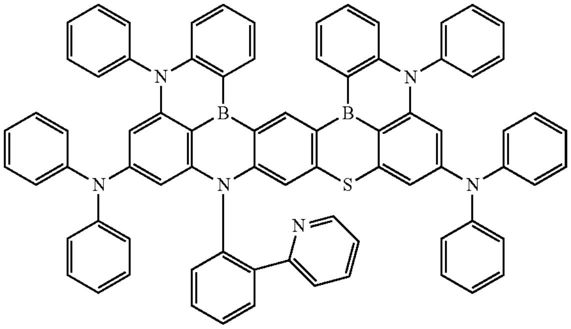
84
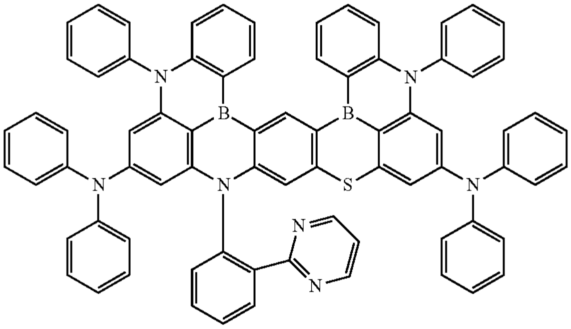
85
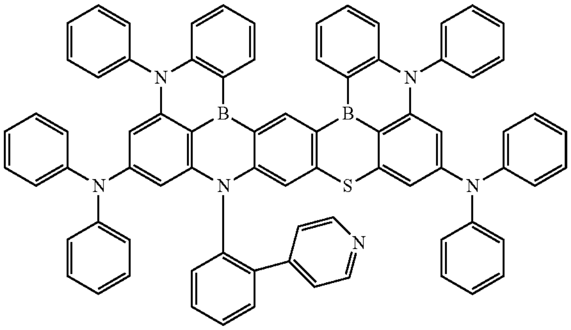
86
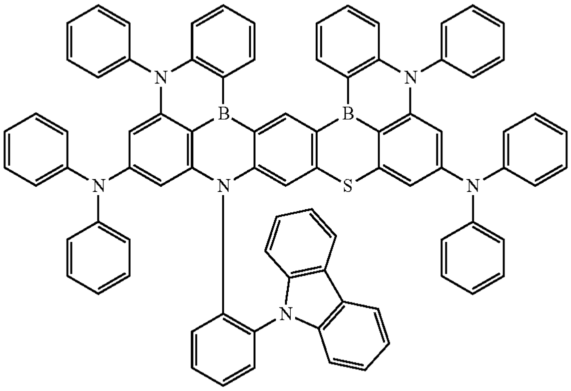

-continued
87
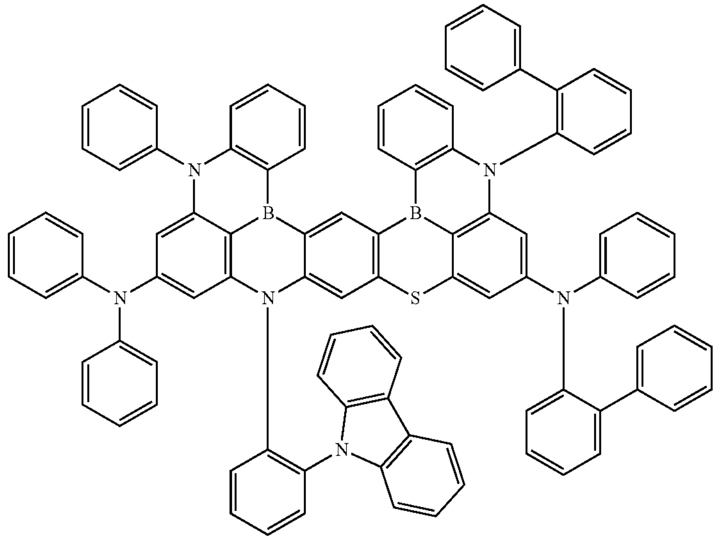
88
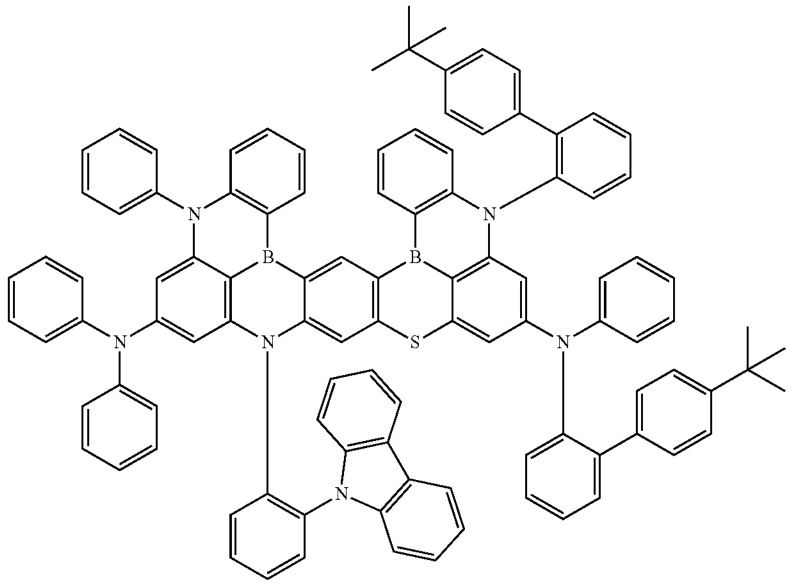
89
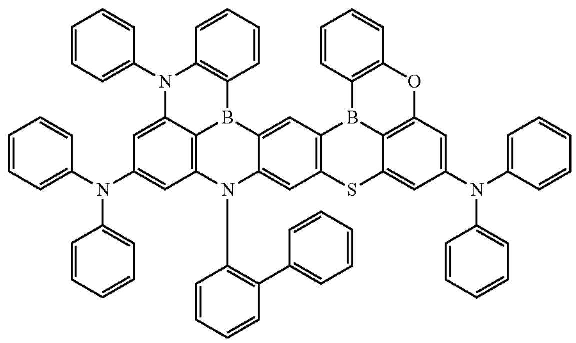
90
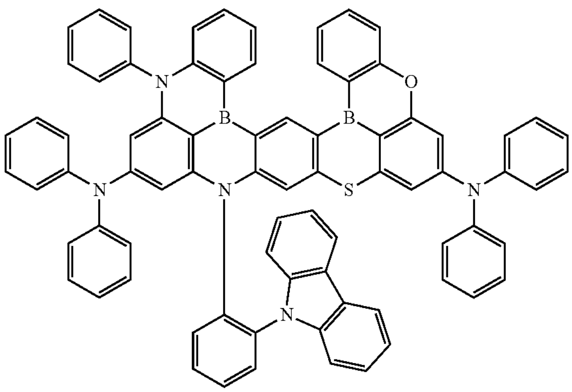

-continued
91
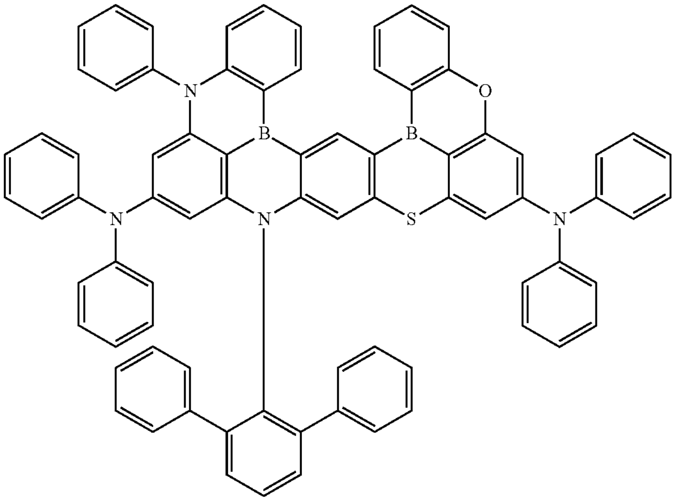
92
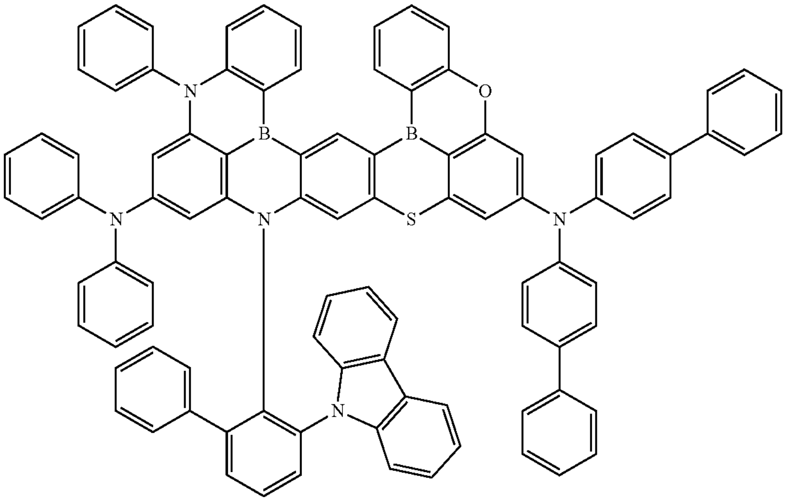
93
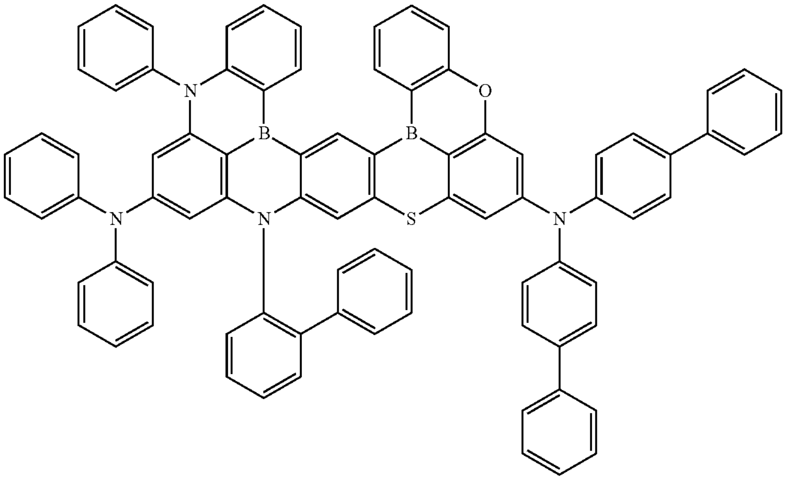

-continued
94
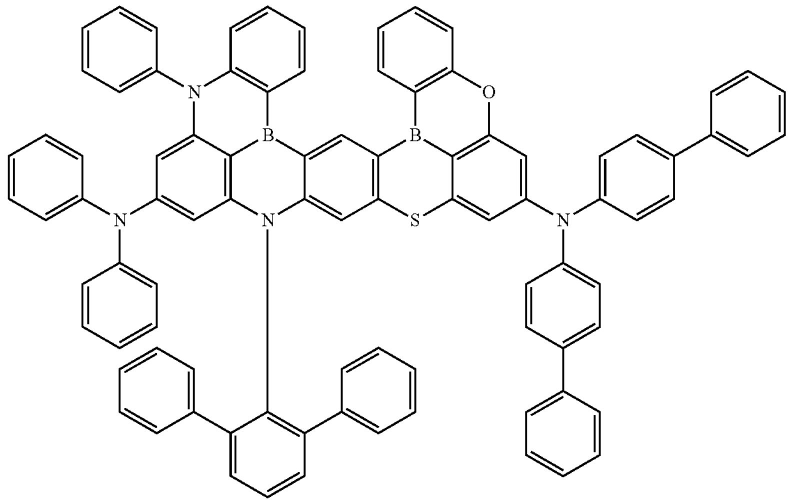
95
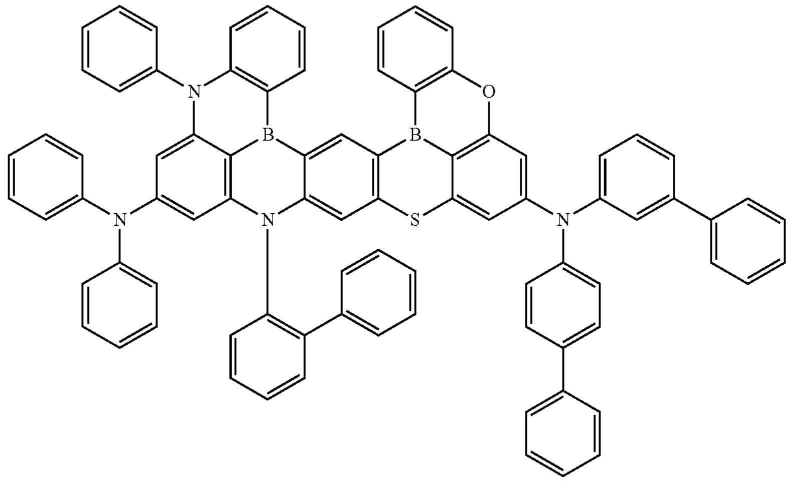
96
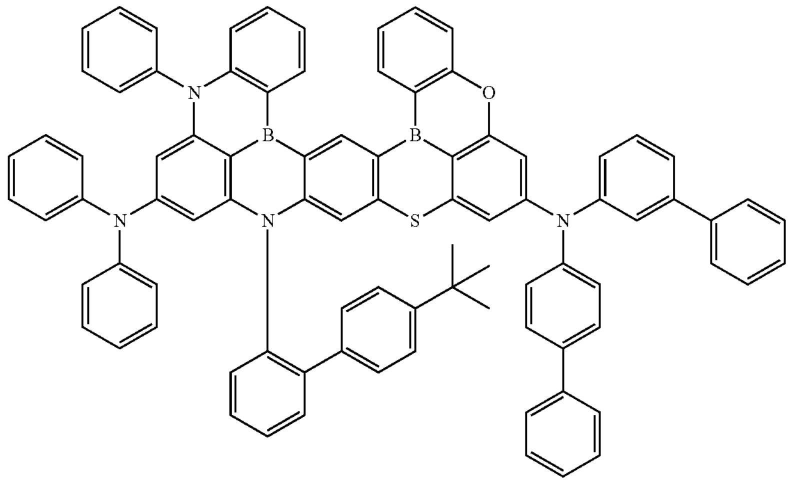

-continued
97
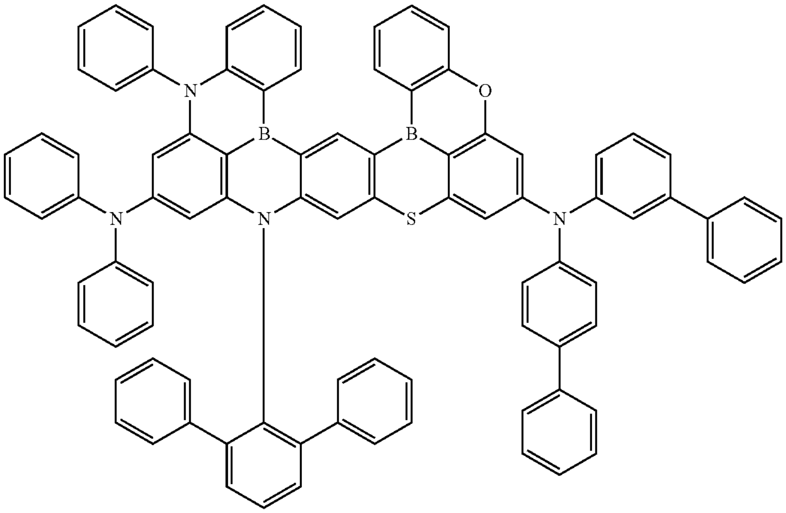
98
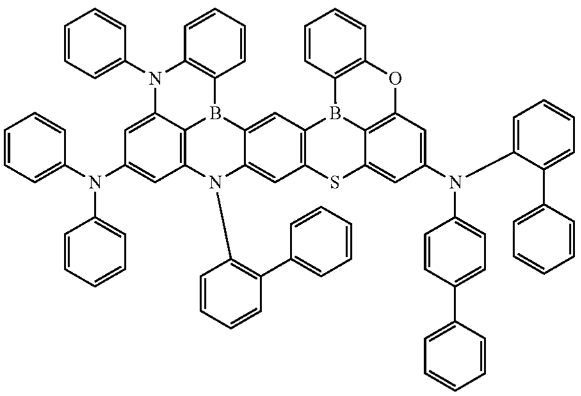
99
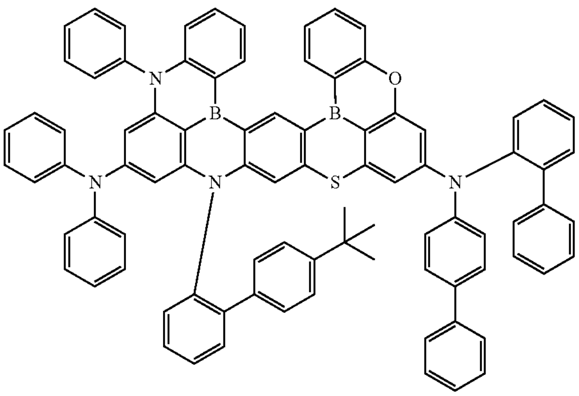
100
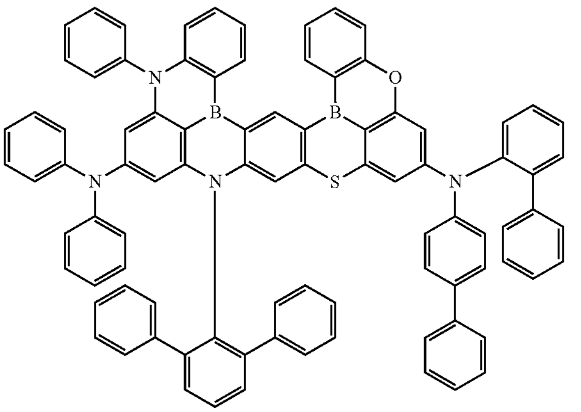
101
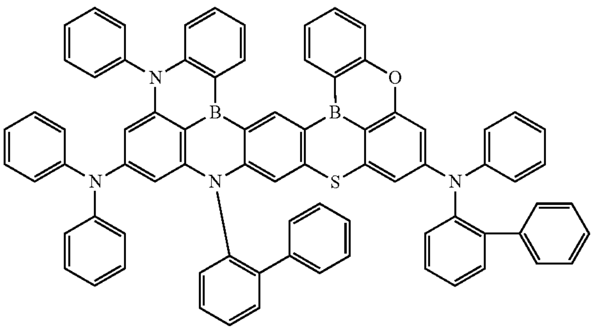

-continued
102
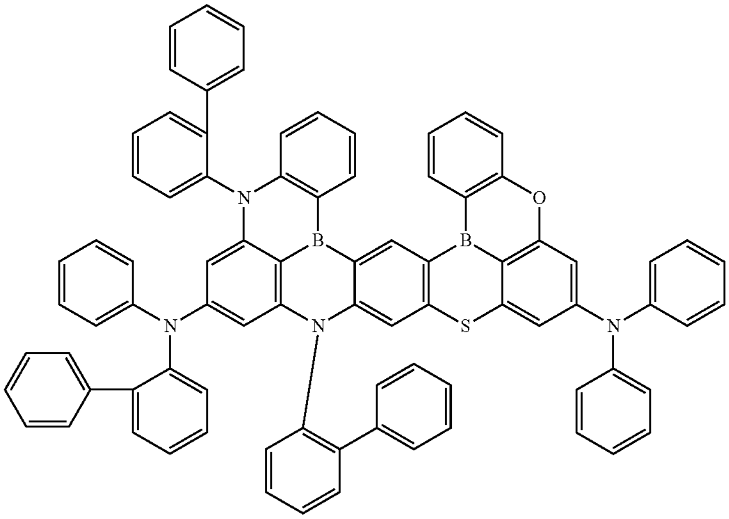
103
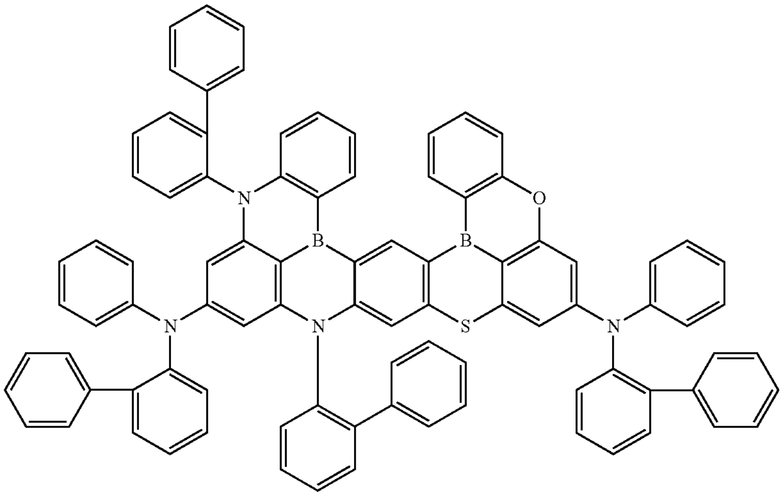
104
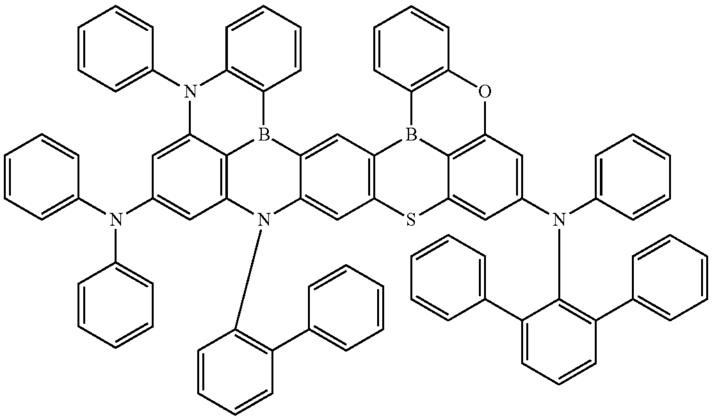

-continued
105
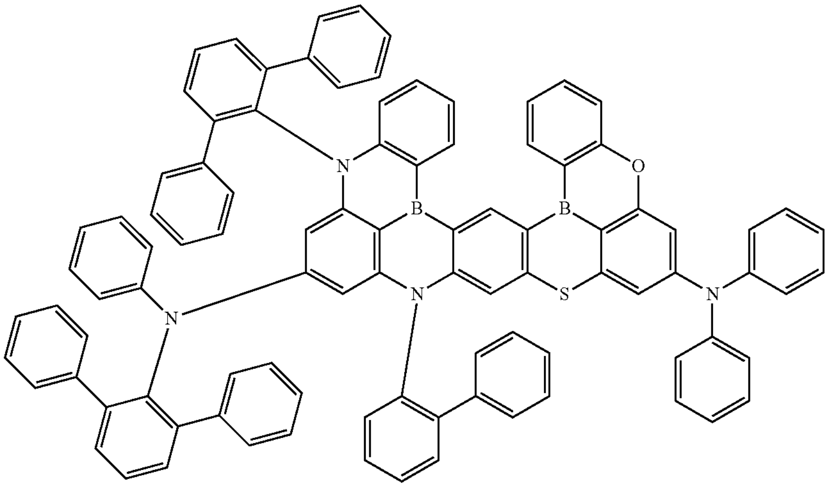
106
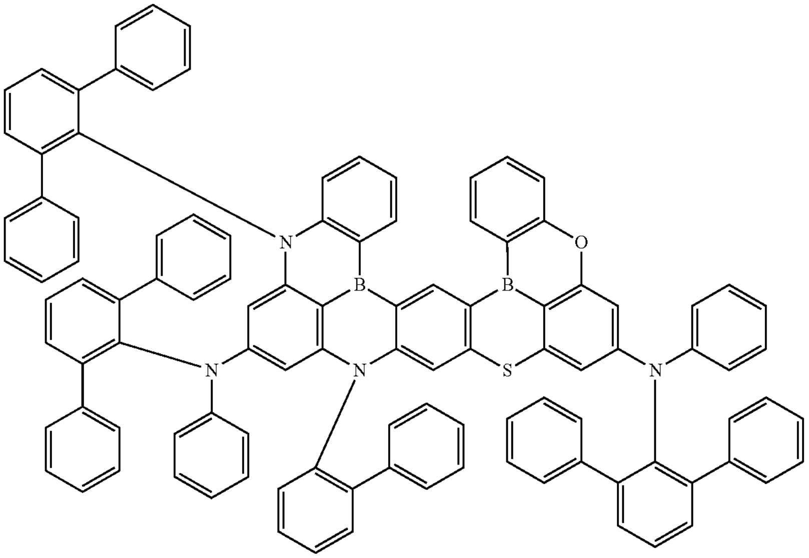
107
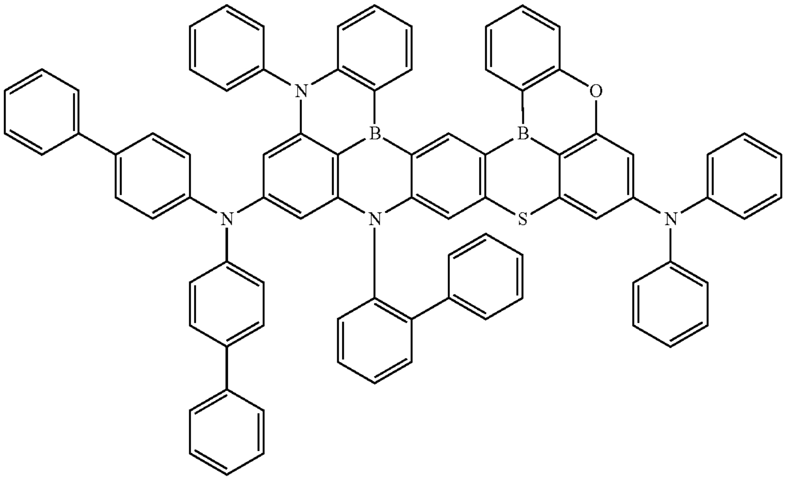

-continued
108
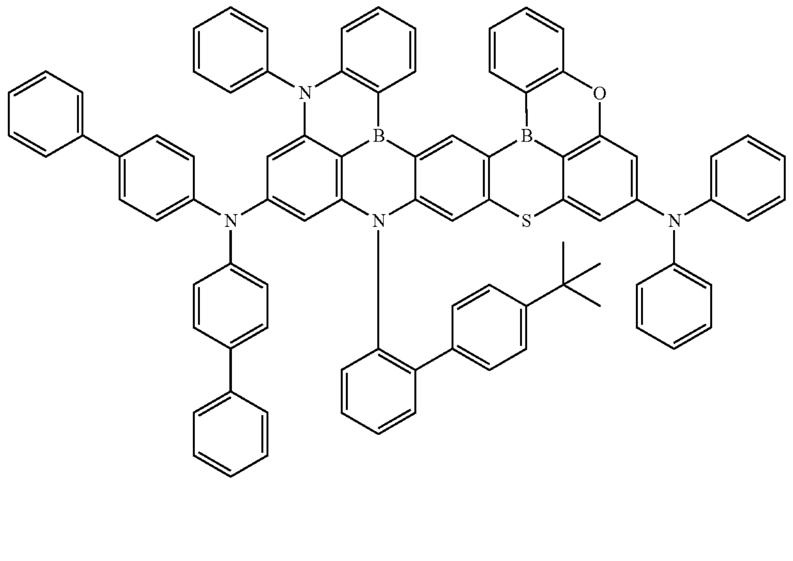
109
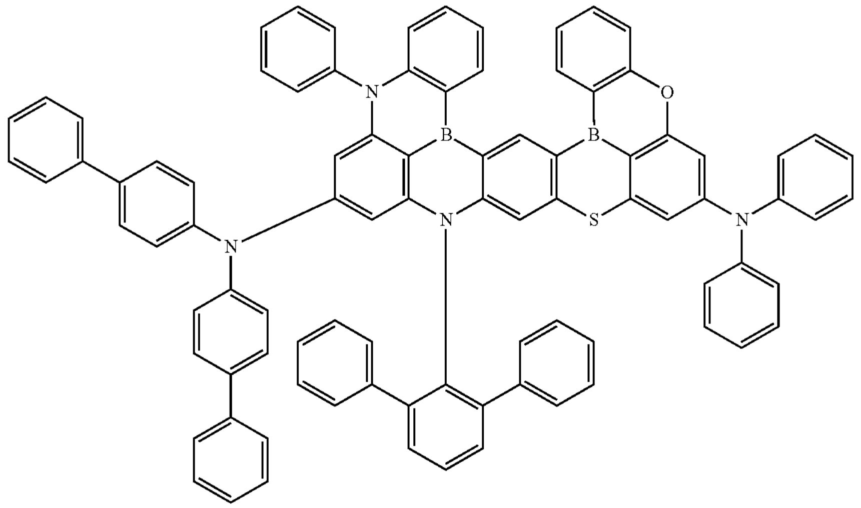
110
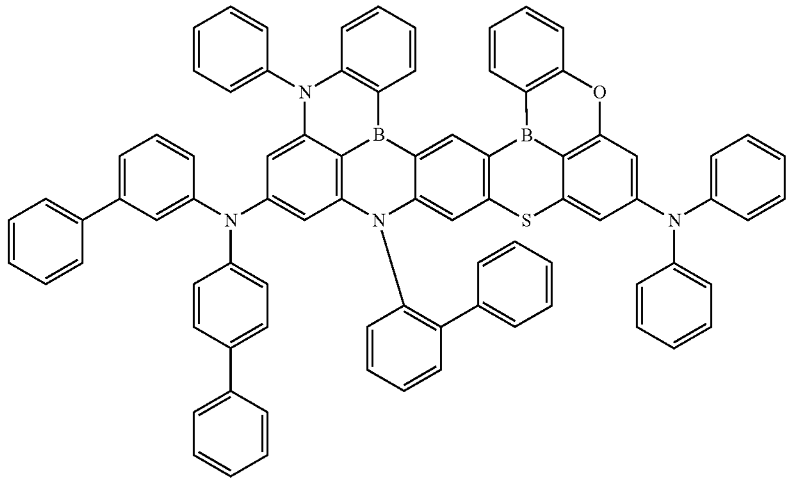

-continued
111
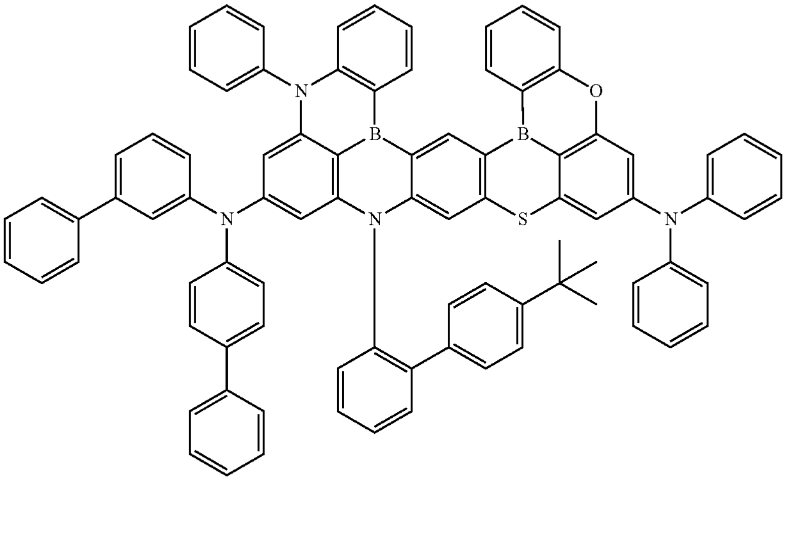
112
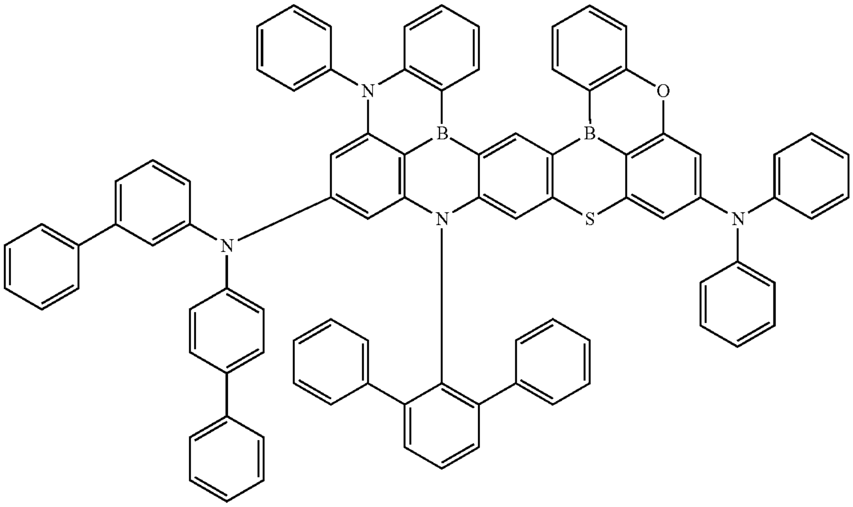
113
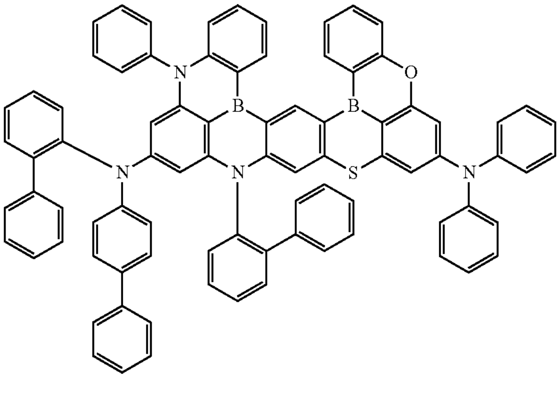
114
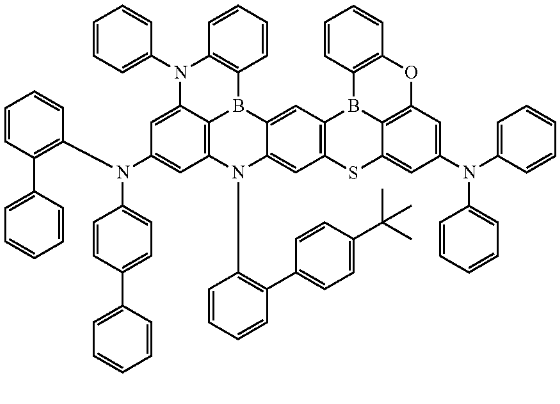

-continued
115
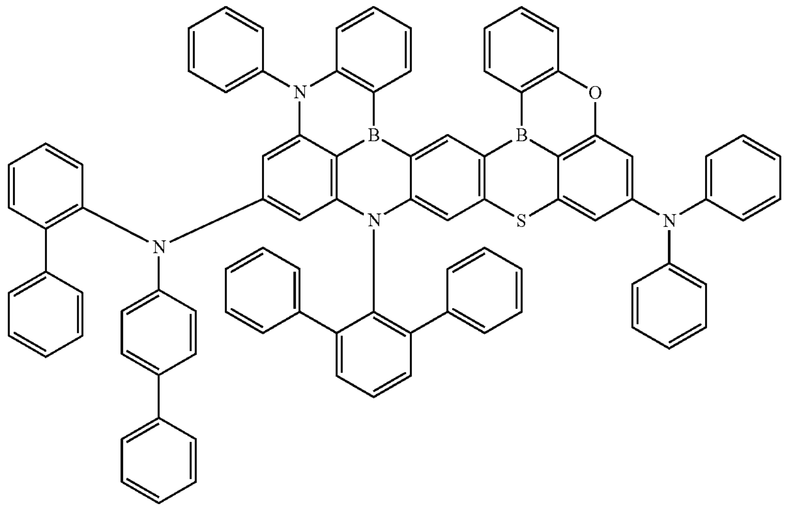
116
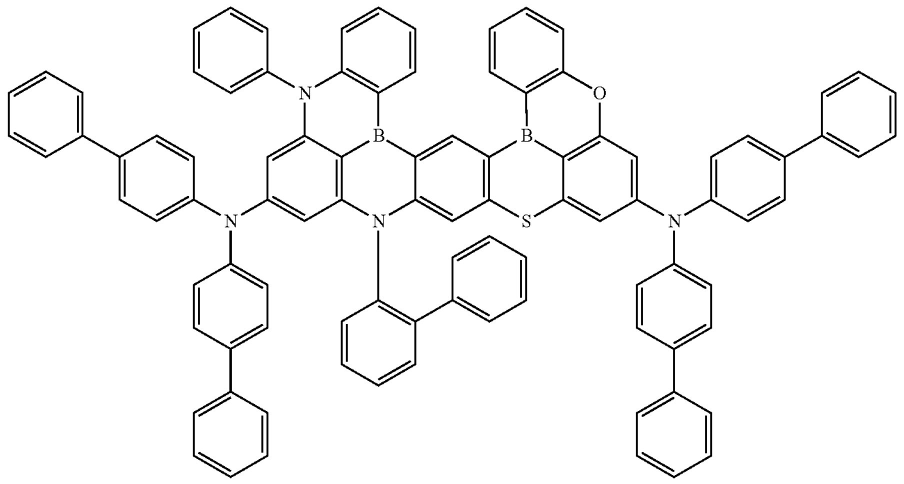
117
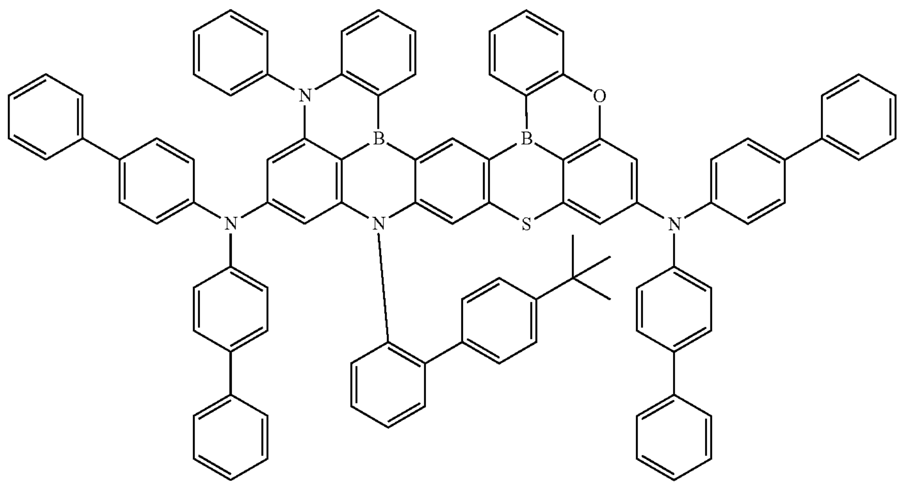

-continued
118
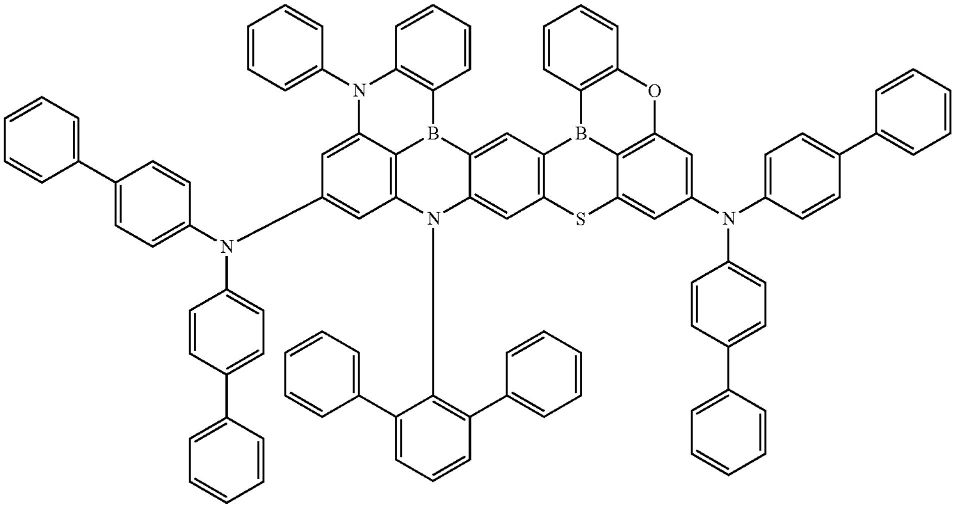
119
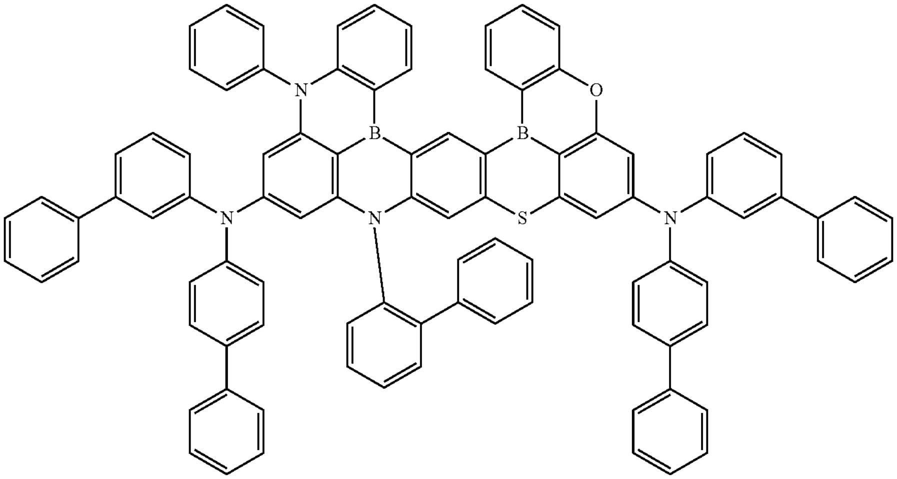
120
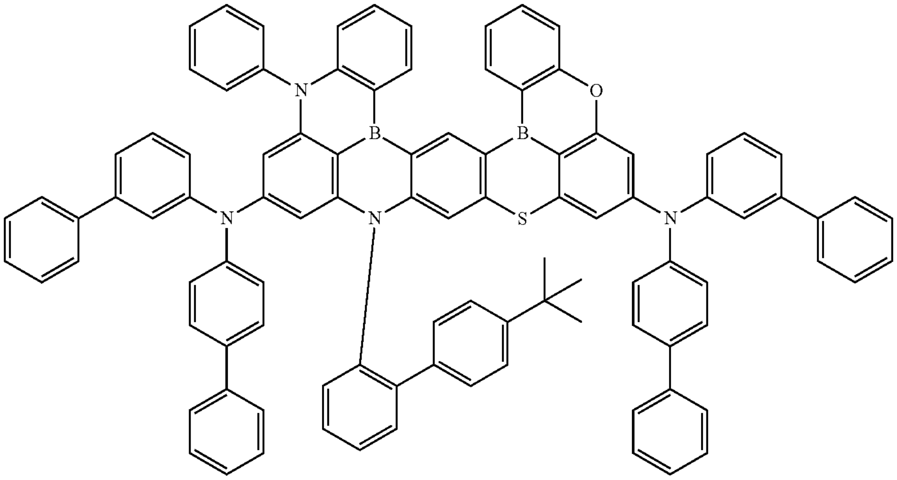

-continued
121
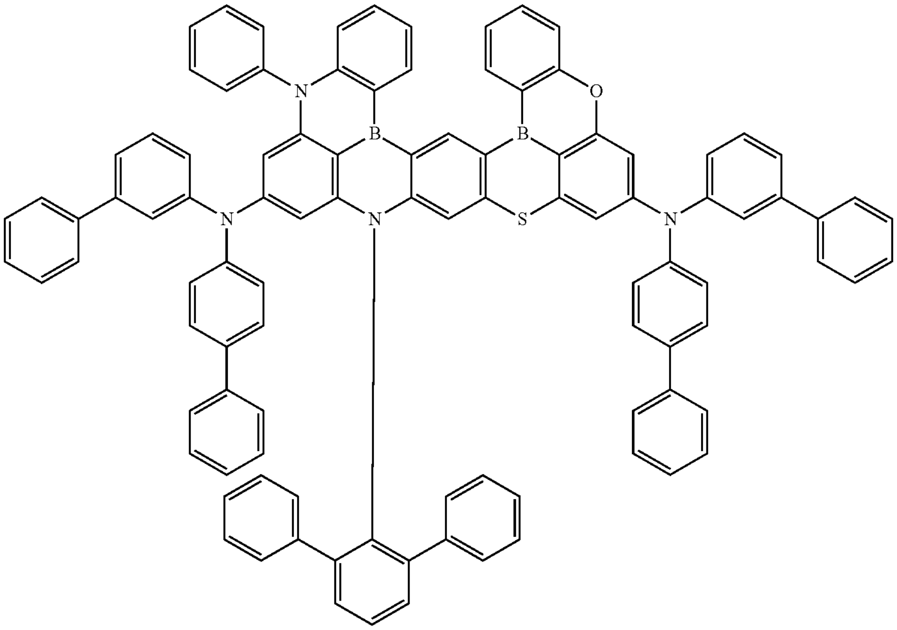
122
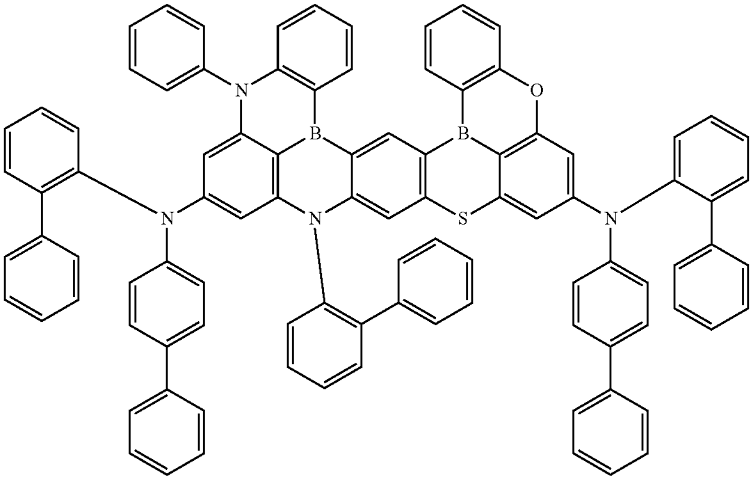
123
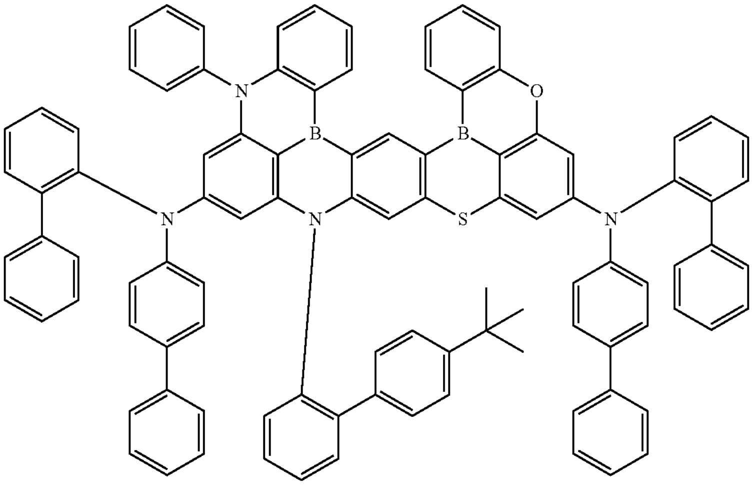

-continued
124
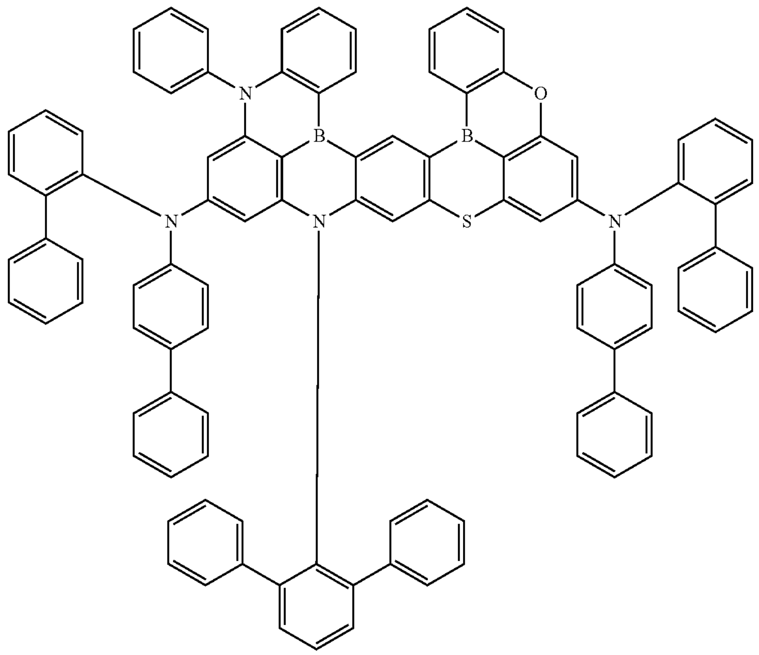
125
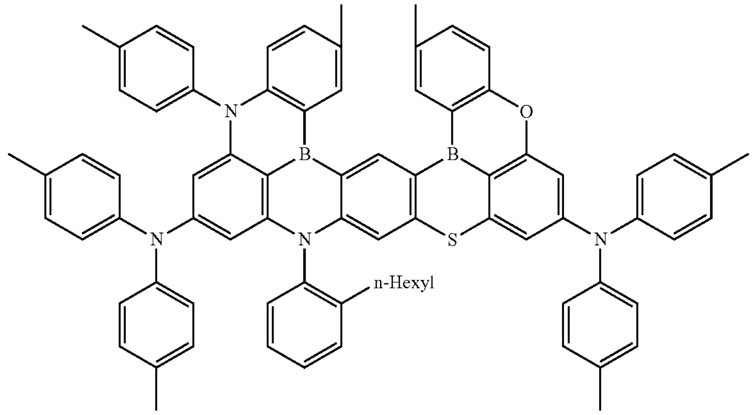
126
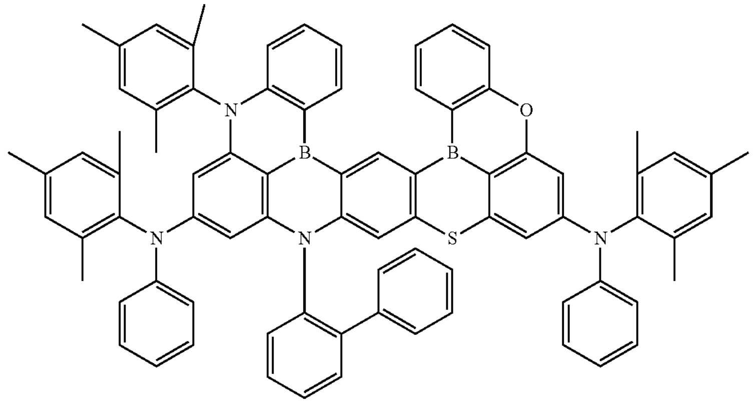

-continued
127
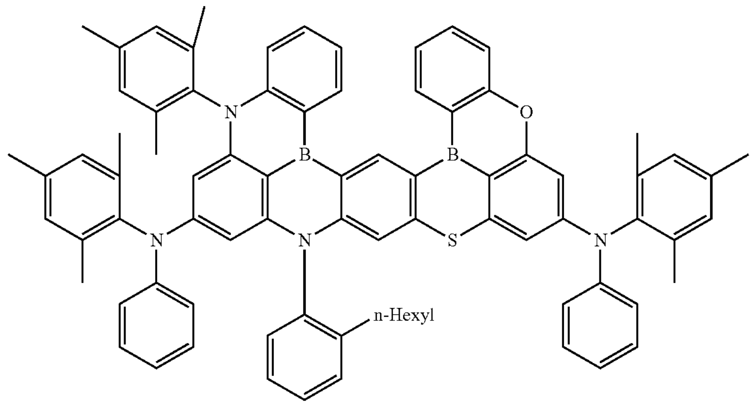
128
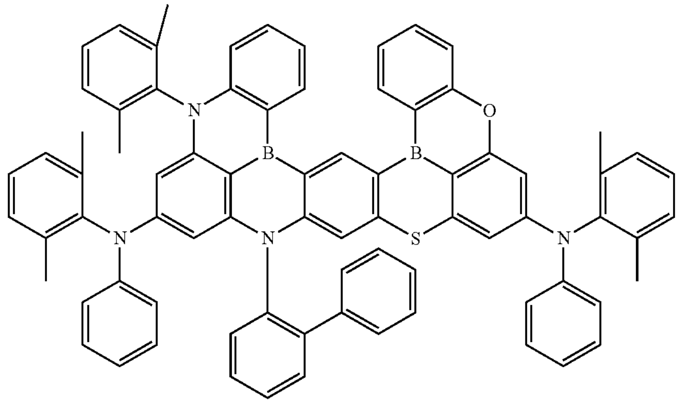
129
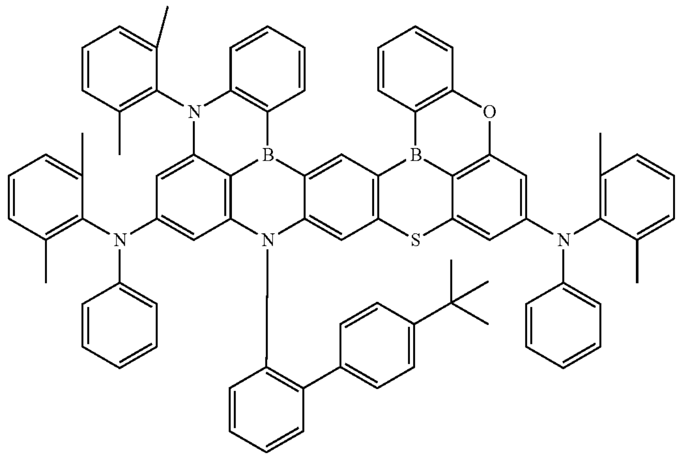

-continued
130
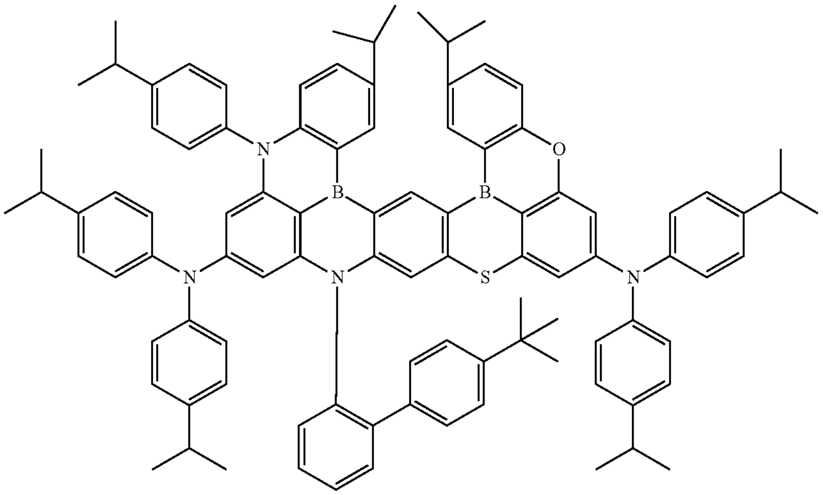
131
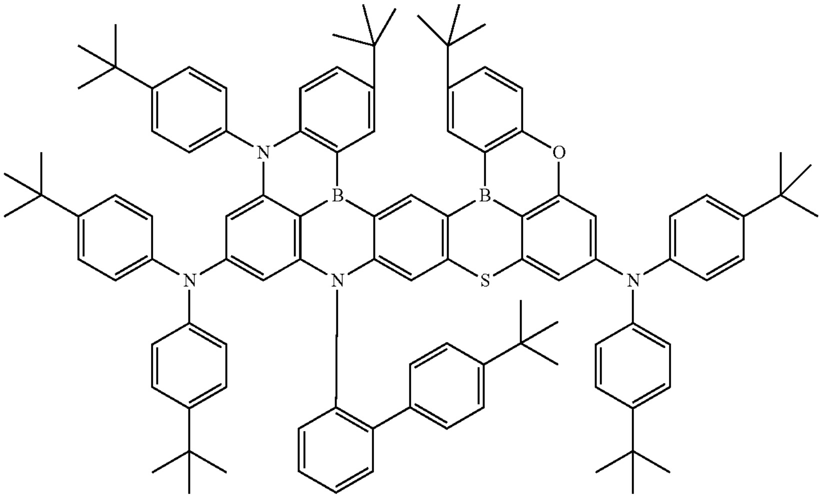
132
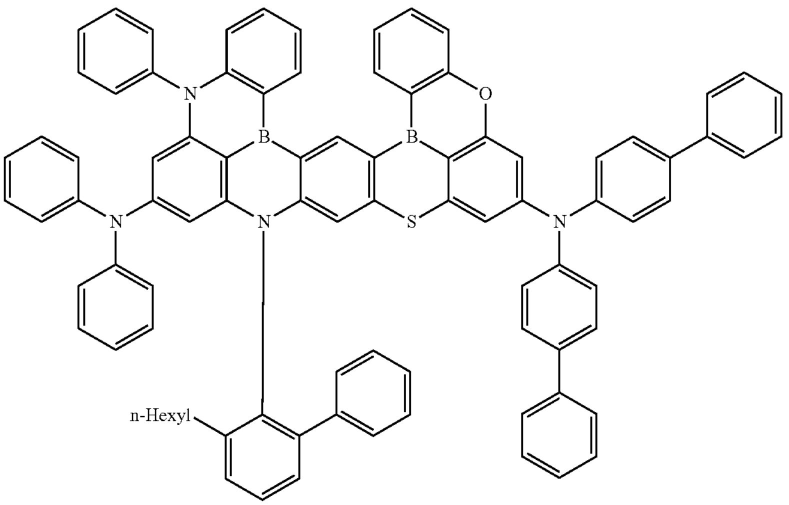

-continued
133
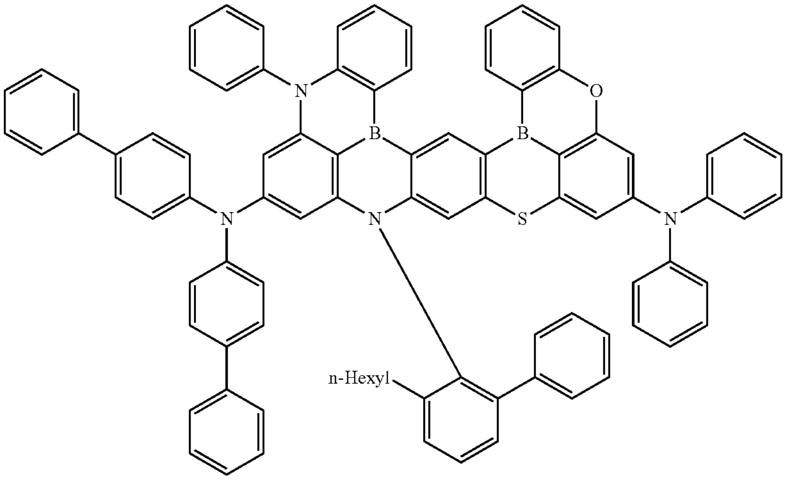
134
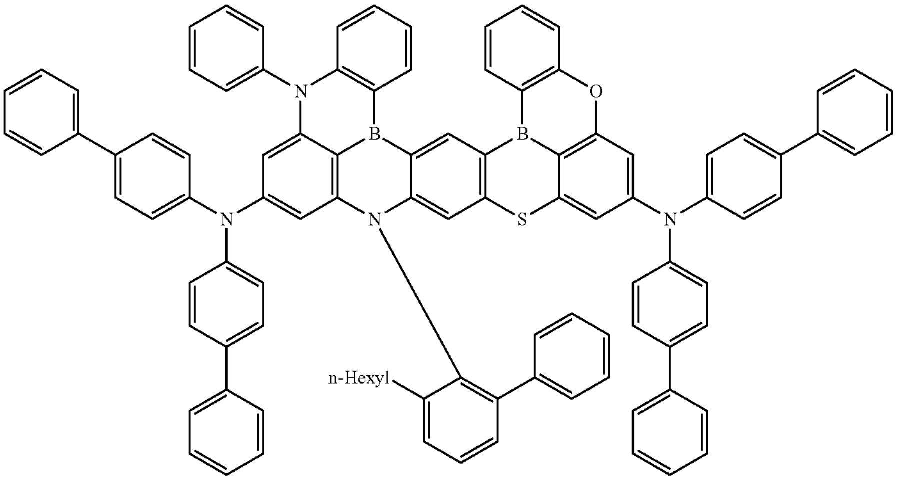
135
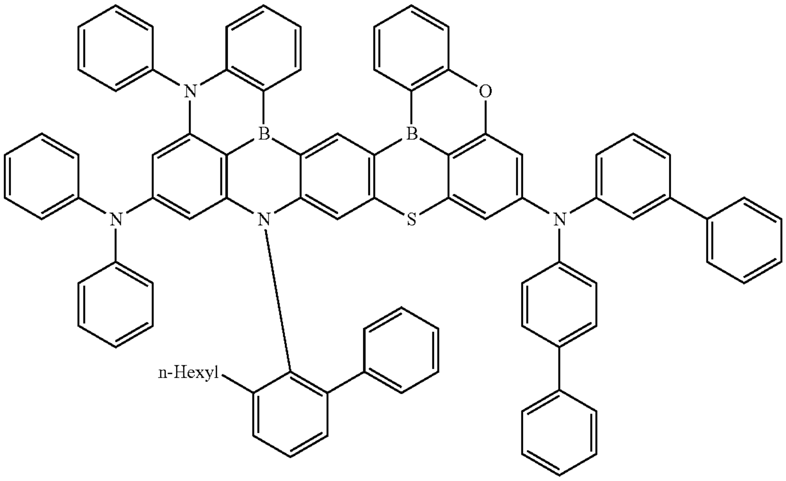

-continued
136
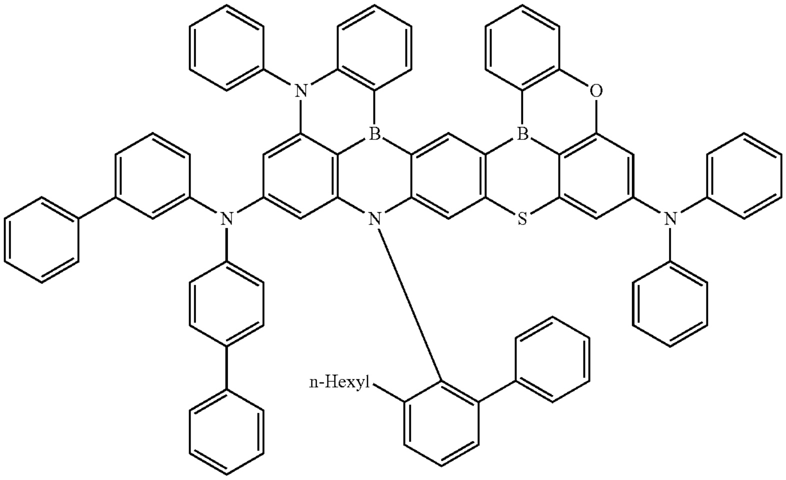
137
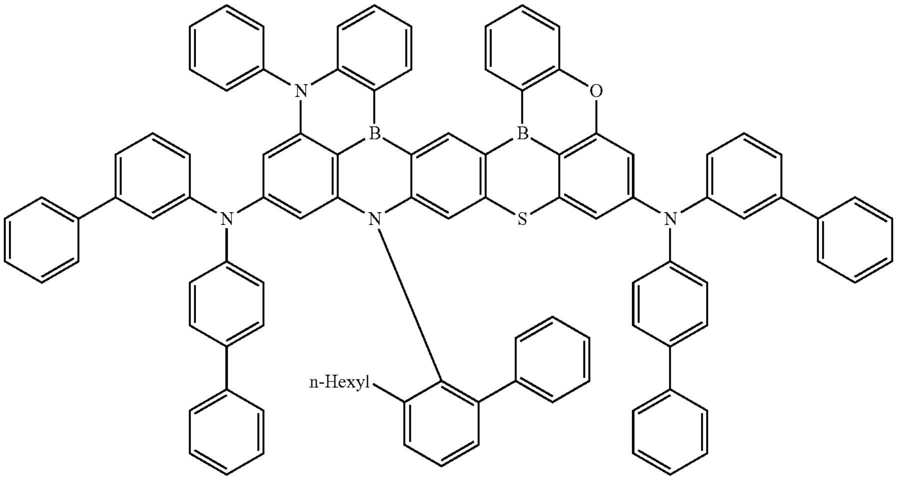
138
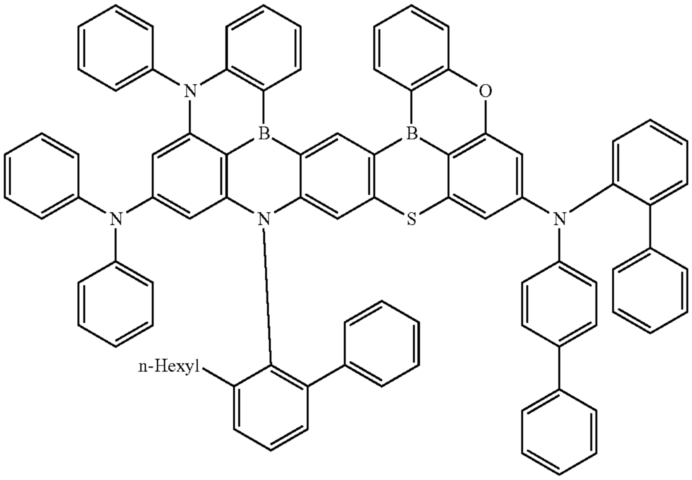

-continued
139
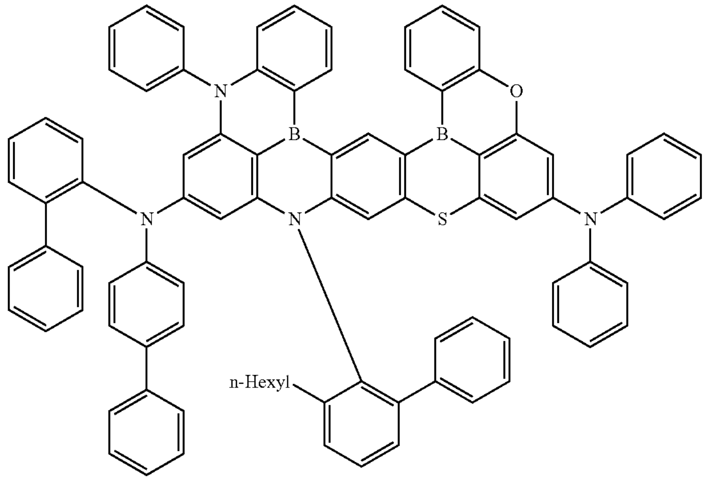
140
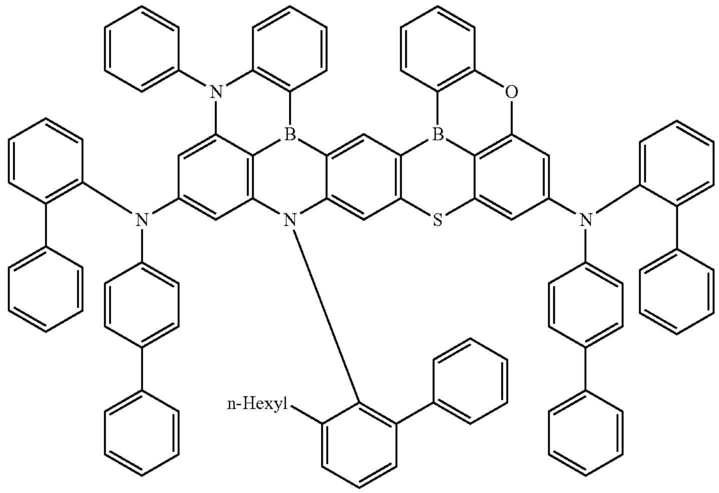
141
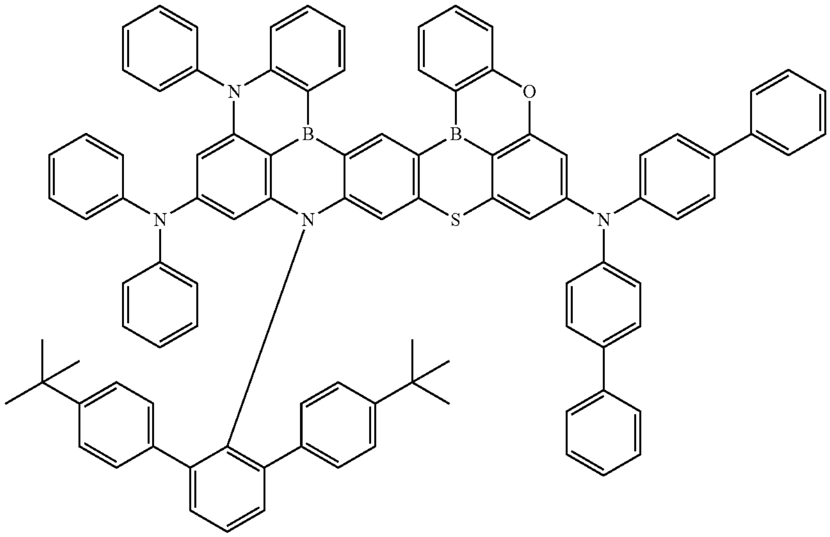

-continued
142
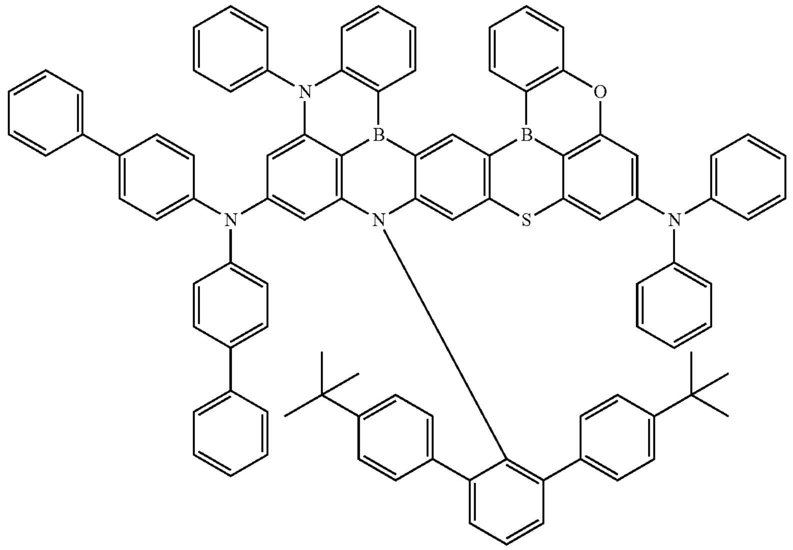
143
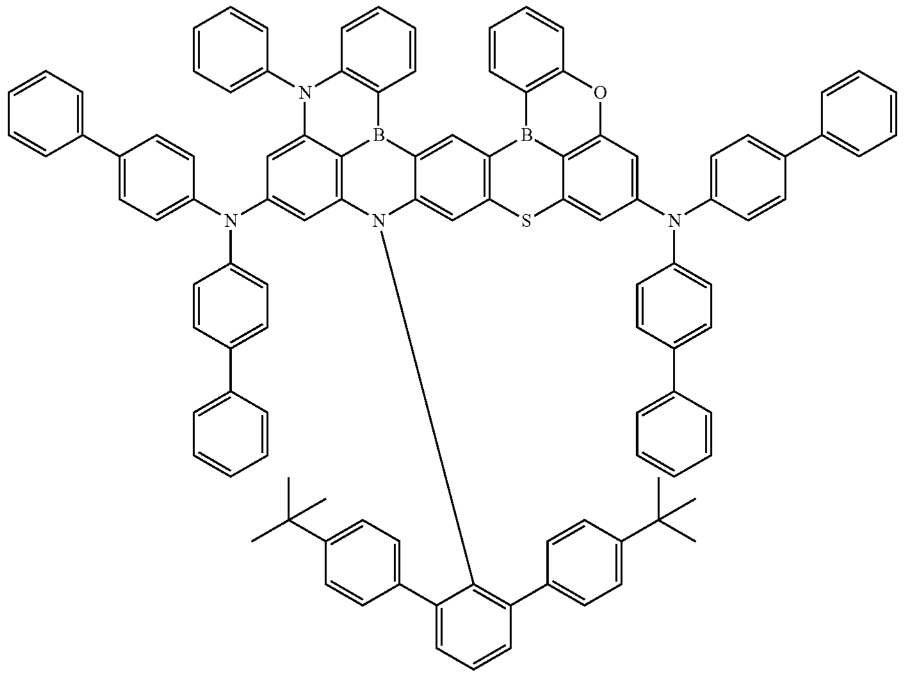

-continued
144
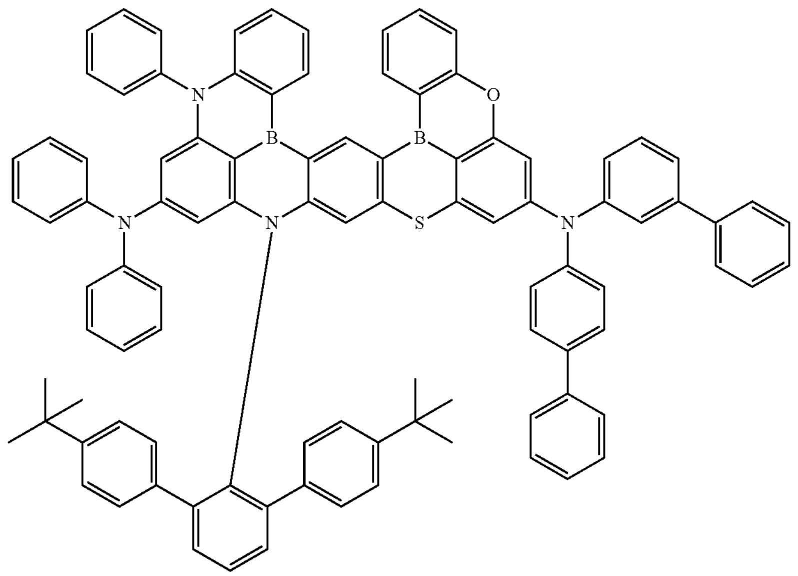
145
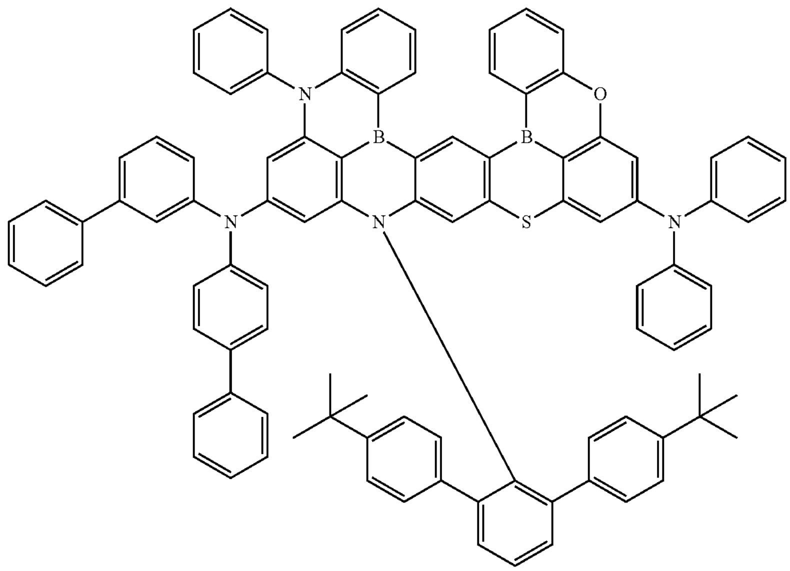

-continued
146
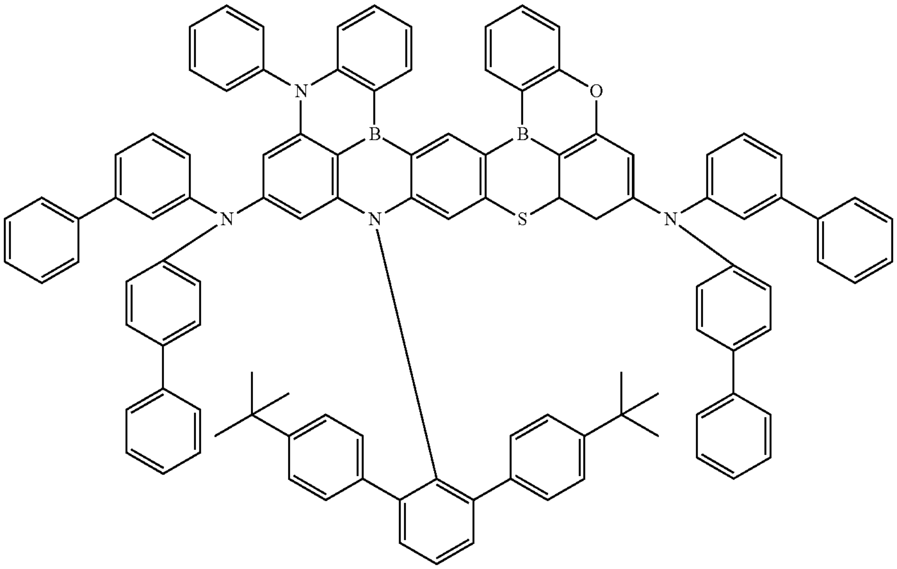
147
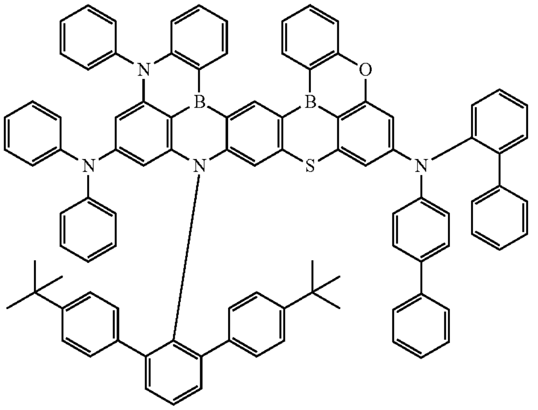
148
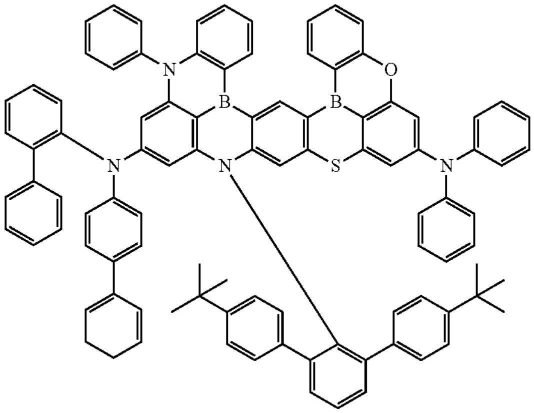
149
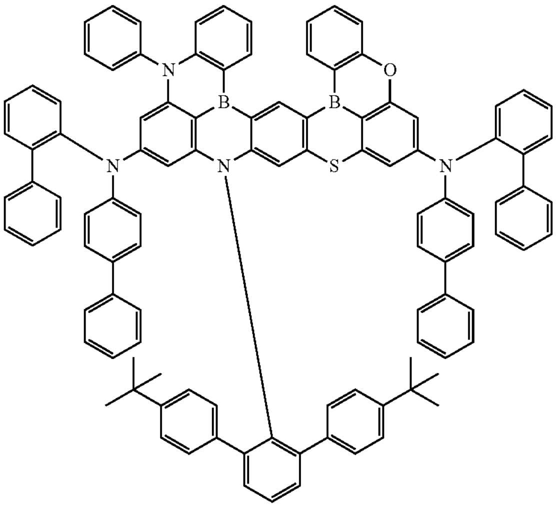
150
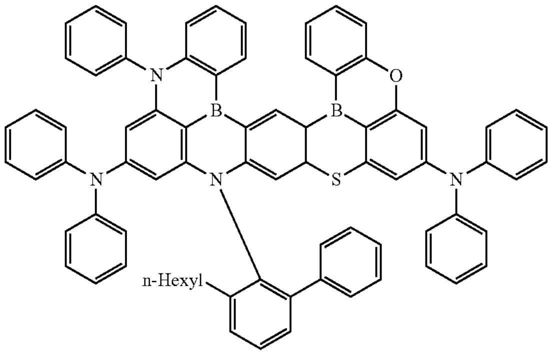

-continued
151
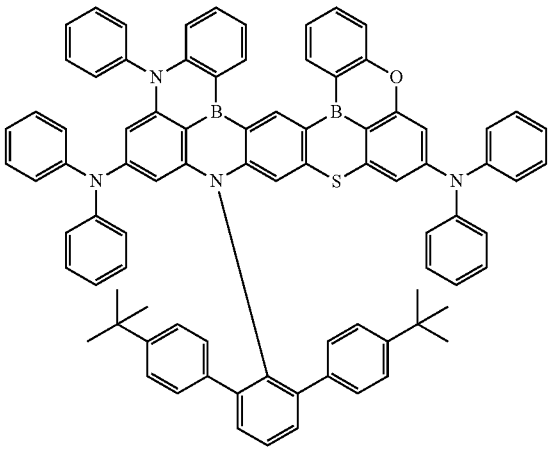
152
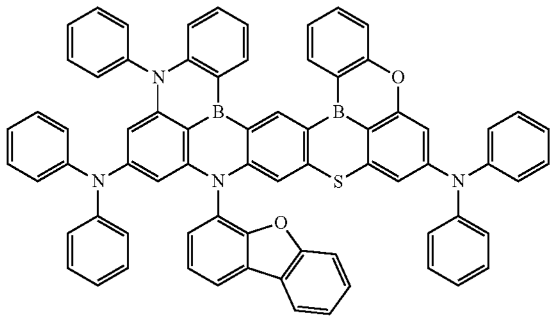
153
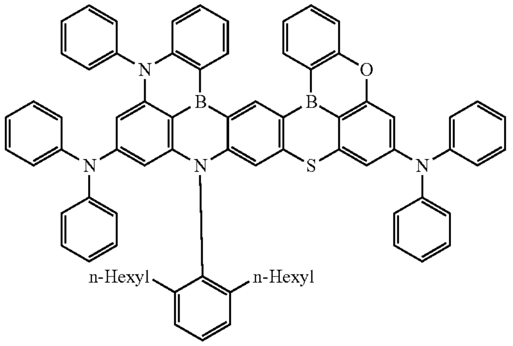
154
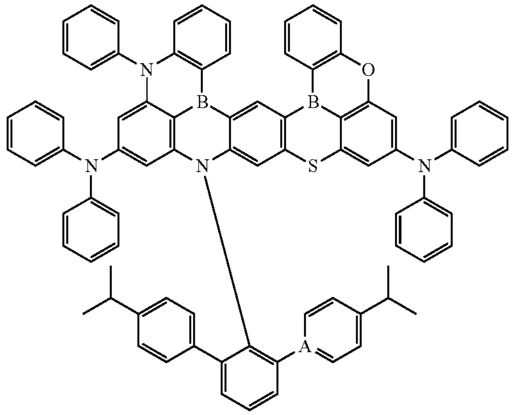
155
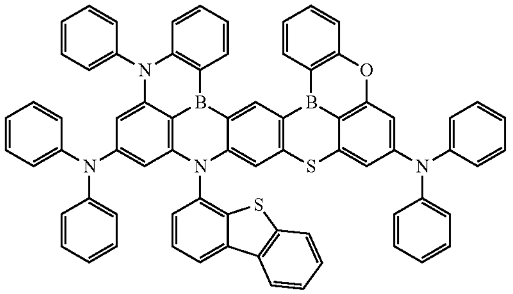
156
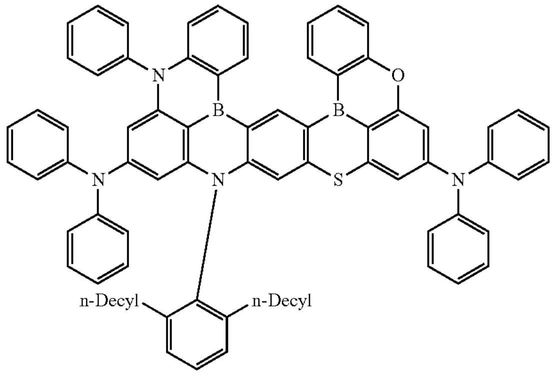

-continued
157
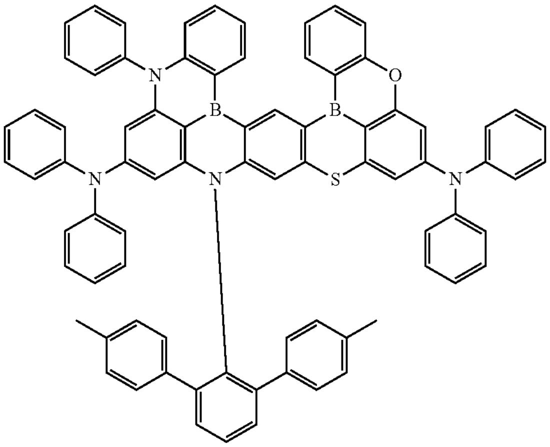
158
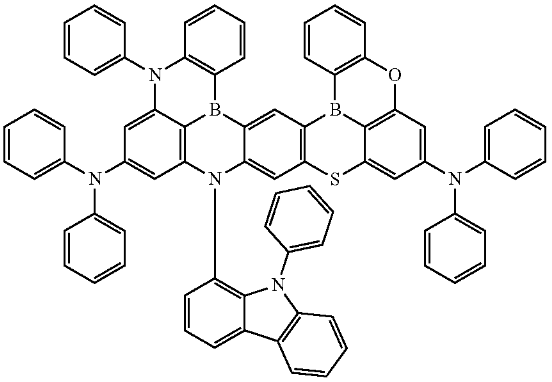
159
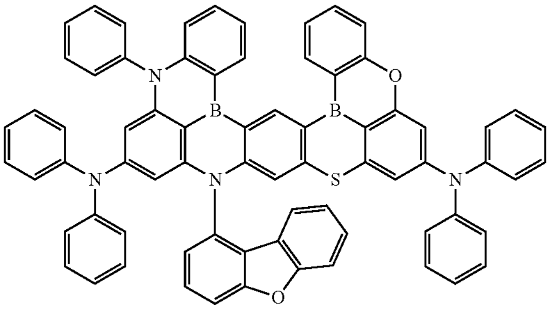
160
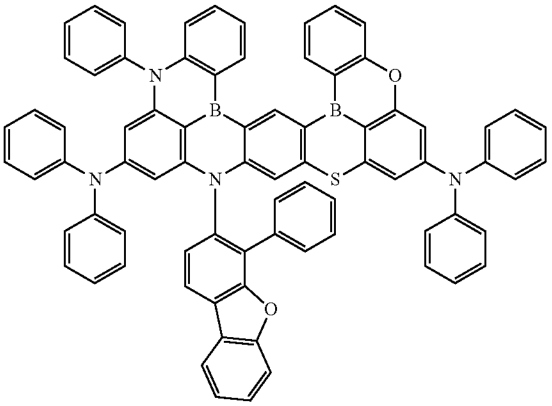
161
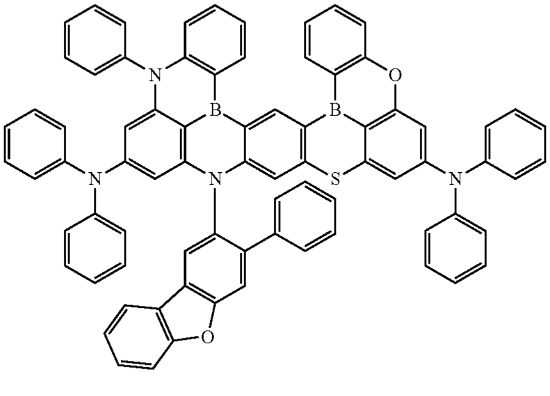
162
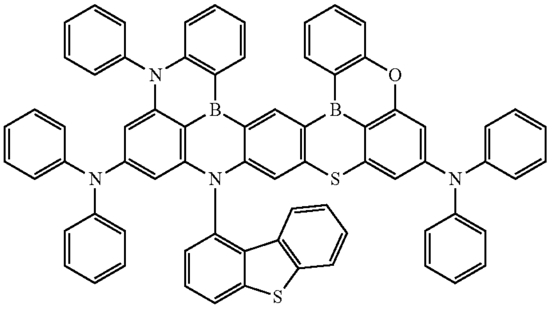

-continued
163
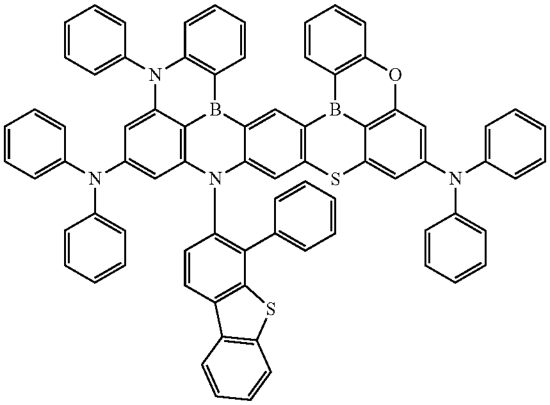
164
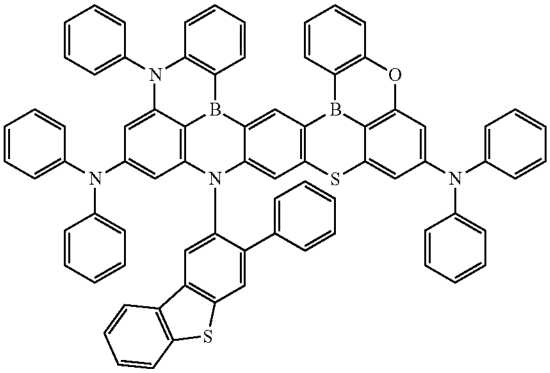
165
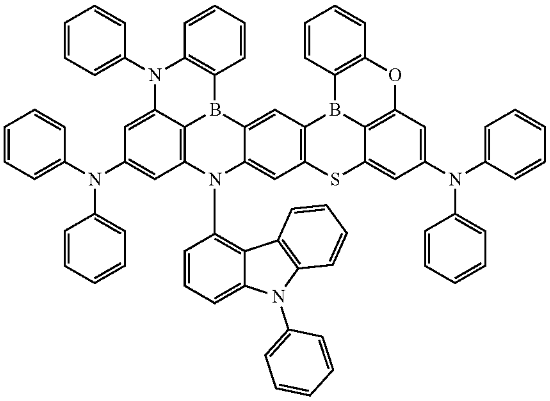
166
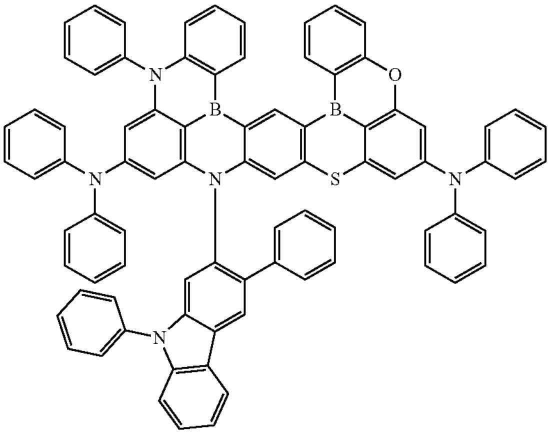
167
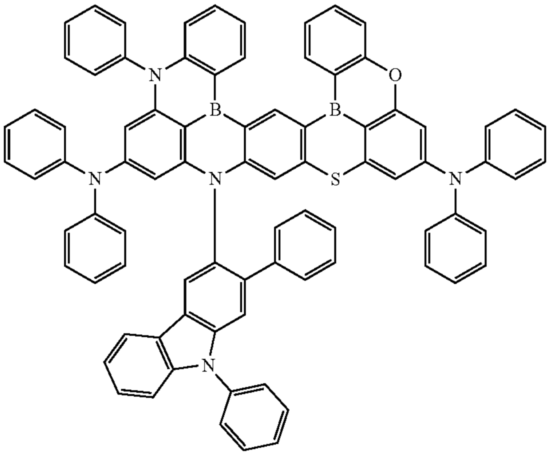
168
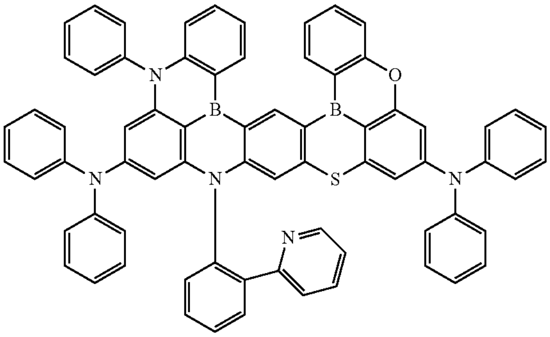

-continued
169
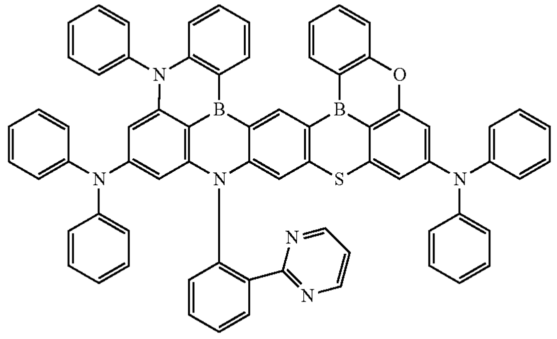
170
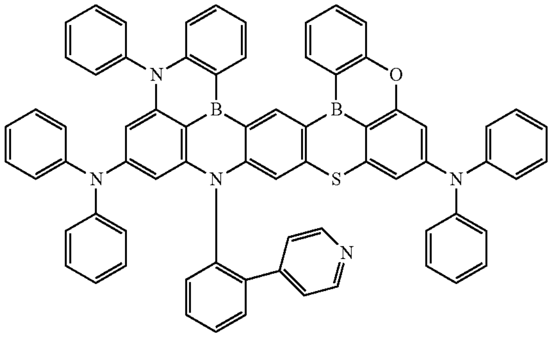
171
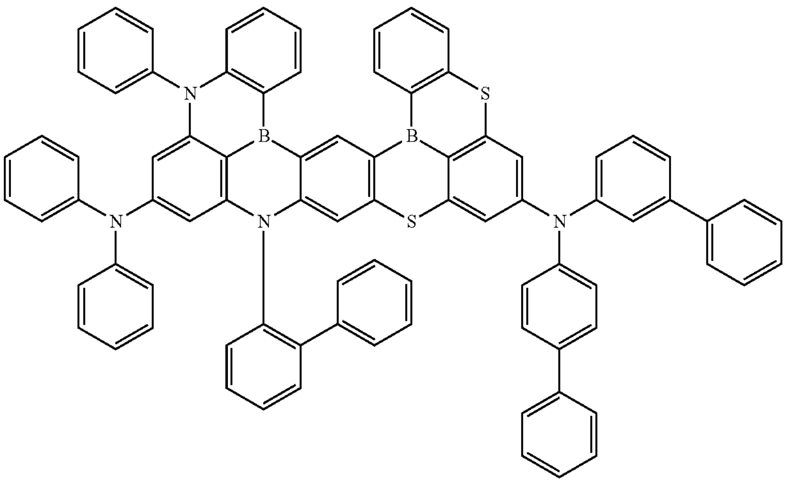
172
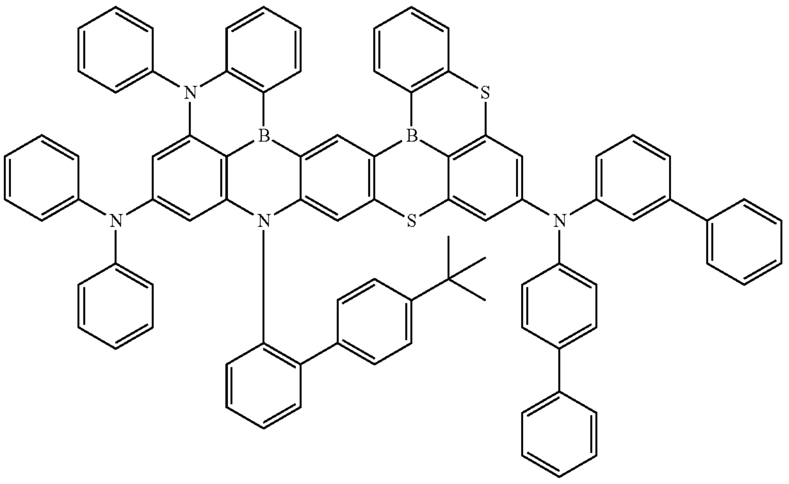

-continued
173
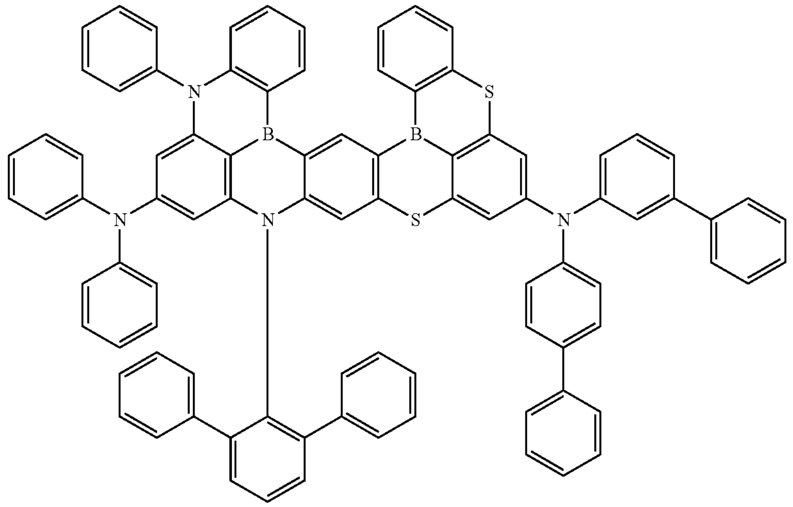
174
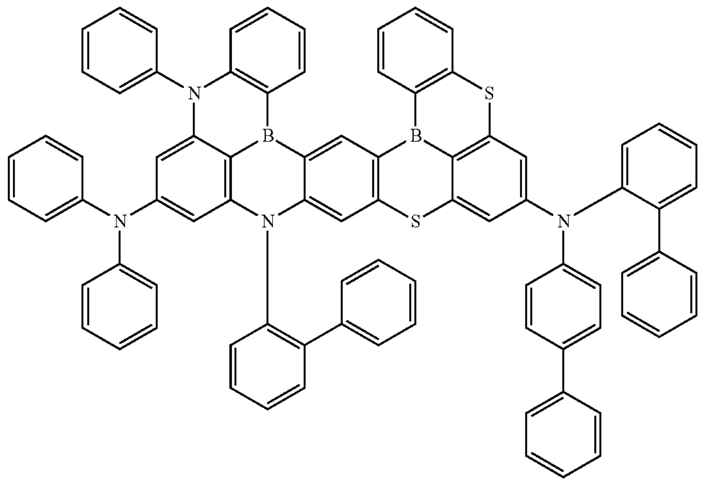
175
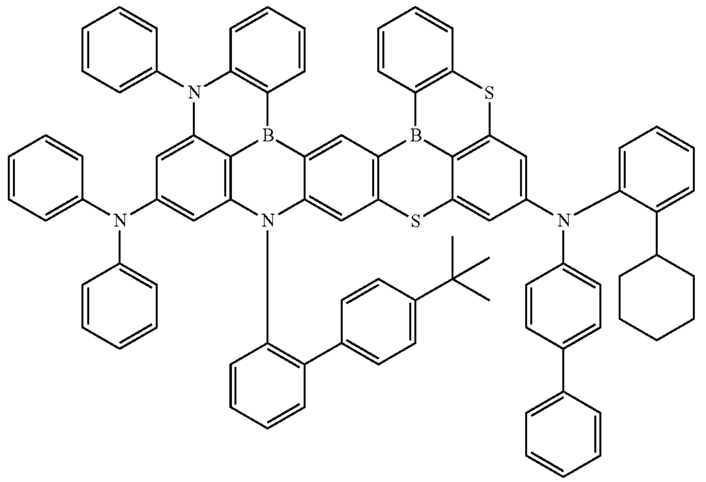

-continued
176
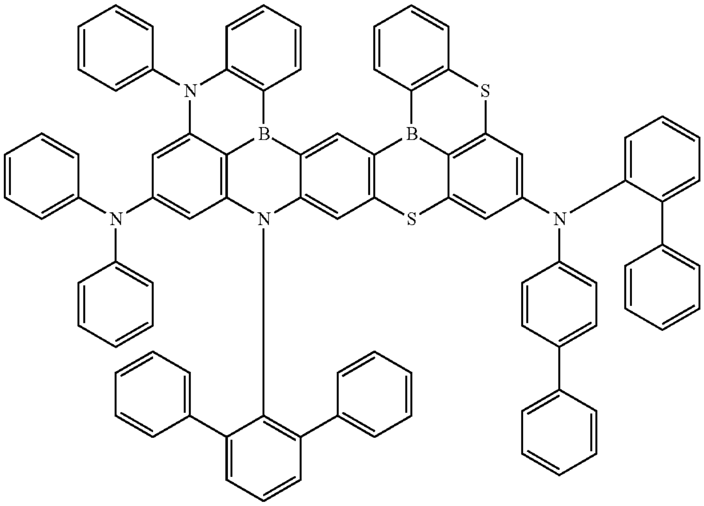
177
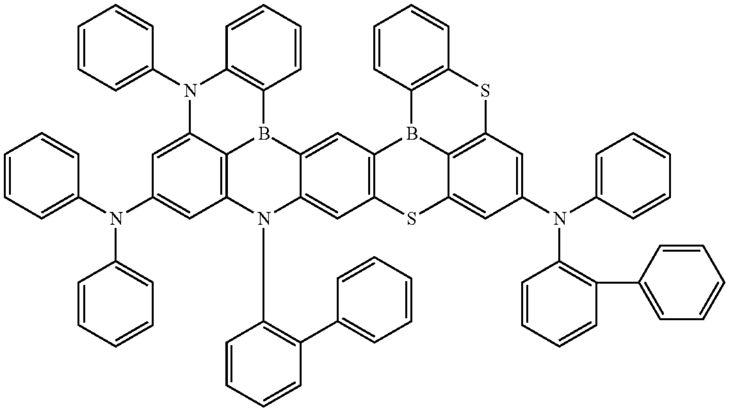
178
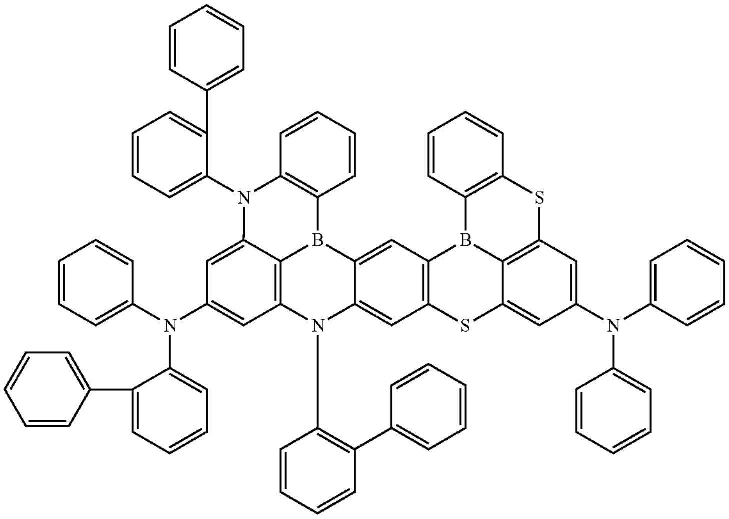

-continued
179
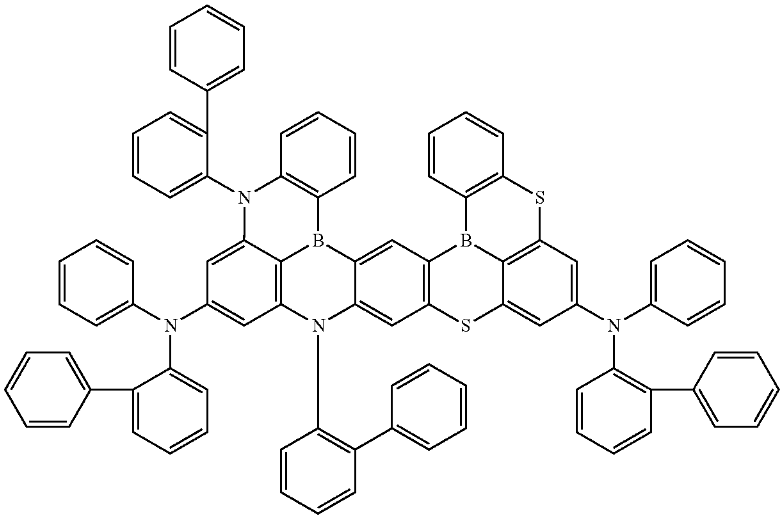
180
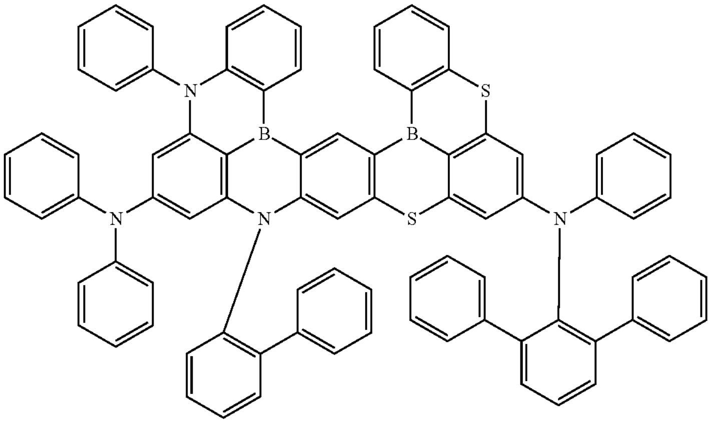
181
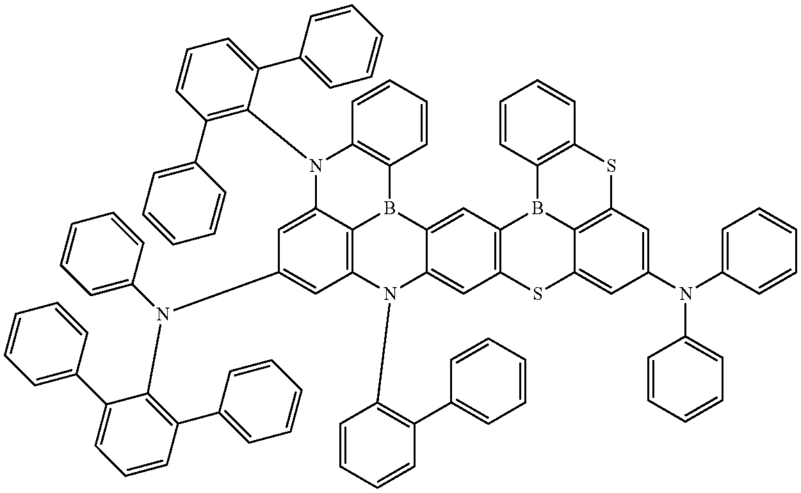

-continued
182
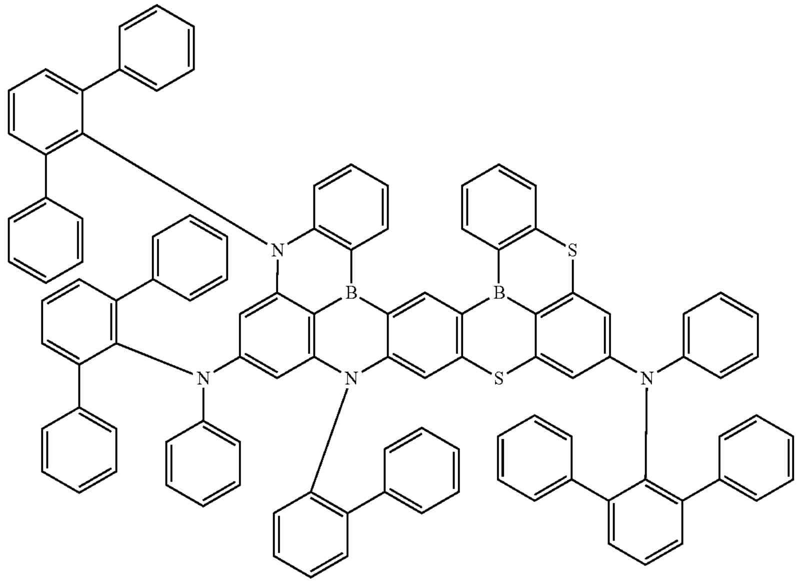
183
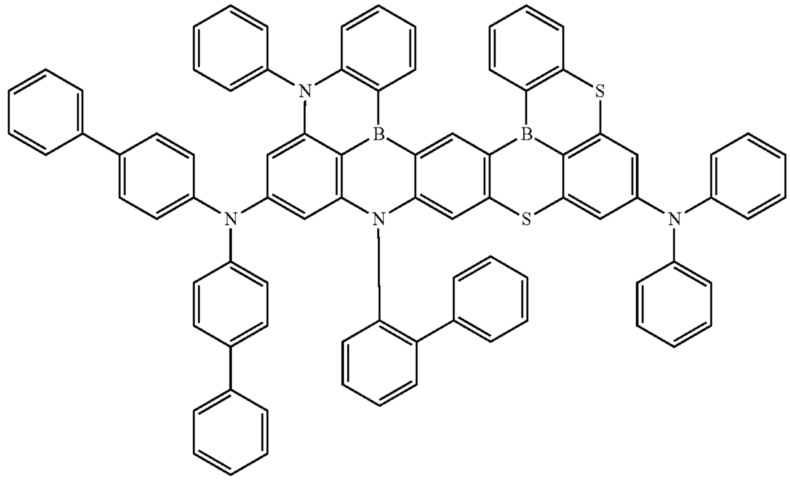
184
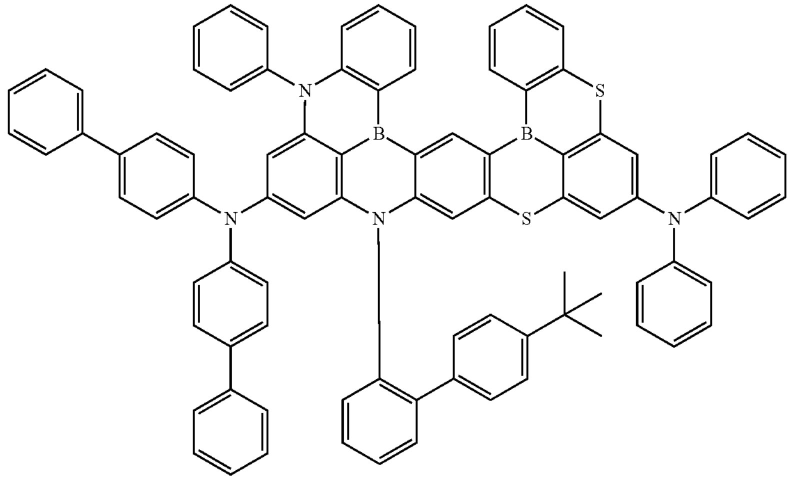

-continued
185
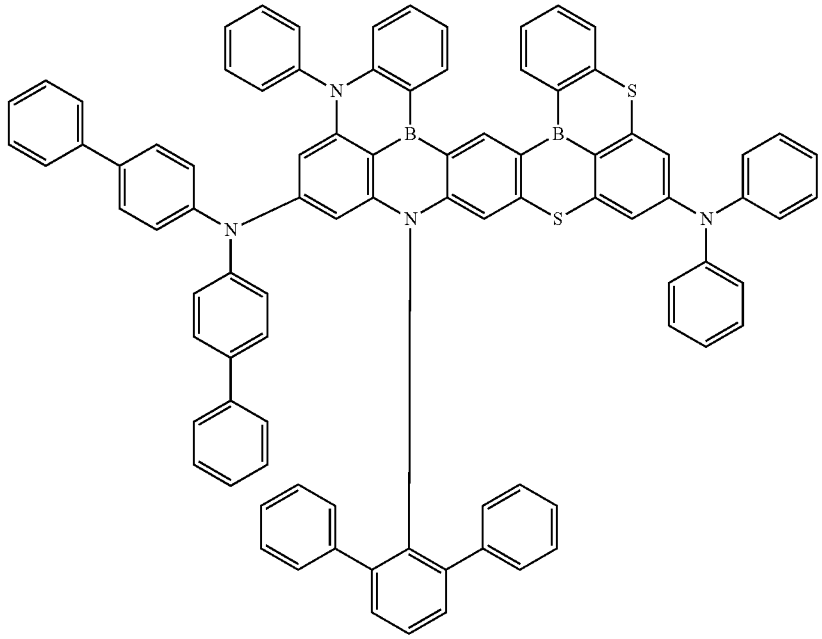
186
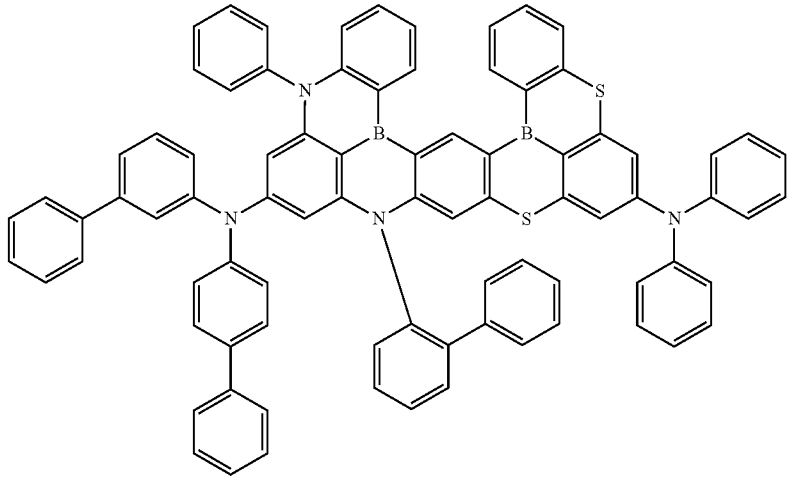
187
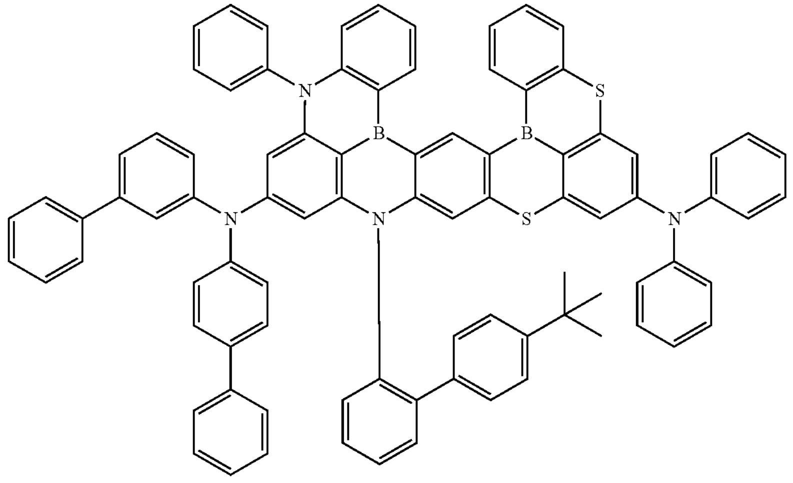

-continued
188
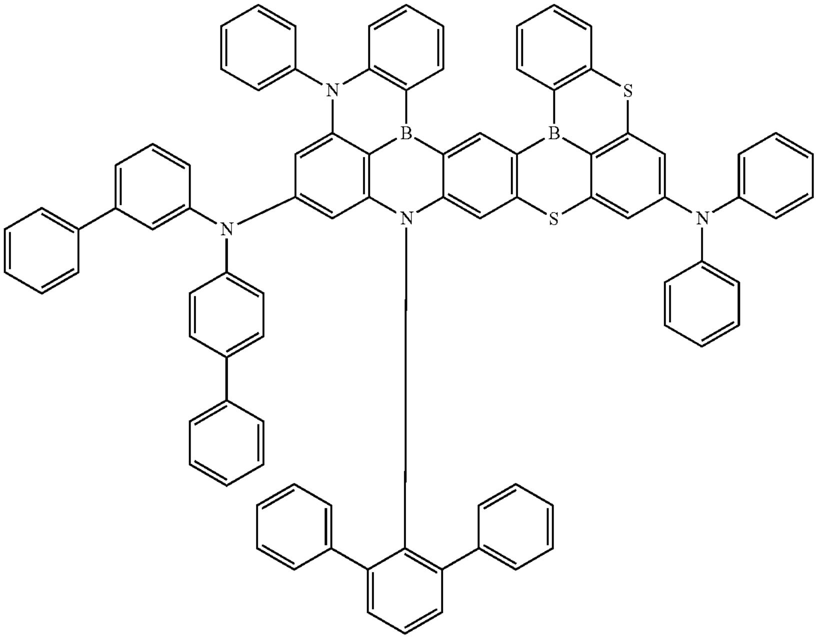
189
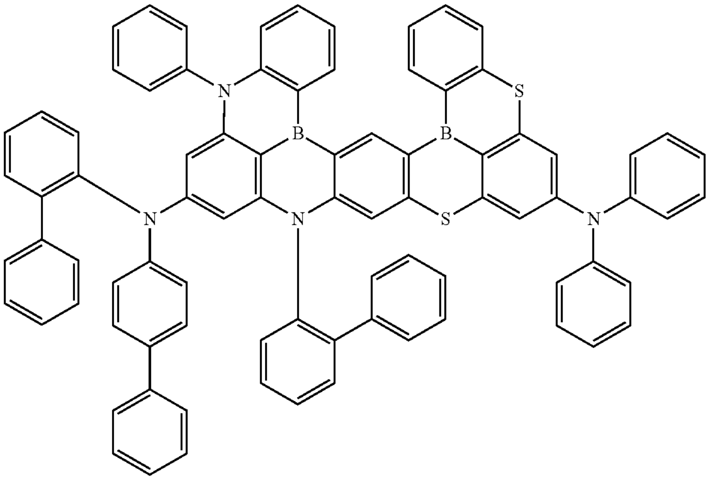
190
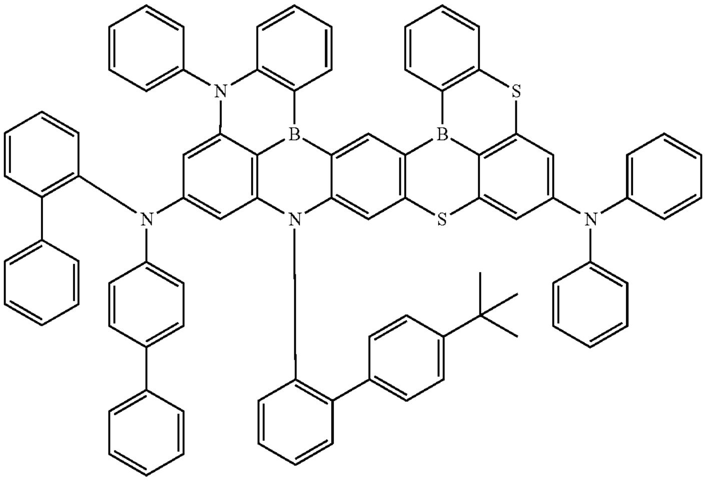

-continued
191
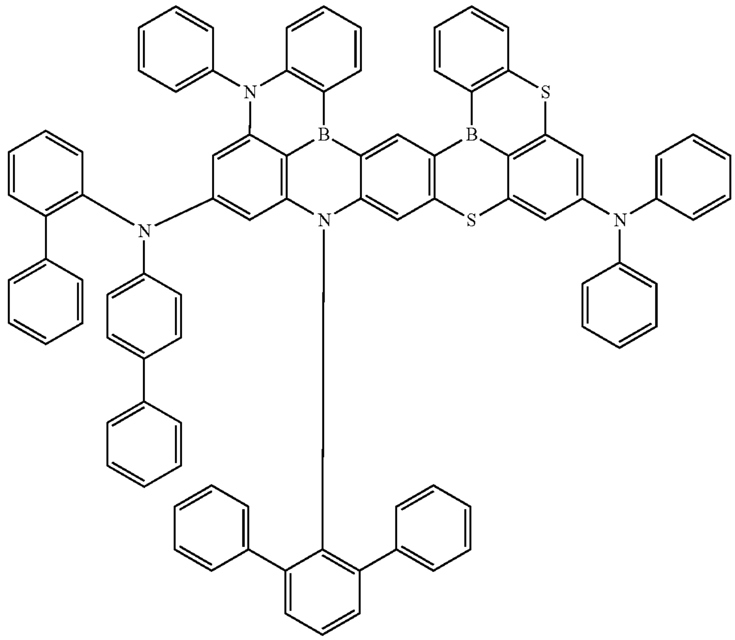
192
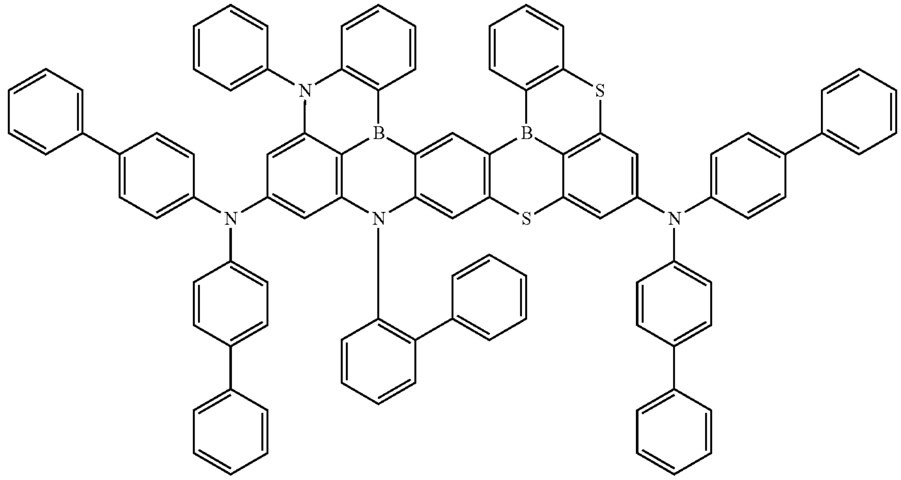
193
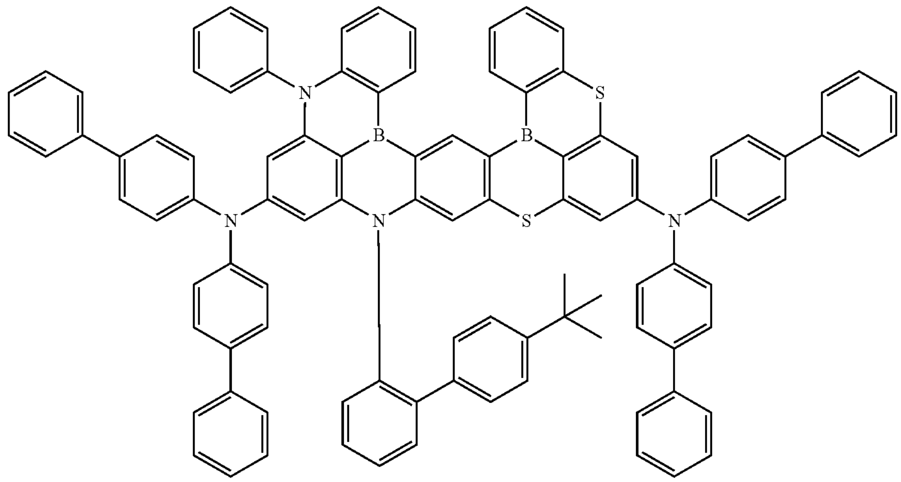

-continued
194
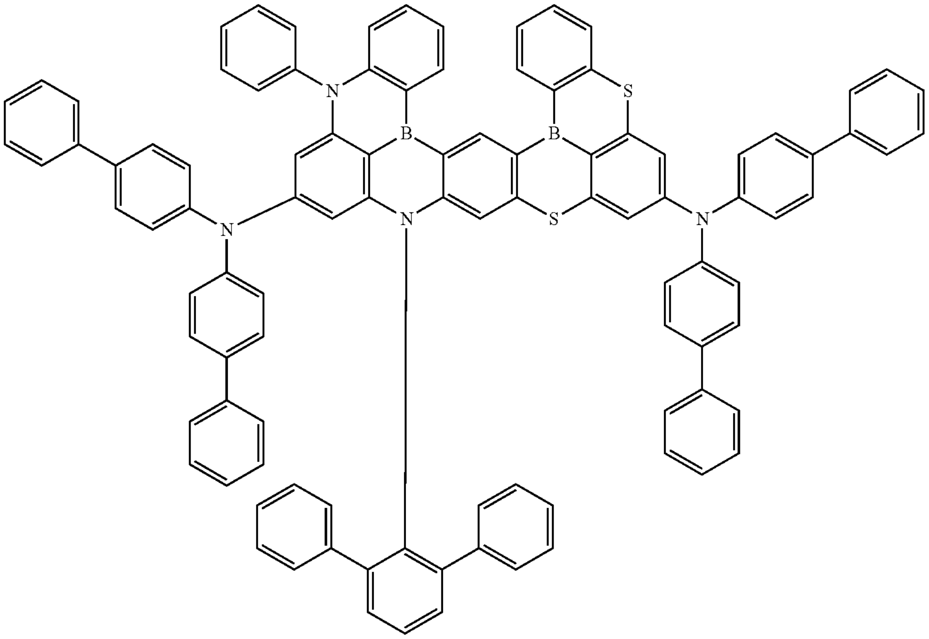
195
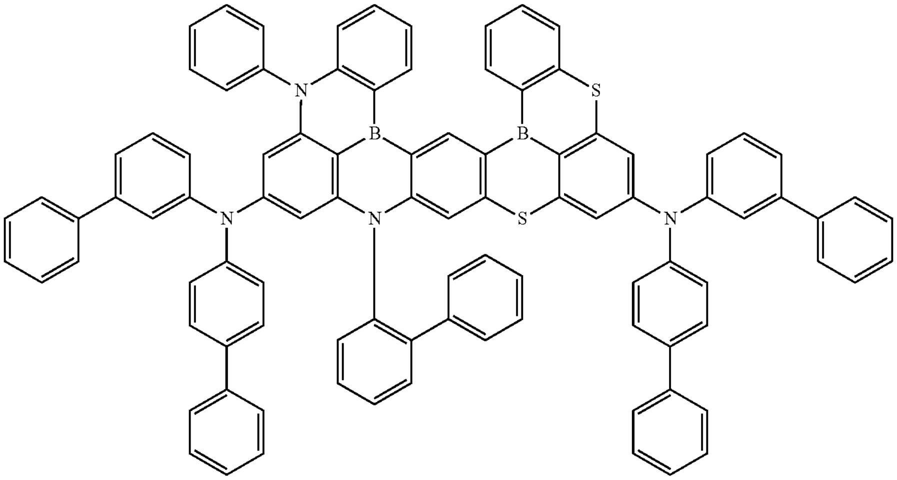
196
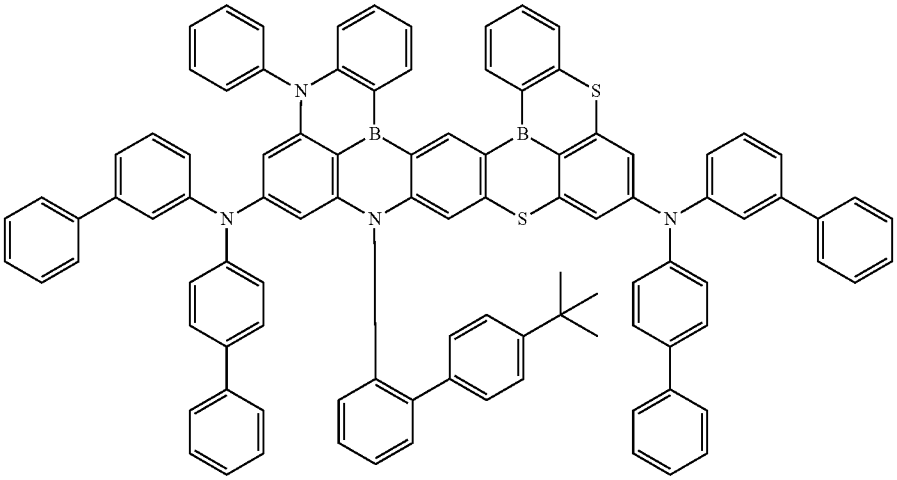

-continued
197
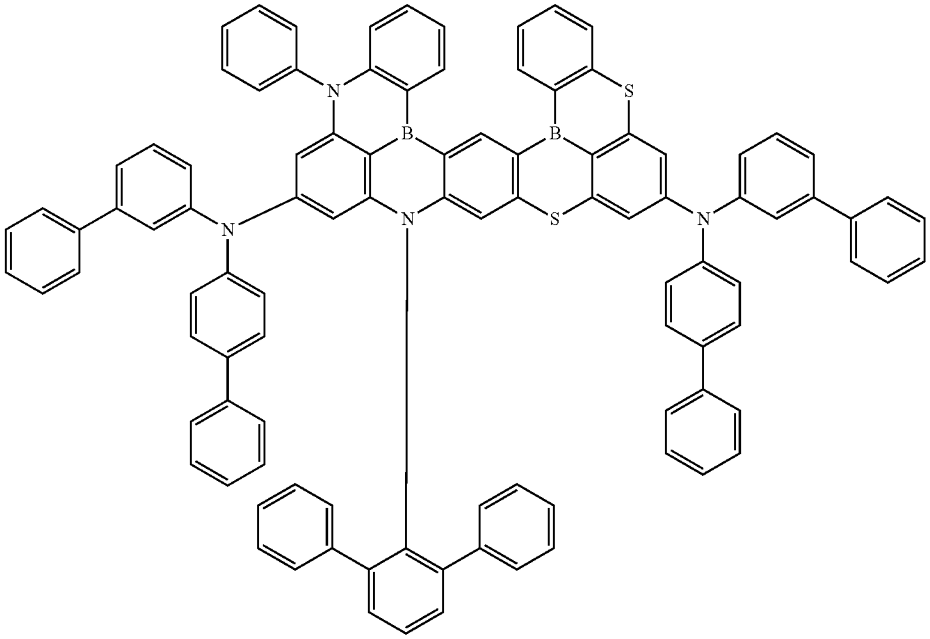
198
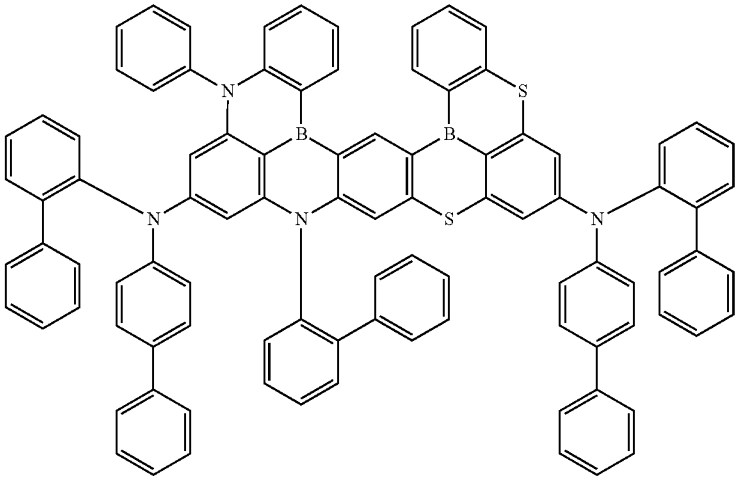
199
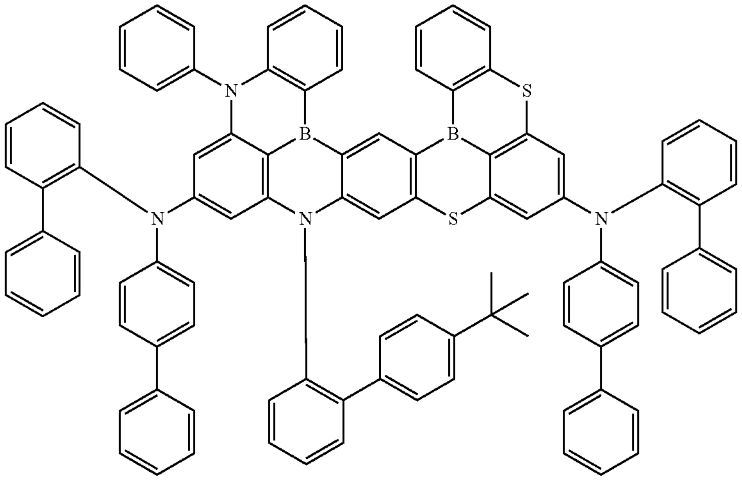

-continued
200
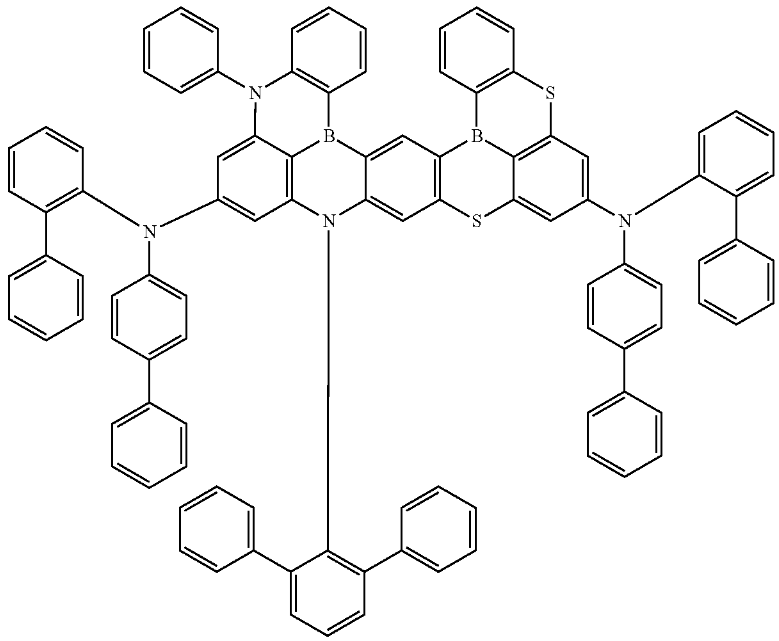
201
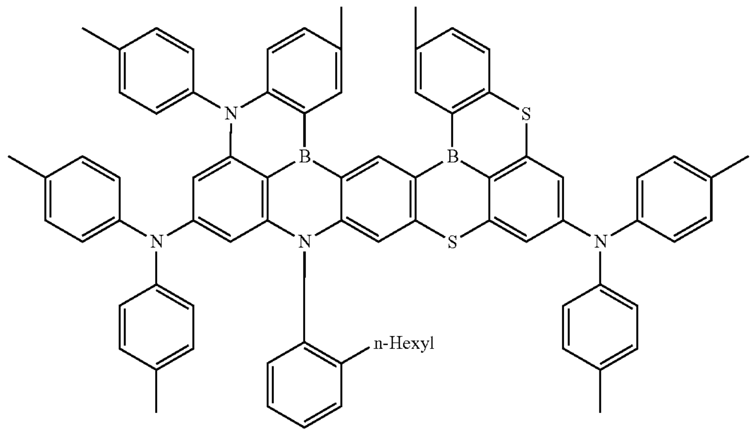
202
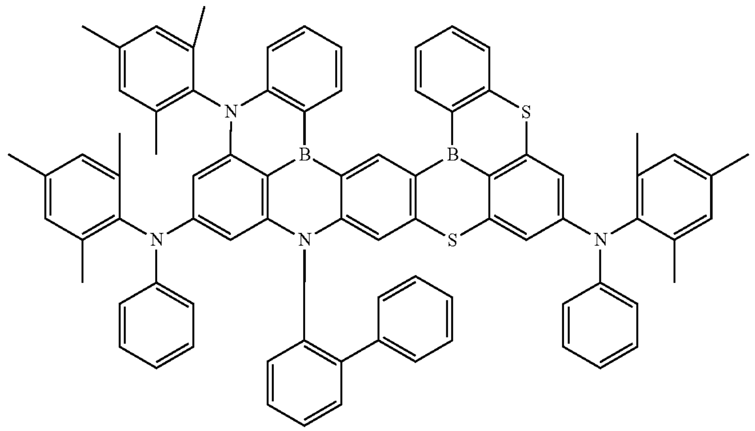

-continued
203
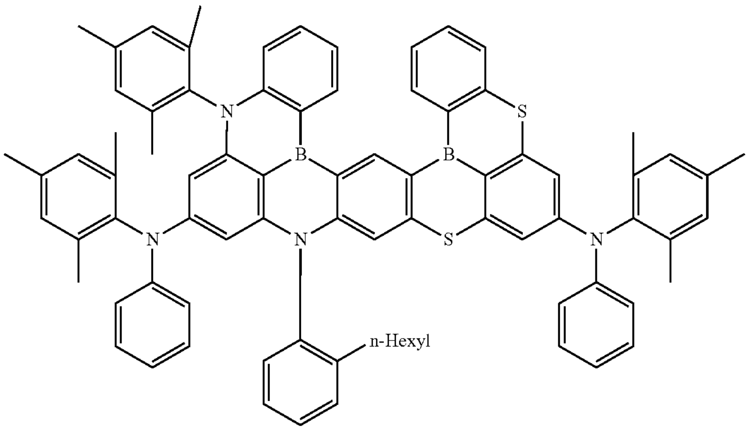
204
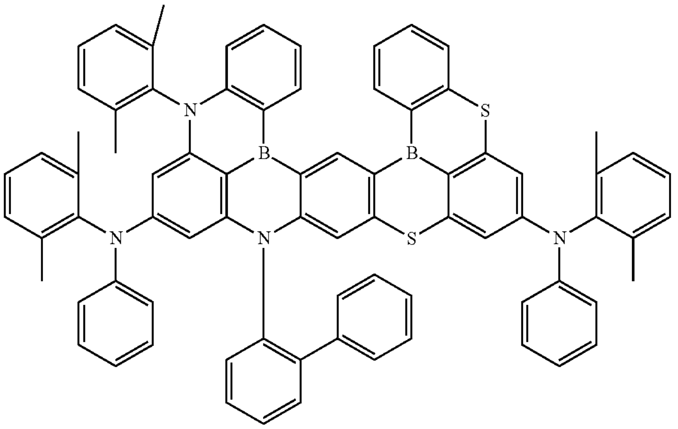
205
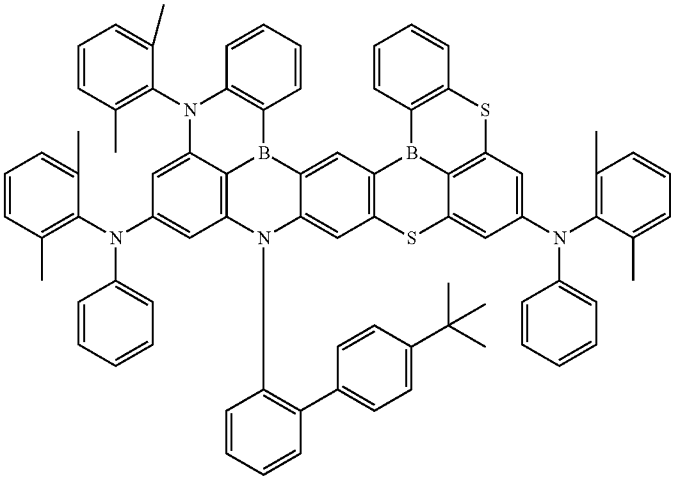

-continued
206
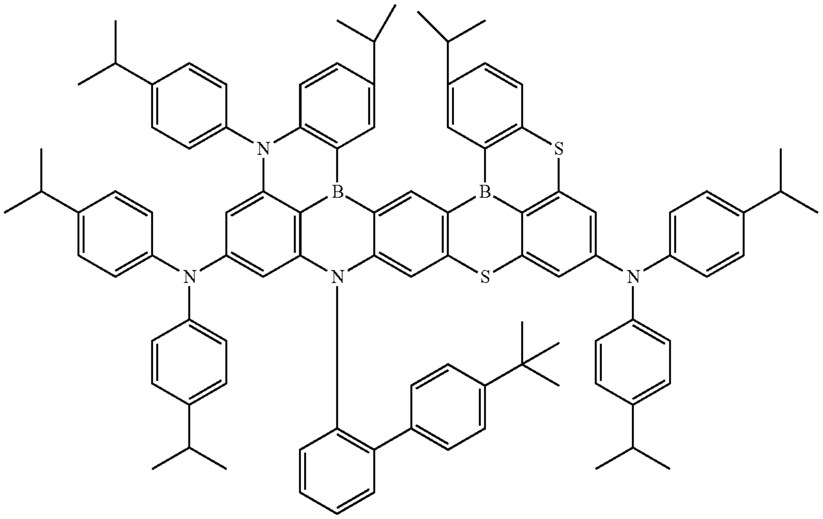
207
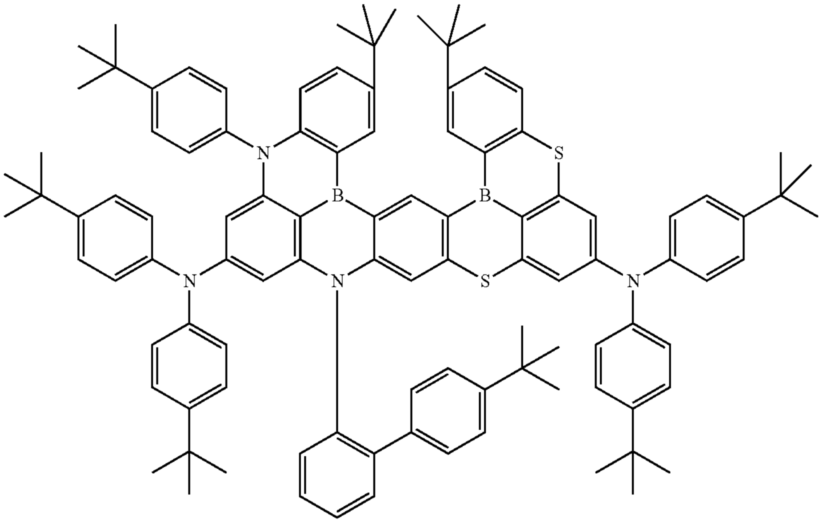
208
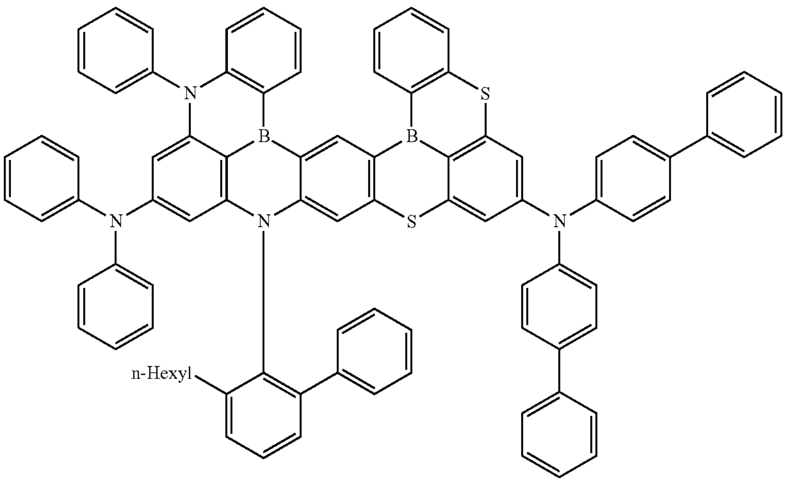

-continued
209
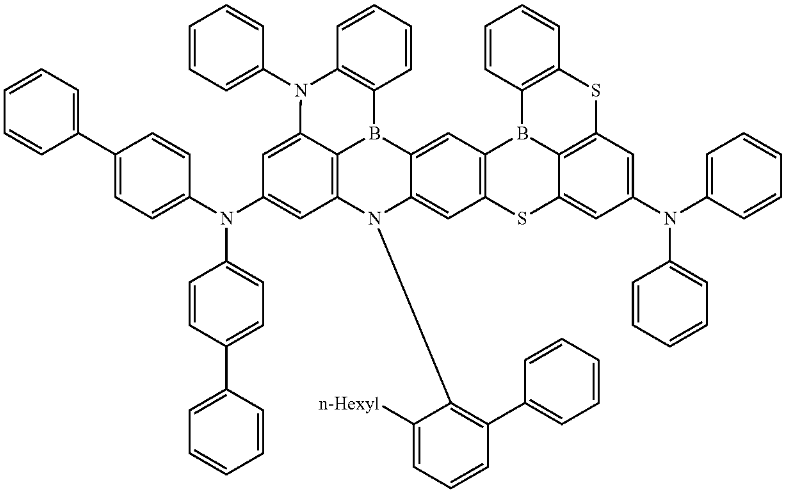
210
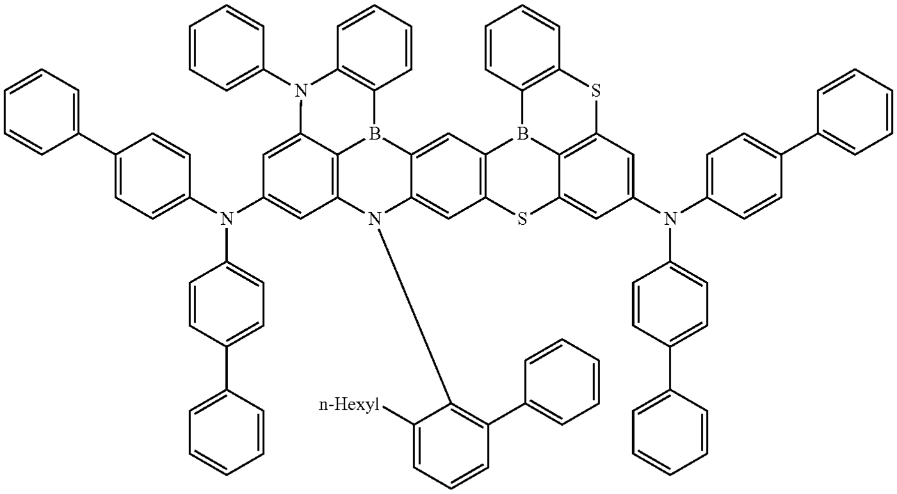
211
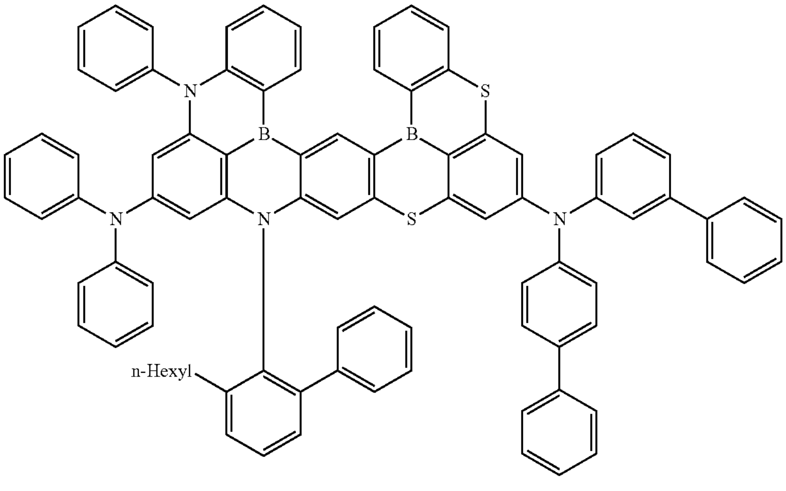

-continued
212
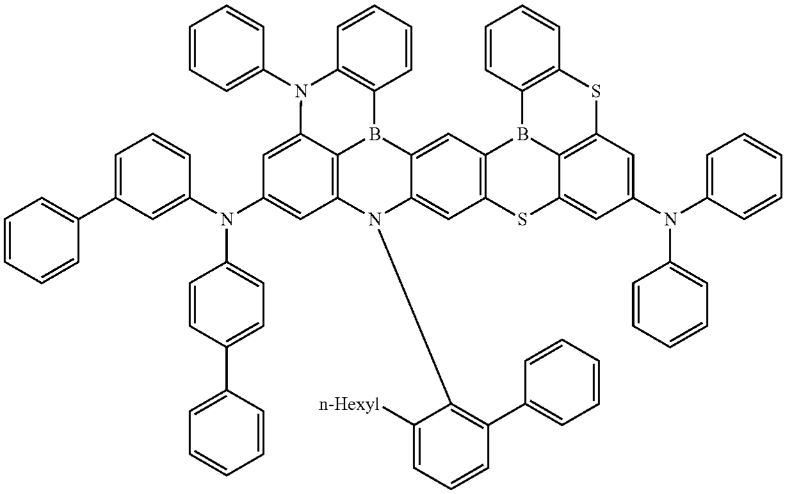
213
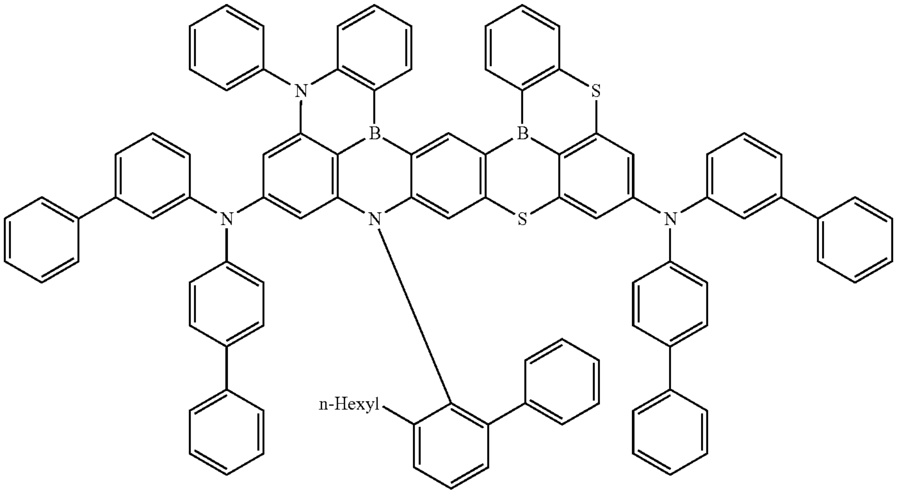
214
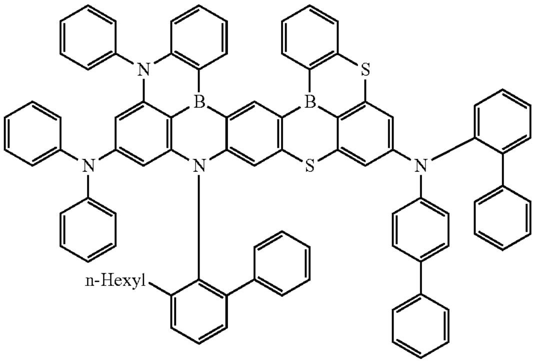
215
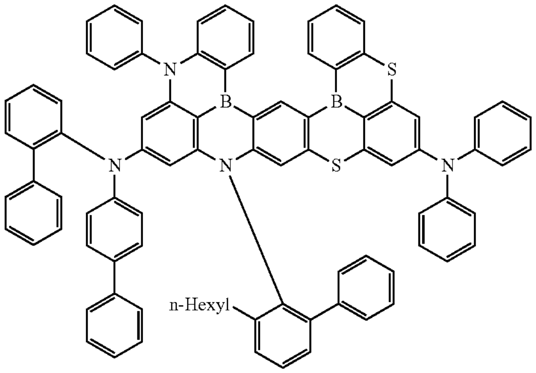

-continued
216
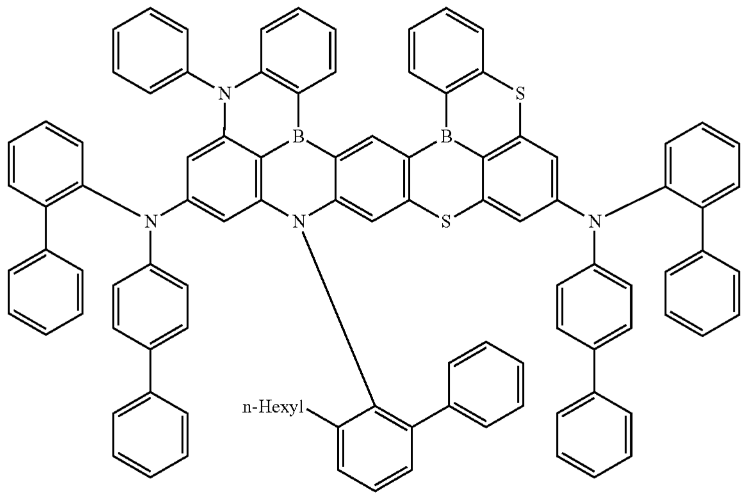
217
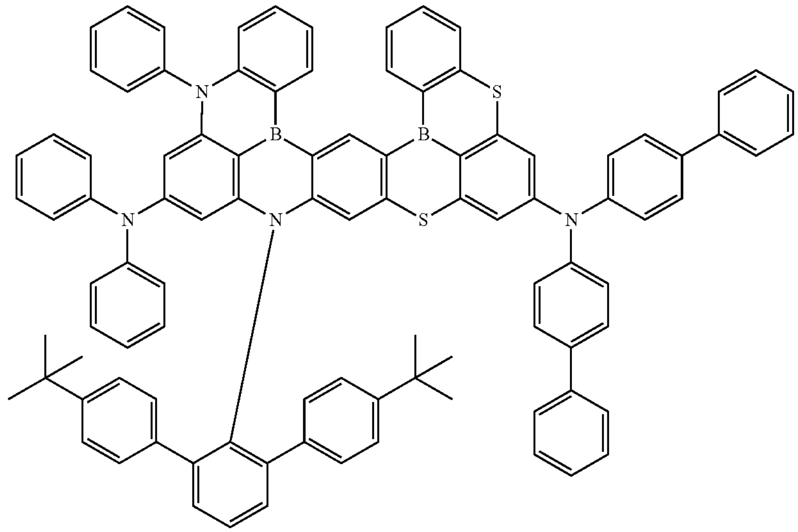
218
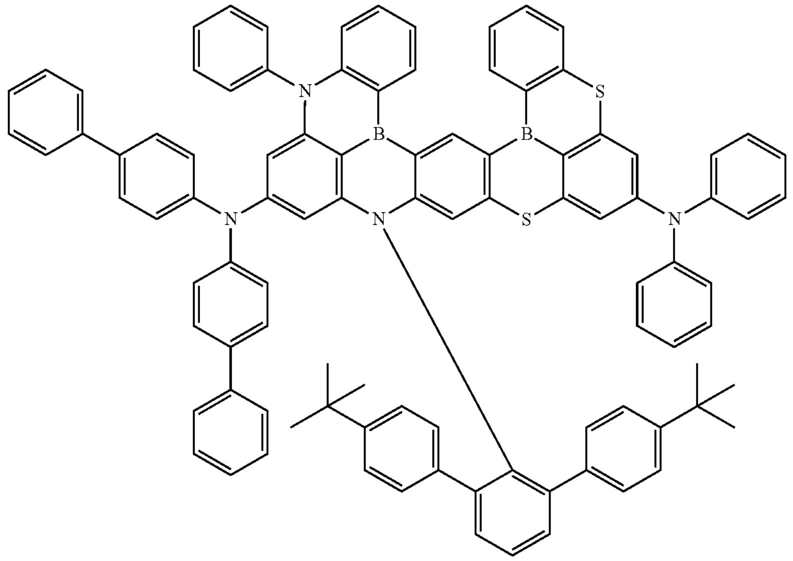

-continued
219
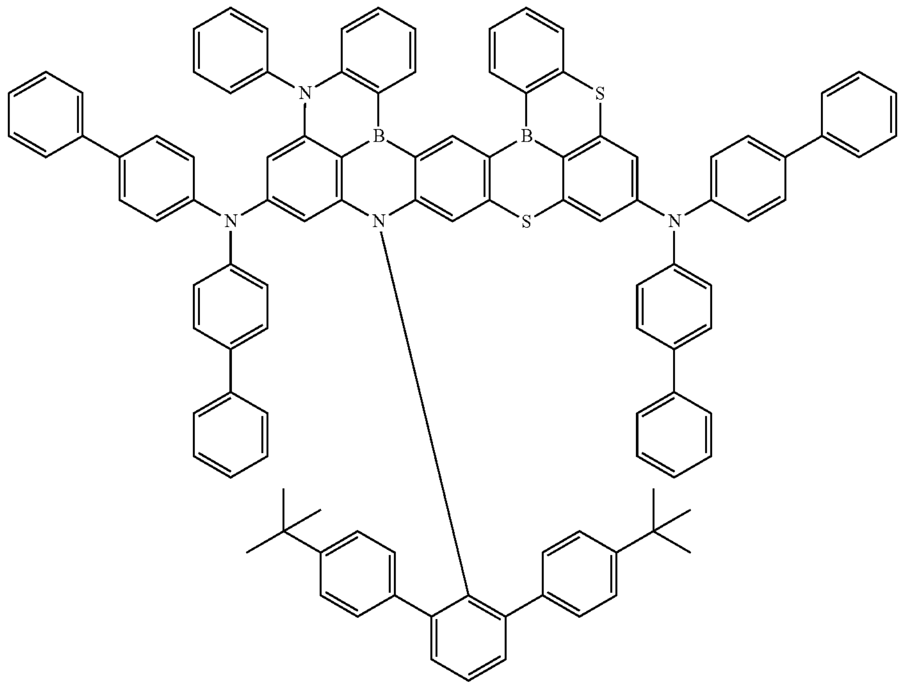
220
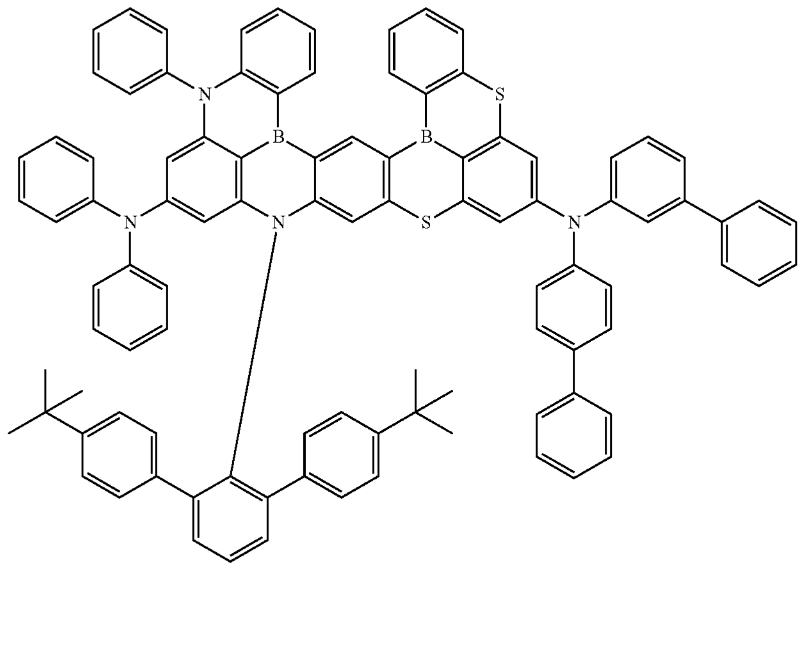

-continued
221
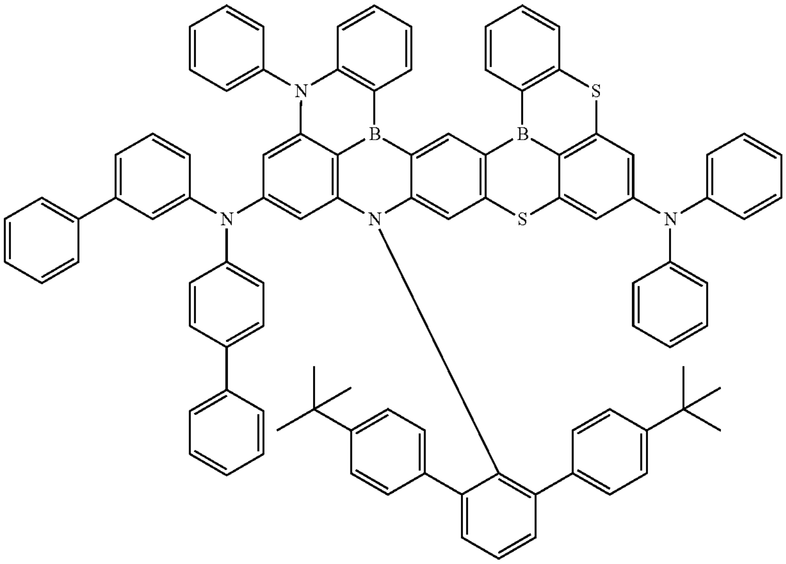
222
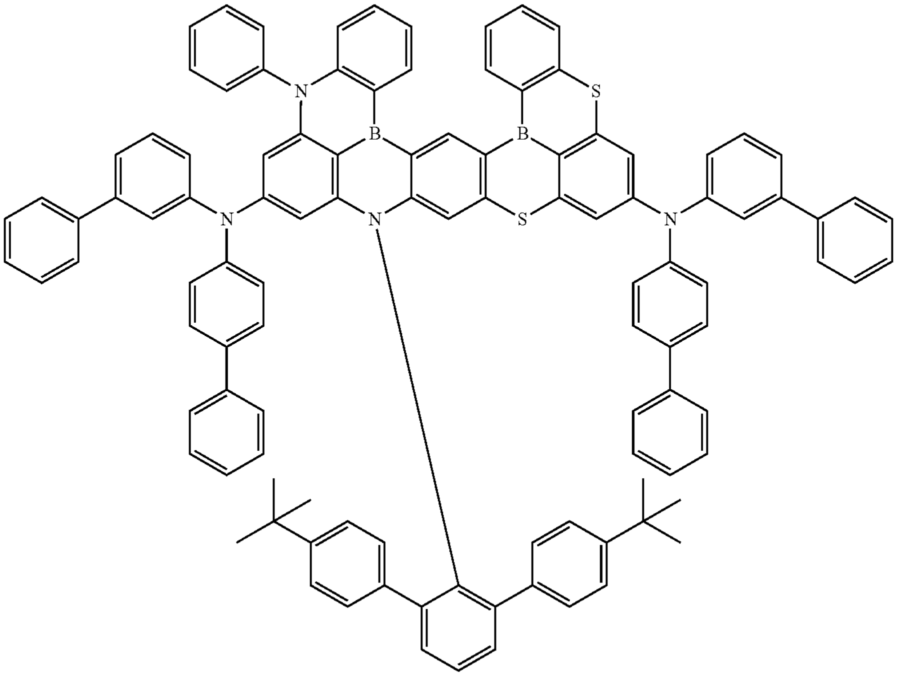

-continued
223
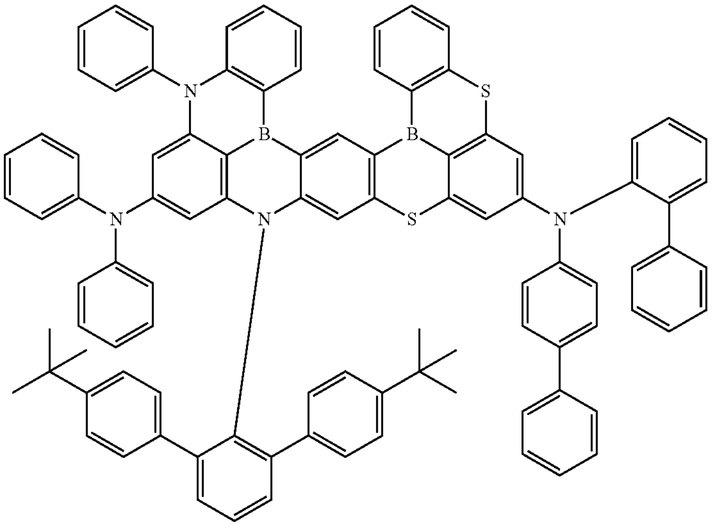
224
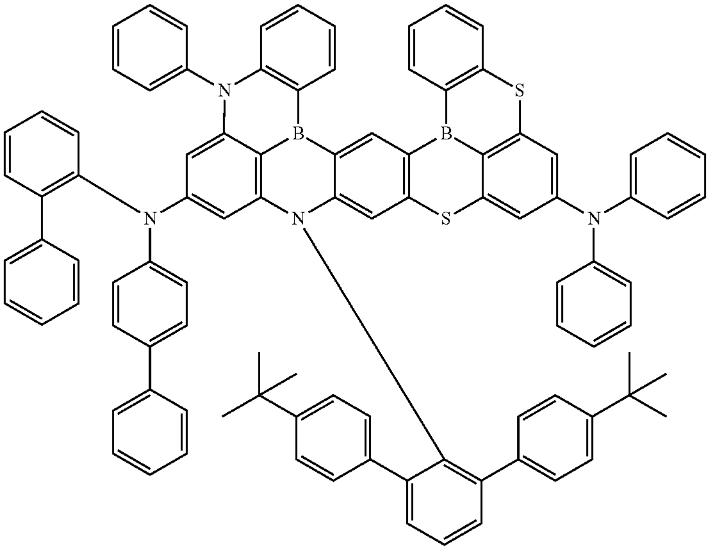
225
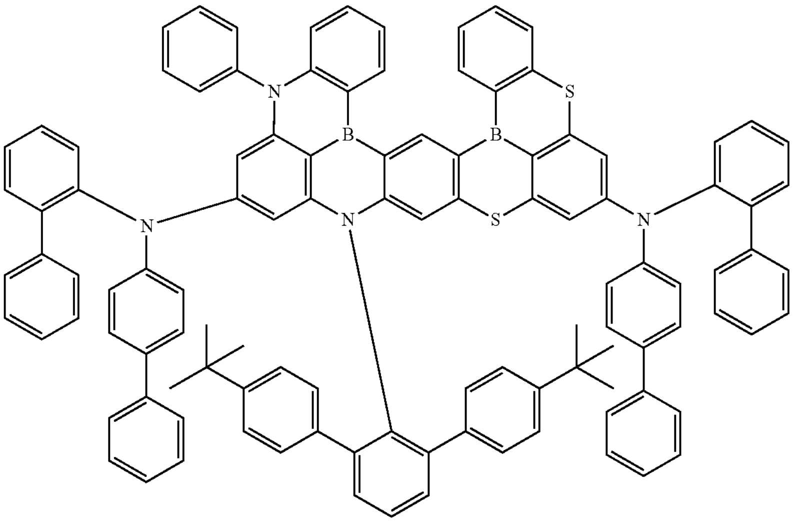

-continued
226
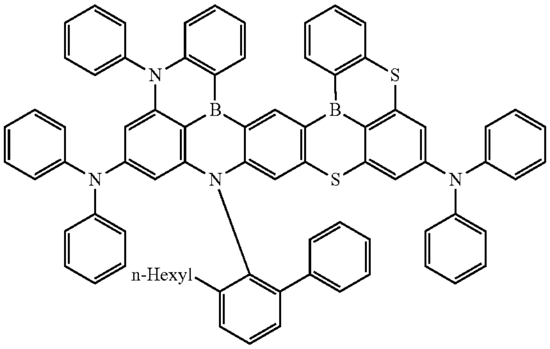
227
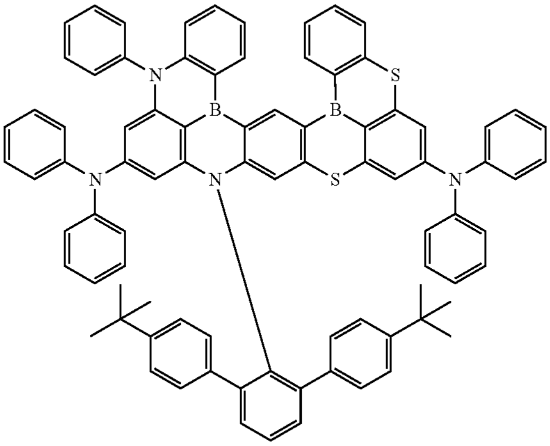
228
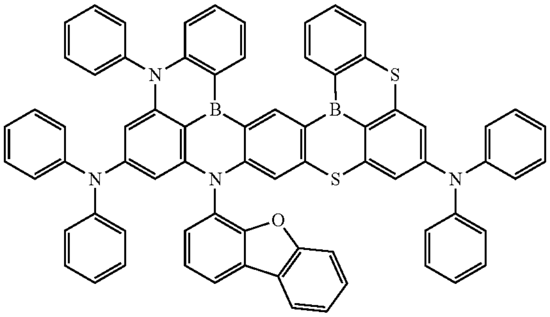
229
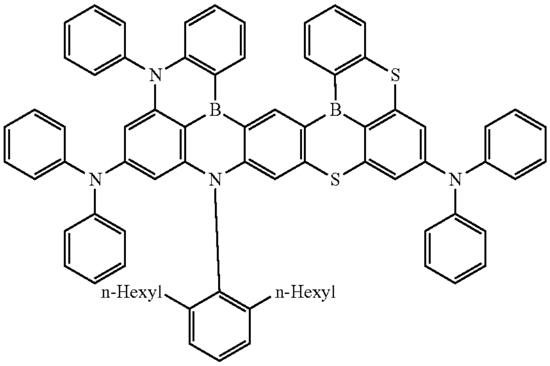
230
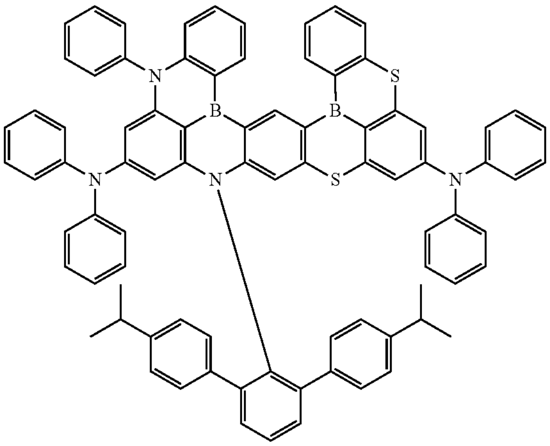
231
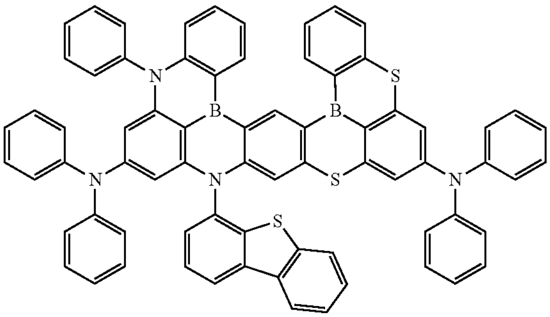

-continued
232
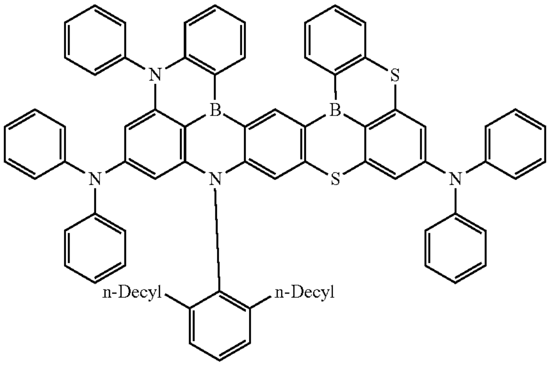
233
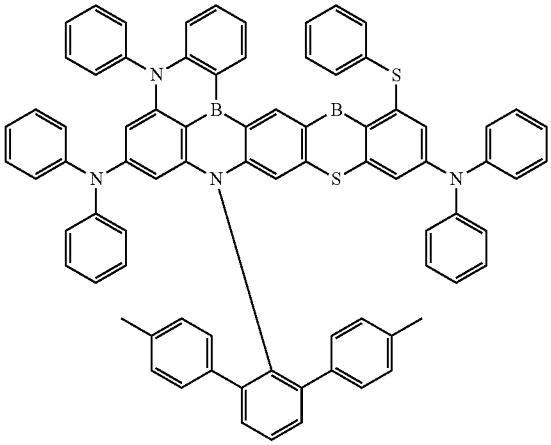
234
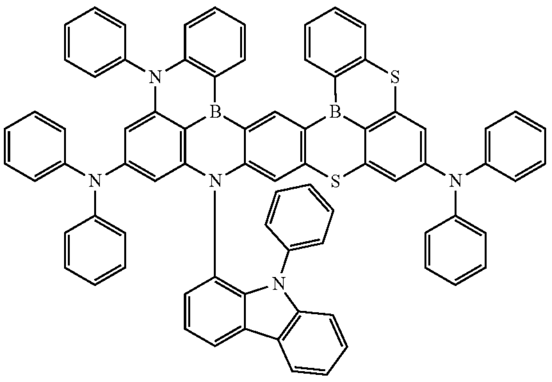
235
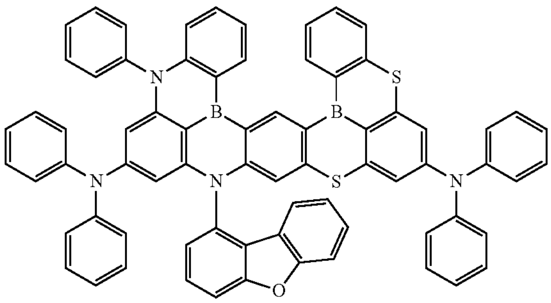
236
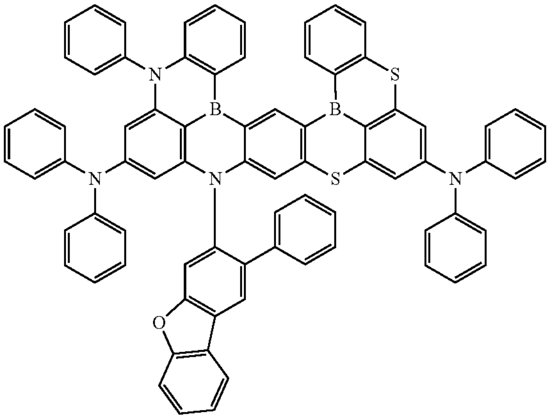
237
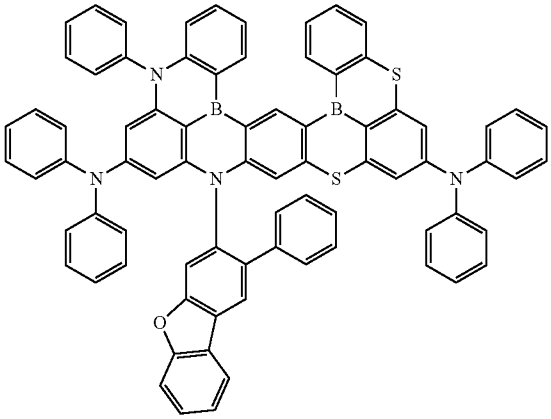

-continued
238
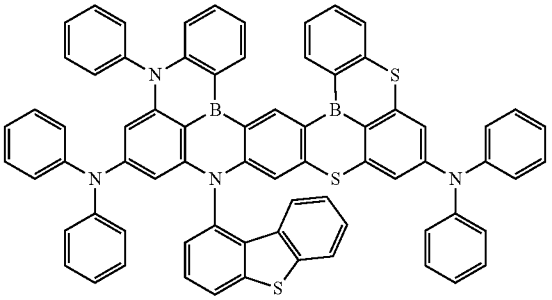
239
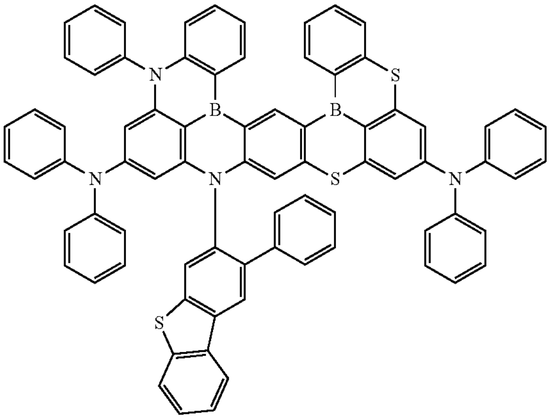
240
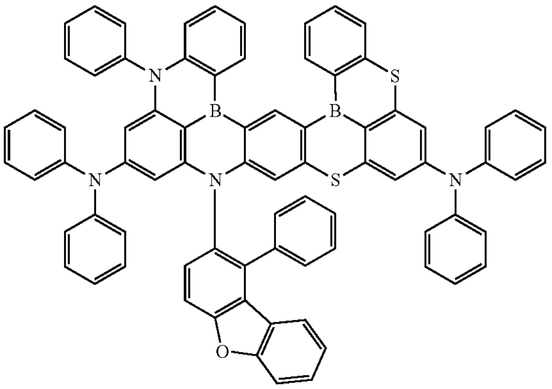
241
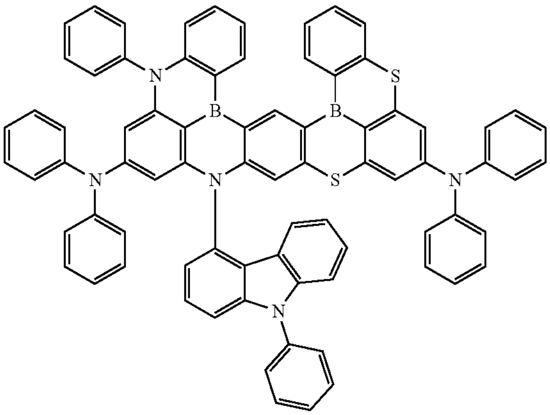
242
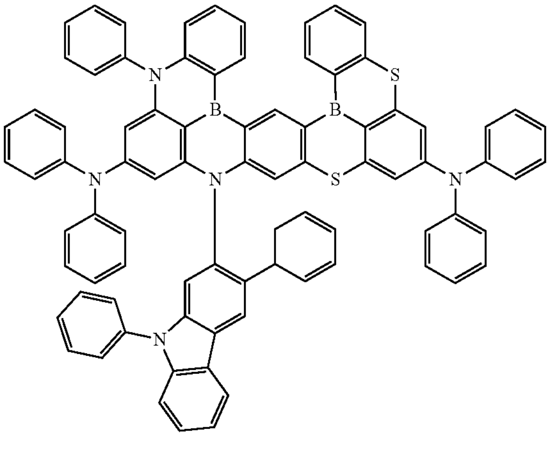
243
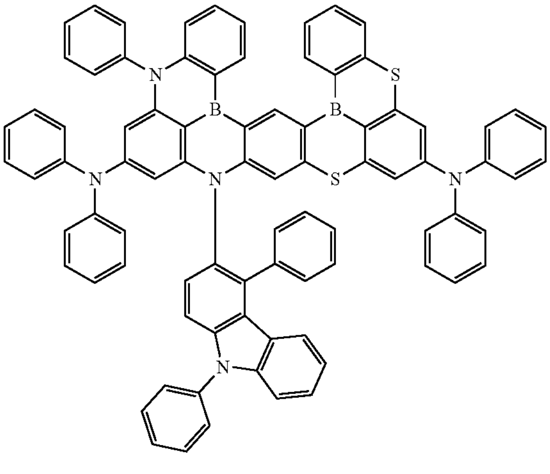

-continued
244
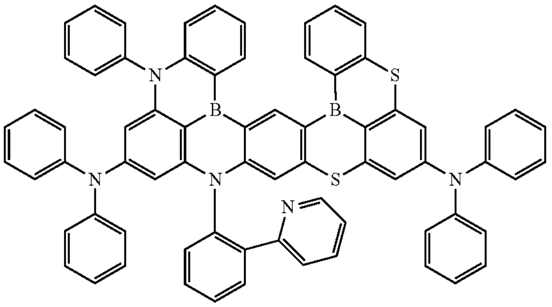
245
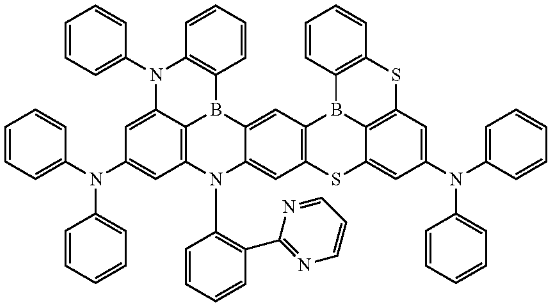
246
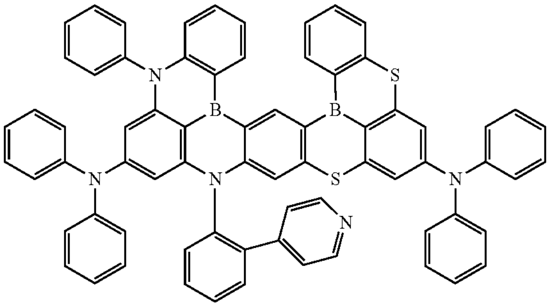
247
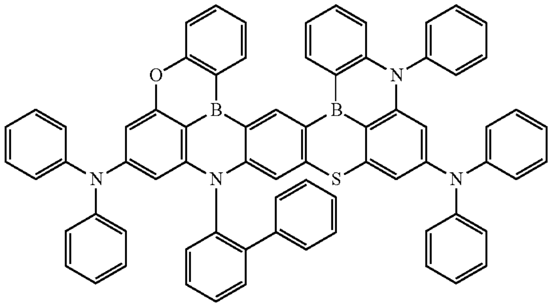
248
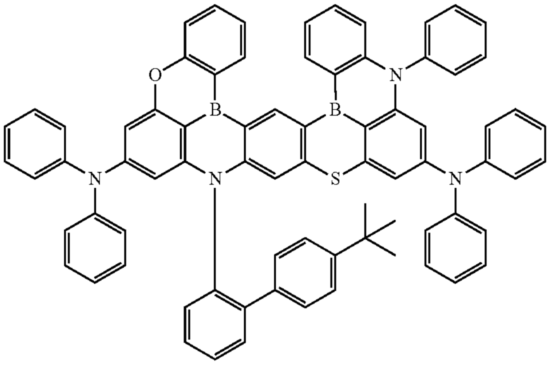
249
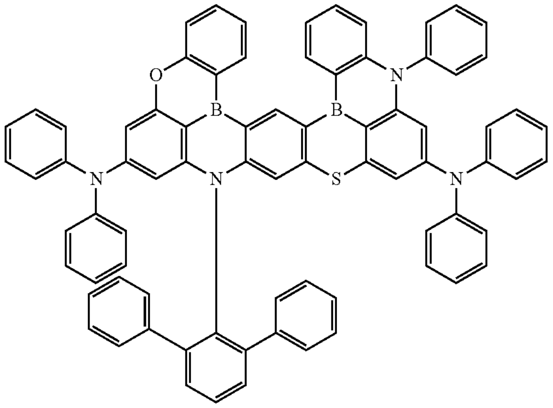
250
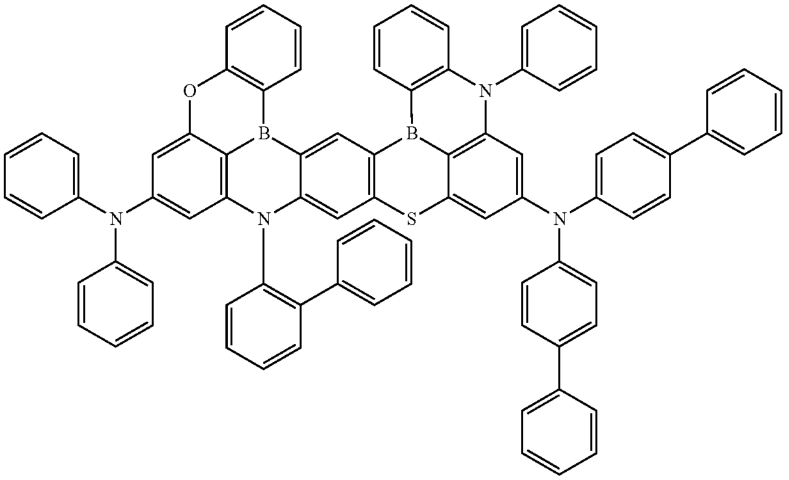

-continued
251
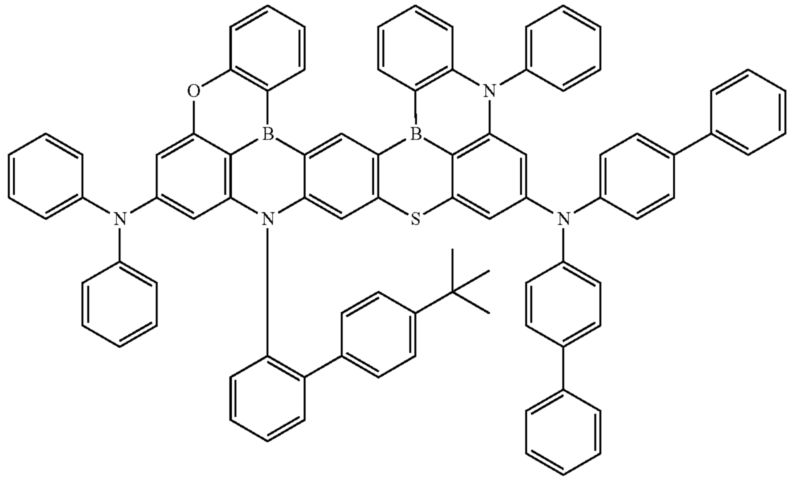
252
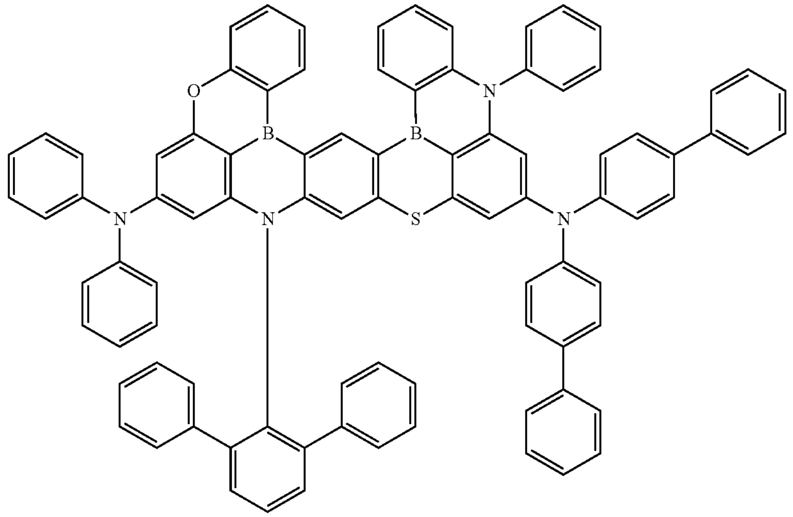
253
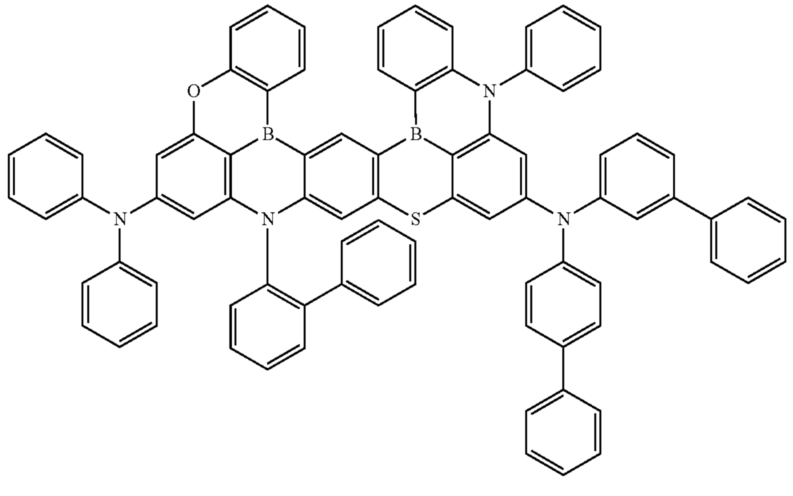

-continued
254
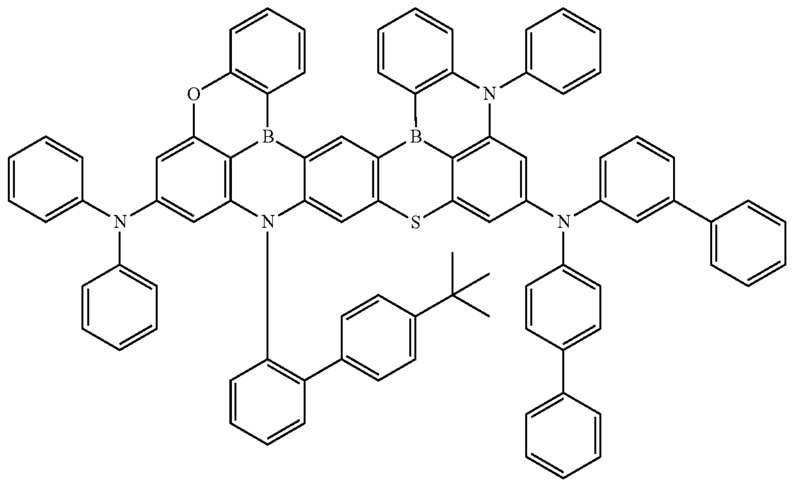
255
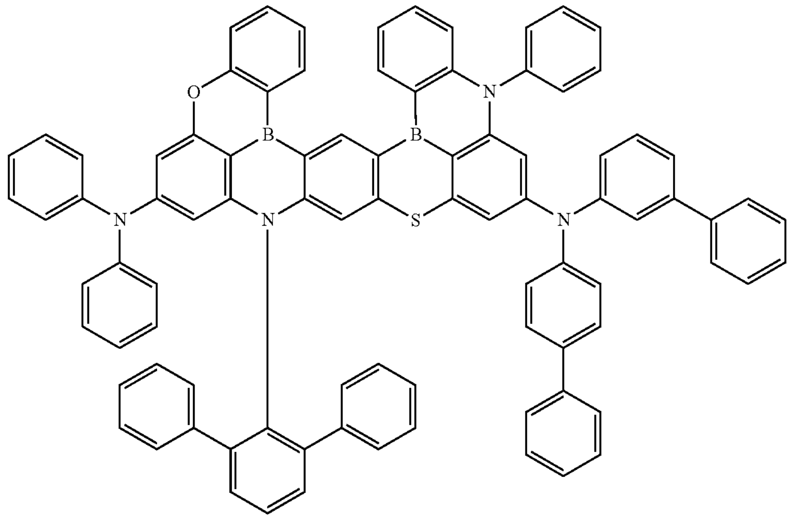
256
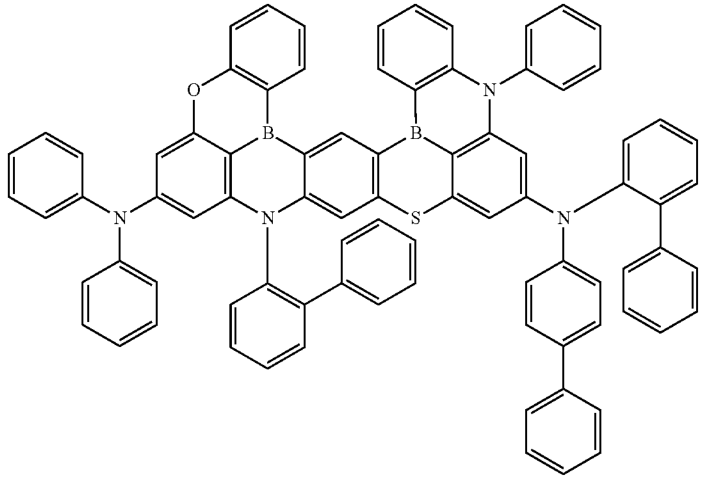

-continued
257
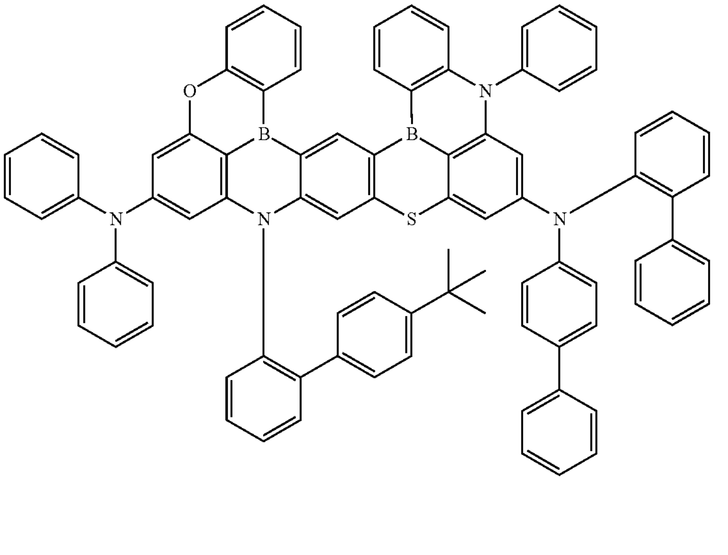
258
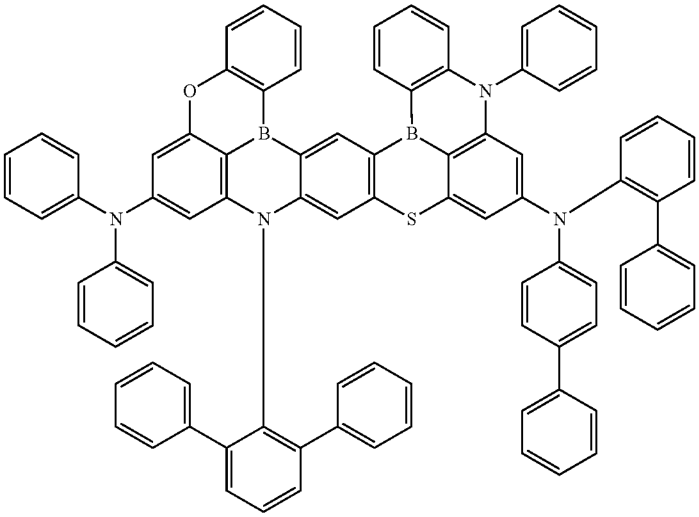
259
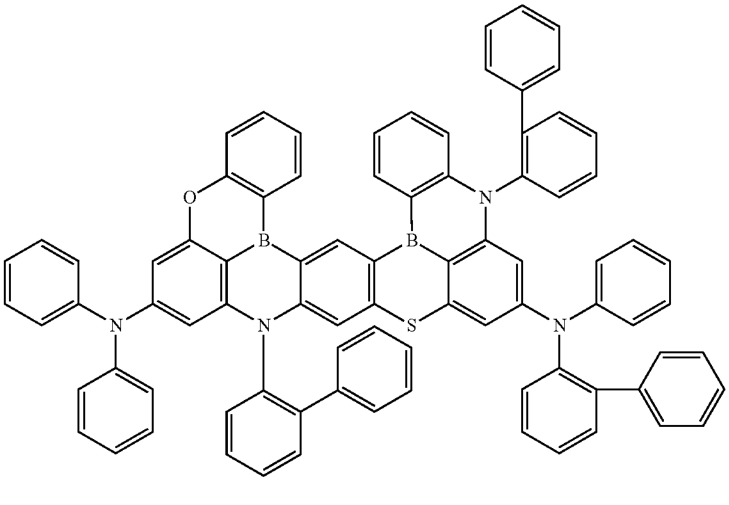

-continued
260
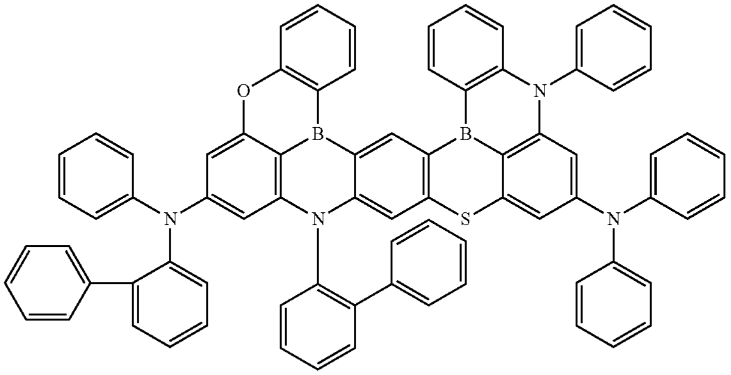
261
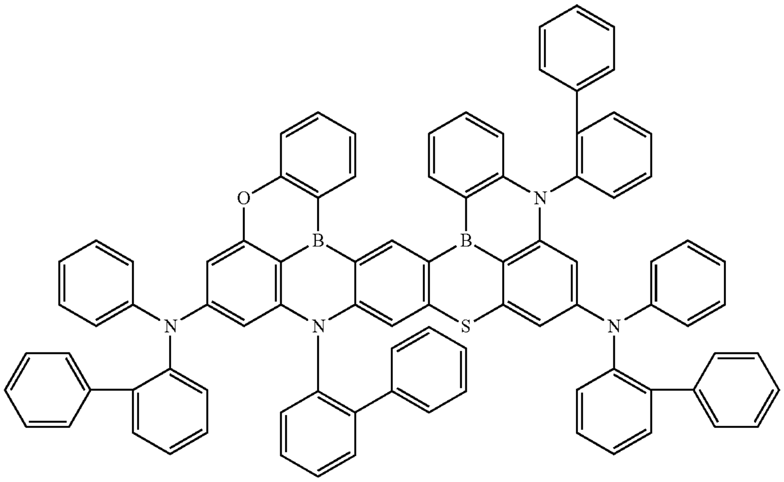
262
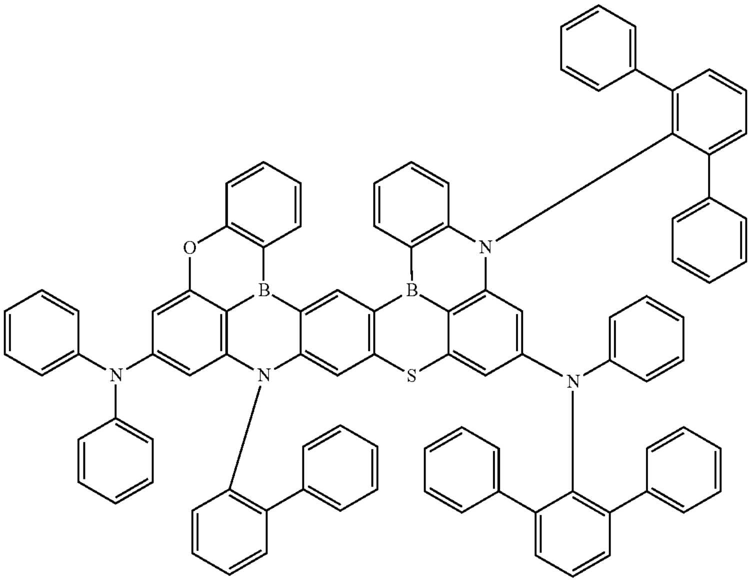

-continued
263
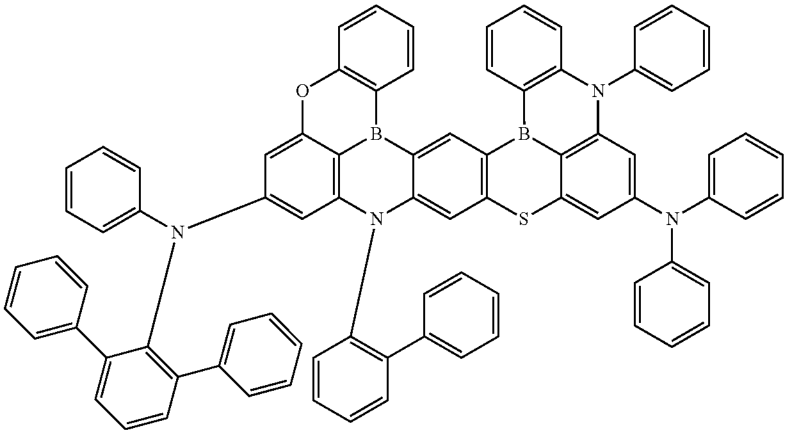
264
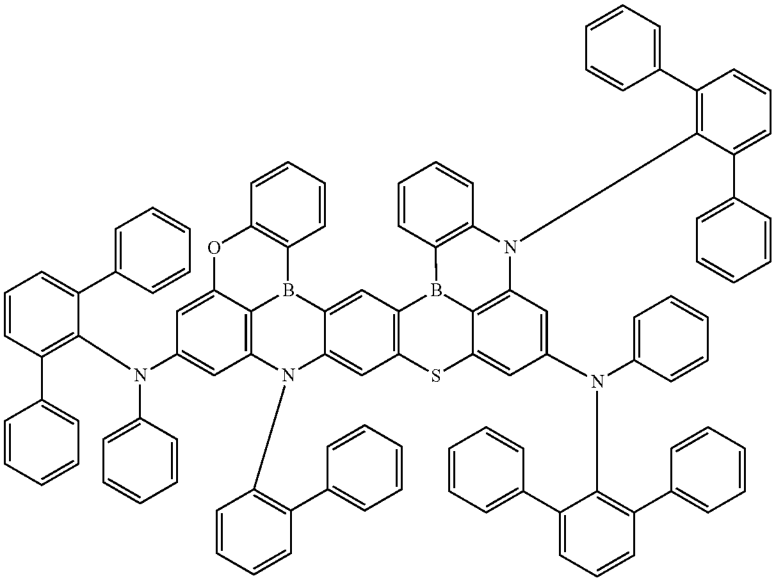
265
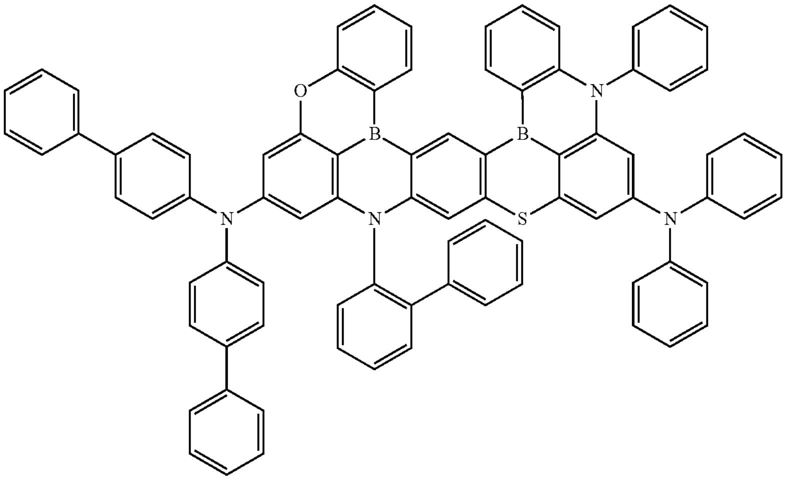

-continued
266
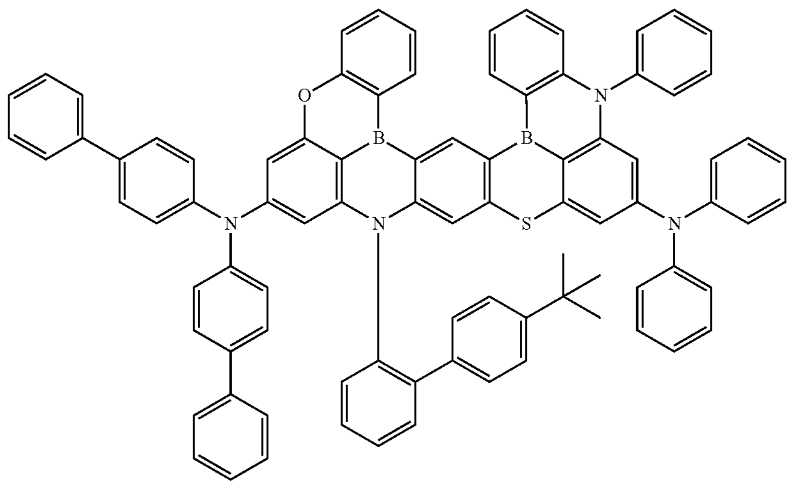
267
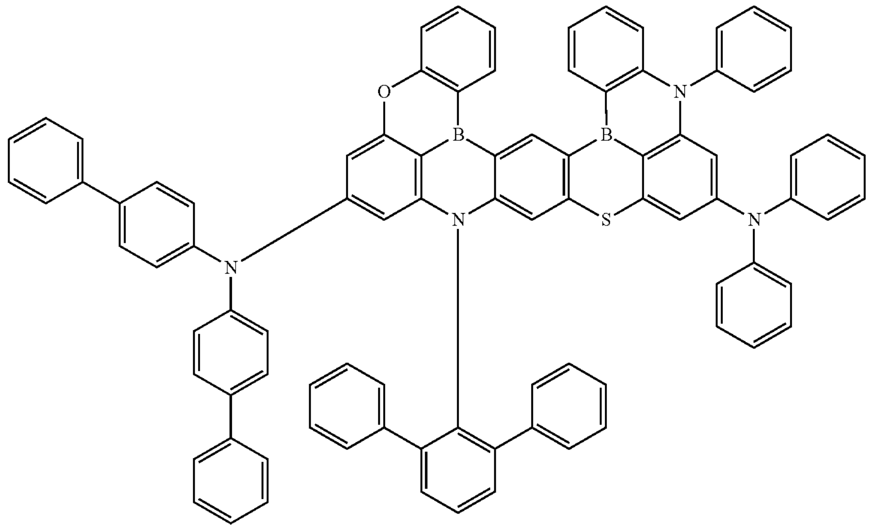
268
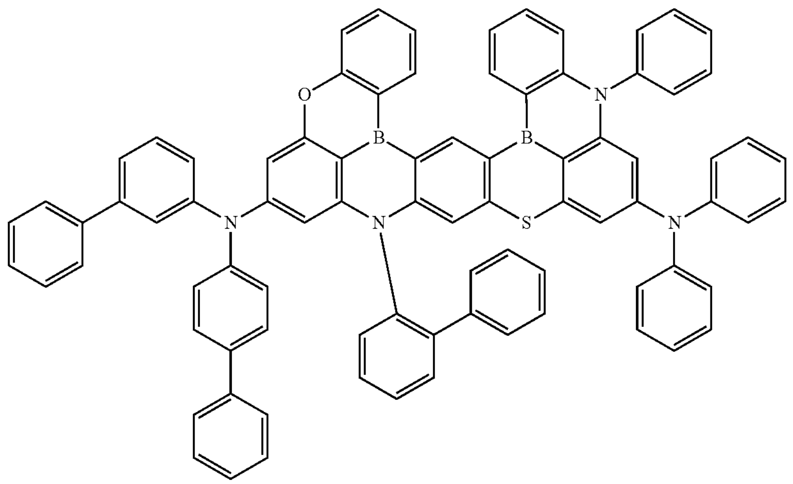

-continued
269
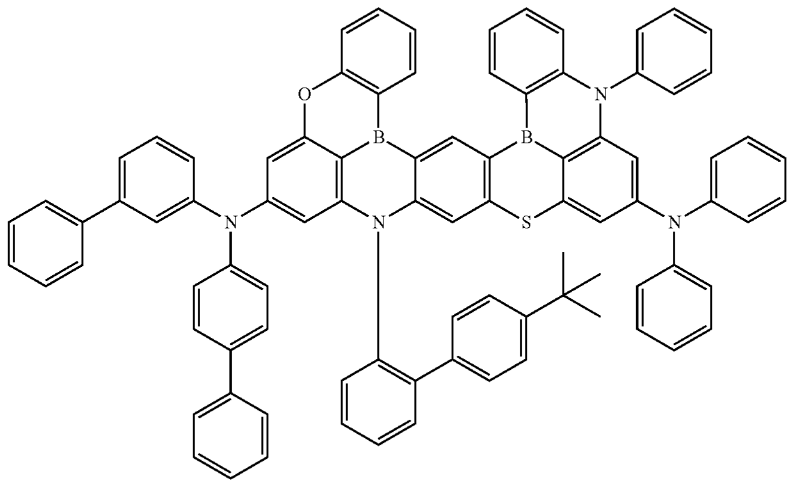
270
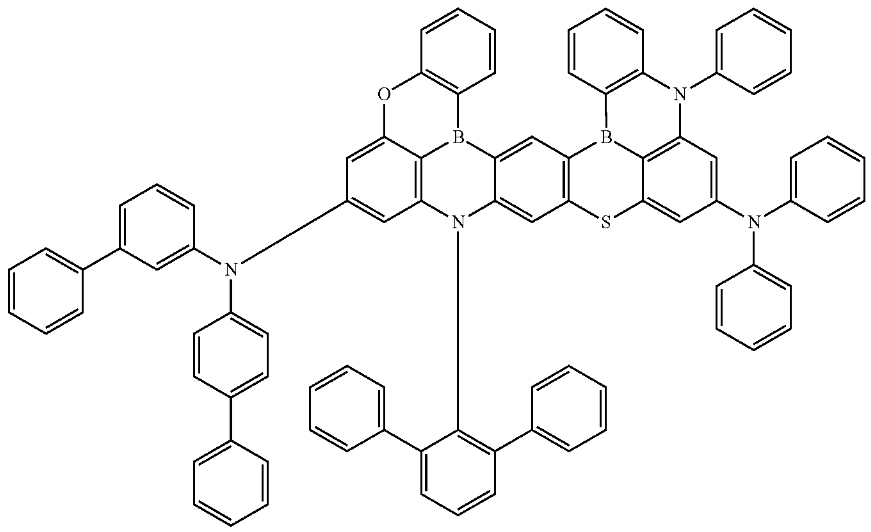
271
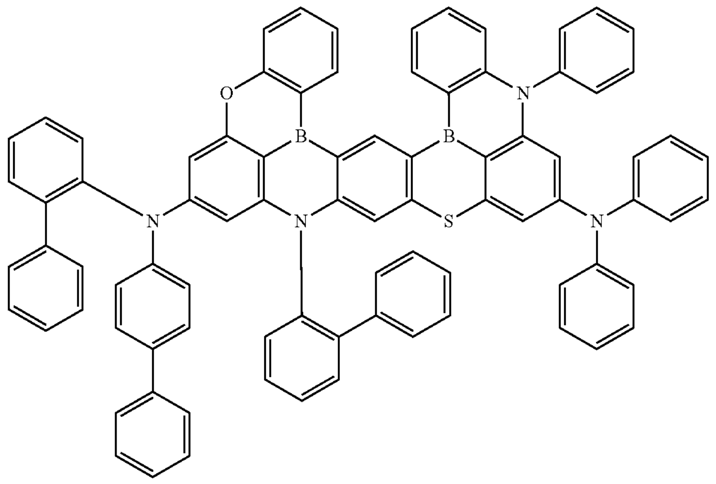

-continued
272
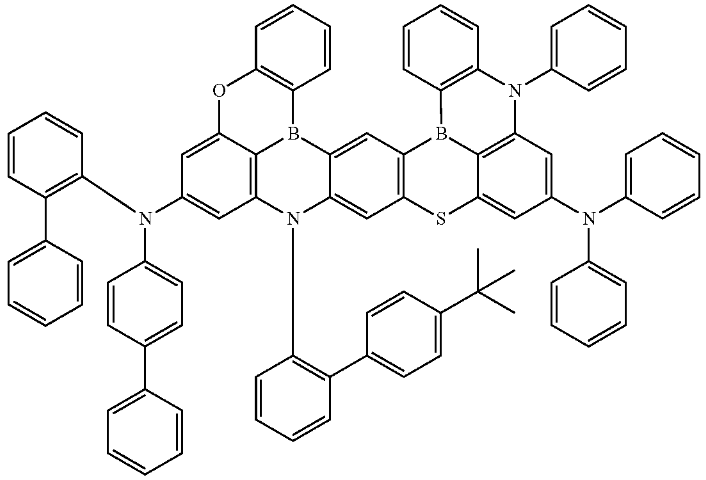
273
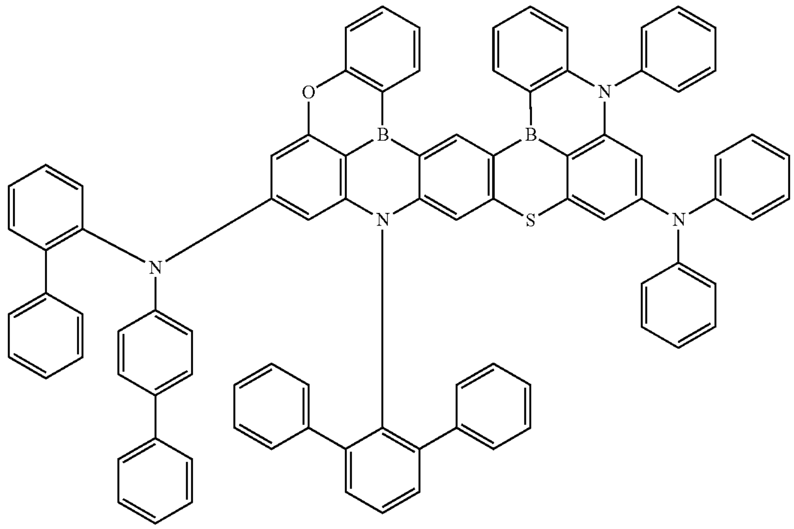
274
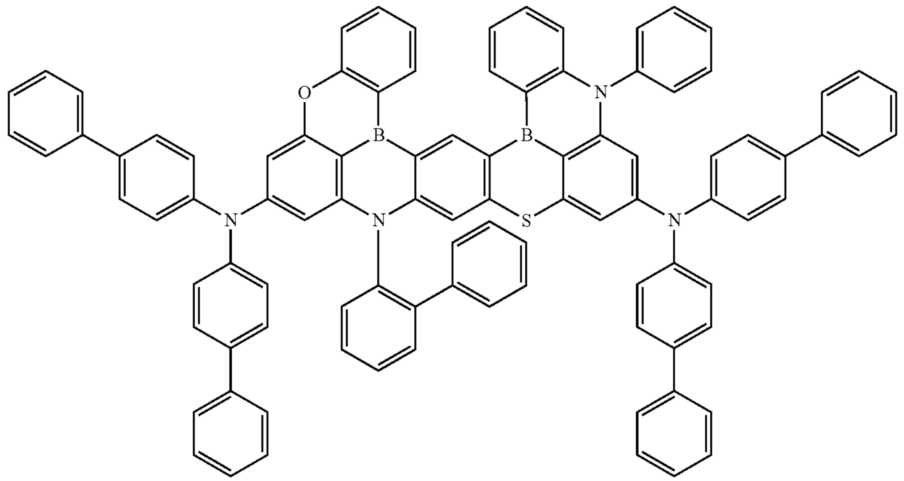

-continued
275
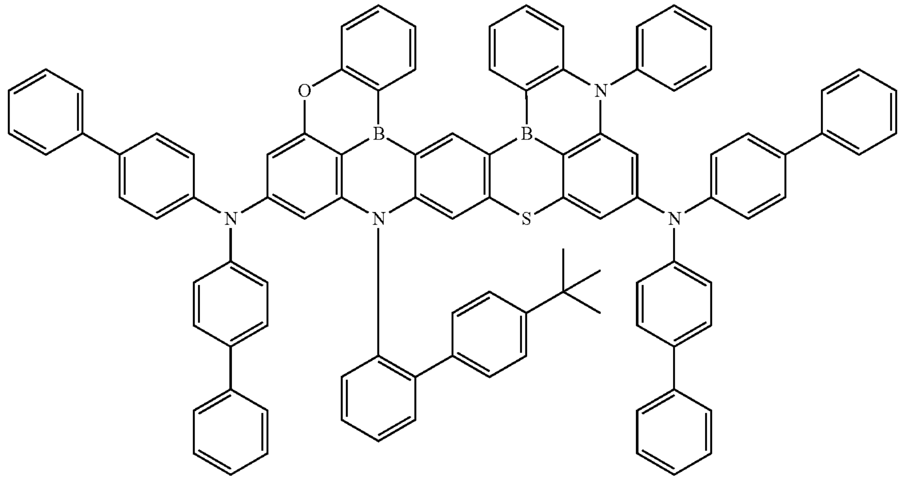
276
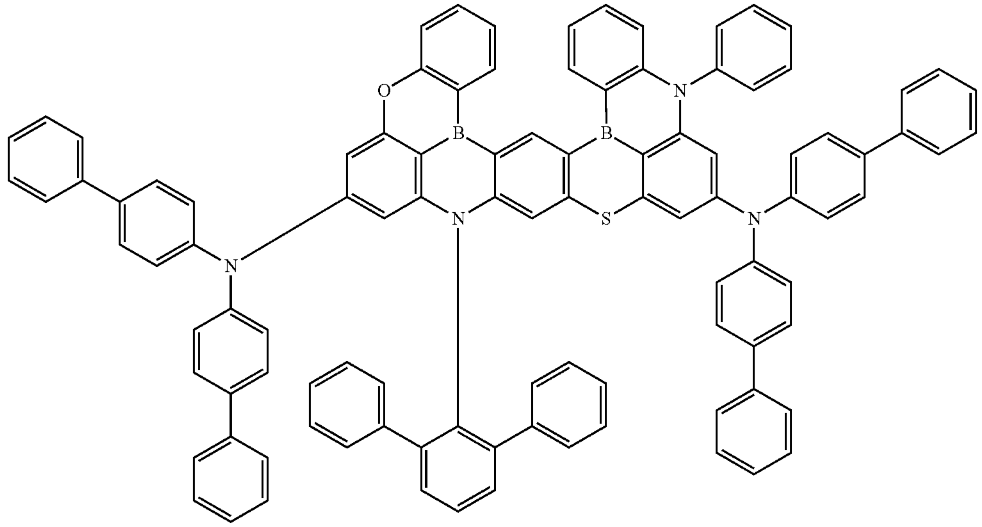
277
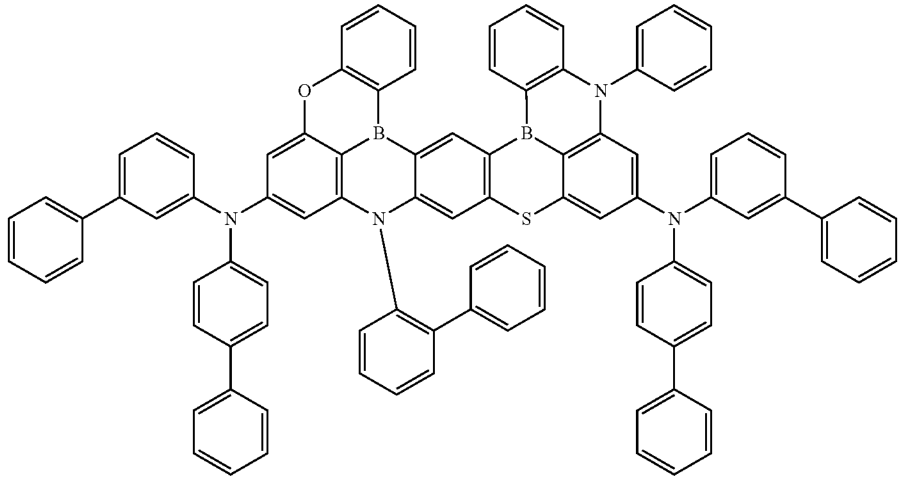

-continued
278
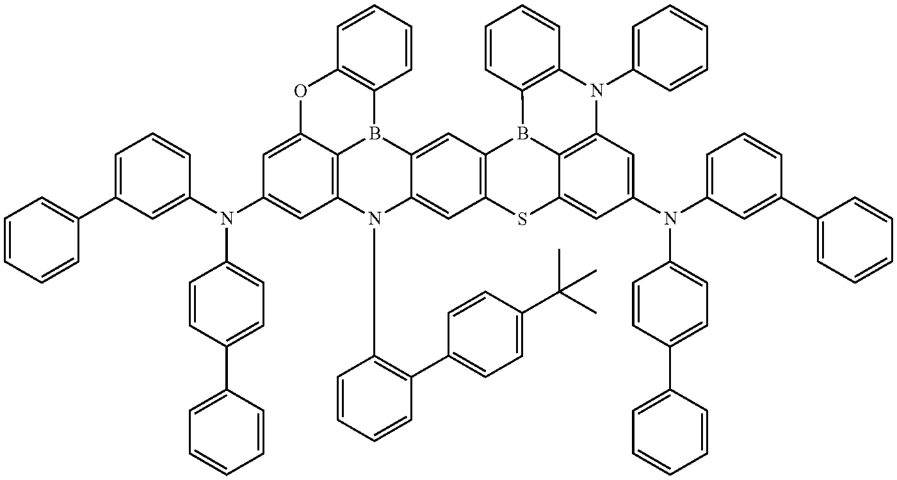
279
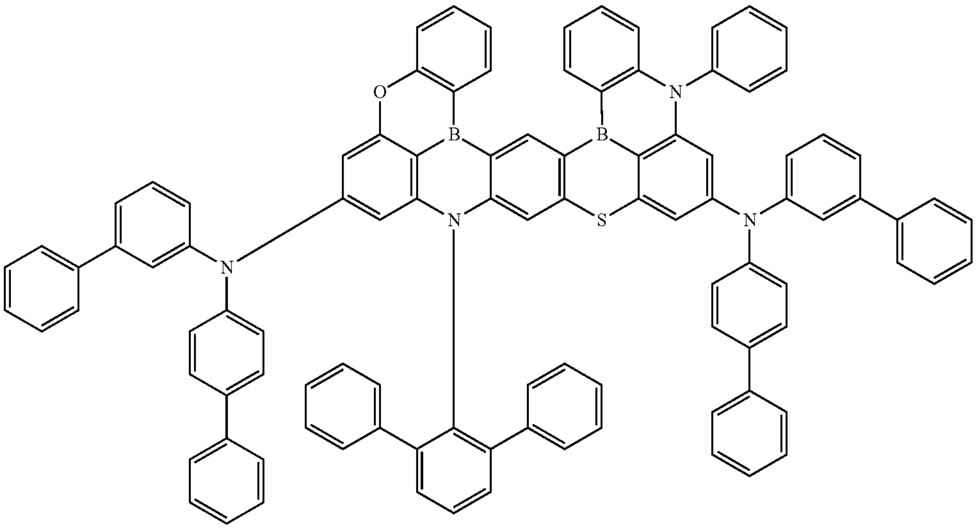
280
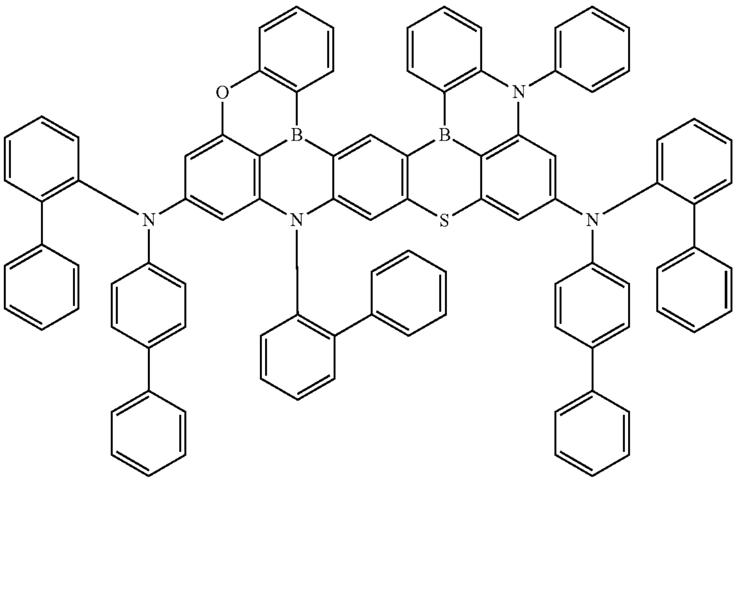

-continued
281
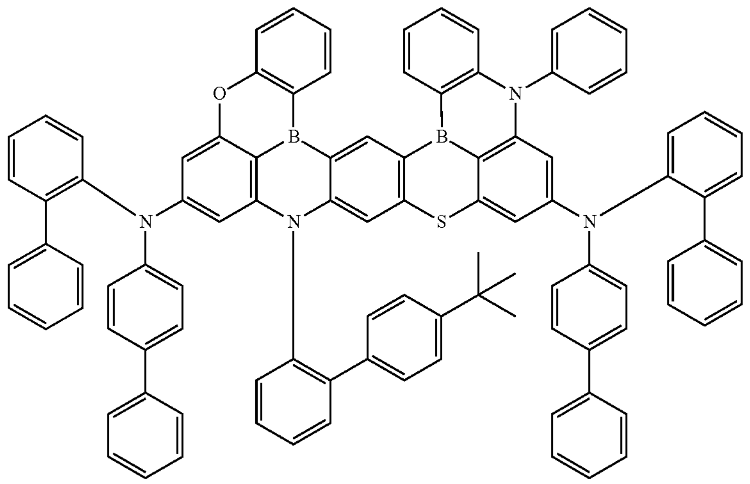
282
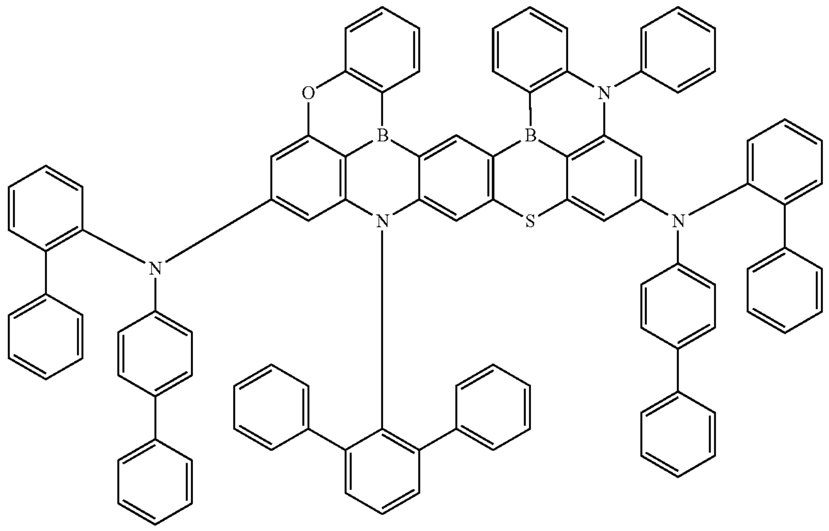
283
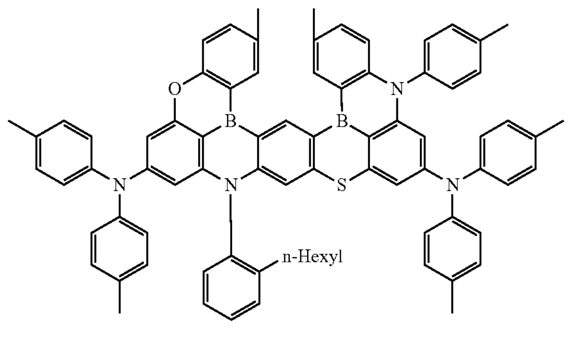
284
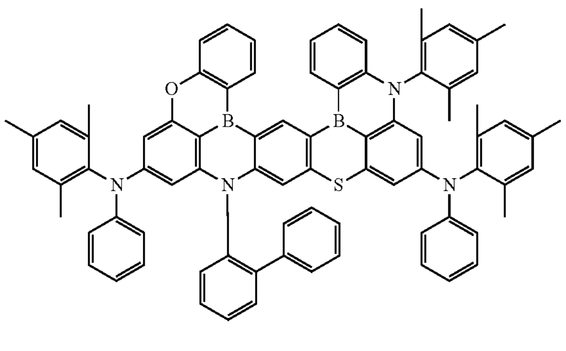

-continued
285
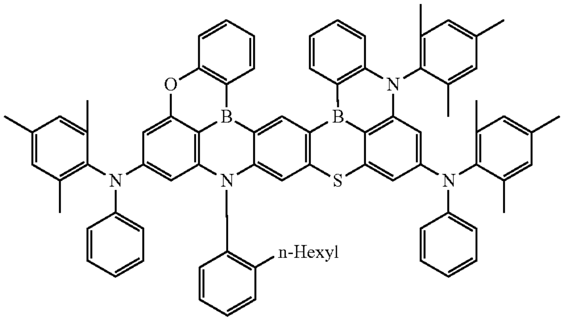
286
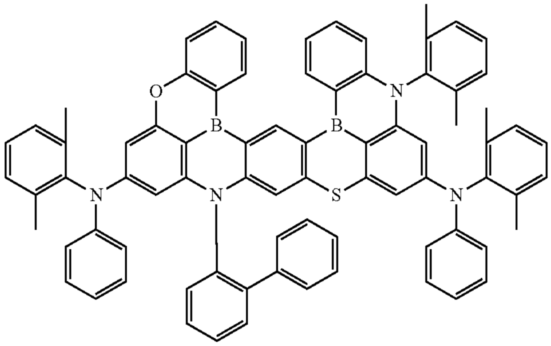
287
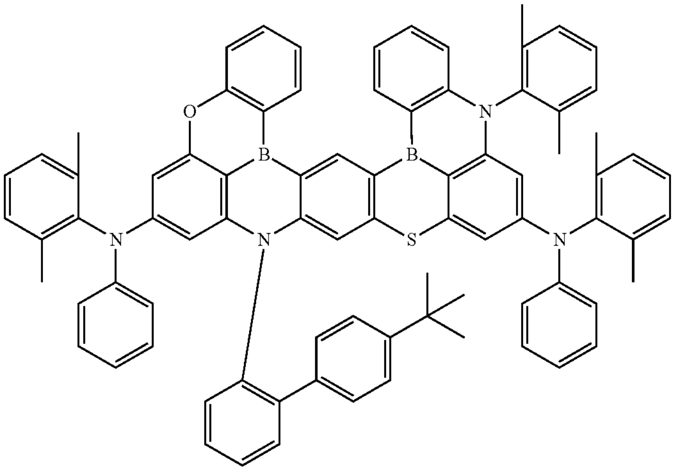
288
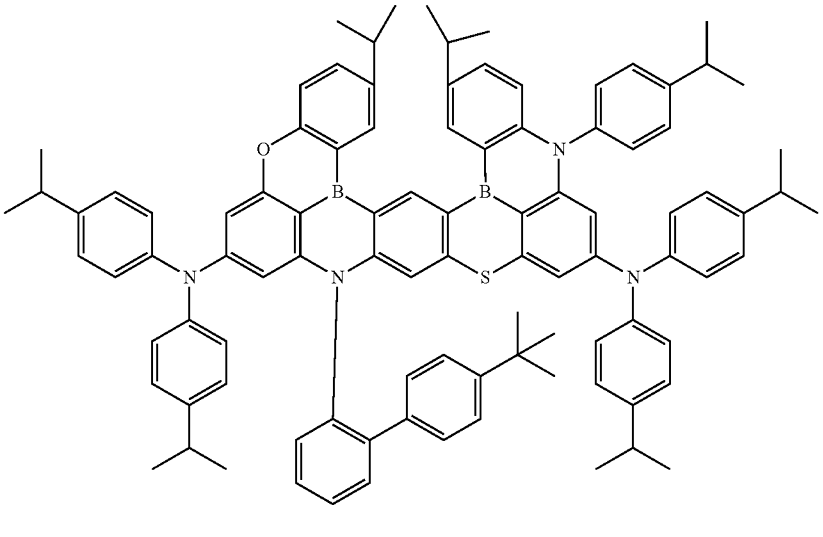

-continued
289
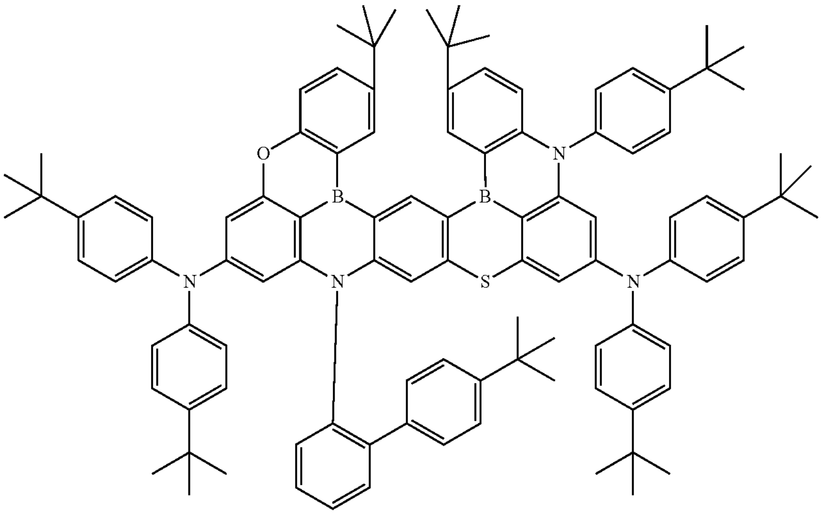
290
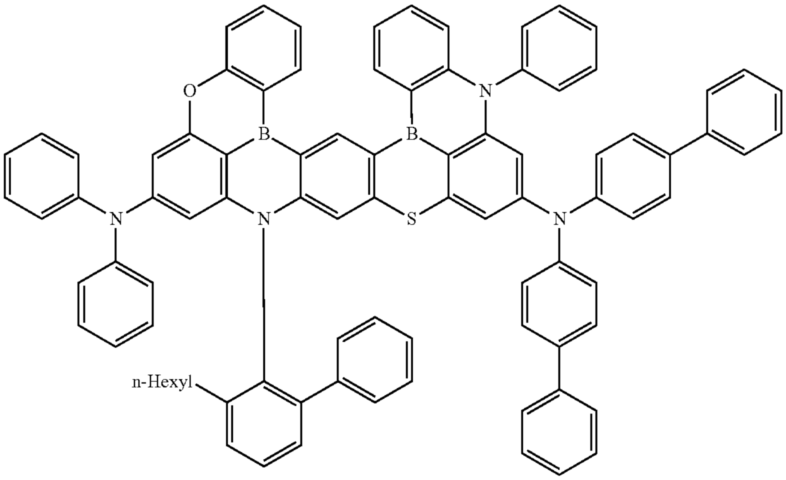
291
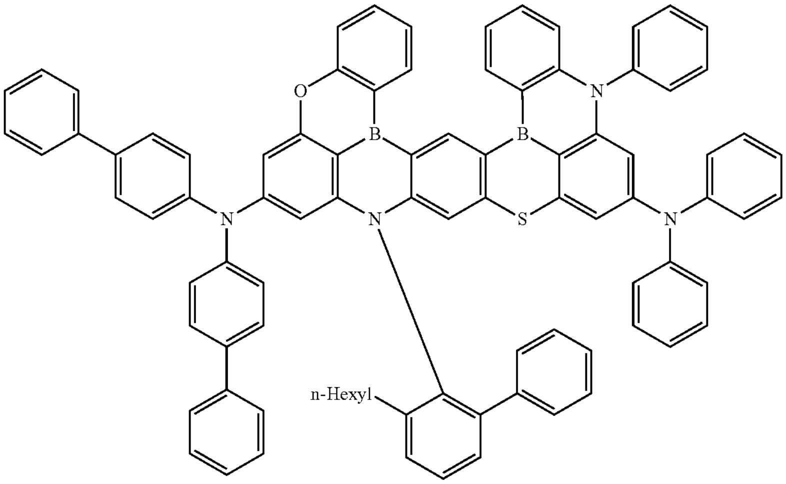

-continued
292
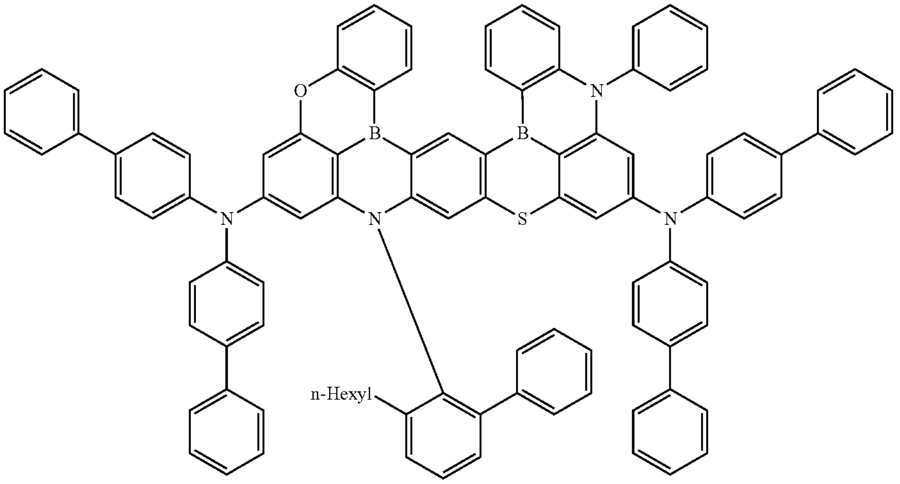
293
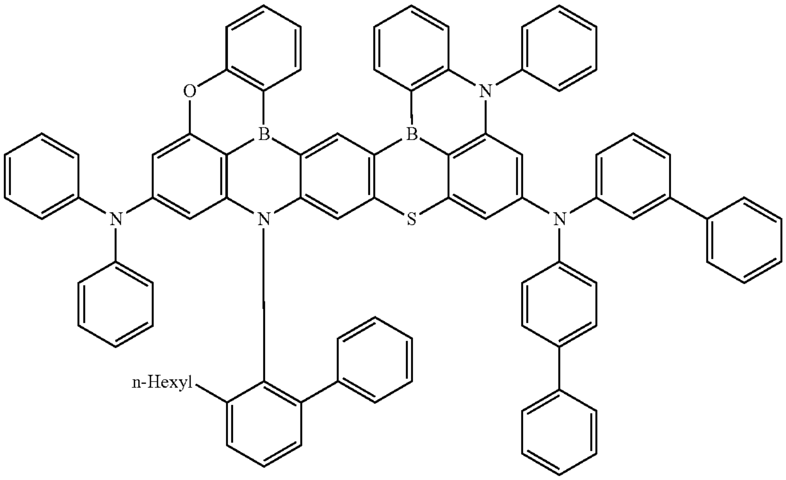
294
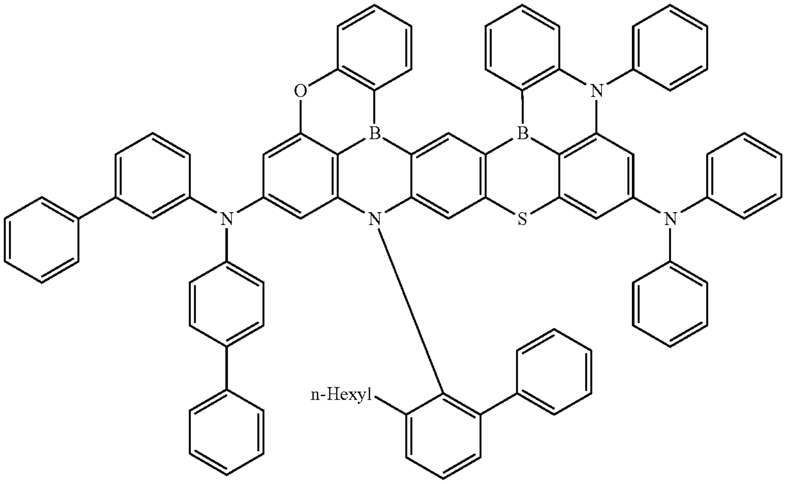

-continued
295
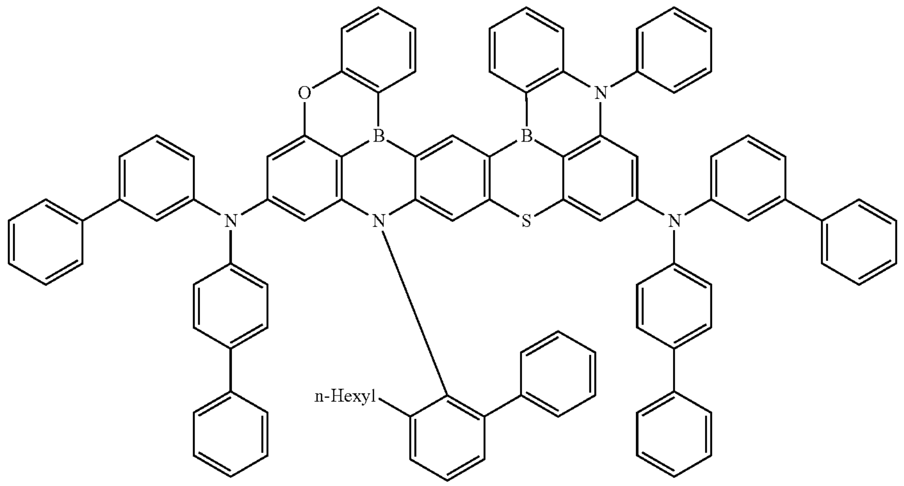
296
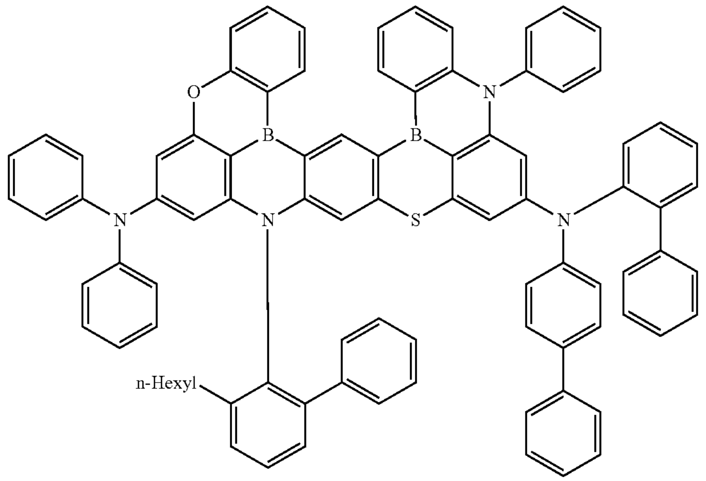
297
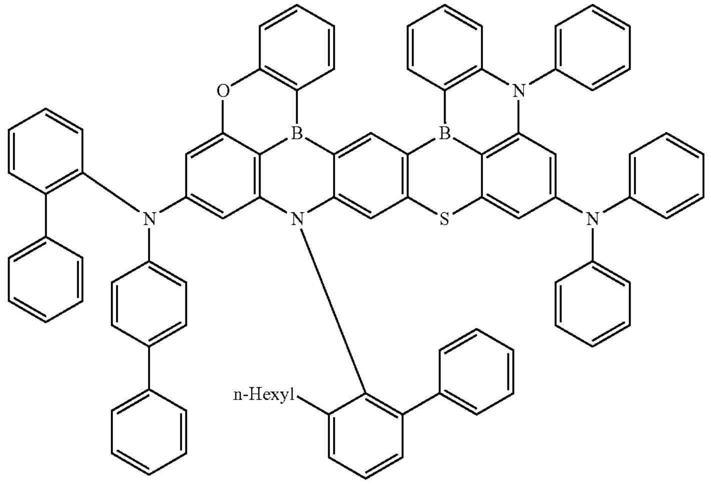

-continued
298
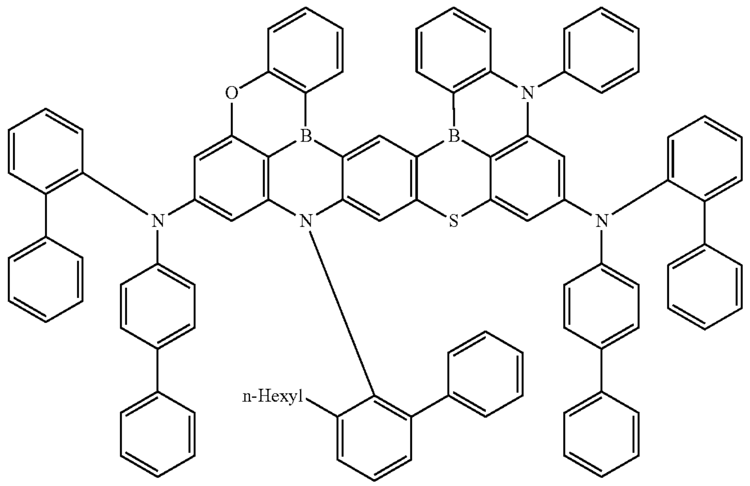
299
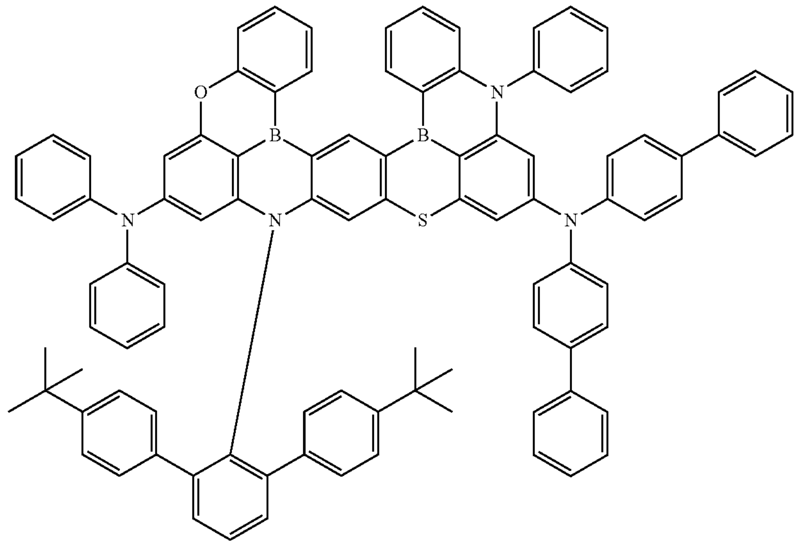
300
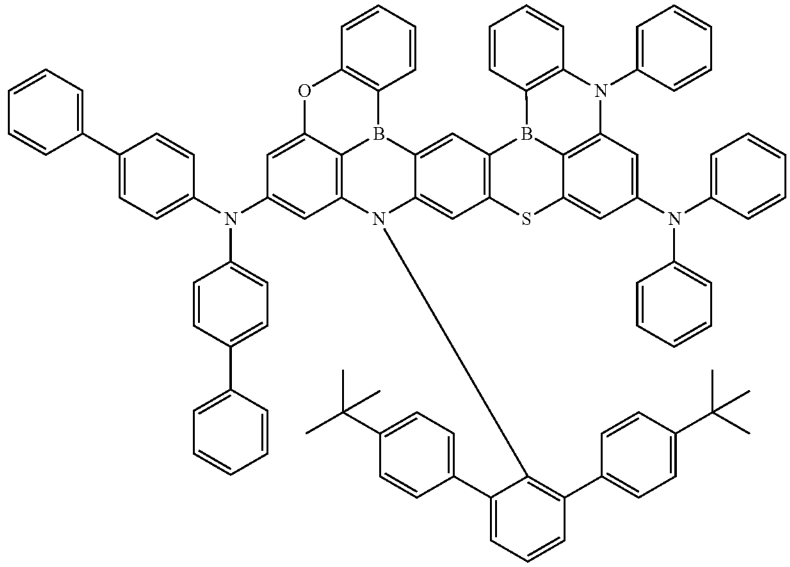

-continued
301
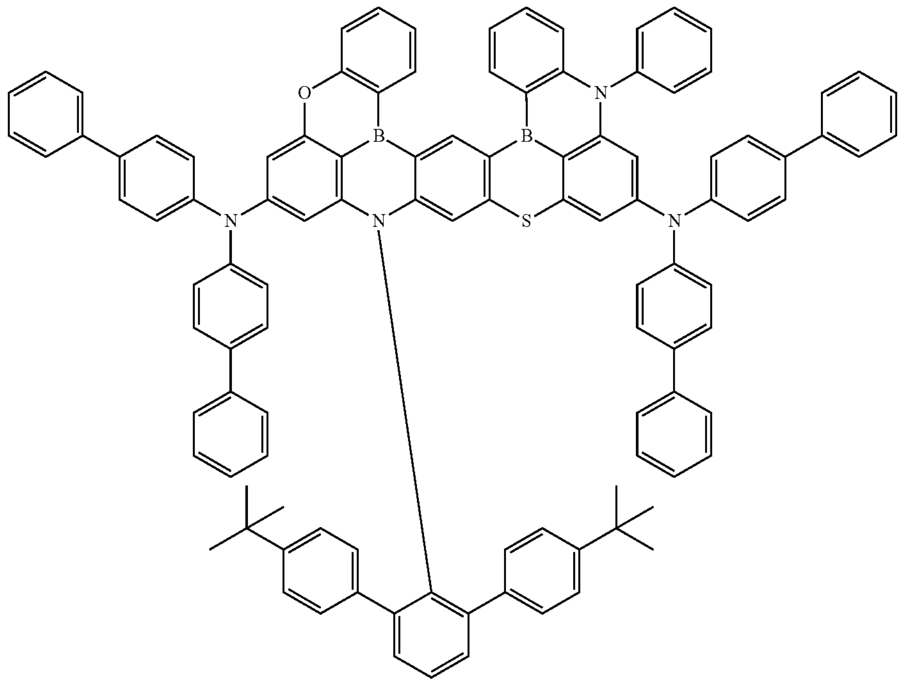
302
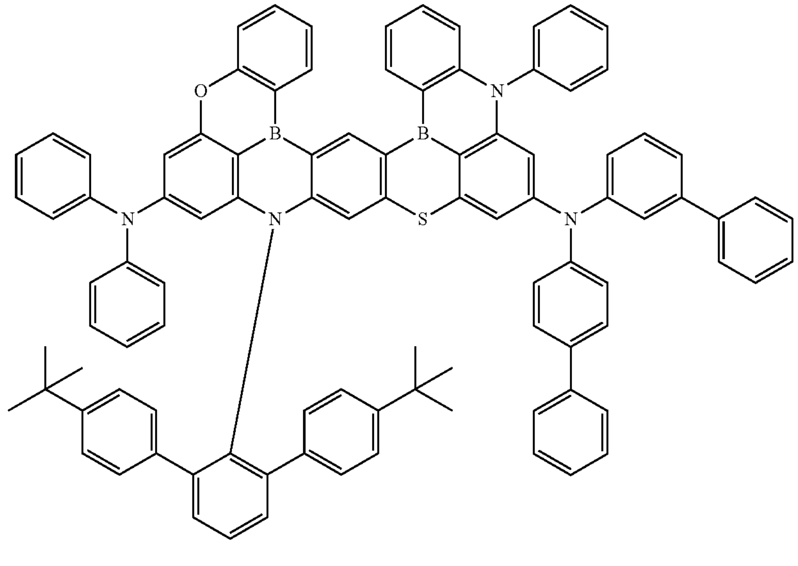

-continued
303
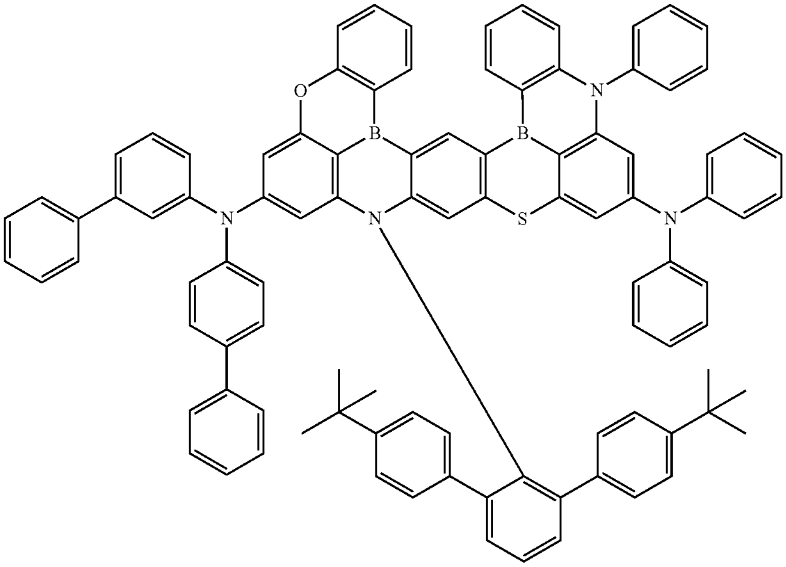
304
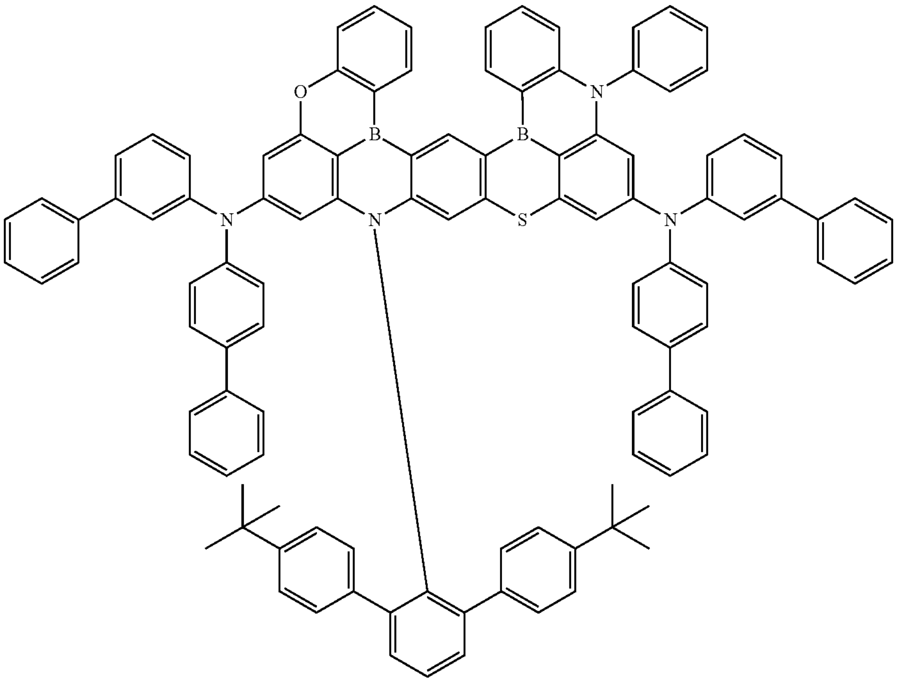

-continued
305
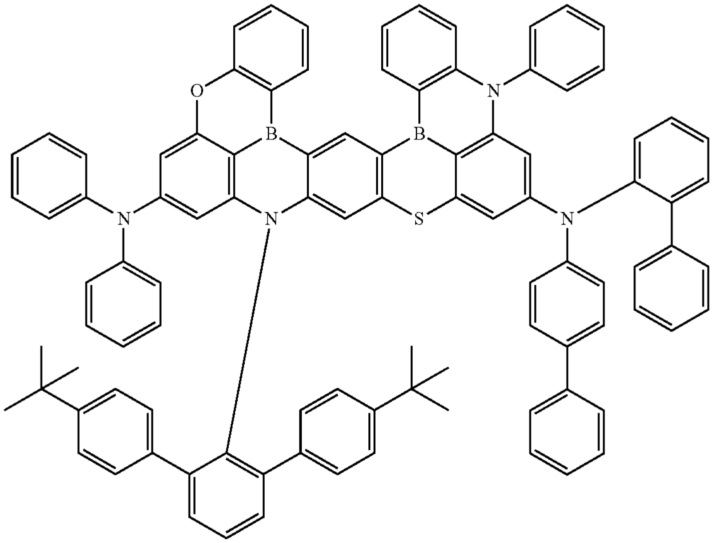
306
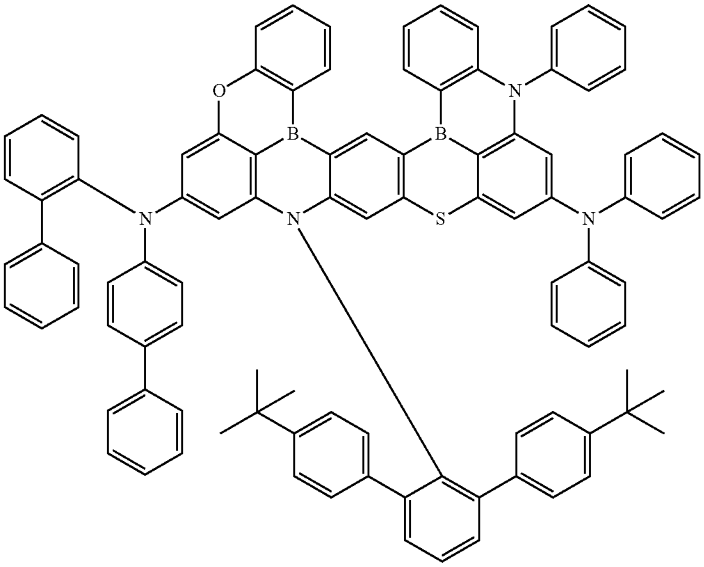

-continued
307
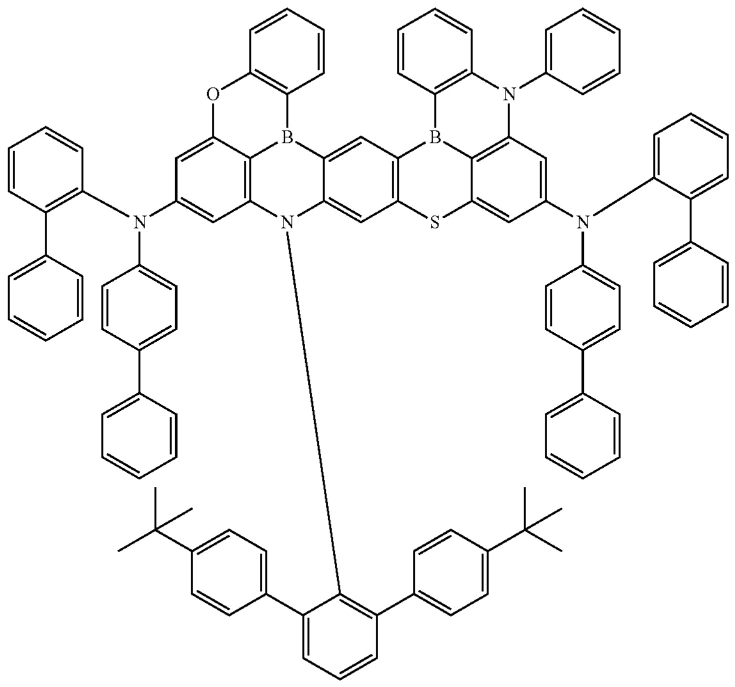
308
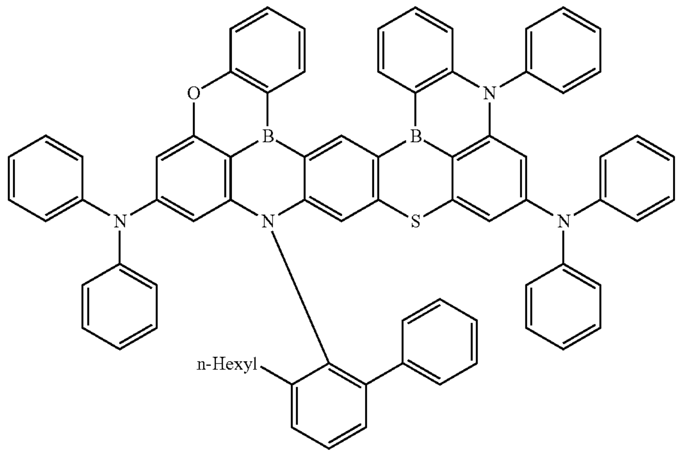

-continued
309
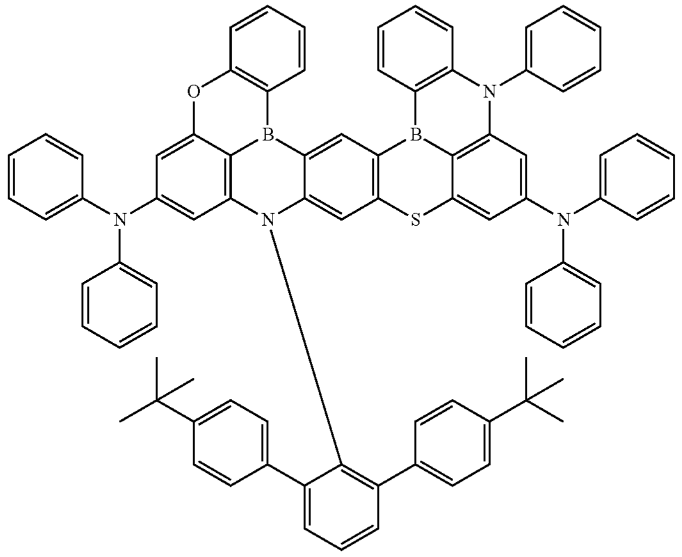
310
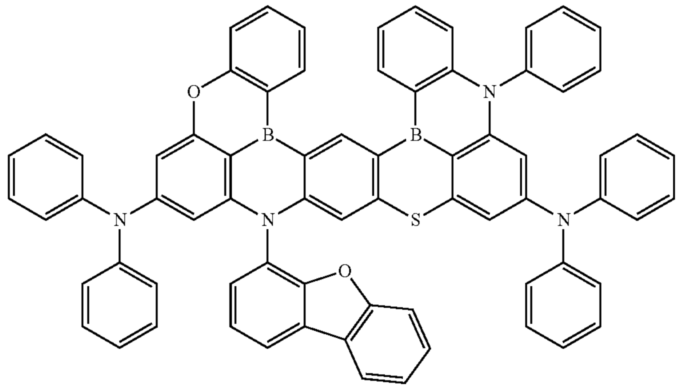
311
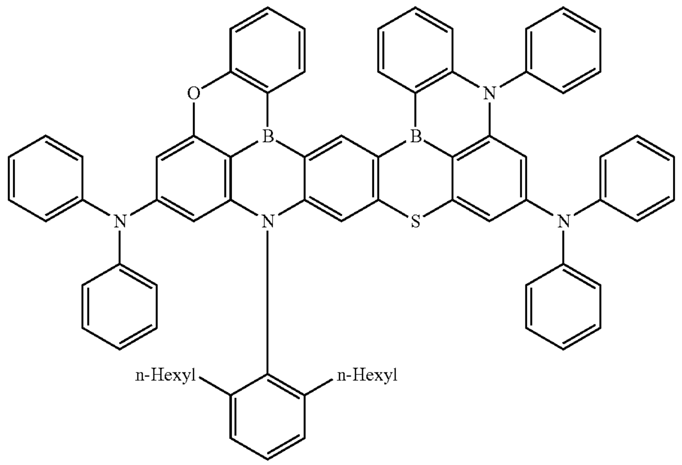

-continued
312
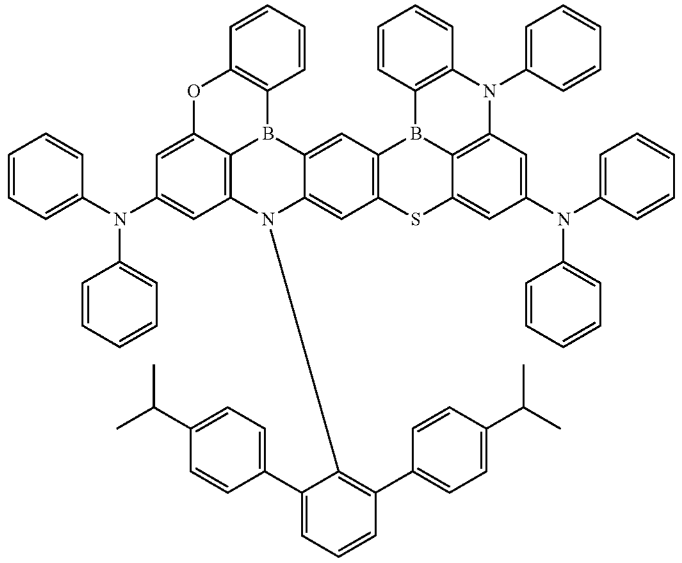
313
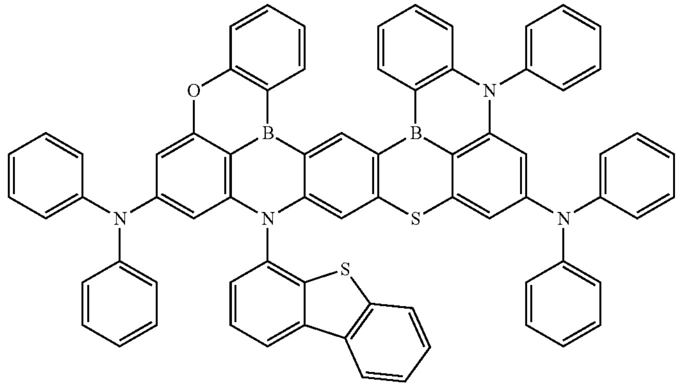
314
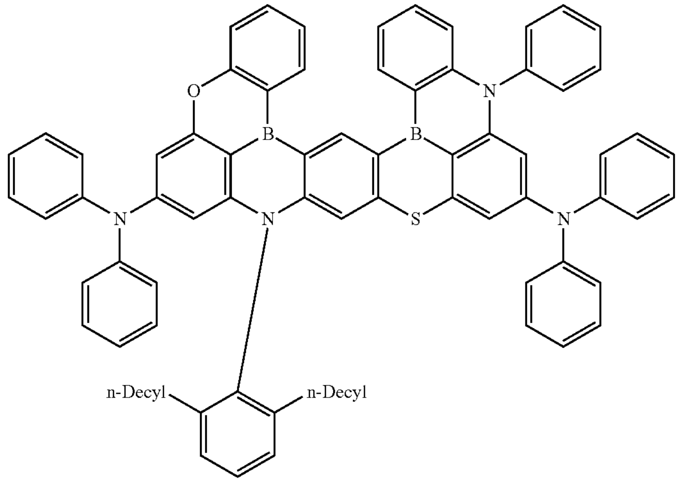

-continued
315
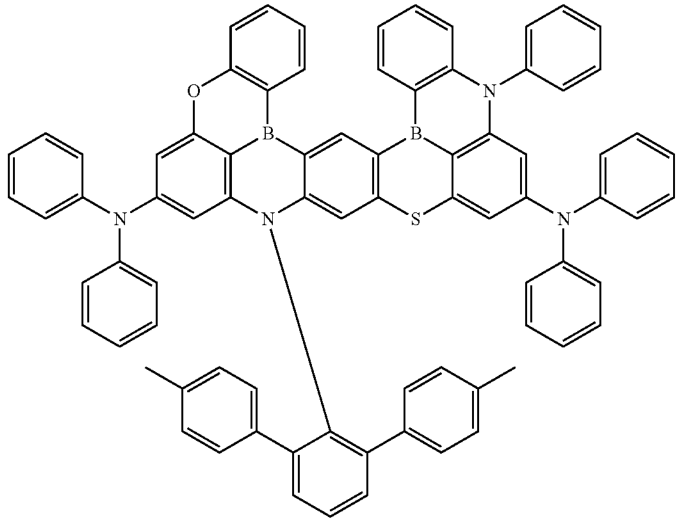
316
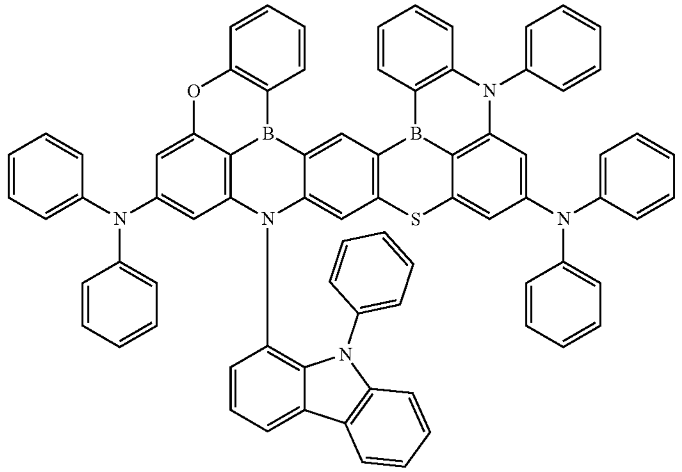
317
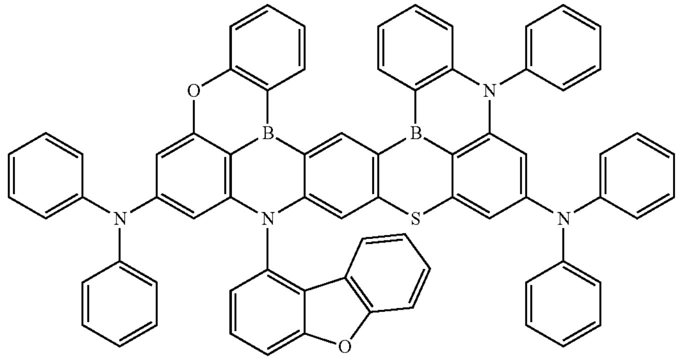

-continued
318
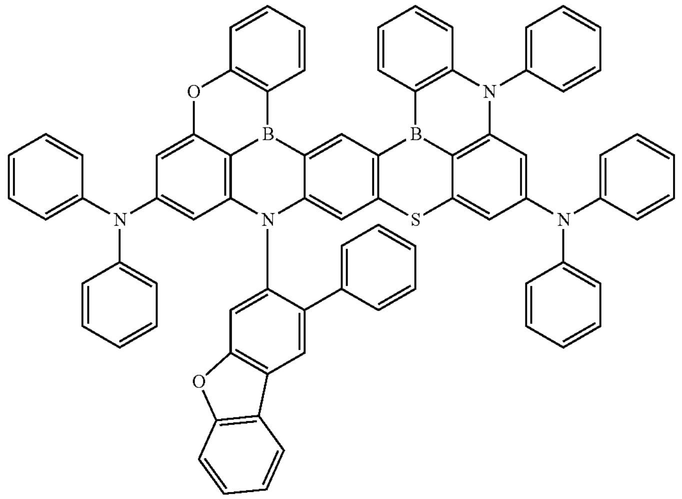
319
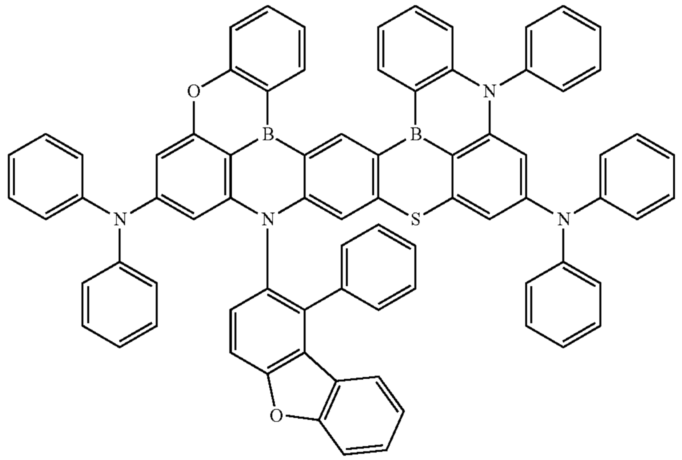
320
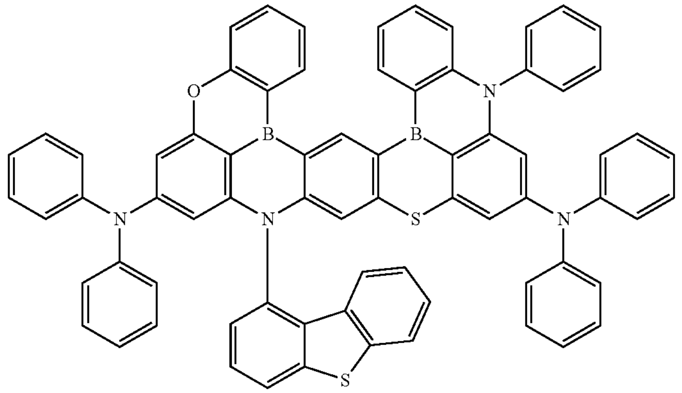

-continued
321
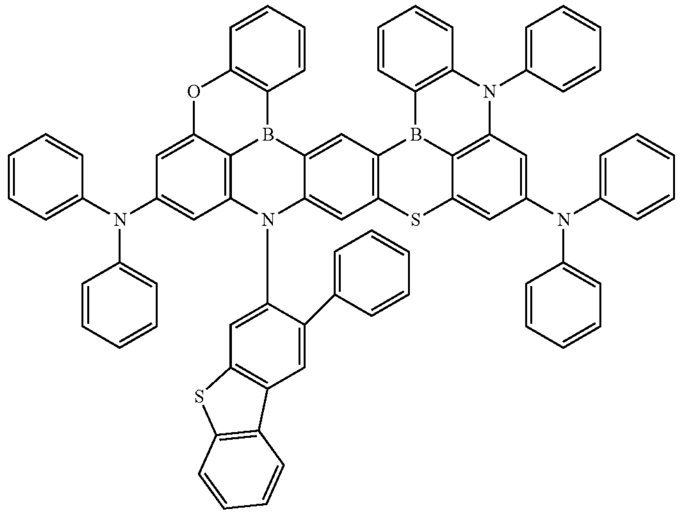
322
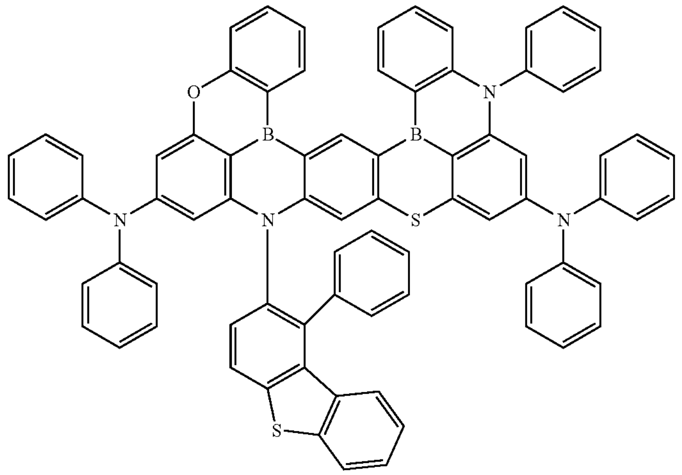
323
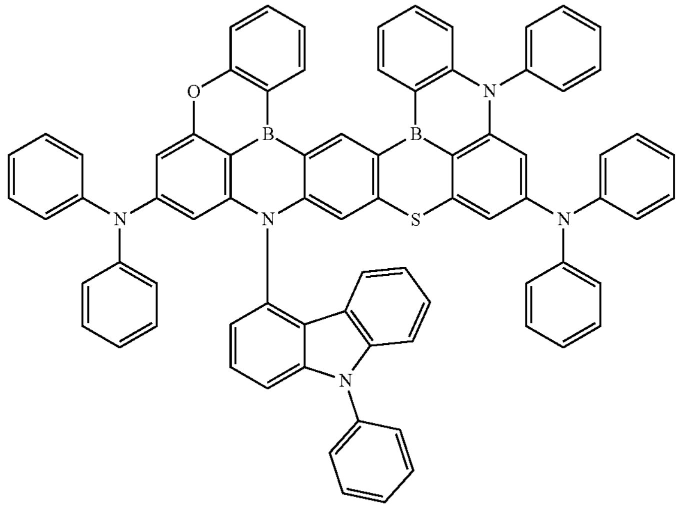

-continued
324
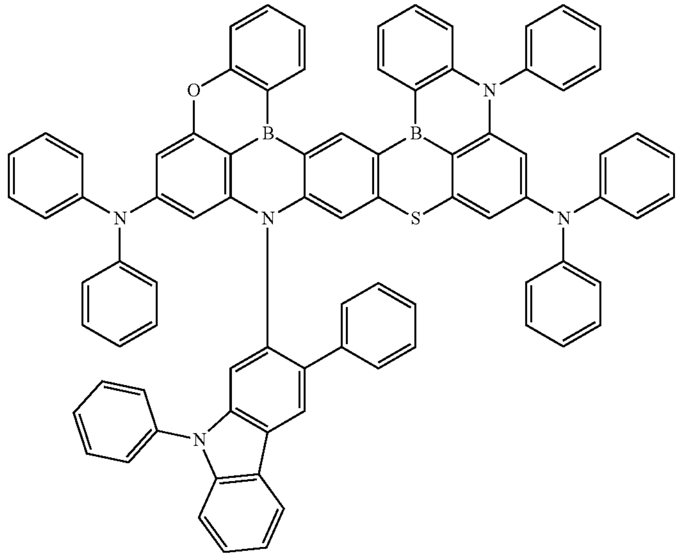
325
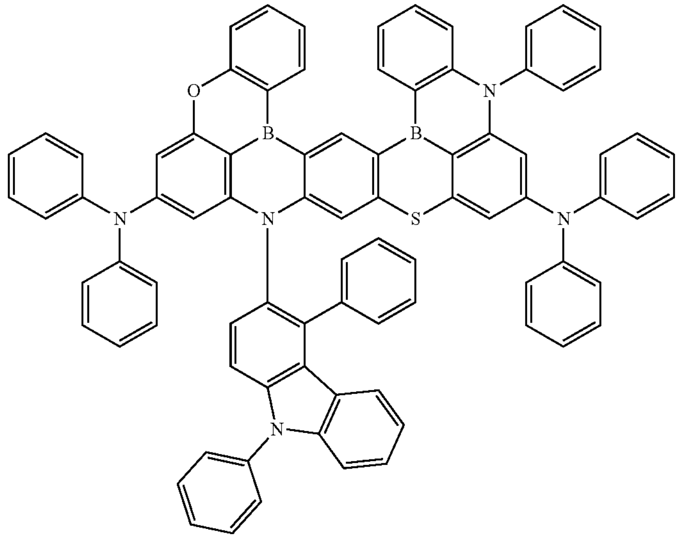
326
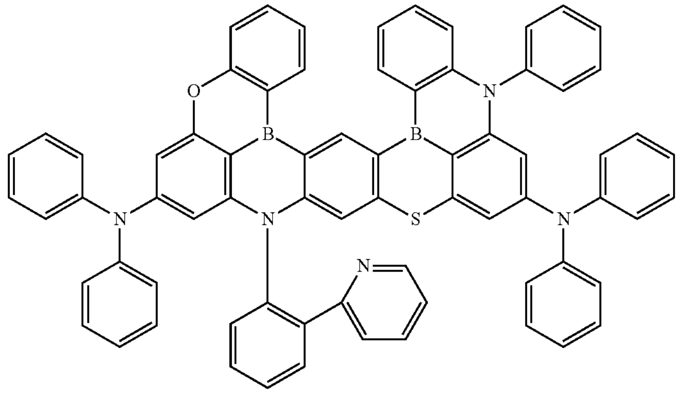

-continued
327
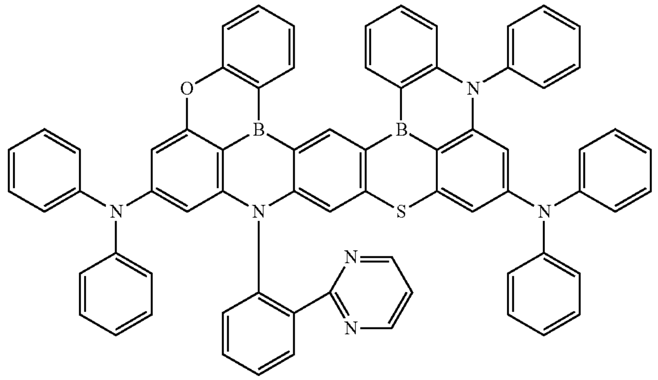
328
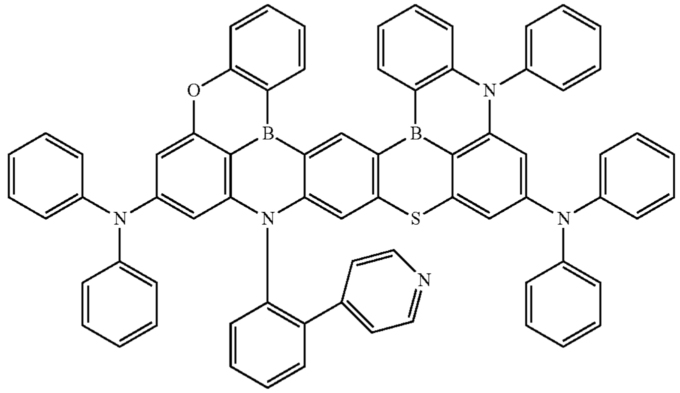
329
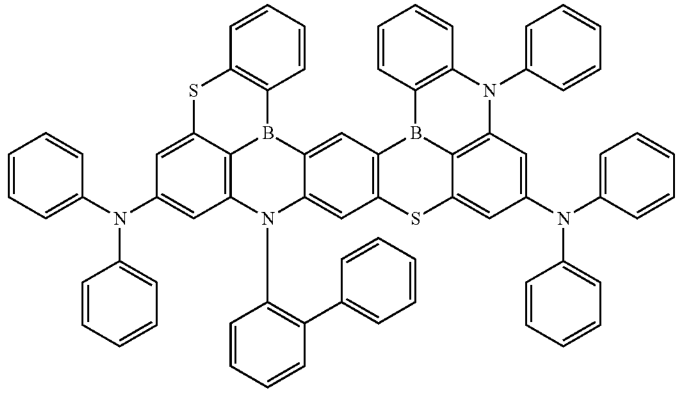
330
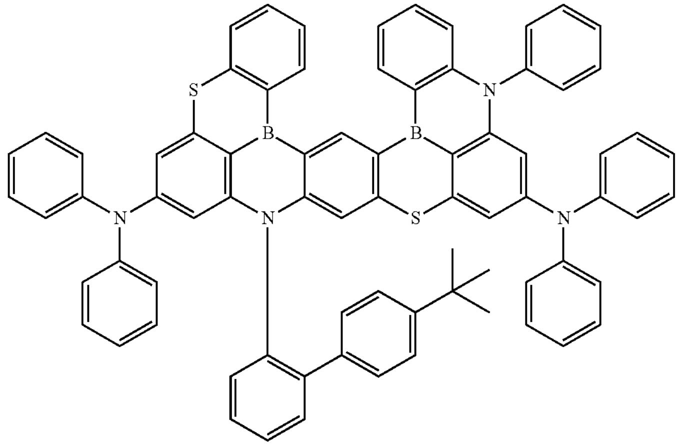

-continued
331
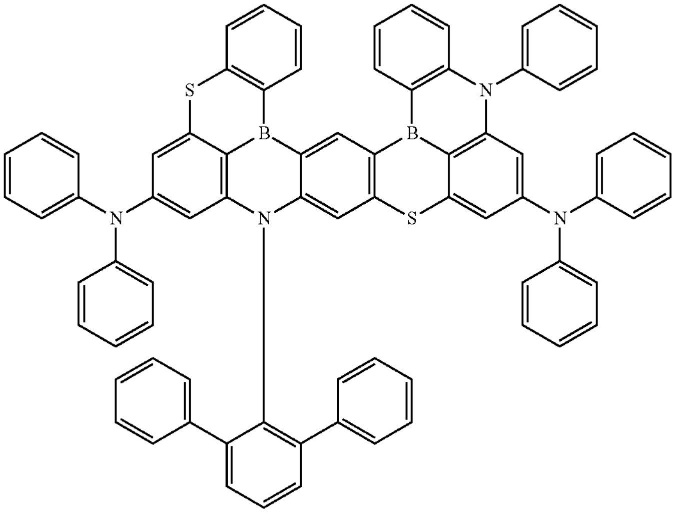
332
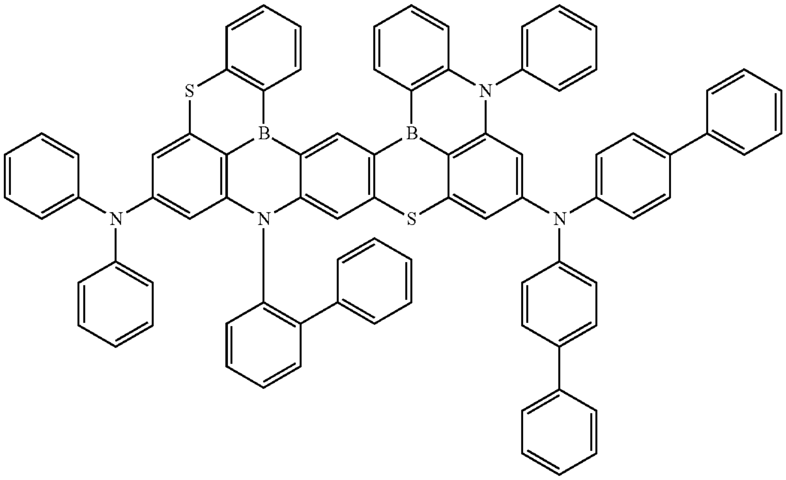
333
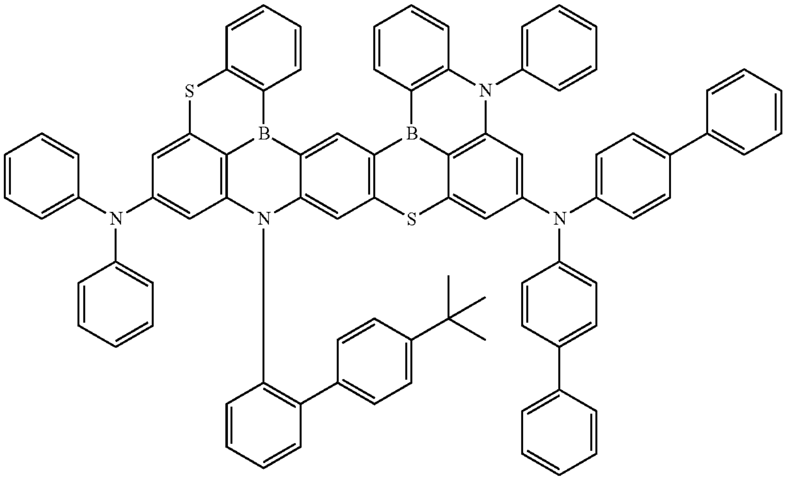

-continued
334
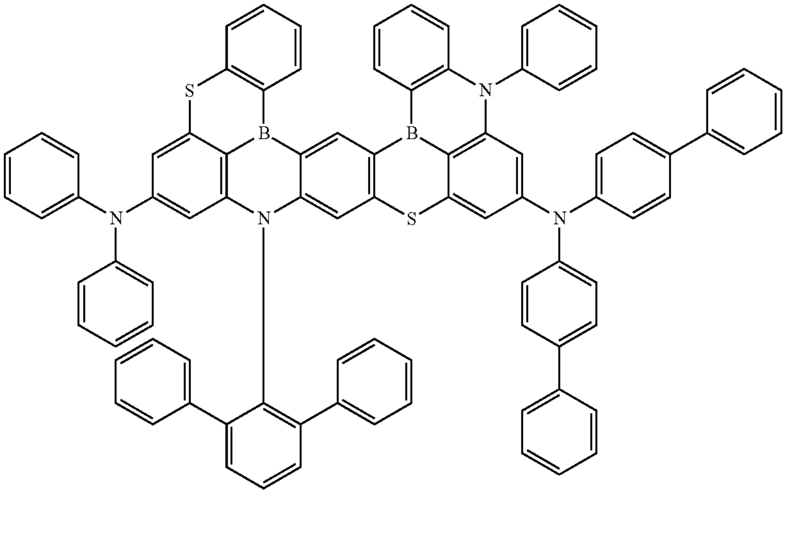
335
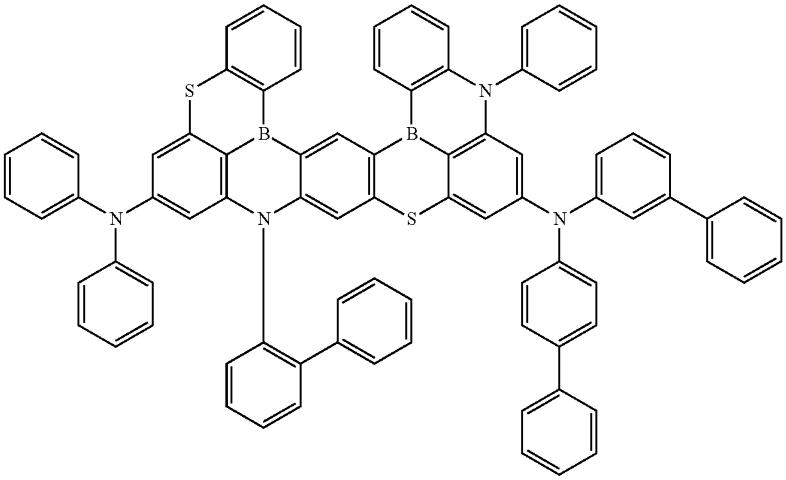
336
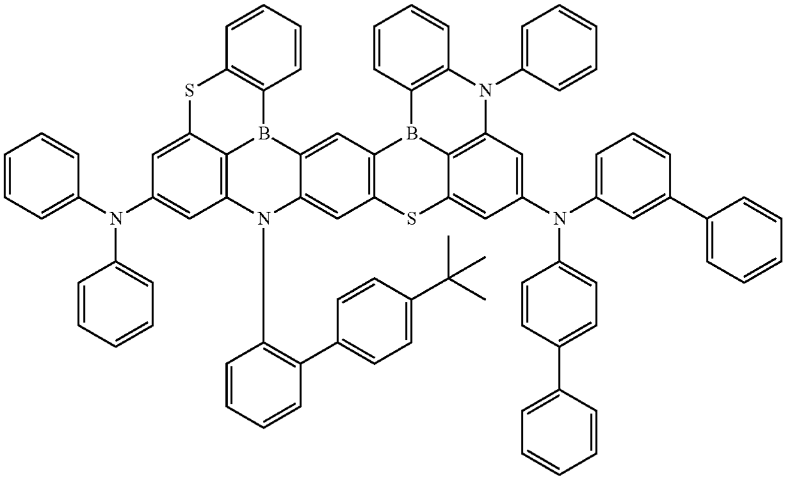

-continued
337
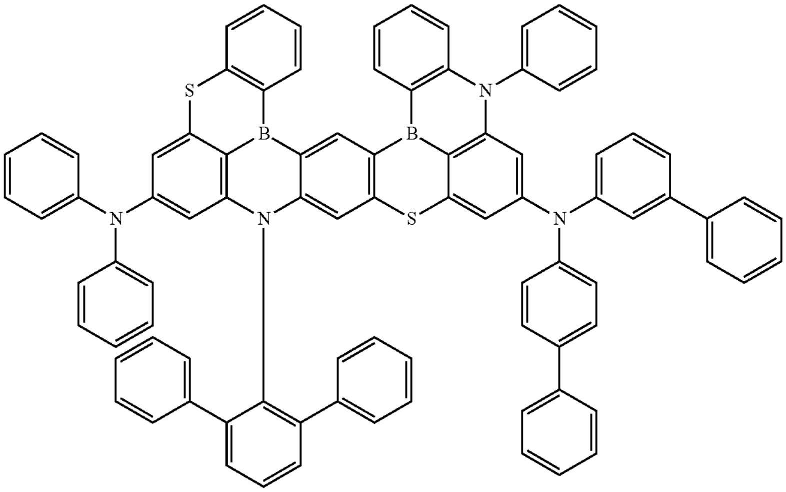
338
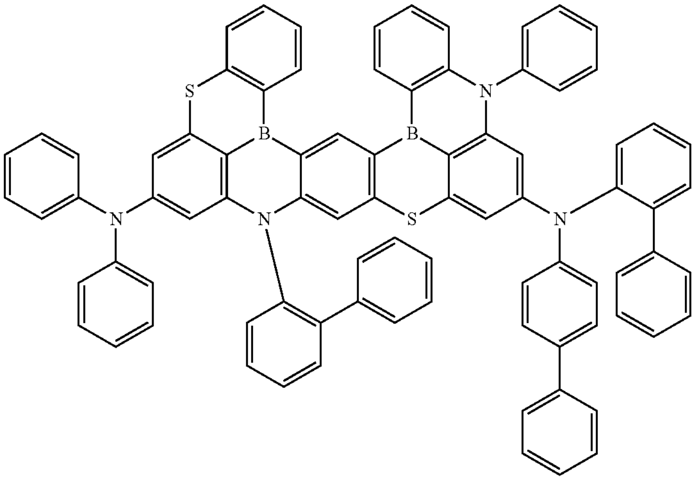
339
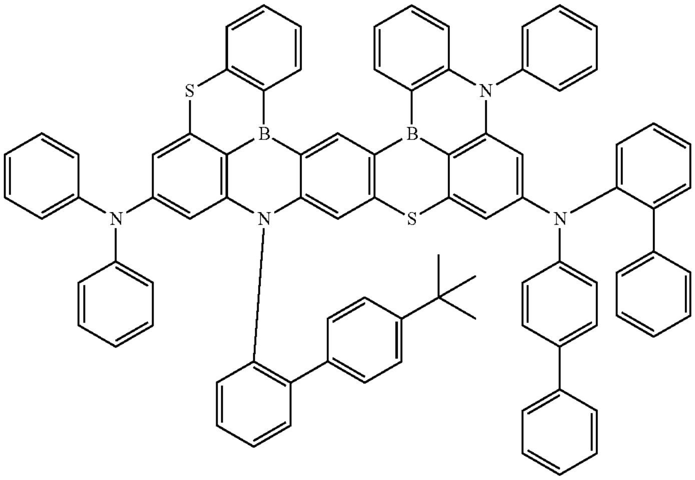

-continued
340
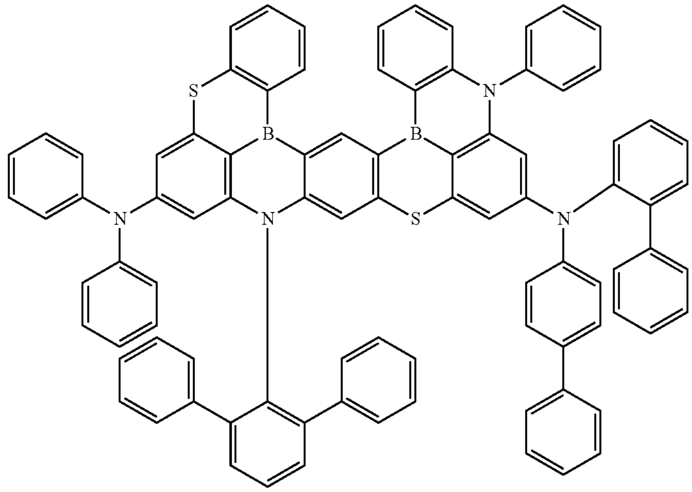
341
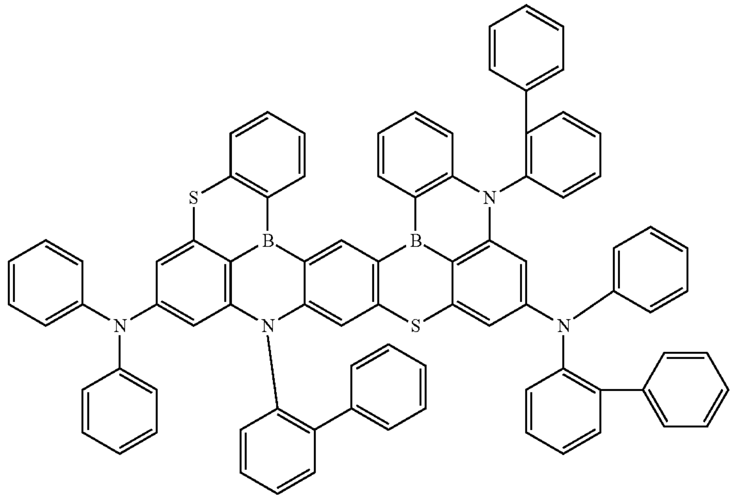
342
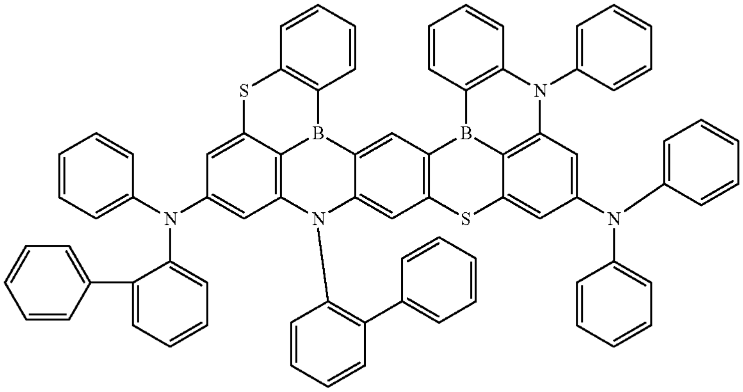

-continued
343
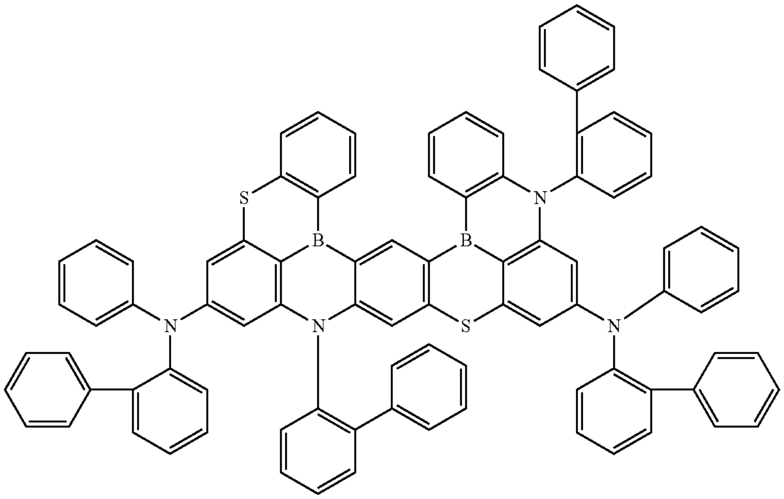
344
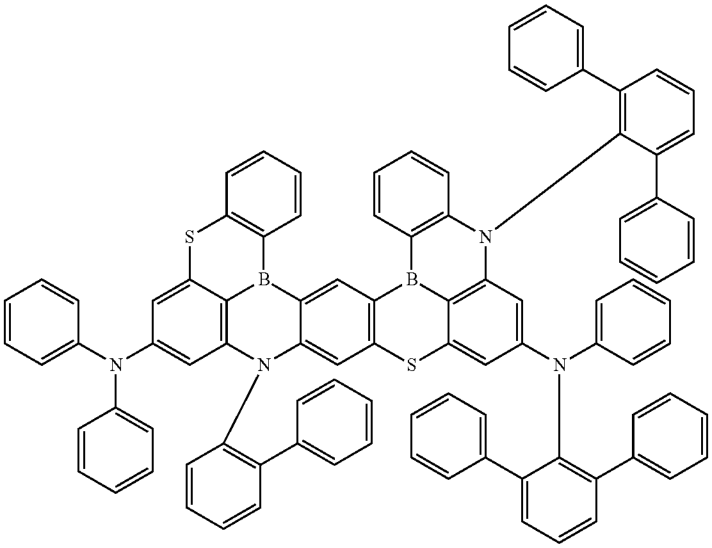
345
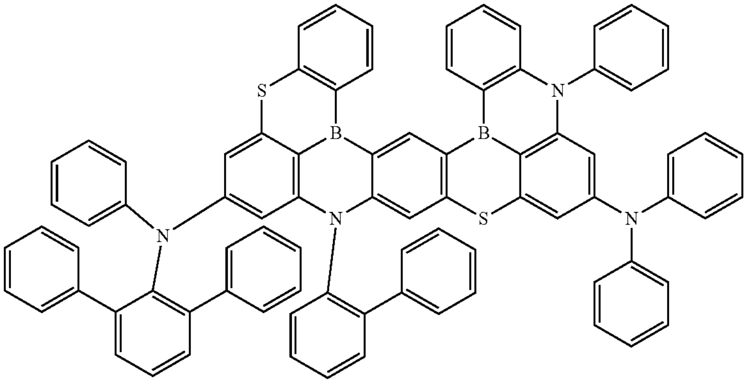

-continued
346
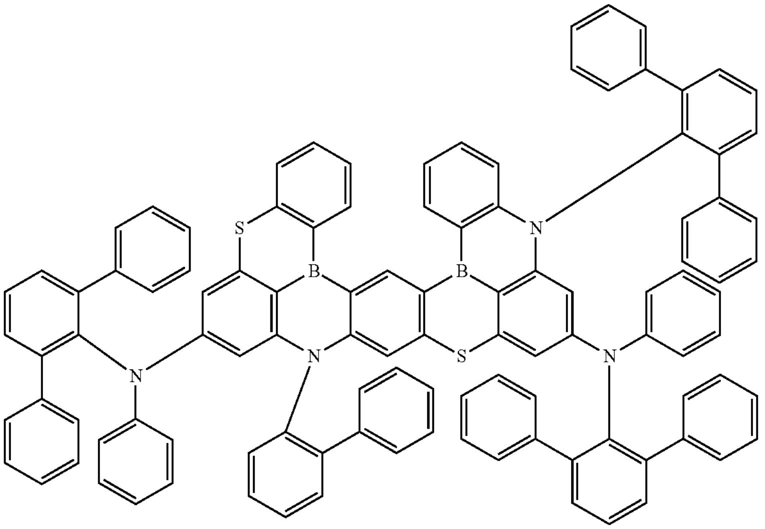
347
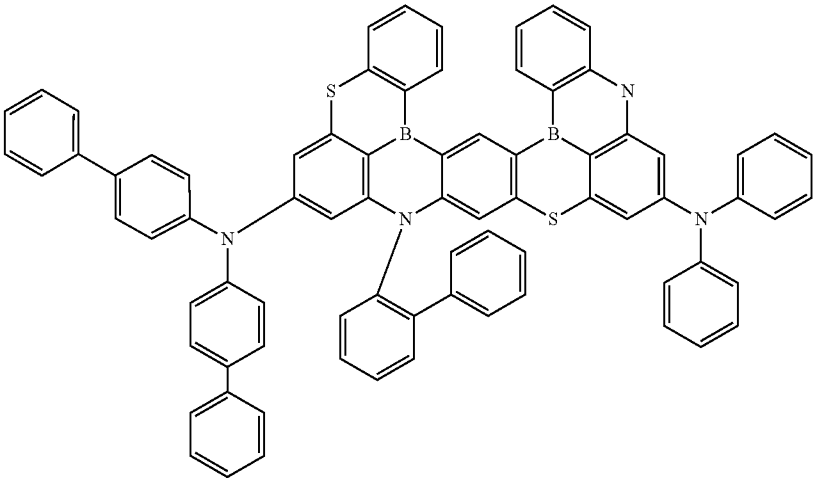
348
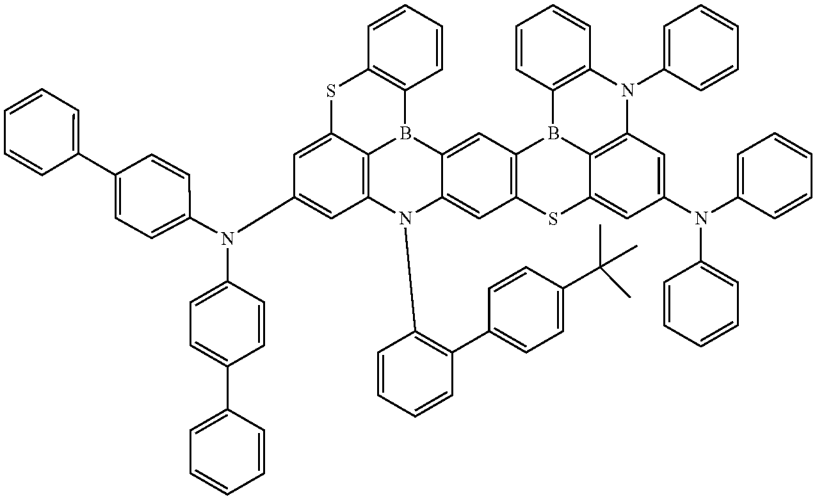

-continued
349
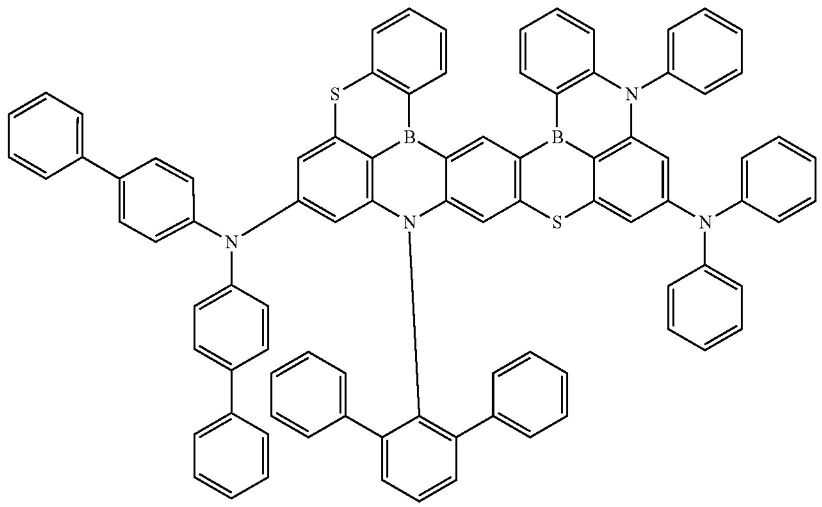
350
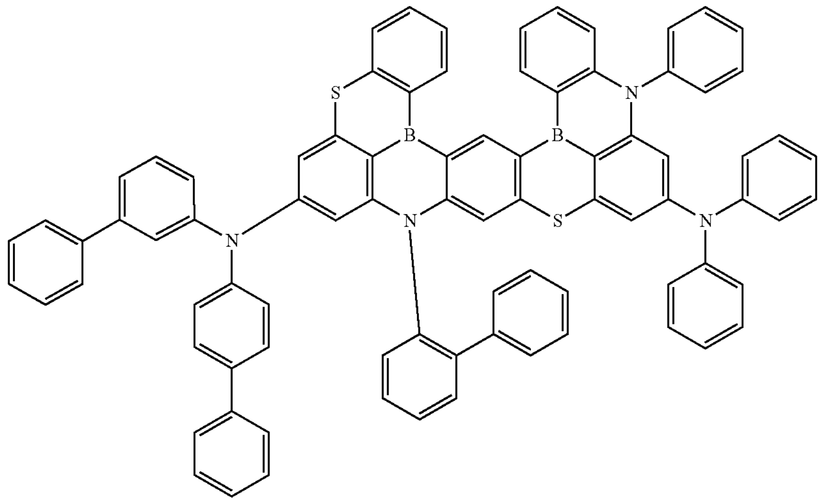
351
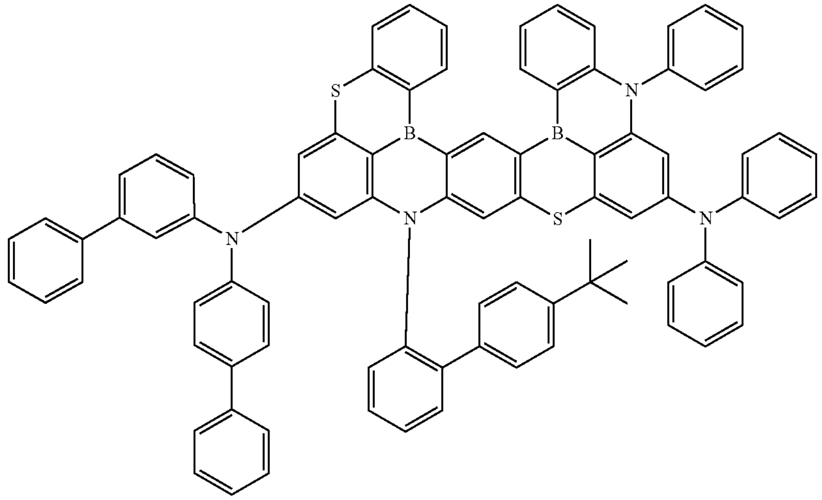

-continued
352
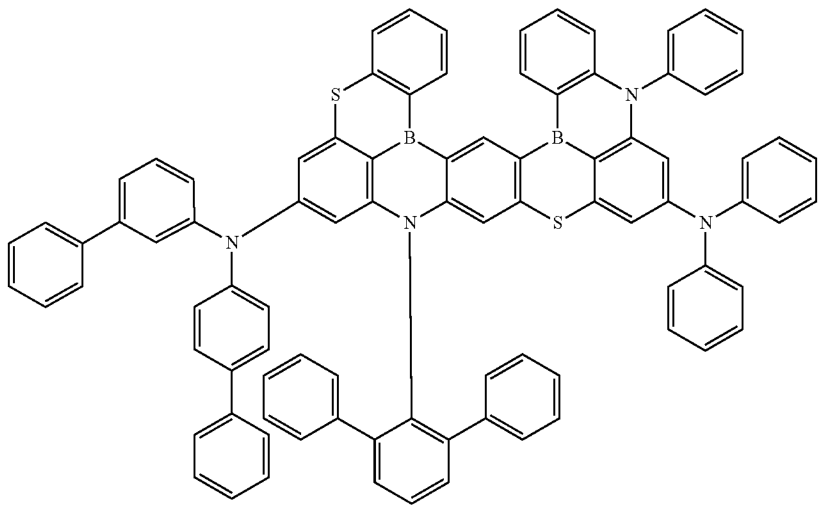
353
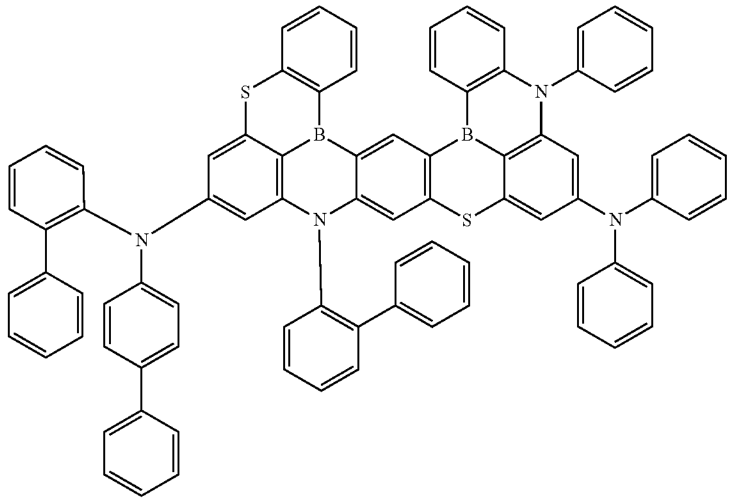
354
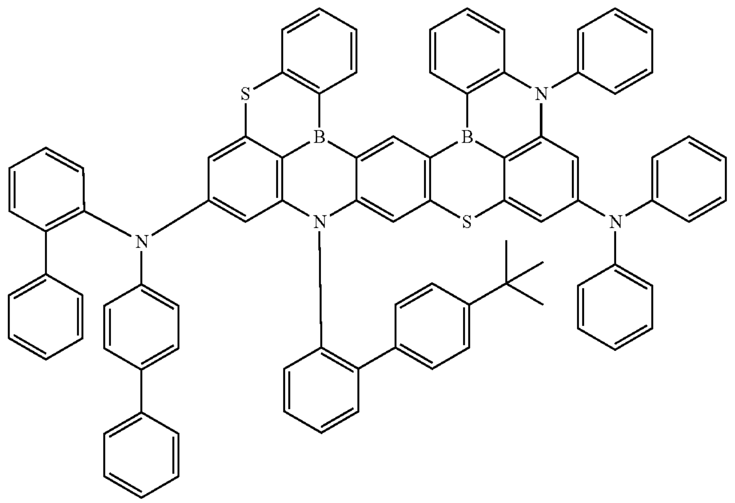

-continued
355
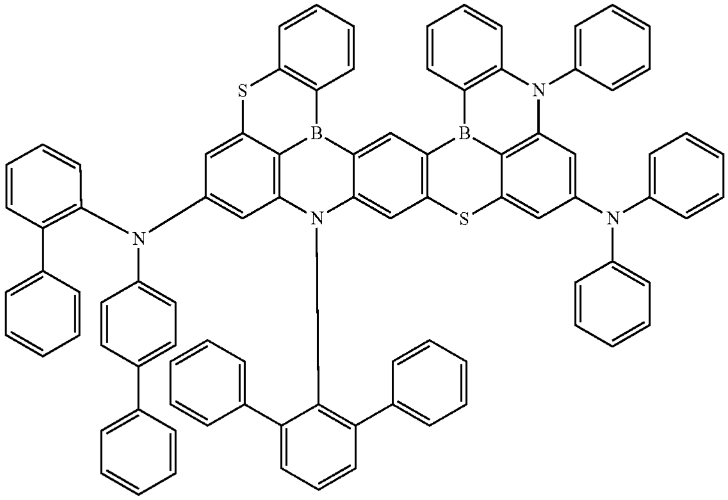
356
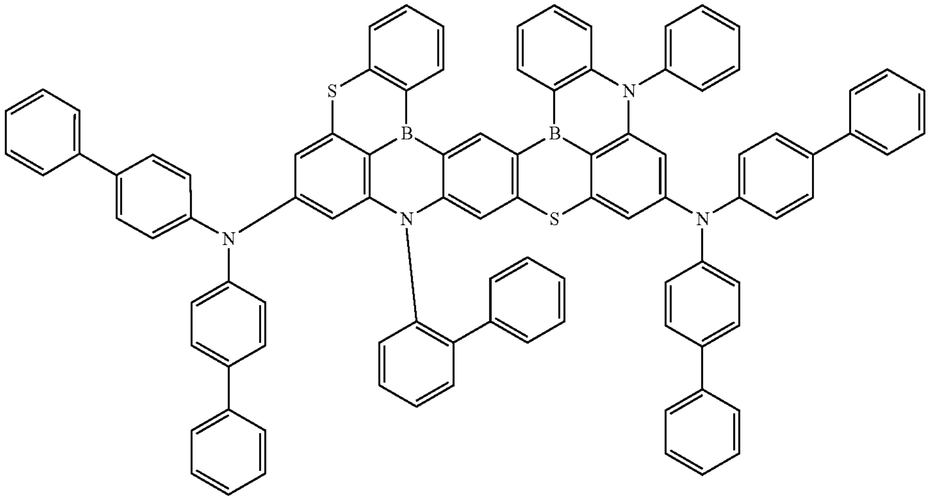
357
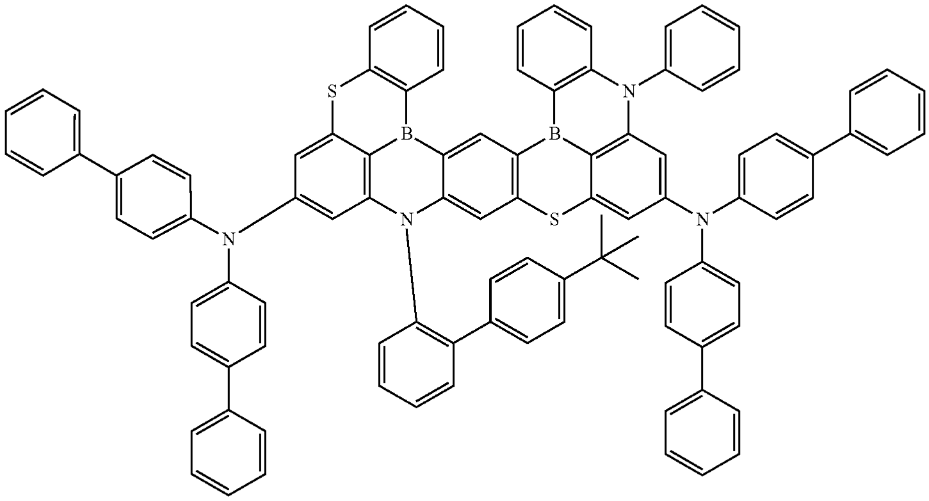

-continued
358
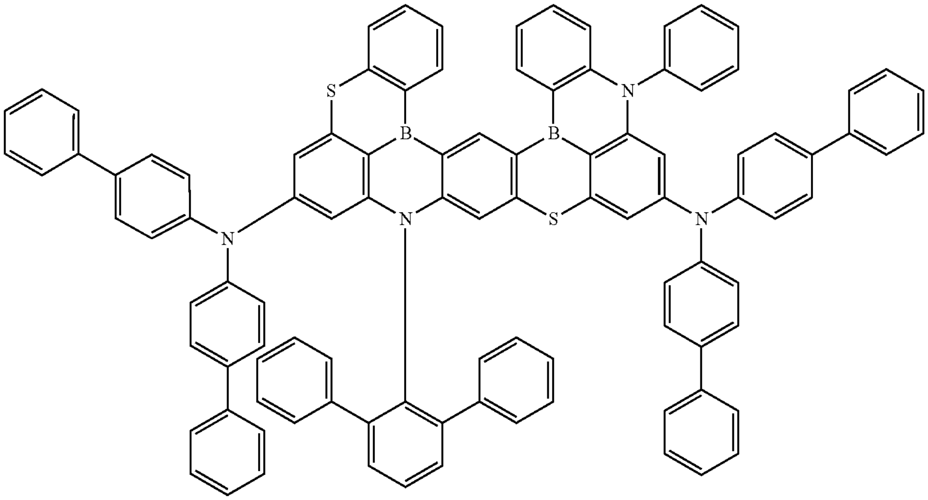
359
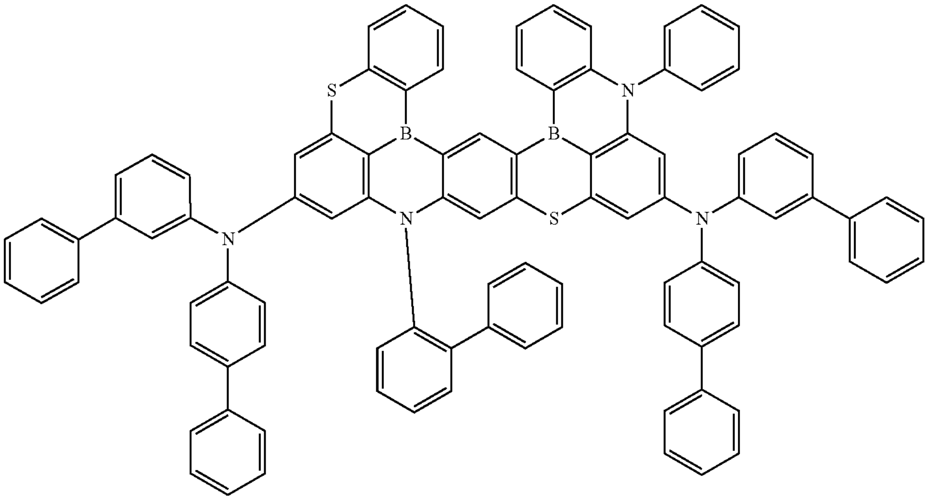
360
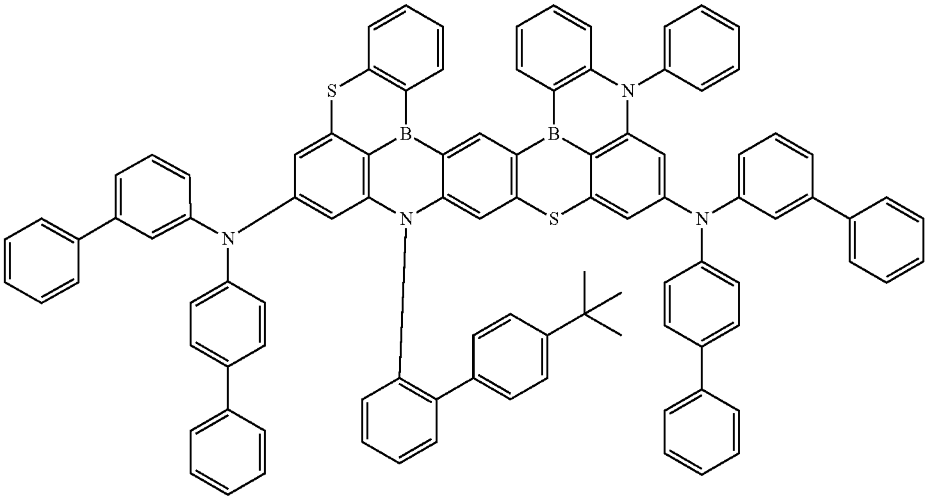

-continued
361
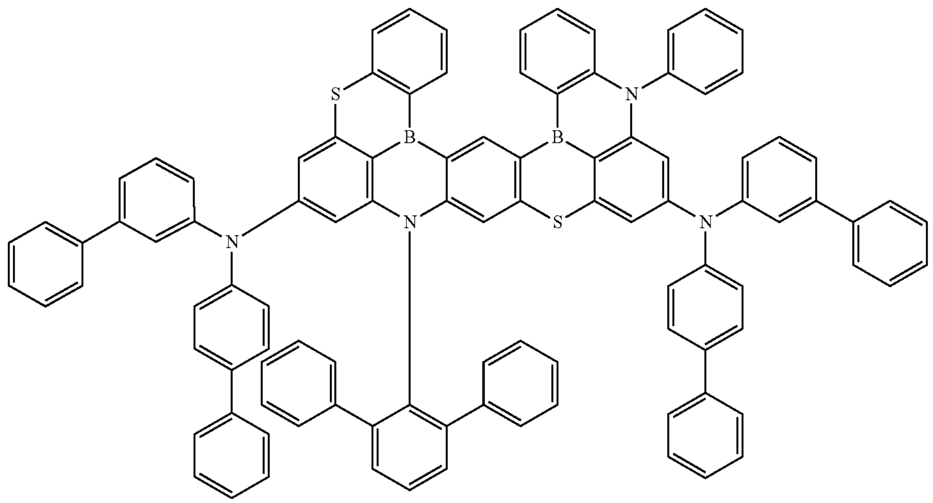
362
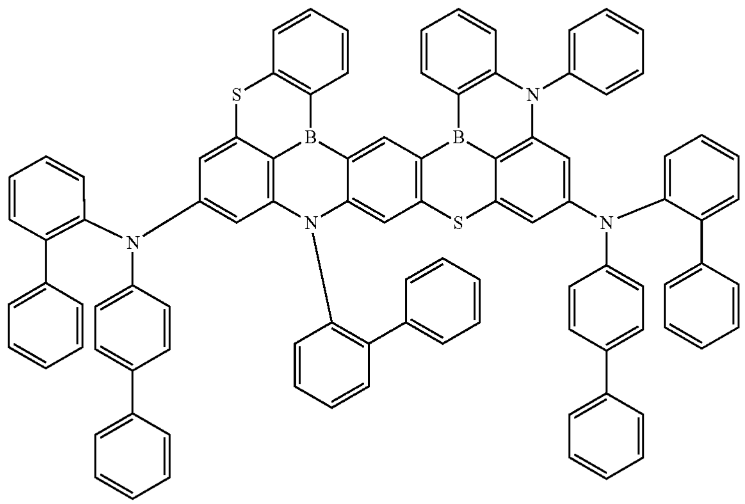
363
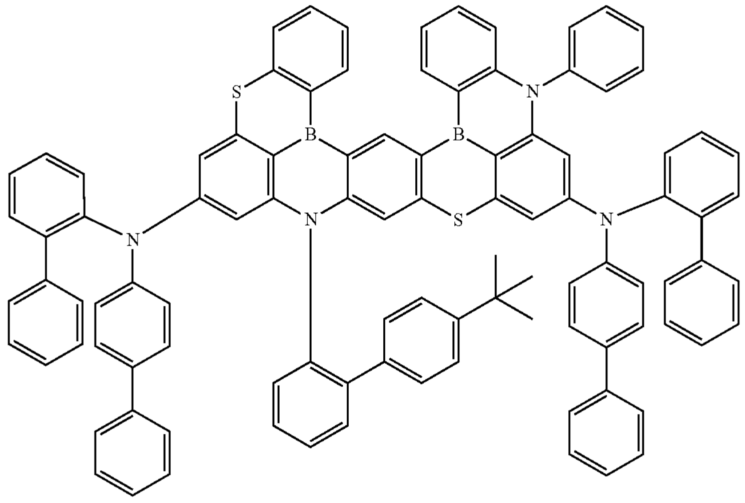

-continued
364
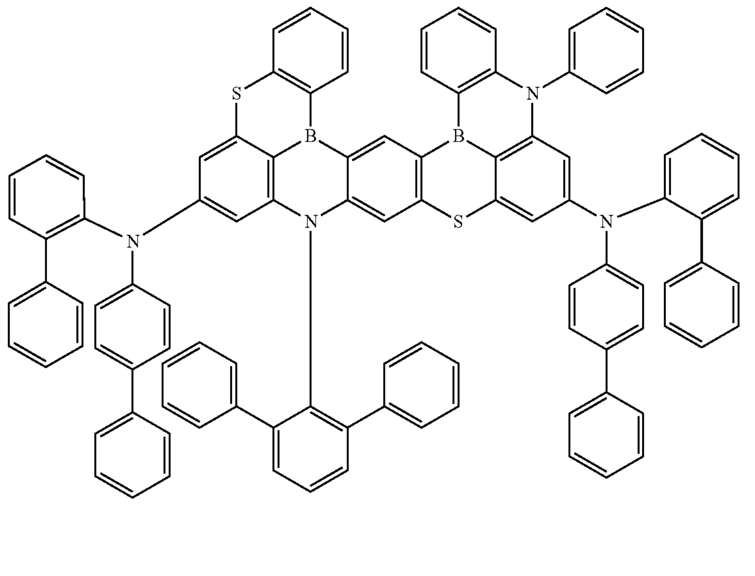
365
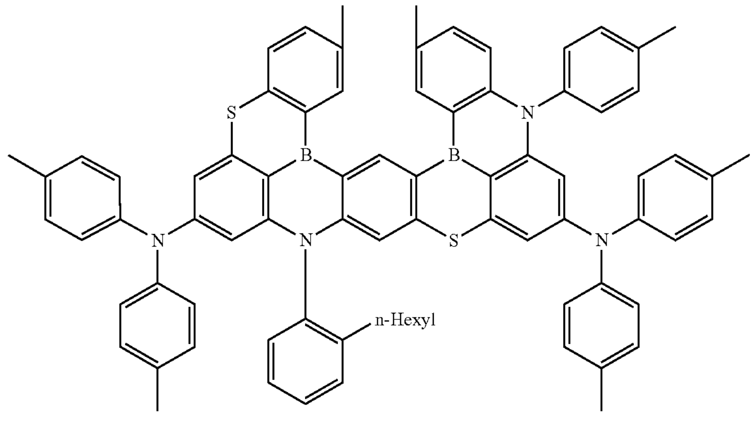
366
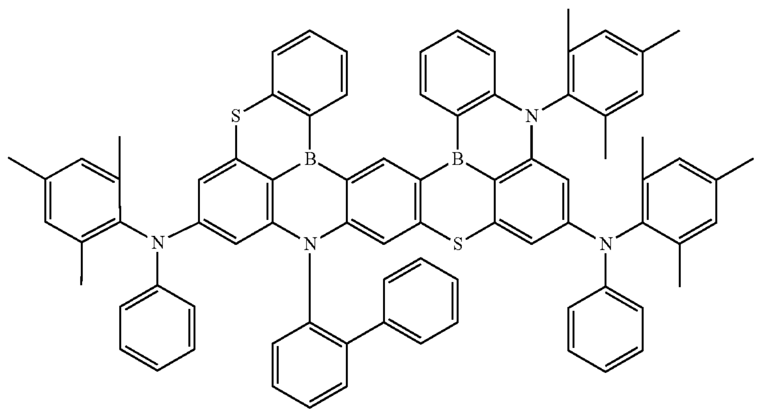

-continued
367
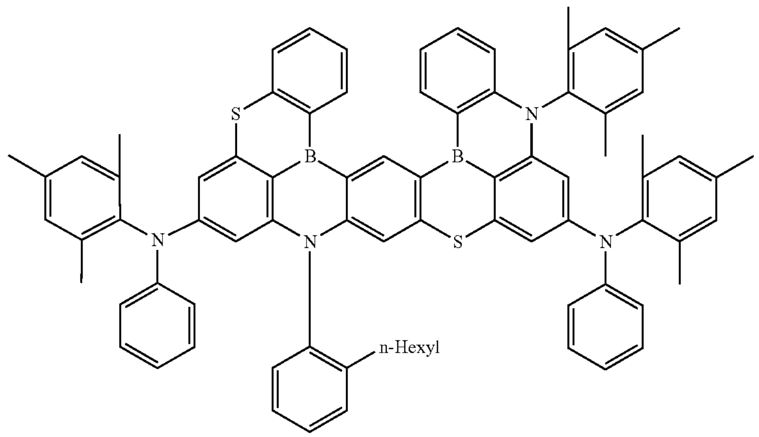
368
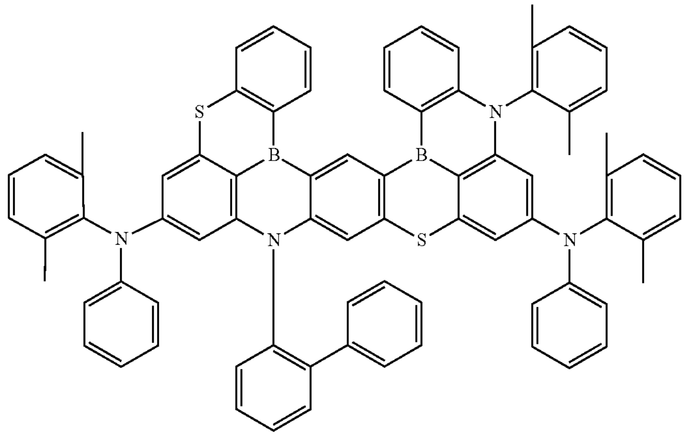
369
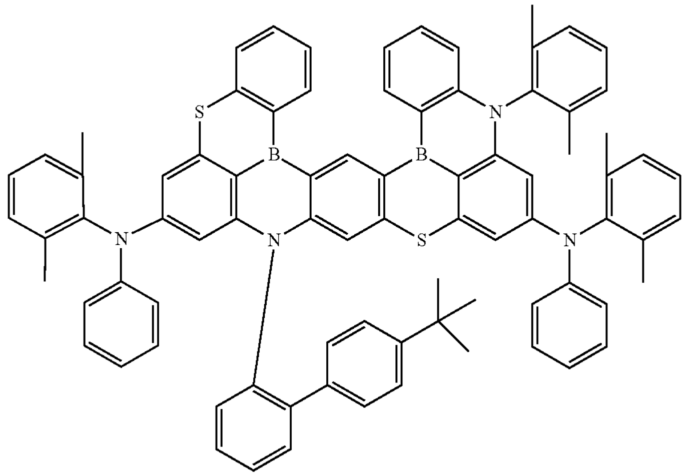

-continued
370
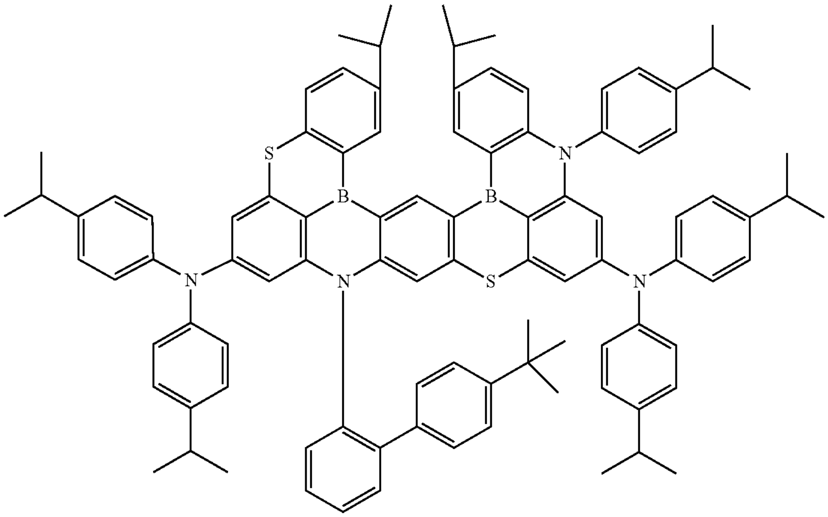
371
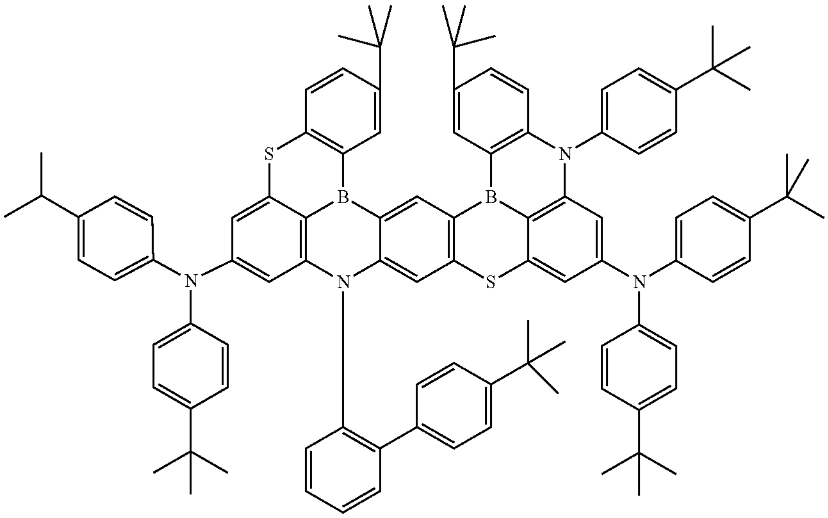
372
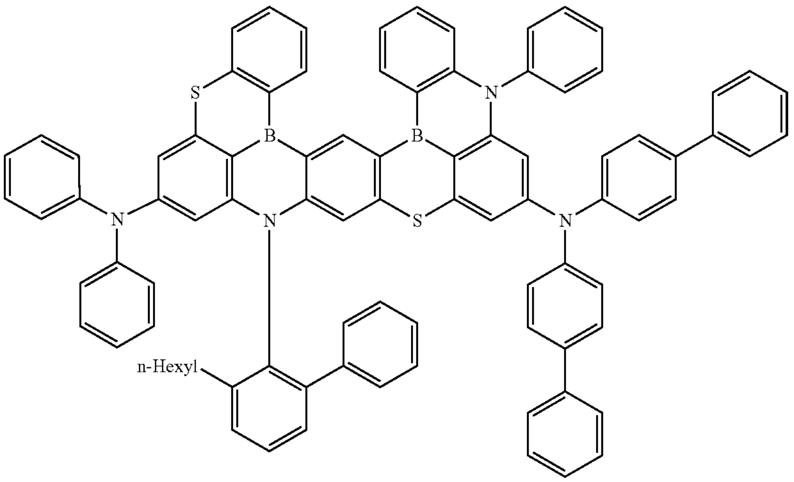

-continued
373
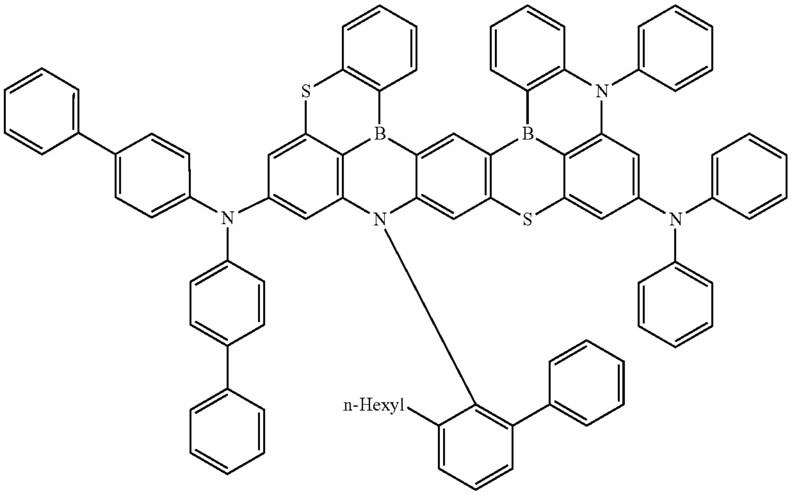
374
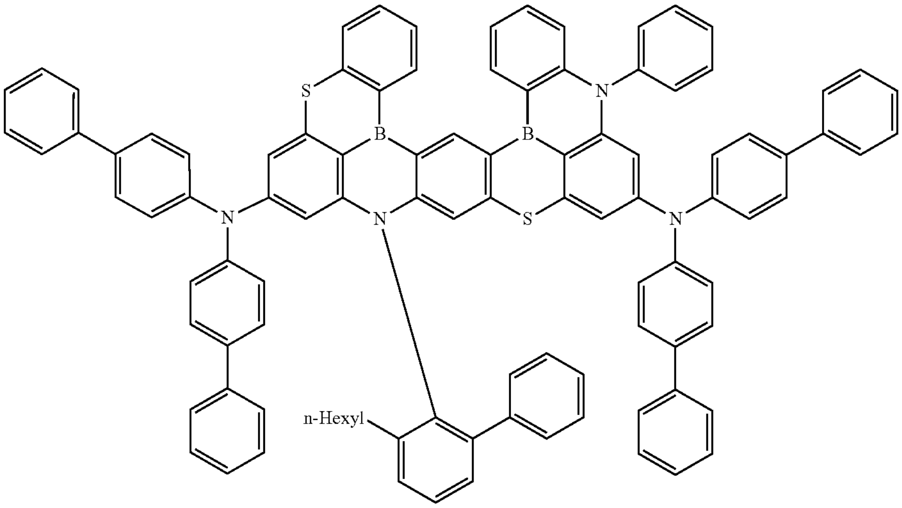
375
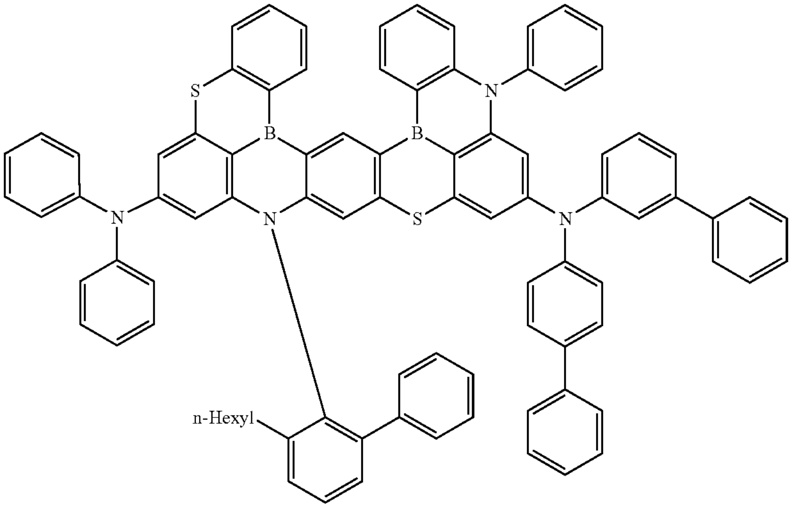

-continued
376
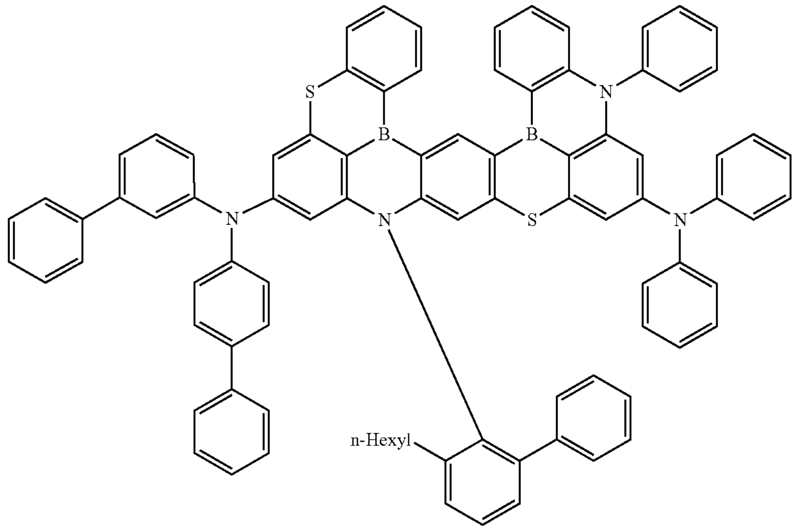
377
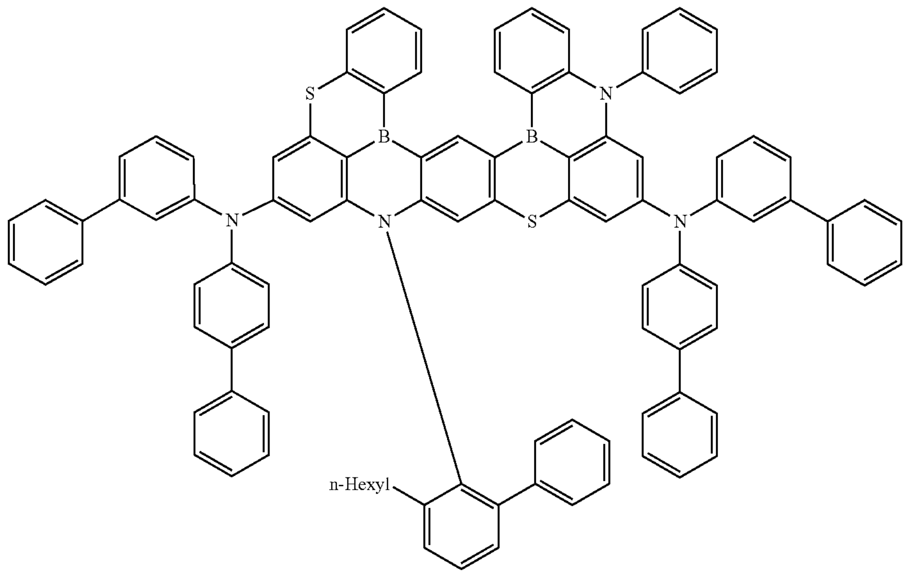
378
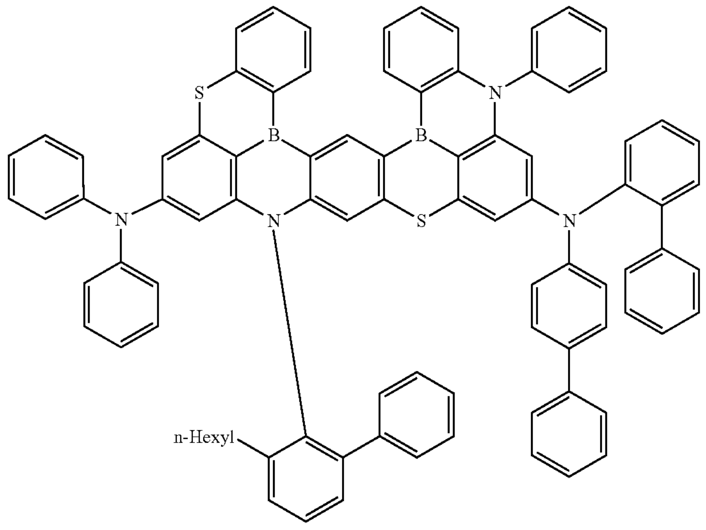

-continued
379
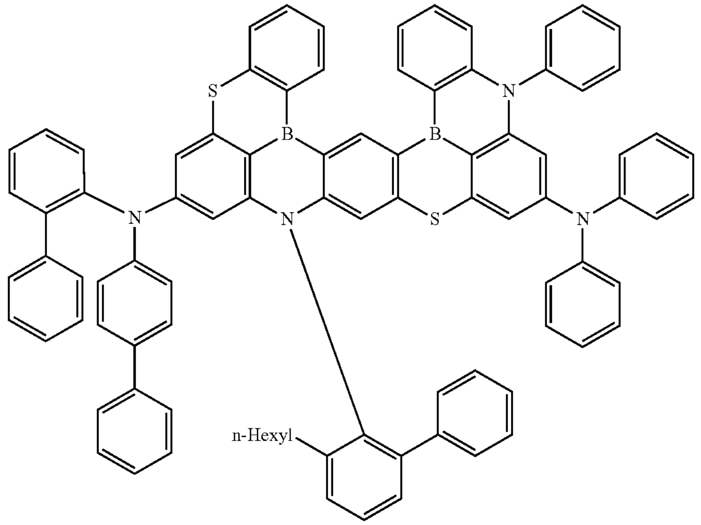
380
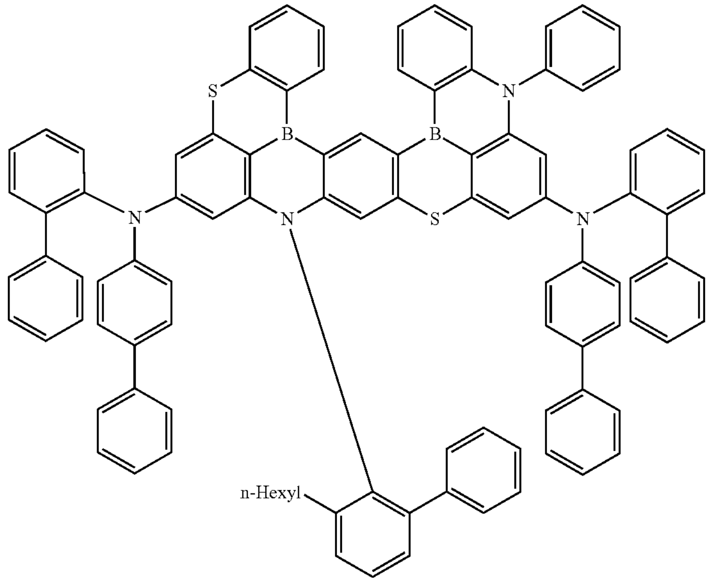

-continued
381
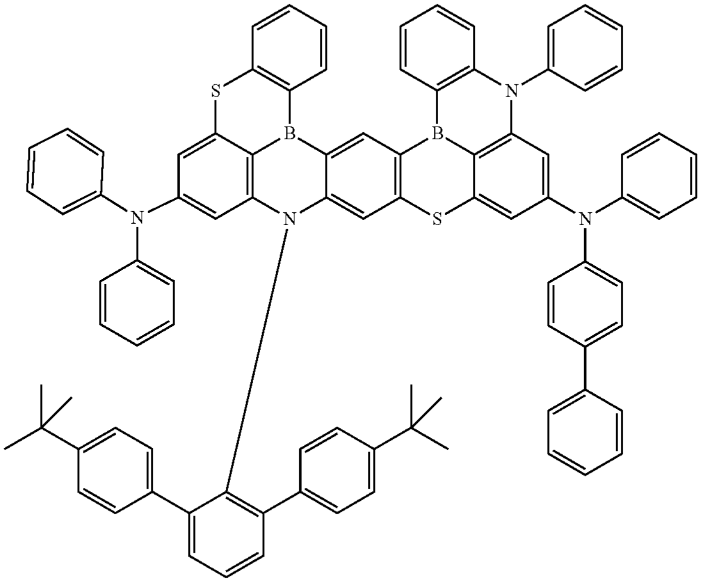
382
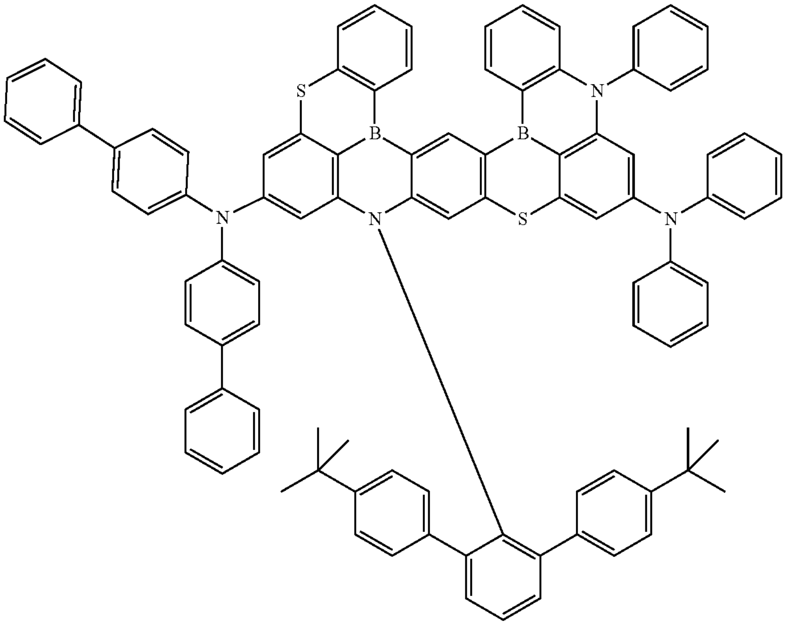

-continued
383
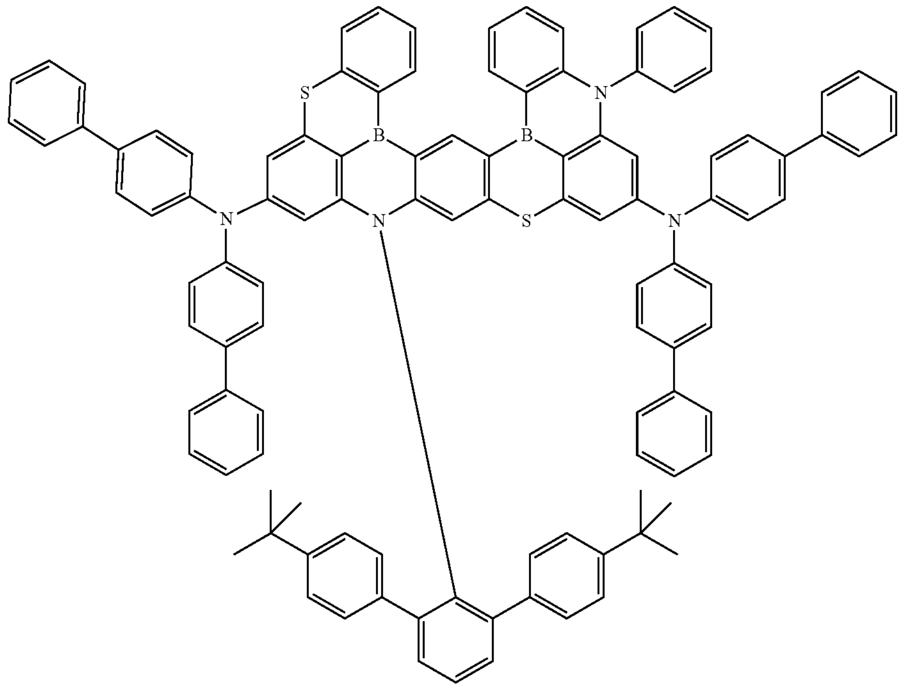
384
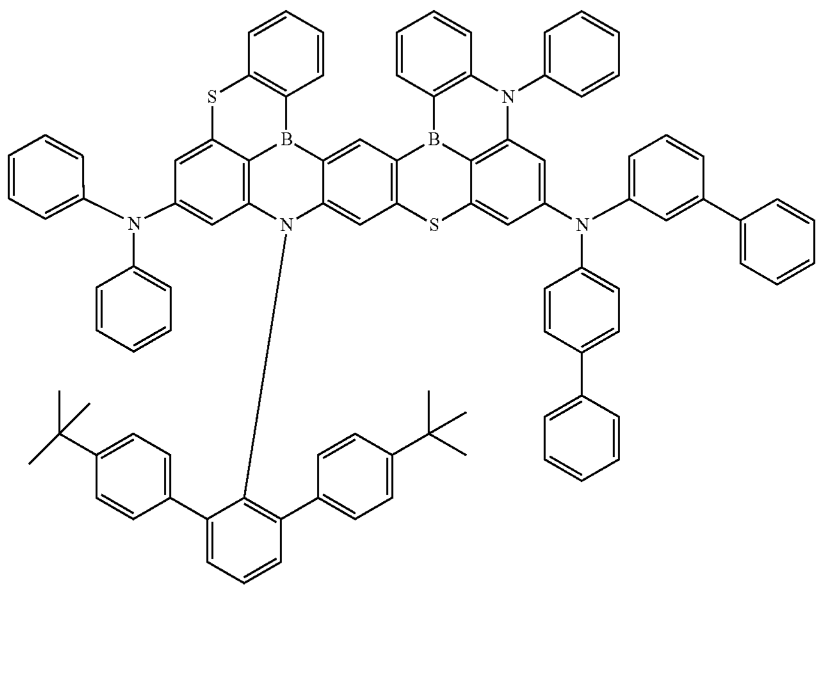

-continued
385
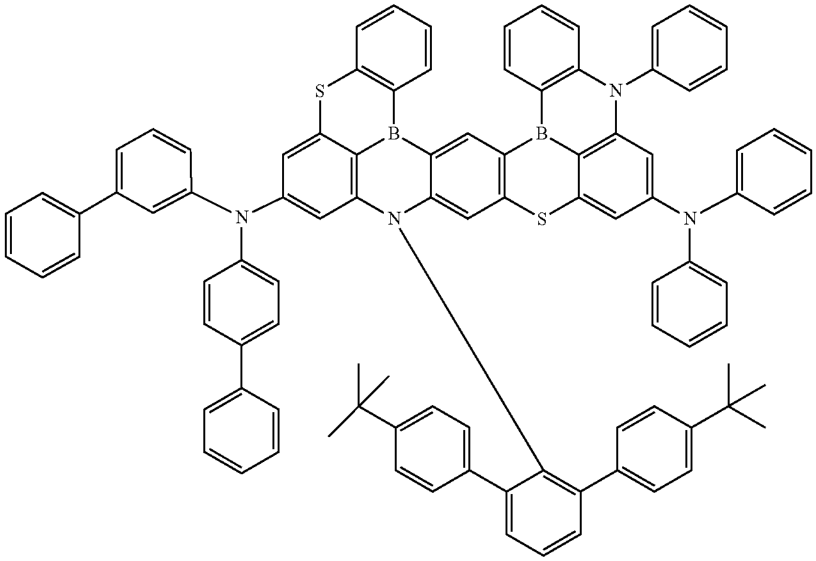
386
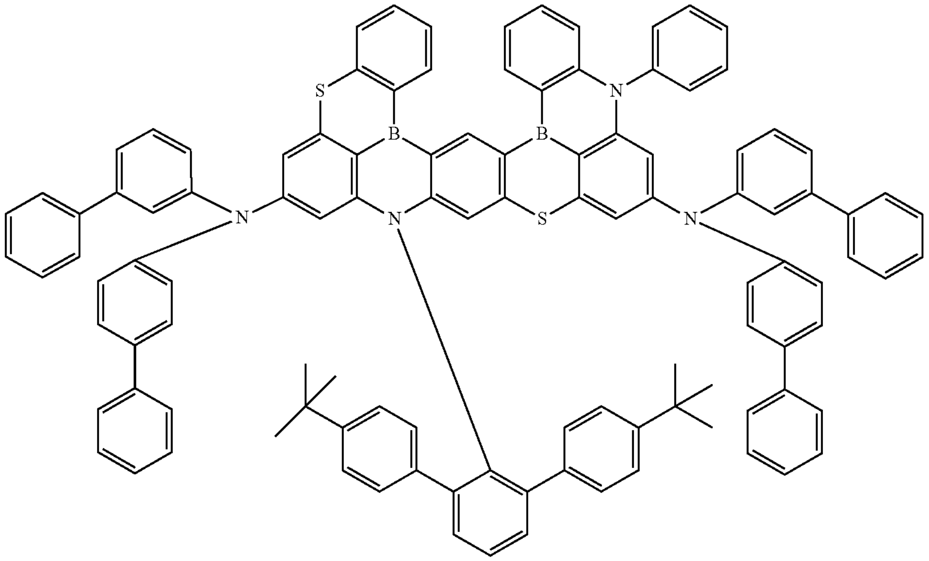
387
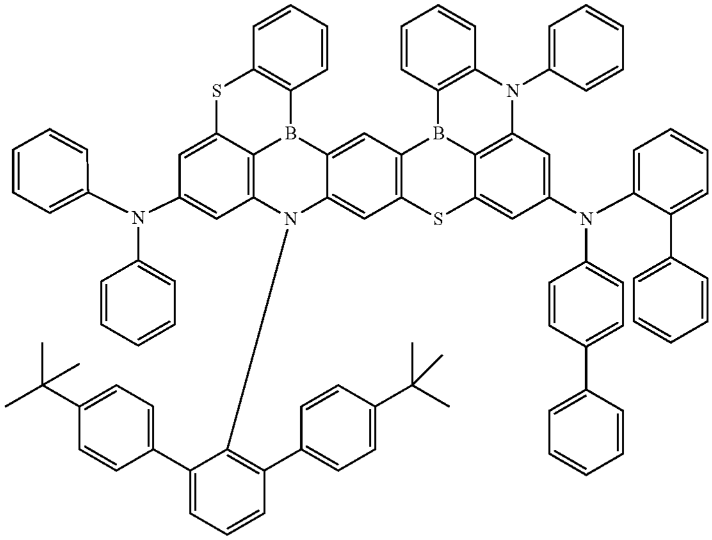

-continued
388
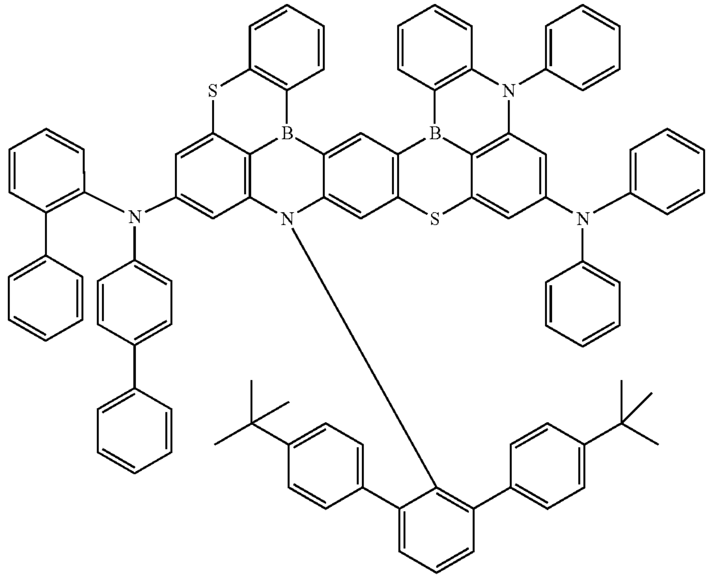
389
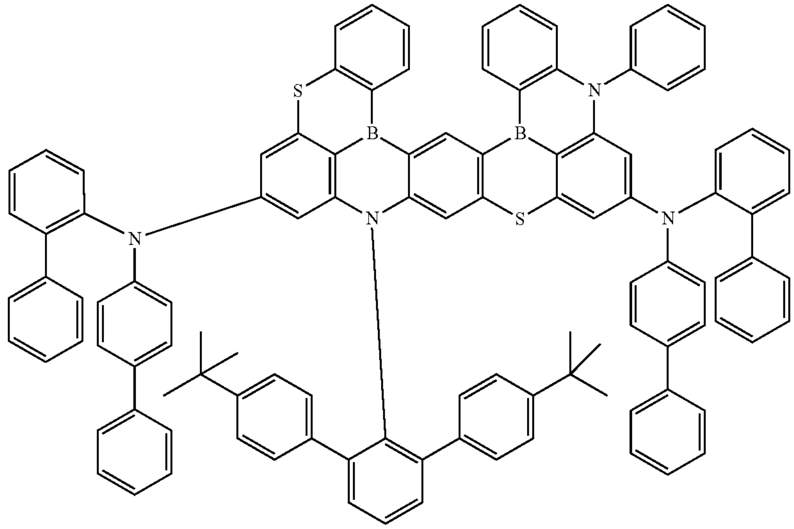
390
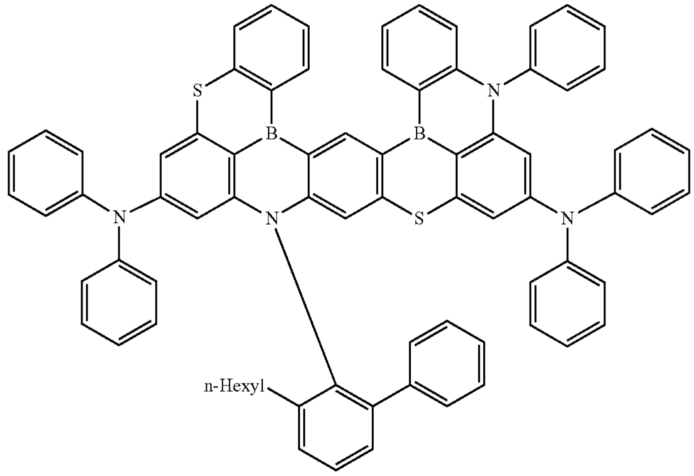

-continued
391
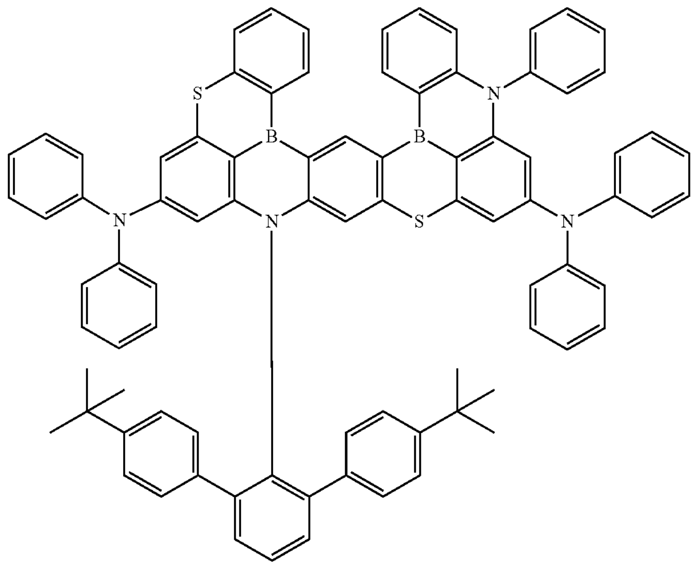
392
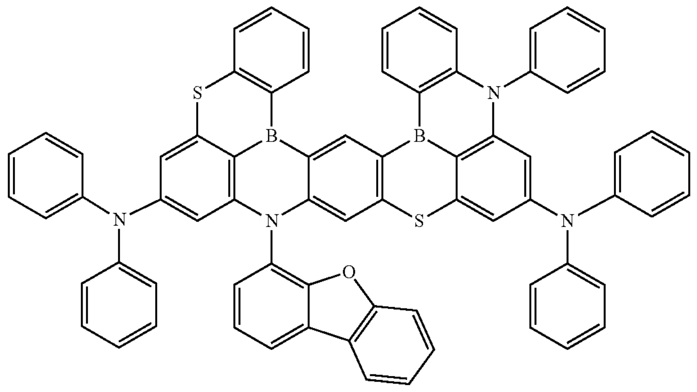
393
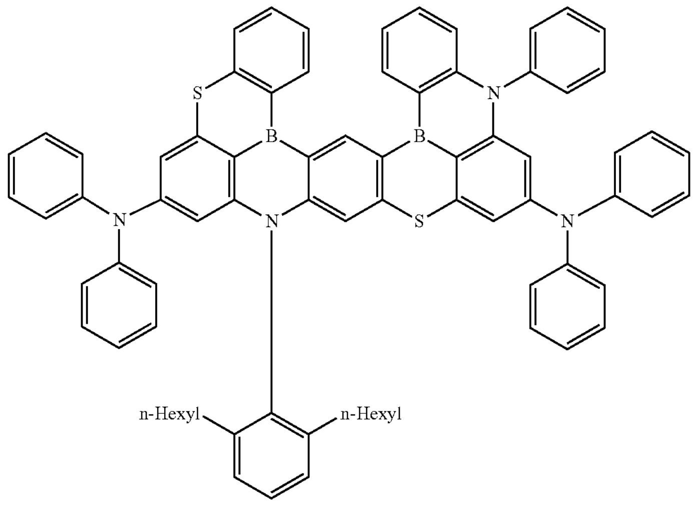

-continued
394
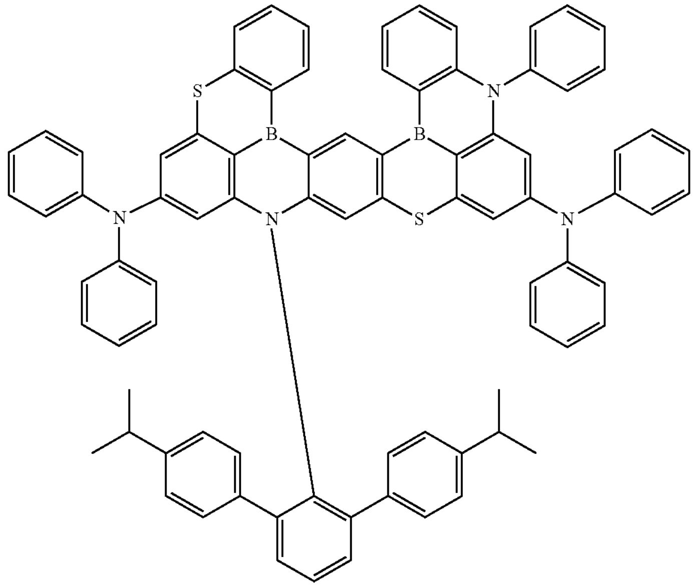
395
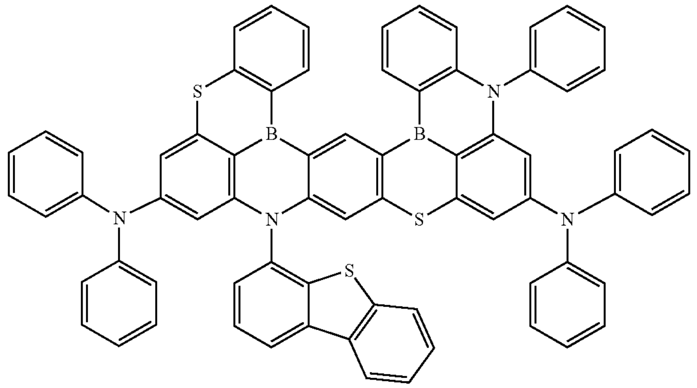
396
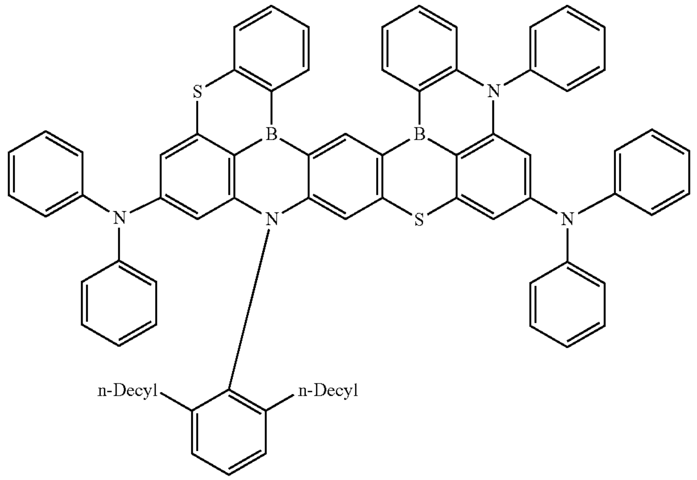

-continued
397
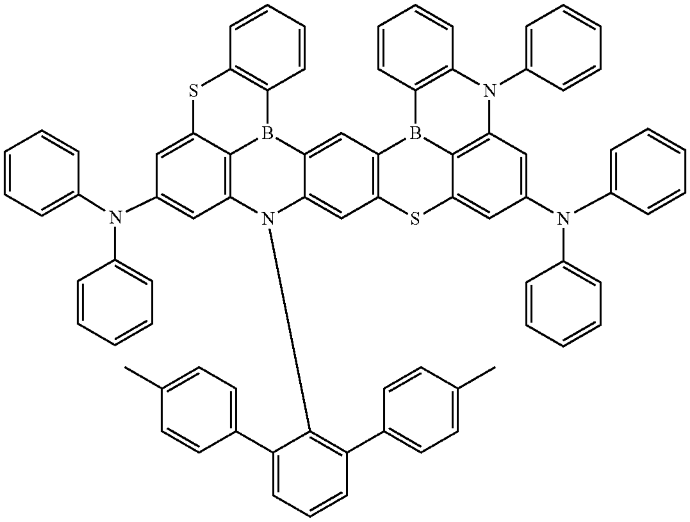
398
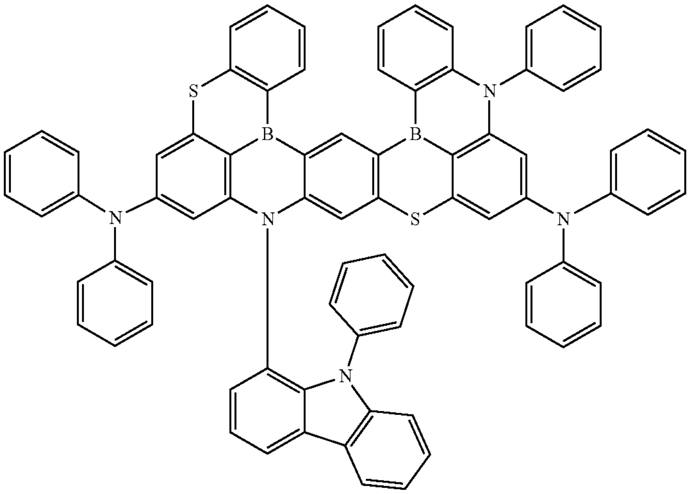
399
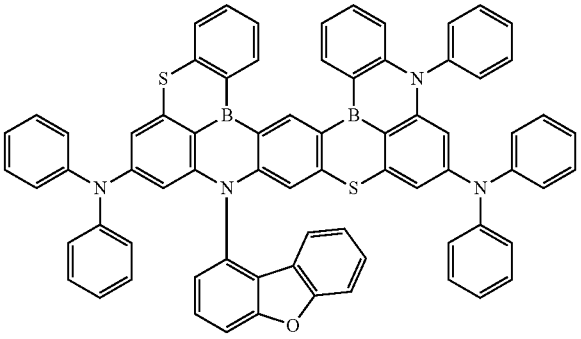
400
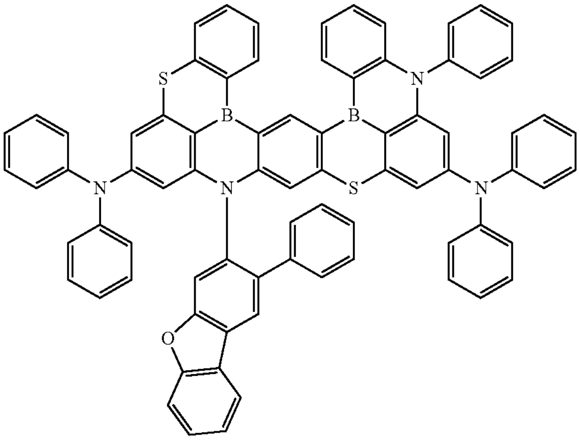

-continued
401
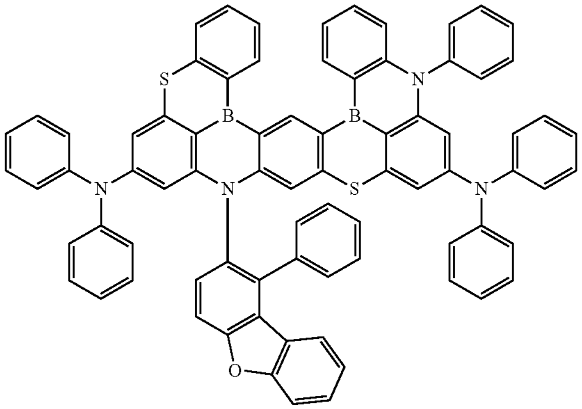
402
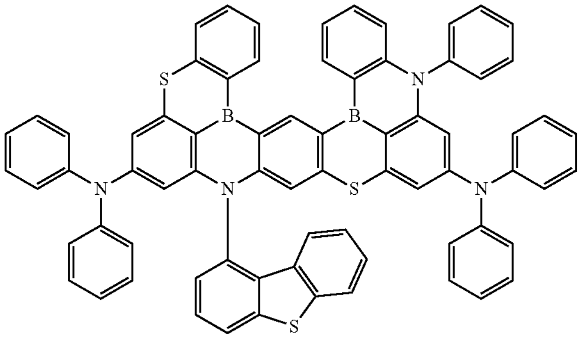
403
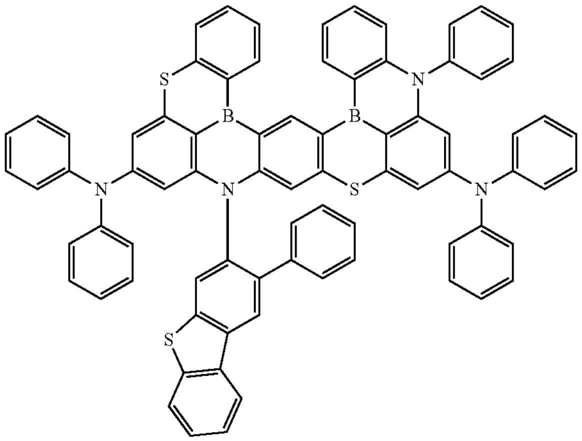
404
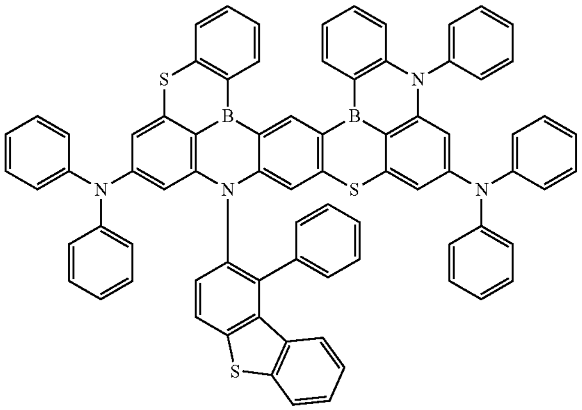
405
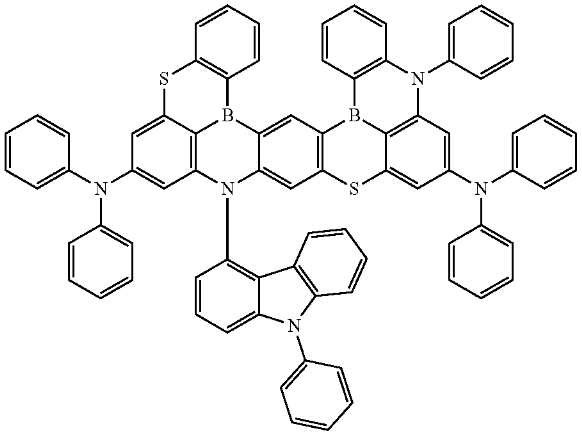
406
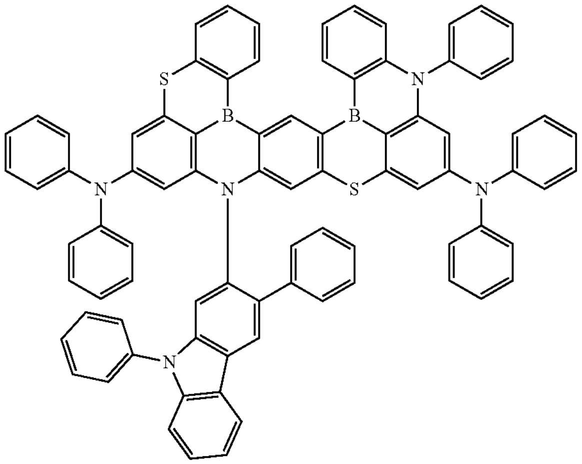

-continued
407
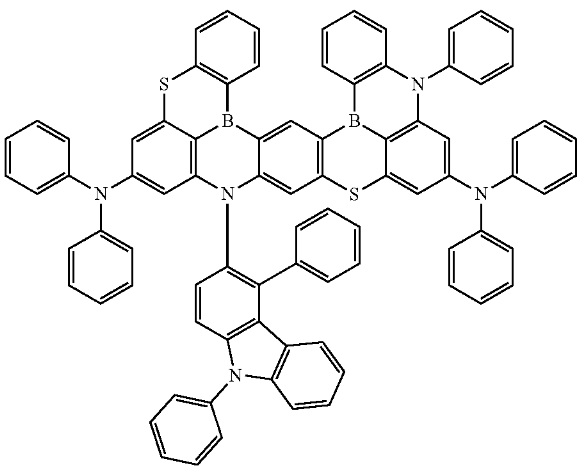
408
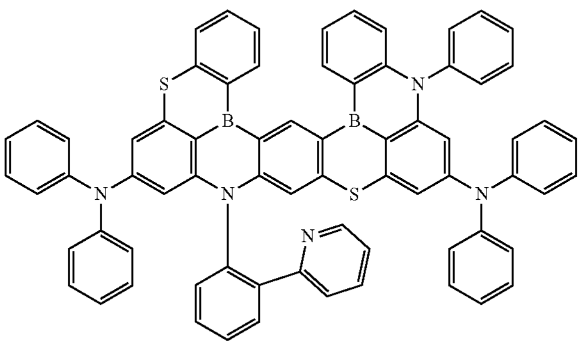
409
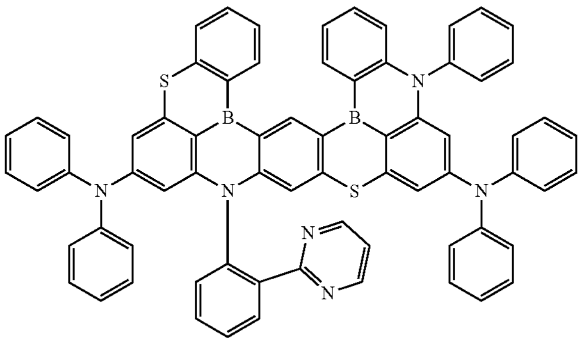
410
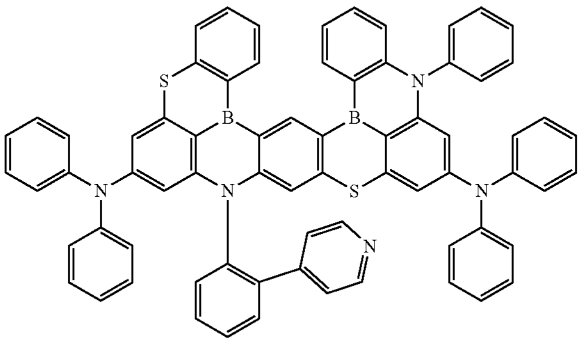
411
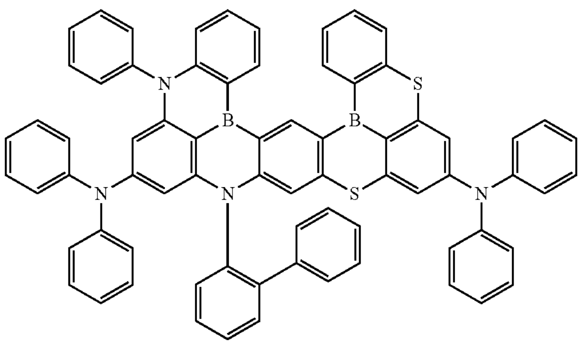
412
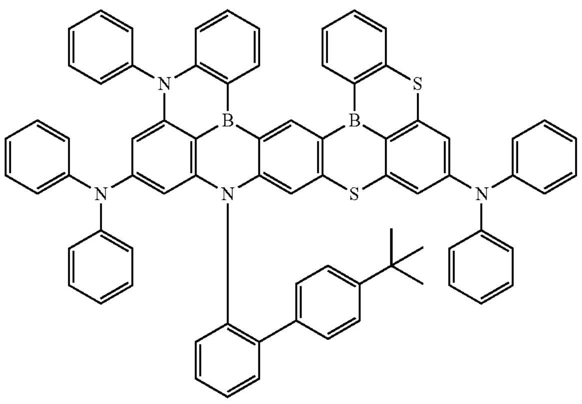

-continued
413
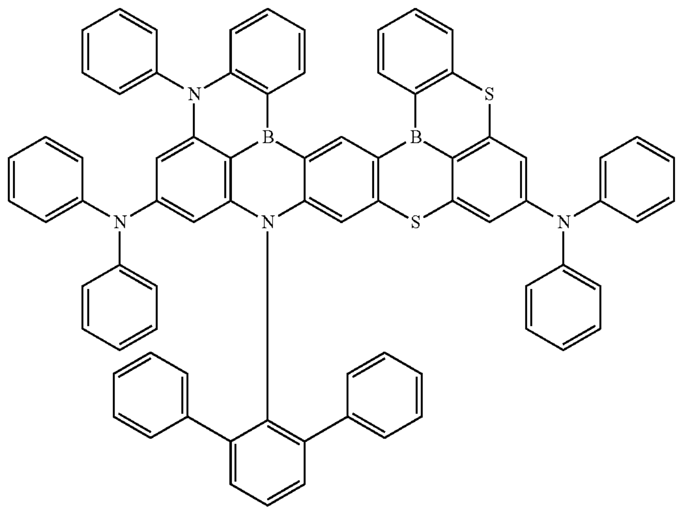
414
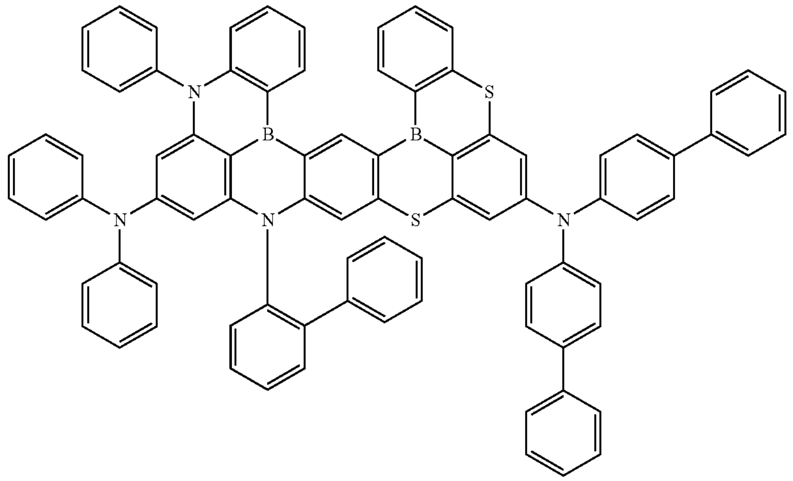
415
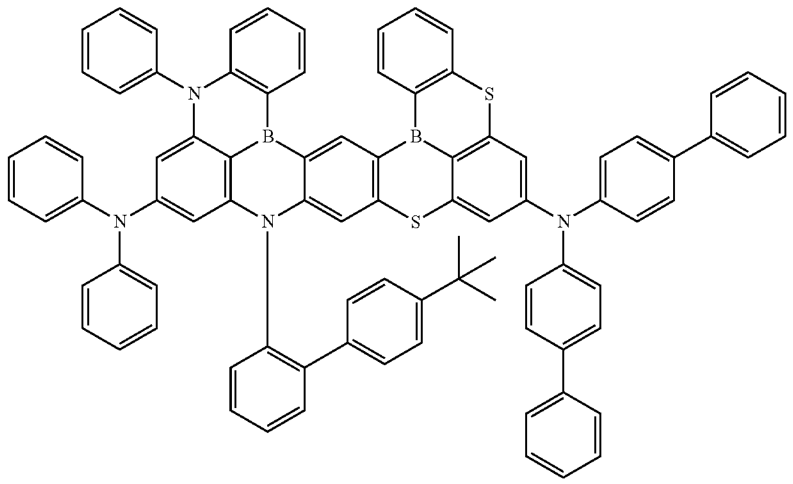

-continued
416
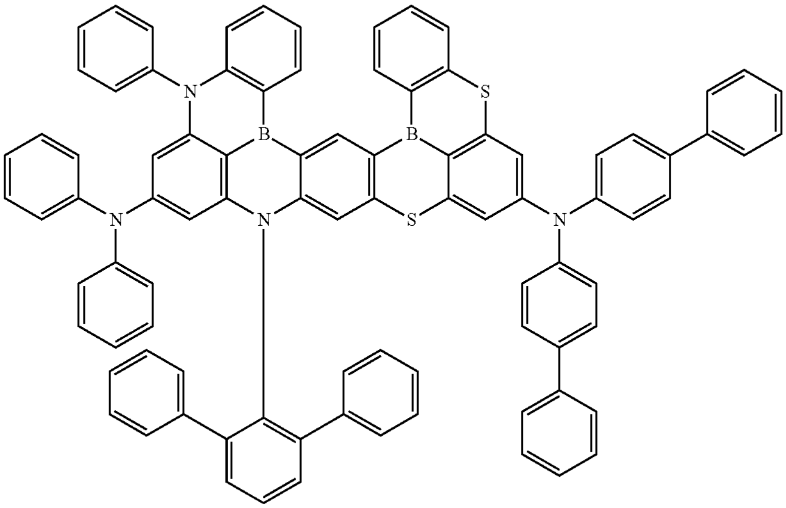
417
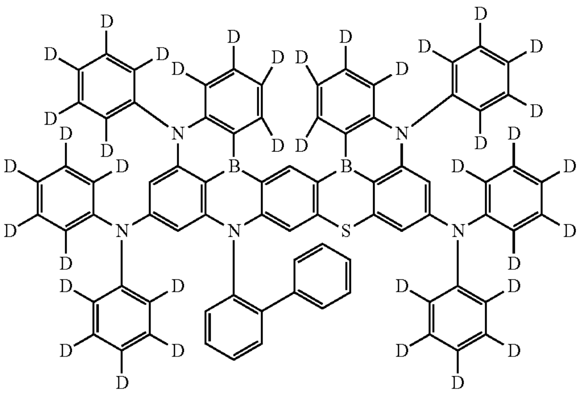
418
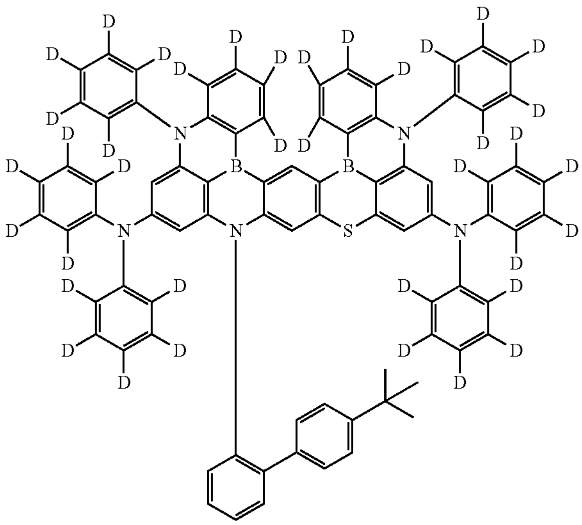
419
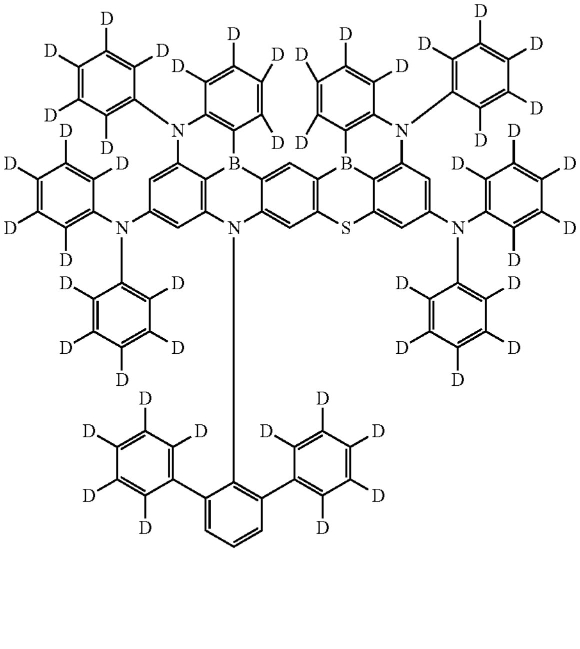
420
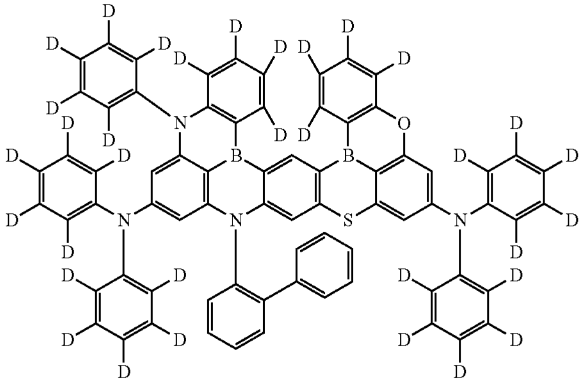

-continued
421
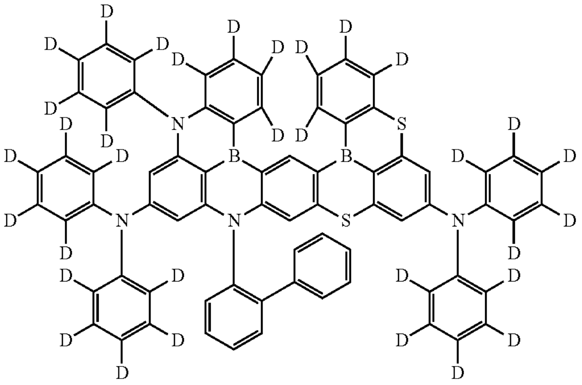
422
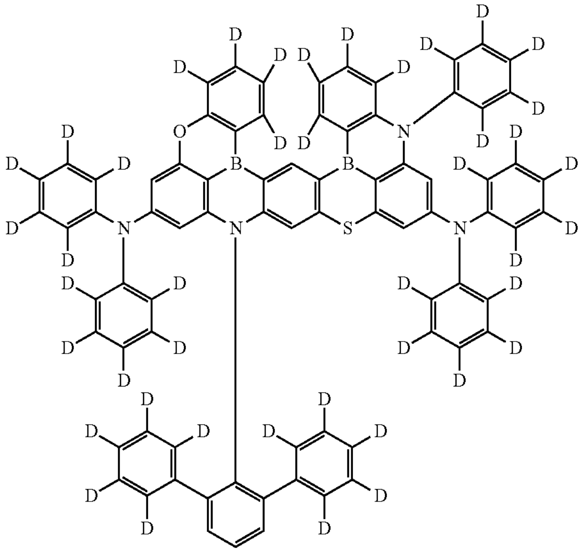
423
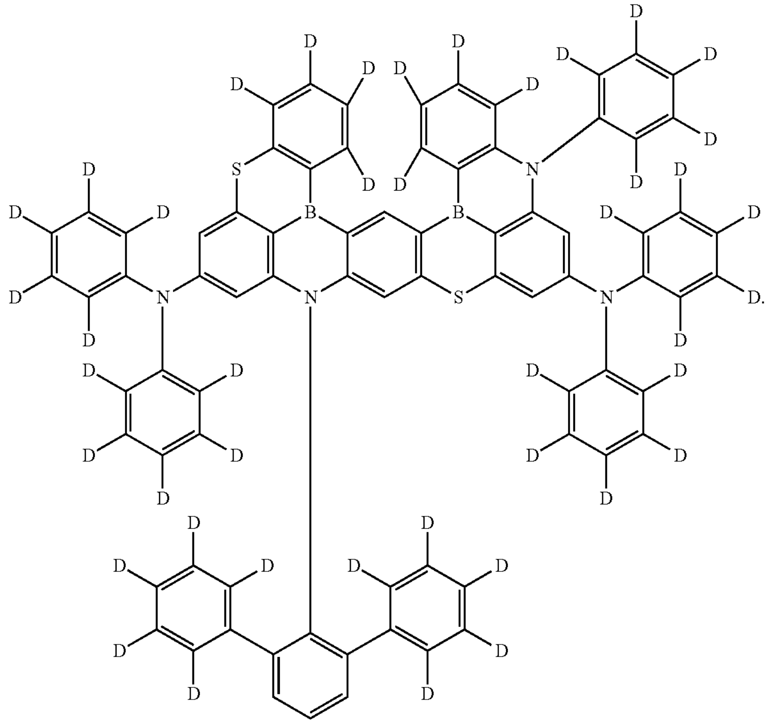

13. A polycyclic compound represented by Formula 1:

[Formula 1]

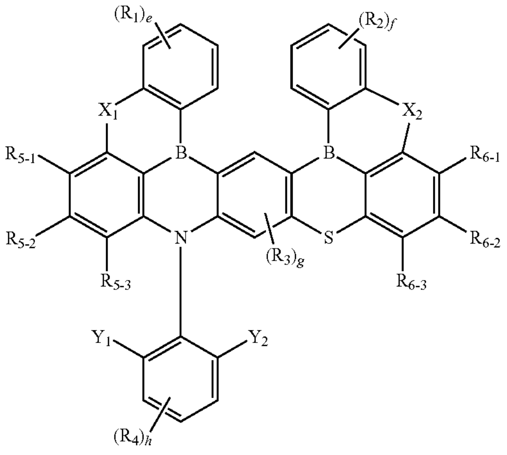

wherein in Formula 1, $X_1$ and $X_2$ are each independently O, S, or $N(R_7)$, e and f are each independently an integer from 0 to 4, g is an integer from 0 to 2, h is an integer from 0 to 3, $R_1$ to $R_4$, $R_{5-1}$ to $R_{5-3}$, and $R_{6-1}$ to $R_{6-3}$ are each independently a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, $R_7$ is a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or is combined with an adjacent group to form a ring, and $Y_1$ and $Y_2$ are each independently a hydrogen atom, a deuterium atom, a substituted or unsubstituted alkyl group of 6 to 20 carbon atoms, a substituted or unsubstituted aryl group of 6 to 30 ring-forming carbon atoms, or a substituted or unsubstituted heteroaryl group of 2 to 30 ring-forming carbon atoms, and at least one of $Y_1$ and $Y_2$ is a substituted or unsubstituted alkyl group of 6 to 20 carbon atoms, a substituted or unsubstituted aryl group of 6 to 30 ring-forming carbon atoms, or a substituted or unsubstituted heteroaryl group of 2 to 30 ring-forming carbon atoms.

14. The polycyclic compound of claim 13, wherein at least one of $X_1$ and $X_2$ is $N(R_7)$, and $R_7$ is a substituted or unsubstituted aryl group of 6 to 30 ring-forming carbon atoms, or a substituted or unsubstituted heteroaryl group of 2 to 30 ring-forming carbon atoms.

15. The polycyclic compound of claim 13, wherein the polycyclic compound represented by Formula 1 is represented by one of Formula 2-1 to Formula 2-5:

[Formula 2-1]

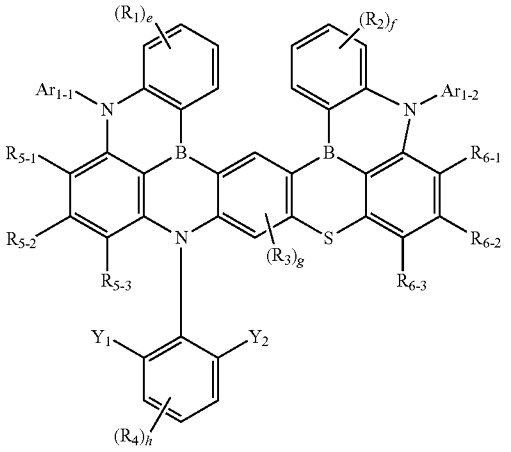

[Formula 2-2]

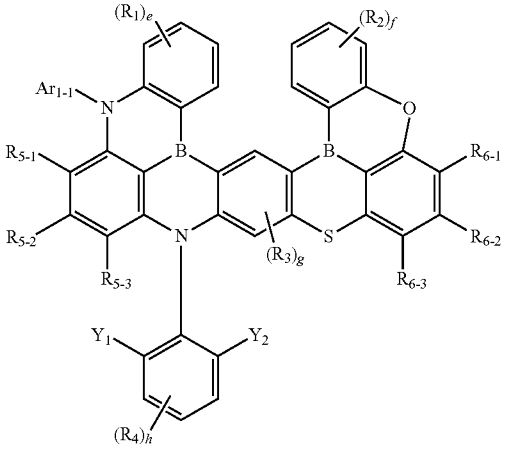

[Formula 2-3]

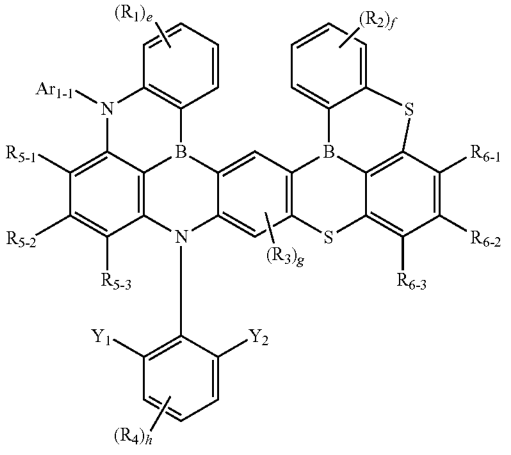

-continued

[Formula 2-4]

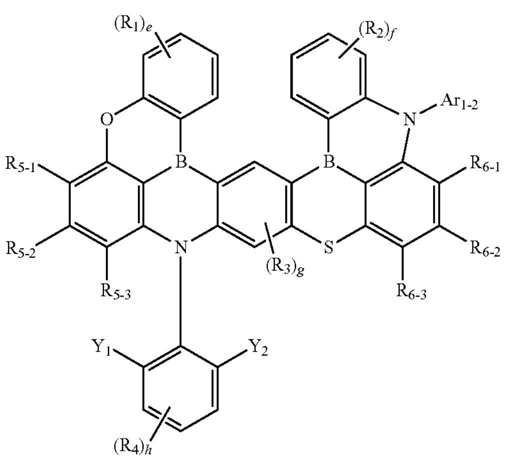

[Formula 2-5]

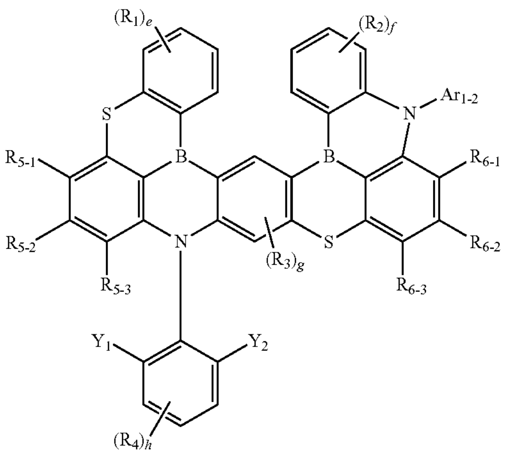

wherein in Formula 2-1 to Formula 2-5, $Ar_{1-1}$ and $Ar_{1-2}$ are each independently a substituted or unsubstituted aryl group of 6 to 30 ring-forming carbon atoms, or a substituted or unsubstituted heteroaryl group of 2 to 30 ring-forming carbon atoms, and $R_1$ to $R_4$, $R_{5-1}$ to $R_{5-3}$, $R_{6-1}$ to $R_{6-3}$, $Y_1$, $Y_2$, and e to h are the same as defined in connection with Formula 1.

16. The polycyclic compound of claim 15, wherein $Ar_{1-1}$ and $Ar_{1-2}$ are each independently a group represented by one of Formula 5-1 to Formula 5-3:

[Formula 5-1]

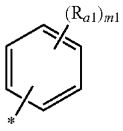

[Formula 5-2]

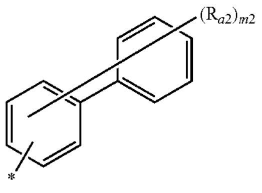

-continued

[Formula 5-3]

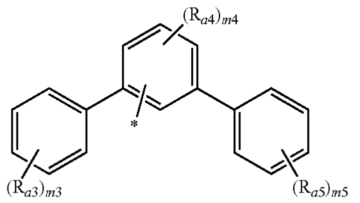

wherein in Formulae 5-1 to Formula 5-3, $R_{a1}$ to $R_{a5}$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, m1, m3, and m5 are each independently an integer from 0 to 5, m2 is an integer from 0 to 9, m4 is an integer from 0 to 3, and —* represents a binding site to a neighboring atom.

17. The polycyclic compound of claim 13, wherein at least one of $R_{5-1}$ to $R_{5-3}$, and $R_{6-1}$ to $R_{6-3}$ is a substituted amine group.

18. The polycyclic compound of claim 13, wherein the polycyclic compound represented by Formula 1 is represented by Formula 3-1 or Formula 3-2:

[Formula 3-1]

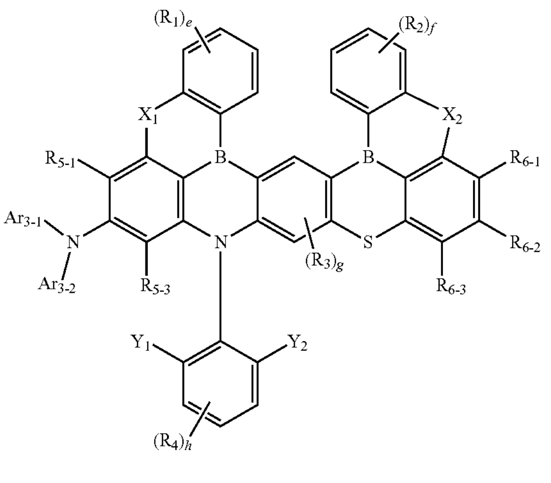

-continued

[Formula 3-2]

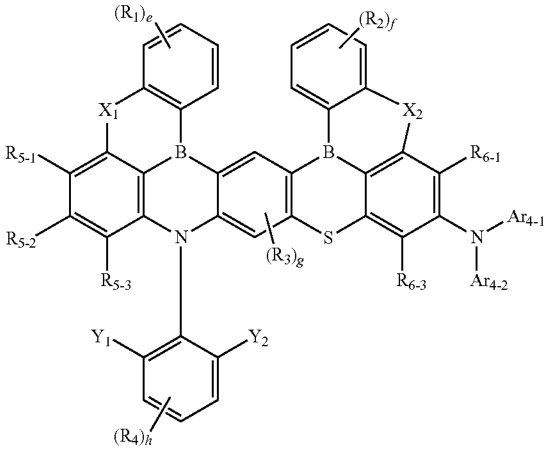

wherein in Formulae 3-1 and Formula 3-2, $Ar_{3-1}$, $Ar_{3-2}$, $Ar_{4-1}$, and $Ar_{4-2}$ are each independently a substituted or unsubstituted aryl group of 6 to 30 ring-forming carbon atoms, and $X_1$, $X_2$, $R_1$ to $R_4$, $R_{5-1}$ to $R_{5-3}$, $R_{6-1}$ to $R_{6-3}$, $Y_1$, $Y_2$, and e to h are the same as defined in connection with Formula 1.

19. The polycyclic compound of claim 13, wherein the polycyclic compound represented by Formula 1 is represented by Formula 4:

[Formula 4]

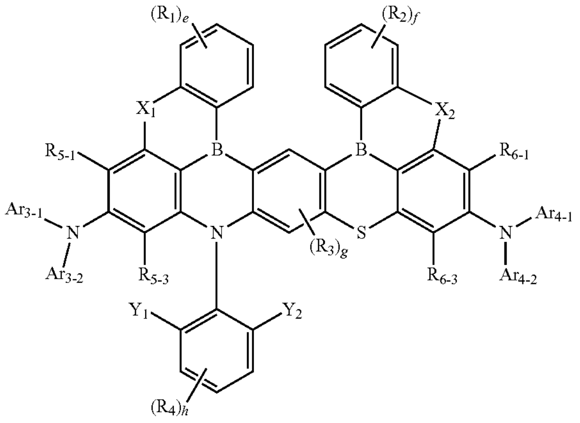

wherein in Formula 4, $Ar_{3-1}$, $Ar_{3-2}$, $Ar_{4-1}$, and $Ar_{4-2}$ are each independently a substituted or unsubstituted aryl group of 6 to 30 ring-forming carbon atoms, and $X_1$, $X_2$, $R_1$ to $R_4$, $R_{5-1}$, $R_{5-3}$, $R_{6-1}$, $R_{6-3}$, $Y_1$, $Y_2$, and e to h are the same as defined in connection with Formula 1.

20. The polycyclic compound of claim 14, wherein the polycyclic compound represented by Formula 1 is one selected from Compound Group 1:

[Compound Group 1]

1

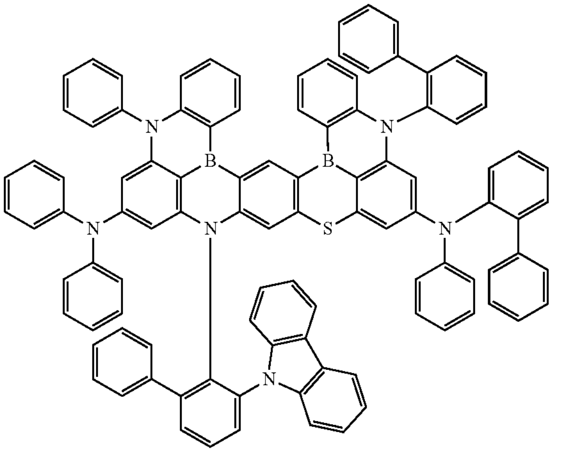

2

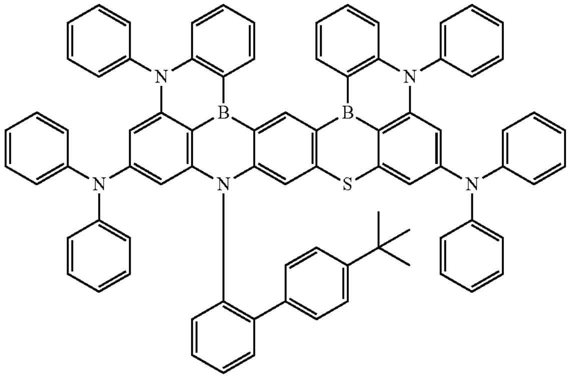

-continued
3
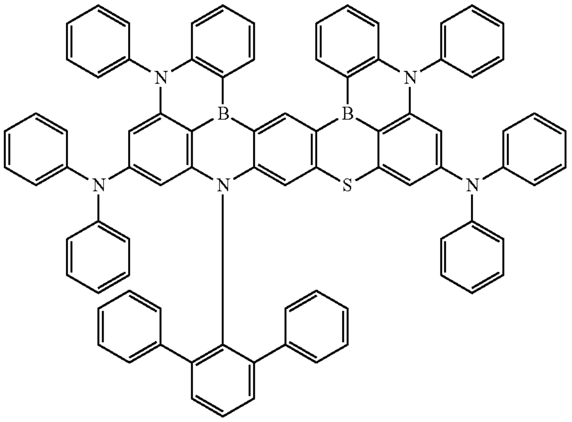
4
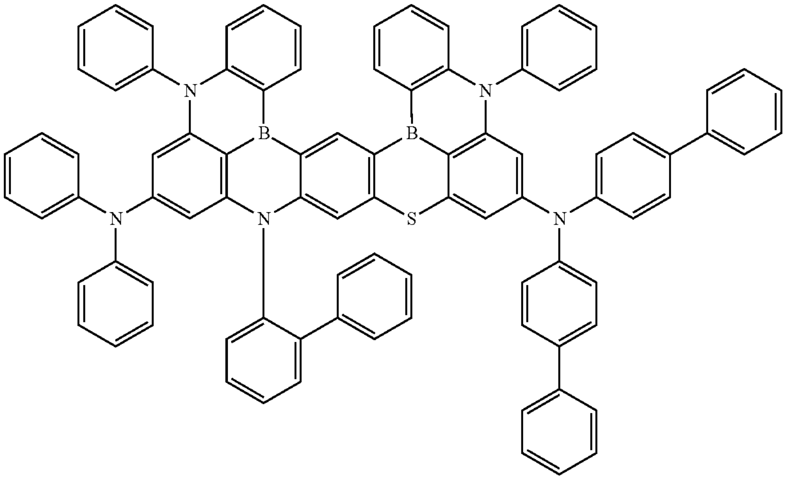
5
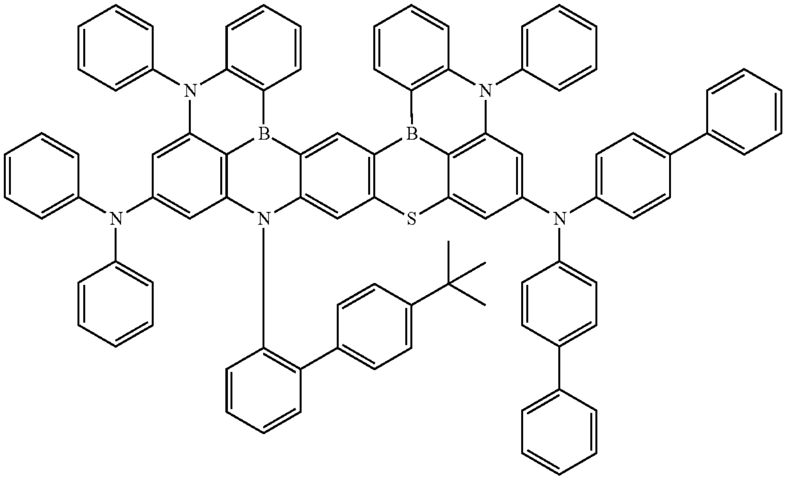

-continued
6
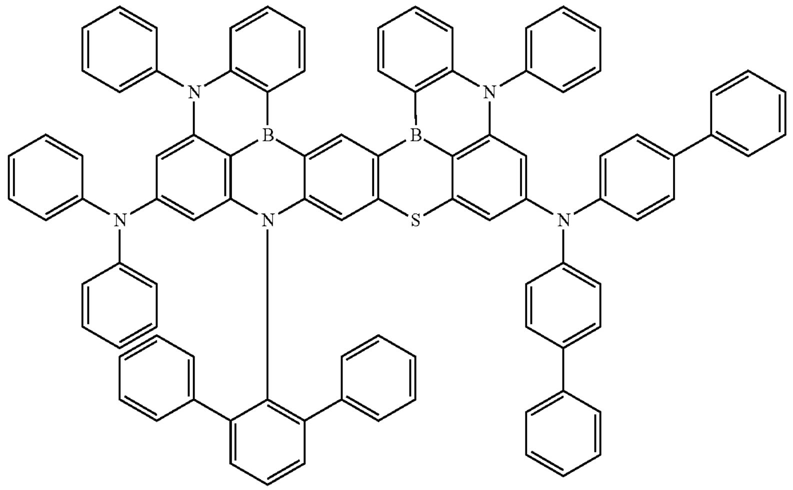
7
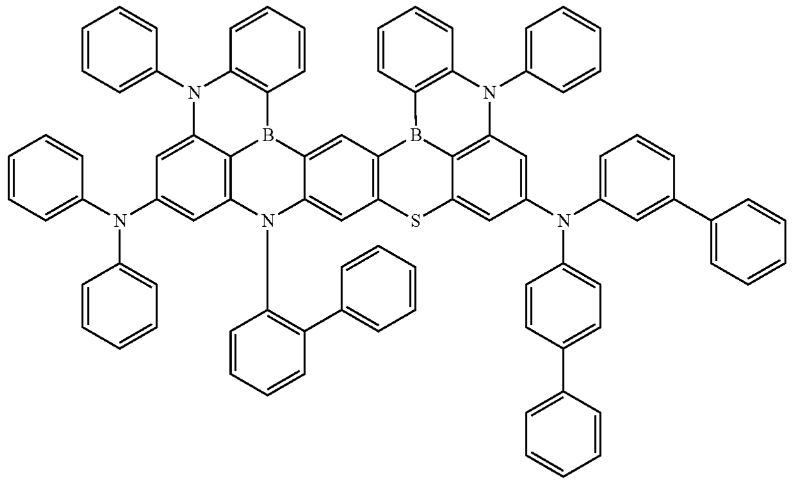
8
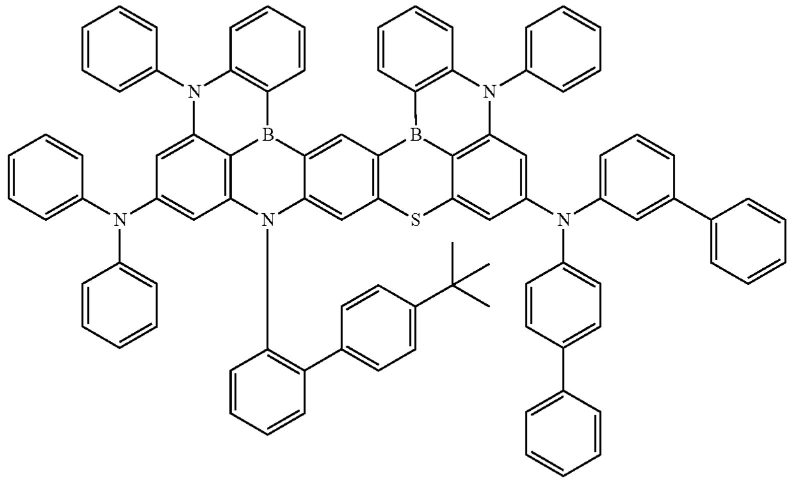

-continued
9
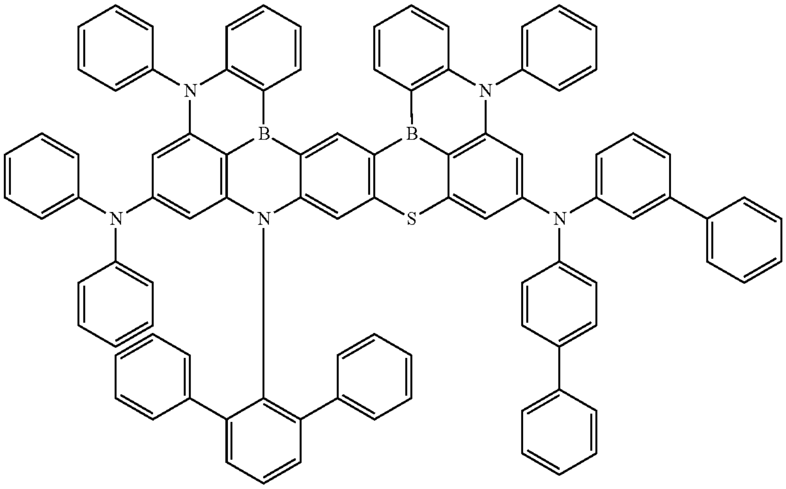
10
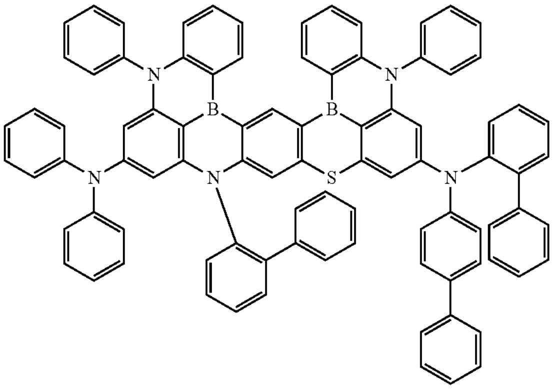
11
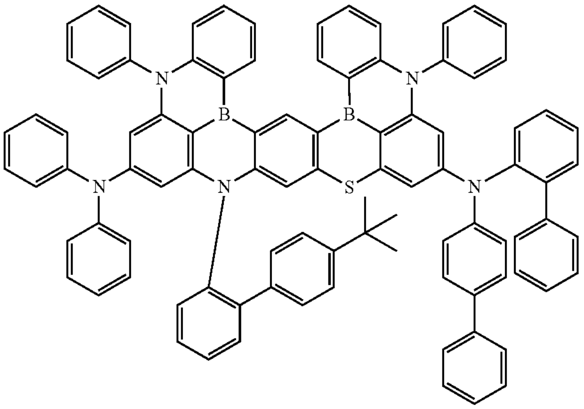
12
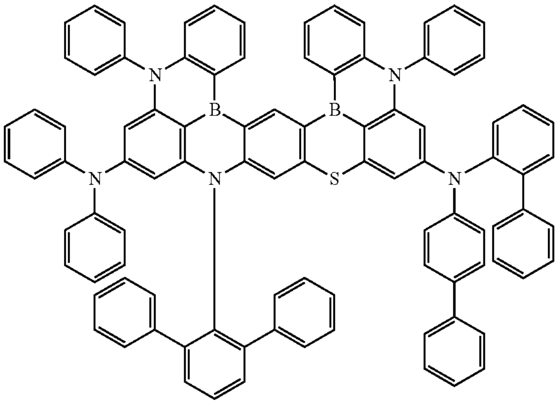
13
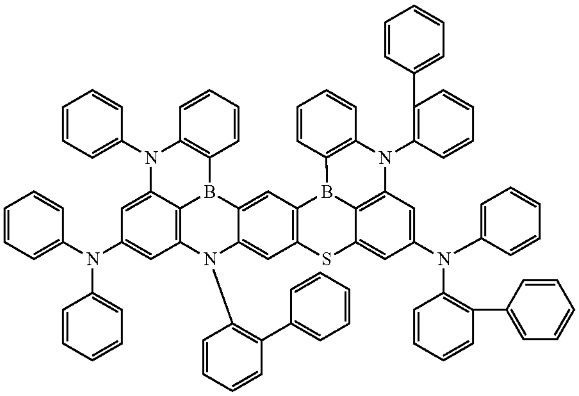

-continued
14
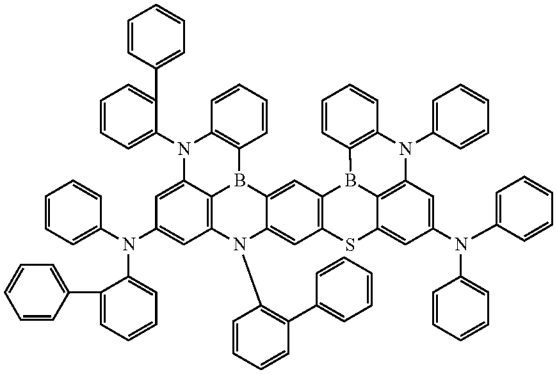
15
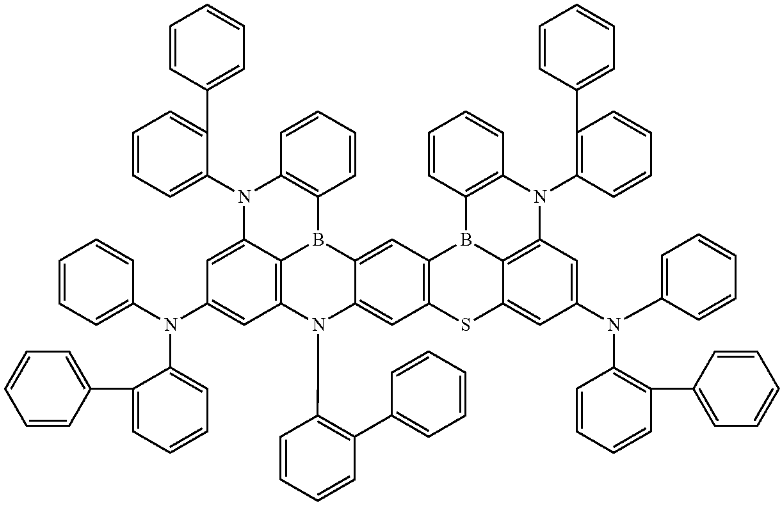
16
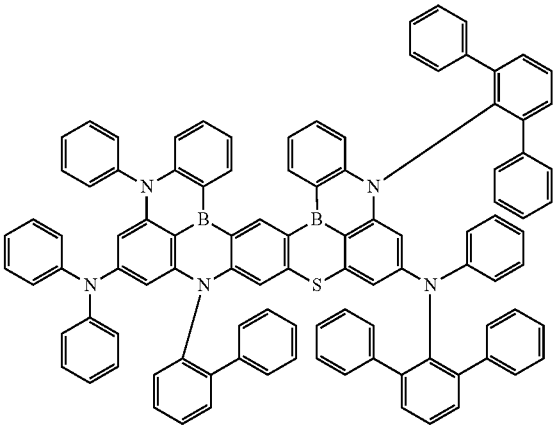

-continued
17
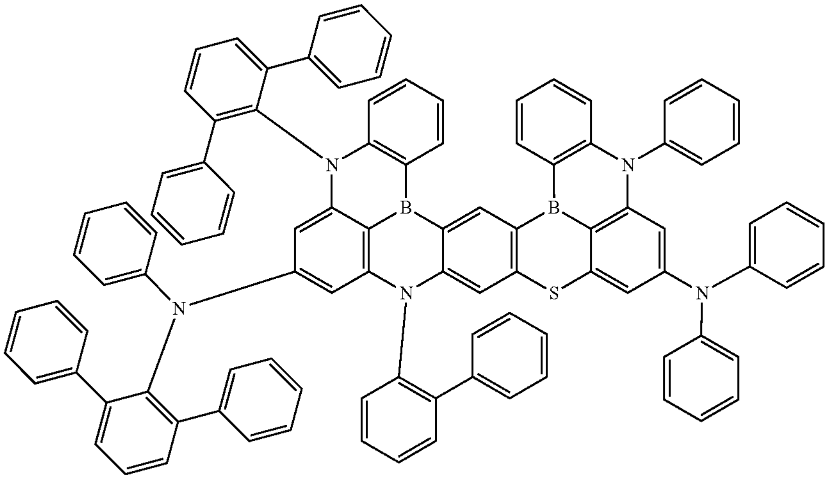
18
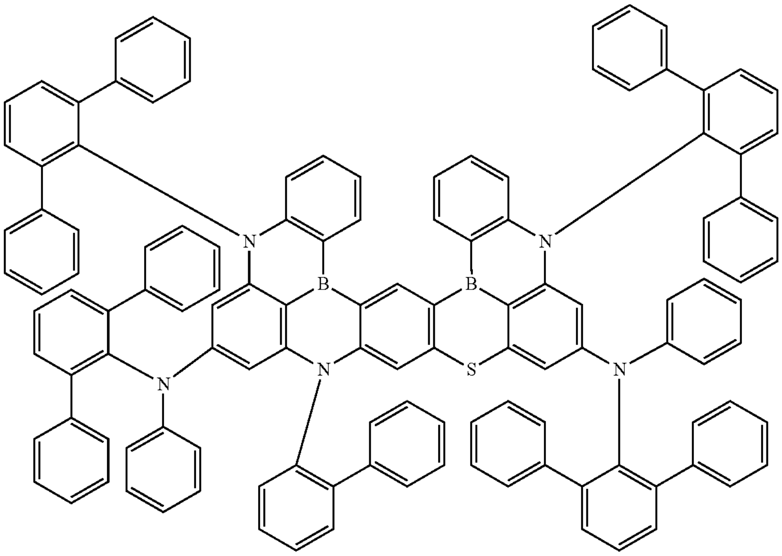
19
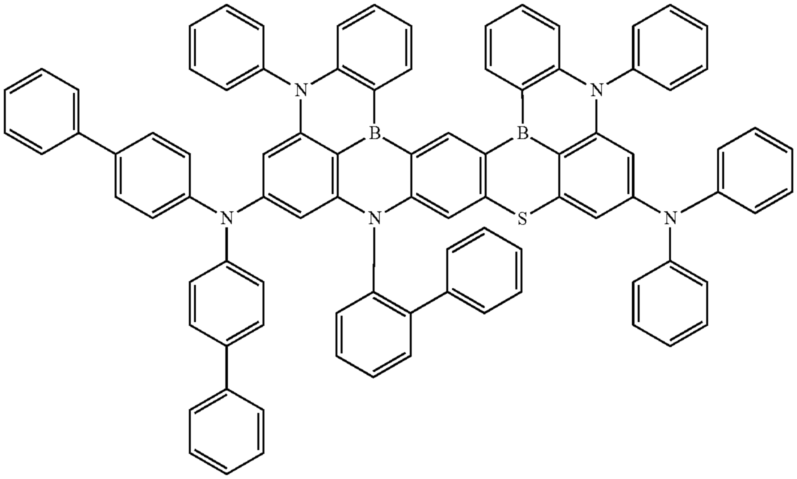

-continued
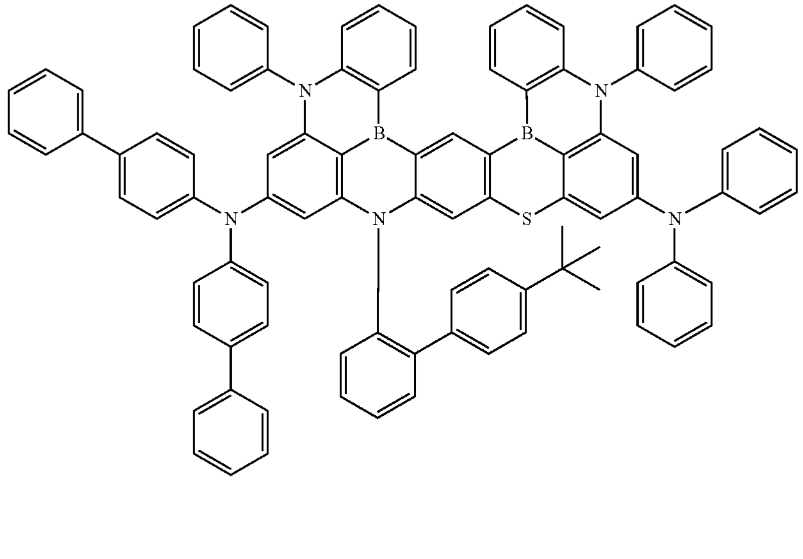
20
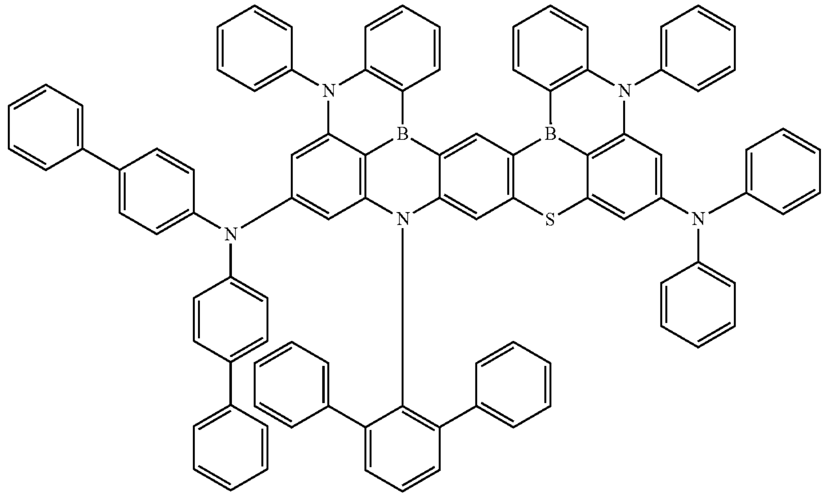
21
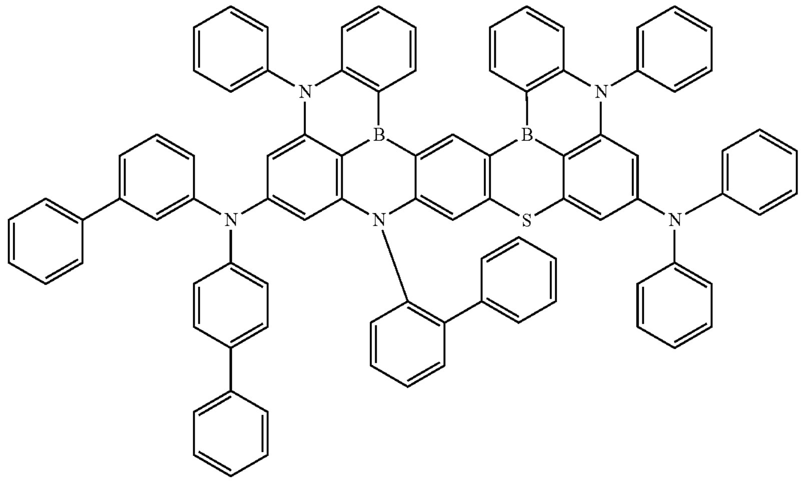
22

-continued
23
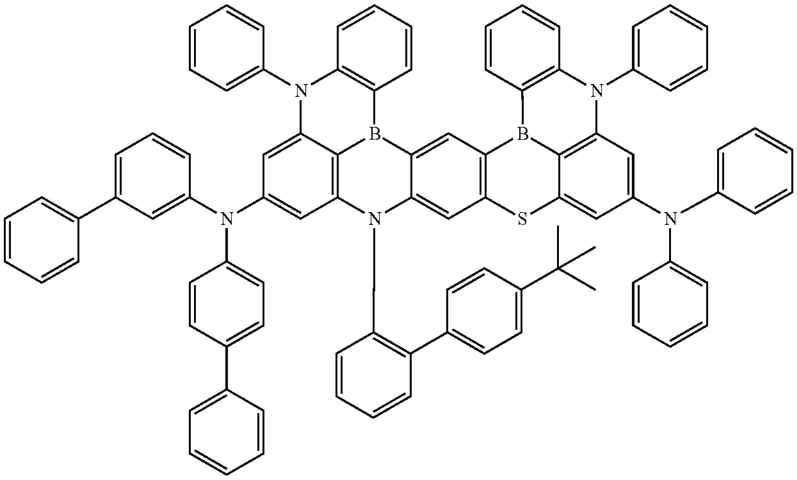
24
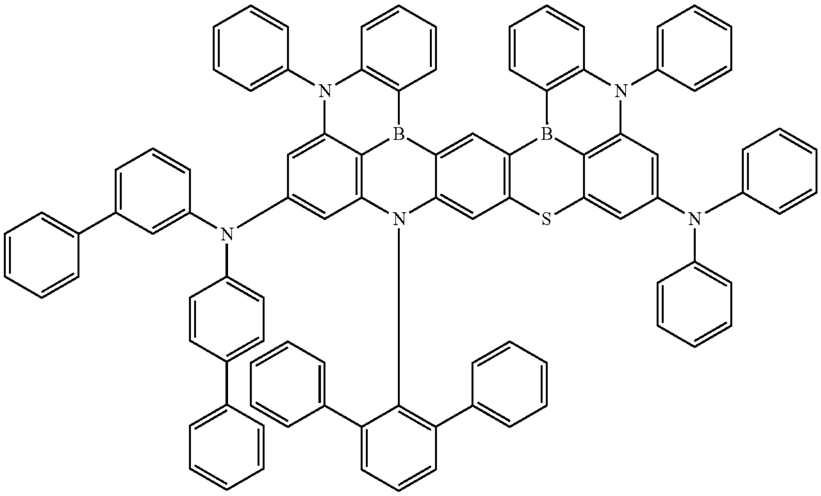
25
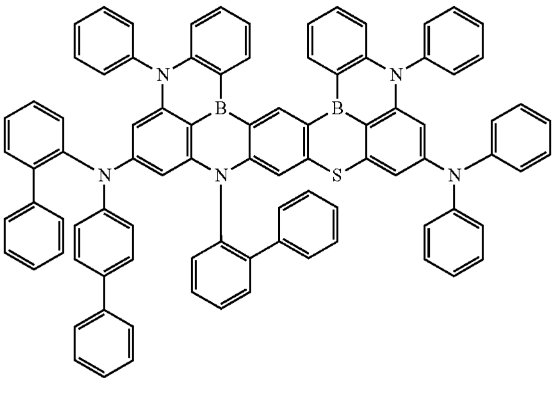
26
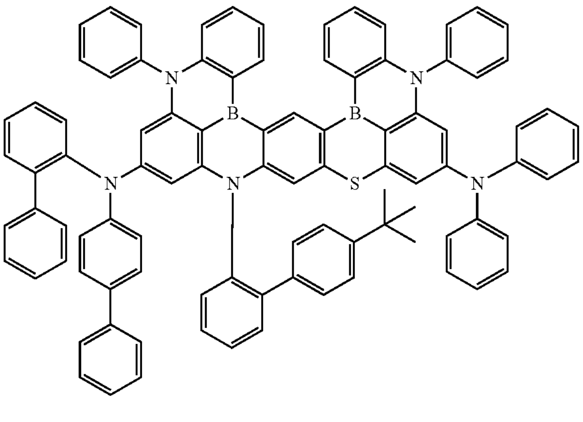

-continued
27
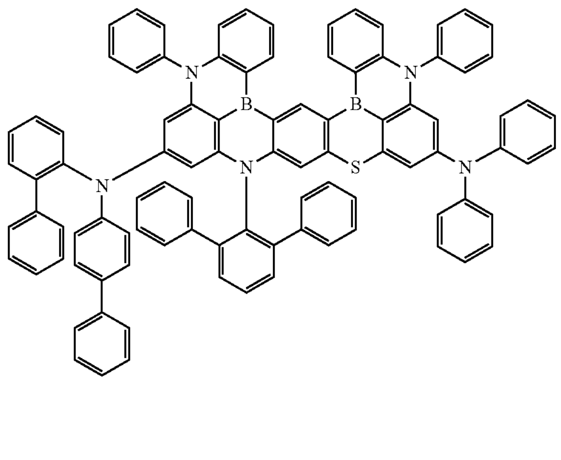
28
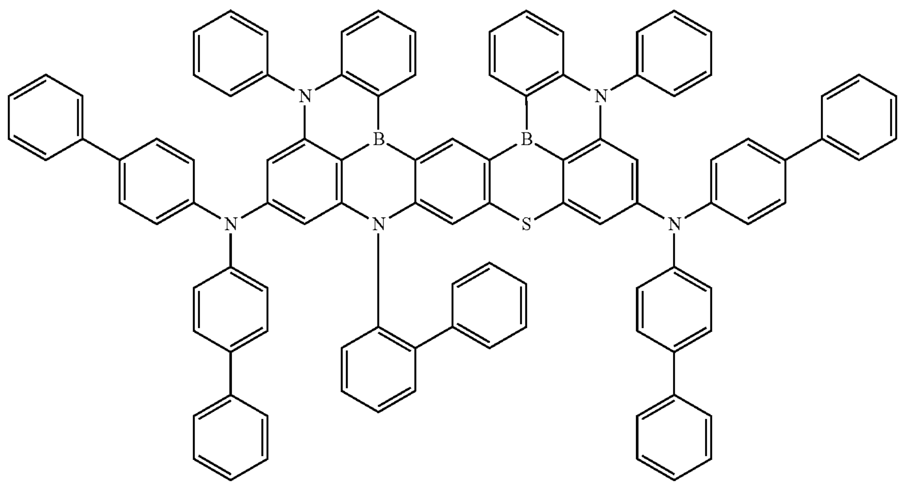
29
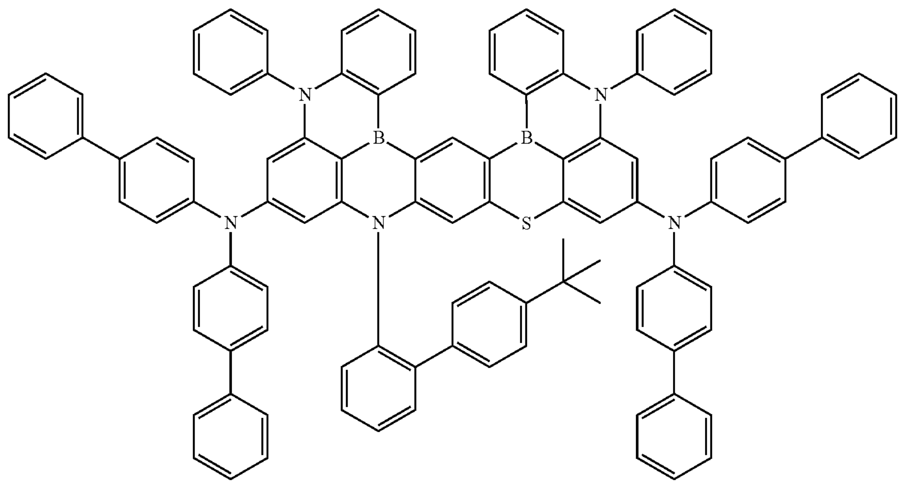

-continued
30
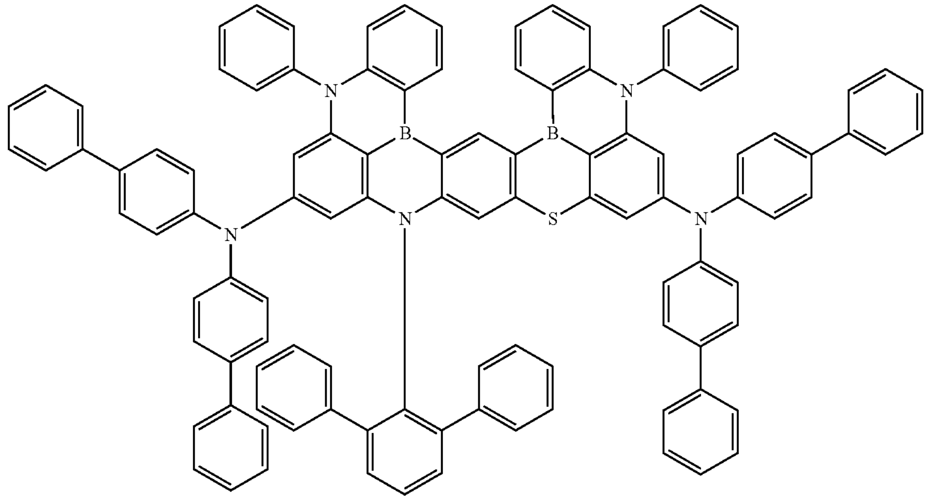
31
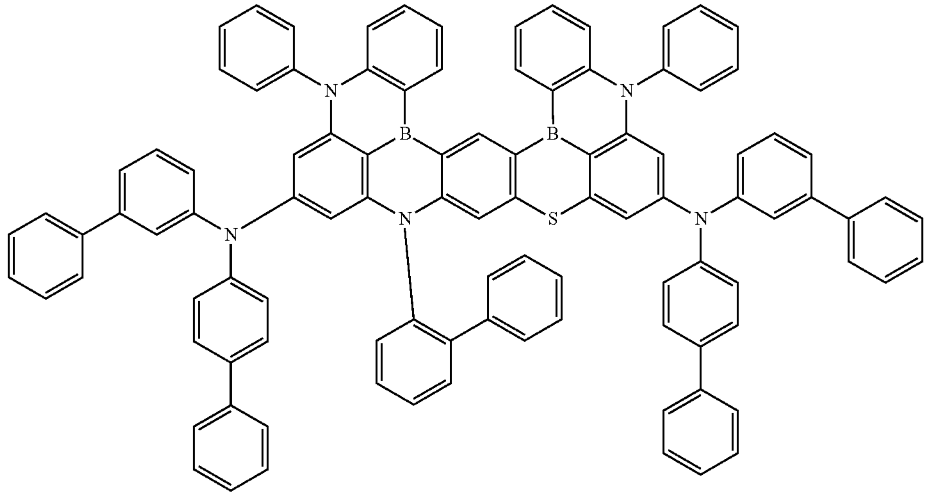
32
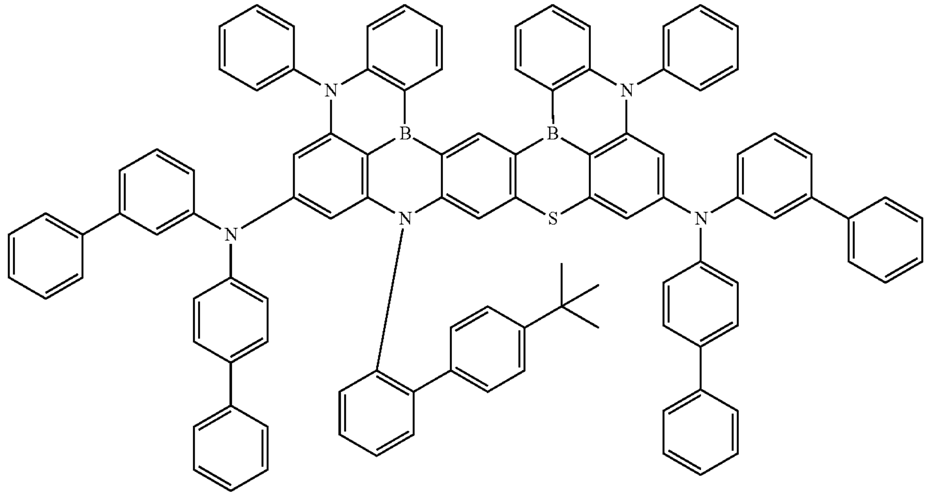

-continued
33
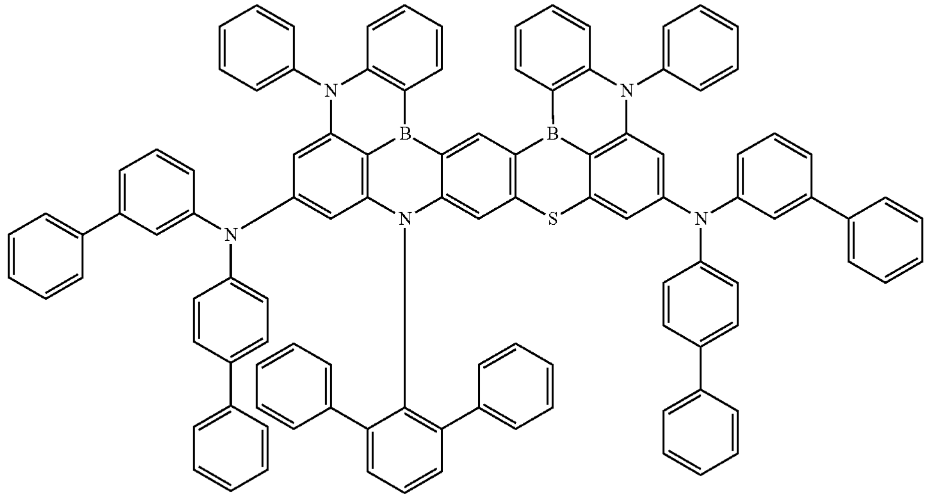
34
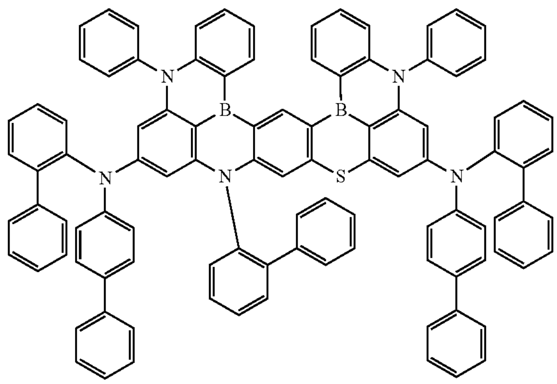
35
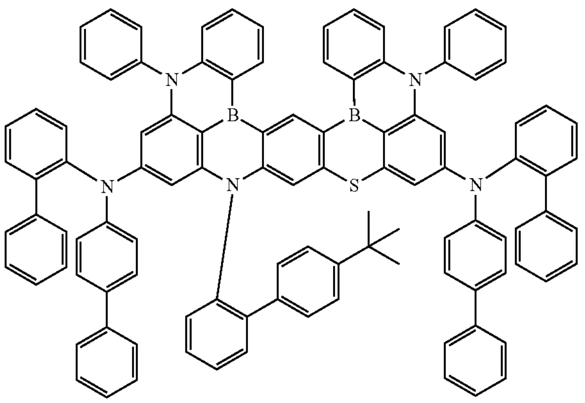
36
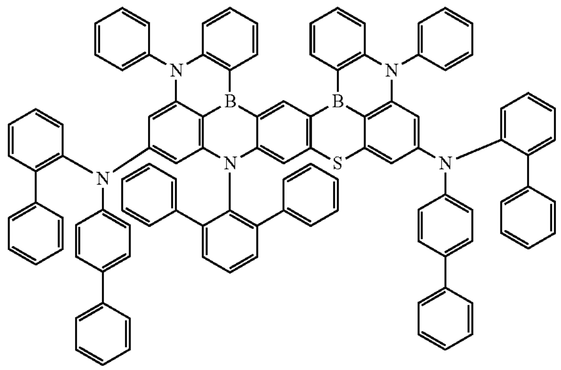
37
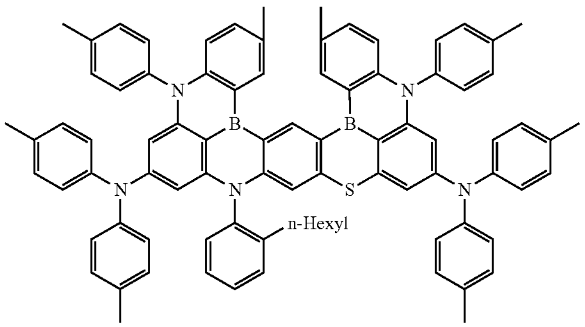
38
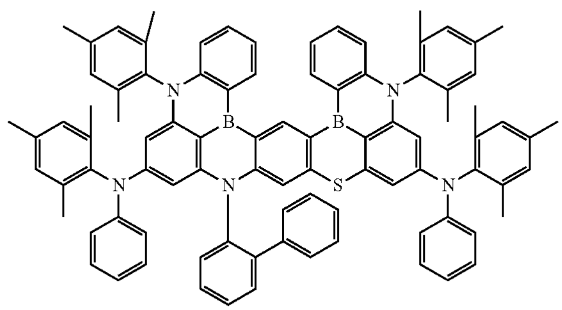
39
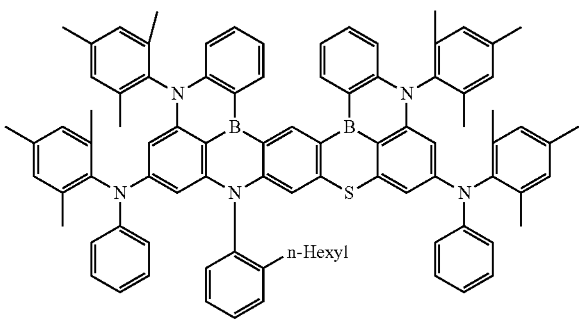

-continued
40
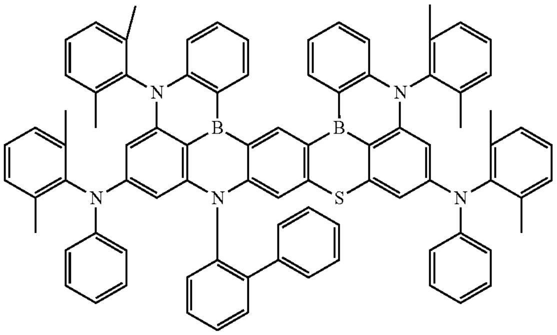
41
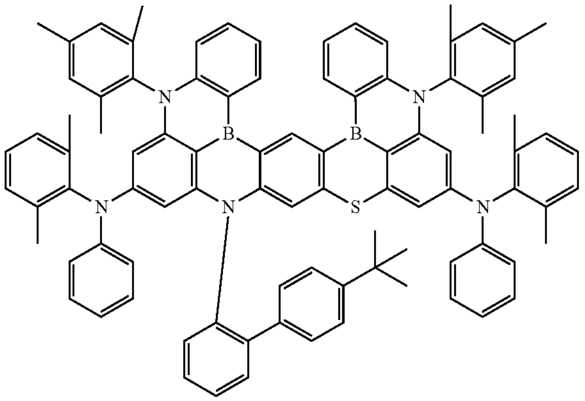
42
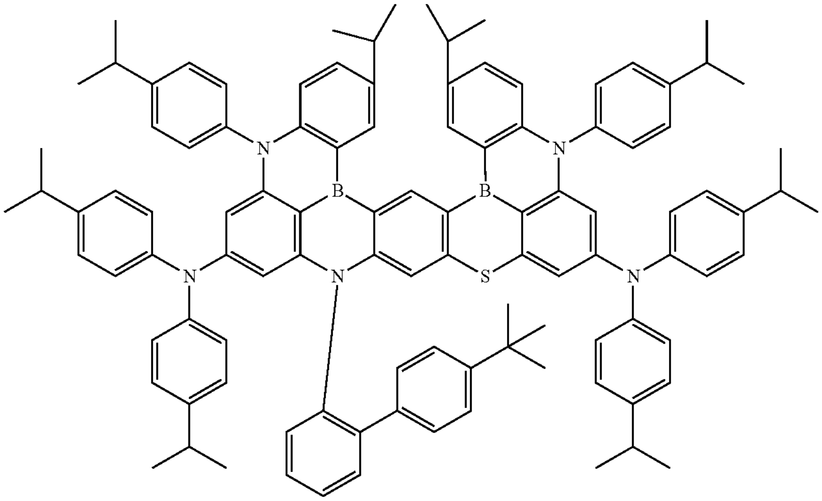
43
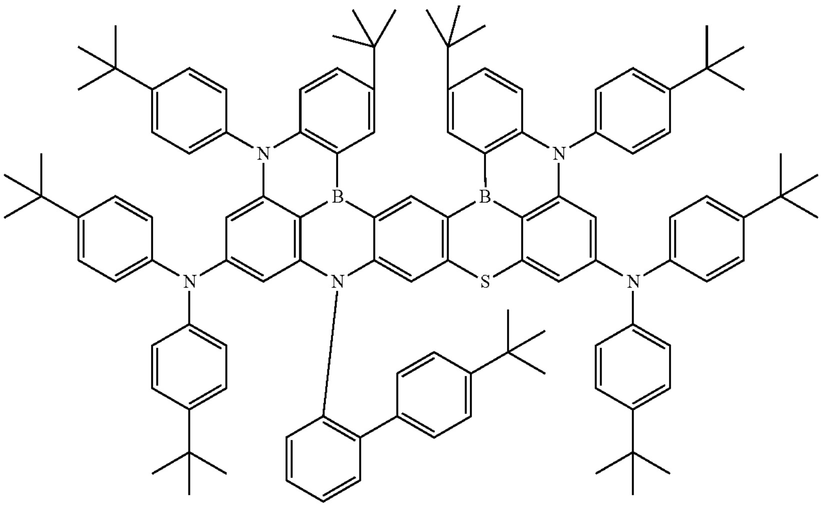

-continued
44
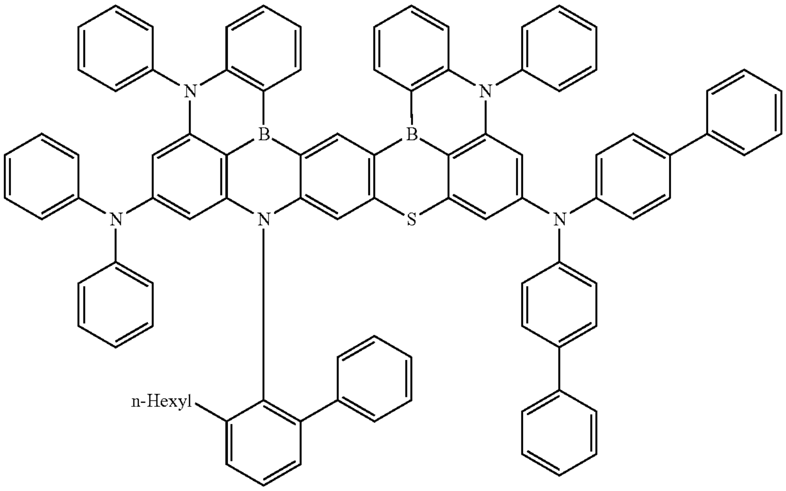
45
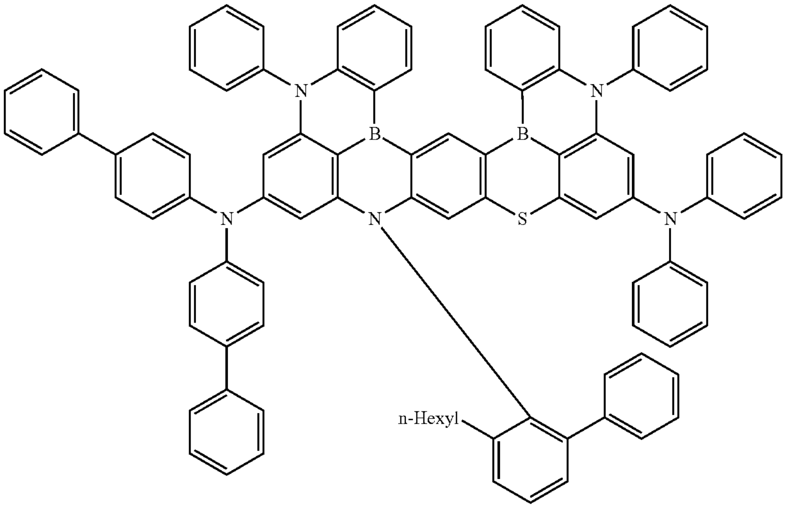
46
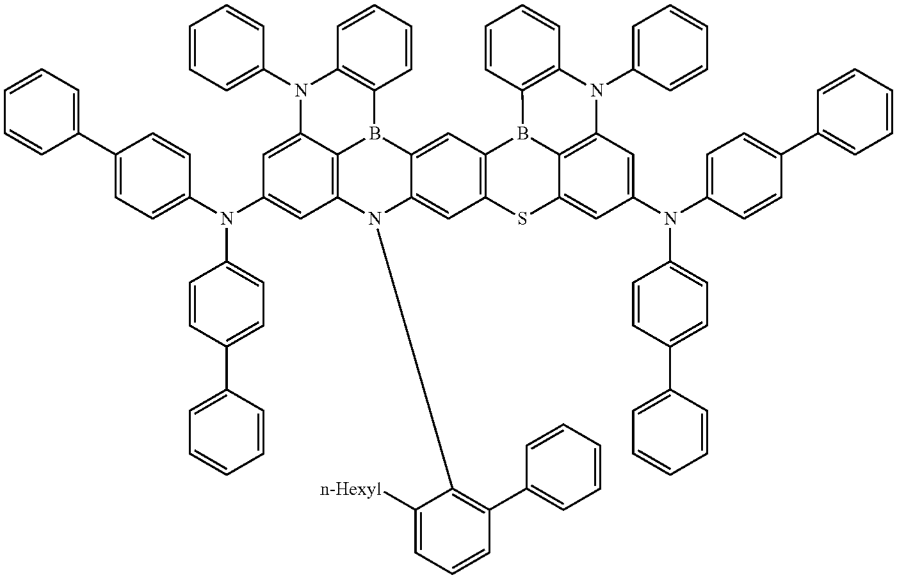

-continued
47
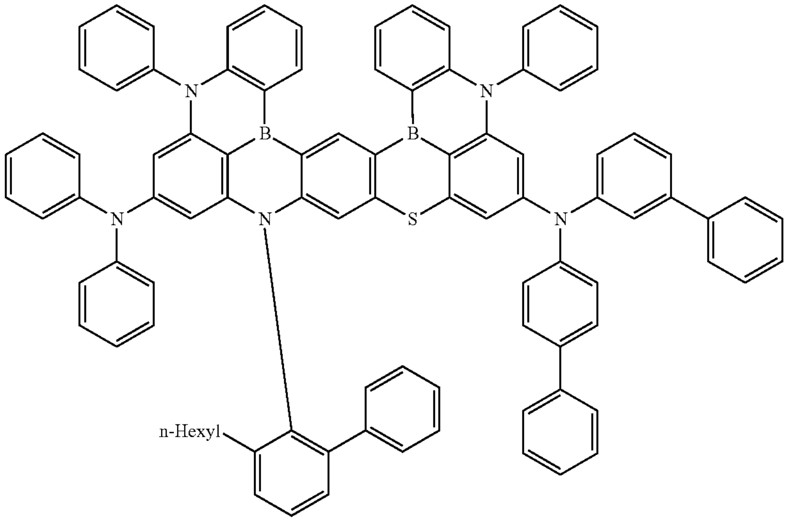
48
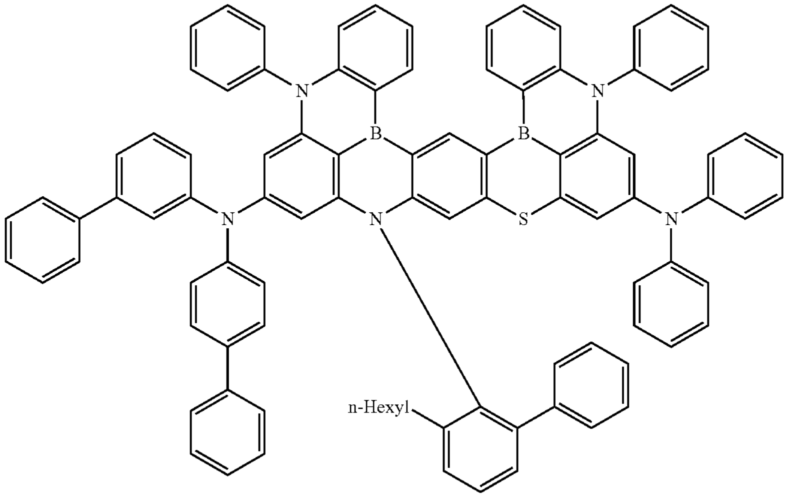
49
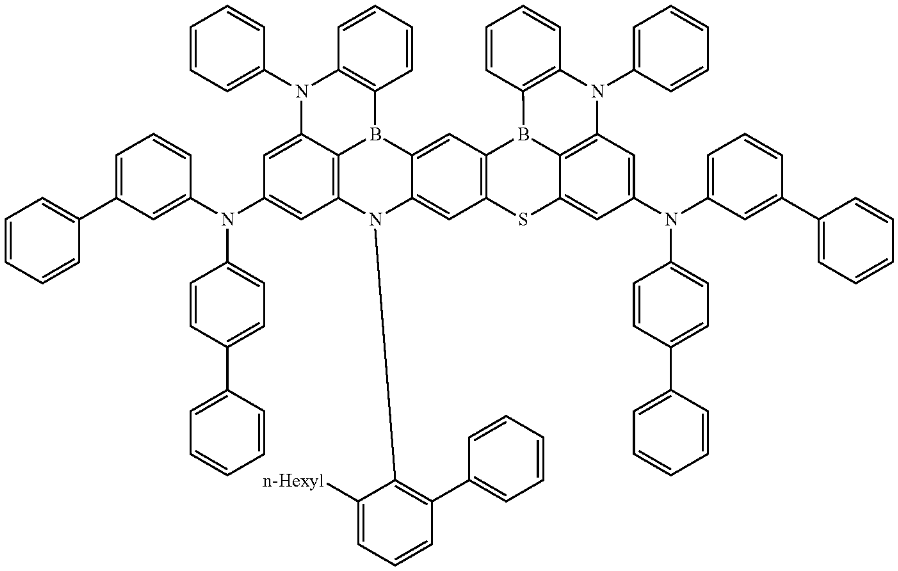

-continued
50
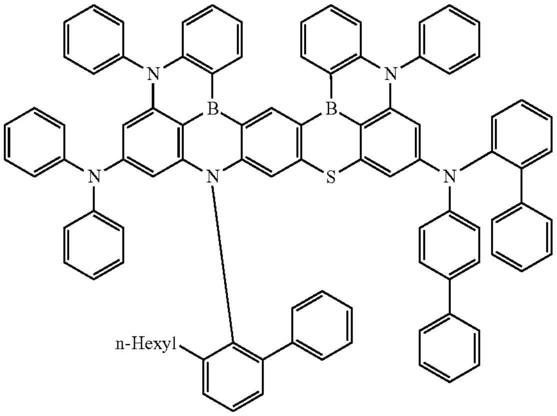
51
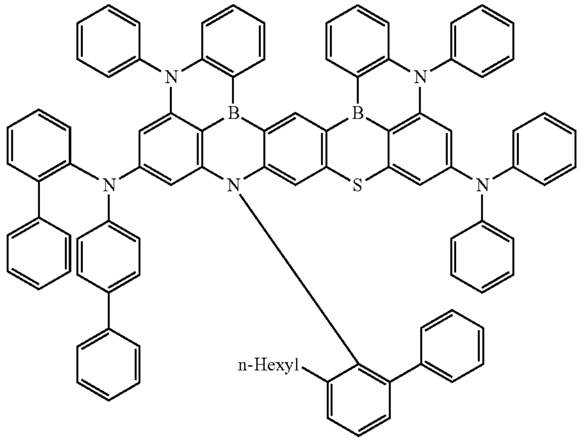
52
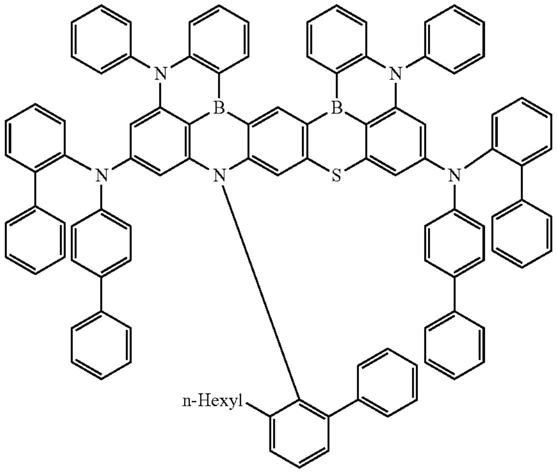
53
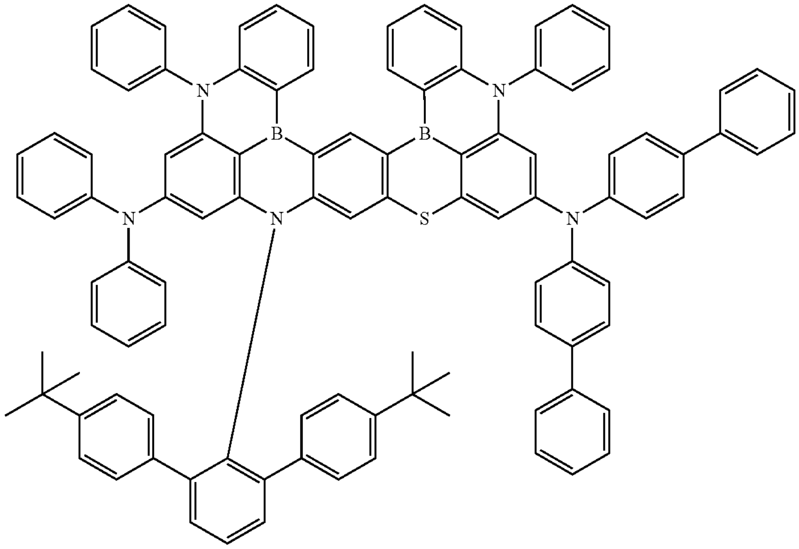

-continued
54
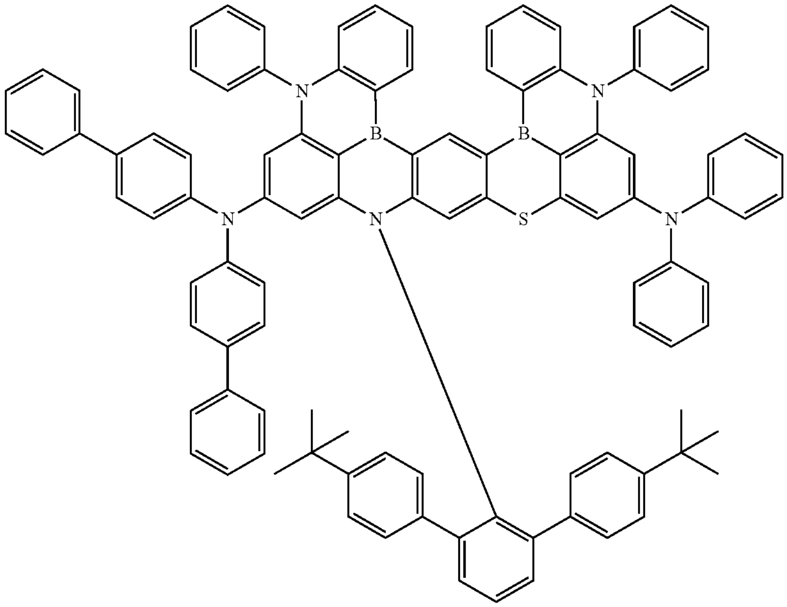
55
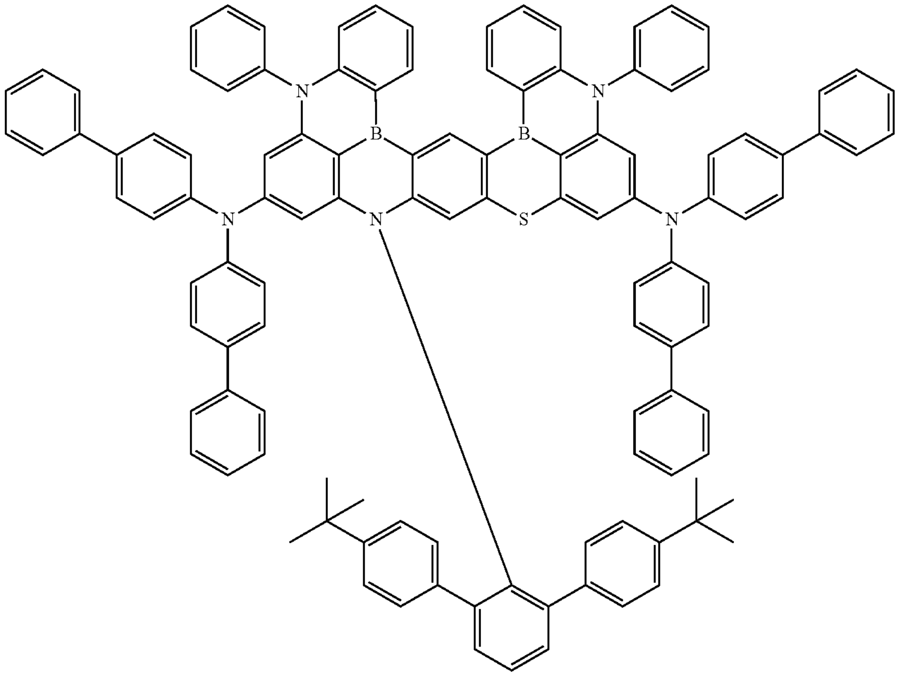

-continued
56
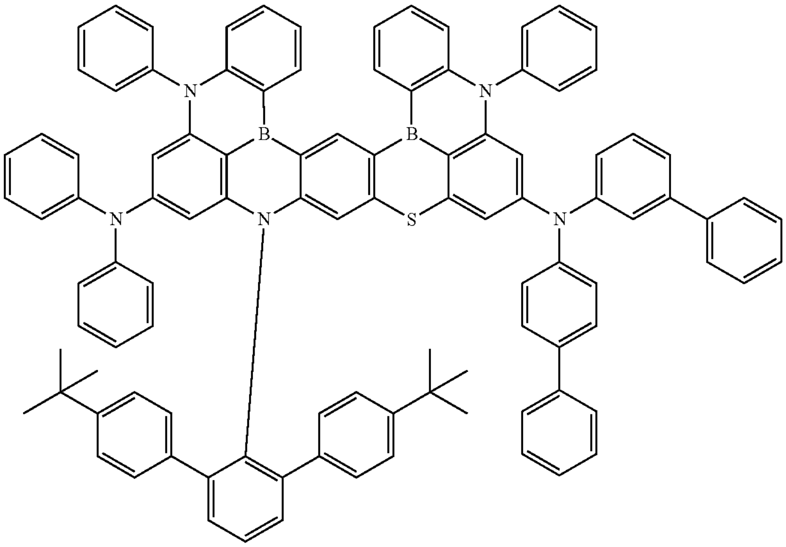
57
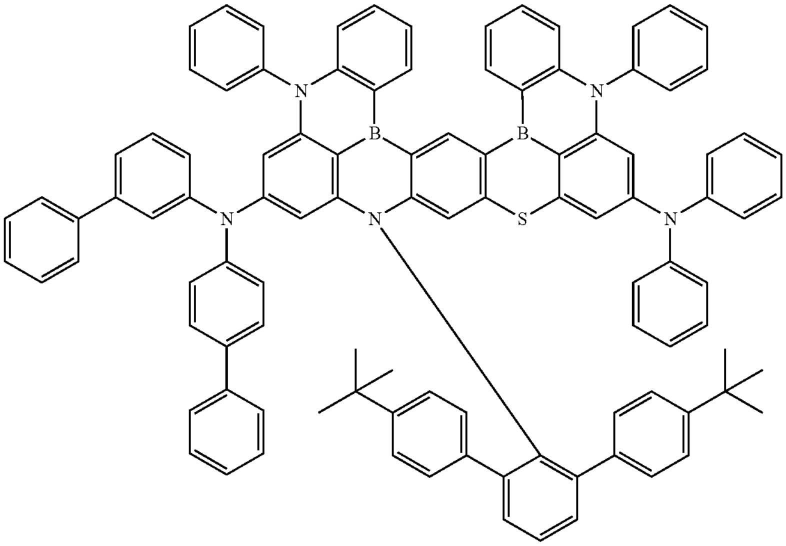
58
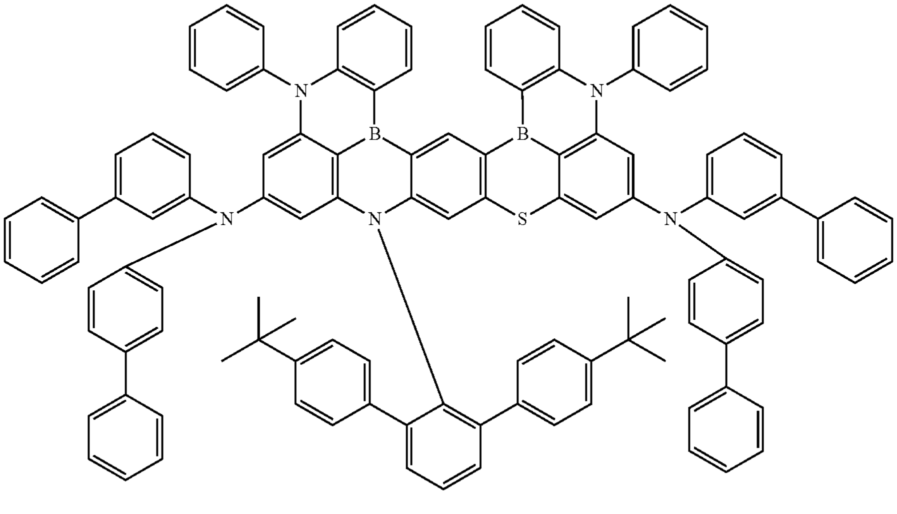

-continued
59
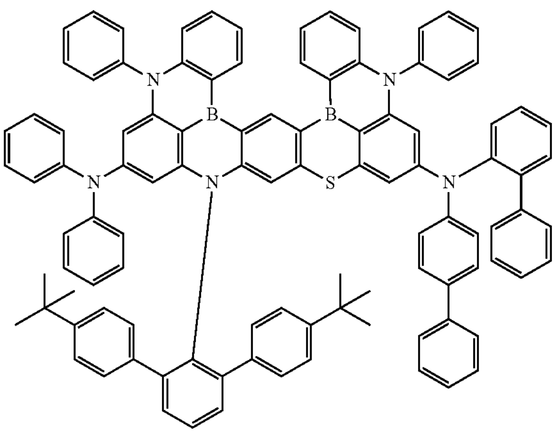
60
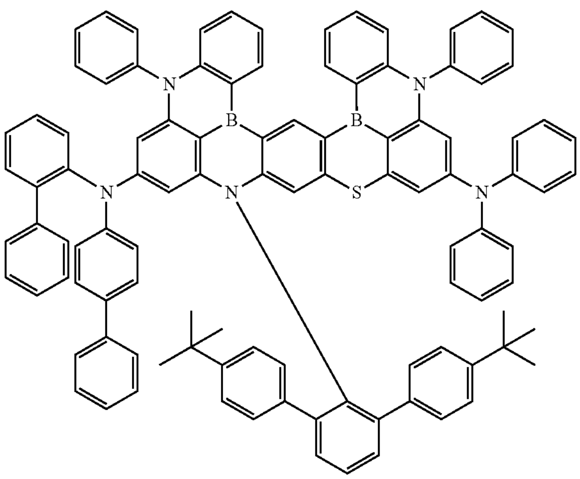
61
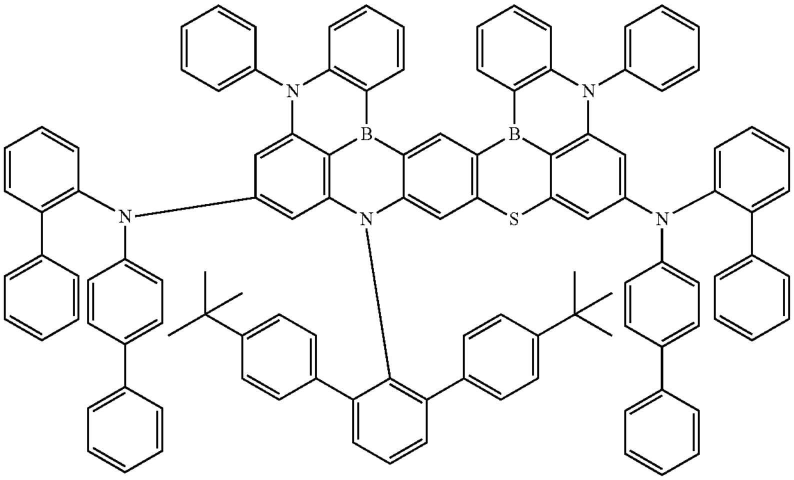
62
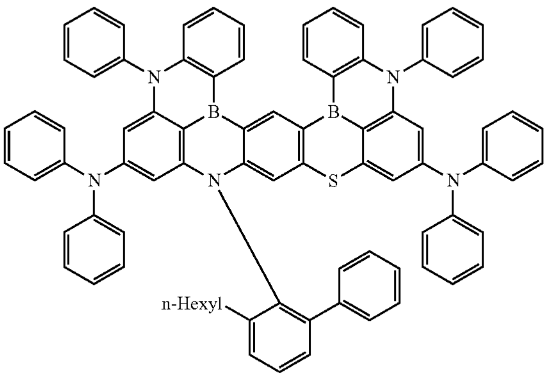
63
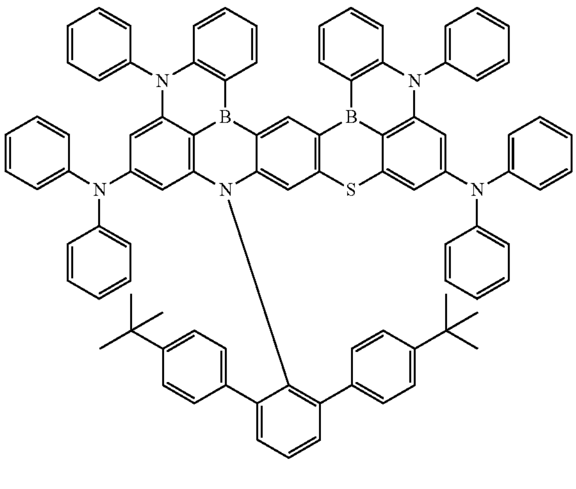

-continued
64
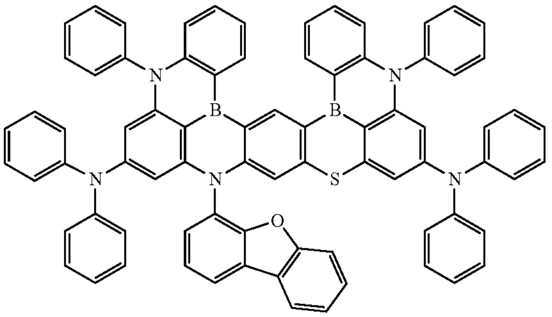
65
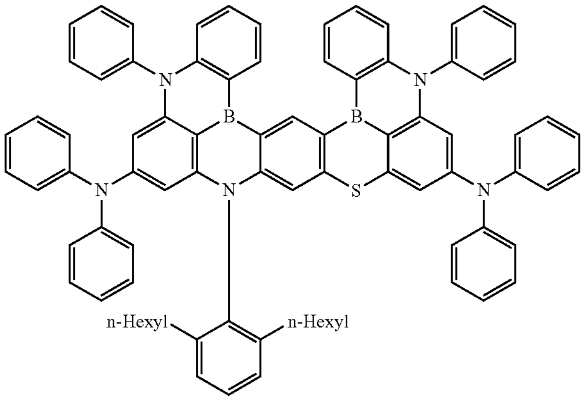
66
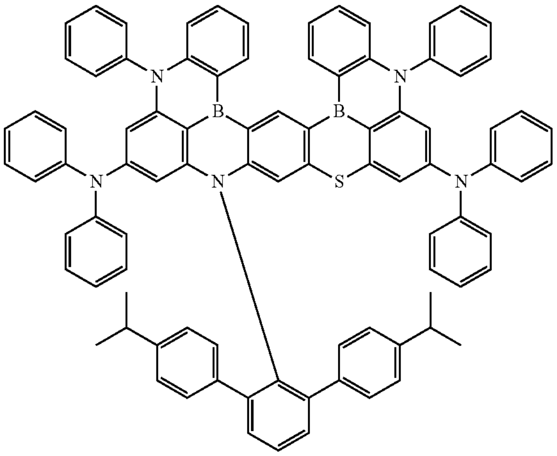
67
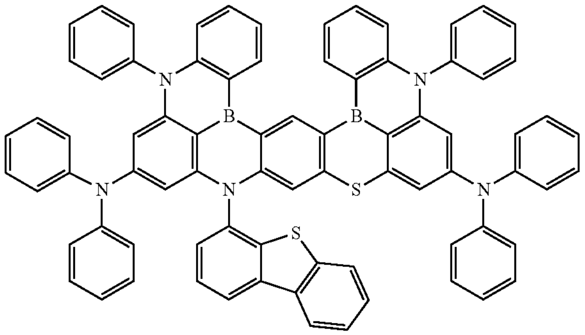
68
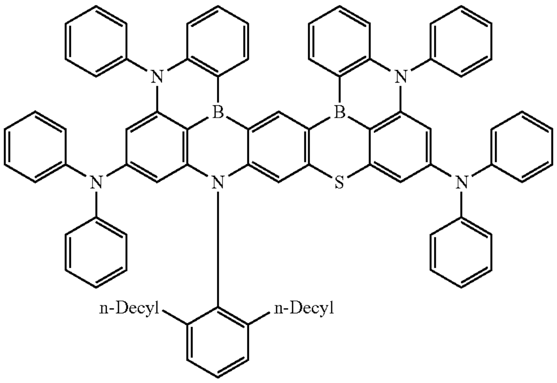
69
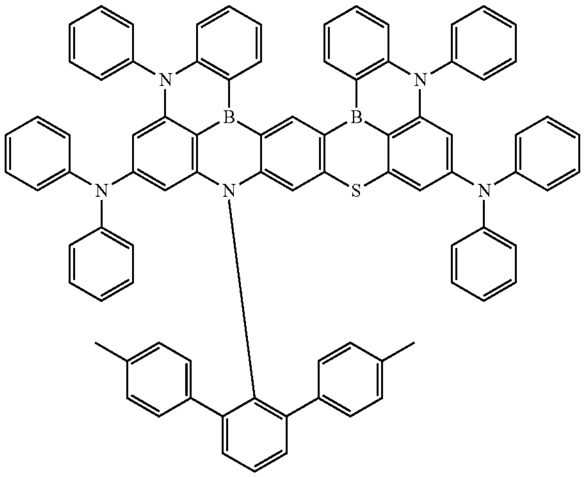

-continued
70
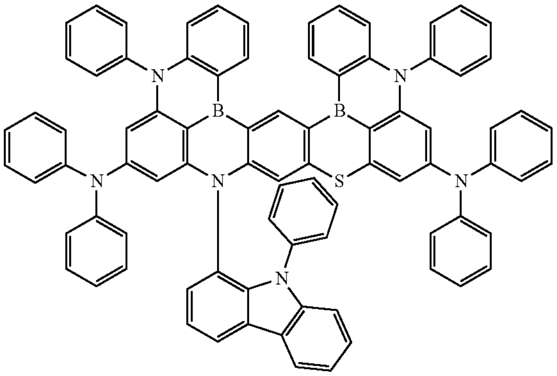
71
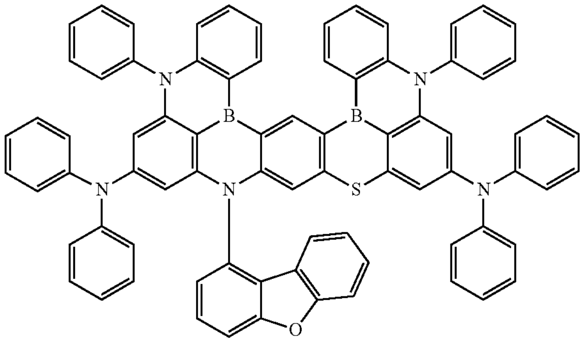
72
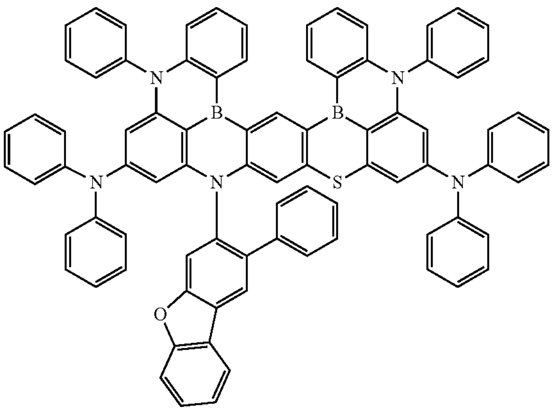
73
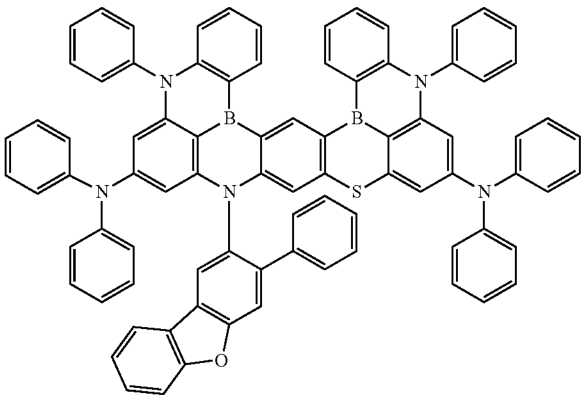
74
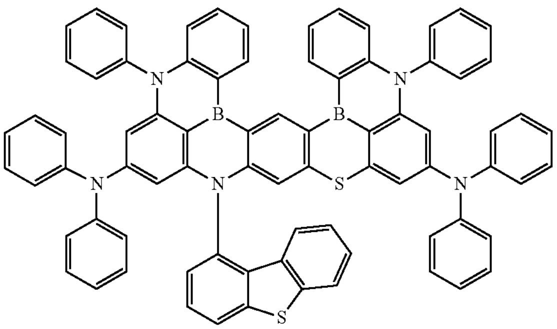
75
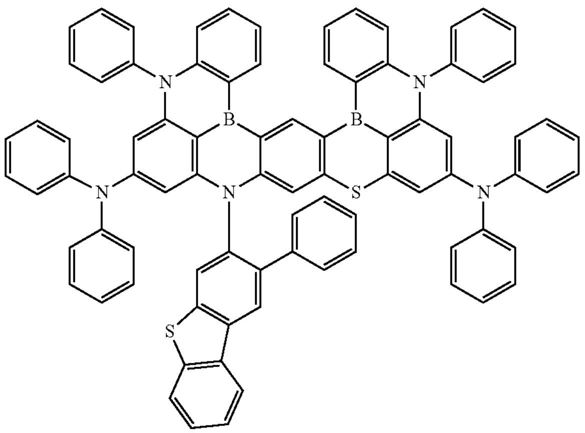

-continued
76
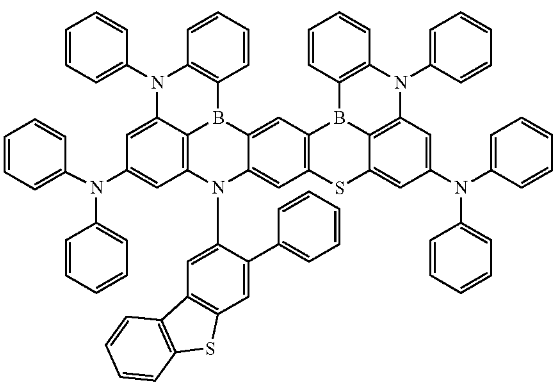
77
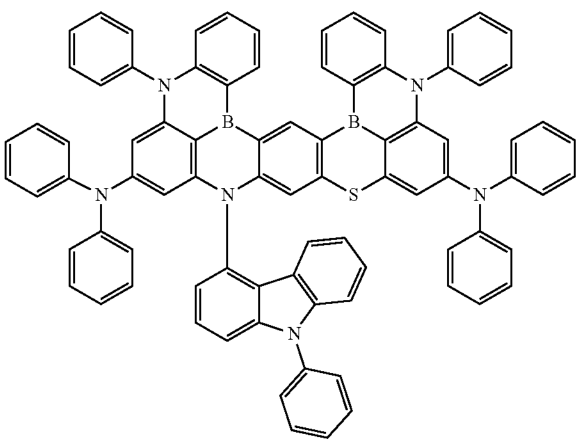
78
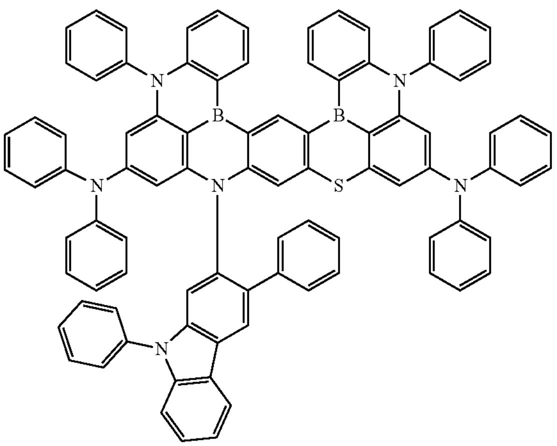
79
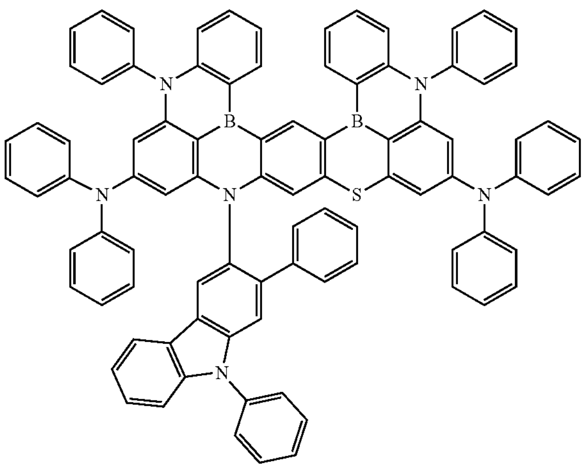
80
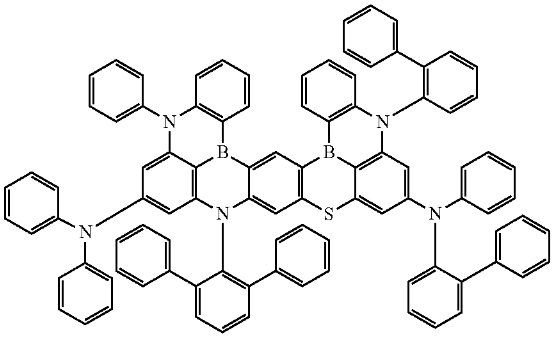

-continued
81
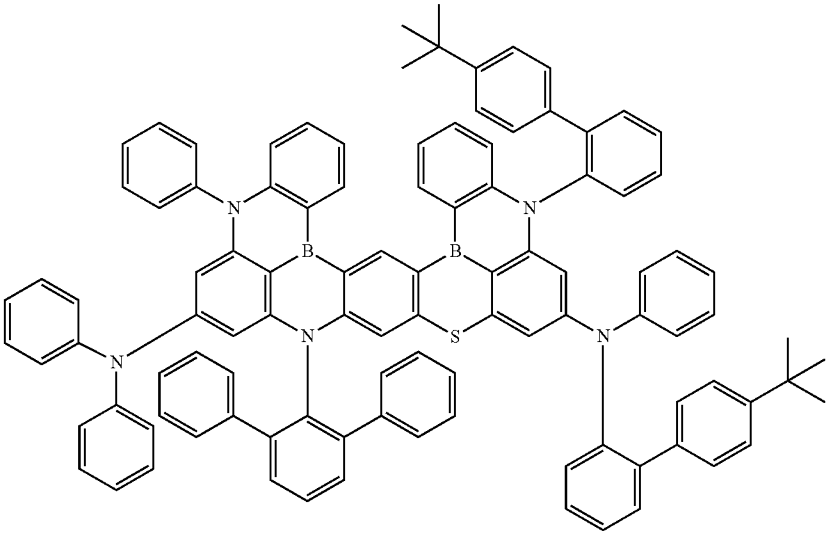
82
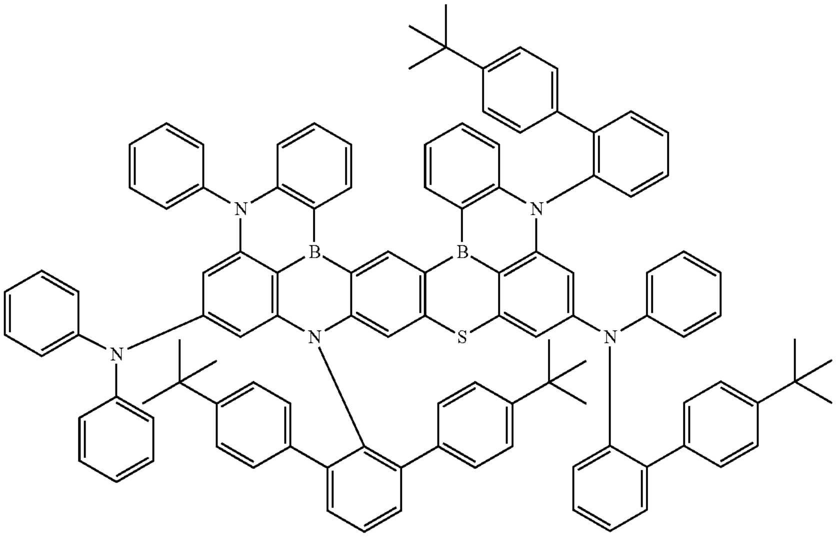
83
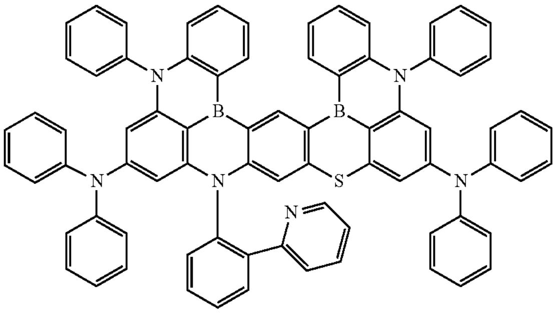
84
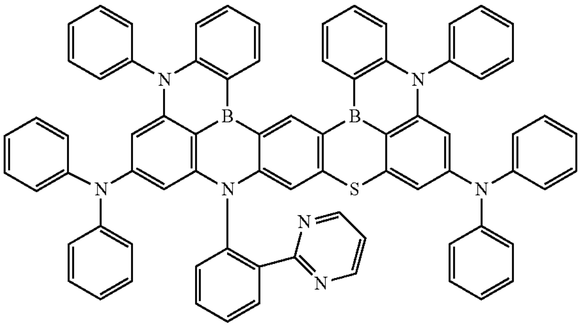

-continued
85
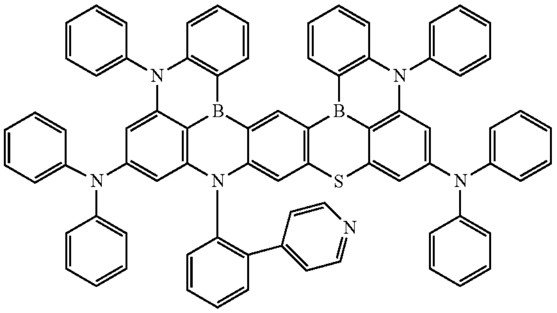
86
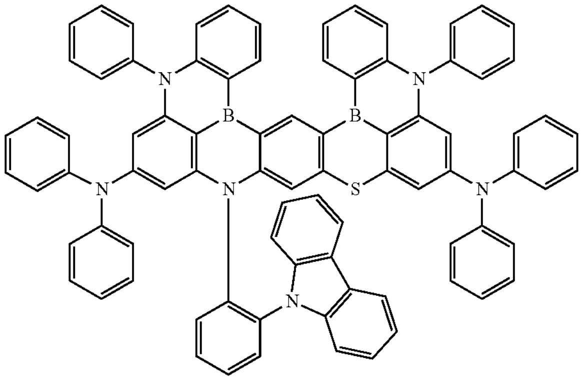
87
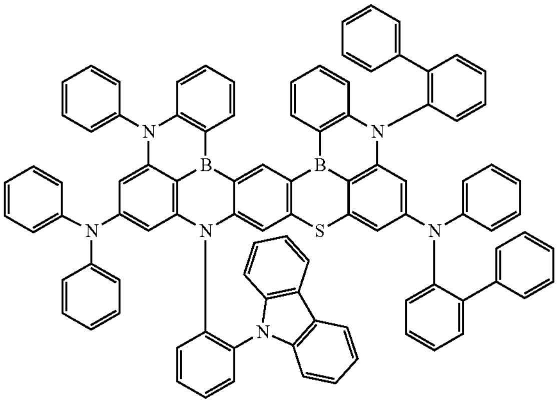
88
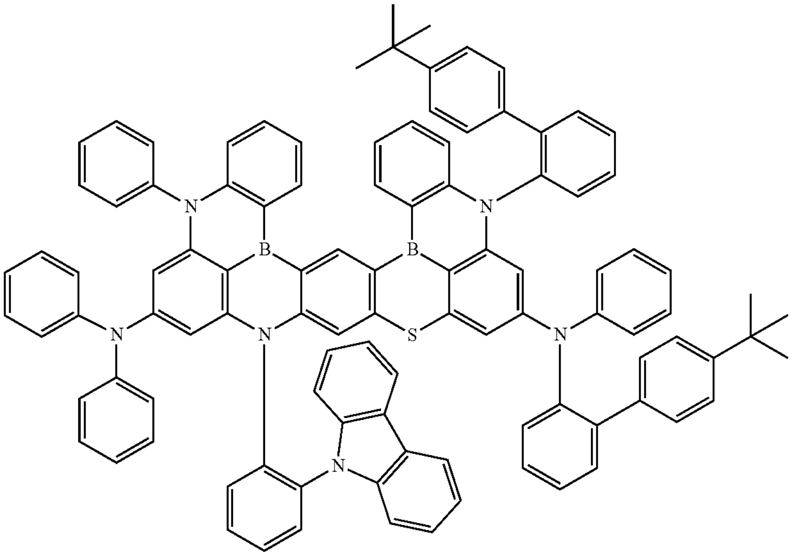

-continued
89
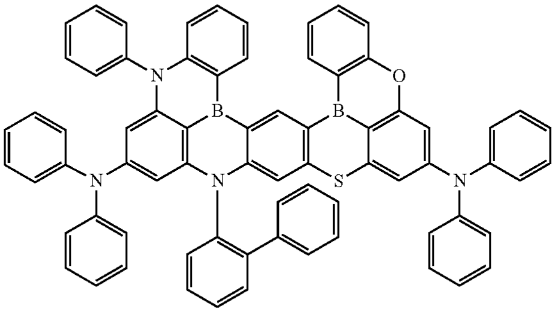
90
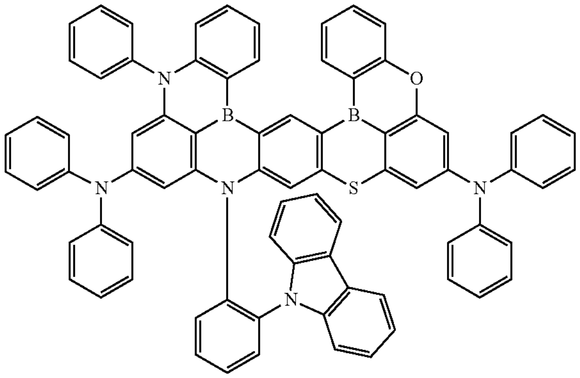
91
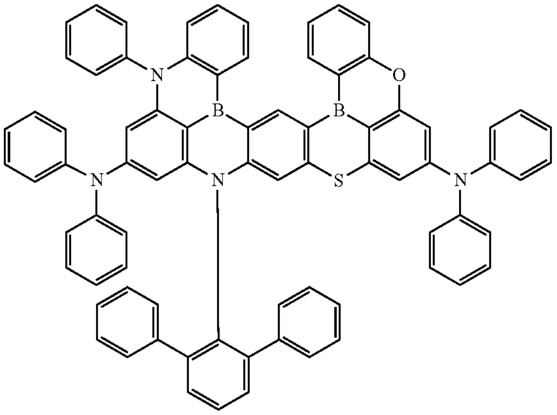
92
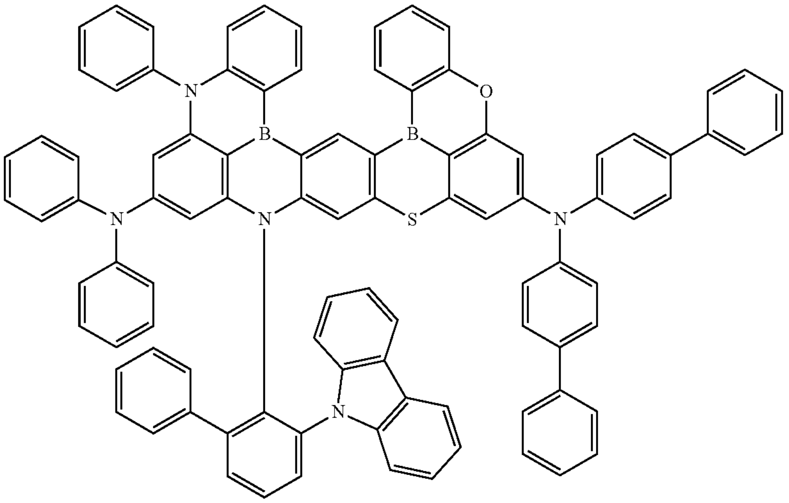

-continued
93
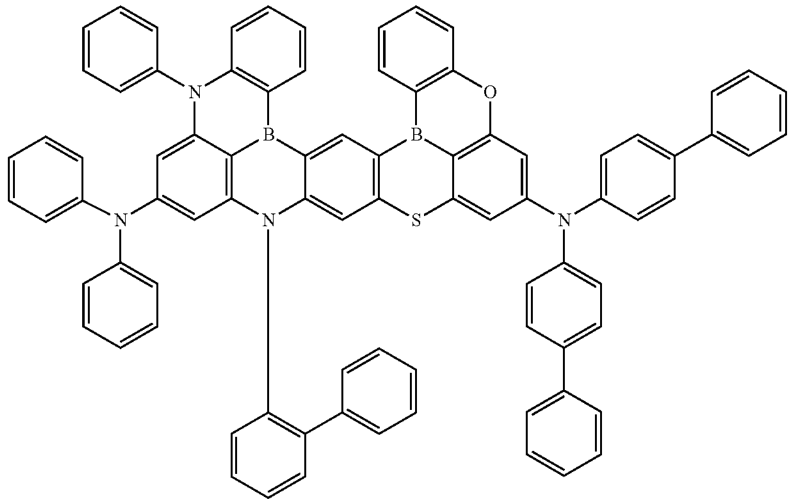
94
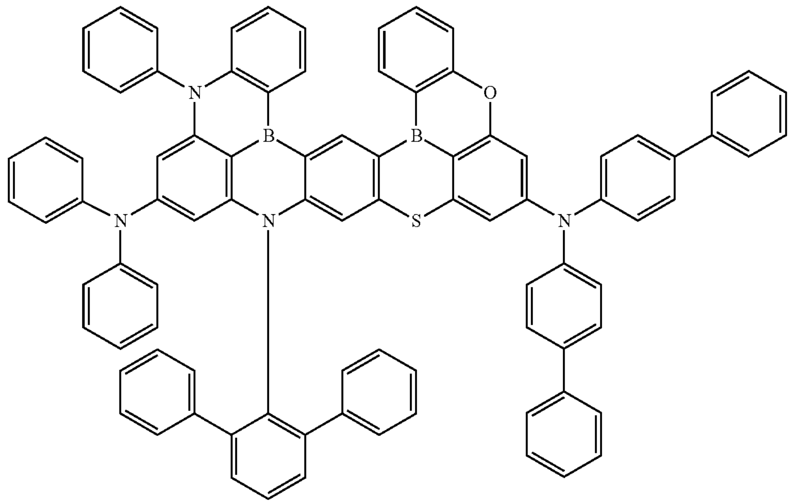
95
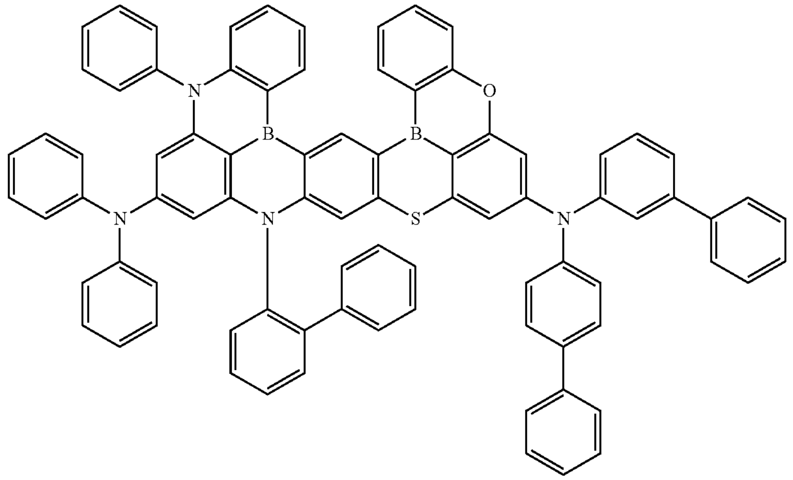

-continued
96
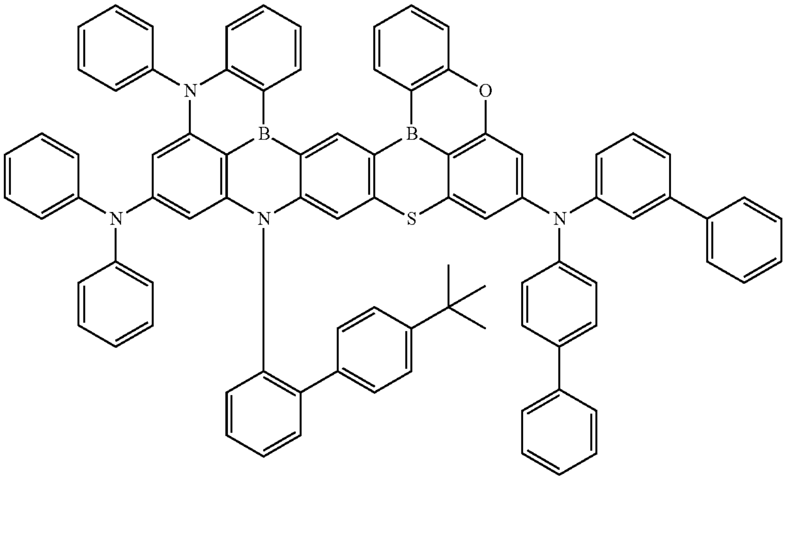
97
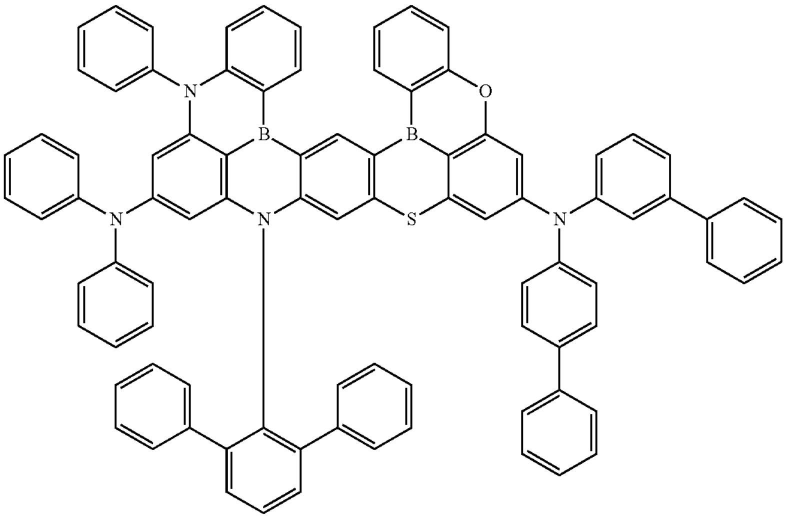
98
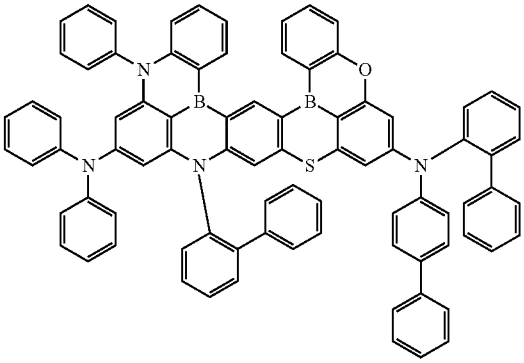
99
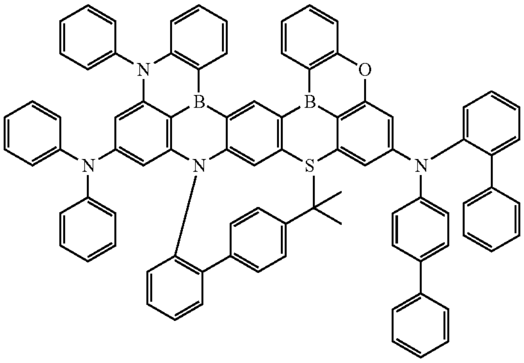

-continued
100
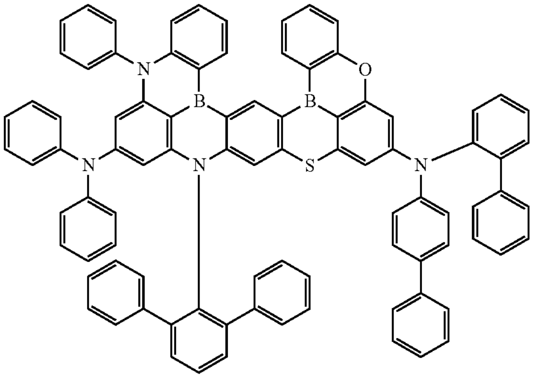
101
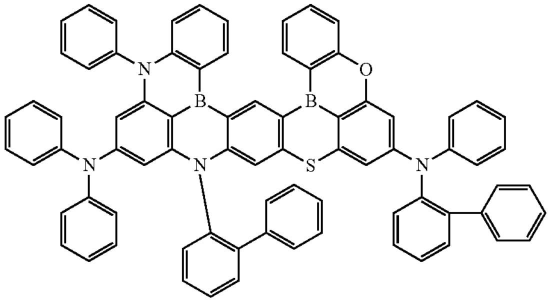
102
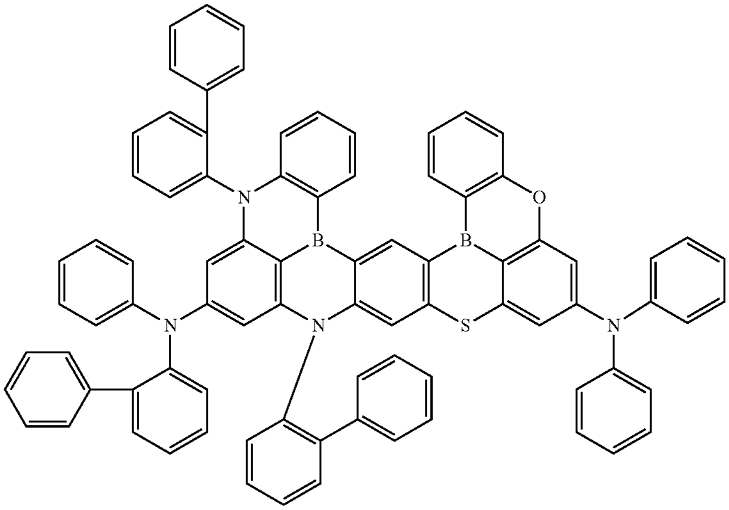
103
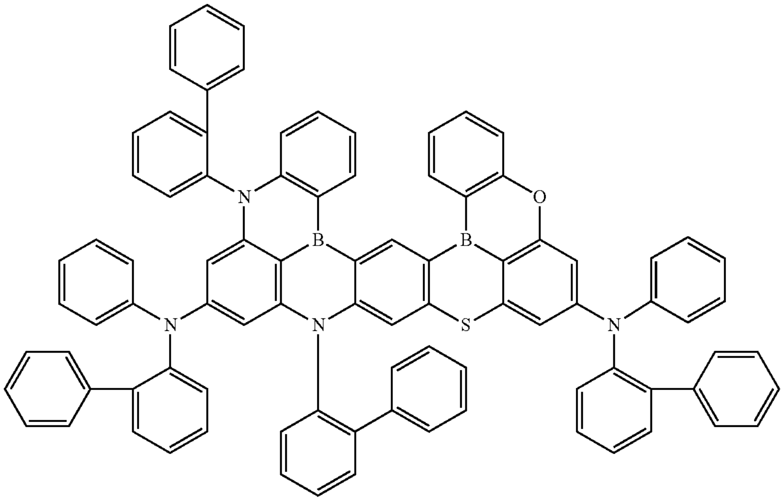

-continued
104
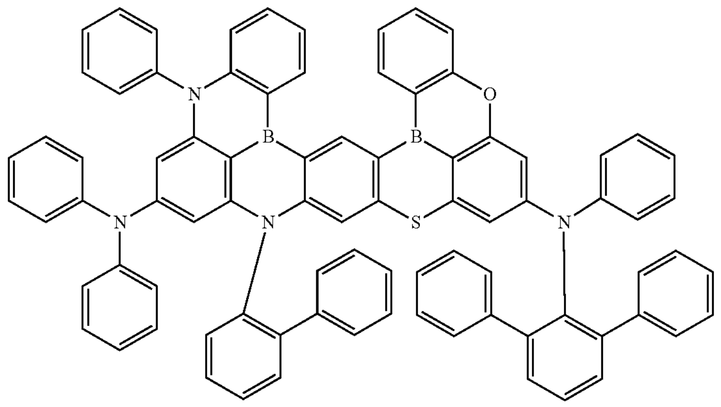
105
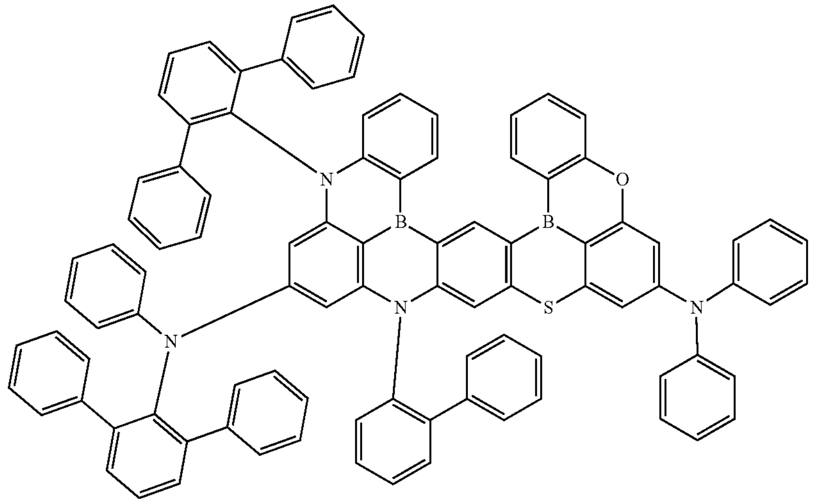
106
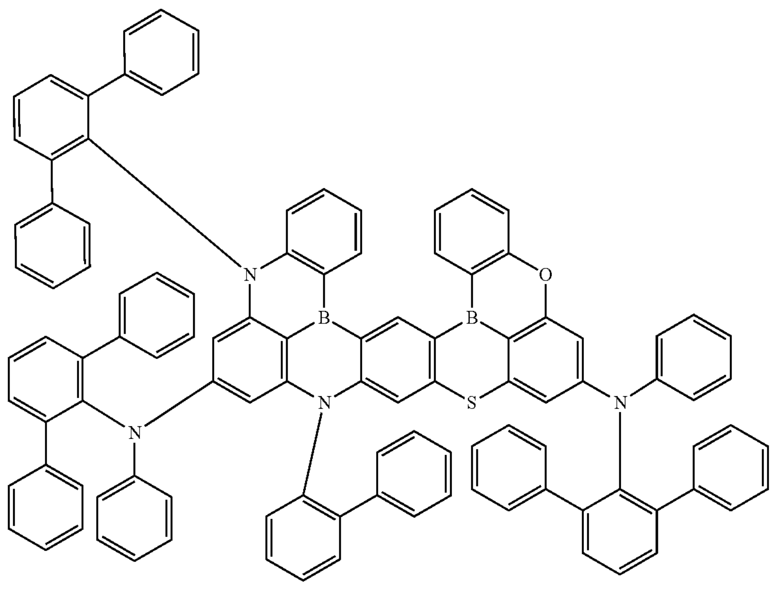

-continued
107
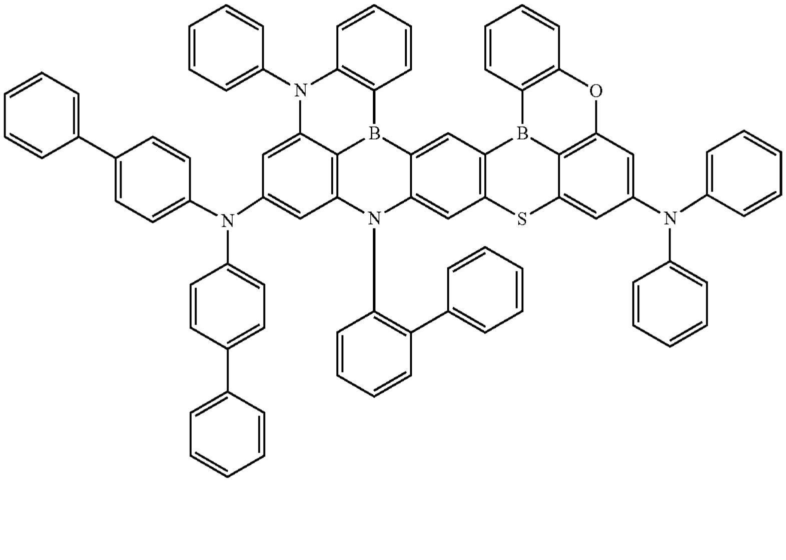
108
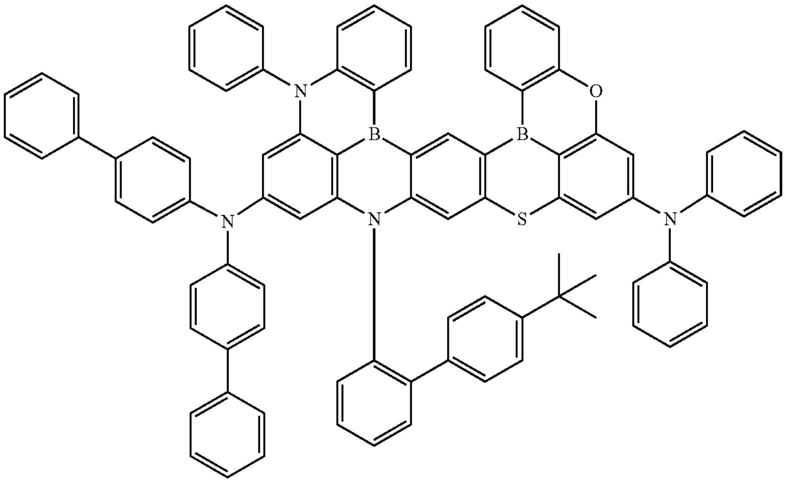
109
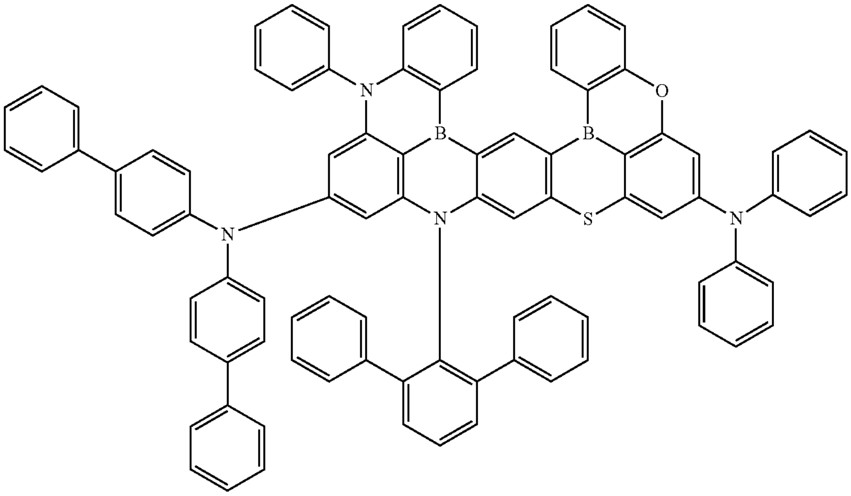

-continued
110
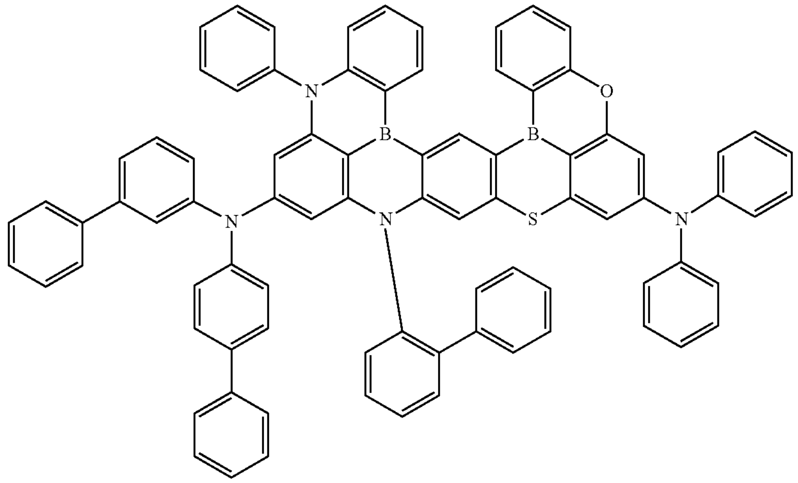
111
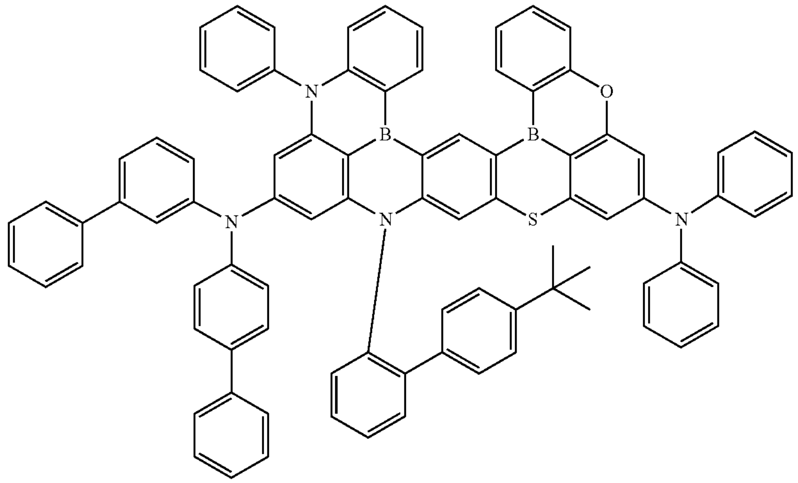
112
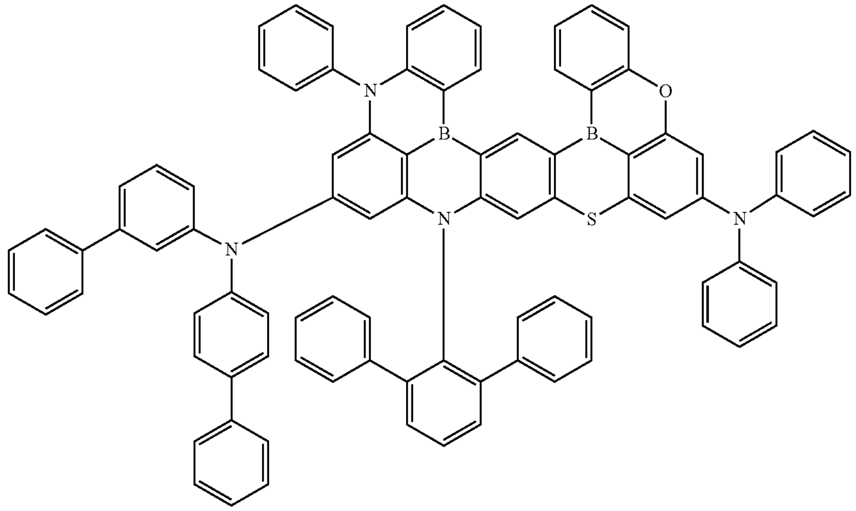

-continued
113
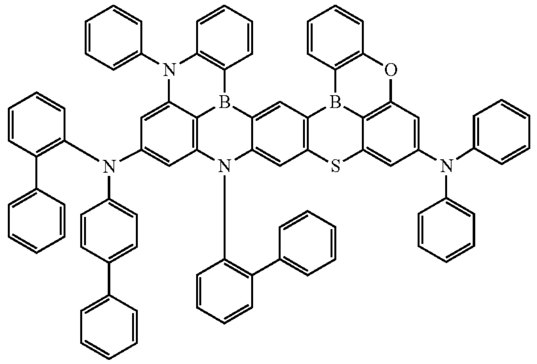
114
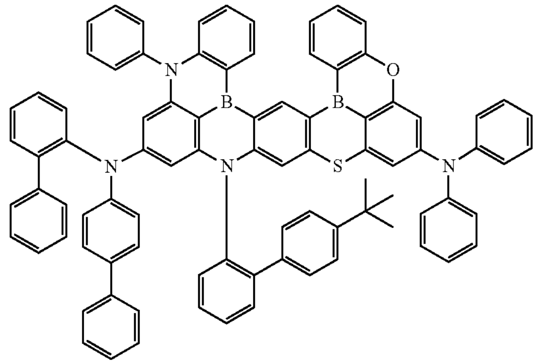
115
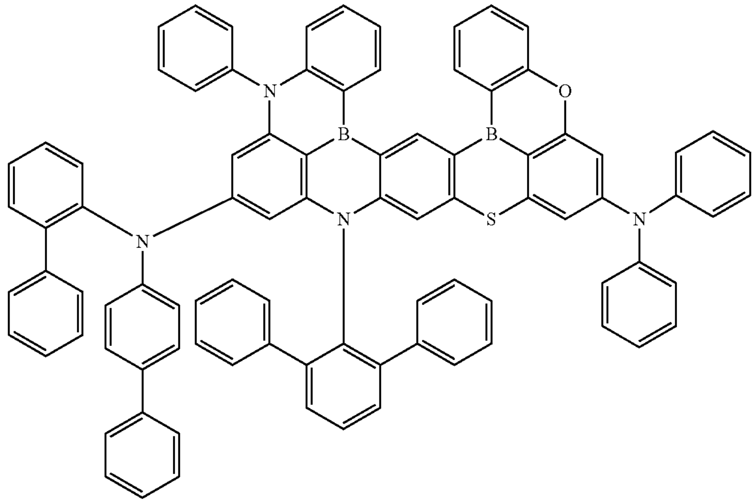
116
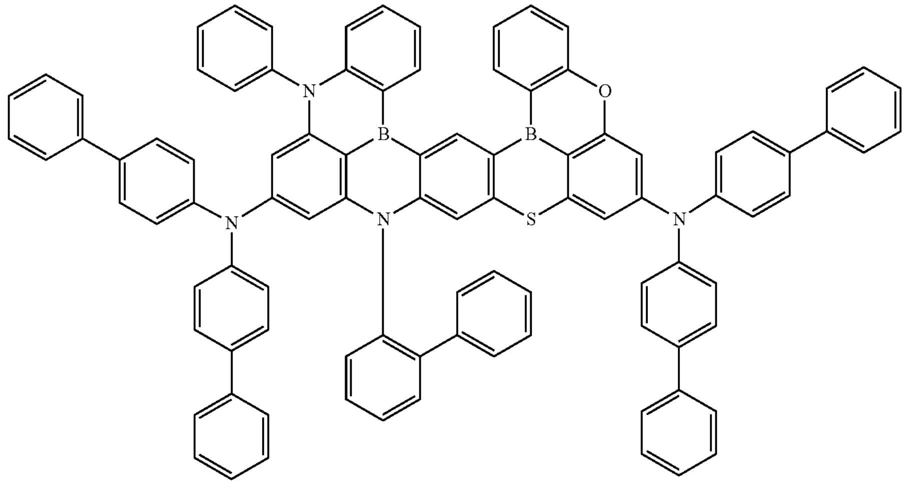

-continued
117
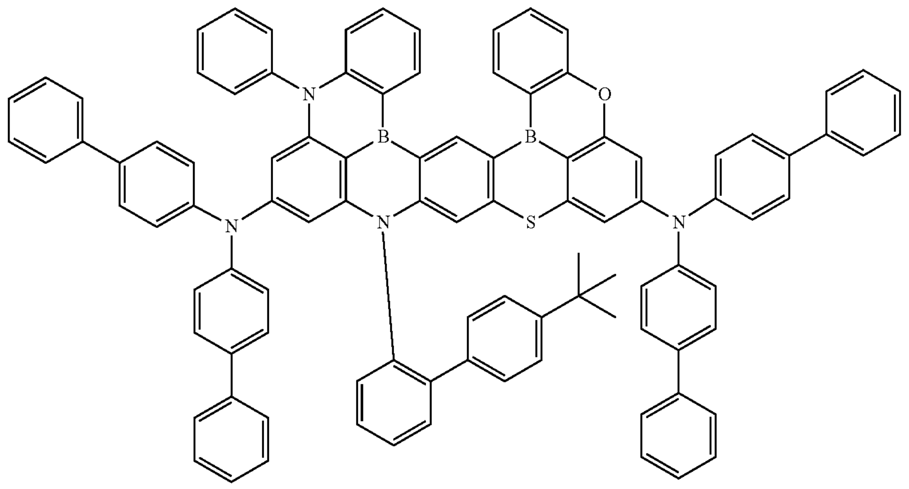
118
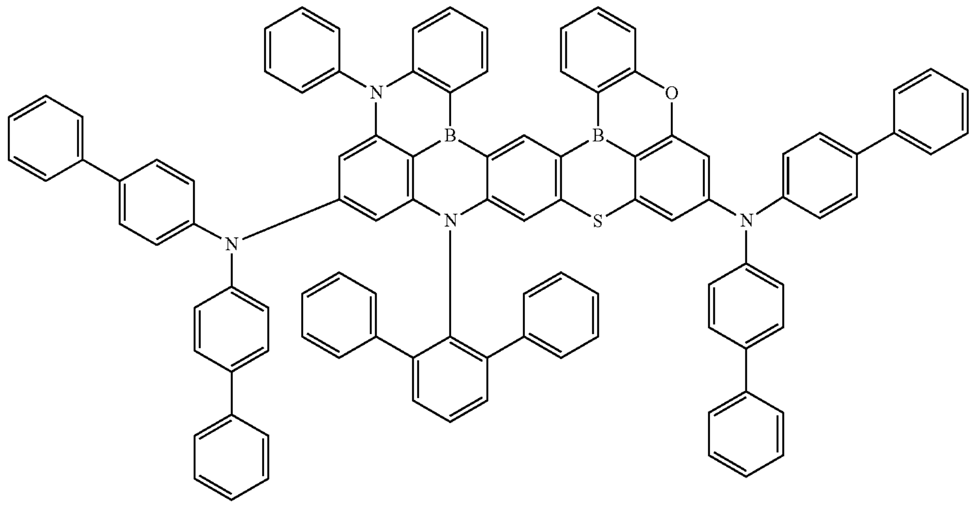
119
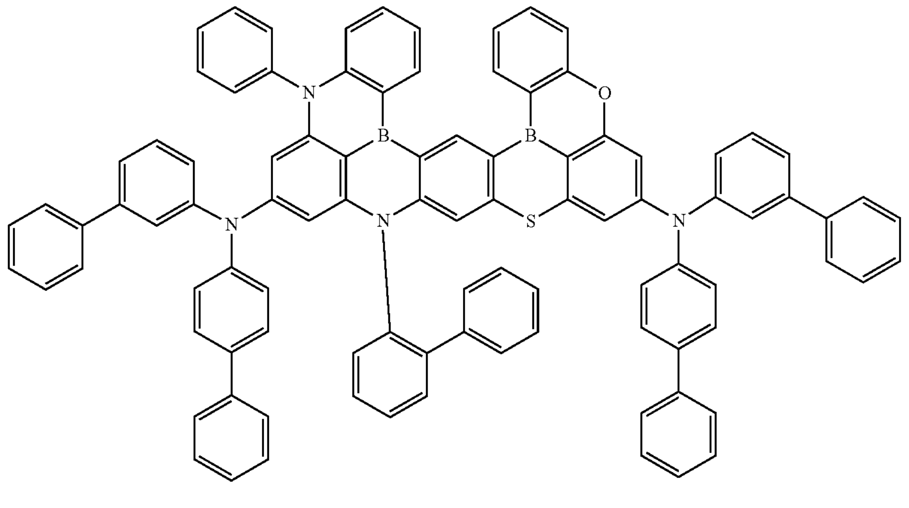

-continued
120
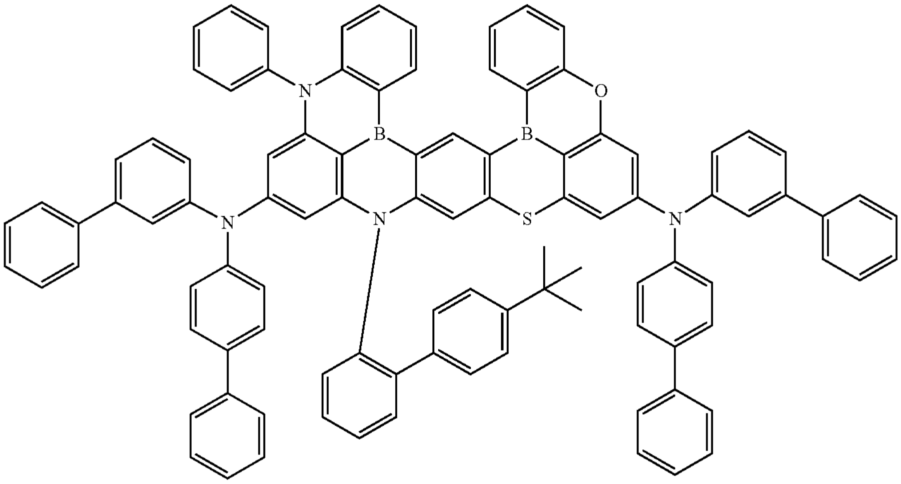
121
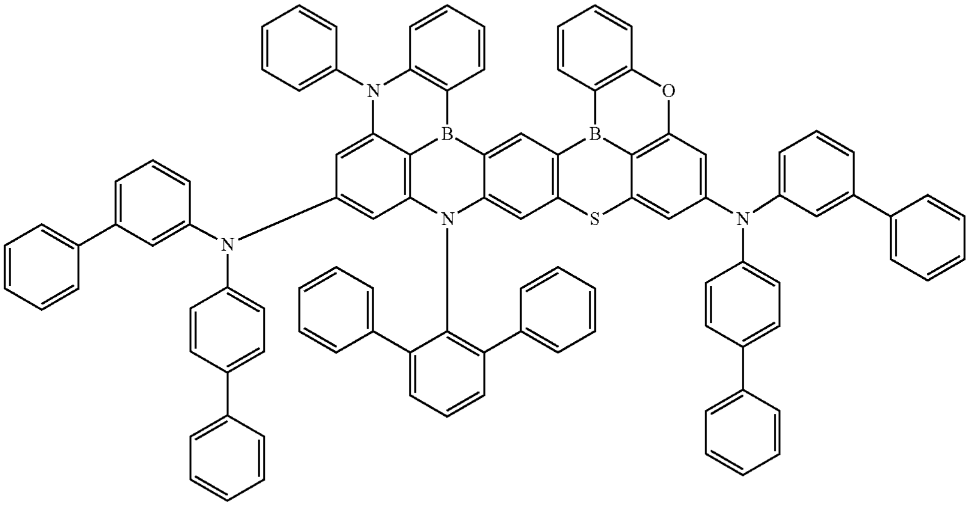
122
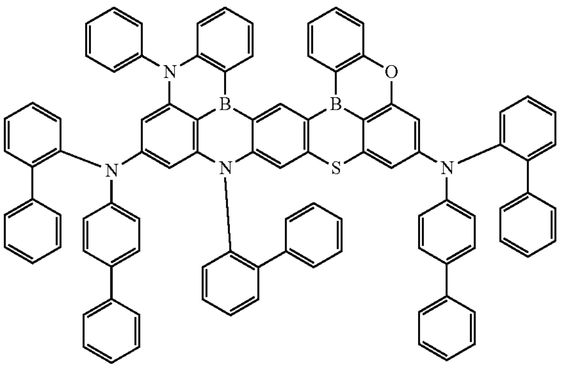
123
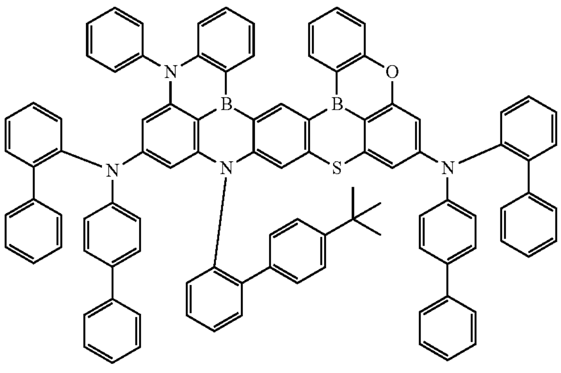

-continued
124
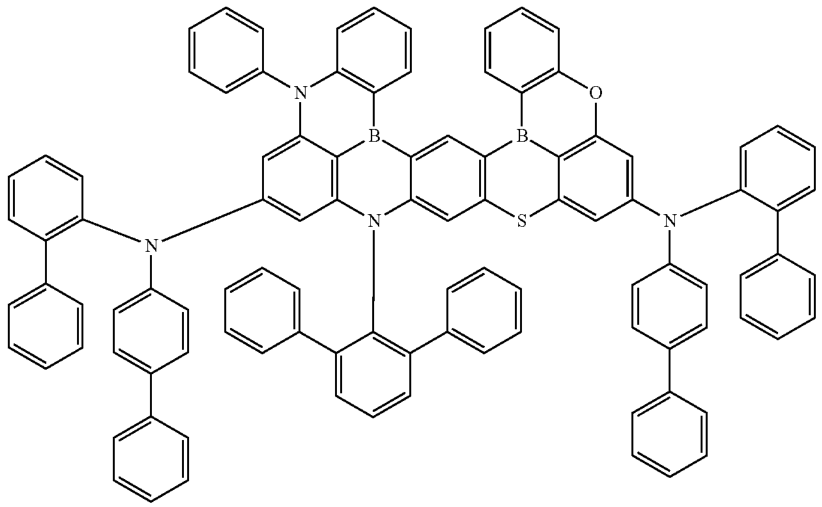
125
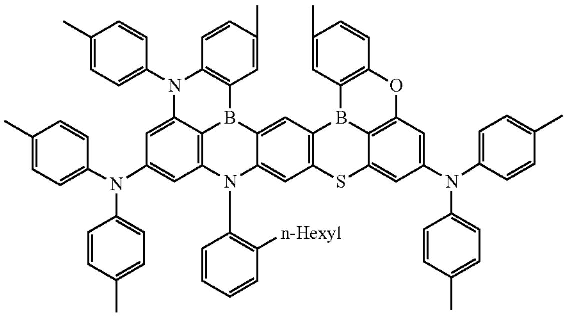
126
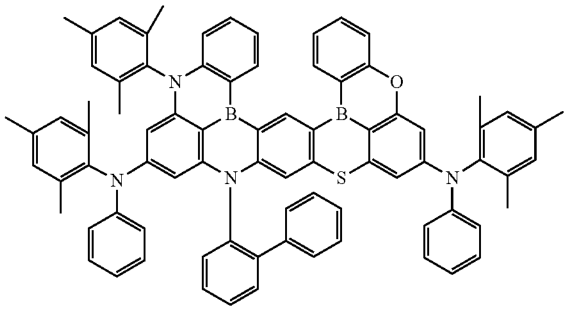
127
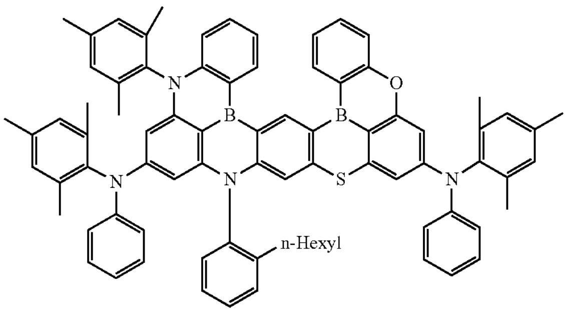
128
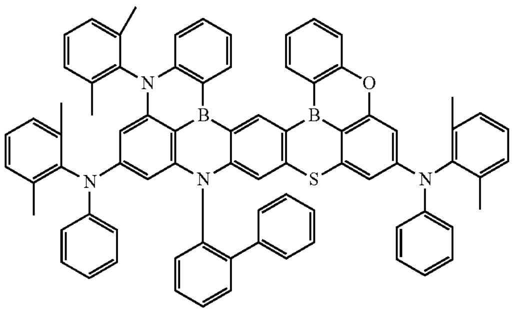
129
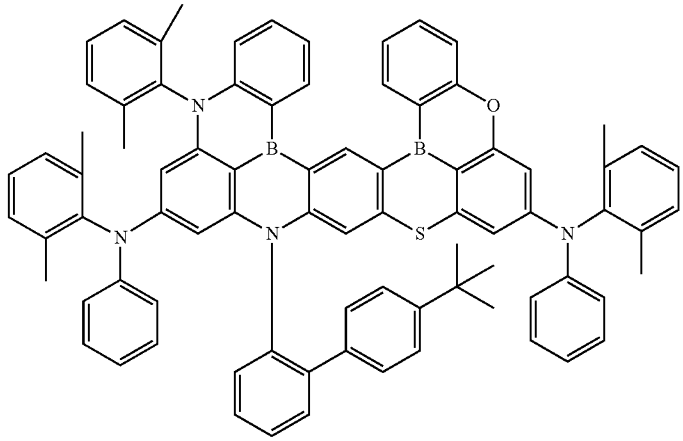

-continued
130
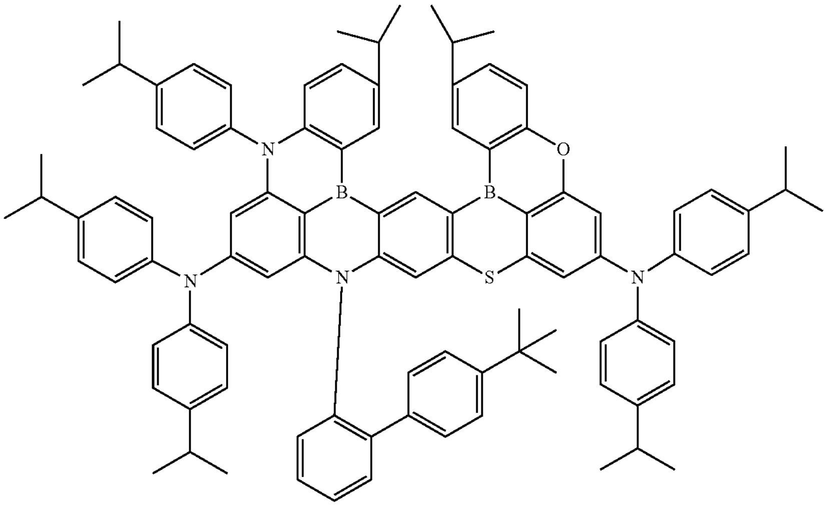
131
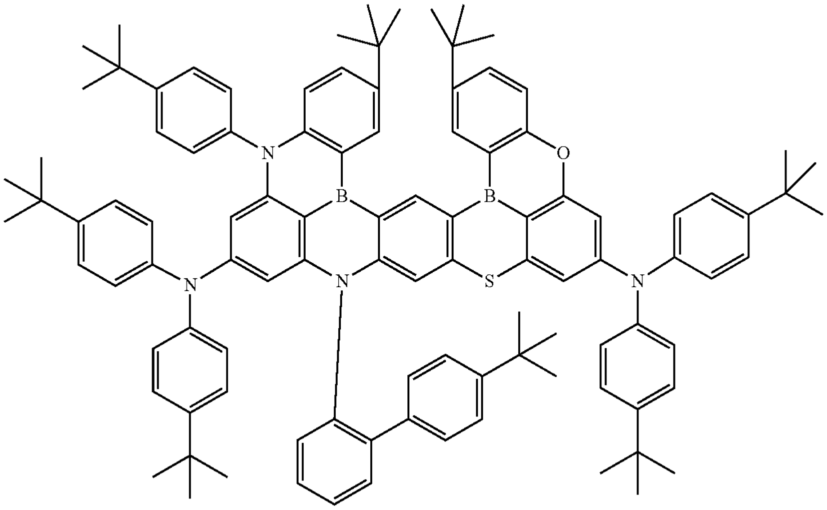
132
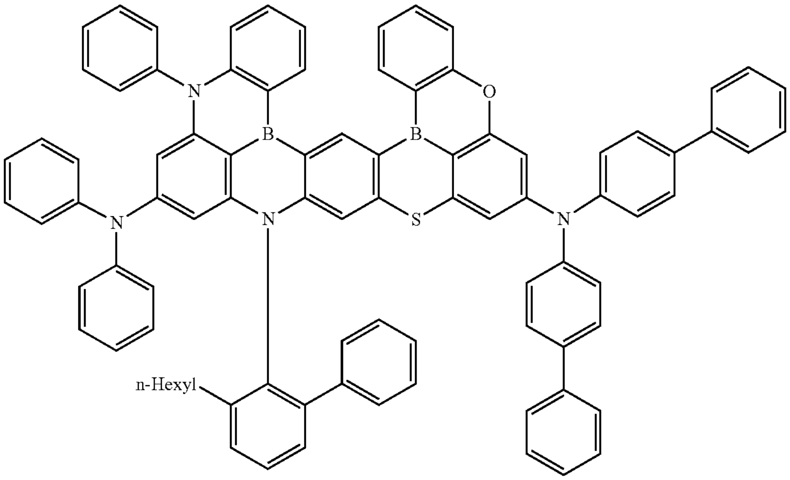
n-Hexyl

-continued
133
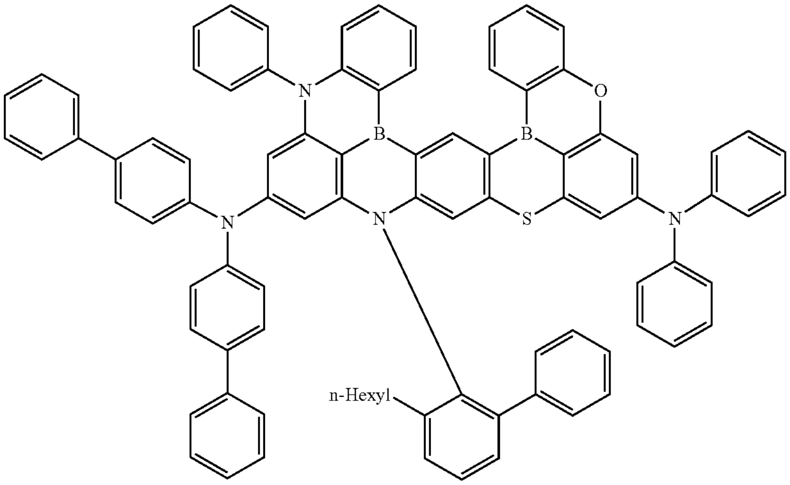
134
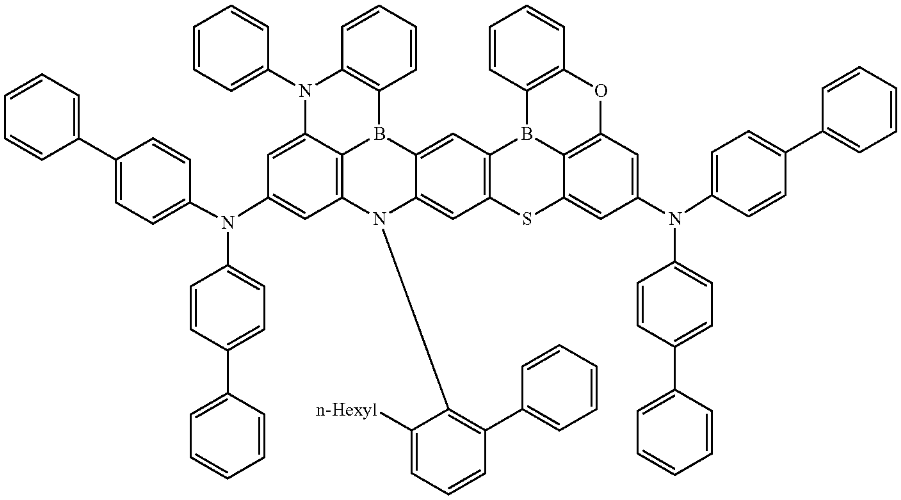
135
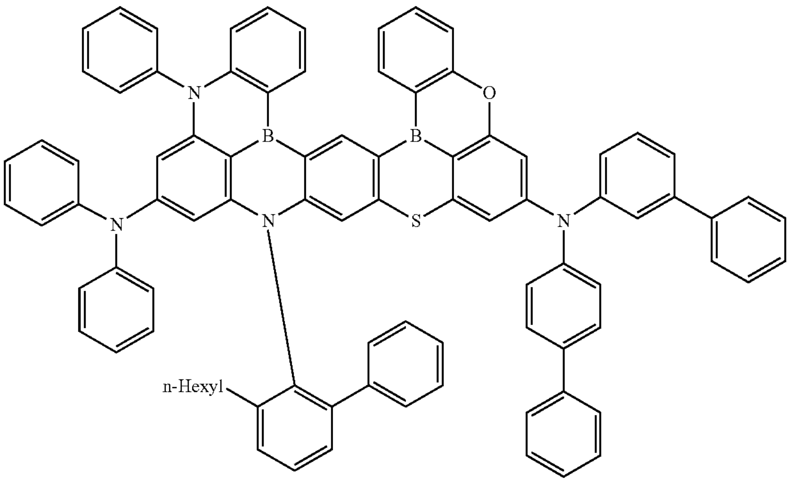

-continued
136
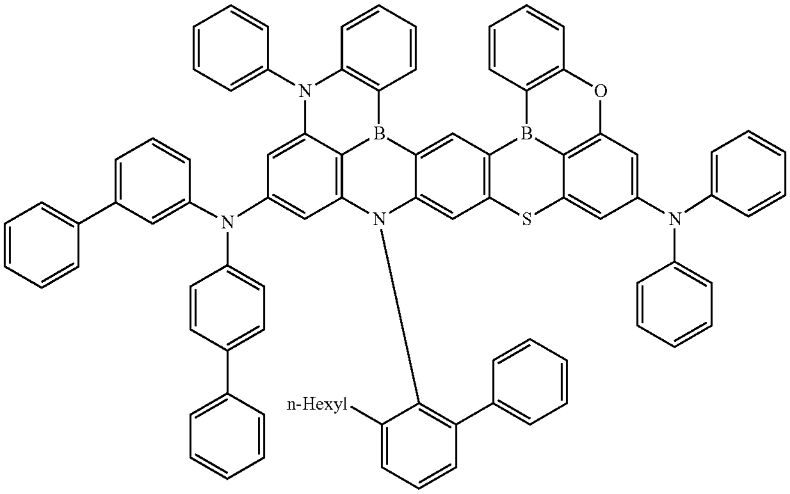
137
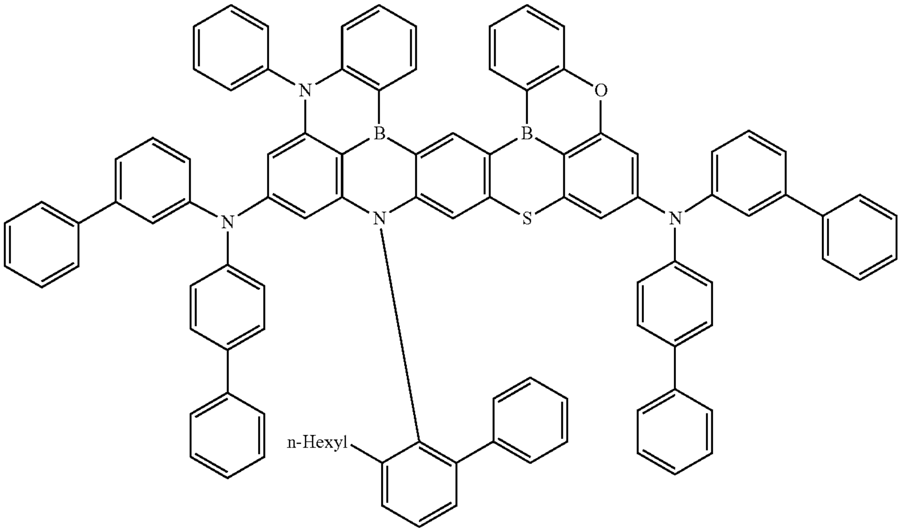
138
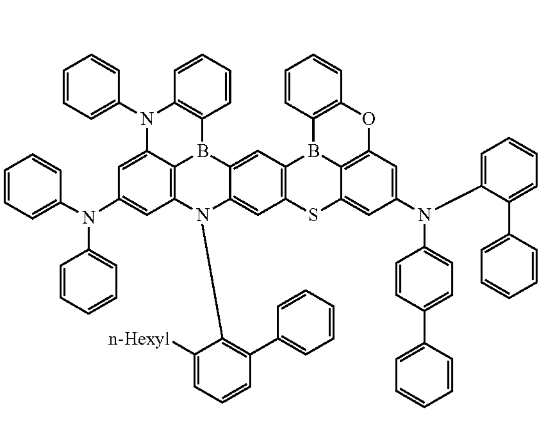
139
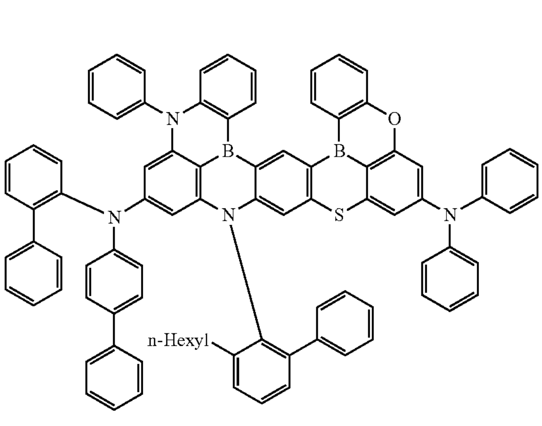

-continued
140
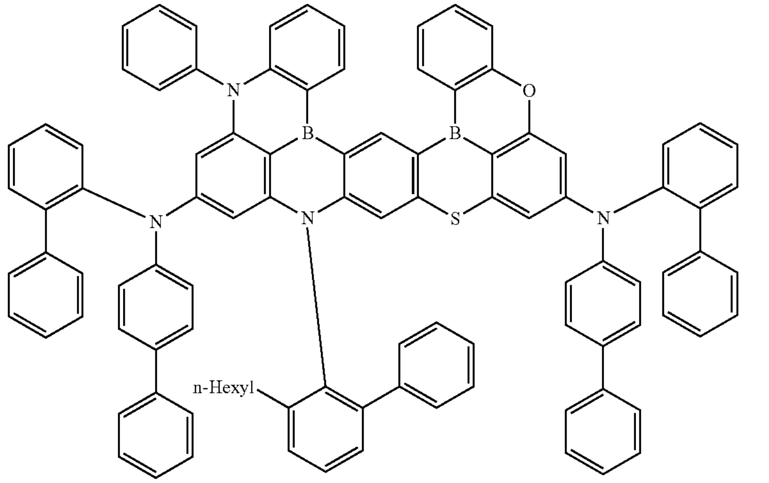
141
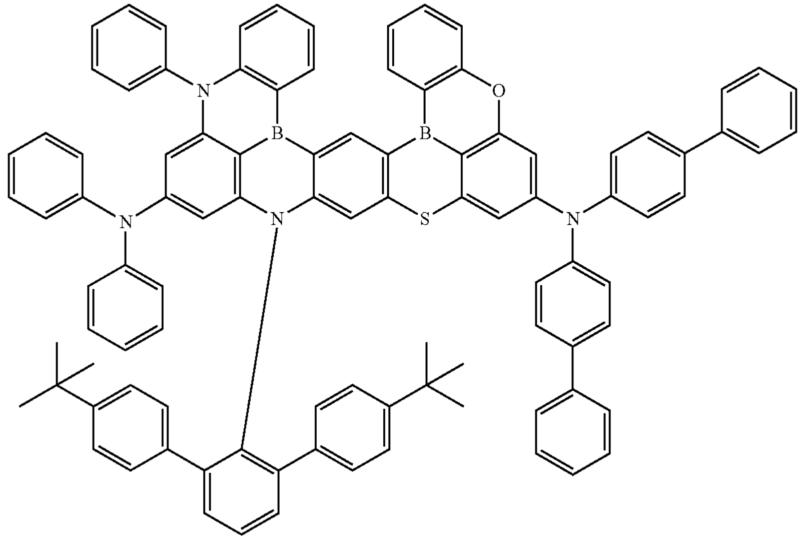
142
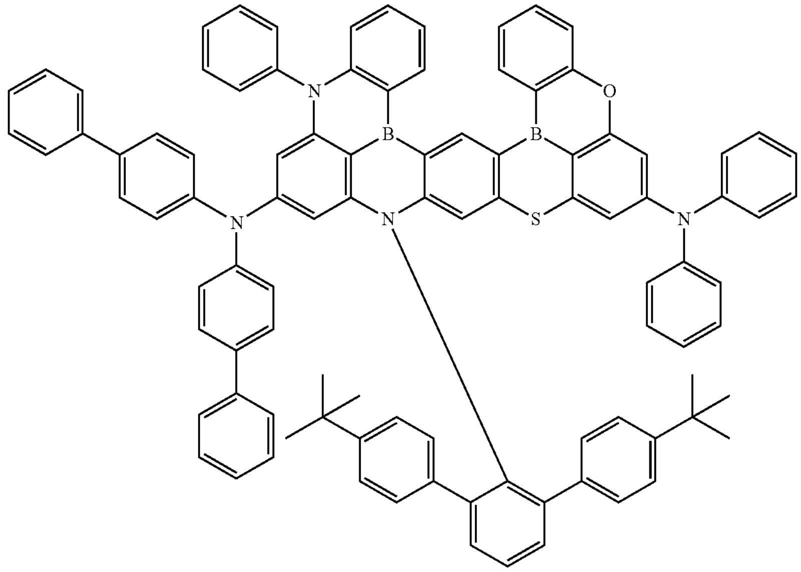

-continued
143
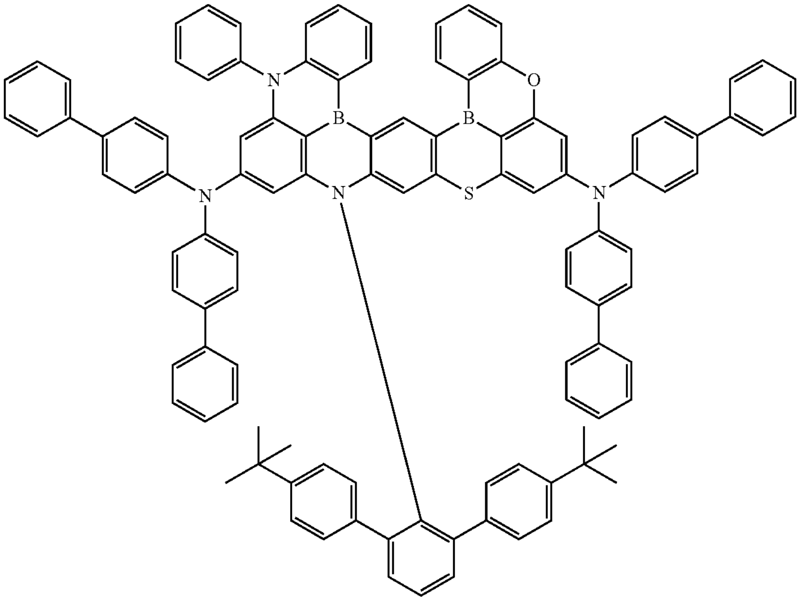
144
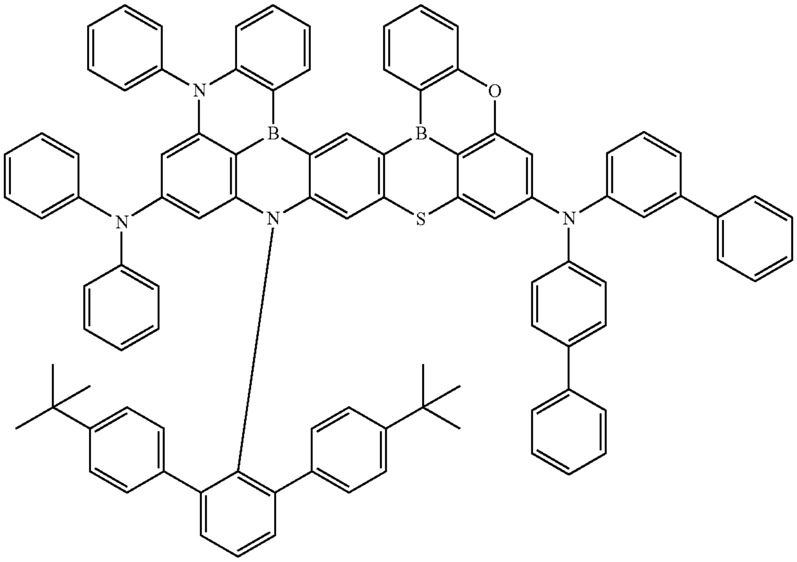

-continued
145
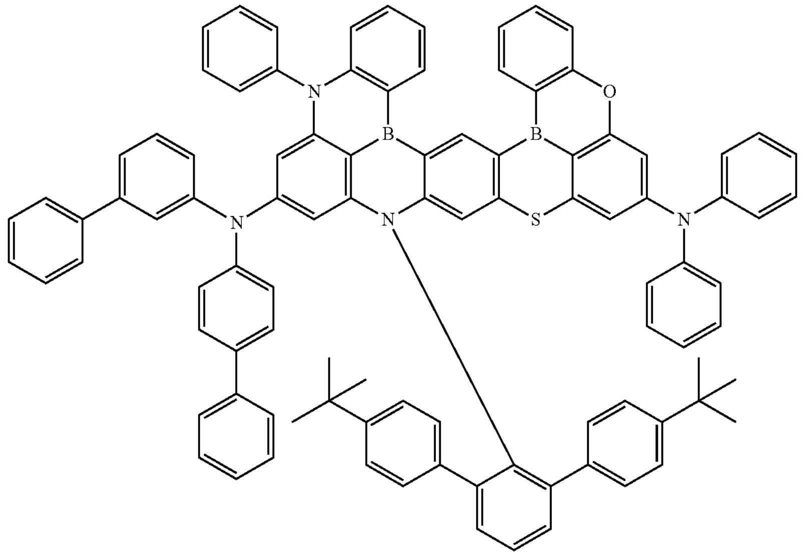
146
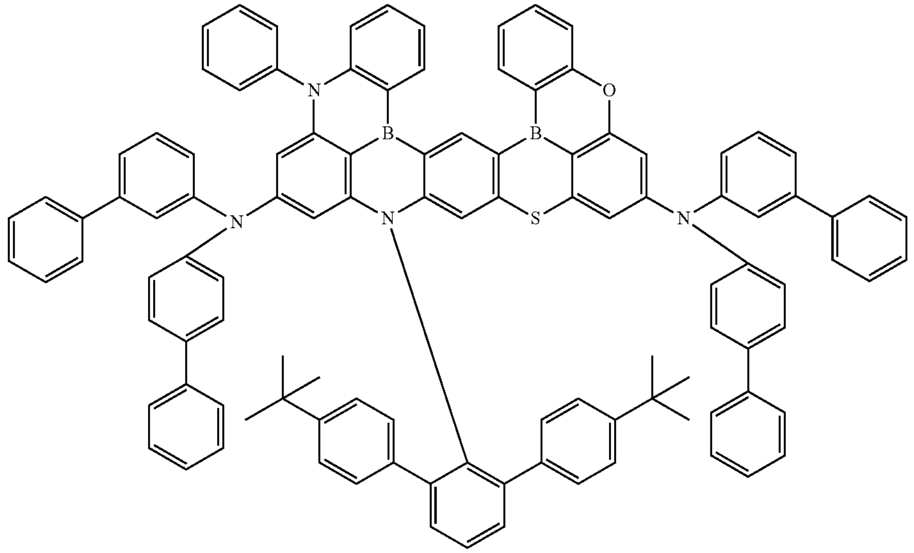
147
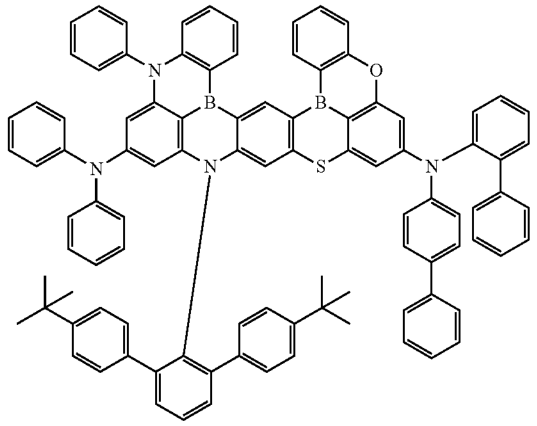
148
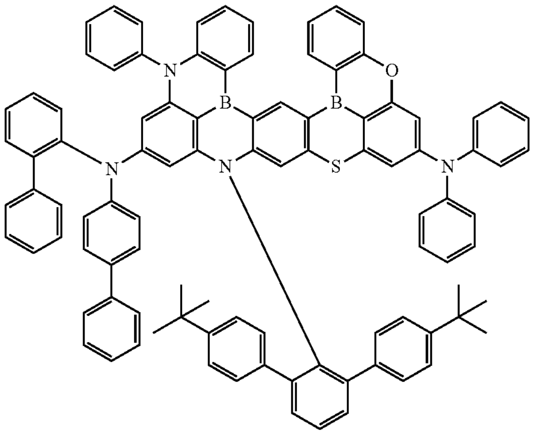

-continued
149
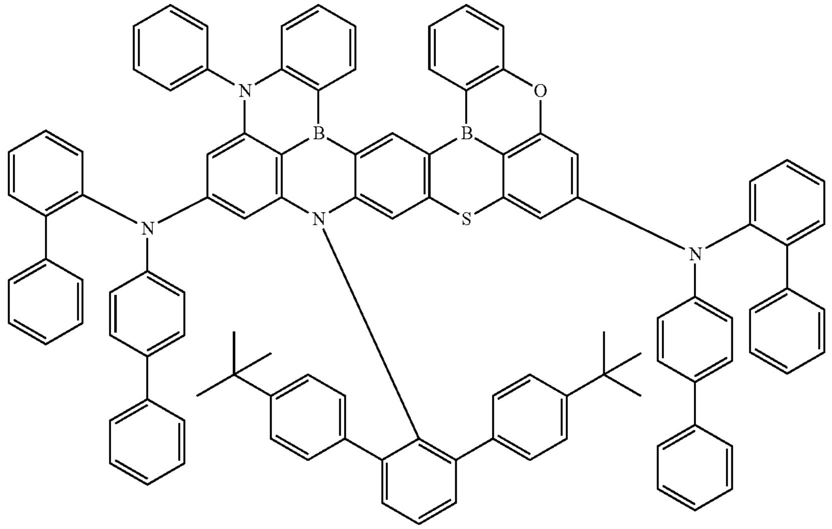
150
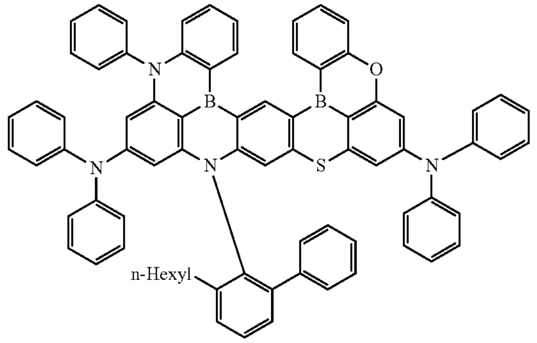
151
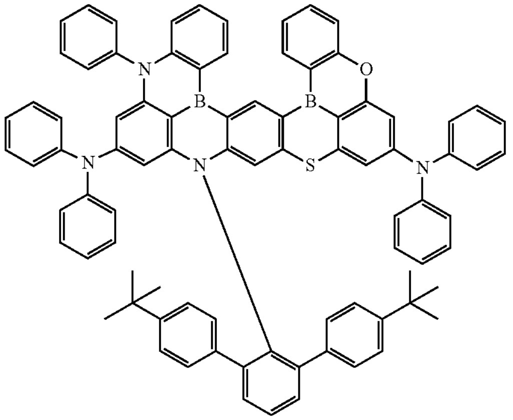
152
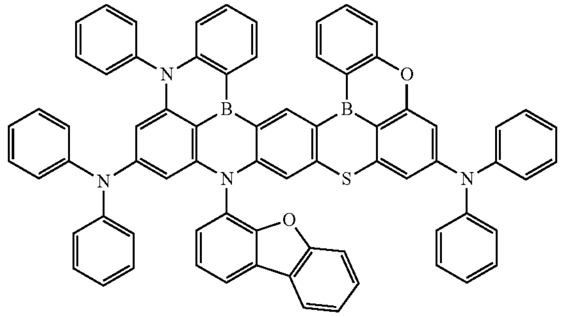
153
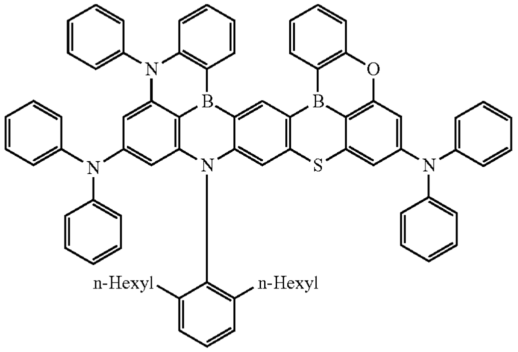

-continued
154
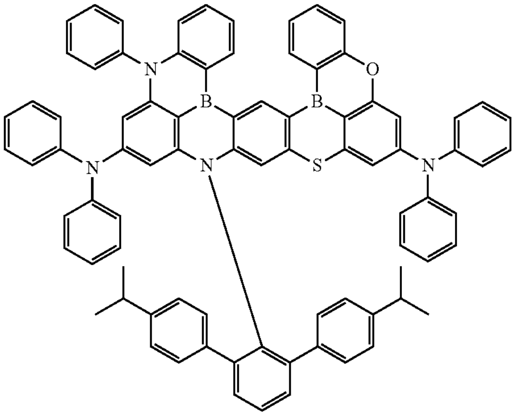
155
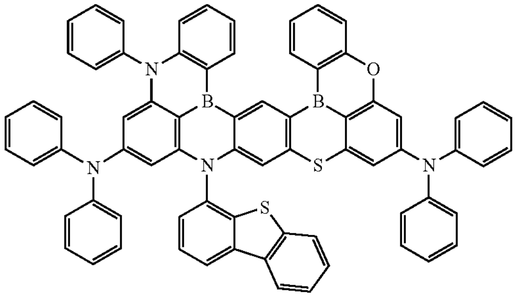
156
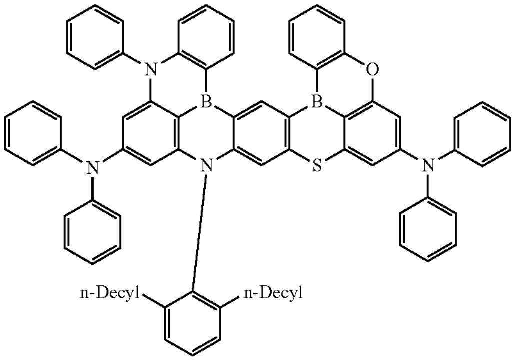
n-Decyl n-Decyl
157
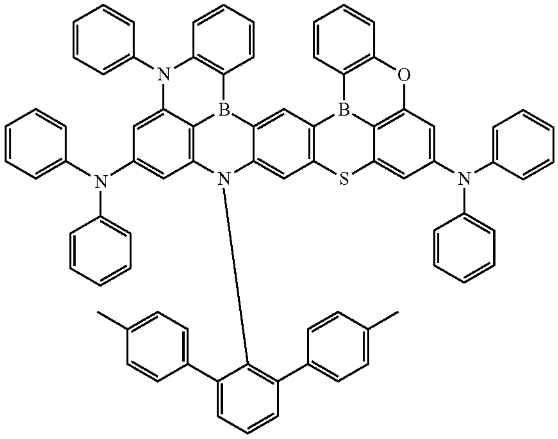
158
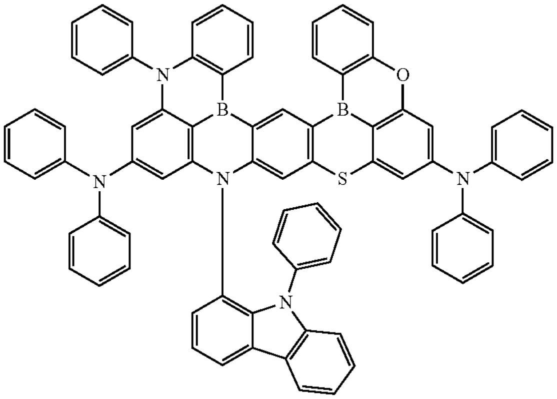
159
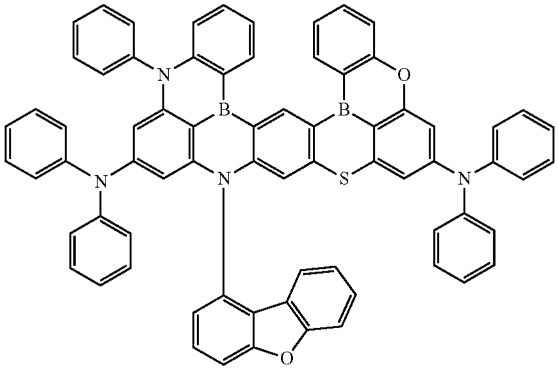

-continued
160
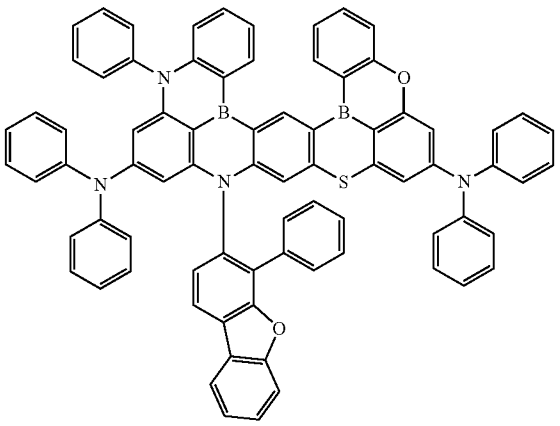
161
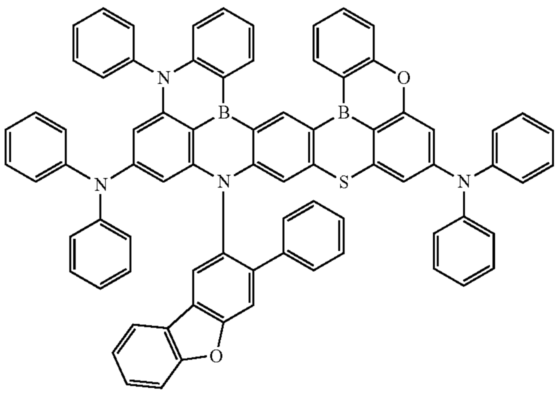
162
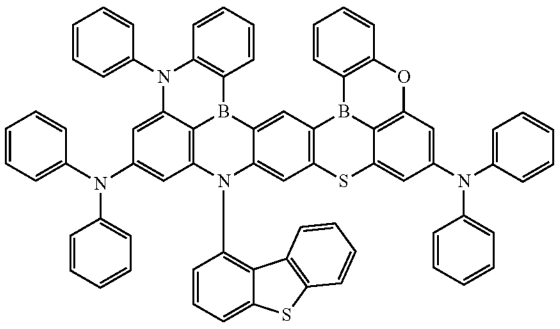
163
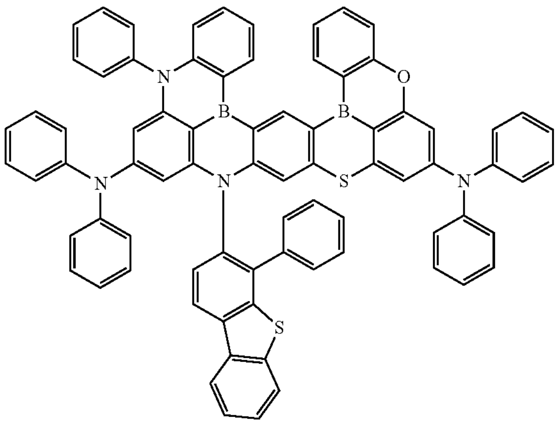
164
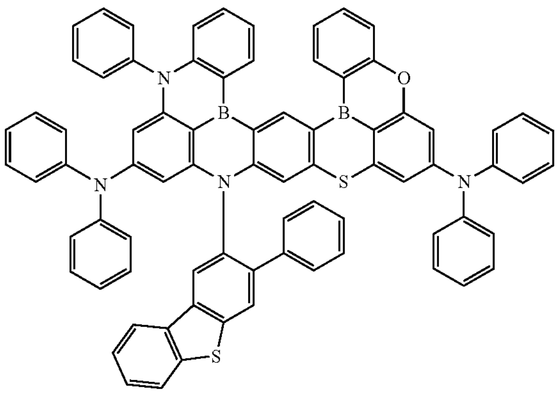
165
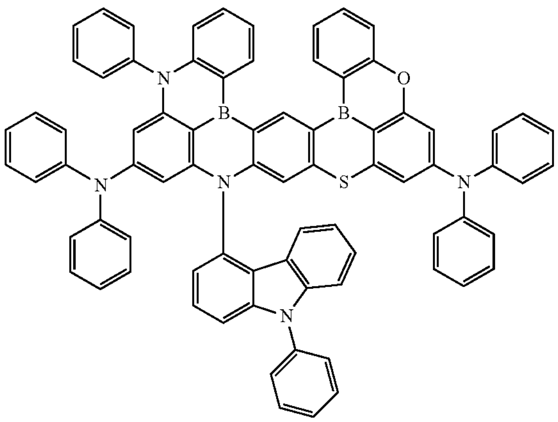

-continued
166
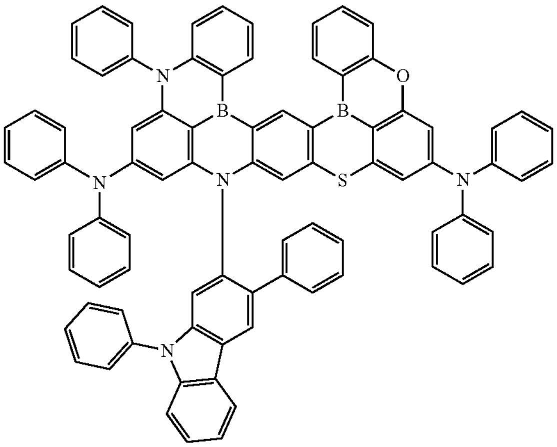
167
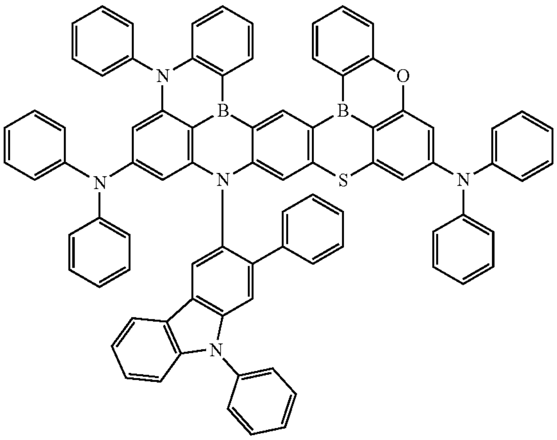
168
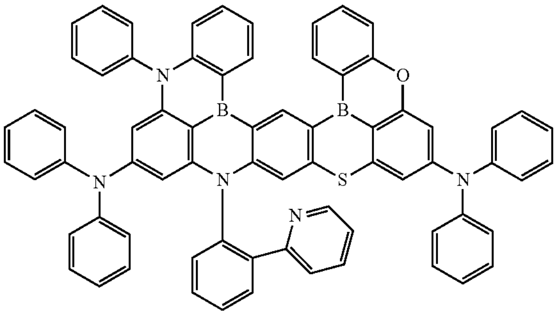
169
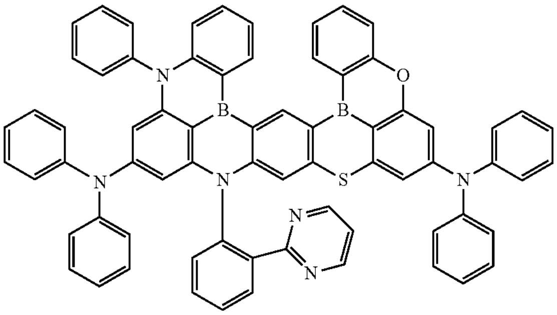
170
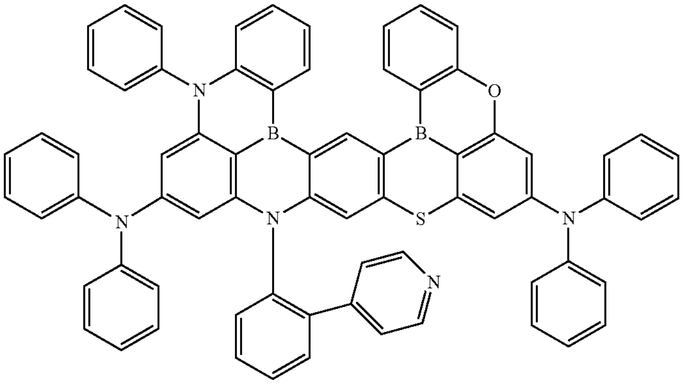

-continued
171
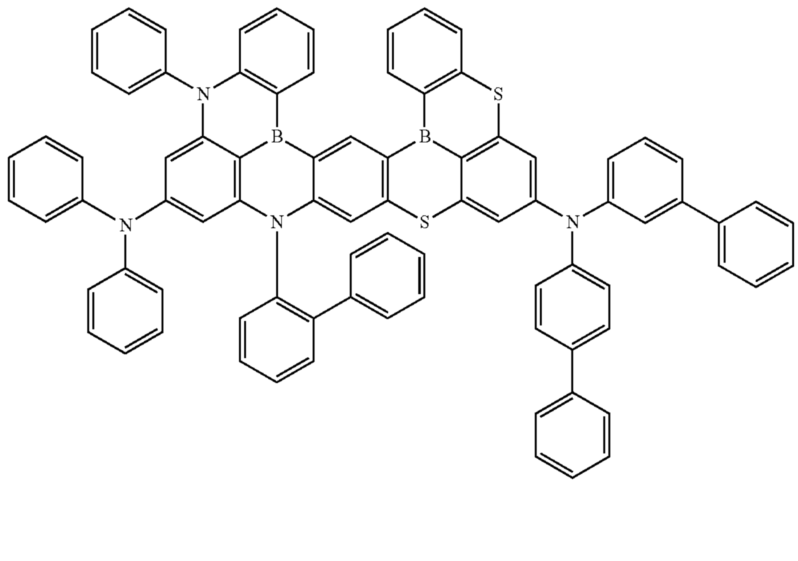
172
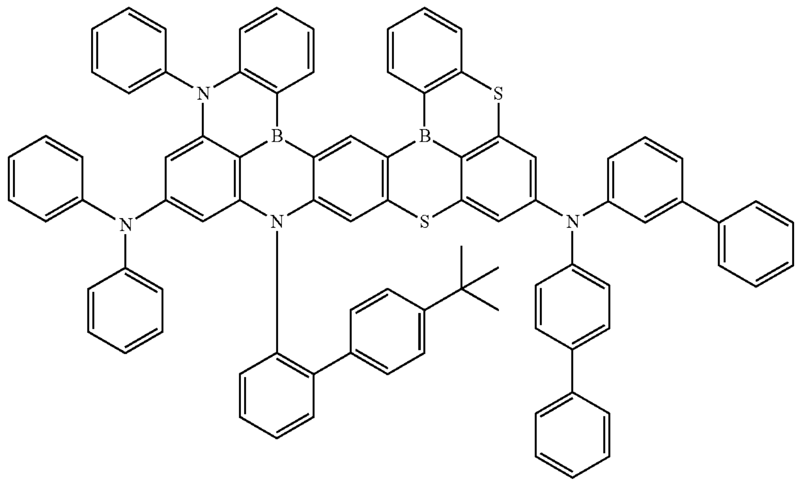
173
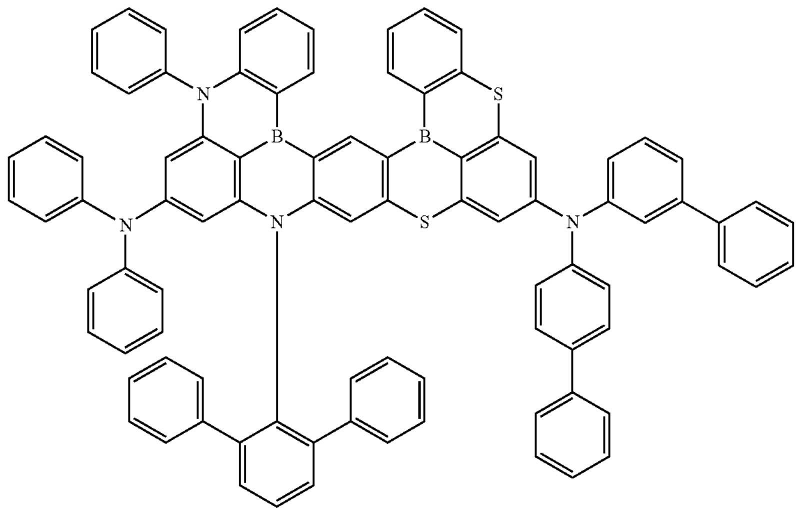

-continued
174
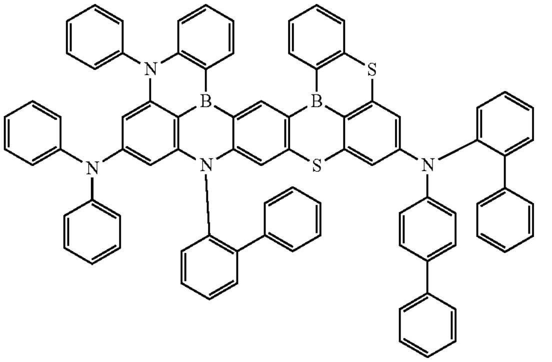
175
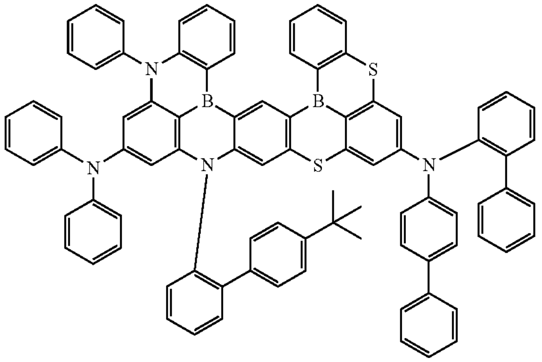
176
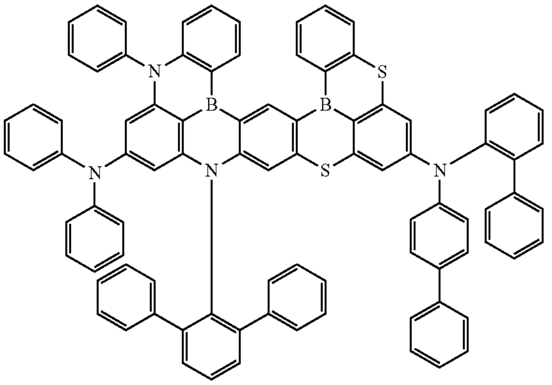
177
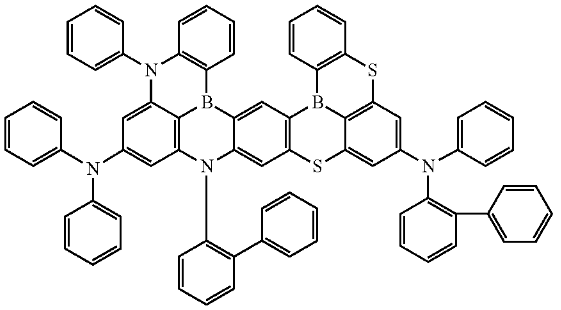
178
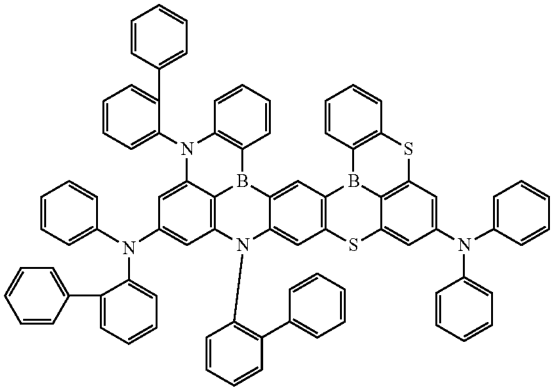
179
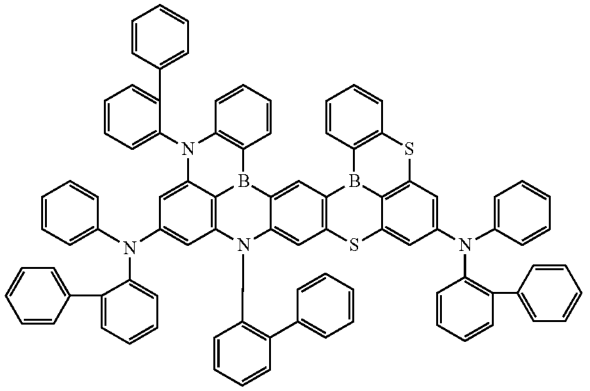
180
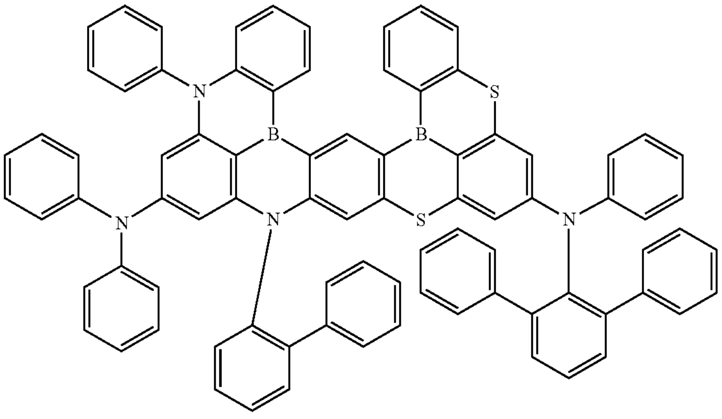

-continued
181
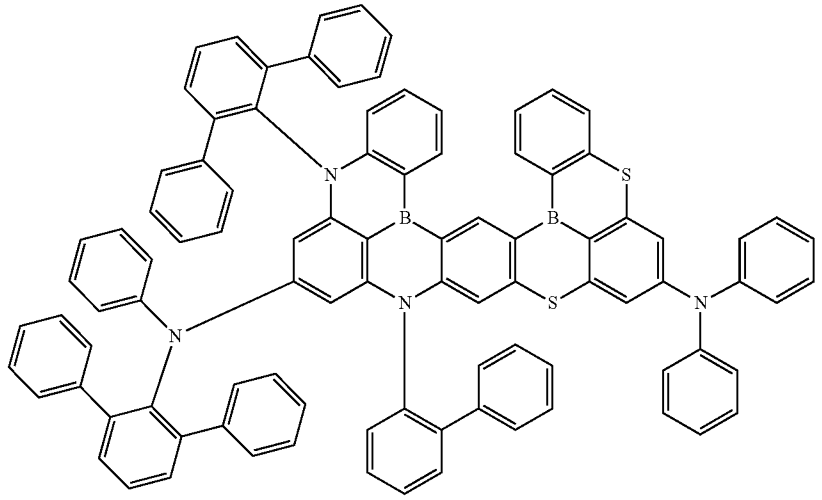
182
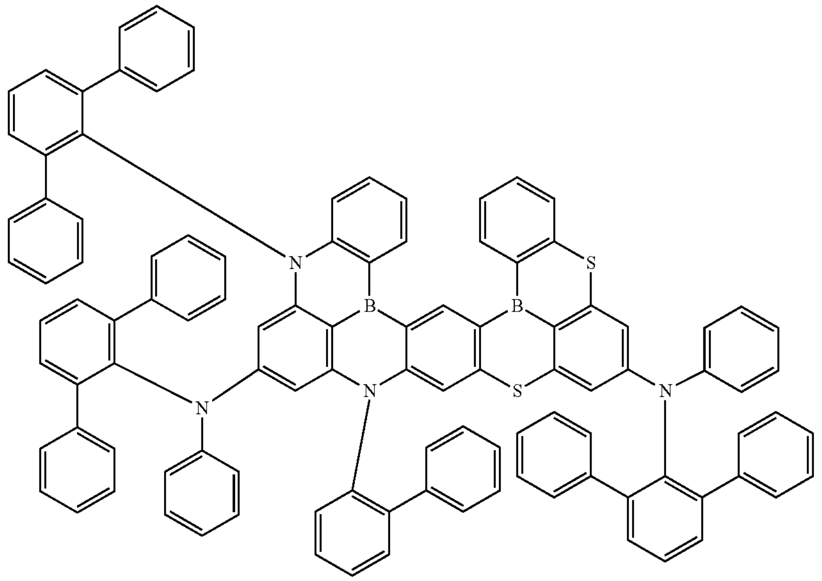
183
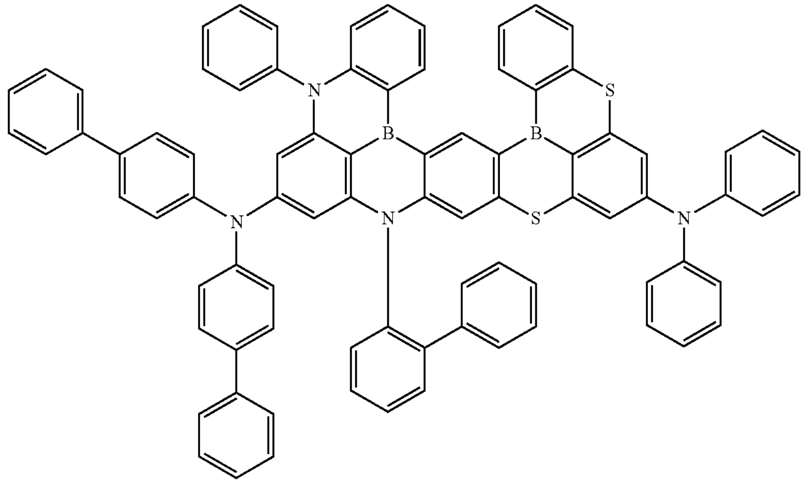

-continued
184
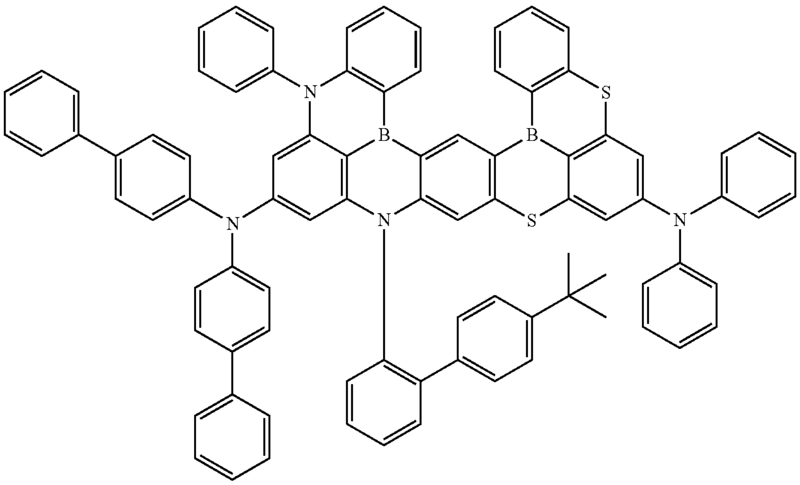
185
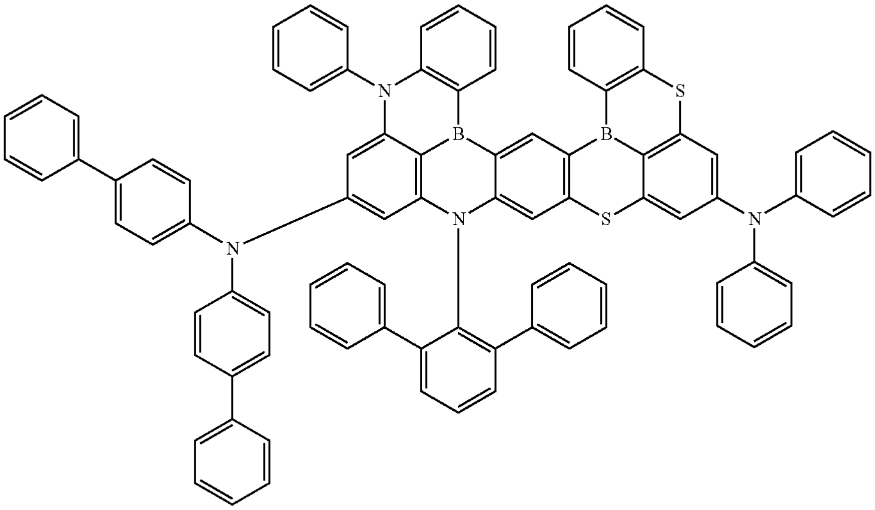
186
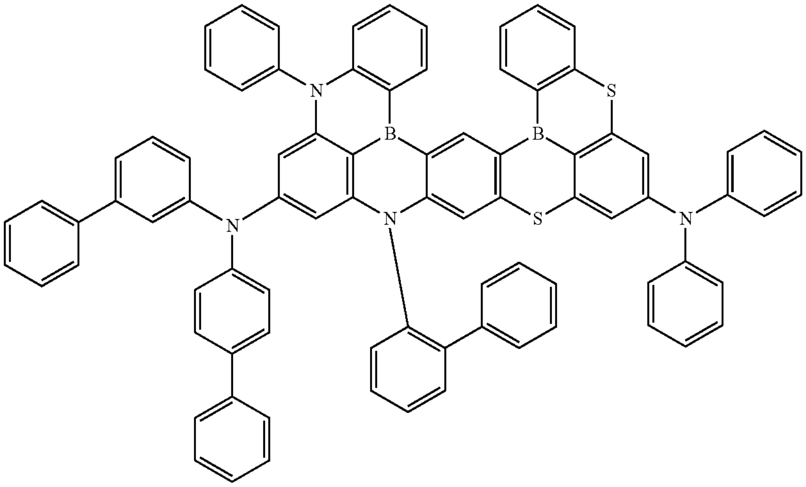

-continued
187
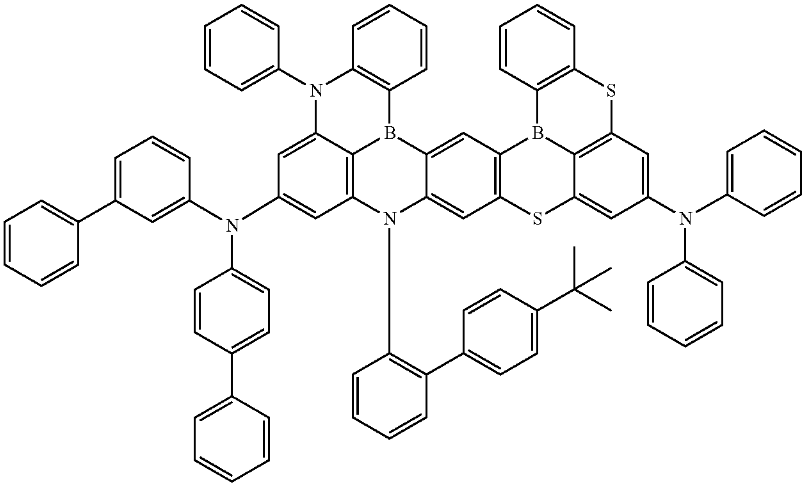
188
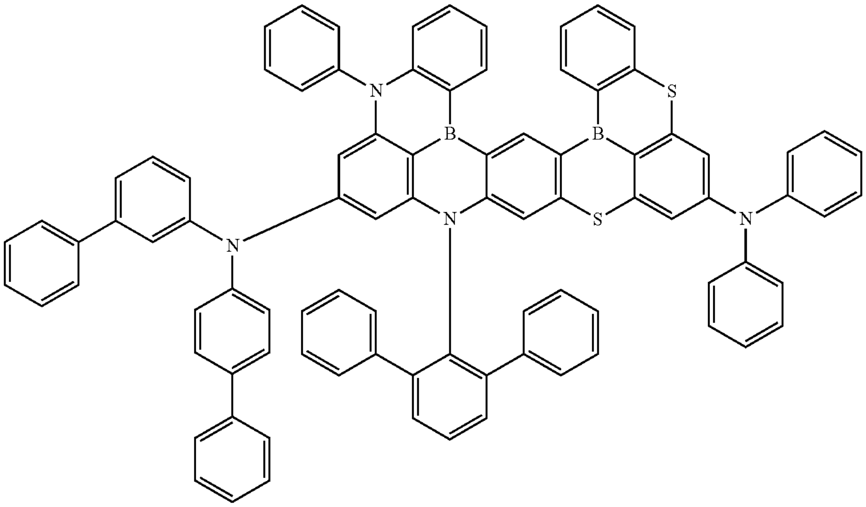
189
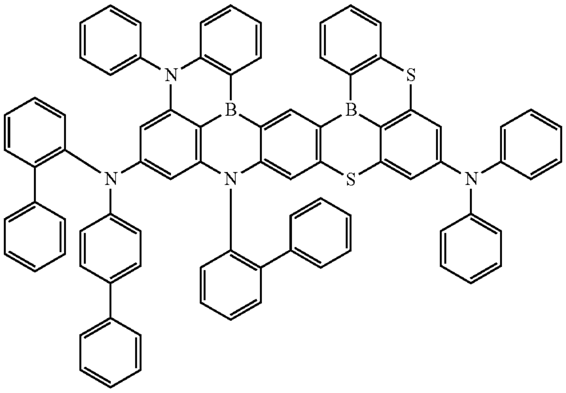
190
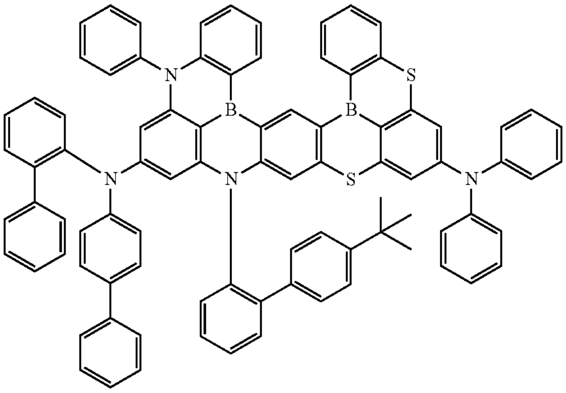

-continued
191
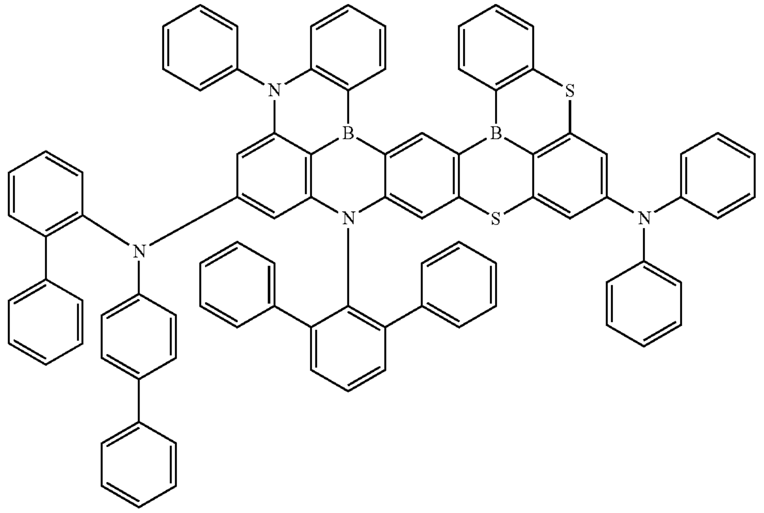
192
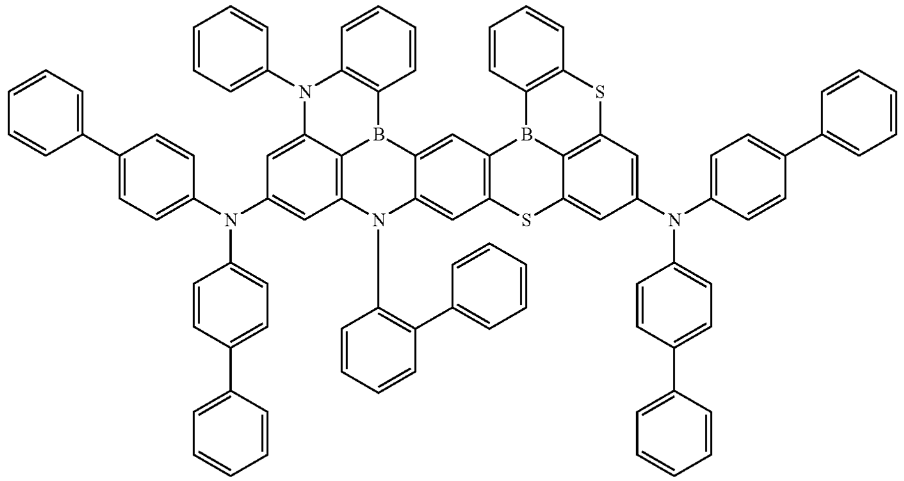
193
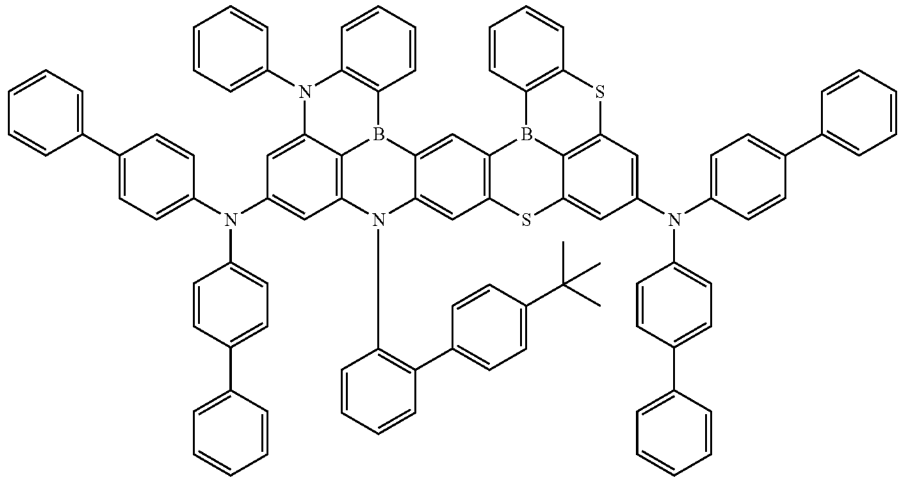

-continued
194
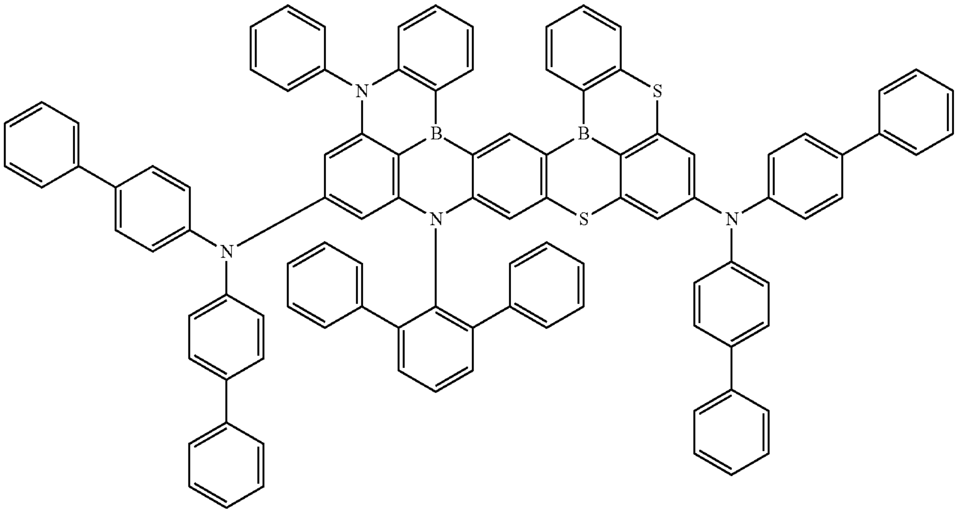
195
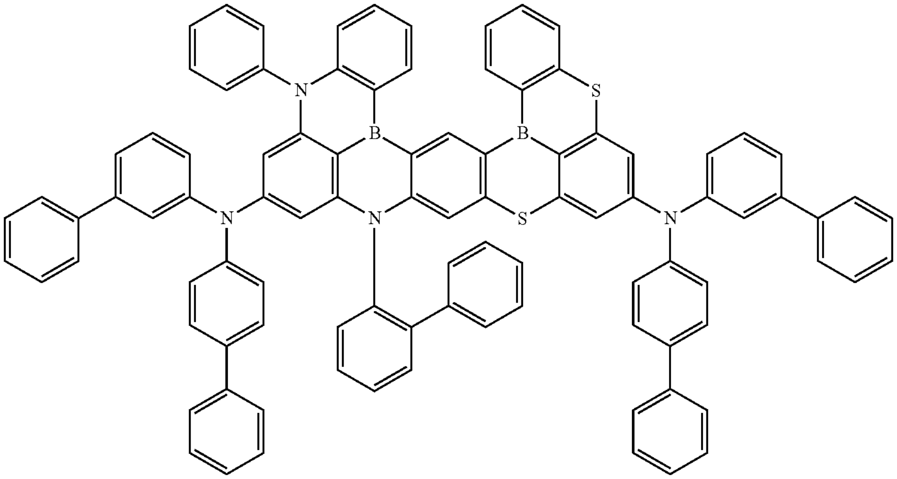
196
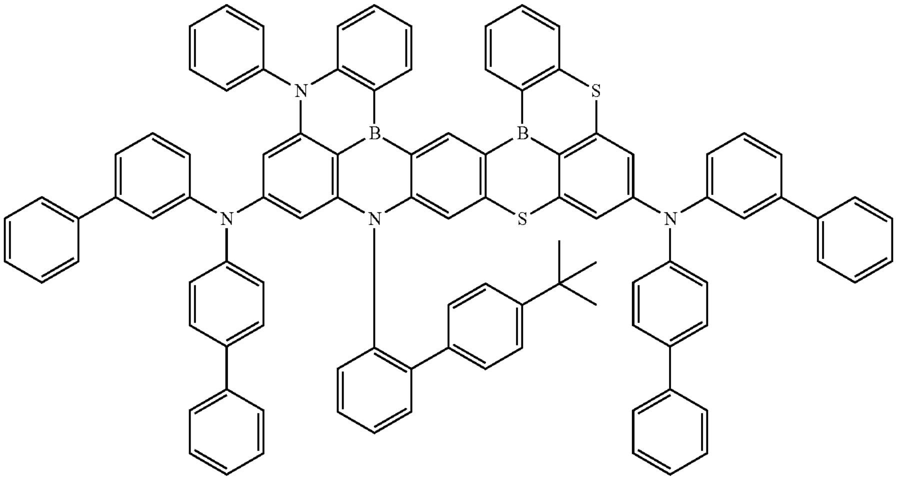

-continued
197
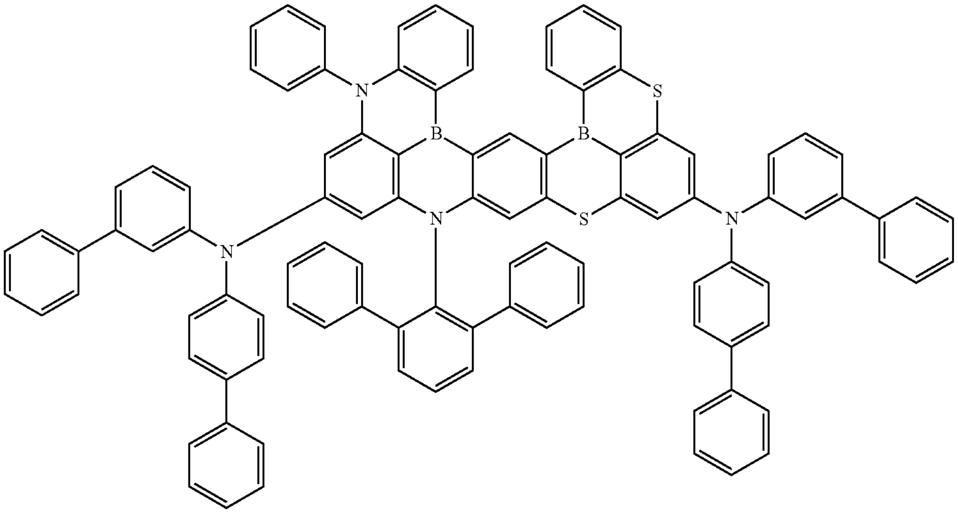
198
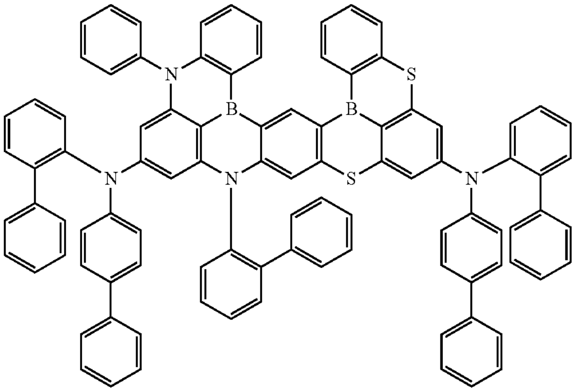
199
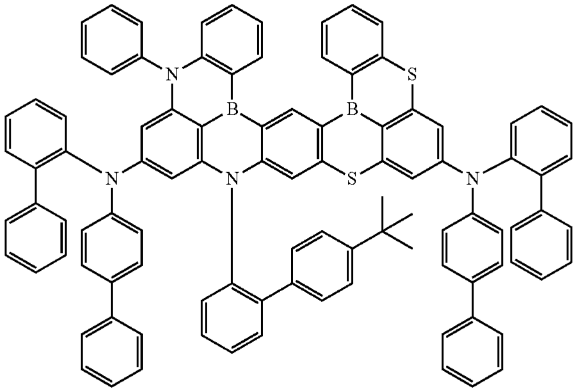
200
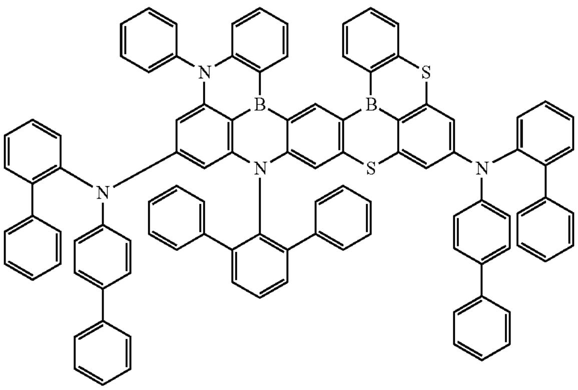
201
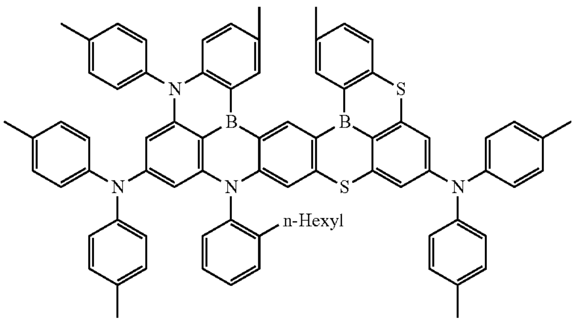

-continued
202
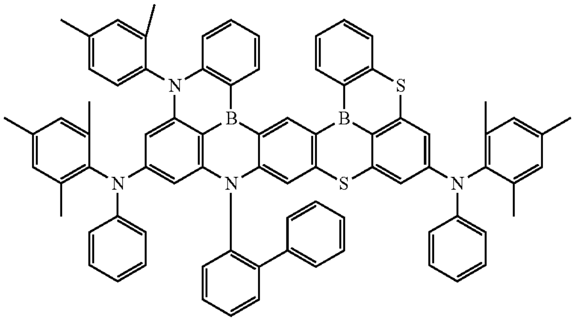
203
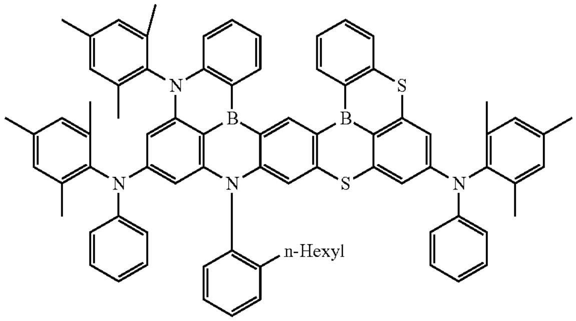
204
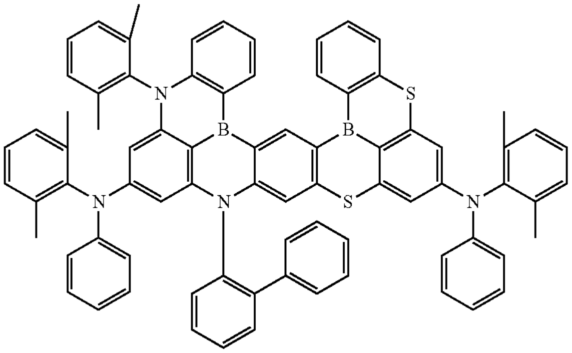
205
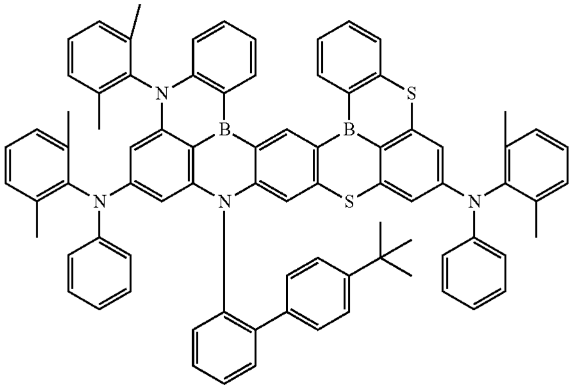
206
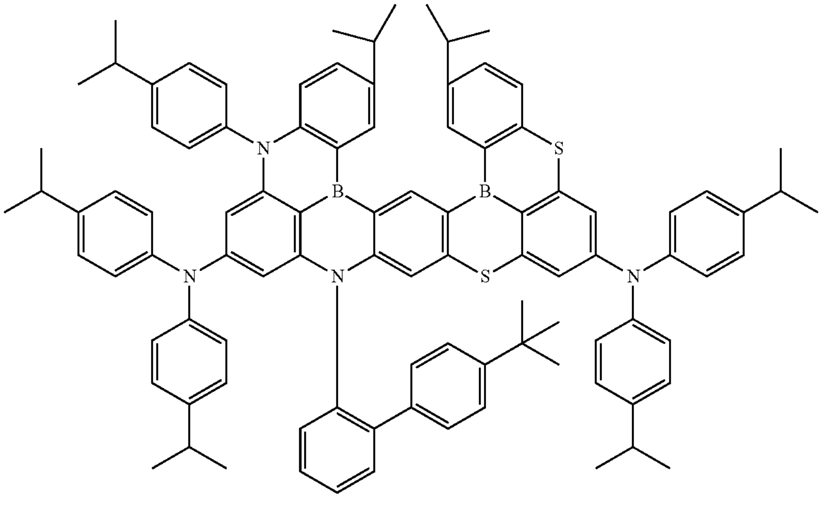

-continued
207
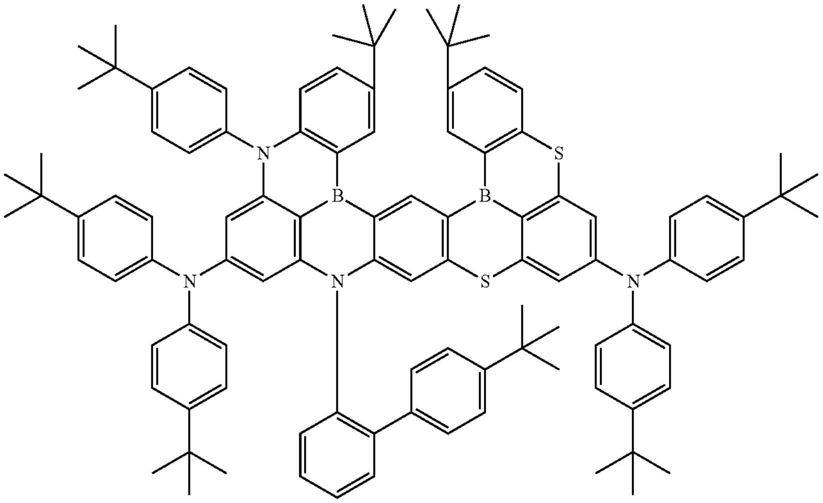
208
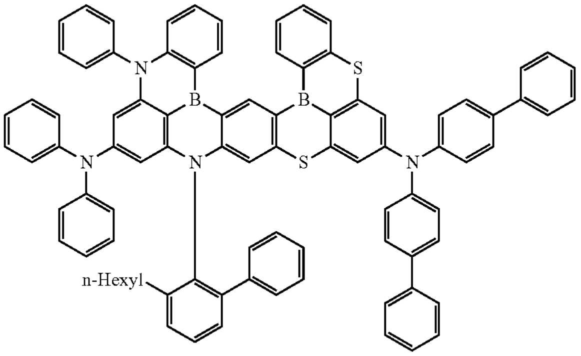
209
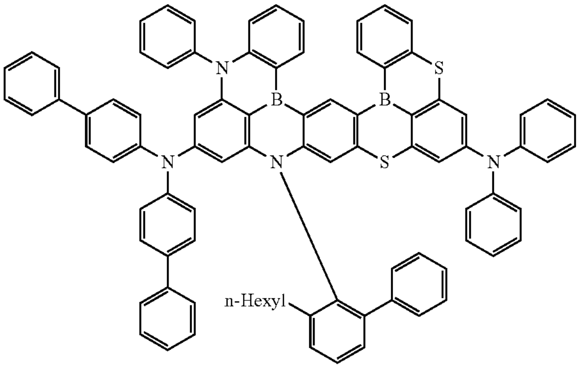
210
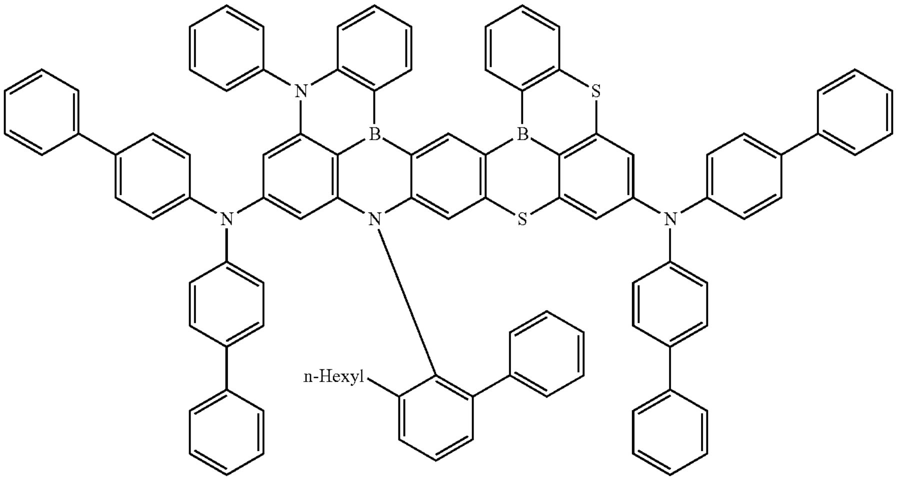

-continued
211
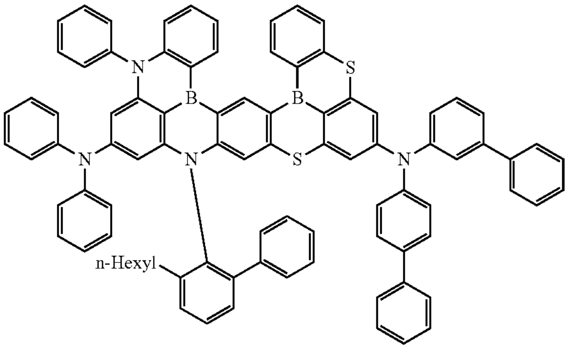
212
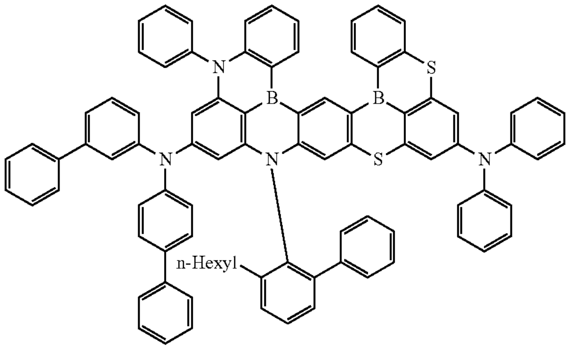
213
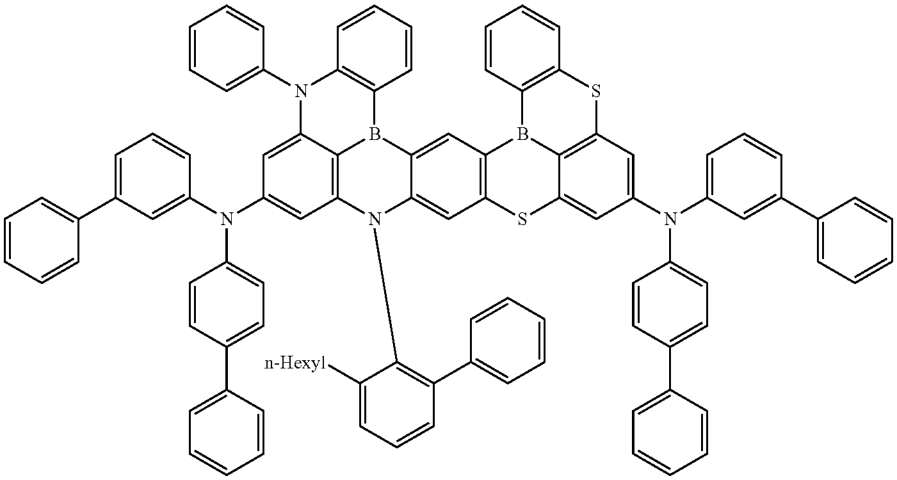
214
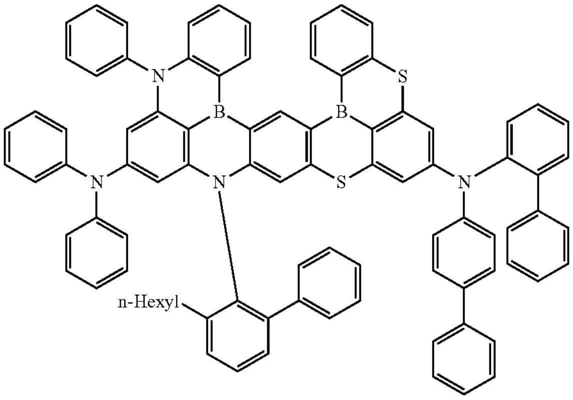
215
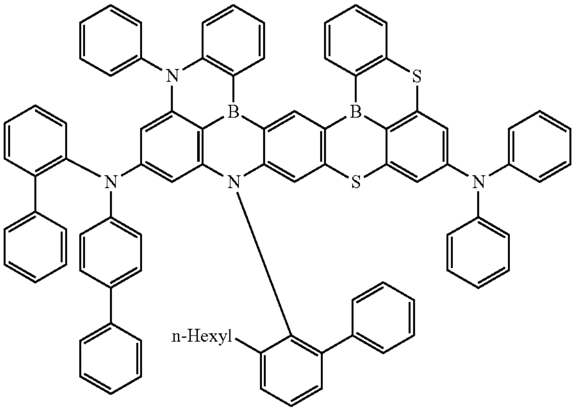

-continued
216
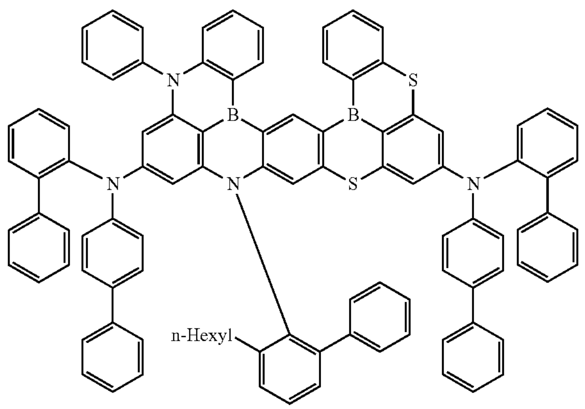
217
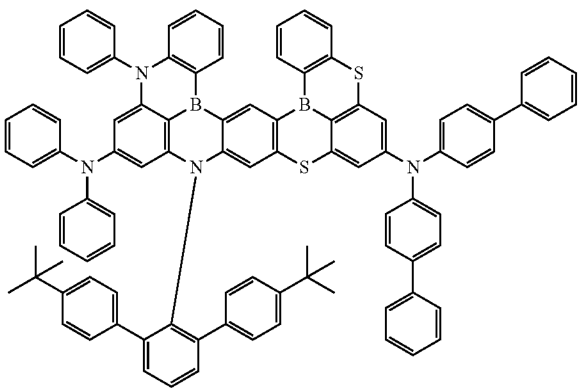
218
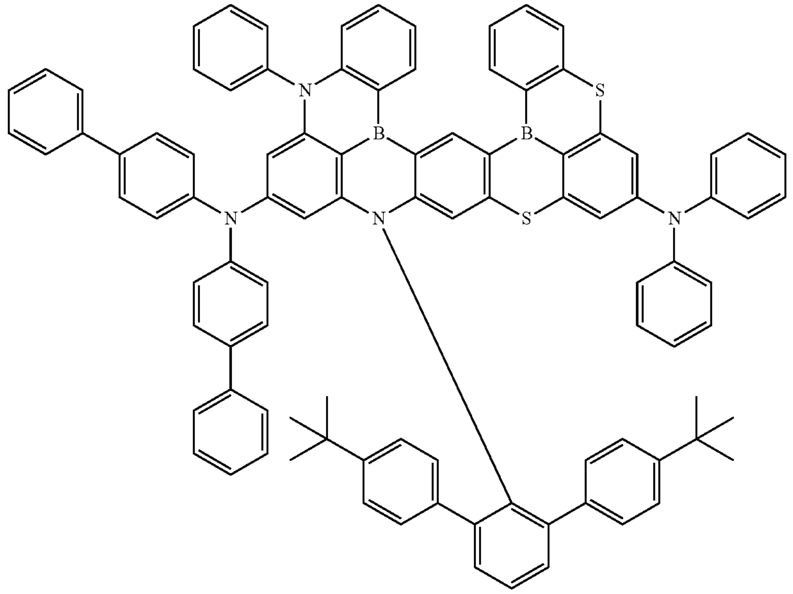
219
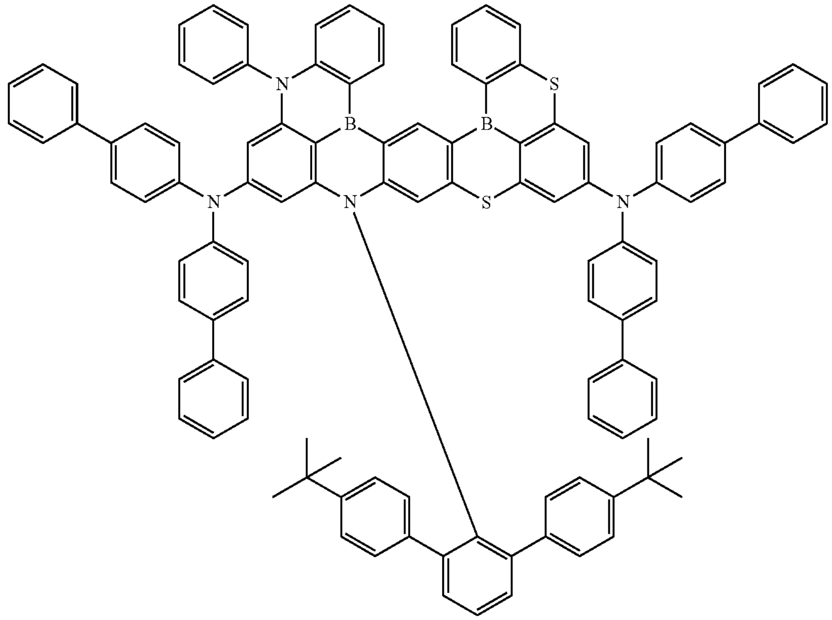

-continued
220
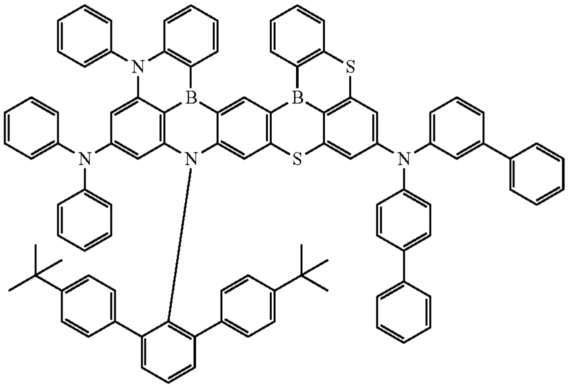
221
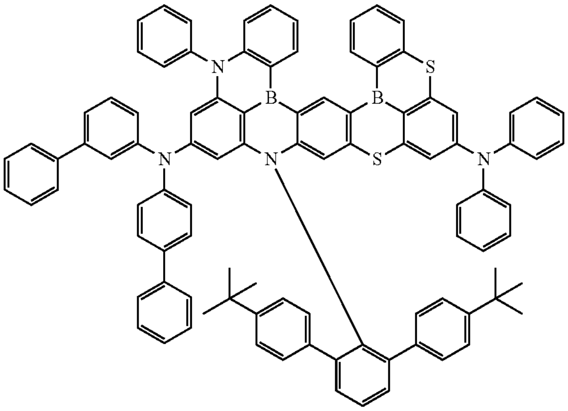
222
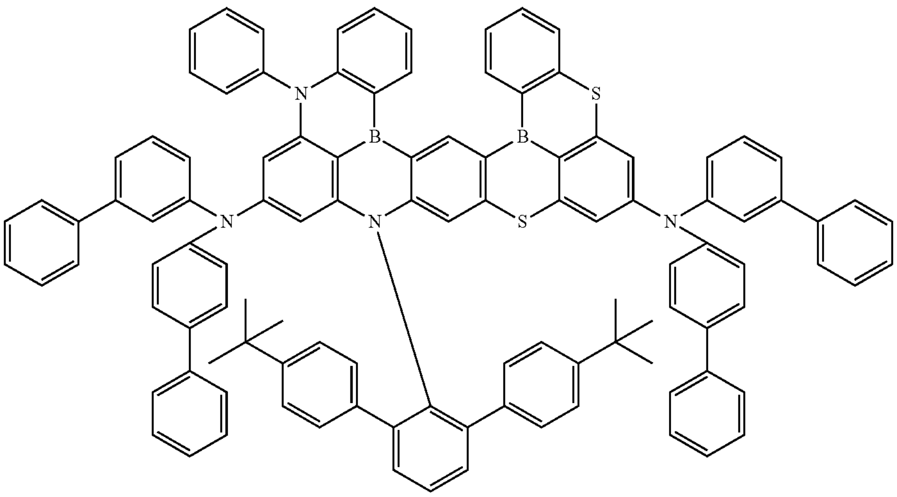
223
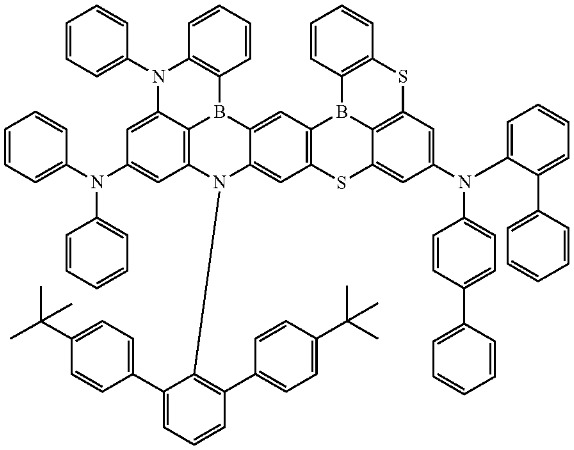
224
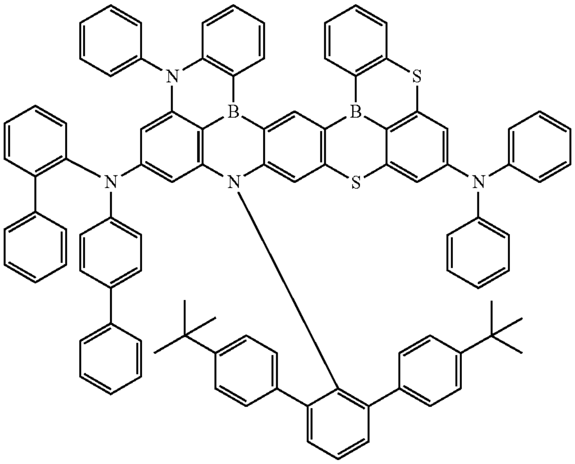

-continued
225
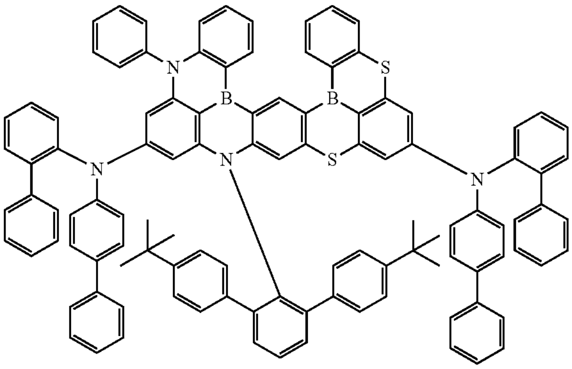
226
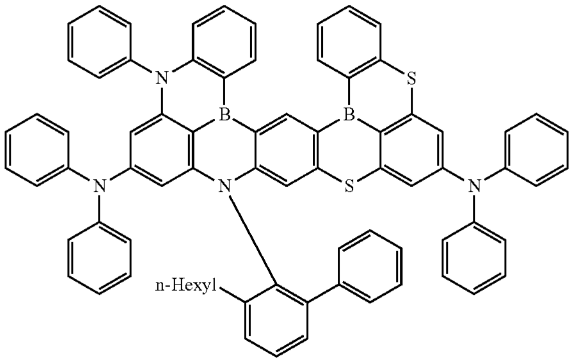
227
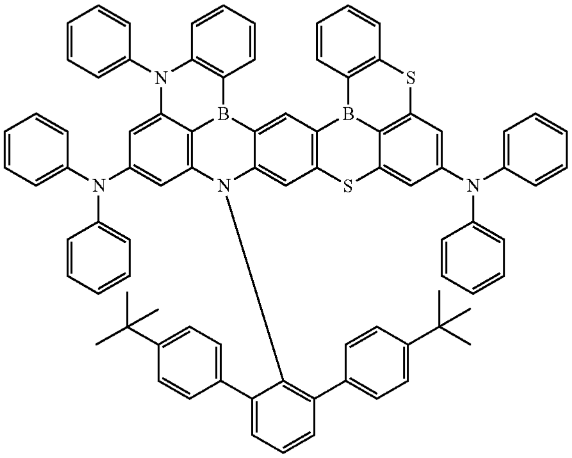
228
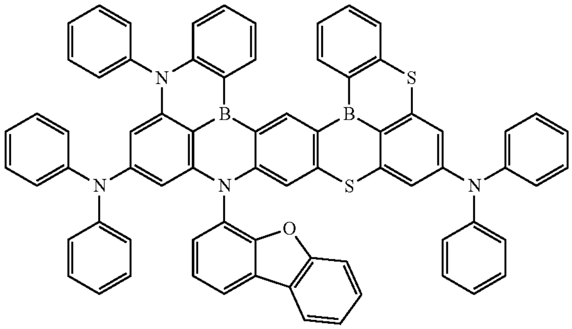
229
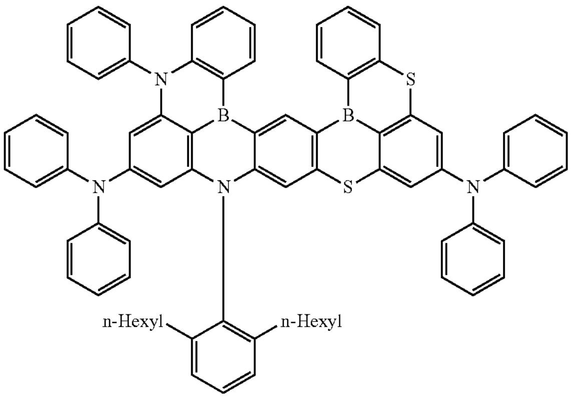
230
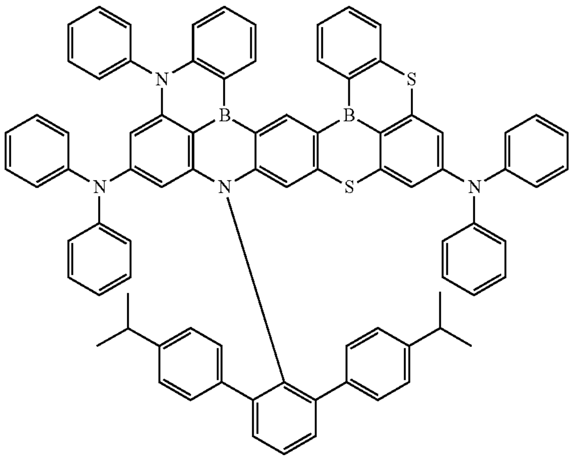

-continued
231
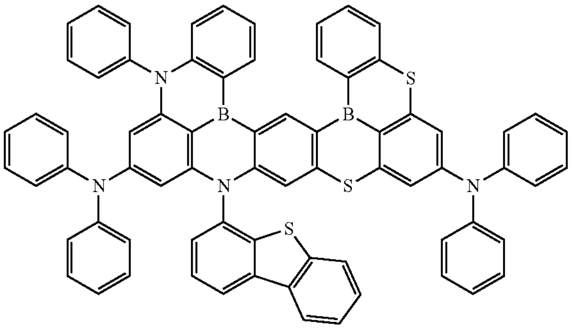
232
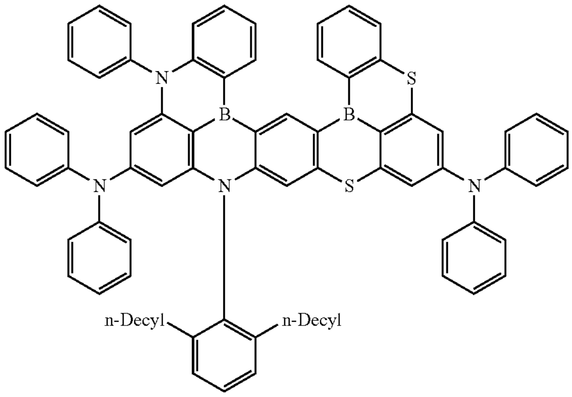
233
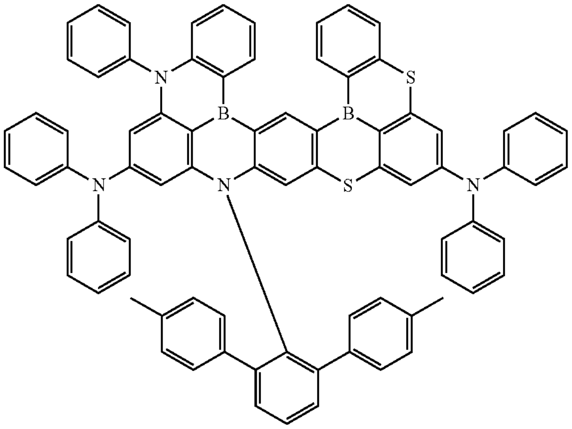
234
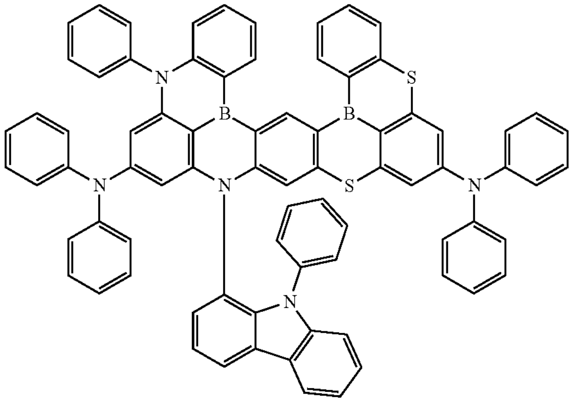
235
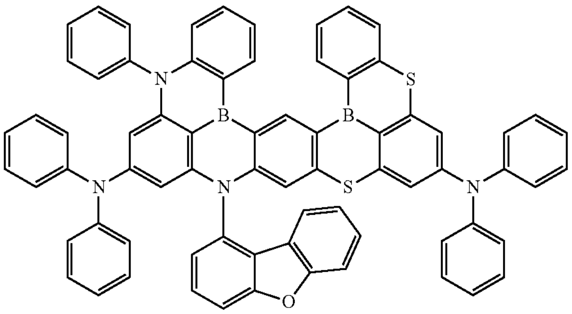
236
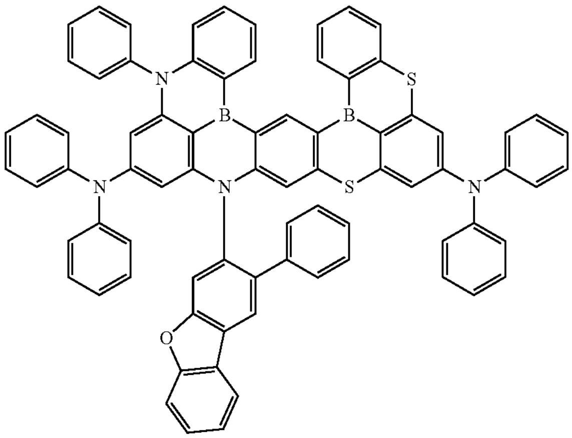

-continued
237
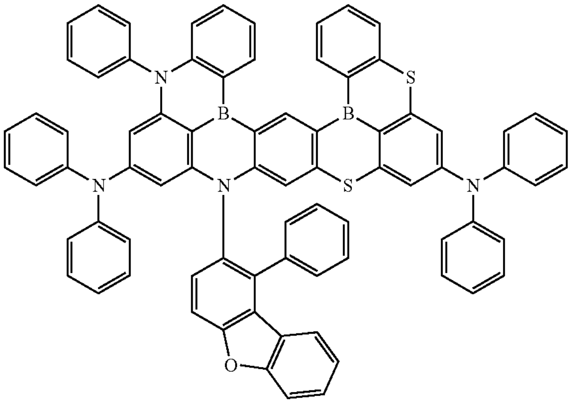
238
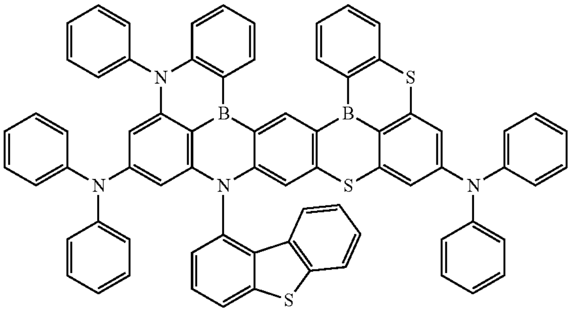
239
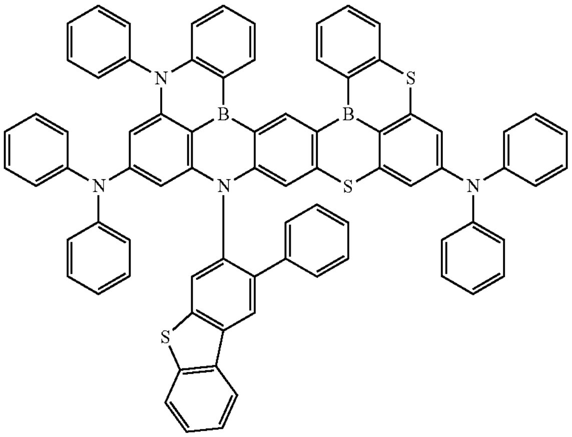
240
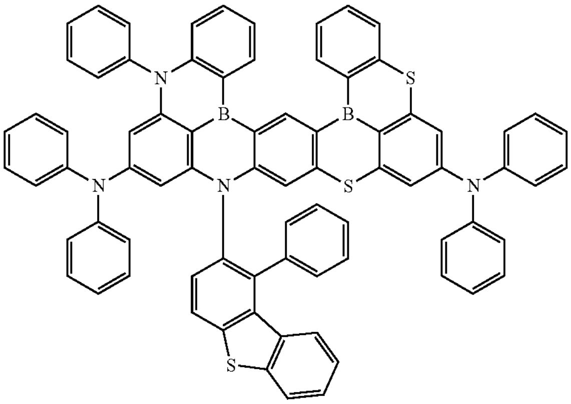
241
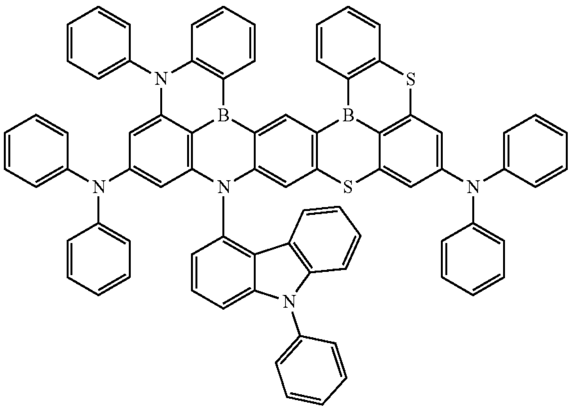
242
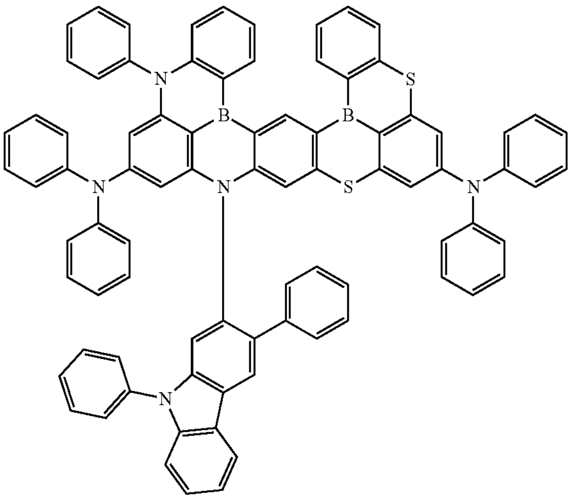

-continued
243
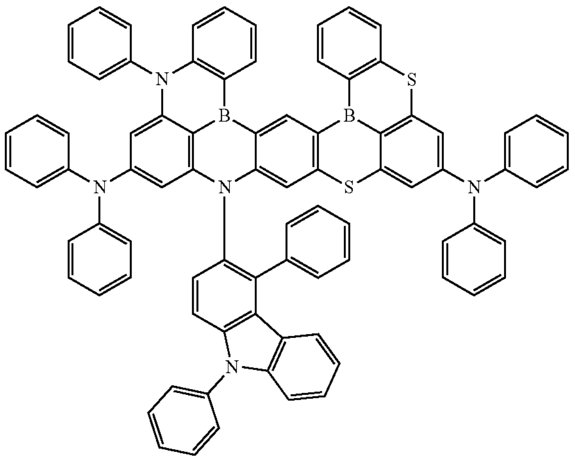
244
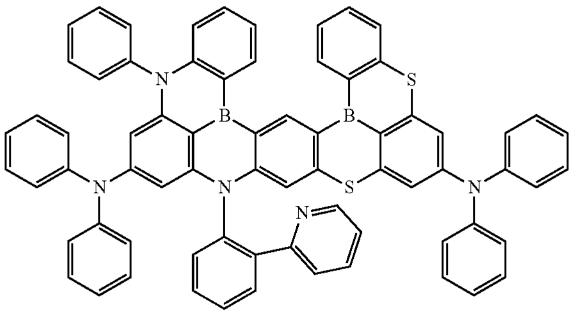
245
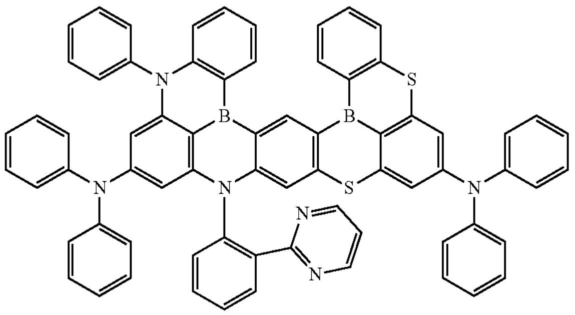
246
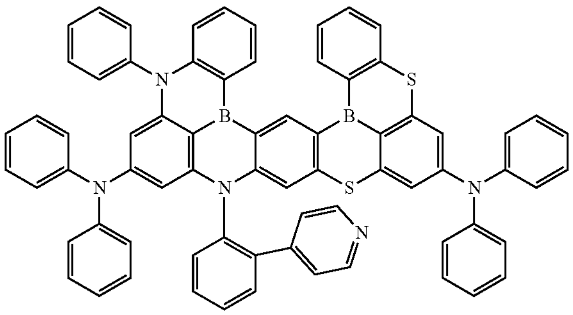
247
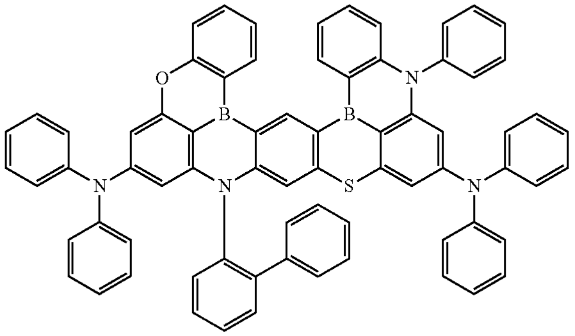
248
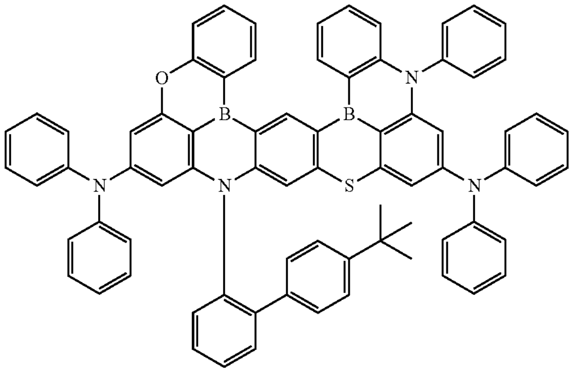
249
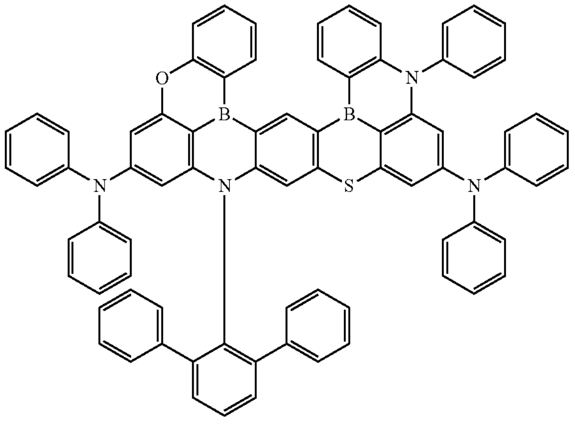
250
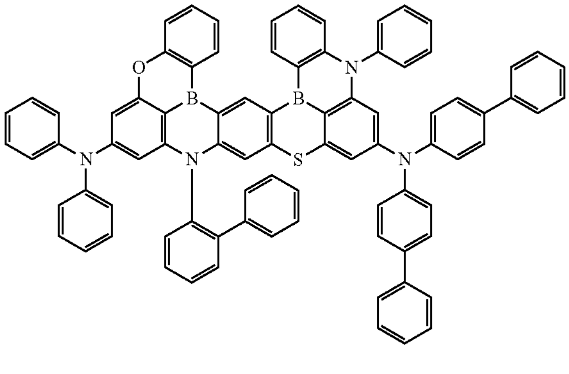

-continued
251
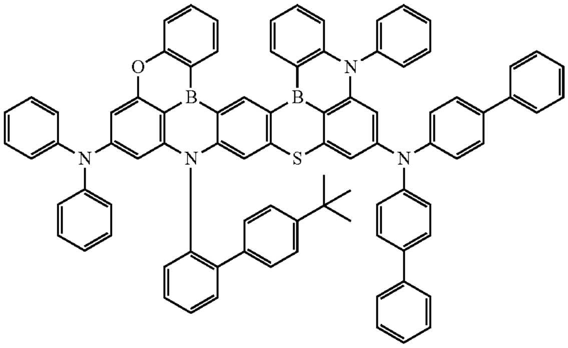
252
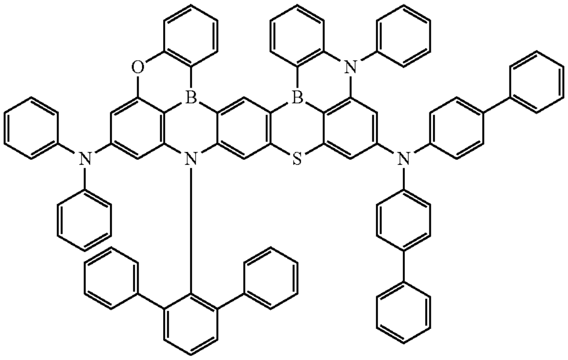
253
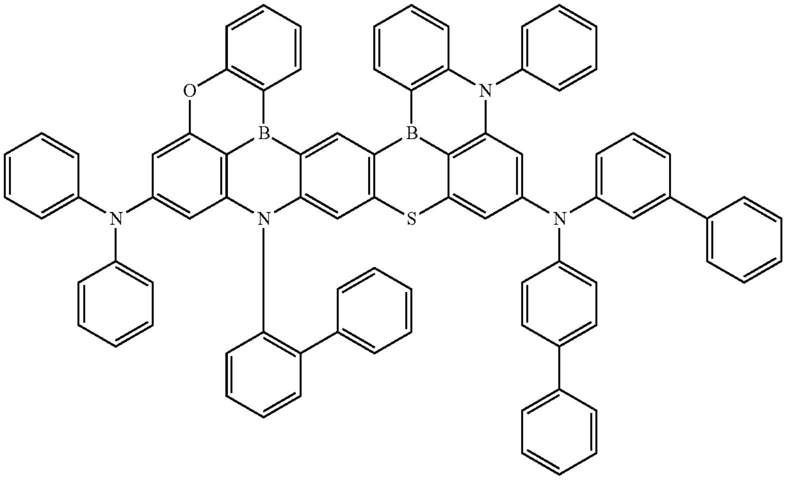
254
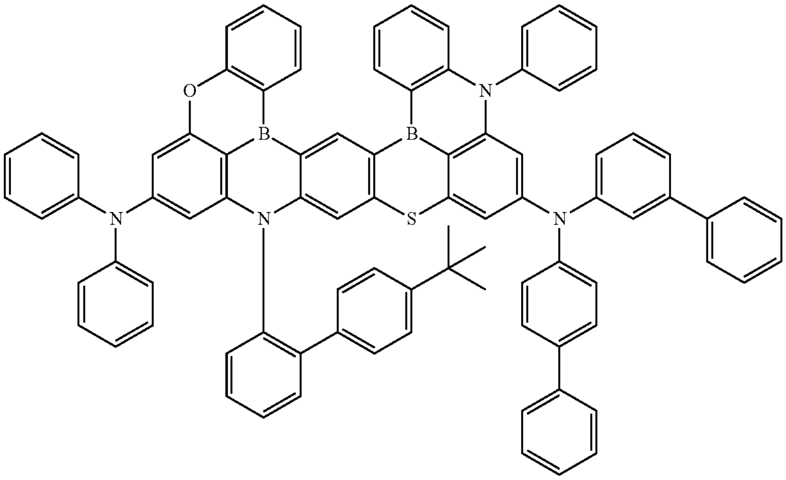

-continued
256
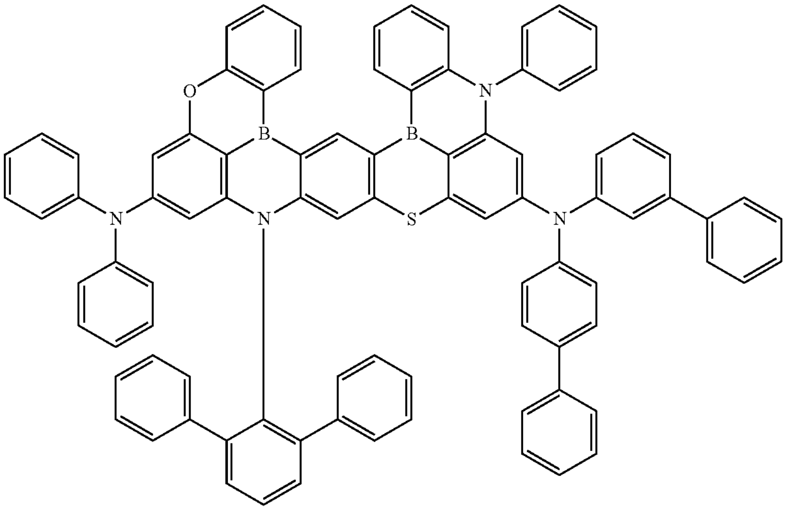
256
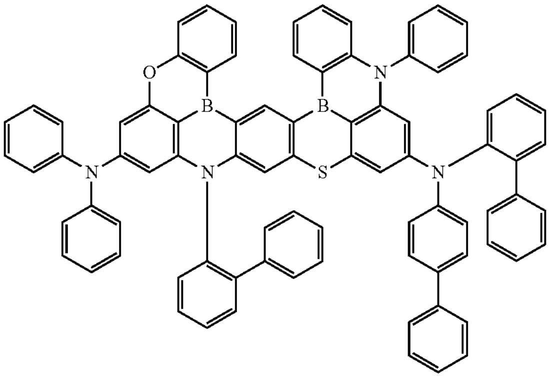
257
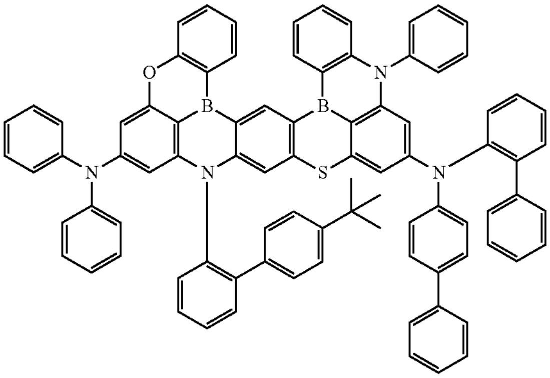
258
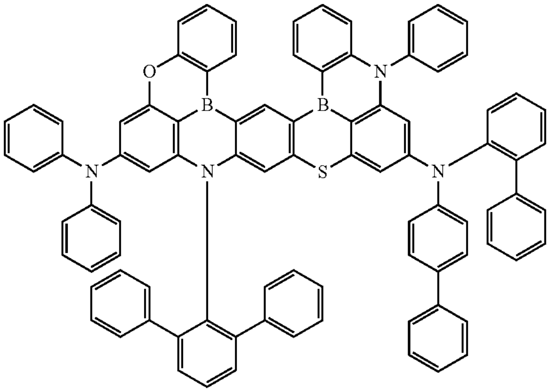
259
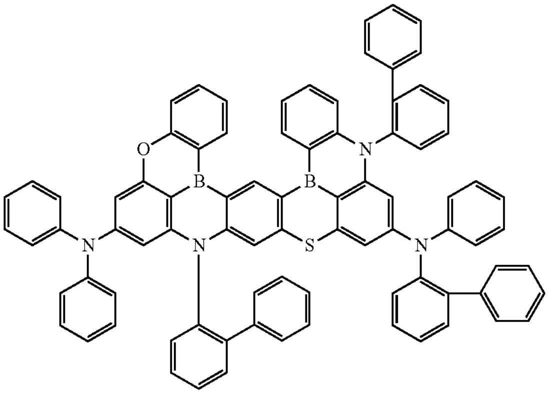

-continued
260
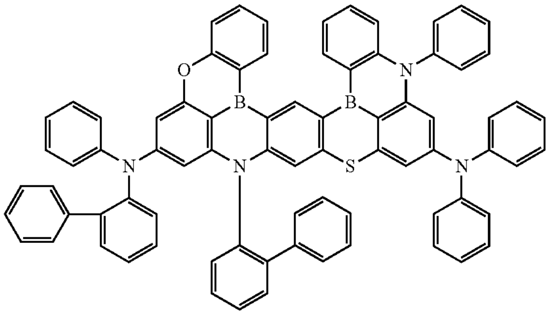
261
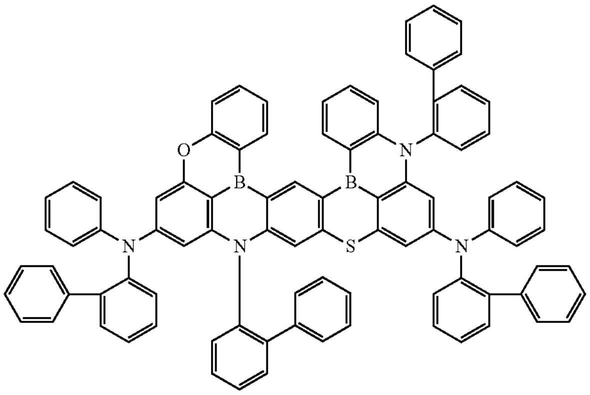
262
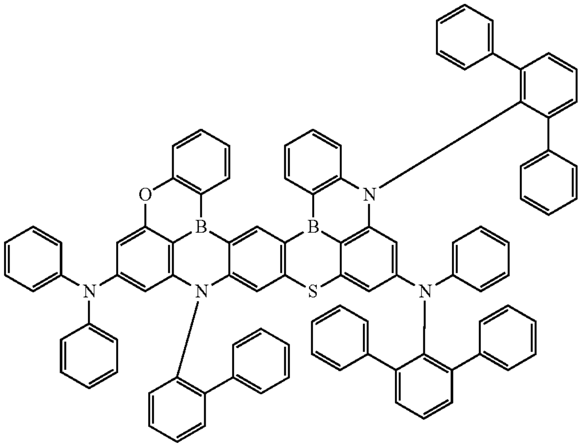
263
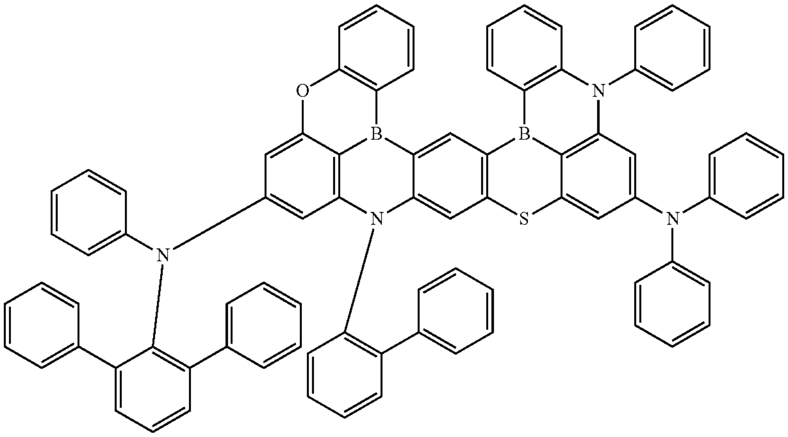

-continued
264
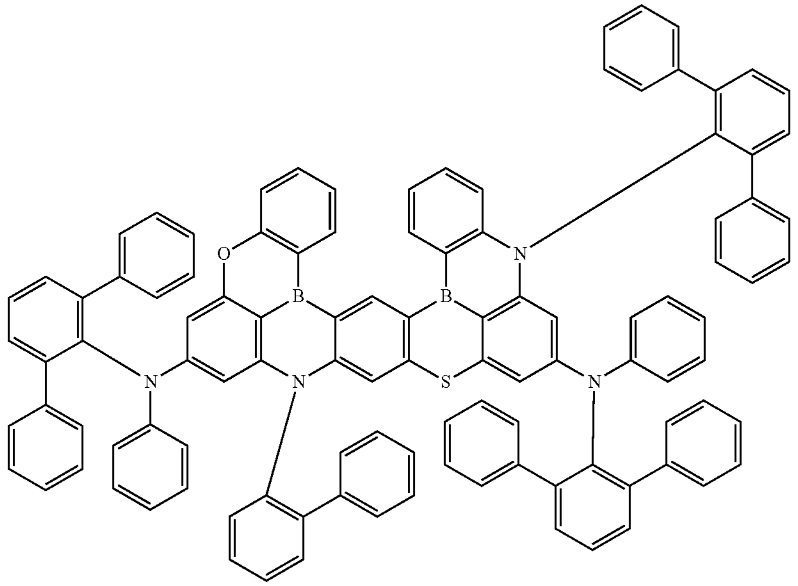
265
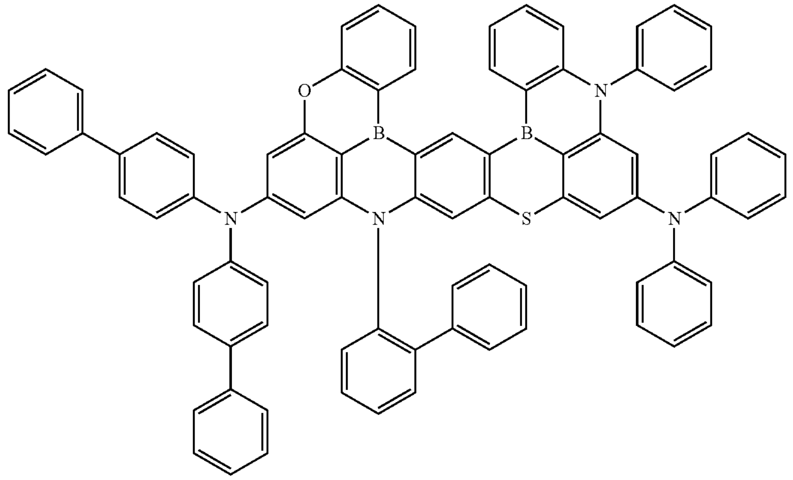
266
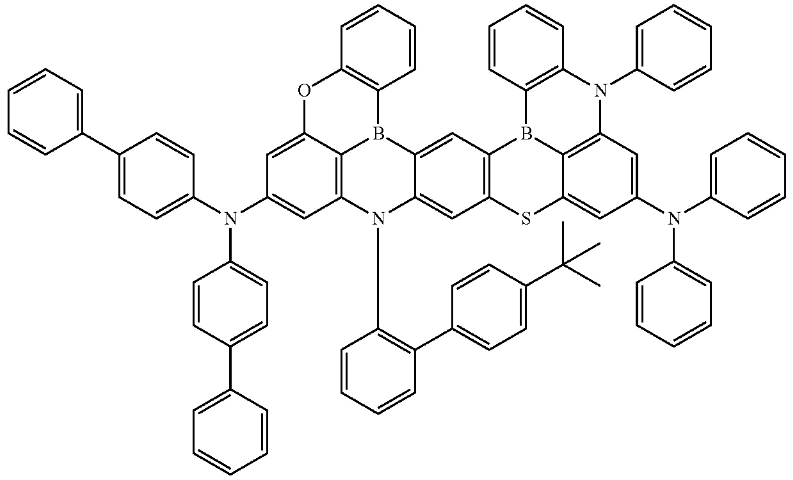

-continued
267
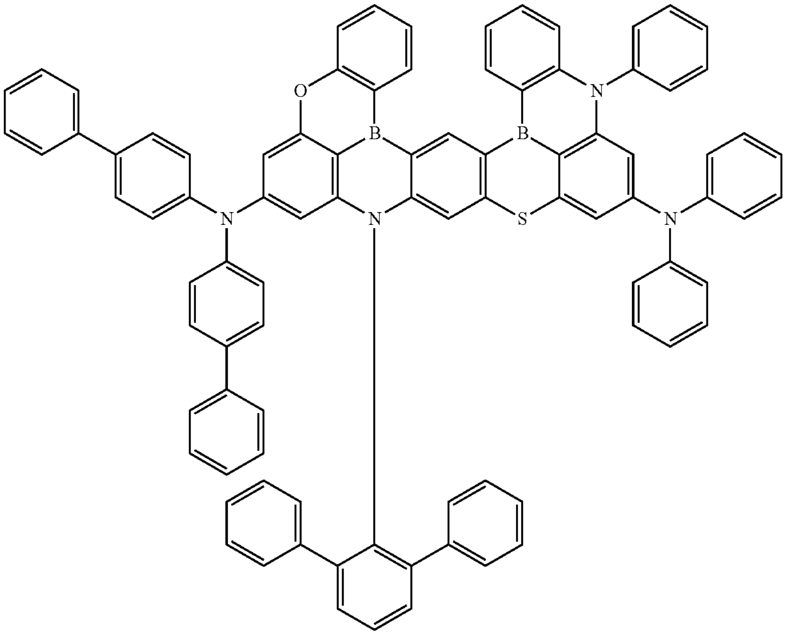
268
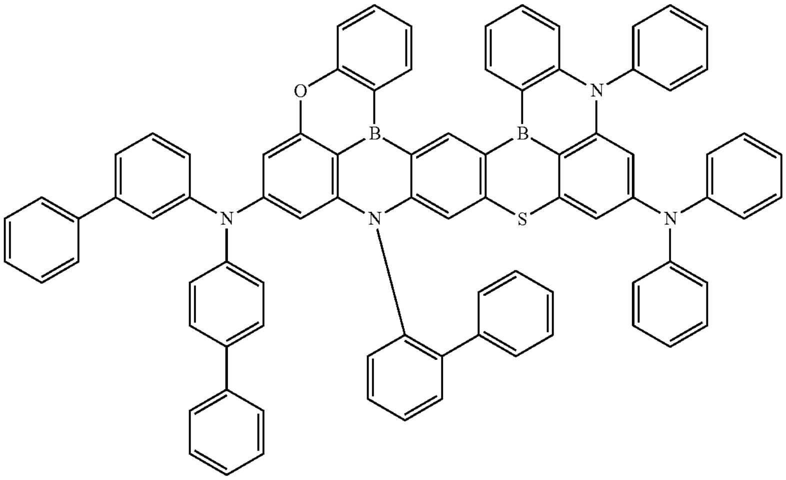
269
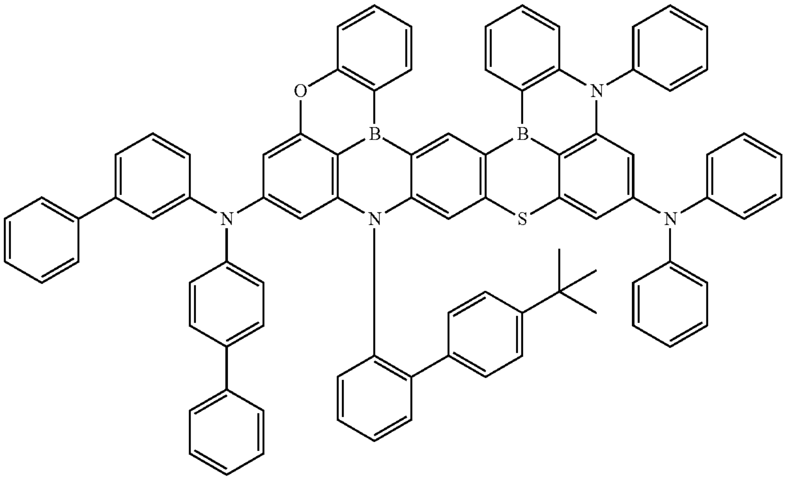

-continued
270
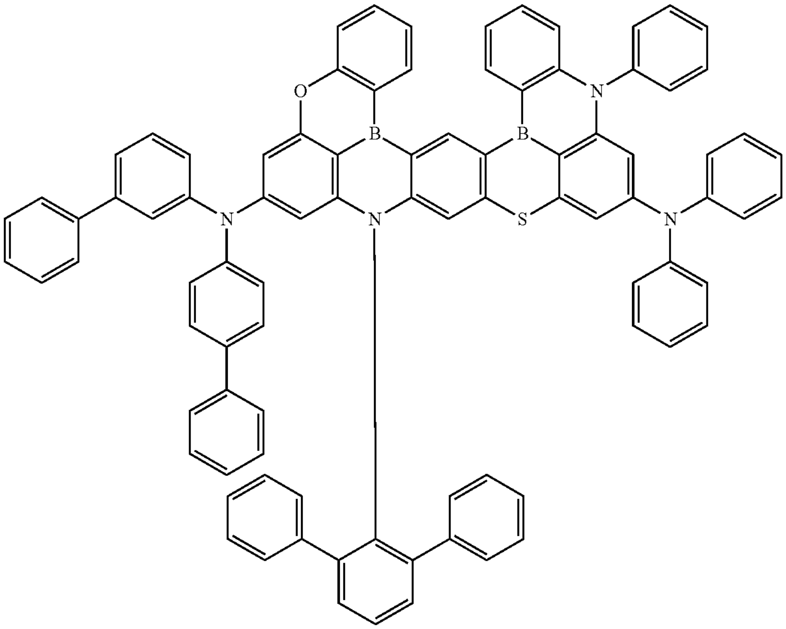
271
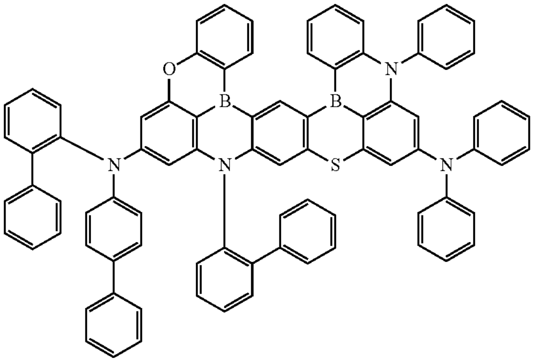
272
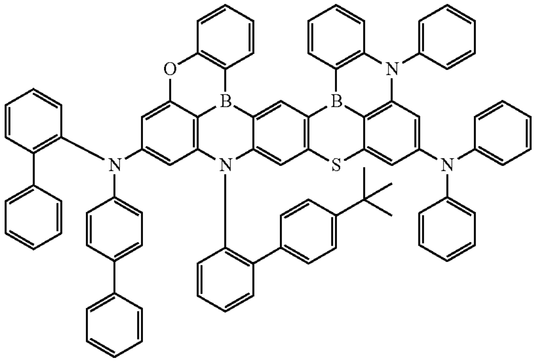
273
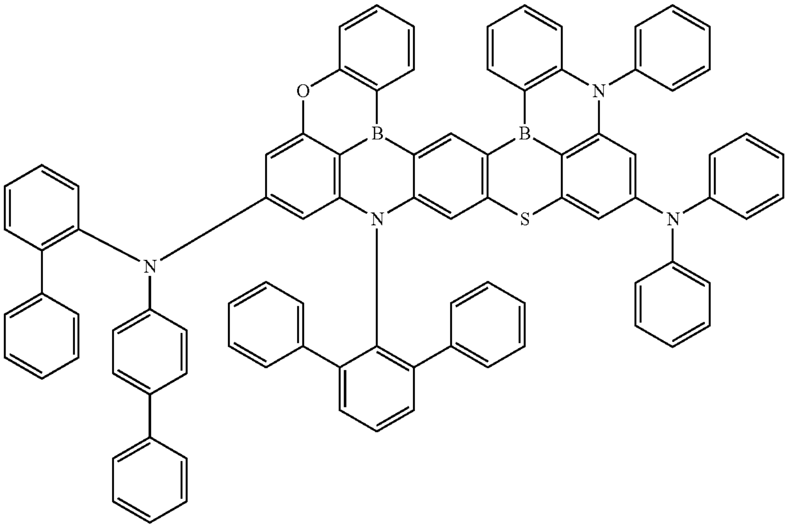

-continued
274
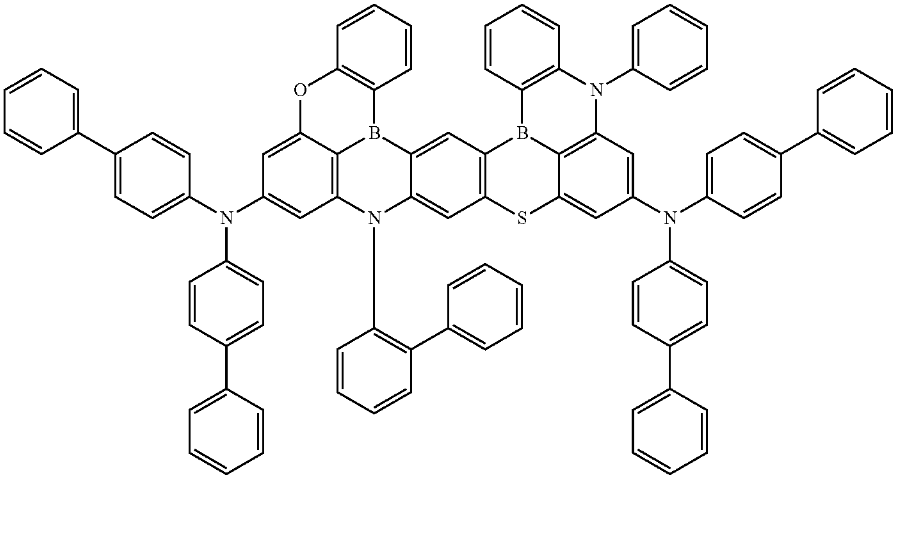
275
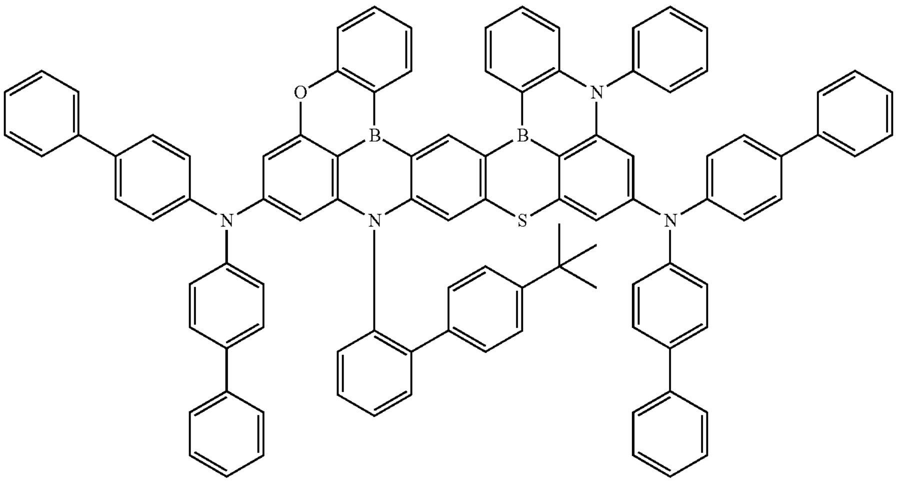
276
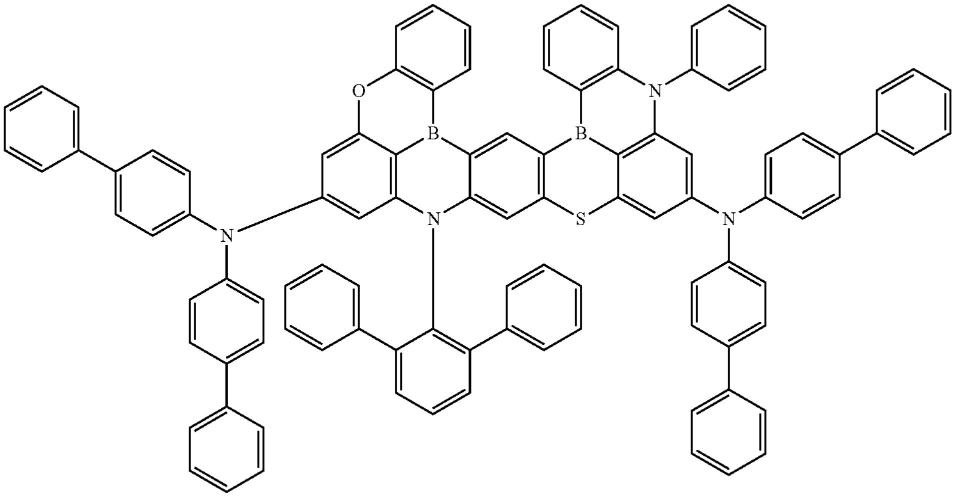

-continued
277
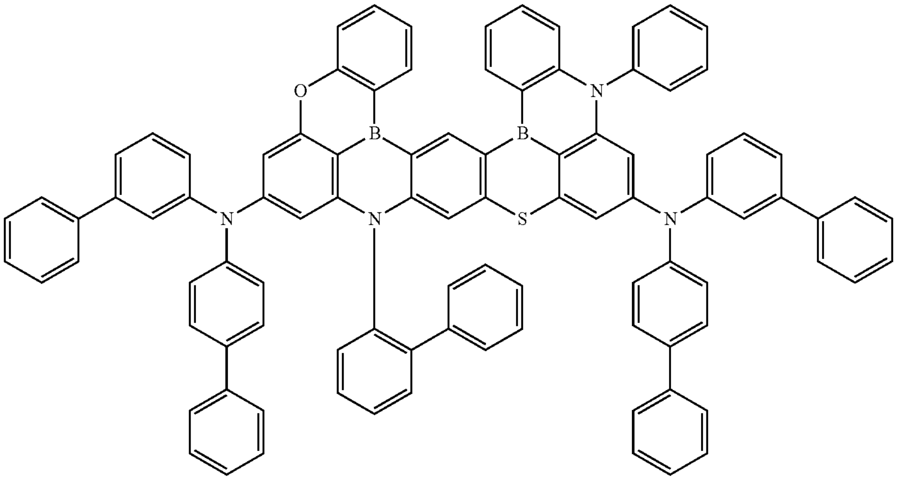
278
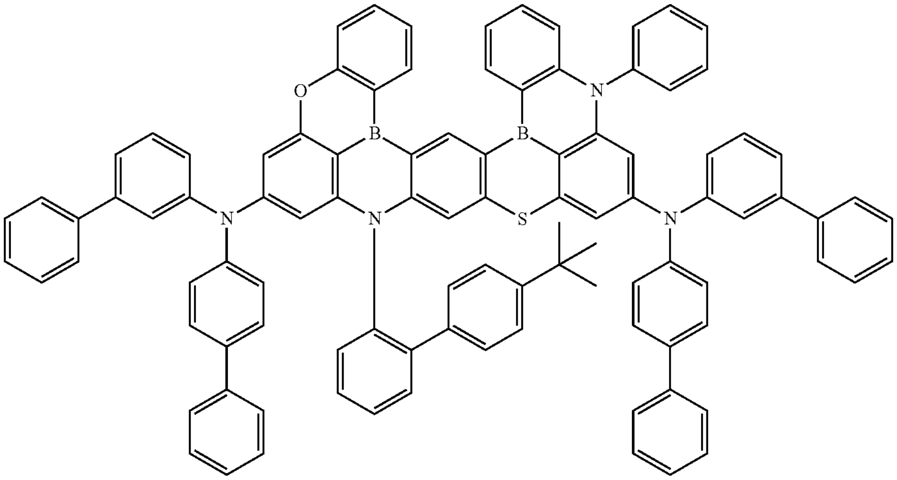
279
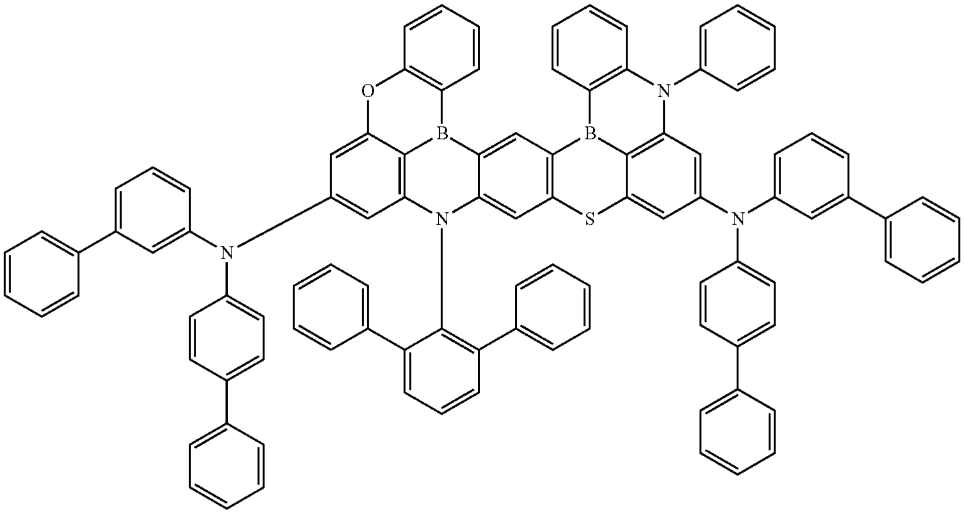

-continued
280
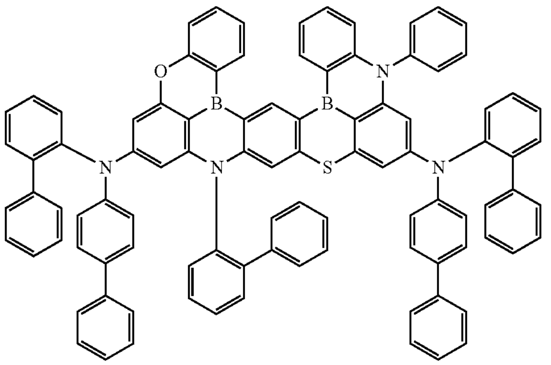
281
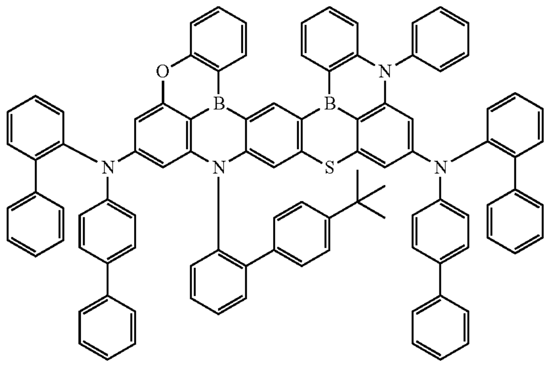
282
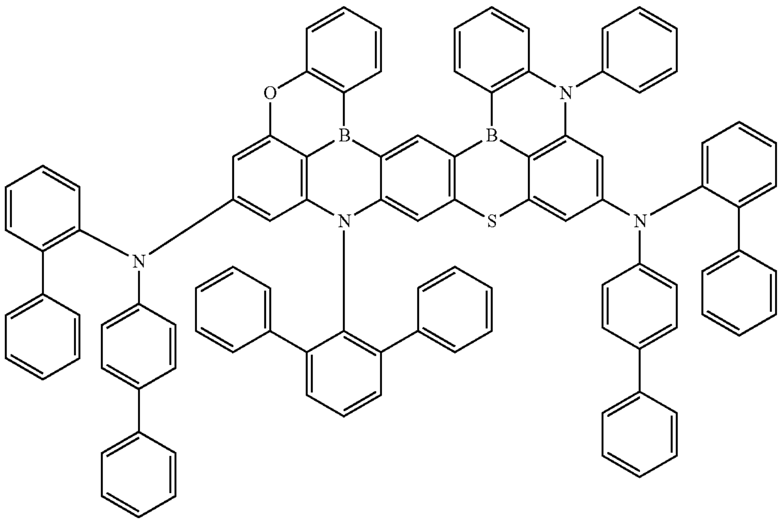
283
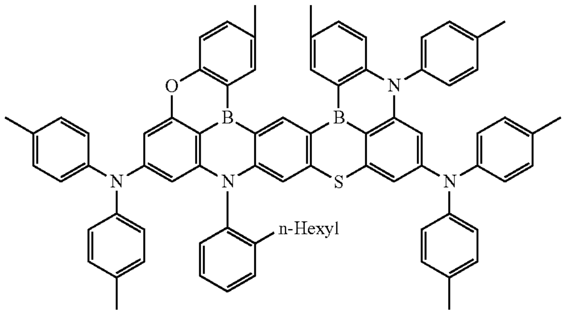
284
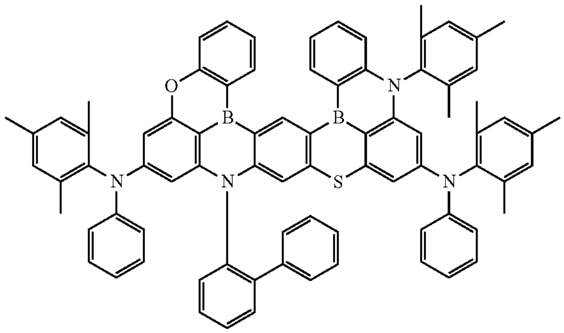
285
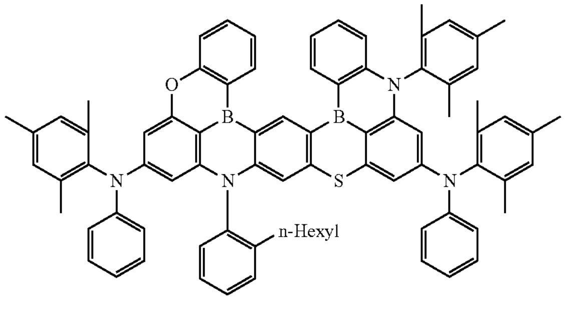
286
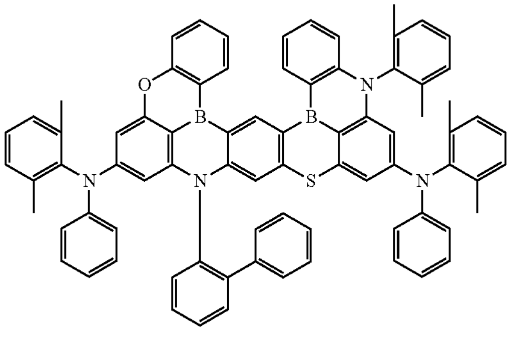

-continued
287
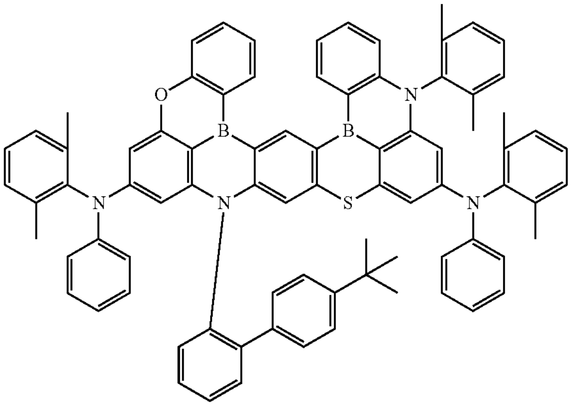
288
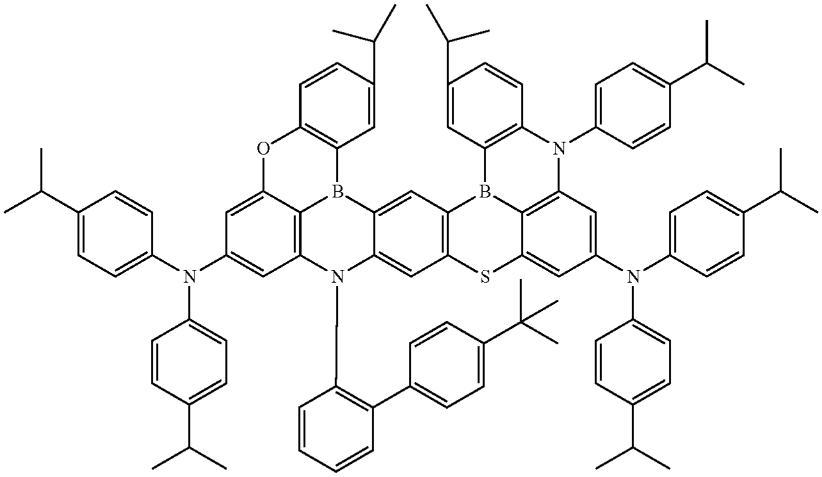
289
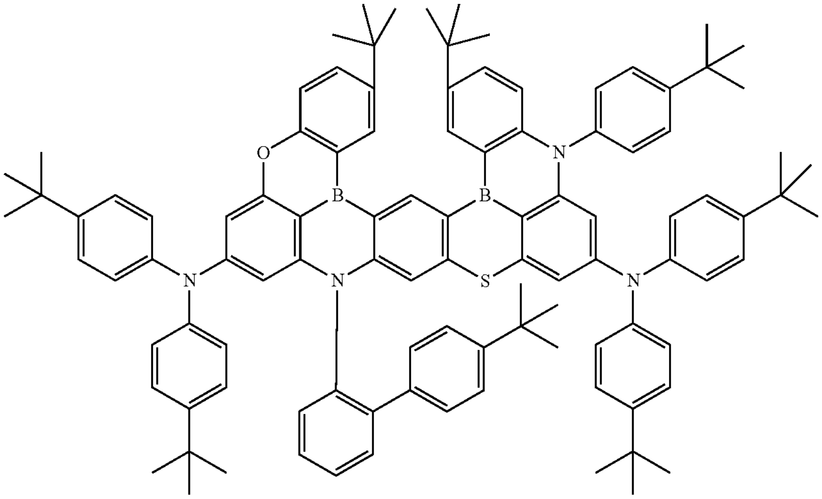

-continued
290
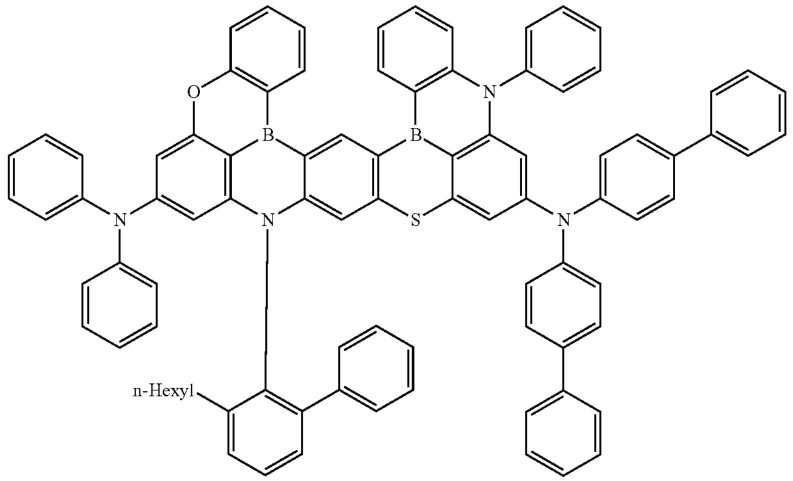
291
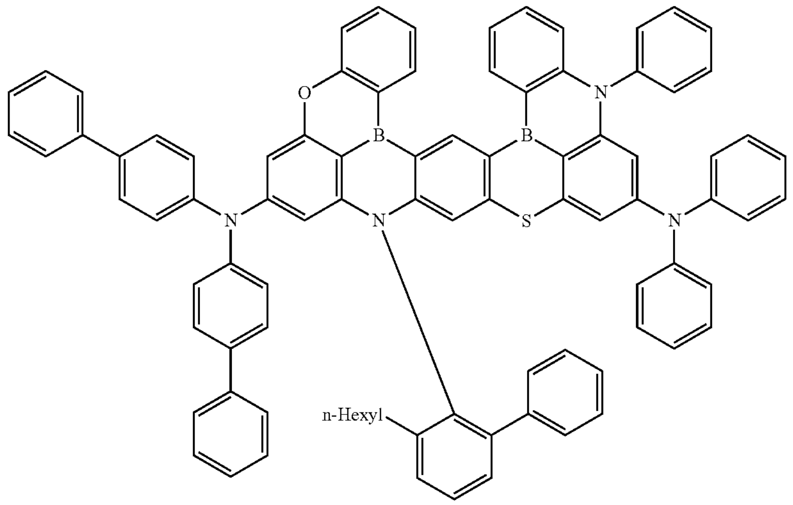
292
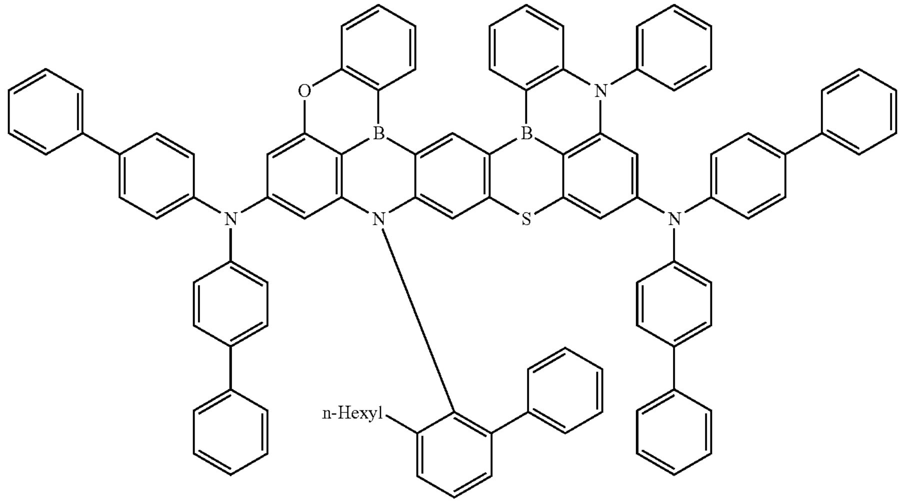

-continued
293
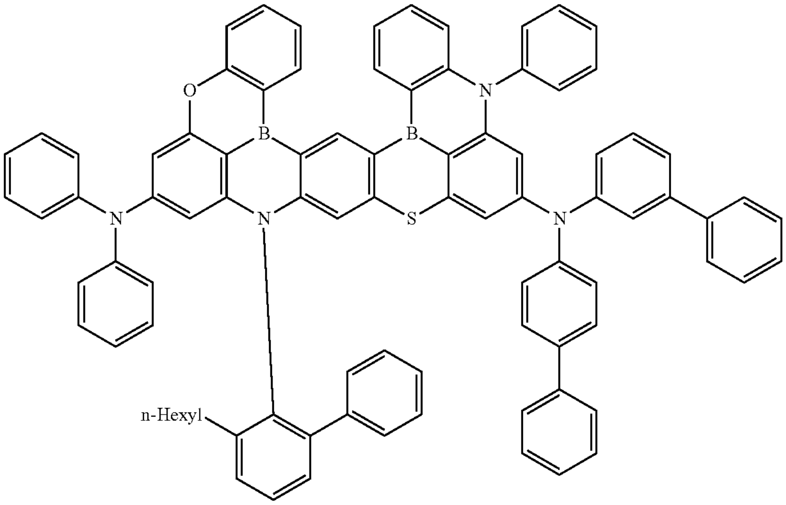
294
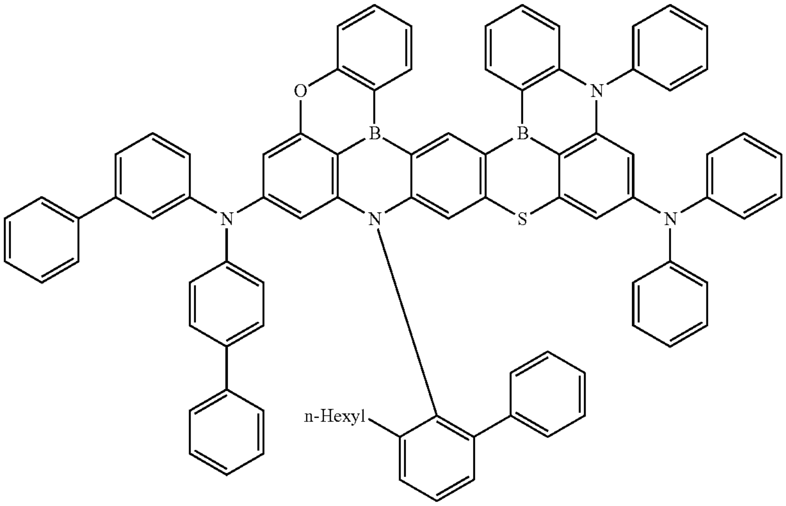
295
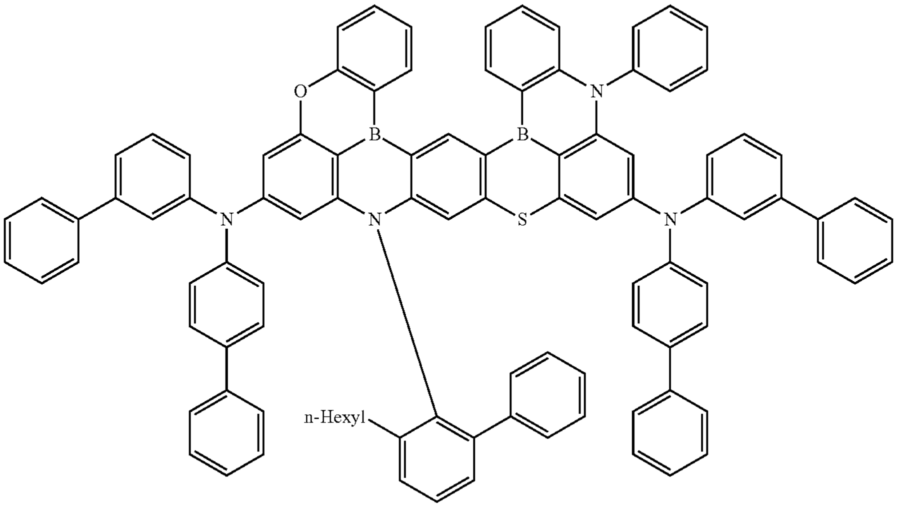

-continued
296
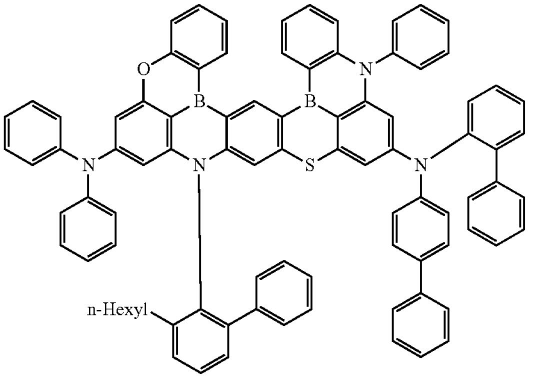
297
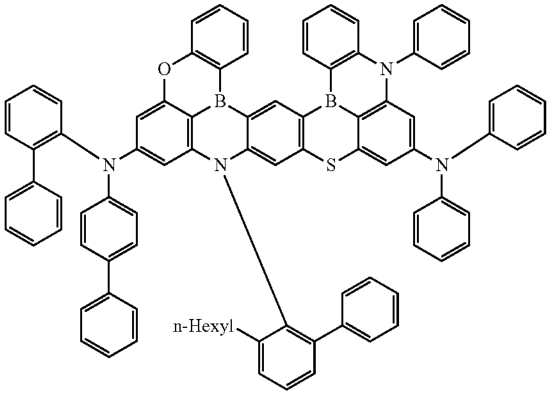
298
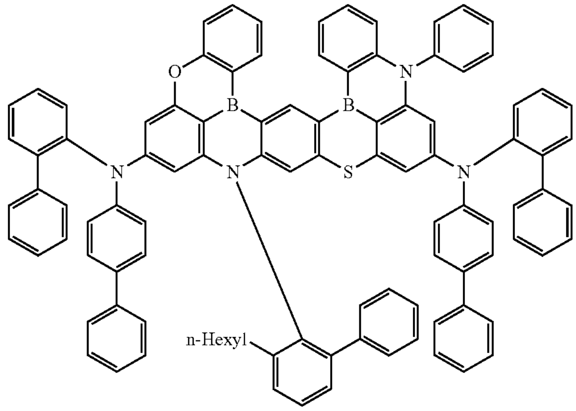
299
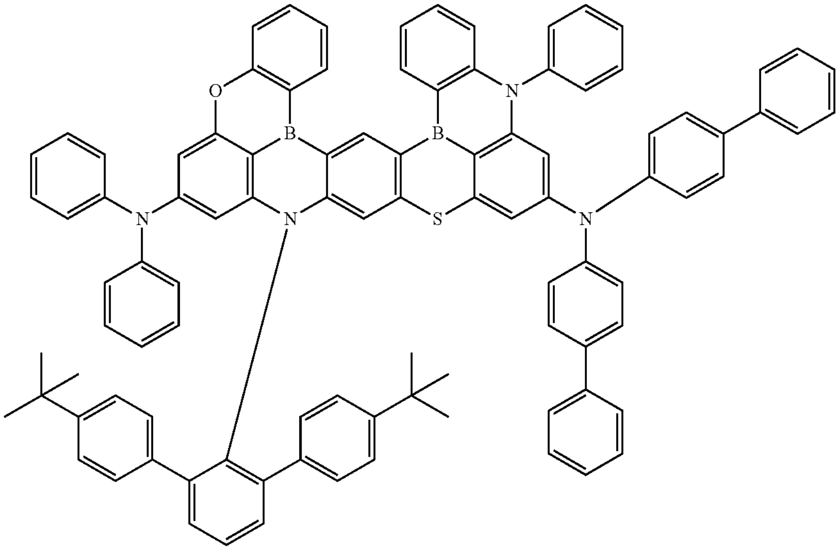

-continued
300
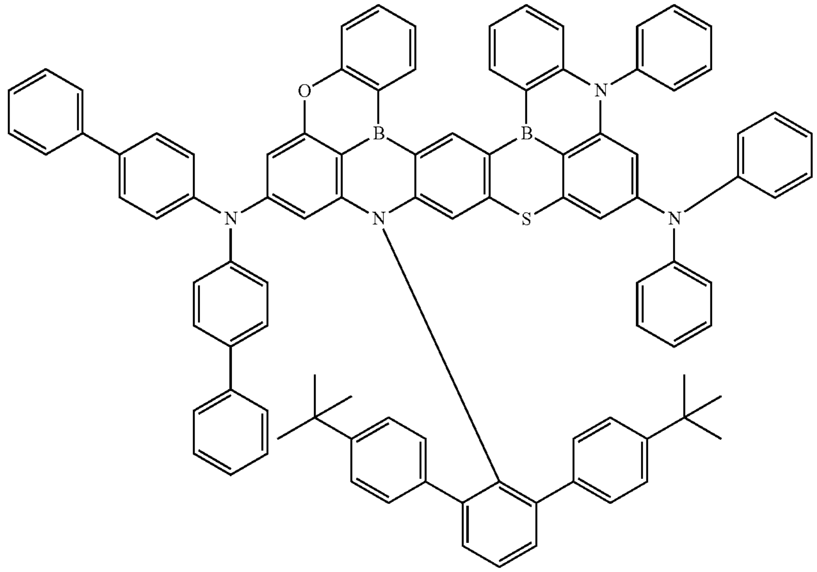
301
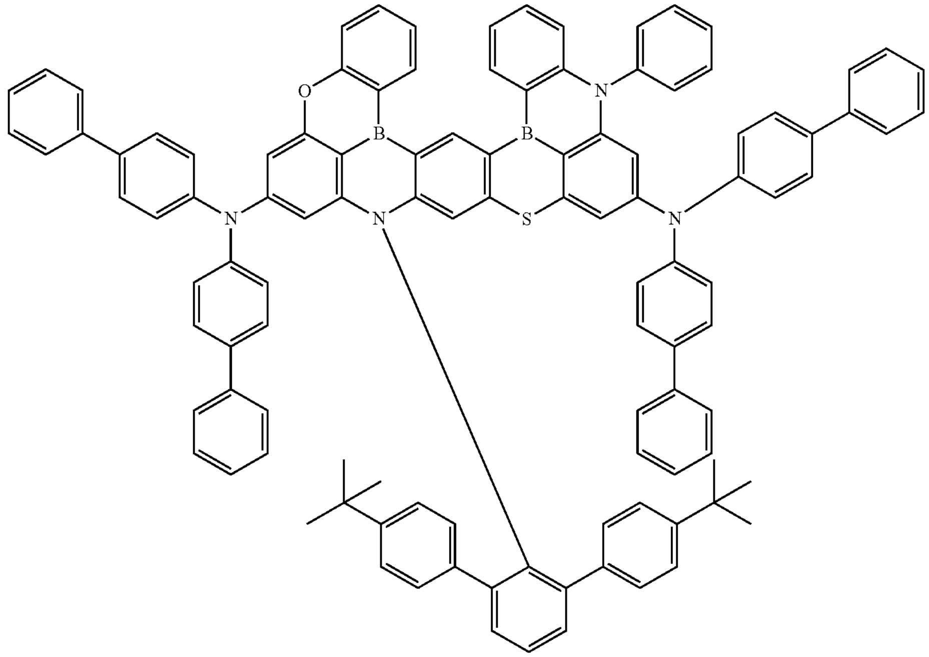

-continued
302
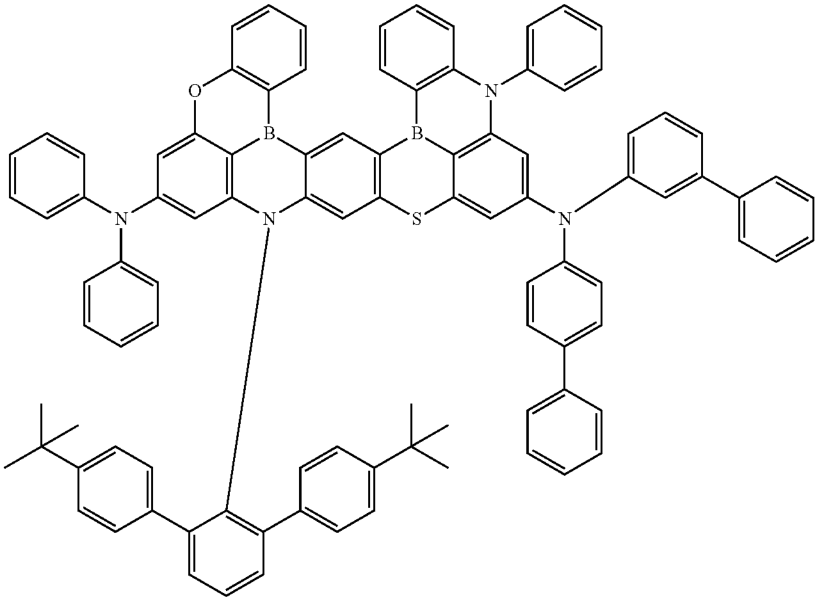
303
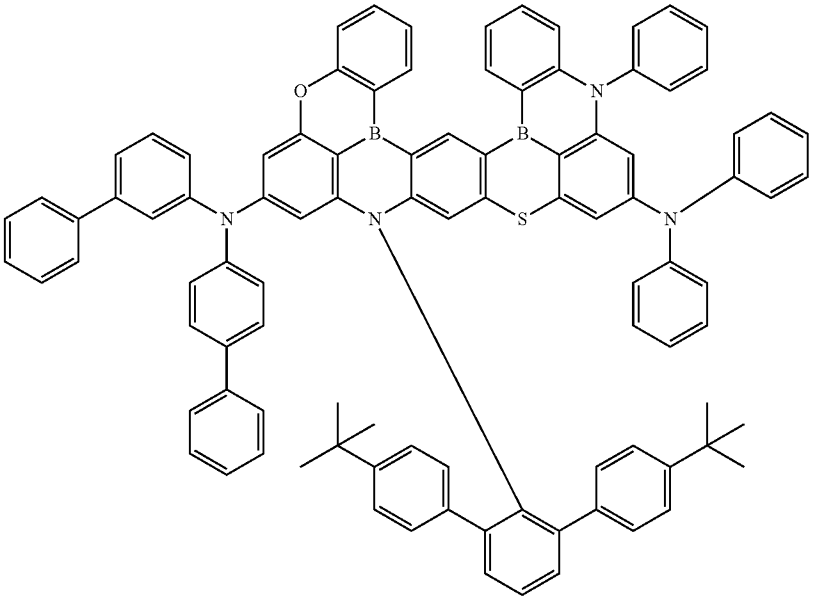

-continued
304
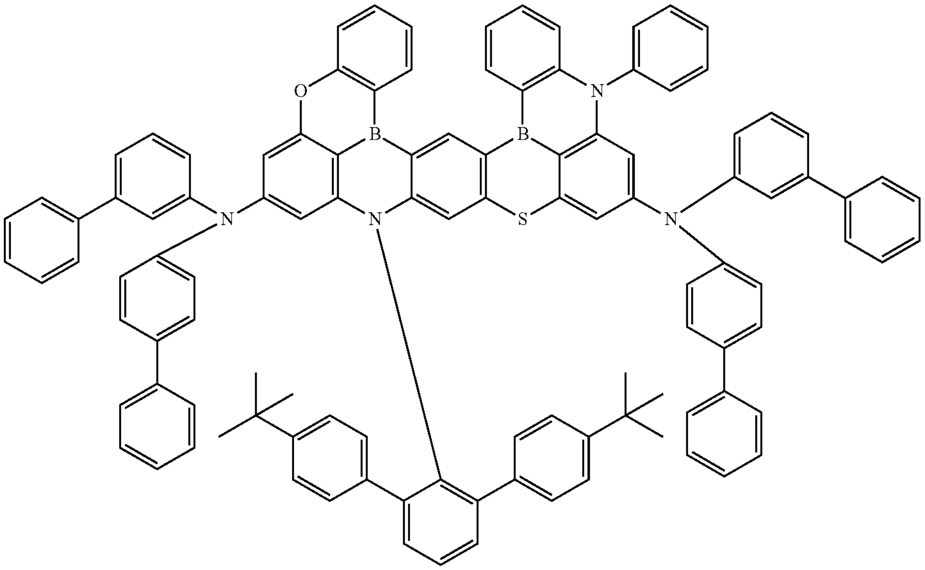
305
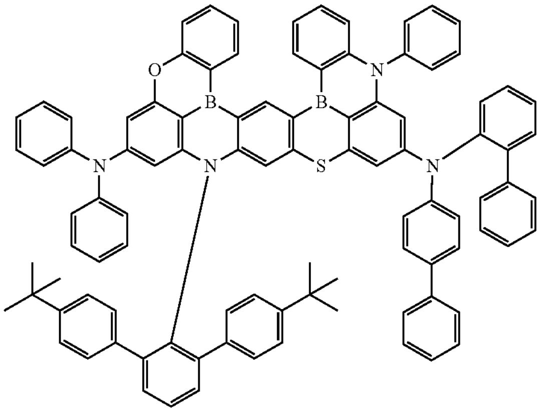
306
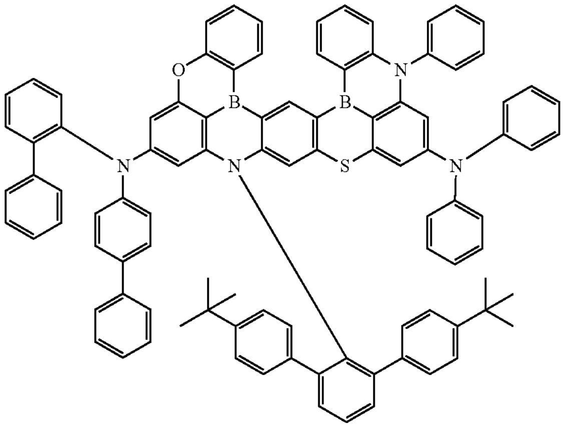
307
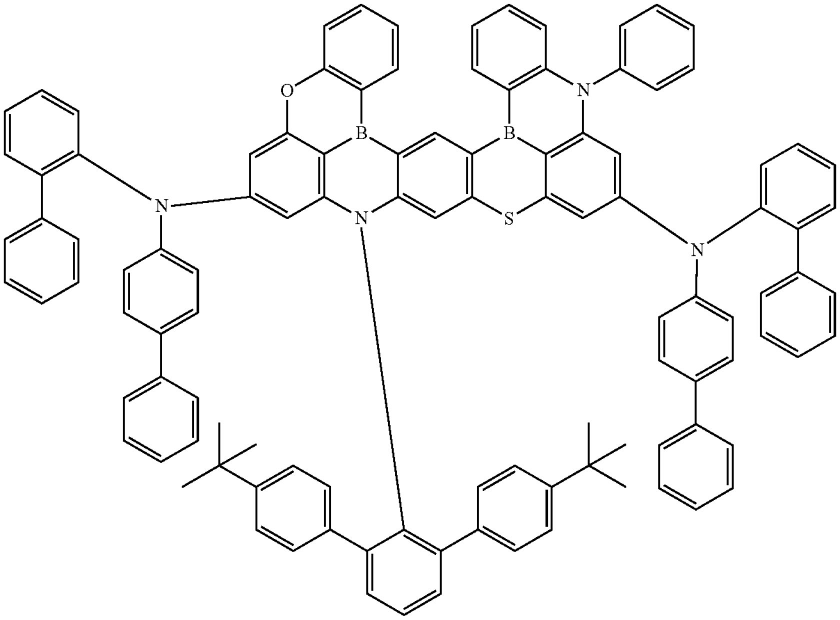

-continued
308
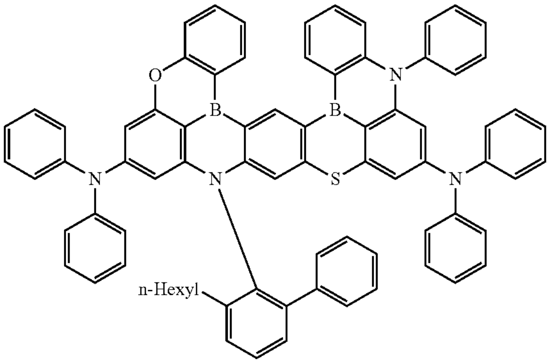
309
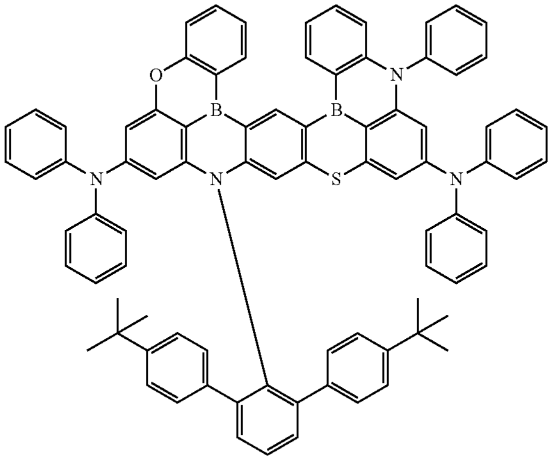
310
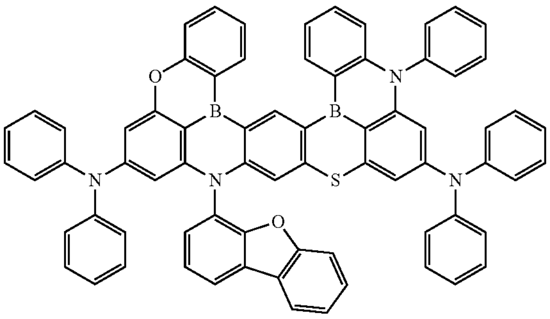
311
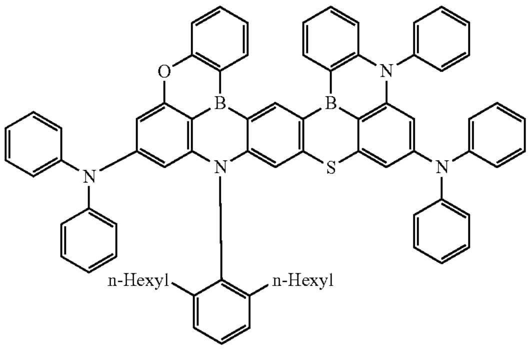
312
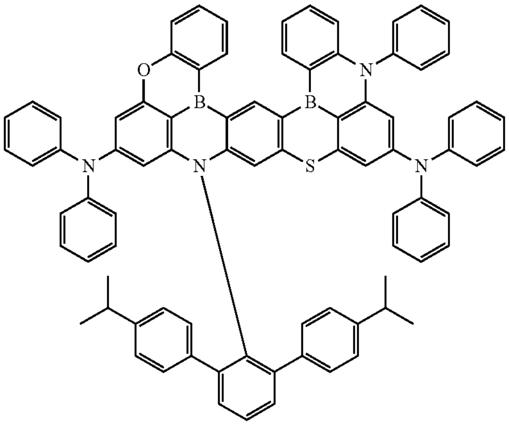
313
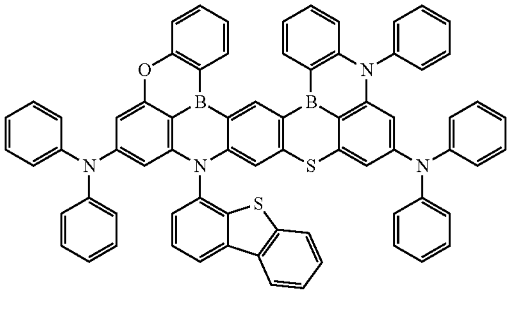

-continued
314
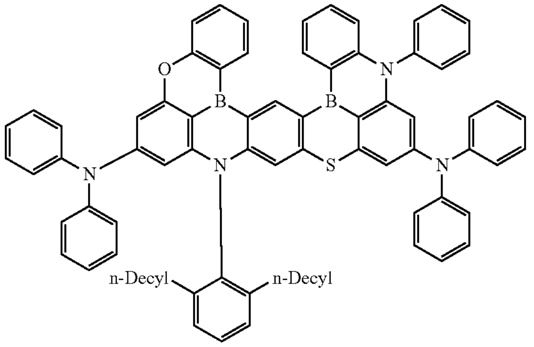
315
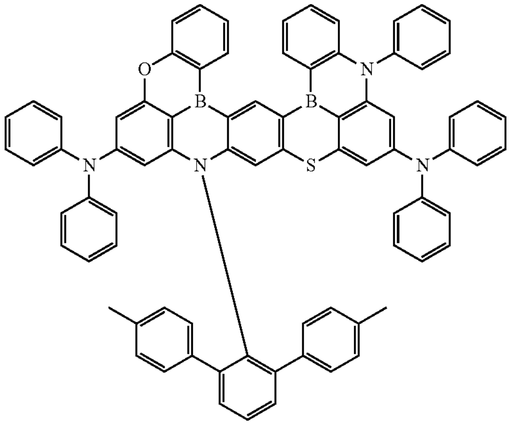
316
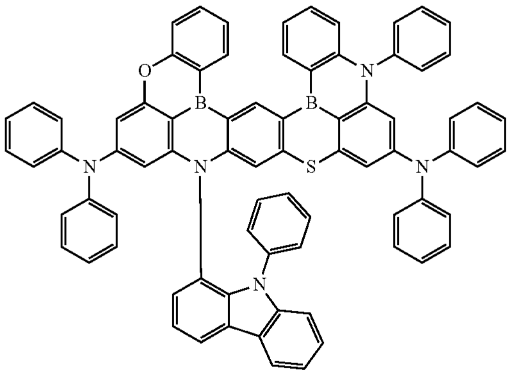
317
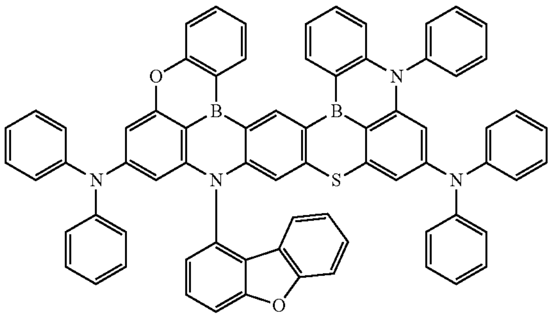
318
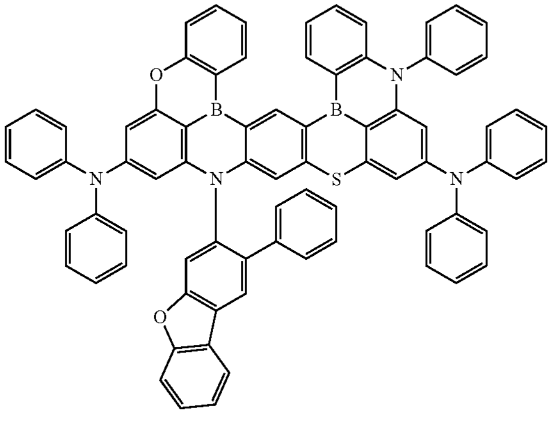
319
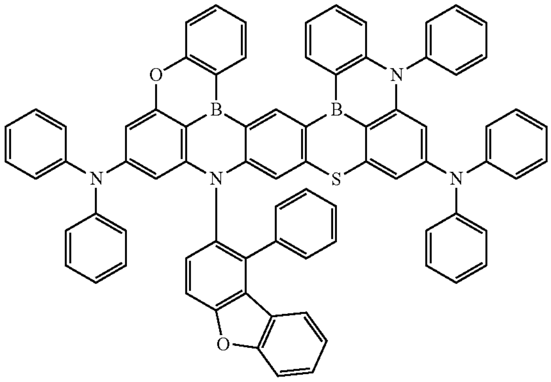

-continued
320
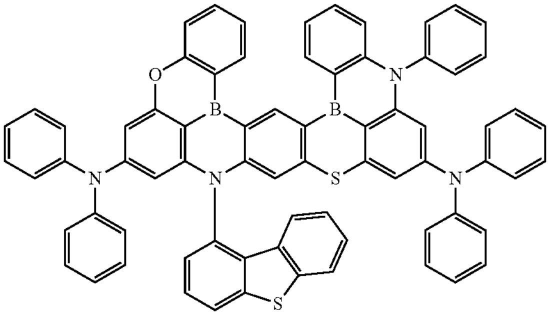
321
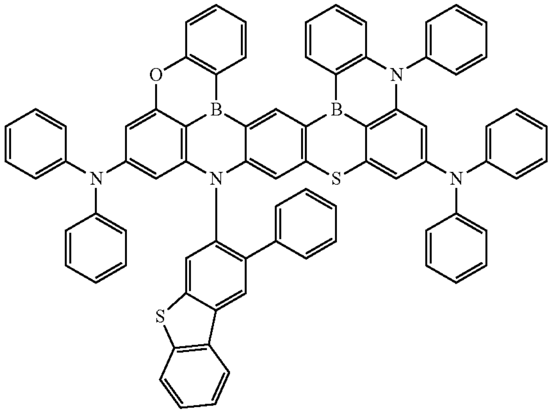
322
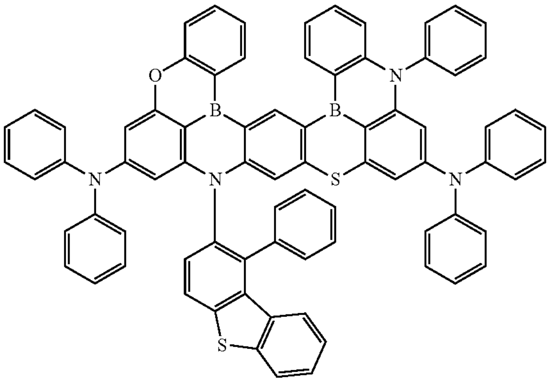
323
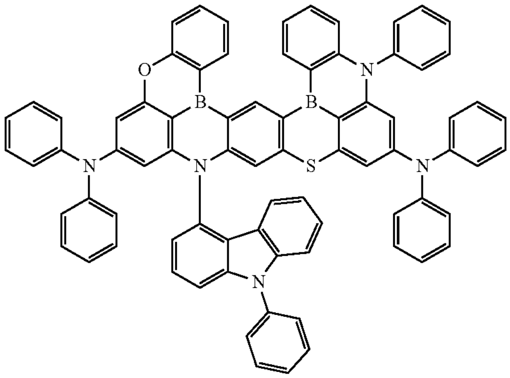
324
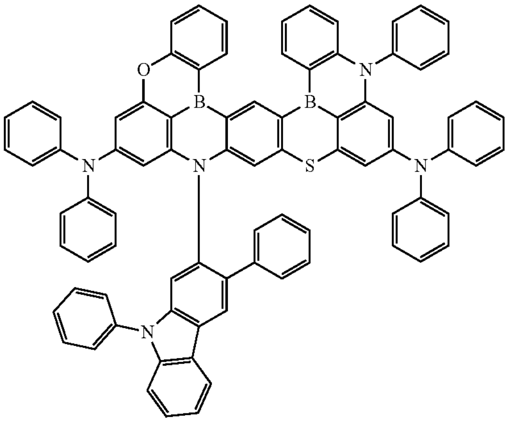
325
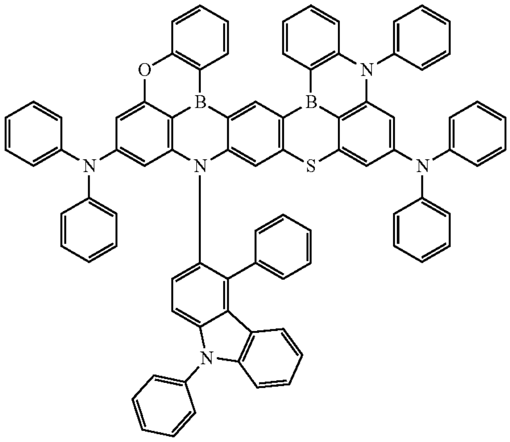
326
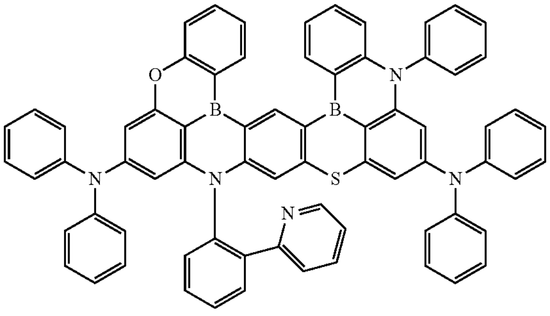
327
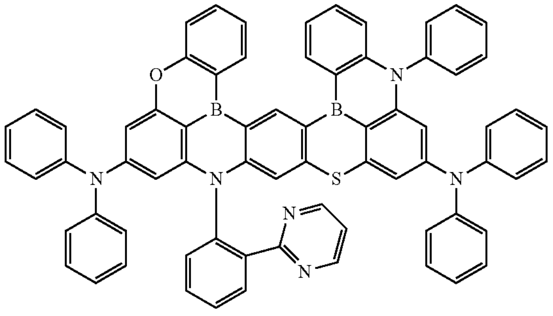

-continued
328
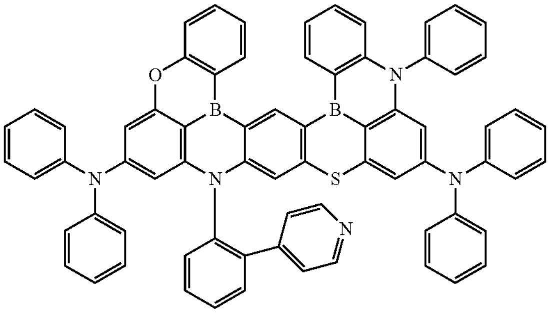
329
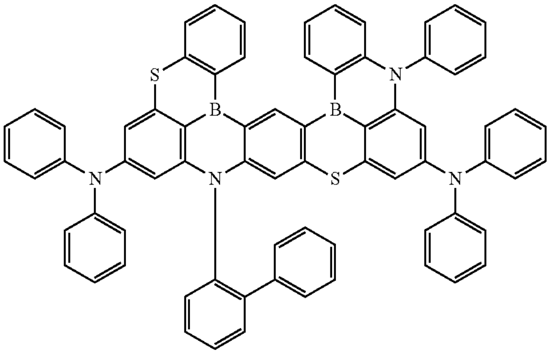
330
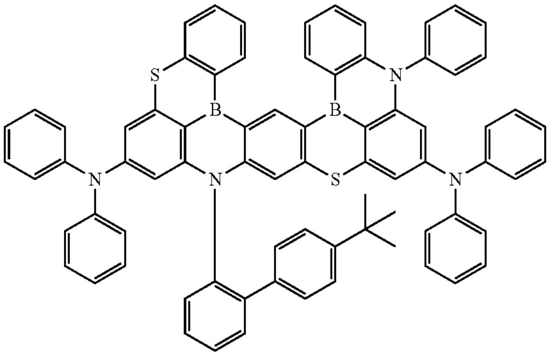
331
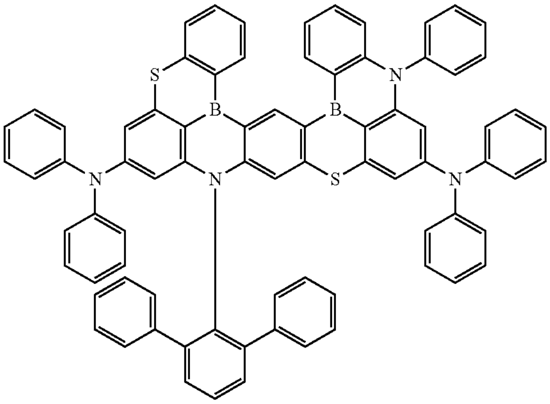
332
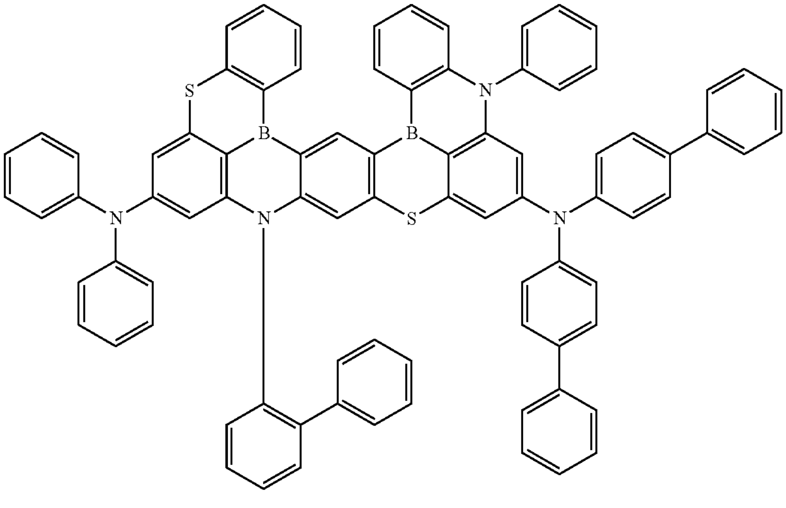

-continued
333
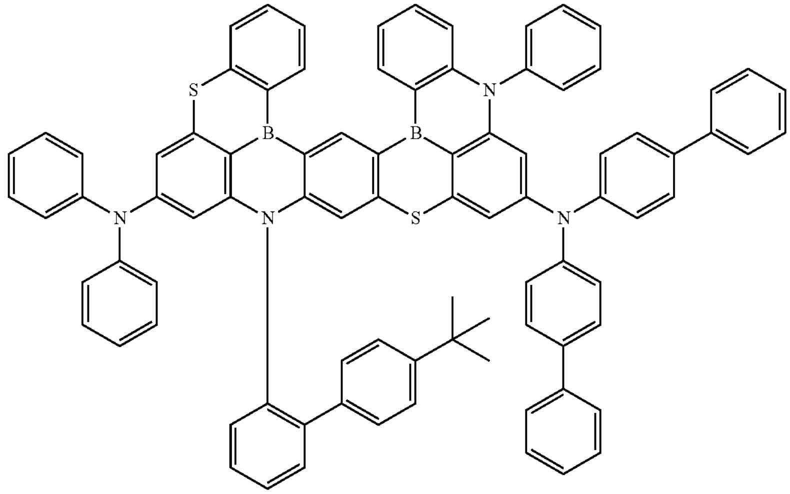
334
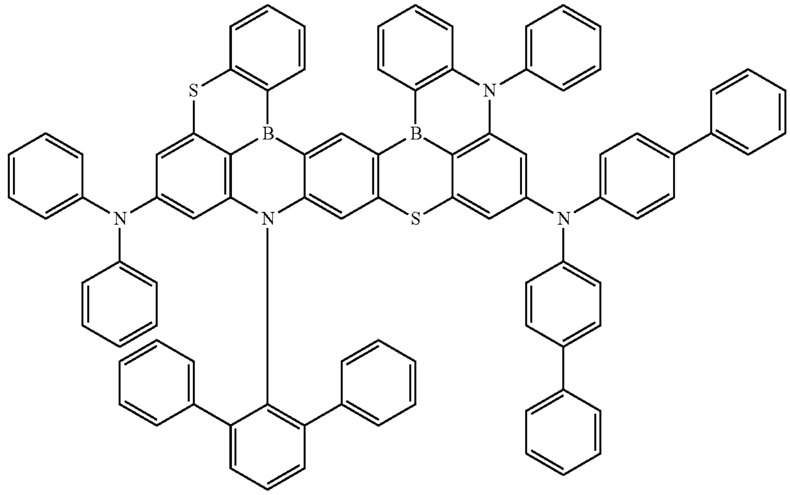
335
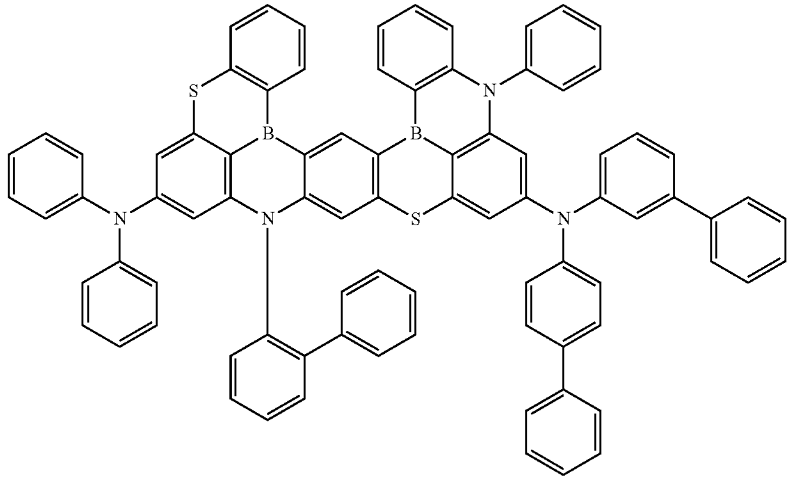

-continued
336
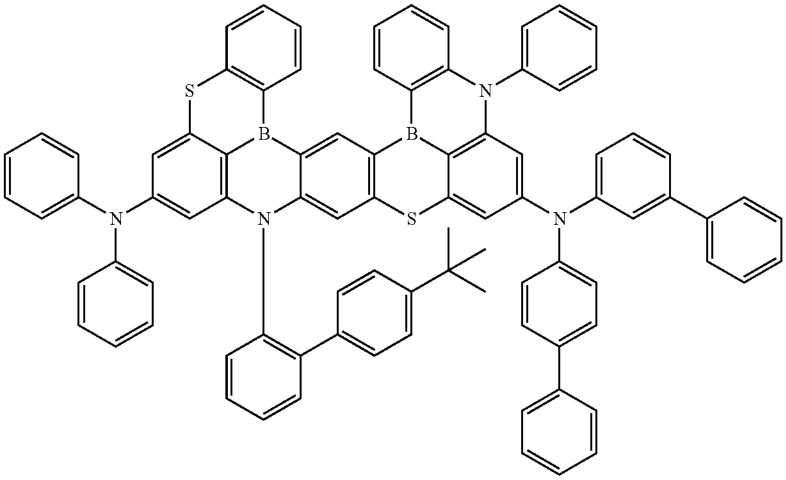
337
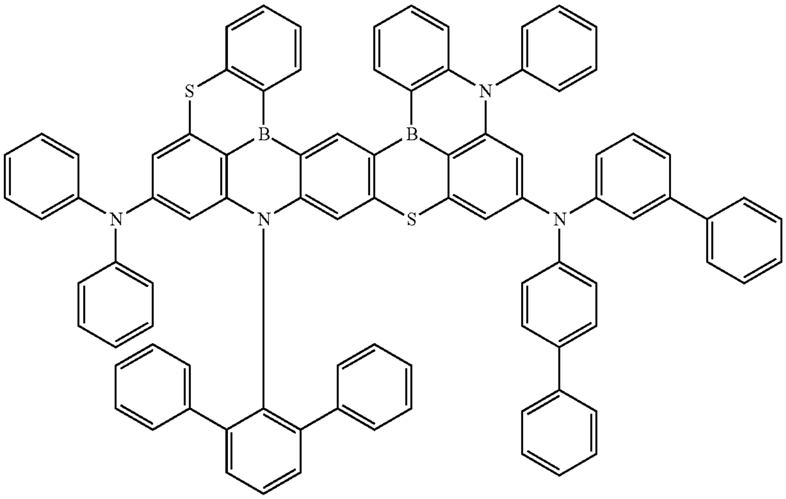
338
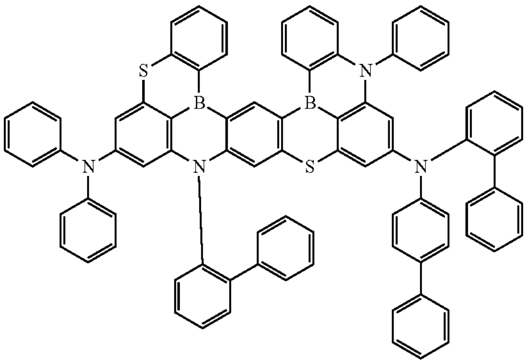
339
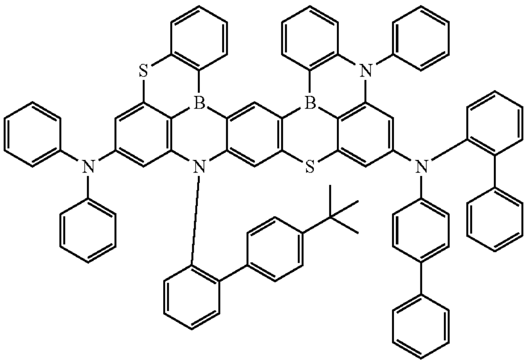

-continued
340
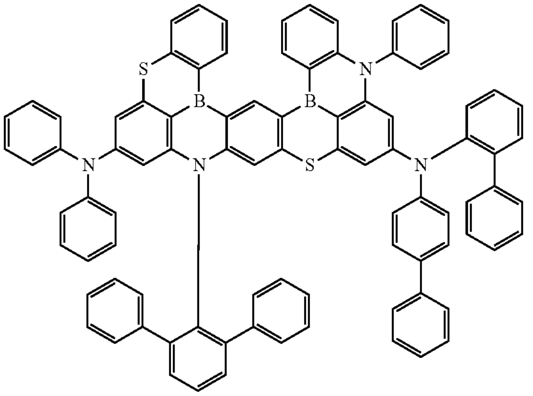
341
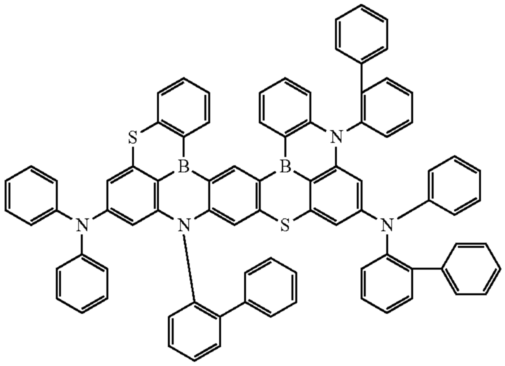
342
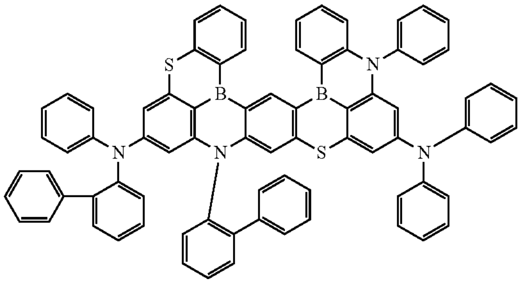
343
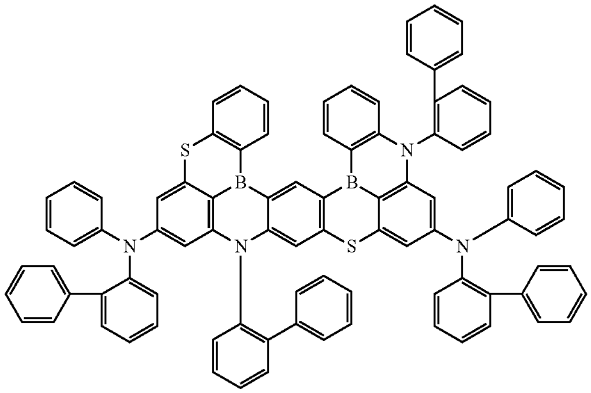
344
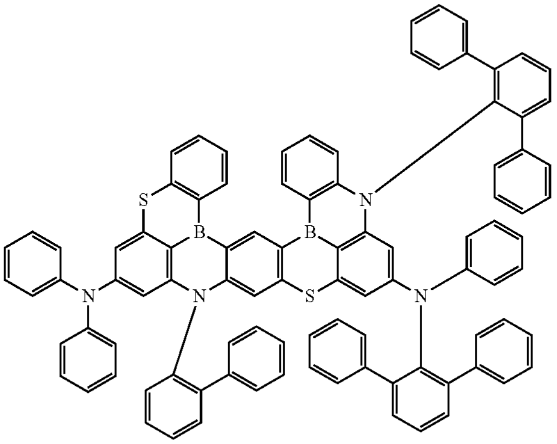

-continued
345
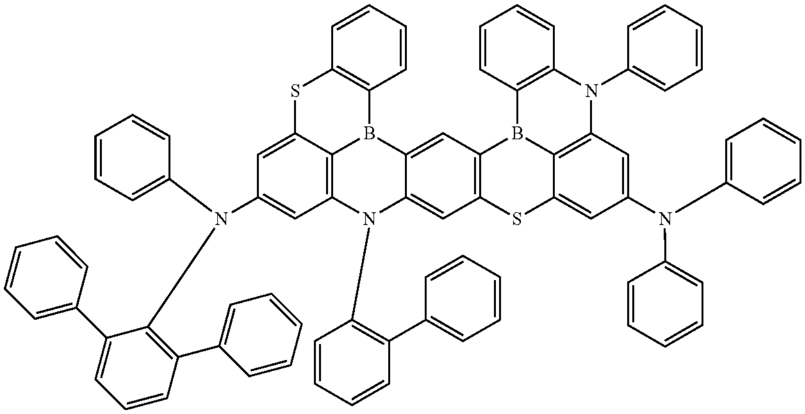
346
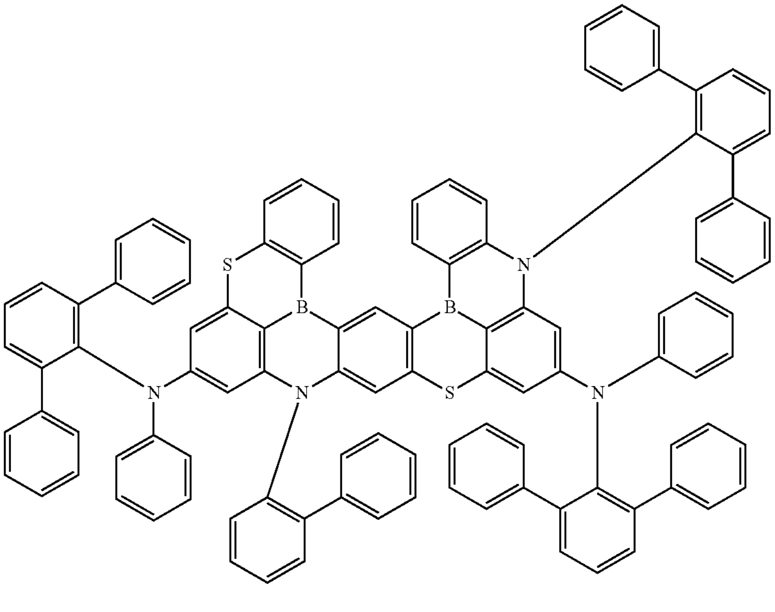
-continued
347
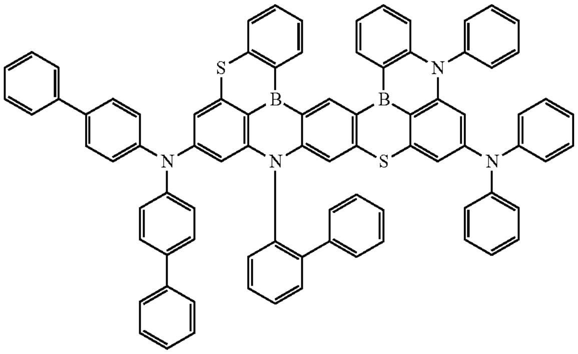
348
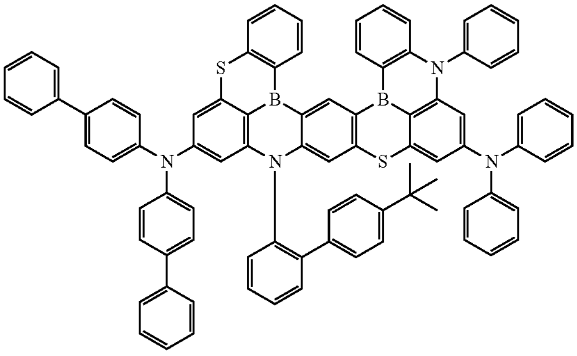

-continued
349
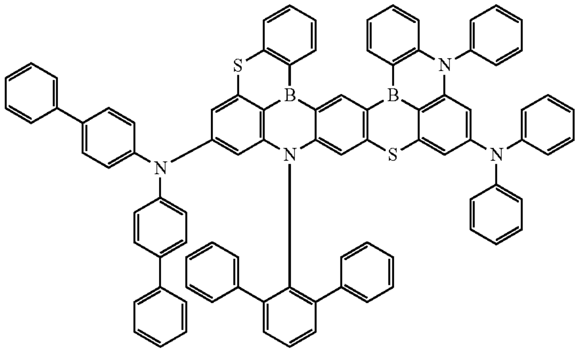
350
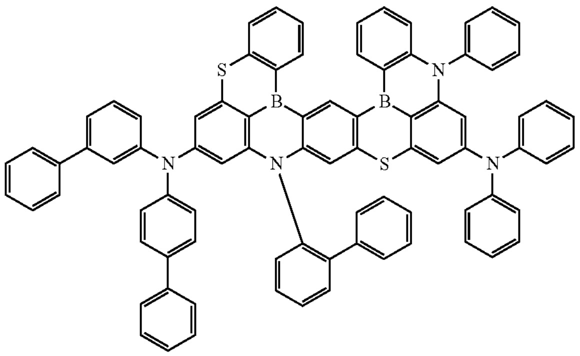
351
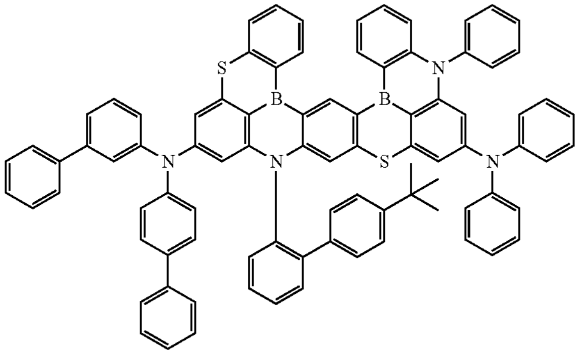
352
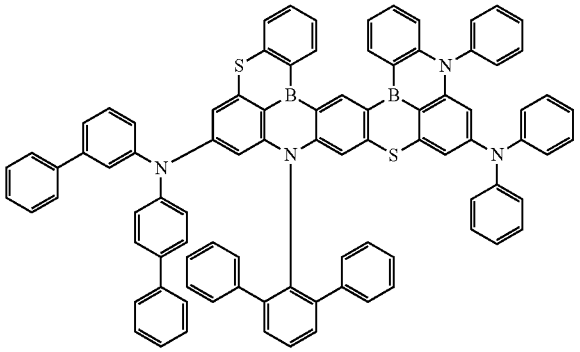
-continued
353
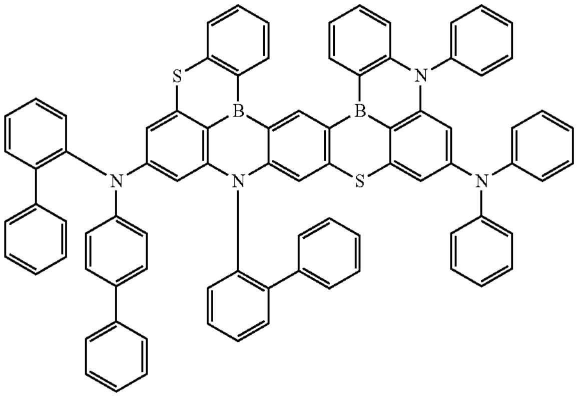
354
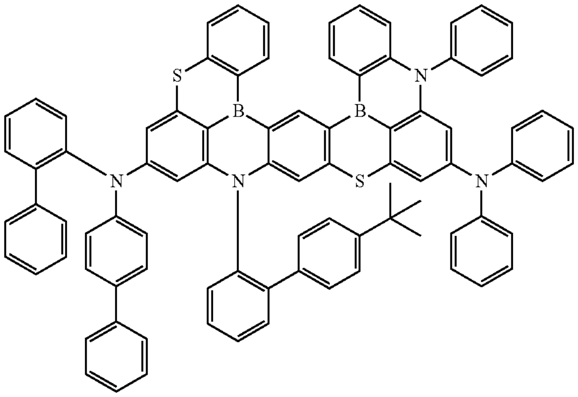
355
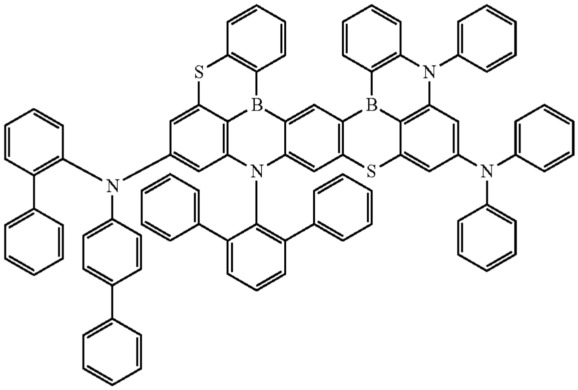
356
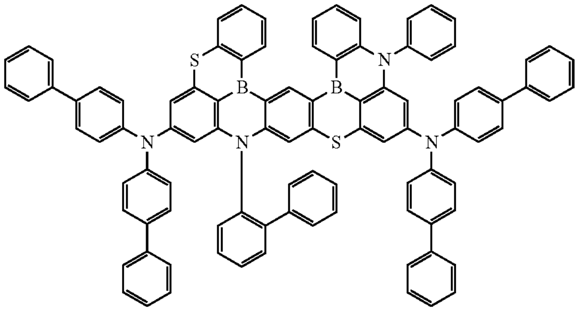

-continued
357
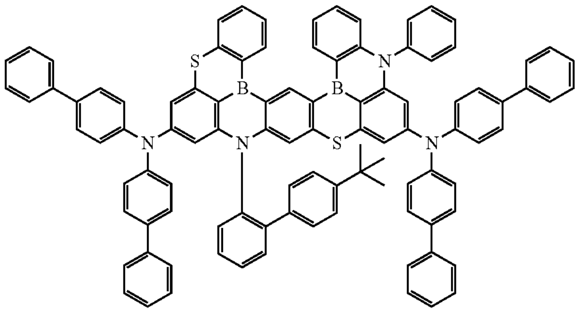
358
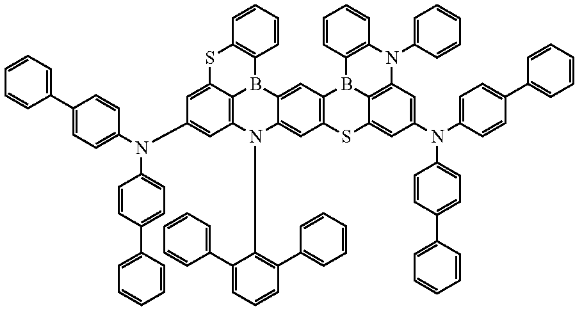
359
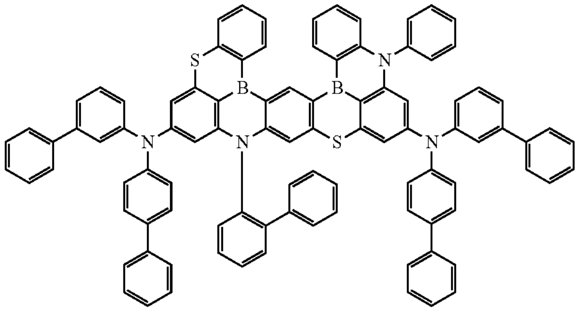
360
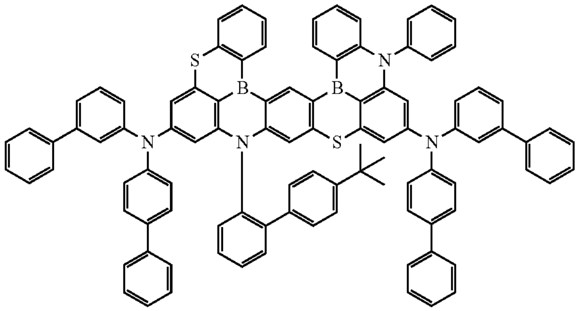
-continued
361
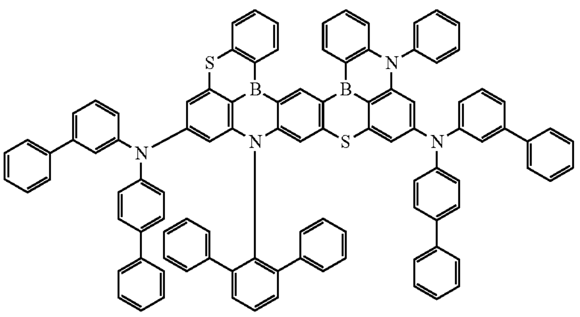
362
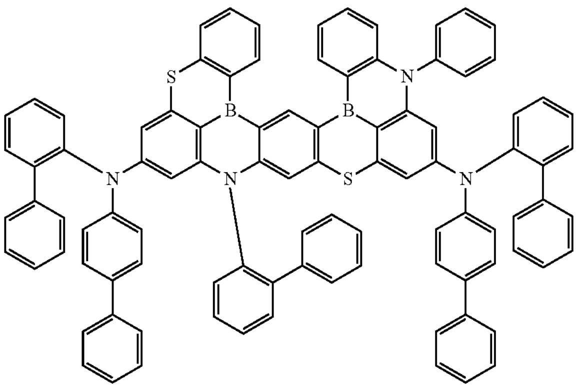
363
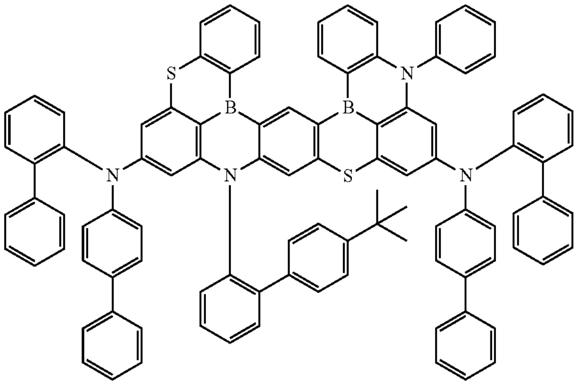
364
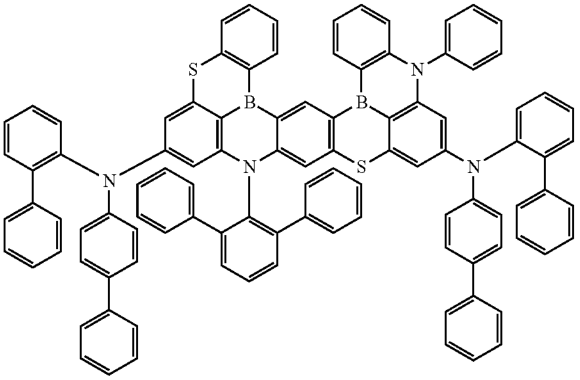

-continued
365
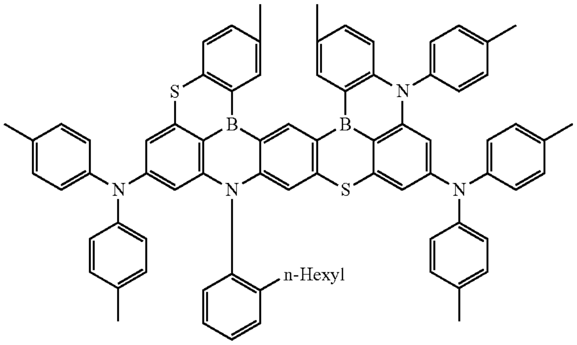
366
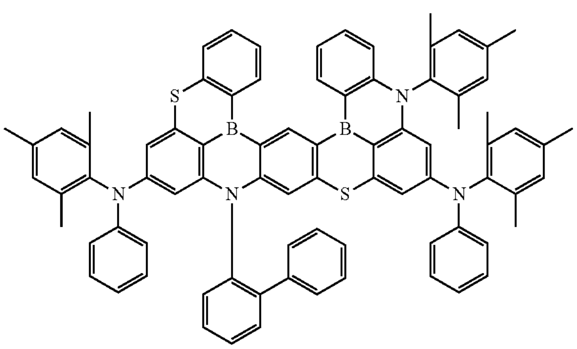
367
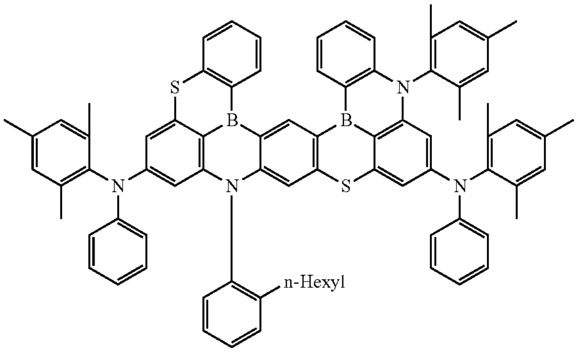
368
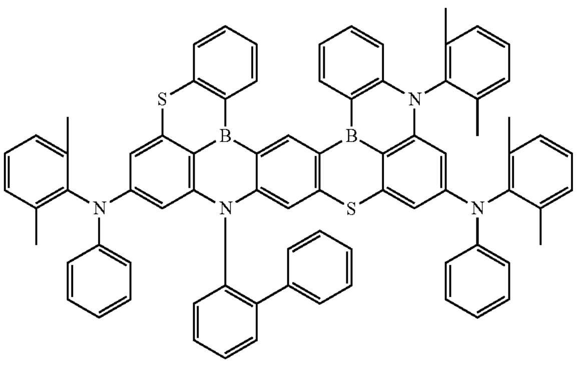
-continued
369
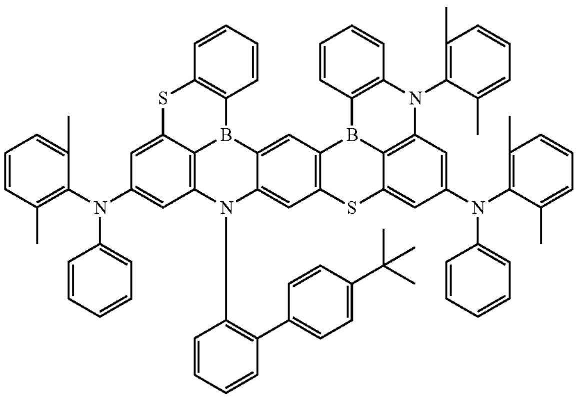
370
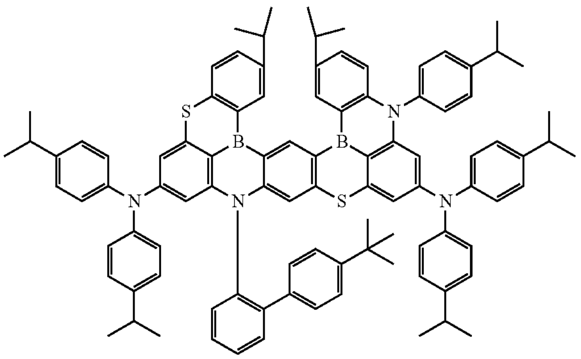
371
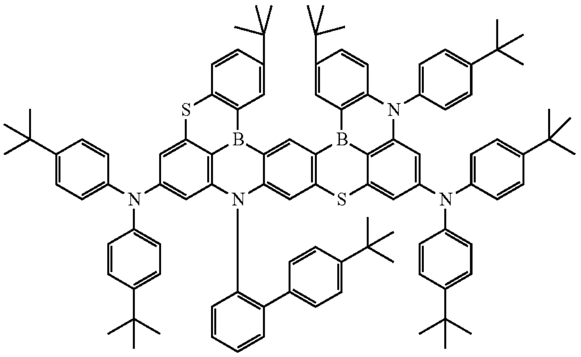
372
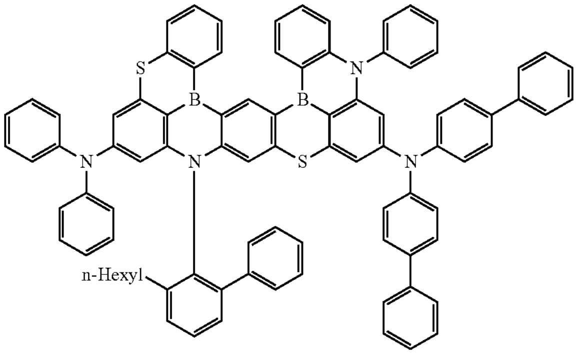

-continued
373
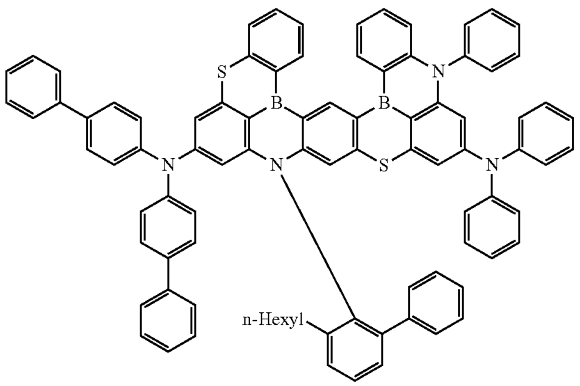
374
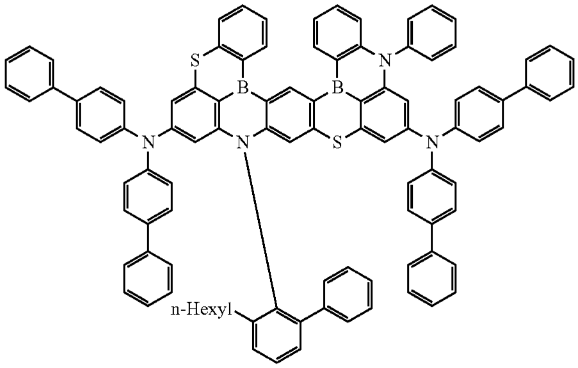
375
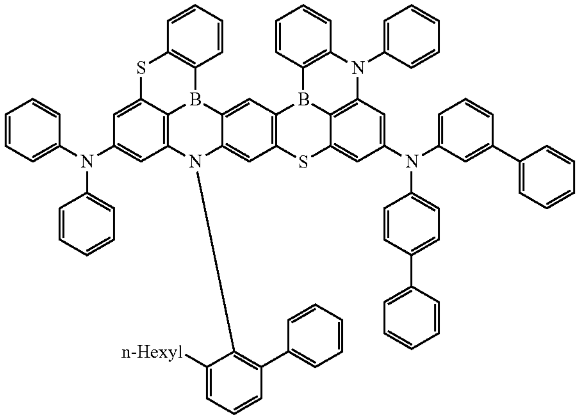
376
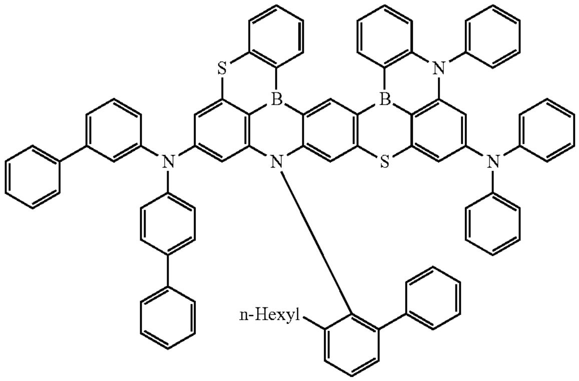
-continued
377
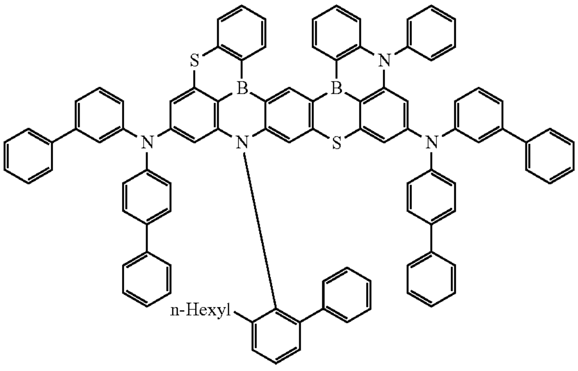
378
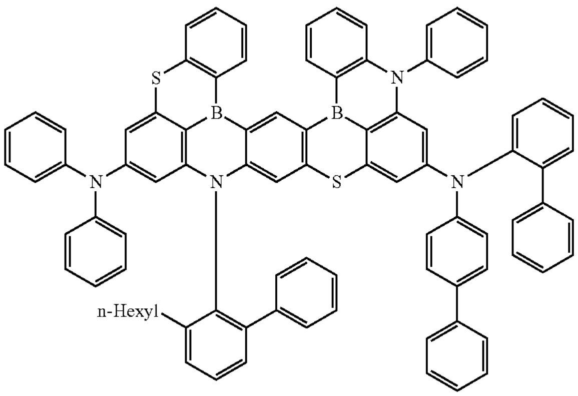
379
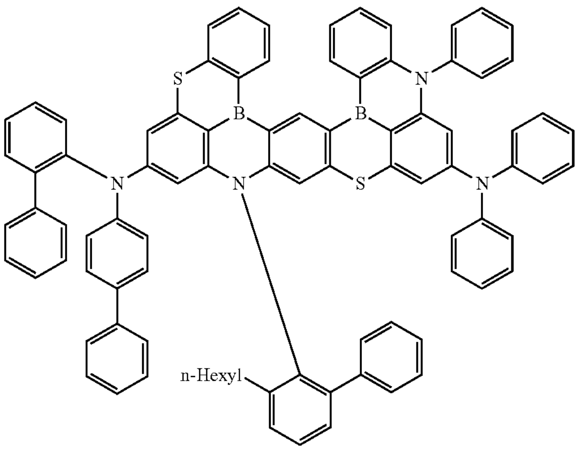

-continued
380
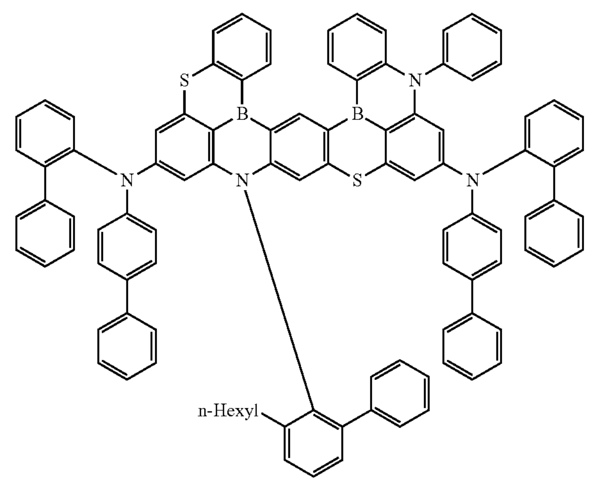
381
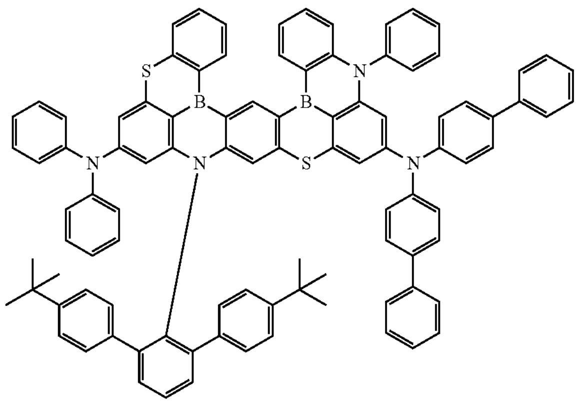
382
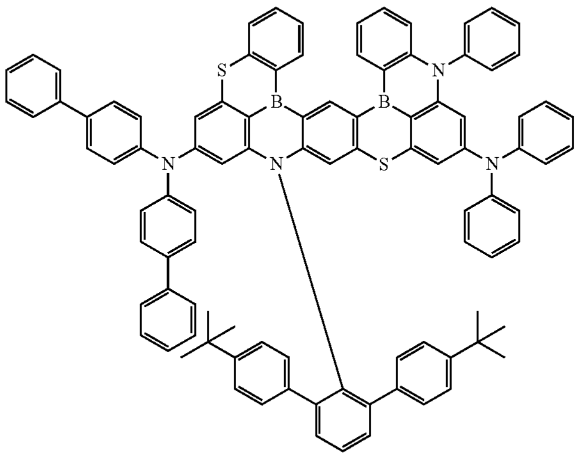
-continued
383
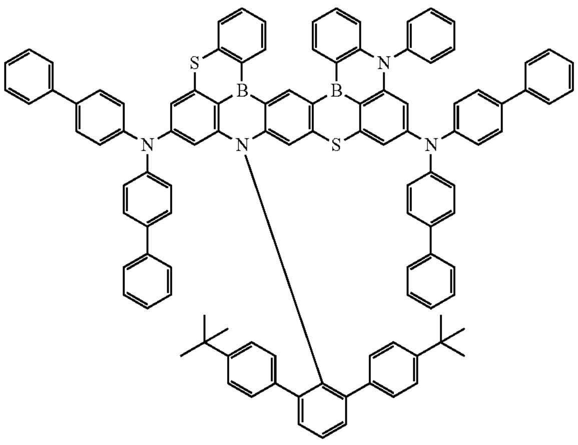
384
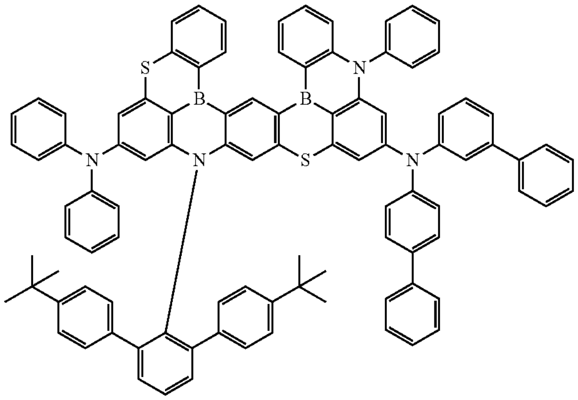
385
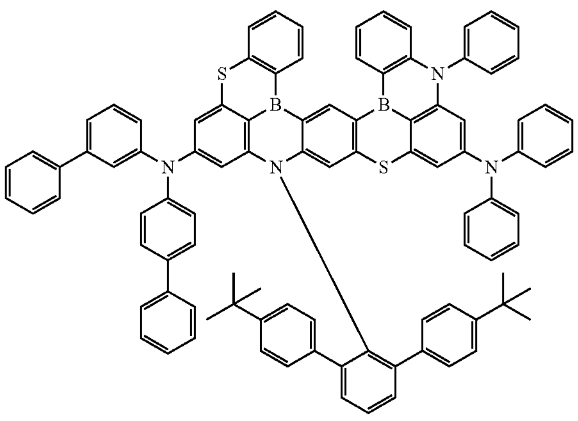

-continued
386
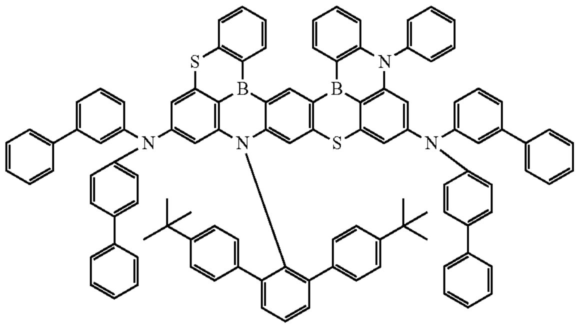
387
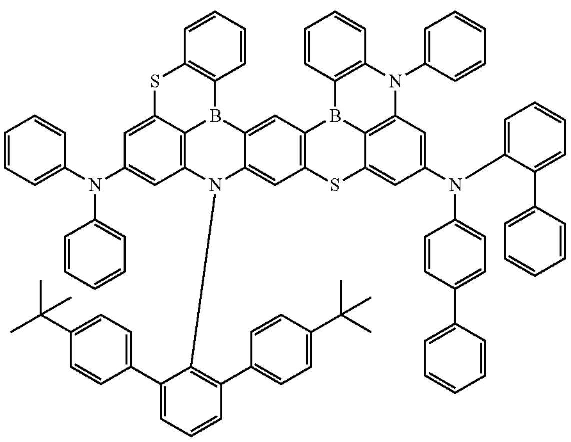
388
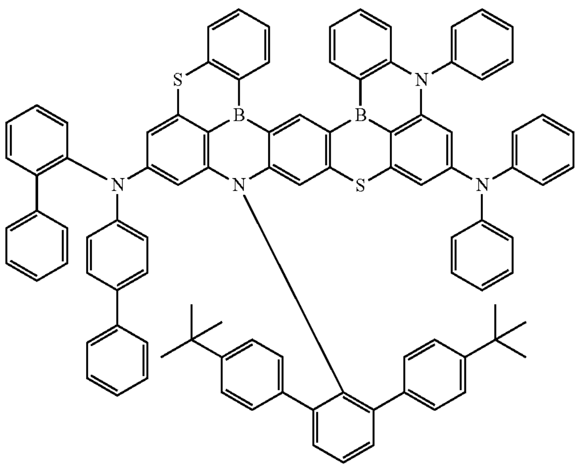
-continued
389
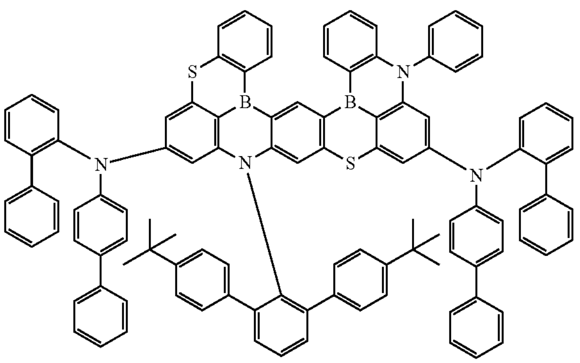
390
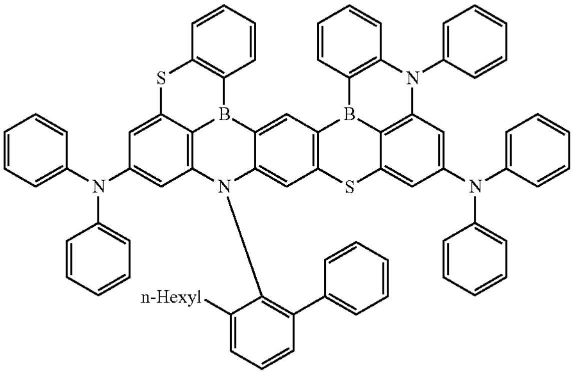
391
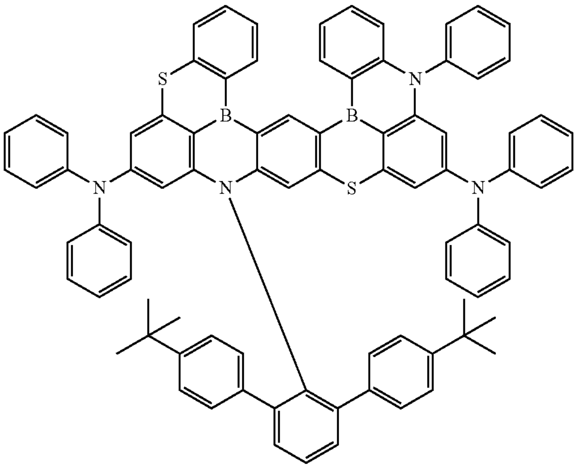
392
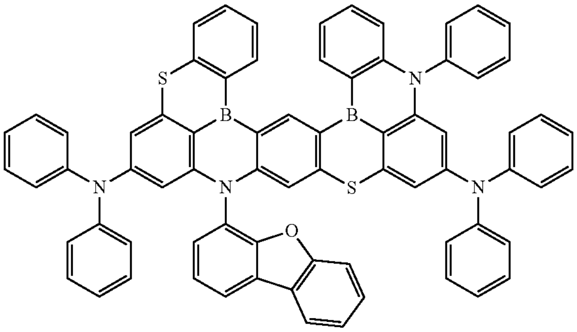

-continued
393
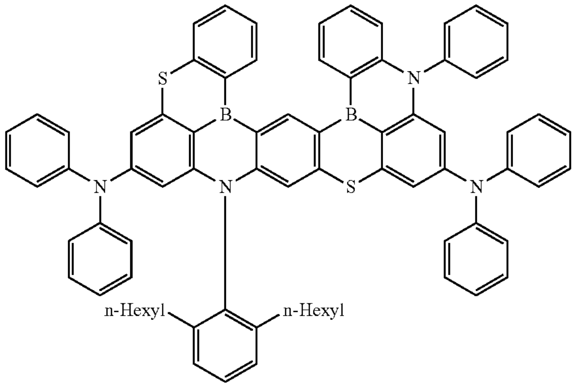
394
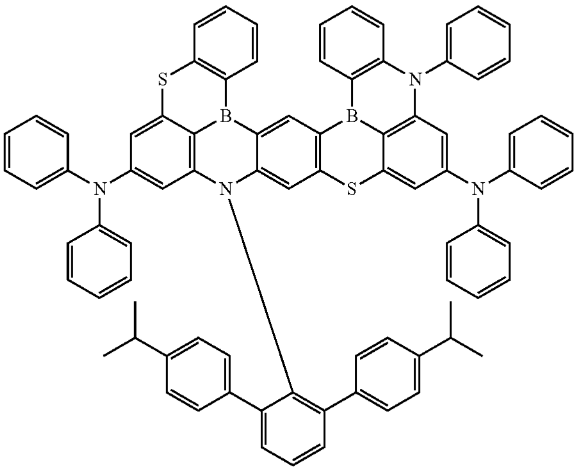
395
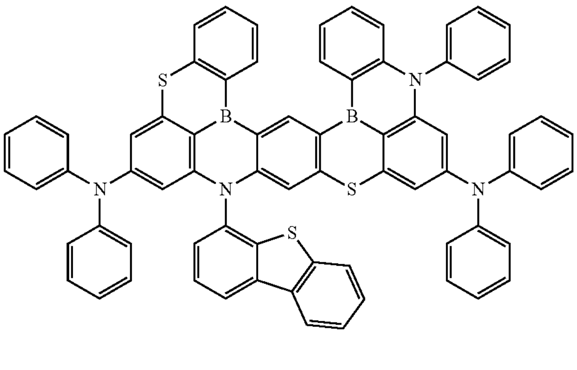
-continued
396
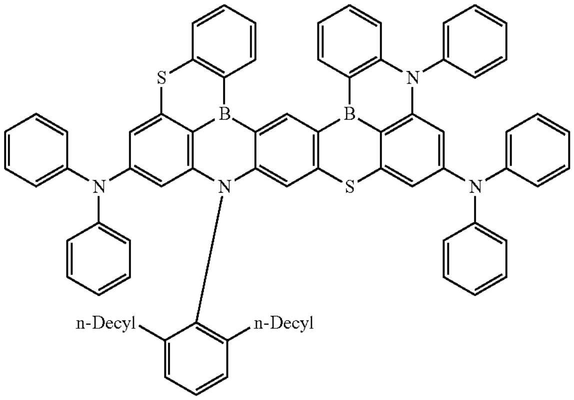
397
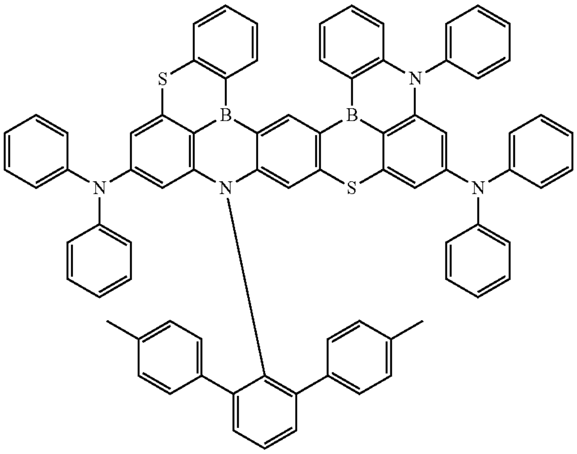
398
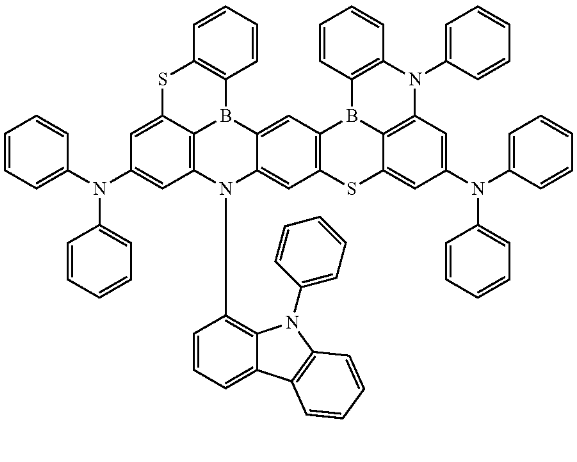

-continued
399
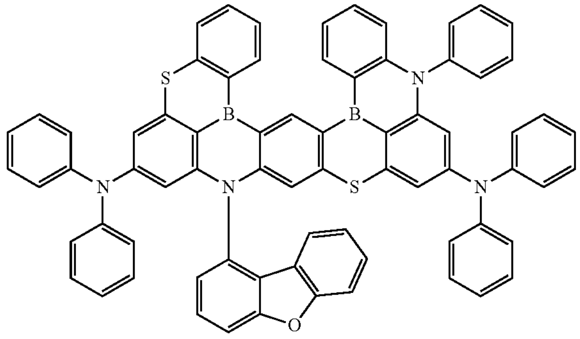
400
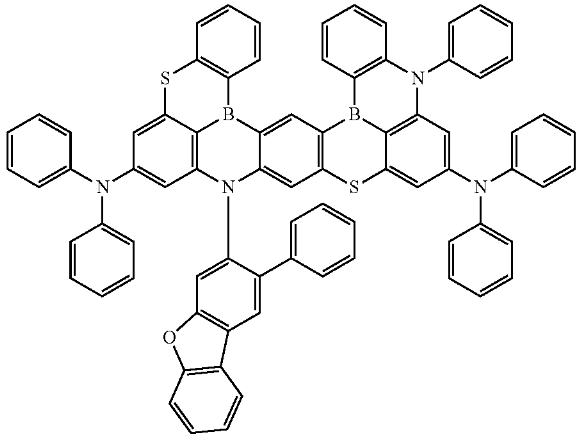
401
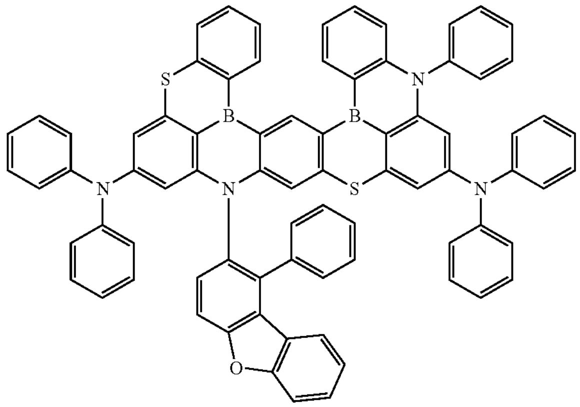
402
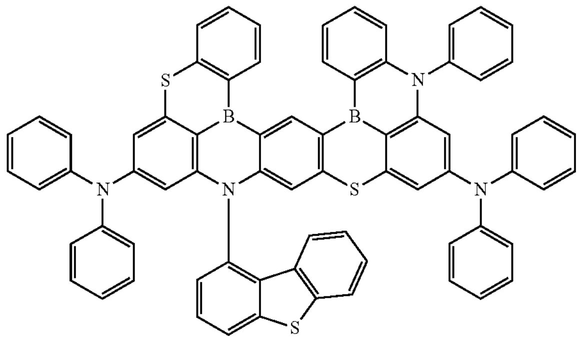
-continued
403
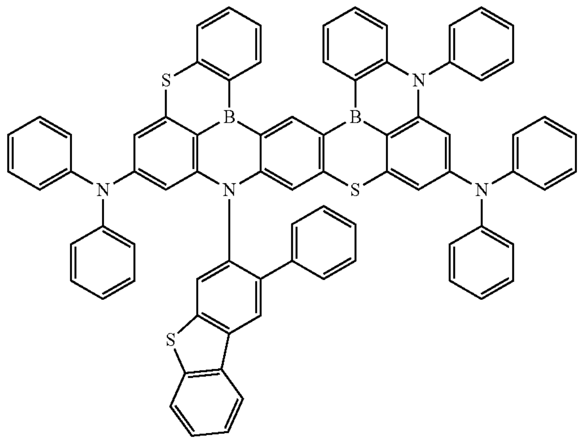
404
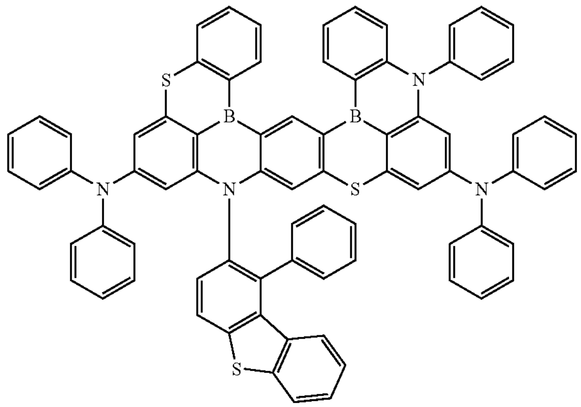
405
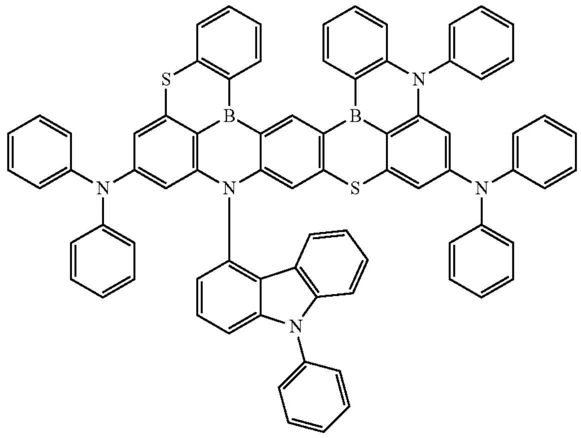

-continued
406
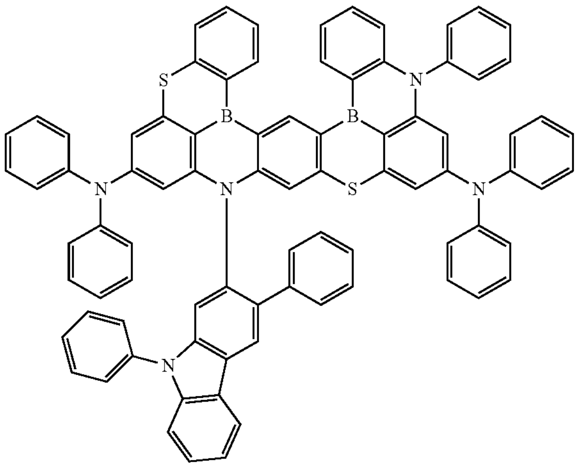
407
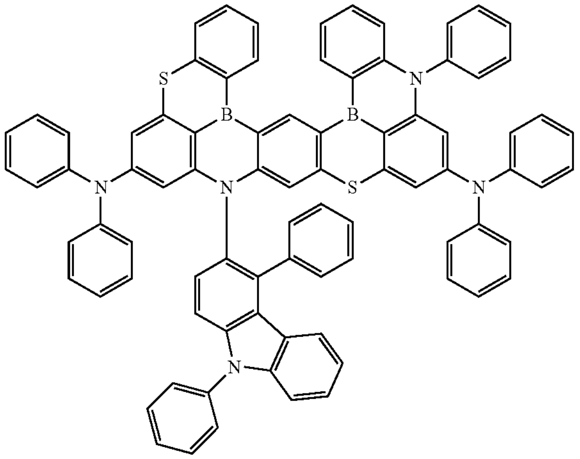
408
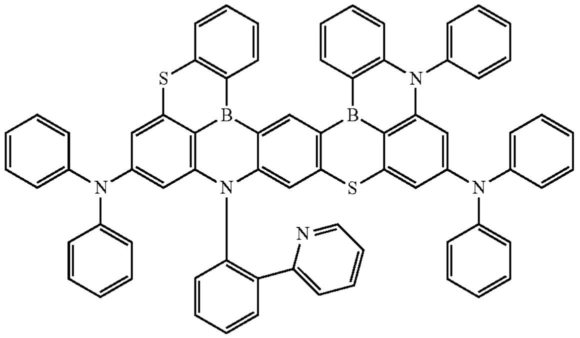
-continued
409
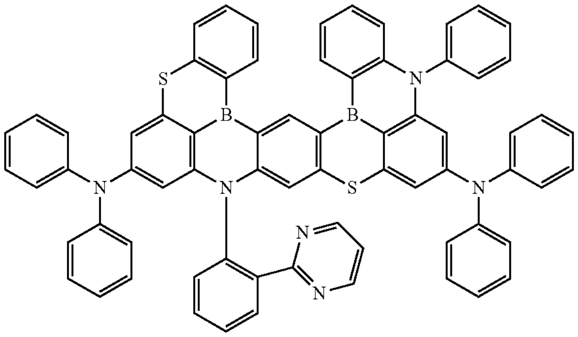
410
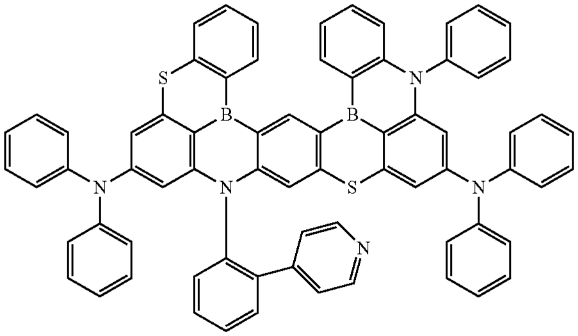
411
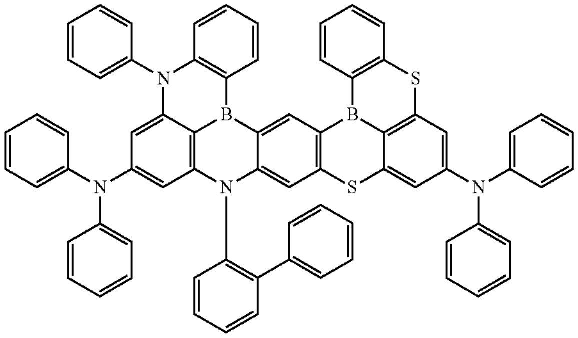
412
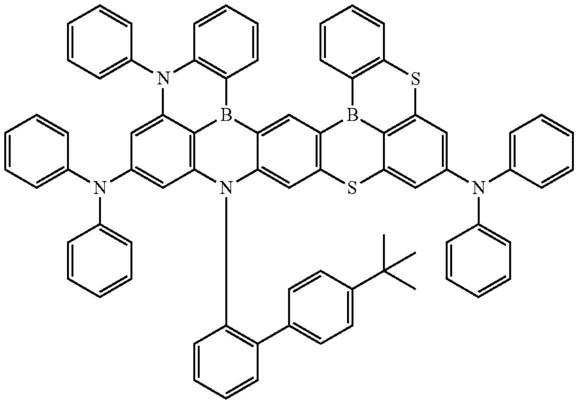

-continued
413
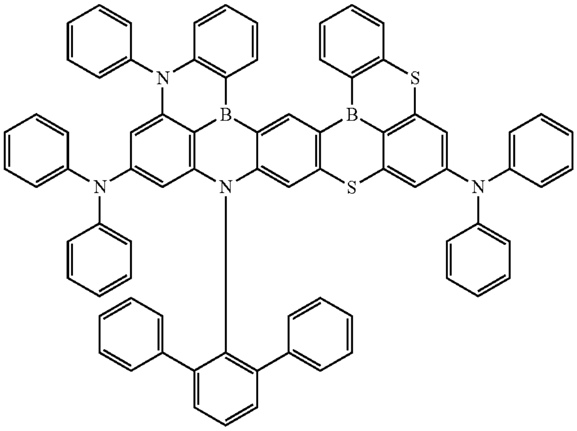
414
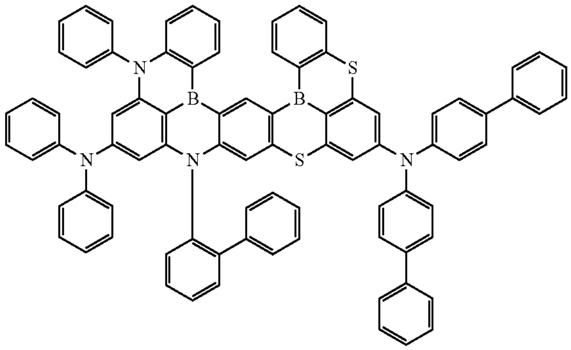
415
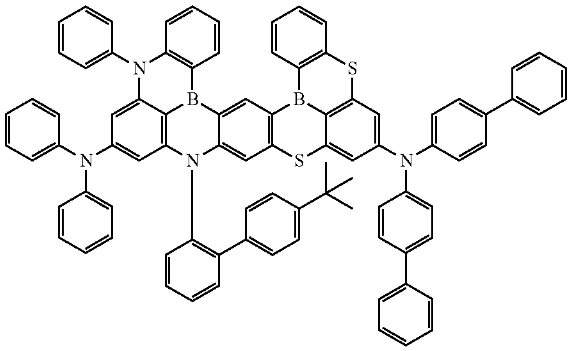
416
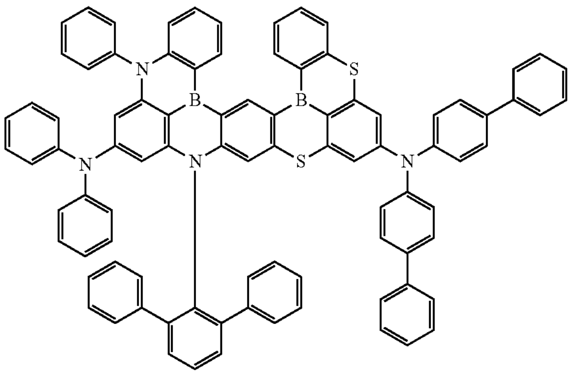
-continued
417
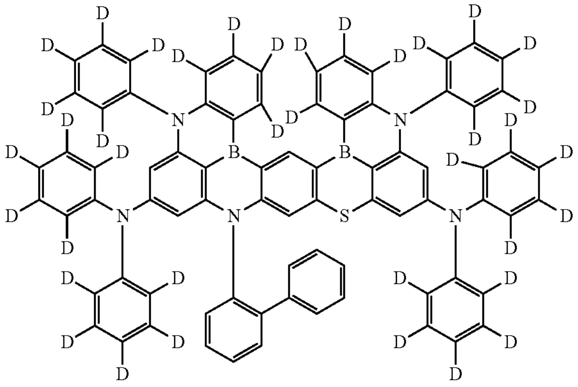
418
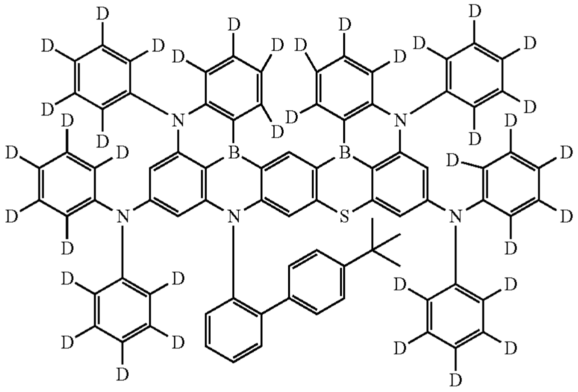
419
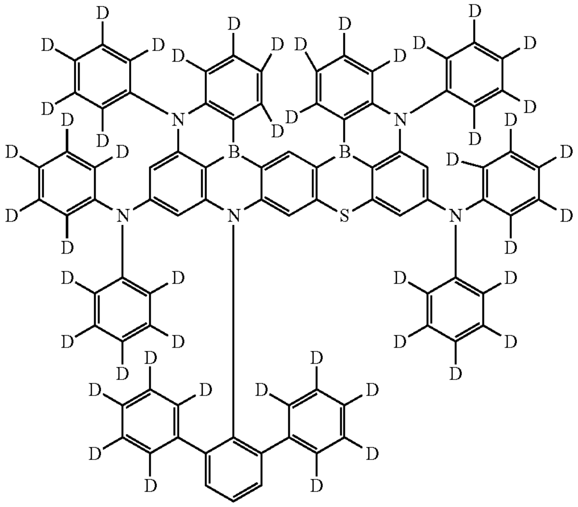

-continued
420
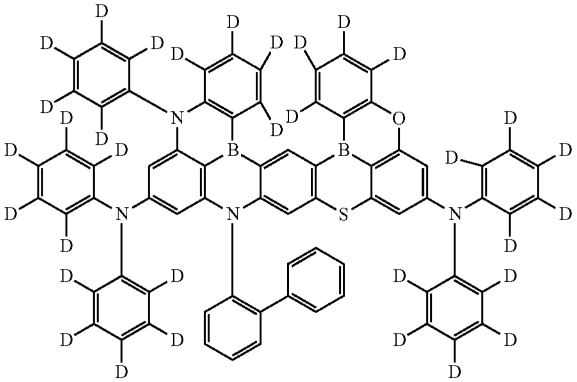
421
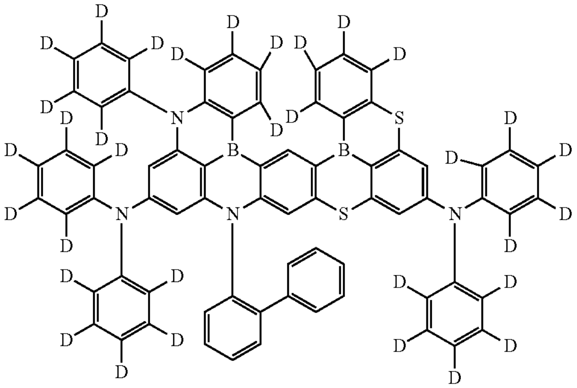
-continued
422
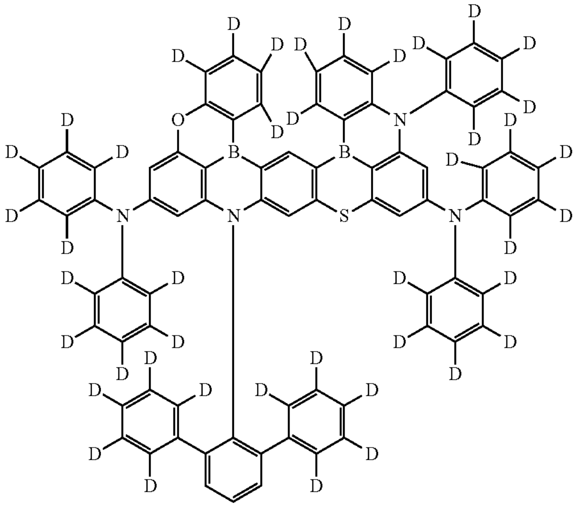
423
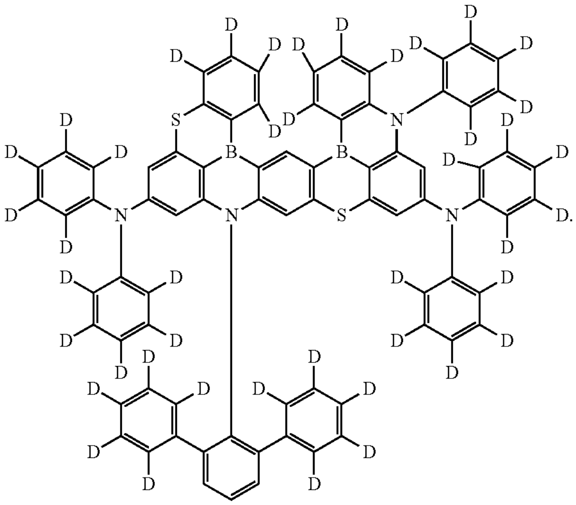
.
* * * * *